US012528830B2

(12) United States Patent
Joo et al.

(10) Patent No.: US 12,528,830 B2
(45) Date of Patent: Jan. 20, 2026

(54) POLYCYCLIC COMPOUND AND ORGANIC ELECTROLUMINESCENT DEVICE USING THE SAME

(71) Applicant: SFC CO., LTD., Cheongju-si (KR)

(72) Inventors: Sung-Hoon Joo, Cheongju-si (KR); Bong-Ki Shin, Cheongju-si (KR); Byung-Sun Yang, Cheongju-si (KR); Ji-Hwan Kim, Cheongju-si (KR); Hyeon-Jun Jo, Cheongju-si (KR); Sung-Eun Choi, Cheongju-si (KR); Seong-Eun Woo, Cheongju-si (KR); Soo-Kyung Kang, Cheongju-si (KR)

(73) Assignee: SFC Co., Ltd., Cheongju-si (KR)

( * ) Notice: Subject to any disclaimer, the term of this patent is extended or adjusted under 35 U.S.C. 154(b) by 962 days.

(21) Appl. No.: 17/692,780

(22) Filed: Mar. 11, 2022

(65) Prior Publication Data

US 2022/0310925 A1 Sep. 29, 2022

(30) Foreign Application Priority Data

Mar. 12, 2021 (KR) ........................ 10-2021-0032480
Nov. 30, 2021 (KR) ........................ 10-2021-0169019
Nov. 30, 2021 (KR) ........................ 10-2021-0169020

(51) Int. Cl.
*H01L 51/00* (2006.01)
*C07F 5/02* (2006.01)
*C09K 11/06* (2006.01)
*H10K 85/60* (2023.01)
*H10K 50/11* (2023.01)

(52) U.S. Cl.
CPC .............. *C07F 5/027* (2013.01); *C09K 11/06* (2013.01); *H10K 85/658* (2023.02); *C07B 2200/05* (2013.01); *C09K 2211/1018* (2013.01); *H10K 50/11* (2023.02)

(58) Field of Classification Search
None
See application file for complete search history.

(56) References Cited

U.S. PATENT DOCUMENTS

2006/0103298 A1 5/2006 Lee
2020/0111972 A1 4/2020 Nakano et al.

FOREIGN PATENT DOCUMENTS

| | | | | |
|---|---|---|---|---|
| EP | 3345911 | A1 | * | 7/2015 |
| EP | 3 907 228 | A1 | | 11/2021 |
| EP | 3 909 958 | A1 | | 11/2021 |
| EP | 3 919 500 | A1 | | 12/2021 |
| EP | 3960744 | A1 | * | 3/2022 |
| JP | 2010-215759 | A | | 9/2010 |
| JP | 2020-512303 | A | | 4/2020 |
| JP | 2020-83896 | A | | 6/2020 |
| JP | 2020-105171 | A | | 7/2020 |
| JP | 2020-202377 | A | | 12/2020 |
| JP | 2021-22733 | A | | 2/2021 |
| JP | 2021-38206 | A | | 3/2021 |
| JP | 76050018 | B2 | * | 3/2025 |
| KR | 10-2020-0125583 | A | | 11/2020 |
| KR | 10-2021-0027179 | A | | 3/2021 |
| KR | 10-2021-0067843 | A | | 6/2021 |
| KR | 10-2021-0118766 | A | | 10/2021 |
| WO | WO 2006/117914 | A1 | | 11/2006 |
| WO | WO 2020/105990 | A1 | | 5/2020 |
| WO | WO 2020/153650 | A1 | | 7/2020 |
| WO | WO 2020/218079 | A1 | | 10/2020 |
| WO | WO 2020/251049 | A1 | | 12/2020 |
| WO | WO 2021/107678 | A1 | | 6/2021 |
| WO | WO 2021/107680 | A1 | | 6/2021 |
| WO | WO 2021/107681 | A1 | | 6/2021 |
| WO | WO 2021/107699 | A1 | | 6/2021 |
| WO | WO 2021/107743 | A1 | | 6/2021 |
| WO | WO 2021/150092 | A1 | | 7/2021 |
| WO | WO 2021/194216 | A1 | | 9/2021 |

OTHER PUBLICATIONS

Chinese Office Action Issued on Jul. 12, 2024, in Counterpart Chinese Patent Application No. 202210242733.0 (12 Pages in English, 12 Pages in Chinese).
Chinese Office Action Issued on Aug. 30, 2024, in Counterpart Chinese Patent Application No. 202210241955.0 (11 Pages in English, 11 Pages in Chinese).
Extended European search report issued on Jul. 15, 2022, in counterpart European Patent Application No. 22161566.9 (9 pages in English).
Japanese Office Action issued on Mar. 7, 2023, in counterpart Japanese Patent Application No. 2022-039667 (4 pages in Japanese).
Extended European search report issued on Jul. 14, 2022, in counterpart European Patent Application No. 22161567.7 (12 pages in English).
European Office Action issued on Sep. 5, 2023, in counterpart European Patent Application No. 22 161 566.9 (5 pages in English).
Korean Office Action issued on Mar. 16, 2022 in corresponding Korean Patent Application No. 10-2021-0169019 (10 pages in Korean).

(Continued)

*Primary Examiner* — Tae H Yoon
(74) *Attorney, Agent, or Firm* — NSIP Law

(57) ABSTRACT

Disclosed is a polycyclic compound that can be employed in various organic layers of an organic electroluminescent device. The polycyclic compound has a characteristic skeleton structure and characteristic substituents. Also disclosed is an organic electroluminescent device including the polycyclic compound. The organic electroluminescent device includes a light emitting layer employing the polycyclic compound as a dopant and an anthracene derivative having a characteristic structure as a host. The use of the polycyclic compound significantly improves the luminous efficiency and life characteristics of the organic electroluminescent device and makes the organic electroluminescent device highly efficient and long lasting.

16 Claims, No Drawings

(56) References Cited

OTHER PUBLICATIONS

Japanese Office Action issued on Mar. 7, 2023, in counterpart Japanese Patent Application No. 2022-039693 (3 pages in Japanese).
U.S. Non-Final Office Action issued on Jun. 17, 2025, in related U.S. Appl. No. 17/692,774. (pp. 1-17).

* cited by examiner

POLYCYCLIC COMPOUND AND ORGANIC ELECTROLUMINESCENT DEVICE USING THE SAME

CROSS REFERENCE TO RELATED APPLICATIONS

This application claims the benefit under 35 U.S.C. § 119(a) of Korean Patent Application No. 10-2021-0032480 filed on Mar. 12, 2021, Korean Patent Application No. 10-2021-0169019 filed on Nov. 30, 2021, and Korean Patent Application No. 10-2021-0169020 filed on Nov. 30, 2021, in the Korean Intellectual Property Office, the entire disclosures of which are incorporated herein by reference for all purposes.

BACKGROUND OF THE INVENTION

1. Field of the Invention

The present invention relates to a polycyclic compound and an a highly efficient and long-lasting organic electroluminescent device with significantly improved luminous efficiency using the polycyclic compound.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Particularly, for maximum efficiency in a light emitting layer, an appropriate combination of energy band gaps of a host and a dopant is required such that holes and electrons migrate to the dopant through stable electrochemical paths to form excitons.

SUMMARY OF THE INVENTION

Accordingly, the present invention intends to provide a compound that is employed in a light emitting layer of an organic electroluminescent device to achieve high efficiency and long lifetime of the device, and a highly efficient and long-lasting organic electroluminescent device including the compound.

One aspect of the present invention provides a compound represented by Formula A-1:

(A-1)

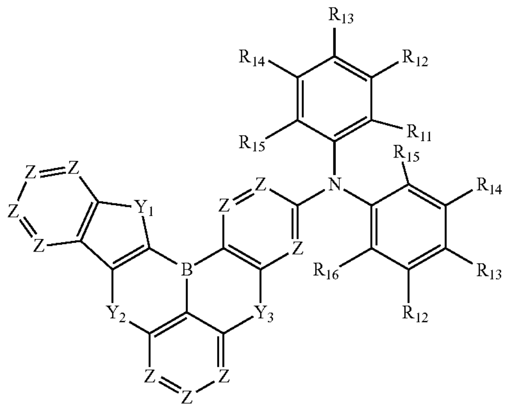

and an organic electroluminescent device using the compound.

Structural features of Formula A-1 and specific compounds that can be represented by Formula A-1 are described below. $R_{11}$ to $R_{16}$, $Y_1$ to $Y_3$, and Z in Formula A-1 are as defined below.

A further aspect of the present invention provides an organic electroluminescent device including a first electrode, a second electrode opposite to the first electrode, and one or more organic layers interposed between the first and second electrodes wherein one of the organic layers is a light emitting layer including a host and a dopant and wherein the dopant includes at least one compound represented by Formula A-1:

(A-1)

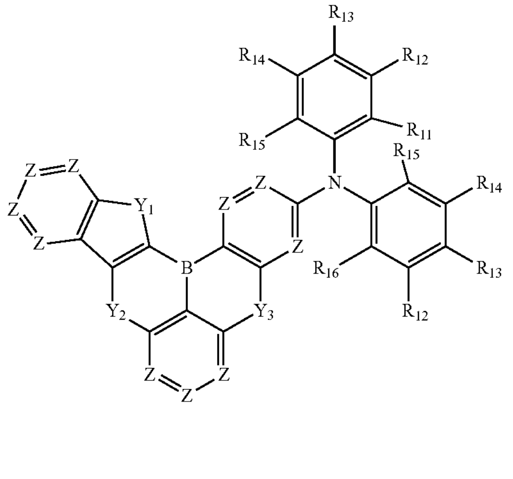

and the host is an anthracene compound represented by Formula 1:

(1)

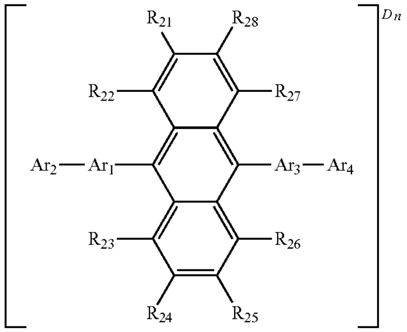

Structural features of Formula A-1 and specific compounds that can be represented by Formula A-1 are described below. $R_{11}$ to $R_{16}$, $Y_1$ to $Y_3$, and Z in Formula A-1 are as defined below. Structural features of Formula 1 and specific compounds that can be represented by Formula 1 are described below. $Ar_1$ to $Ar_4$, $R_{21}$ to $R_{28}$, and $D_n$ in Formula 1 are as defined below.

The polycyclic compound of the present invention can be employed in an organic layer of an organic electroluminescent device to achieve high efficiency and long lifetime of the device.

The polycyclic compound, whose structure is characterized by a boron-containing moiety and which has a polycyclic skeleton structure, and the anthracene derivative including one or more deuterium atoms in its anthracene skeleton are used as a dopant and a host in a light emitting layer of an organic electroluminescent device, respectively, achieving high efficiency and long lifetime of the device.

The present invention will now be described in more detail.

One aspect of the present invention is directed to a compound represented by Formula A-1:

(A-1)

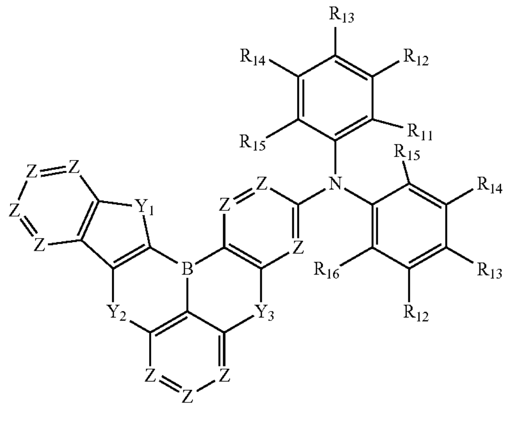

wherein each Z is independently CR or N,

R and $R_{12}$ to $R_{16}$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted germanium, substituted or unsubstituted boron, substituted or unsubstituted aluminum, phosphoryl, hydroxyl, selenium, tellurium, nitro, cyano, and halogen, with the proviso that each of $R_{12}$ to $R_{16}$ optionally forms an aliphatic or aromatic monocyclic or polycyclic ring with the other adjacent group(s), the moieties Z are identical to or different from each other, the groups R are identical to or different from each other, with the proviso that the groups R are optionally linked to each other to form an alicyclic or aromatic monocyclic or polycyclic ring, $Y_1$ is O or S, $Y_2$ and $Y_3$ are identical to or different from each other and are each independently selected from N—$R_1$, $CR_2R_3$, O, S, Se, and $SiR_4R_5$, $R_1$ to $R_5$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, $R_{11}$ is selected from substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, provided that when the adjacent Z is CR, each of $R_{15}$, $R_{16}$, and $R_1$ to $R_5$ optionally forms an alicyclic or aromatic monocyclic or polycyclic ring with R, with the proviso that $R_2$ and $R_3$ together optionally form an alicyclic or aromatic monocyclic or polycyclic ring and $R_4$ and $R_5$ together optionally form an alicyclic or aromatic monocyclic or polycyclic ring, with the proviso that at least one of $Y_2$ and $Y_3$ is represented by Structure A:

(A)

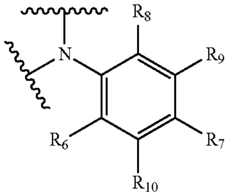

wherein $R_6$ is selected from substituted or unsubstituted $C_1$-$C_{30}$ alkyl, substituted or unsubstituted $C_6$-$C_{20}$ aryl, substituted or unsubstituted $C_2$-$C_{20}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, $R_7$ is selected from hydrogen, deuterium, substituted or unsubstituted $C_1$-$C_{30}$ alkyl, substituted or unsubstituted $C_3$-$C_{30}$ cycloalkyl, substituted or unsubstituted $C_6$-$C_{50}$ aryl, and substituted or unsubstituted $C_2$-$C_{20}$ heteroaryl, and $R_8$ to $R_{10}$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, with the proviso that each of $R_6$ to $R_{10}$ optionally forms an alicyclic or aromatic monocyclic or polycyclic ring with an adjacent substituent; and a highly efficient and long-lasting organic electroluminescent device including an organic layer employing the polycyclic compound.

According to one embodiment of the present invention, $R_{11}$ may be substituted or unsubstituted $C_6$-$C_{20}$ aryl and the aryl group may be substituted or unsubstituted phenyl.

According to one embodiment of the present invention, $R_6$ may be substituted or unsubstituted phenyl.

According to one embodiment of the present invention, one or more of the hydrogen atoms in the compound represented by Formula A-1 may be substituted with deuterium atoms and the degree of deuteration of the compound represented by Formula A-1 may be at least 5%.

The characteristic structures and ring-forming structures in Formula A-1 based on the definitions provided above can be identified from the specific compounds listed below.

A further aspect of the present invention is directed to an organic electroluminescent device including a first electrode, a second electrode, and one or more organic layers interposed between the first and second electrodes wherein one of the organic layers is a light emitting layer composed of a host and a dopant and wherein the dopant includes at least one compound represented by Formula A-1:

(A-1)

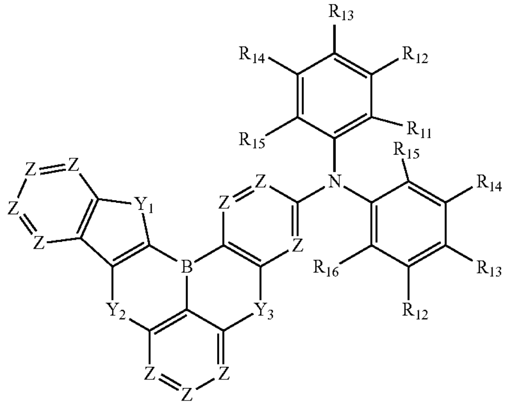

wherein $R_{11}$ to $R_{16}$, $Y_1$ to $Y_3$, and Z are as defined above, and the host is an anthracene compound represented by Formula 1:

(1)

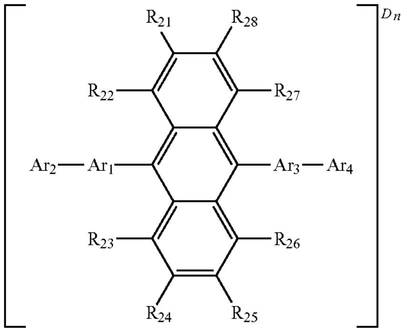

wherein $R_{21}$ to $R_{28}$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, $Ar_1$ and $Ar_3$ are identical to or different from each other and are each independently substituted or unsubstituted $C_6$-$C_{30}$ arylene or substituted or unsubstituted $C_5$-$C_{30}$ heteroarylene, $Ar_2$ and $Ar_4$ are identical to or different from each other and are each independently selected from substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, and substituted or unsubstituted $C_3$-$C_{30}$ mixed aliphatic-aromatic cyclic groups, $D_n$ represents the number of deuterium (D) atoms replacing hydrogen atoms in $Ar_1$ to $Ar_4$, and n is an integer from 0 to 40.

According to one embodiment of the present invention, at least one of $R_{21}$ to $R_{28}$ in Formula 1 may be a deuterium atom.

According to one embodiment of the present invention, at least four of $R_{21}$ to $R_{28}$ in Formula 1 may be deuterium atoms.

The degree of deuteration of the compound represented by Formula 1 may be at least 5%.

The content of the dopant in the light emitting layer is typically selected in the range of about 0.01 to about 20 parts by weight, based on about 100 parts by weight of the host, but is not limited thereto.

The light emitting layer may further include one or more dopants other than the dopant represented by Formula A-1 and one or more hosts other than the host represented by Formula 1. Thus, two or more different dopants and two or more different hosts may be mixed or stacked in the light emitting layer.

As used herein, the term "substituted" in the definition of $R_{11}$ to $R_{16}$, $Y_1$ to $Y_3$, and Z in Formulae A-1 and $Ar_1$ to $Ar_4$ and $R_{21}$ to $R_{28}$ in Formula 1 indicates substitution with one or more substituents selected from deuterium, $C_1$-$C_{30}$ alkyl, $C_2$-$C_{30}$ alkenyl, $C_2$-$C_{30}$ alkynyl, $C_6$-$C_{50}$ aryl, $C_3$-$C_{30}$ cycloalkyl, $C_3$-$C_{30}$ cycloalkenyl, $C_1$-$C_{30}$ heterocycloalkyl, $C_2$-$C_{50}$ heteroaryl, $C_3$-$C_{30}$ mixed aliphatic-aromatic cyclic groups, $C_1$-$C_{30}$ alkoxy, $C_6$-$C_{30}$ aryloxy, $C_1$-$C_{30}$ alkylthioxy, $C_5$-$C_{30}$ arylthioxy, amine, silyl, germanium, boron, aluminum, phosphoryl, hydroxyl, selenium, tellurium, nitro, cyano, and halogen, or a combination thereof. The term "unsubstituted" in the same definition indicates having no substituent. Hydrogen atoms in the substituents may be substituted with deuterium atoms.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The aromatic hydrocarbon rings or aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The aromatic heterocyclic rings or heteroaryl groups refer to aromatic groups interrupted by one or more heteroatoms. Examples of the aromatic heterocyclic rings or heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The aliphatic hydrocarbon rings refer to non-aromatic rings consisting only of carbon and hydrogen atoms. The aliphatic hydrocarbon ring is intended to include monocyclic and polycyclic ones and may be optionally substituted with one or more other substituents. As used herein, the term "polycyclic" means that the aliphatic hydrocarbon ring may be directly attached or fused to one or more other cyclic groups. The other cyclic groups may be aliphatic hydrocarbon rings and other examples thereof include aliphatic heterocyclic, aryl, and heteroaryl groups. Specific examples of the aliphatic hydrocarbon rings include, but are not limited to, cycloalkyl groups such as cyclopropyl, cyclobutyl, cyclopentyl, adamantyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, and cyclooctyl, cycloalkanes such as cyclohexane and cyclopentane, and cycloalkenes such as cyclohexene and cyclopentene.

The aliphatic heterocyclic rings refer to aliphatic rings interrupted by one or more heteroatoms such as O, S, Se, N, and Si. The aliphatic heterocyclic ring is intended to include monocyclic or polycyclic ones and may be optionally substituted with one or more other substituents. As used herein, the term "polycyclic" means that the aliphatic heterocyclic ring such as heterocycloalkyl, heterocycloalkane or heterocycloalkene may be directly attached or fused to one or more other cyclic groups. The other cyclic groups may be aliphatic heterocyclic rings and other examples thereof include aliphatic hydrocarbon rings, aryl groups, and heteroaryl groups.

The mixed aliphatic-aromatic cyclic groups (or fused polycyclic non-aromatic hydrocarbon rings) refer to structures in which at least one aliphatic ring and at least one aromatic ring are linked and fused together and which are overall non-aromatic. The mixed aliphatic-aromatic polycyclic rings may contain one or more heteroatoms selected from N, O, P, and S other than carbon atoms (C). This definition applies to the fused polycyclic non-aromatic heterocyclic rings.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include —$SiH_3$, alkylsilyl, arylsilyl, alkylarylsilyl, arylheteroarylsilyl, and heteroarylsilyl. The arylsilyl refers to a silyl group obtained by substituting one, two or three of the hydrogen atoms in —$SiH_3$ with aryl groups. The alkylsilyl refers to a silyl group obtained by substituting one, two or three of the hydrogen atoms in —$SiH_3$ with alkyl groups. The alkylarylsilyl refers to a silyl group obtained by substituting one of the hydrogen atoms in —$SiH_3$ with an alkyl group and the other two hydrogen atoms with aryl groups or substituting two of the hydrogen atoms in —$SiH_3$ with alkyl groups and the remaining hydrogen atom with an aryl group. The arylheteroarylsilyl refers to a silyl group obtained by substituting one of the hydrogen atoms in —$SiH_3$ with an aryl group and the other two hydrogen atoms with heteroaryl groups or substituting two of the hydrogen atoms in —$SiH_3$ with aryl groups and the remaining hydrogen atom with a heteroaryl group. The heteroarylsilyl refers to a silyl group obtained by substituting one, two or three of the hydrogen atoms in —$SiH_3$ with heteroaryl groups. The arylsilyl group may be, for example, substituted or unsubstituted monoarylsilyl, substituted or unsubstituted diarylsilyl, or substituted or unsubstituted triarylsilyl. The same applies to the alkylsilyl and heteroarylsilyl groups.

Each of the aryl groups in the arylsilyl, heteroarylsilyl, and arylheteroarylsilyl groups may be a monocyclic or polycyclic one. Each of the heteroaryl groups in the arylsilyl, heteroarylsilyl, and arylheteroarylsilyl groups may be a monocyclic or polycyclic one.

Specific examples of the silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl. One or more of the hydrogen atoms in each of the silyl groups may be substituted with the substituents mentioned in the aryl groups.

The amine group is intended to include —$NH_2$, alkylamine, arylamine, arylheteroarylamine, and heteroarylamine. The arylamine refers to an amine group obtained by substituting one or two of the hydrogen atoms in —$NH_2$ with aryl groups. The alkylamine refers to an amine group obtained by substituting one or two of the hydrogen atoms in —$NH_2$ with alkyl groups. The alkylarylamine refers to an amine group obtained by substituting one of the hydrogen atoms in —$NH_2$ with an alkyl group and the other hydrogen atom with an aryl group. The arylheteroarylamine refers to an amine group obtained by substituting one of the hydrogen atoms in —$NH_2$ with an aryl group and the other hydrogen atom with a heteroaryl group. The heteroarylamine refers to an amine group obtained by substituting one or two of the hydrogen atoms in —$NH_2$ with heteroaryl groups. The arylamine may be, for example, substituted or unsubstituted monoarylamine, substituted or unsubstituted diarylamine, or substituted or unsubstituted triarylamine. The same applies to the alkylamine and heteroarylamine groups.

Each of the aryl groups in the arylamine, heteroarylamine, and arylheteroarylamine groups may be a monocyclic or polycyclic one. Each of the heteroaryl groups in the arylamine, heteroarylamine, and arylheteroarylamine groups may be a monocyclic or polycyclic one.

The germanium group is intended to include —$GeH_3$, alkylgermanium, arylgermanium, heteroarylgermanium, alkylarylgermanium, alkylheteroarylgermanium, and arylheteroarylgermanium. The definitions of the substituents in the germanium groups follow those described for the silyl groups, except that the silicon (Si) atom in each silyl group is changed to a germanium (Ge) atom.

Specific examples of the germanium groups include trimethylgermane, triethylgermane, triphenylgermane, trimethoxygermane, dimethoxyphenylgermane, diphenylmethylgermane, diphenylvinylgermane, methylcyclobutylgermane, and dimethylfurylgermane. One or more of the hydrogen atoms in each of the germanium groups may be substituted with the substituents mentioned in the aryl groups.

The aryl groups in the aryloxy and arylthioxy groups are the same as those exemplified above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. Specific examples of the arylthioxy groups include, but are not limited to, phenylthioxy, 2-methylphenylthioxy, and 4-tert-butylphenylthioxy groups.

The halogen group may be, for example, fluorine, chlorine, bromine or iodine.

More specifically, the compound represented by Formula A-1 according to the present invention may be selected from, but not limited to, the following compounds 1 to 87:

1

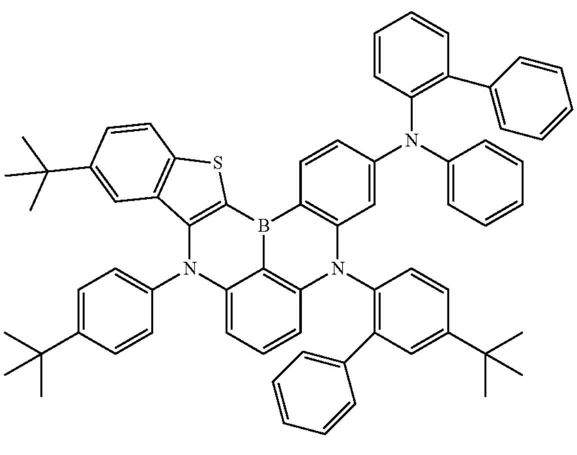

2

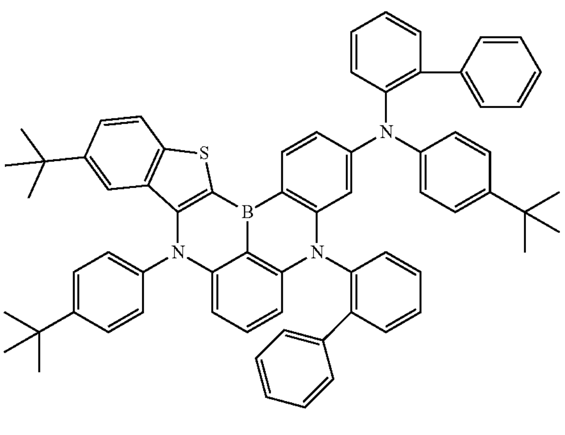

-continued
3
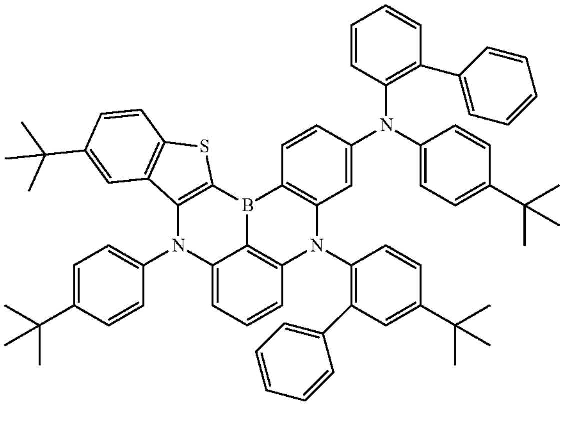
4
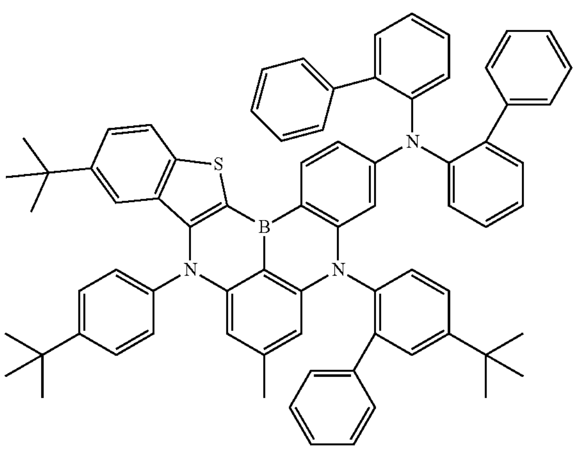
5
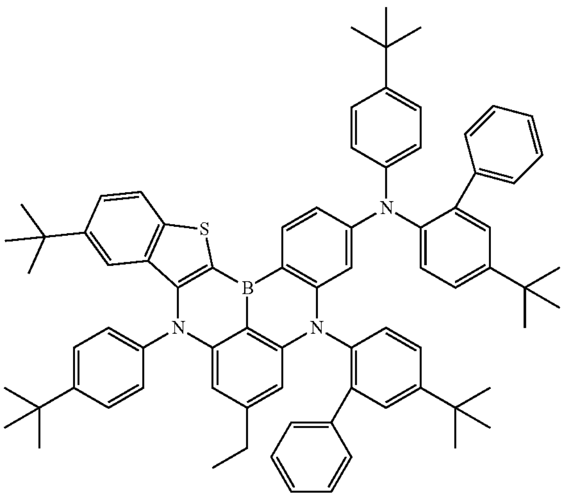
6
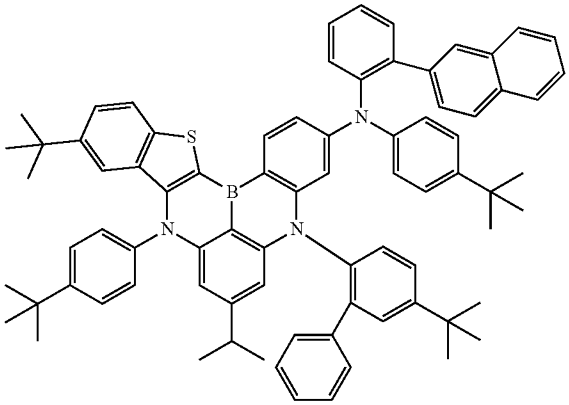
7
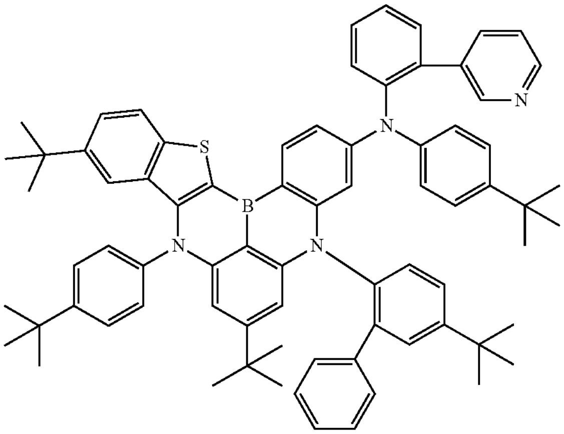
8
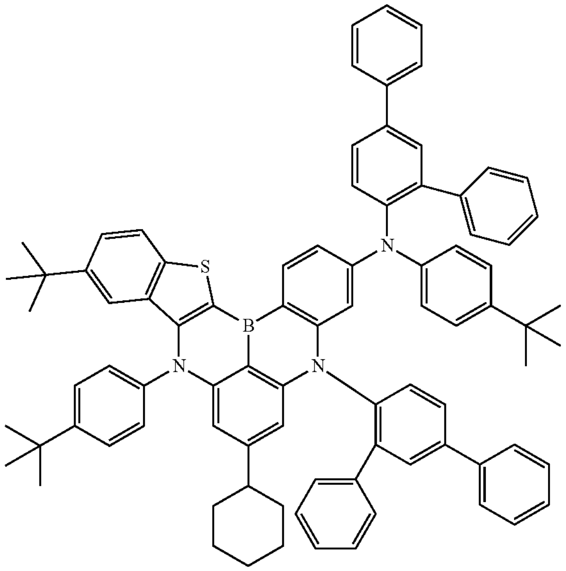

-continued
9
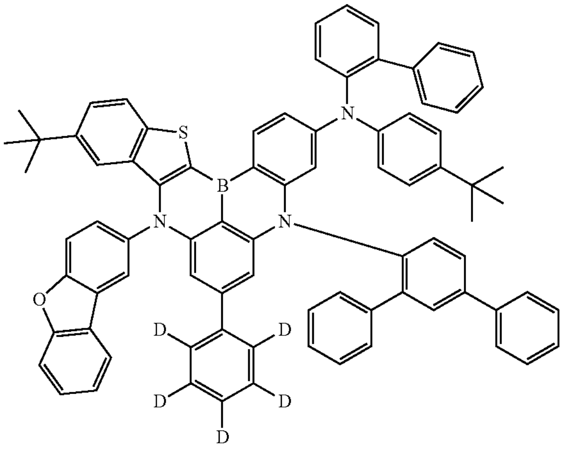
10
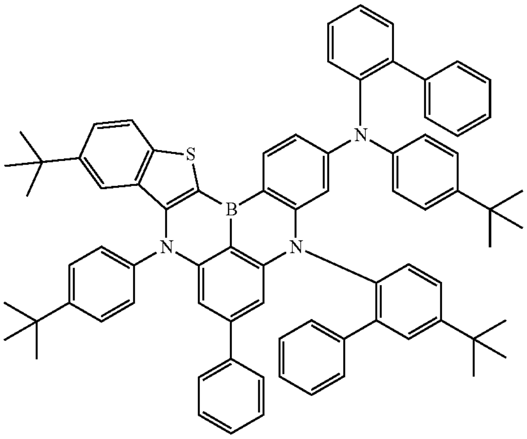
11
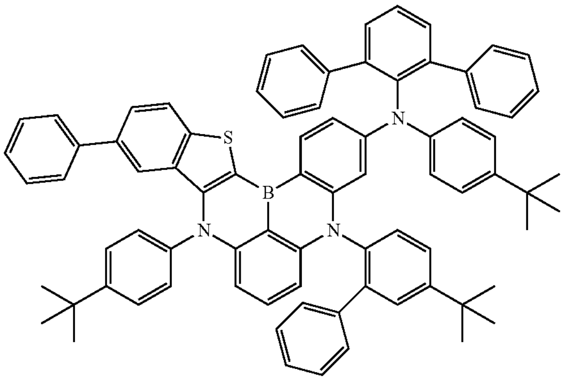
12
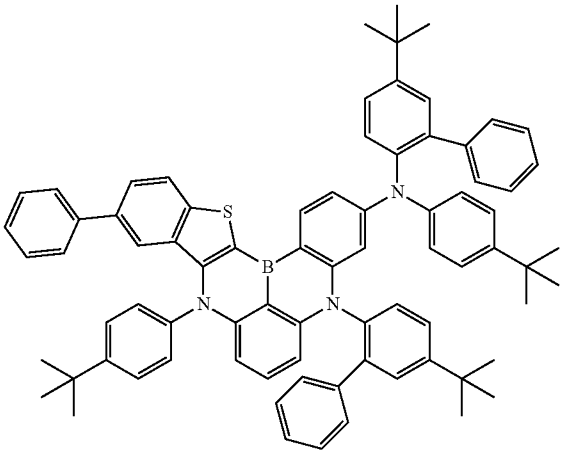
13
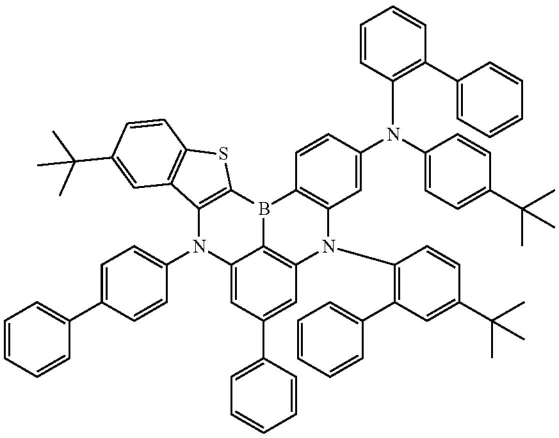
14
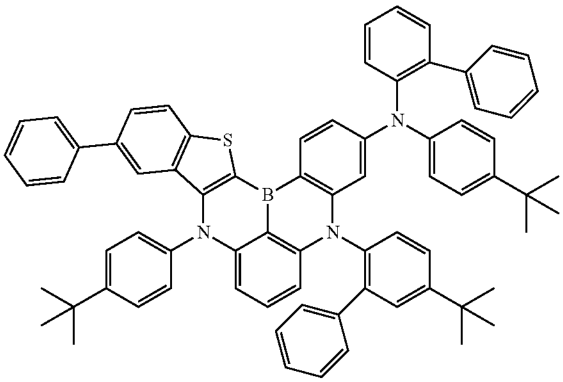

-continued
15
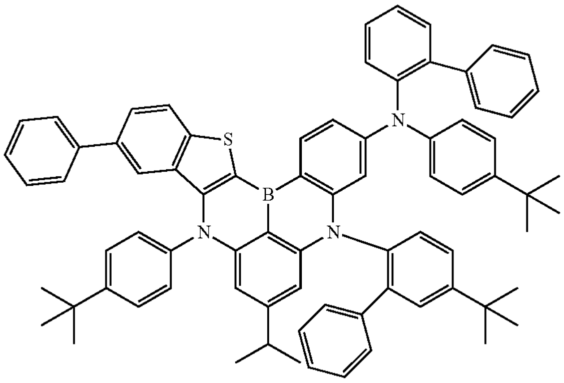
16
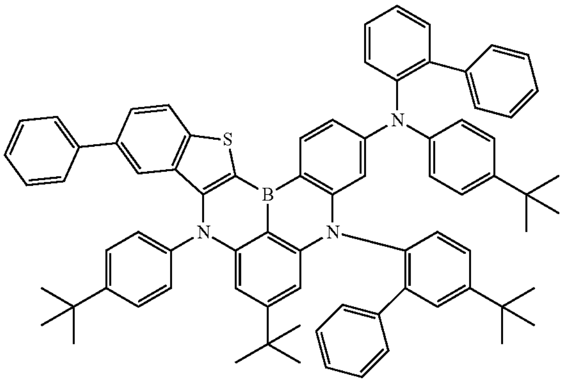
17
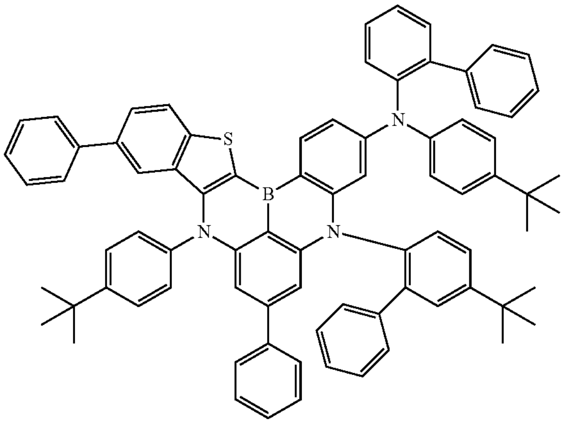
18
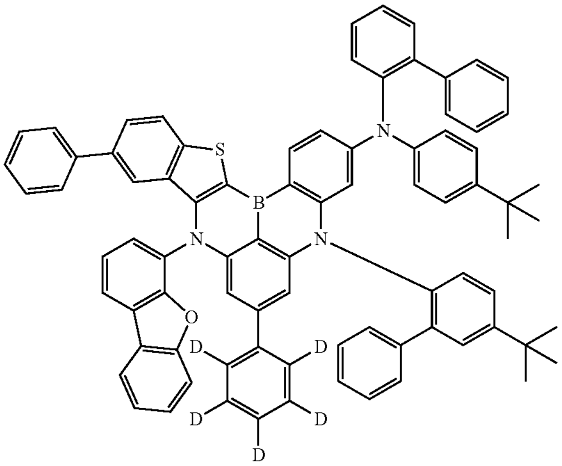
19
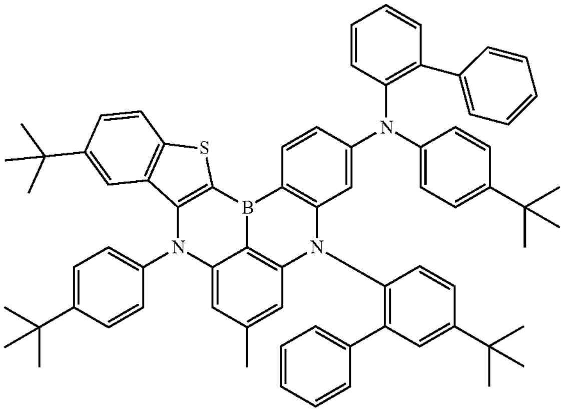
20
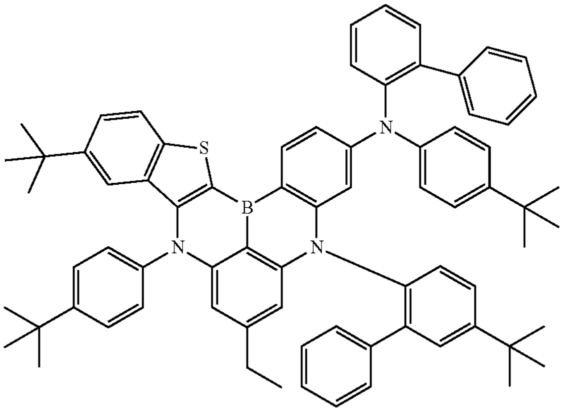

-continued
21
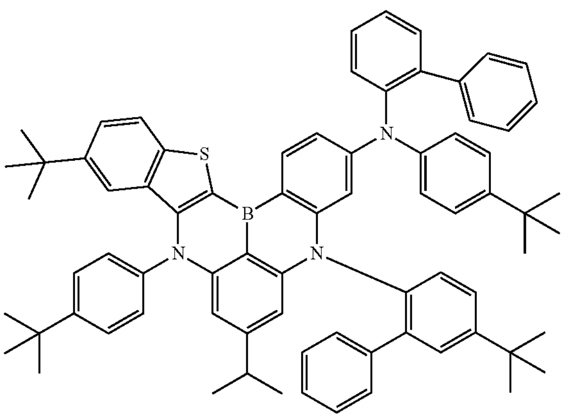
22
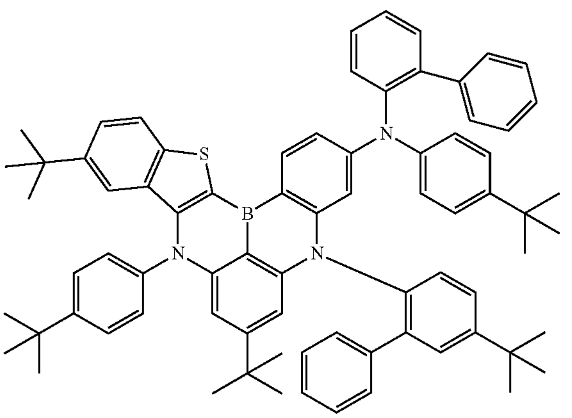
23
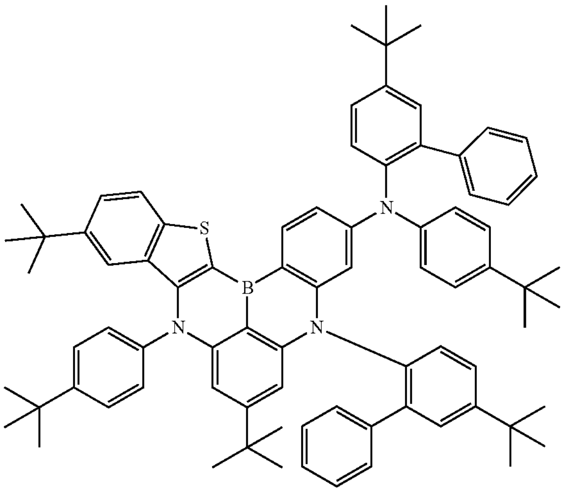
24
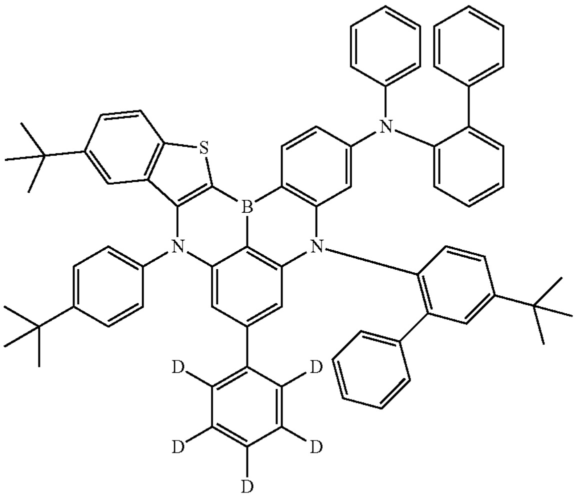
25
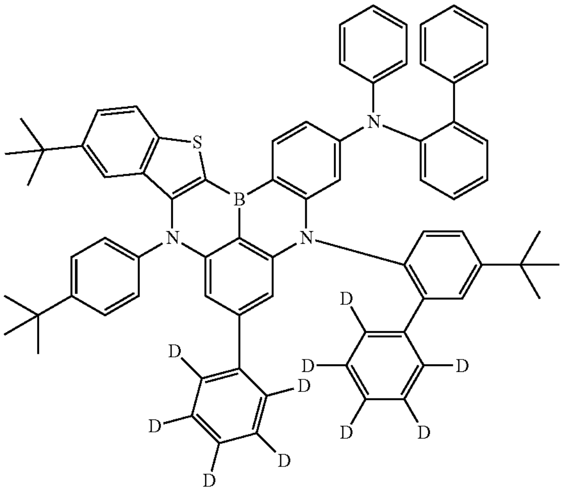
26
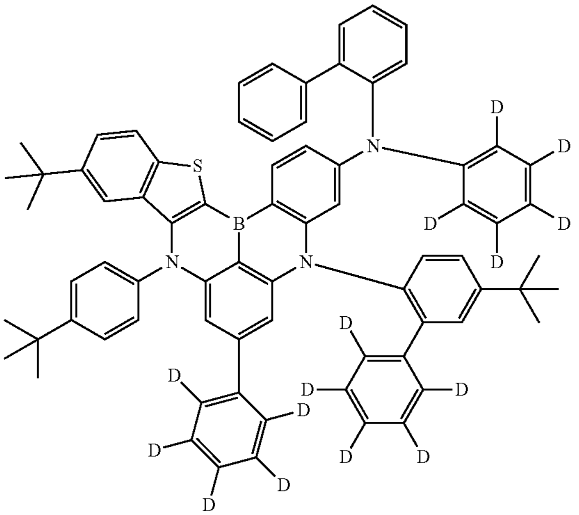

-continued
27
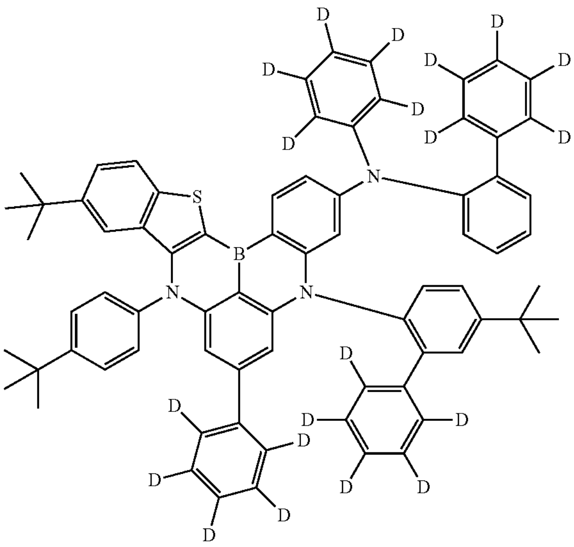
28
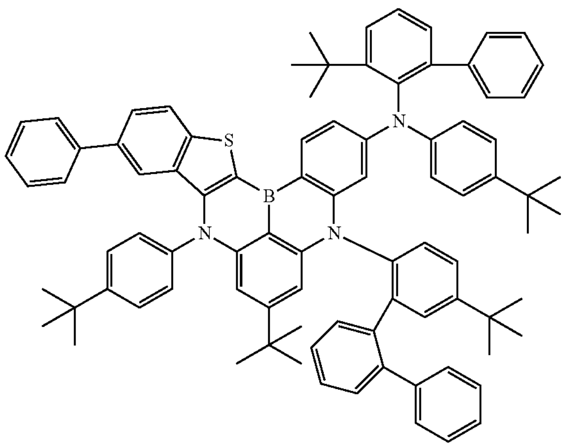
29
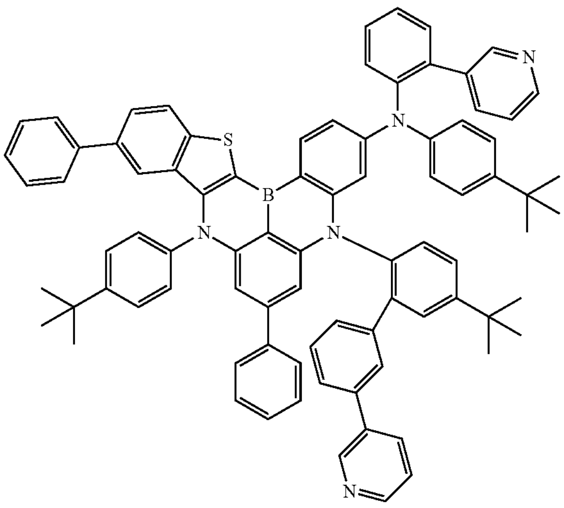
30
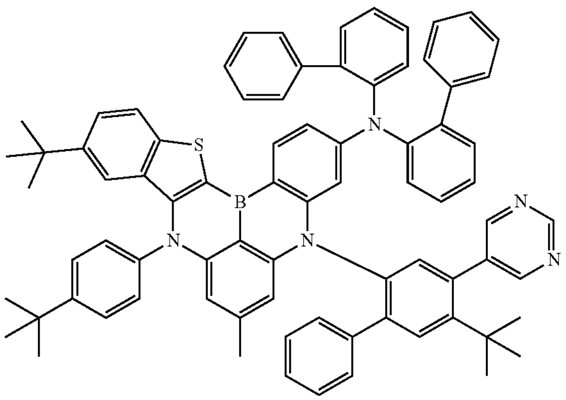
31
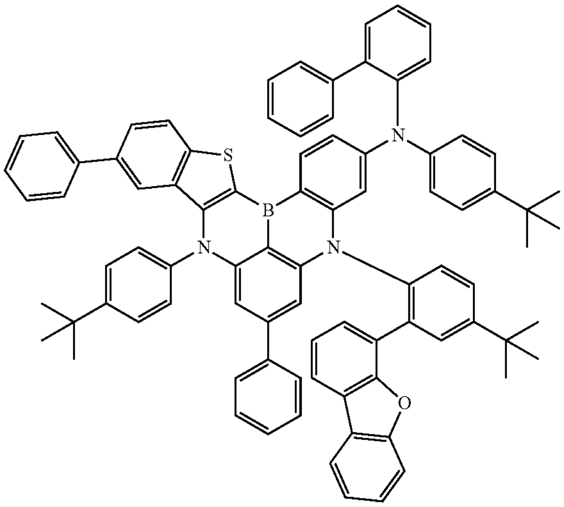
32
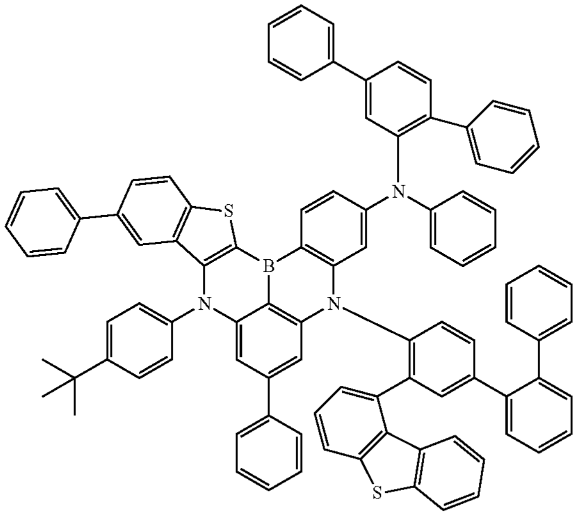

-continued
33
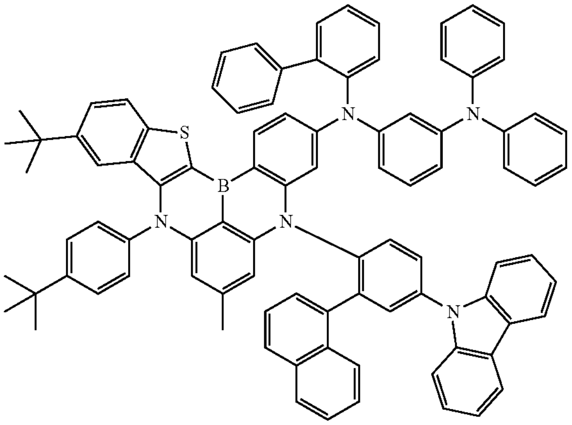
34
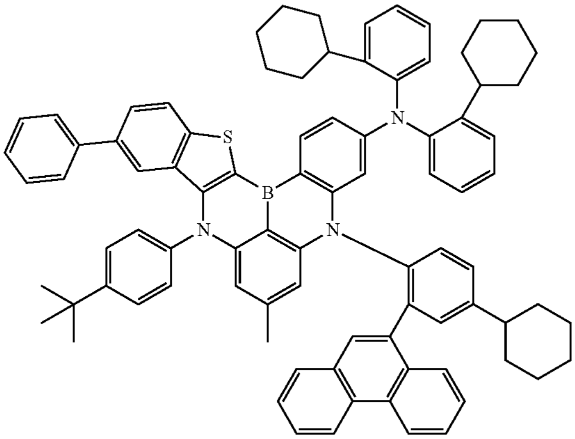
35
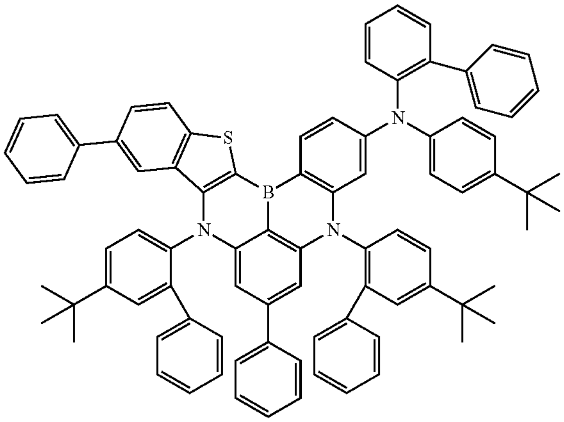
36
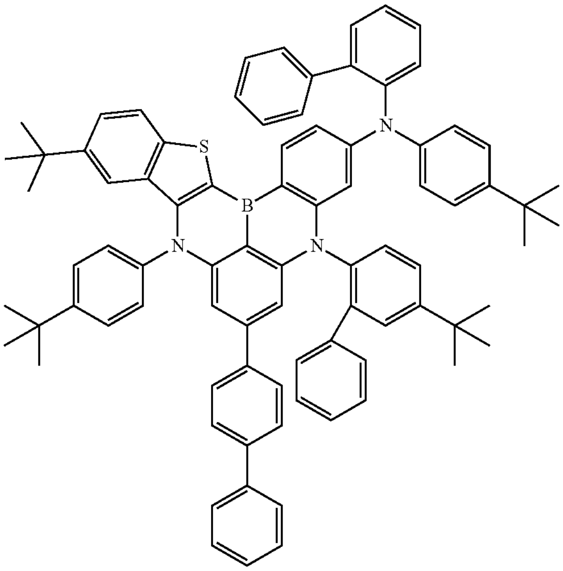
37
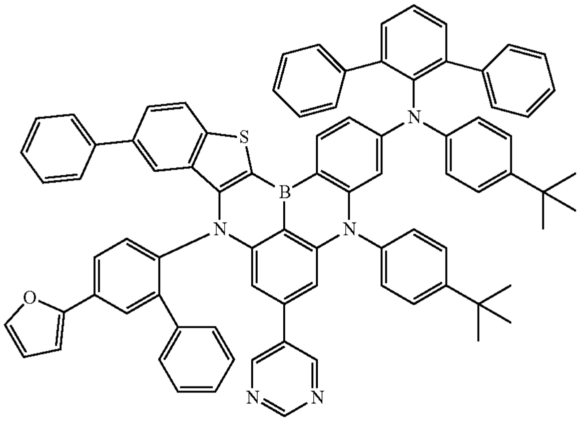
38
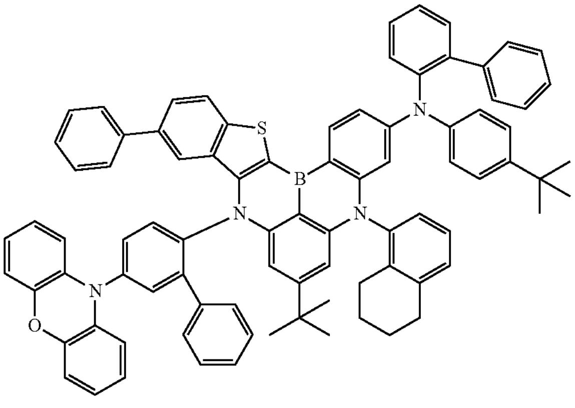

-continued
39
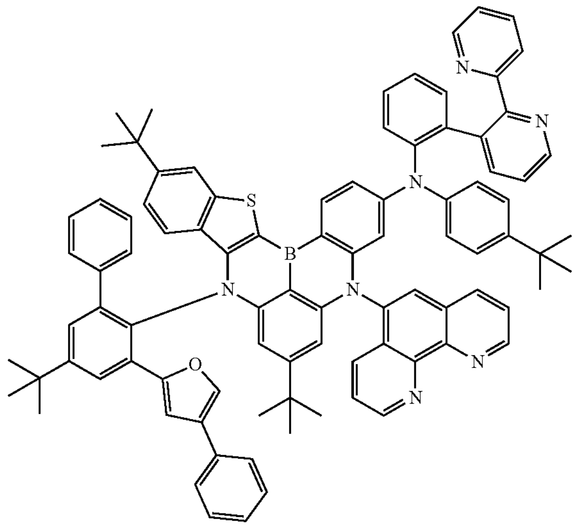
40
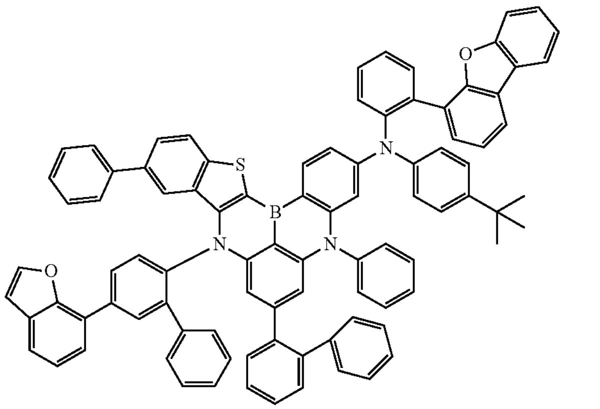
41
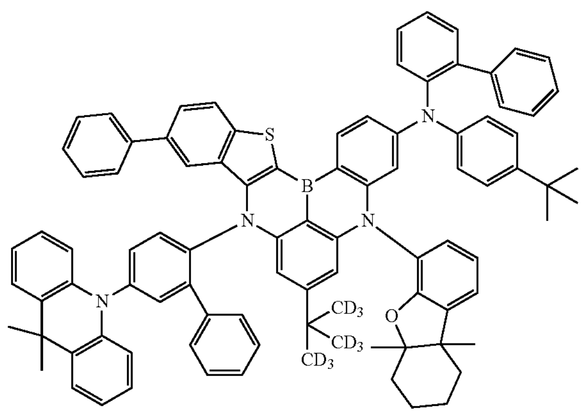
42
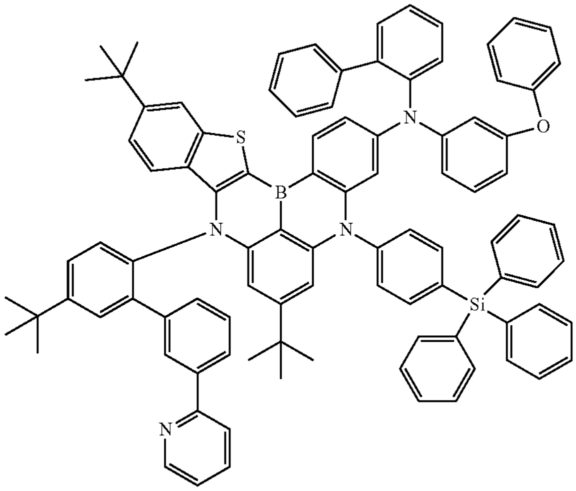
43
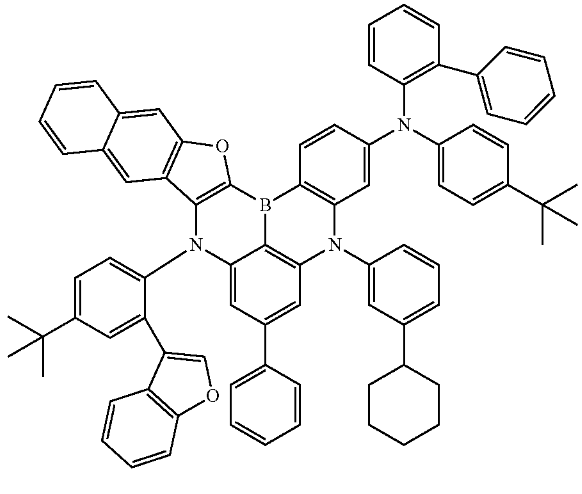
44
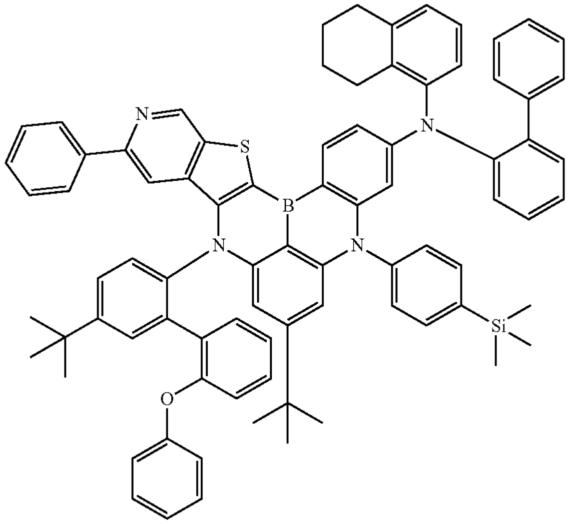

-continued
45
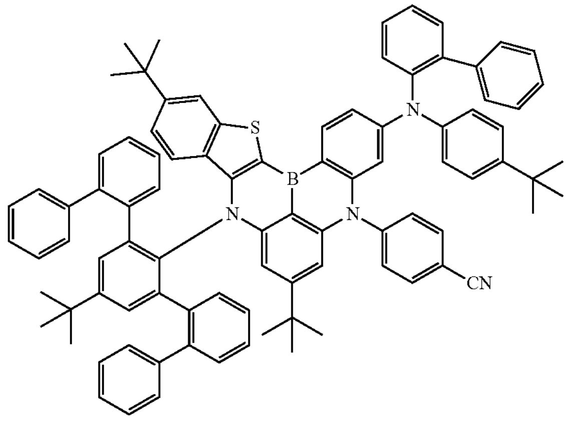
46
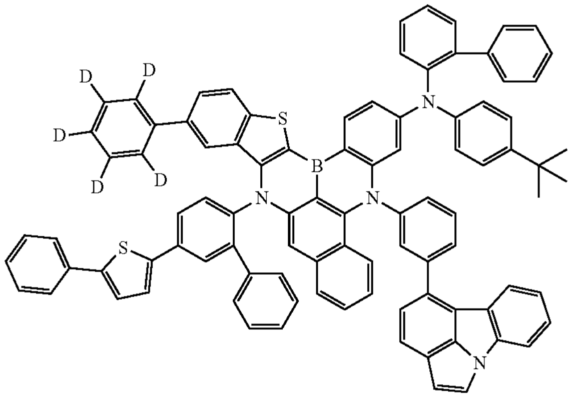
47
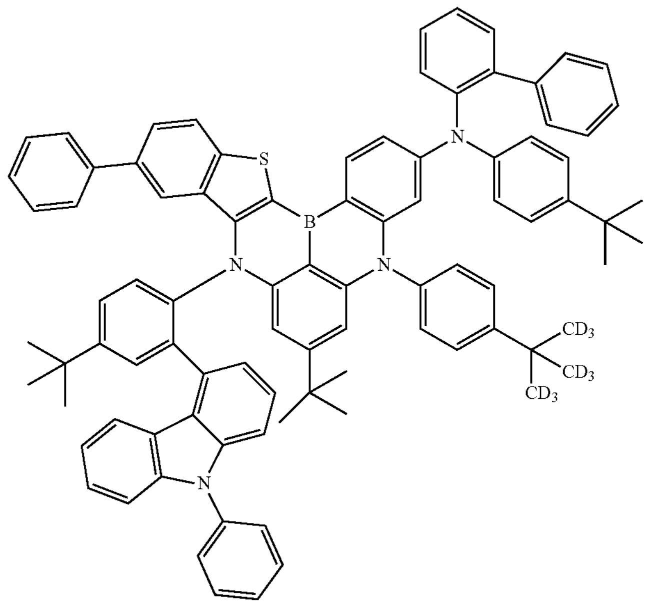
48
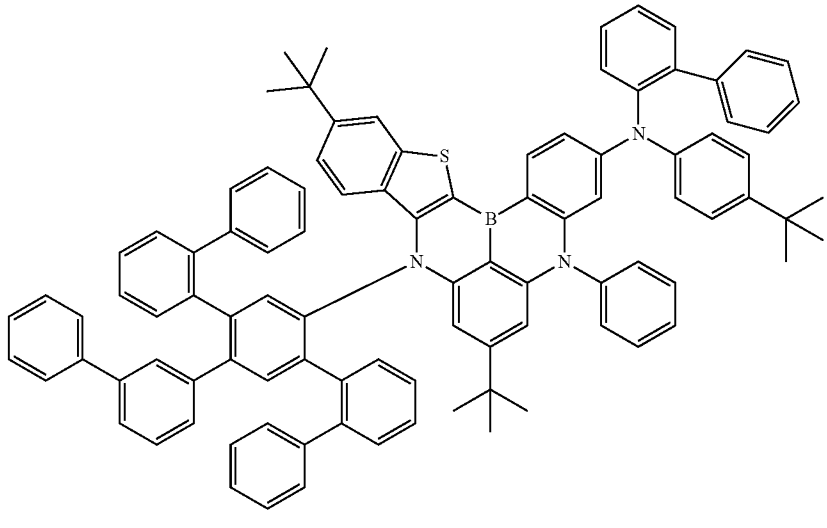

-continued
49
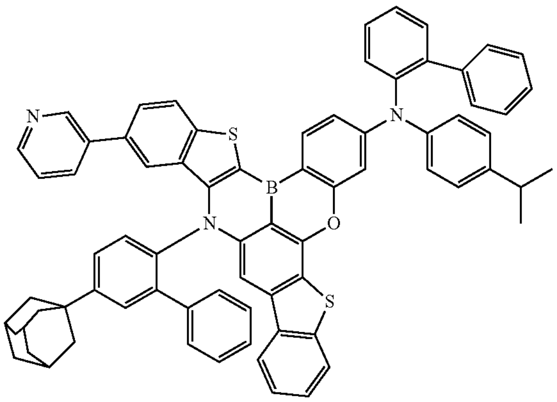
50
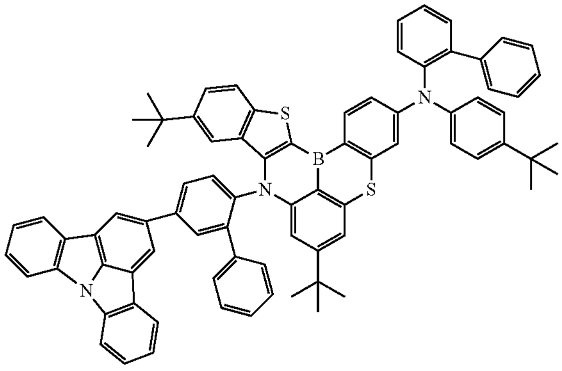
51
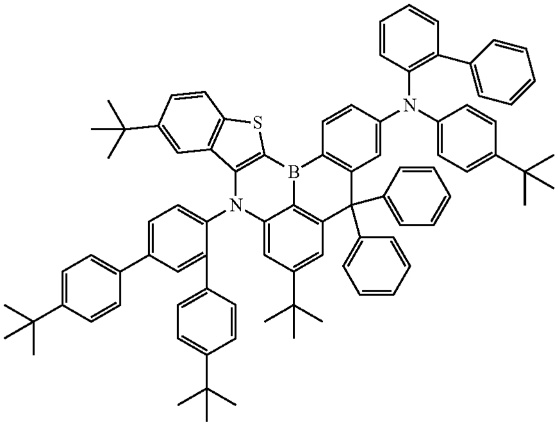
52
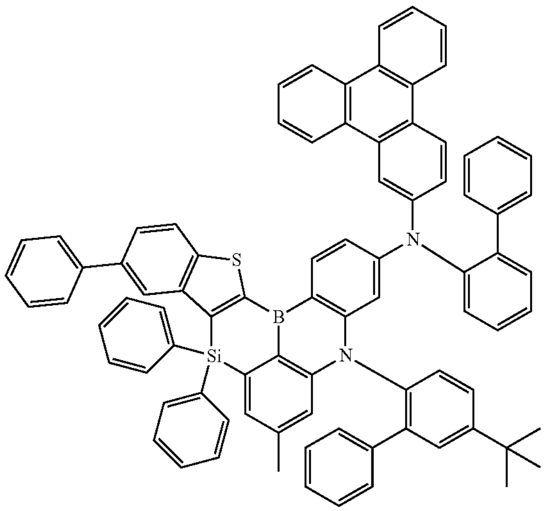
53
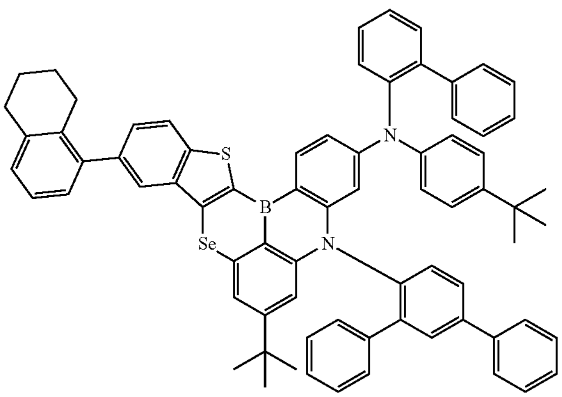
54
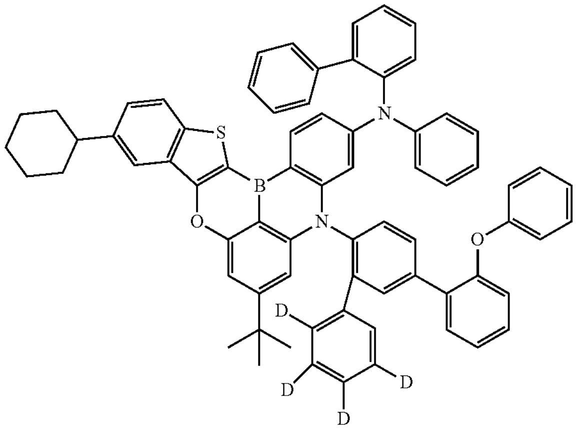

-continued
55
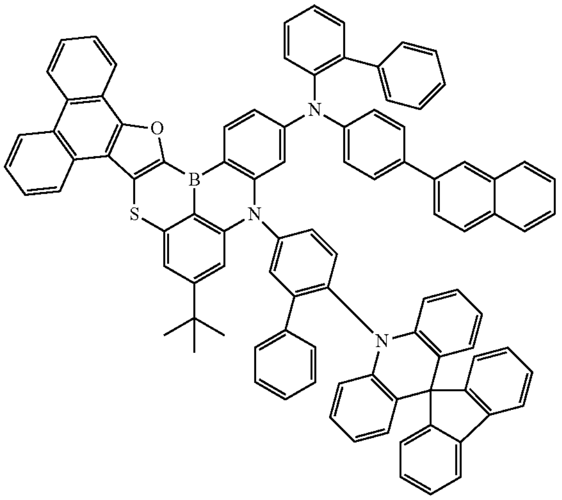
56
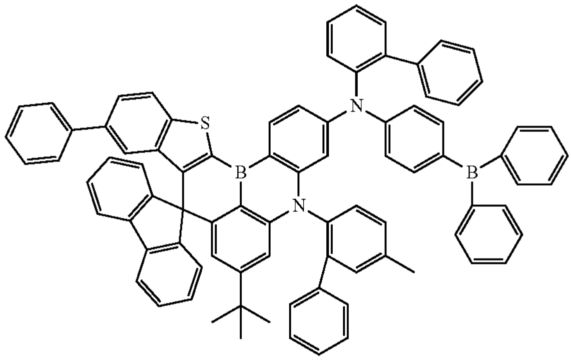
57
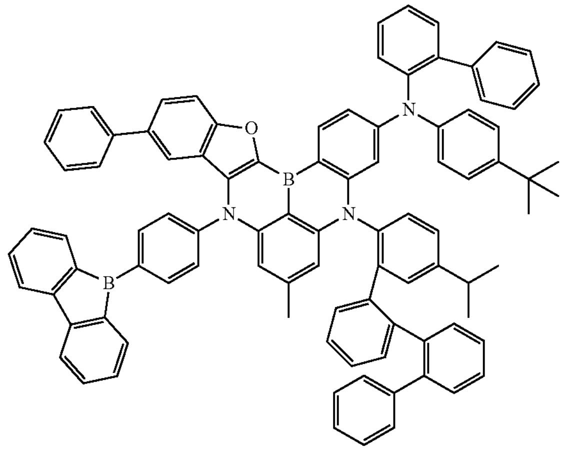
58
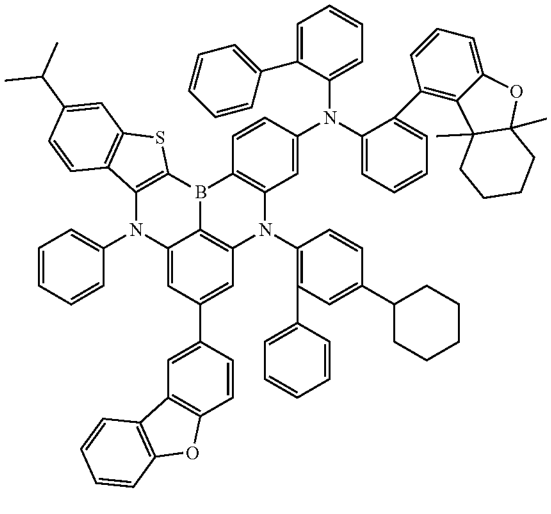
59
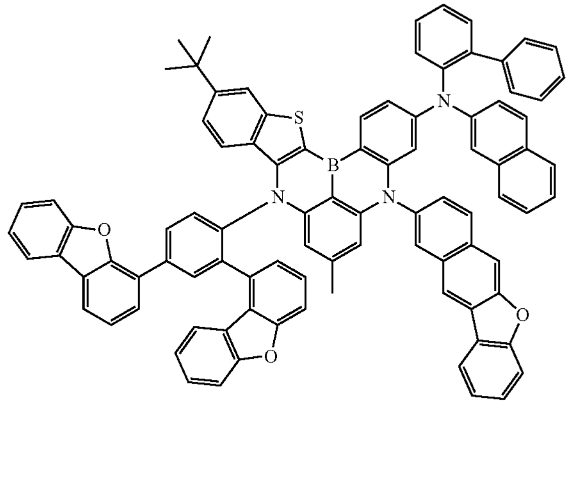
60
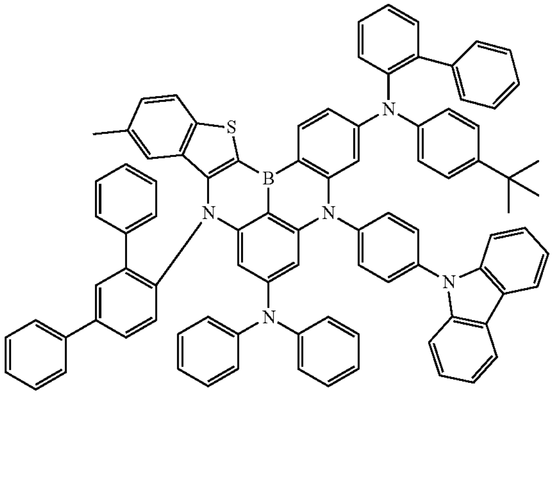

-continued
61
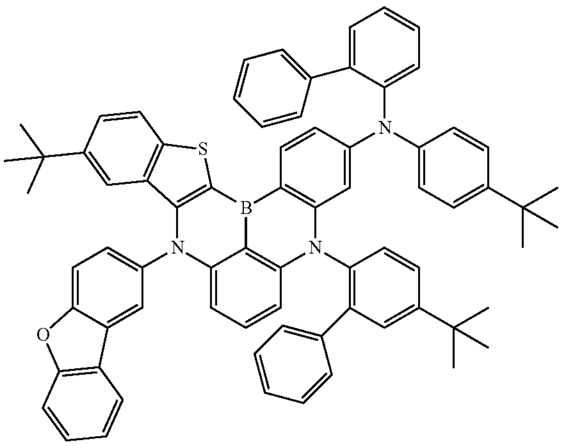
62
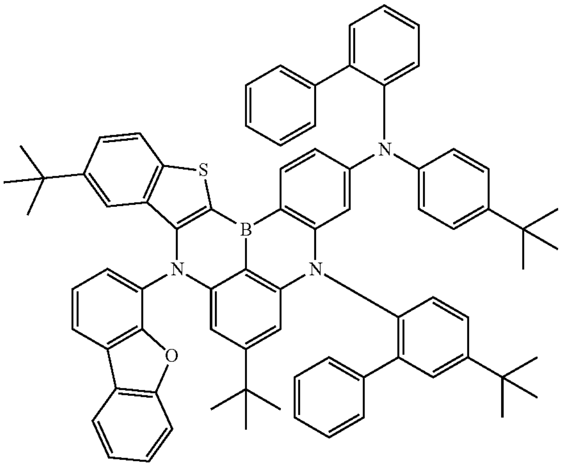
63
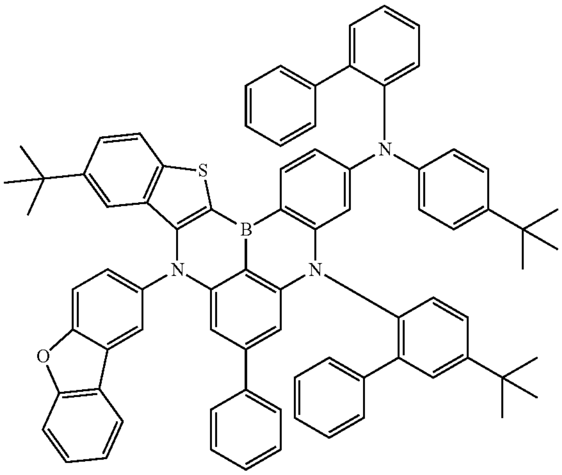
64
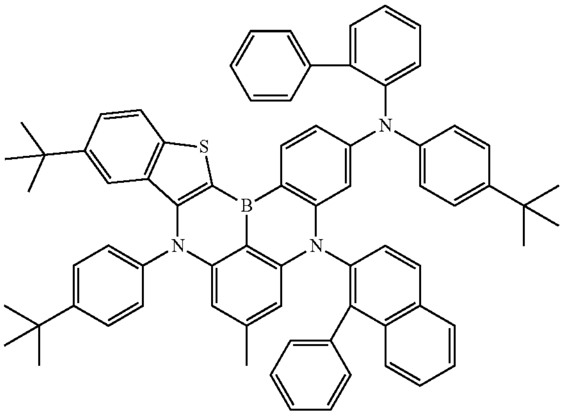
65
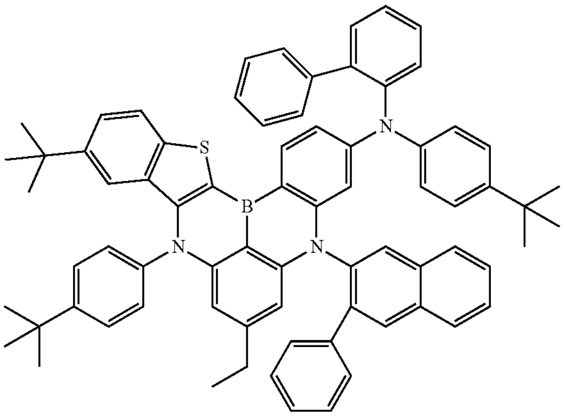
66
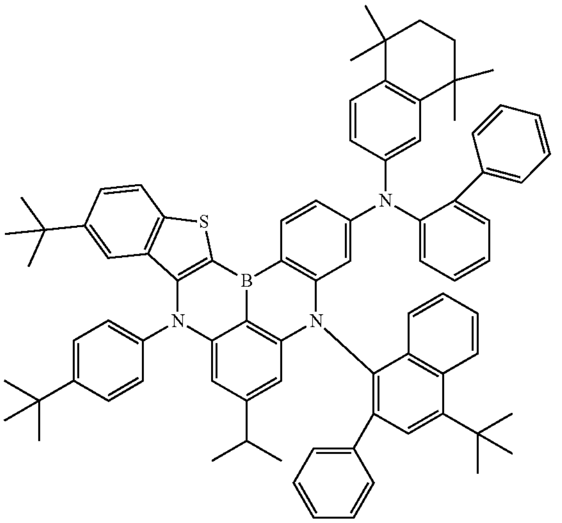

-continued
67
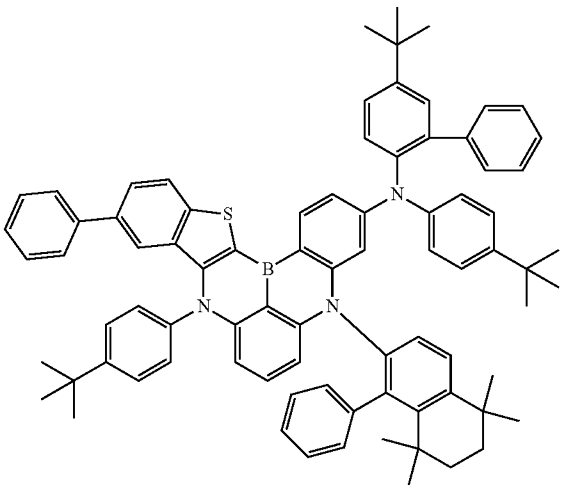
68
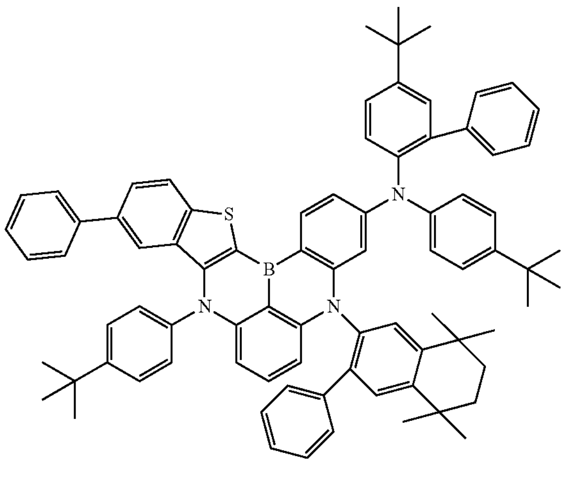
69
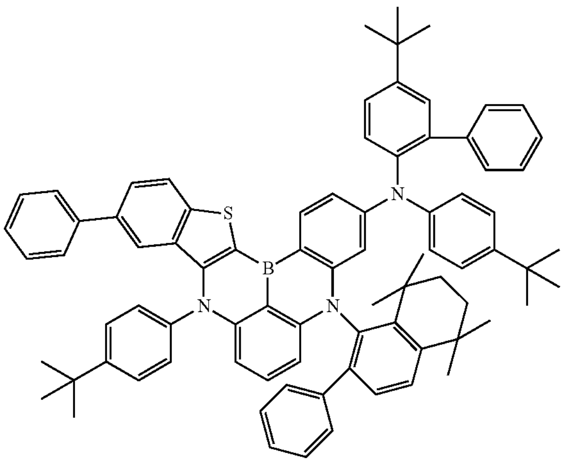
70
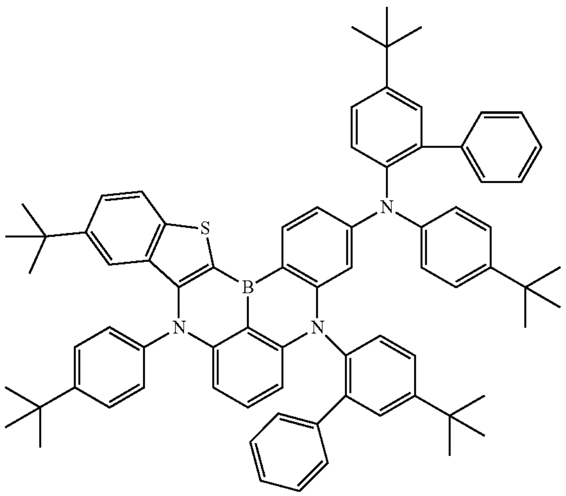
71
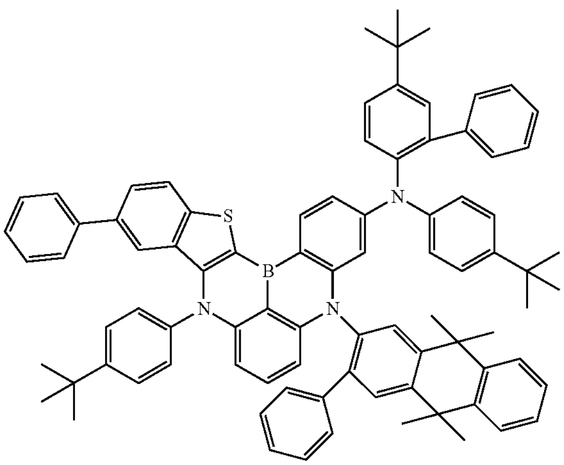
72
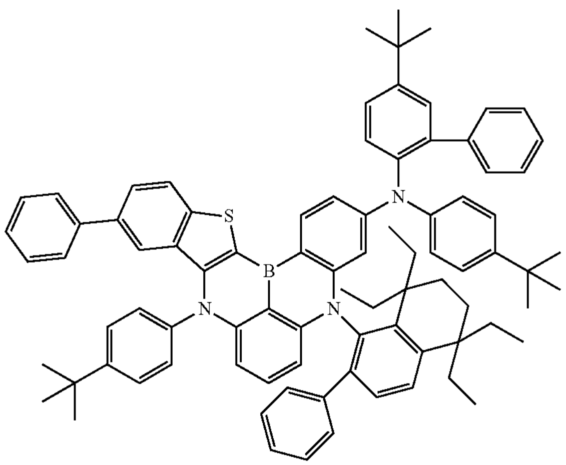

-continued
73
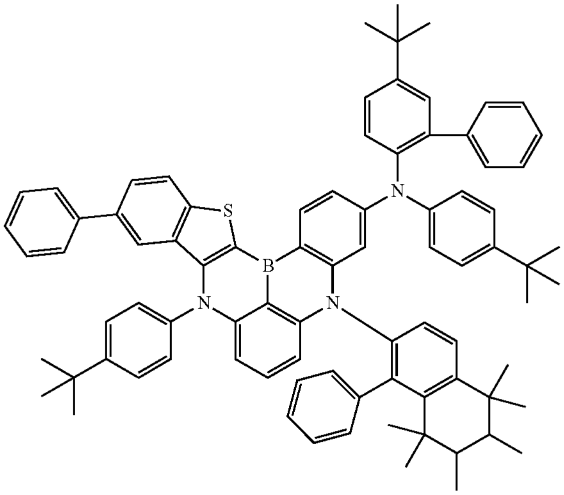
74
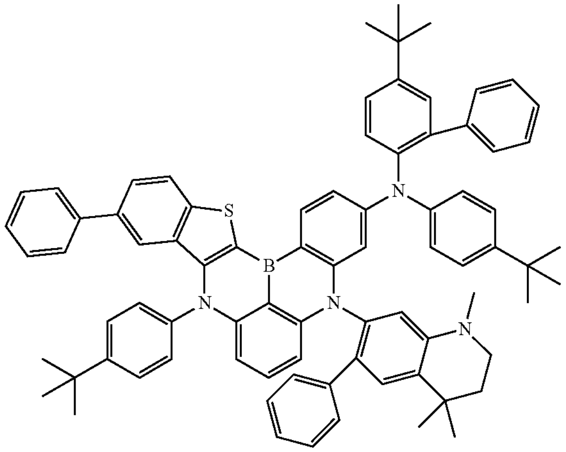
75
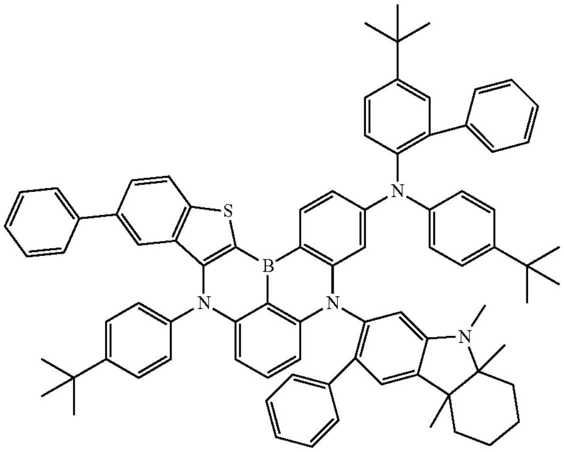
76
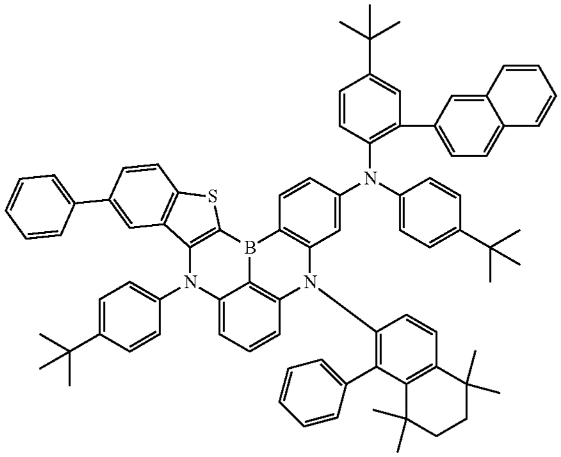
77
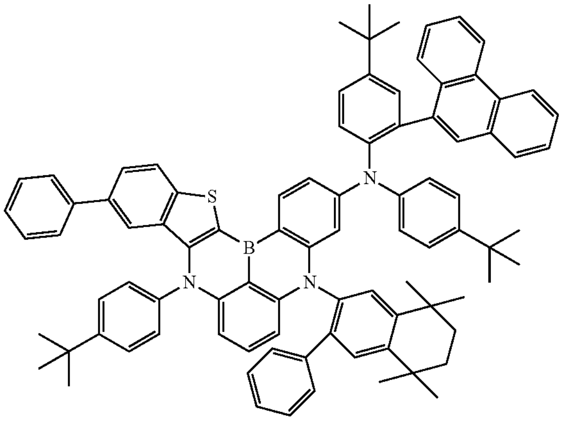
78
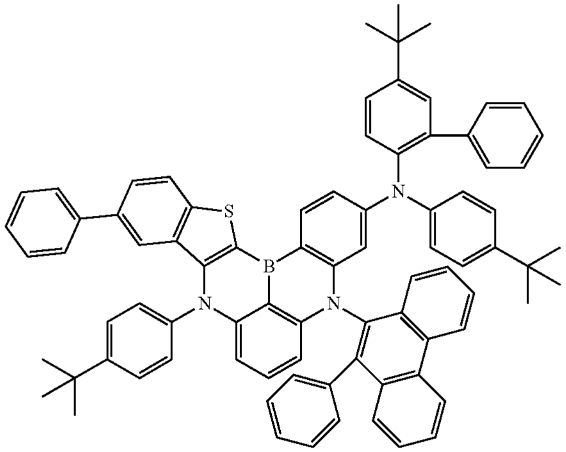

-continued
79
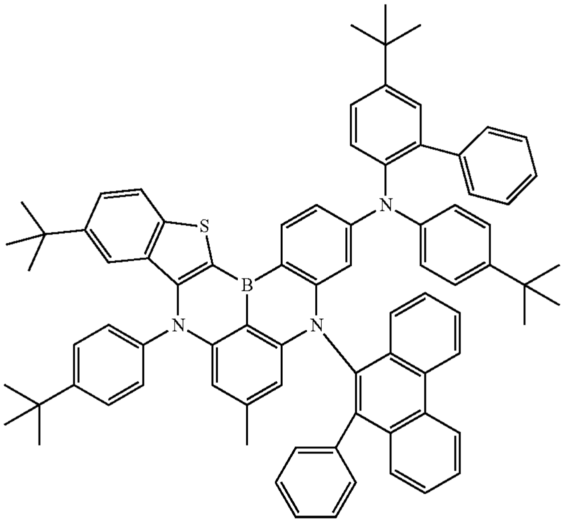
80
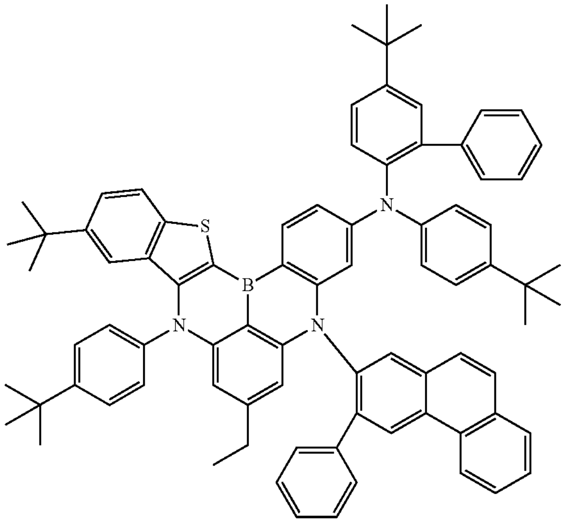
81
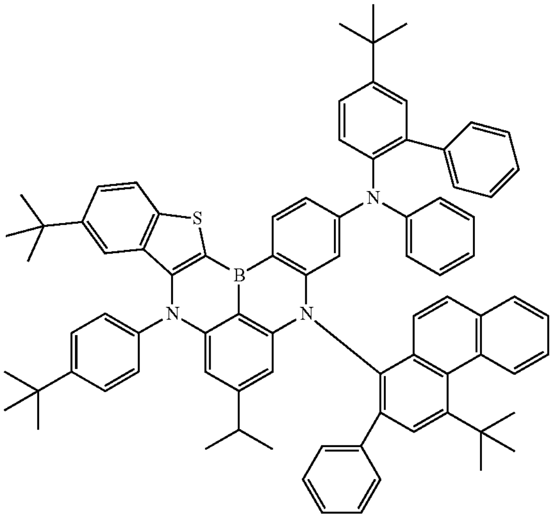
82
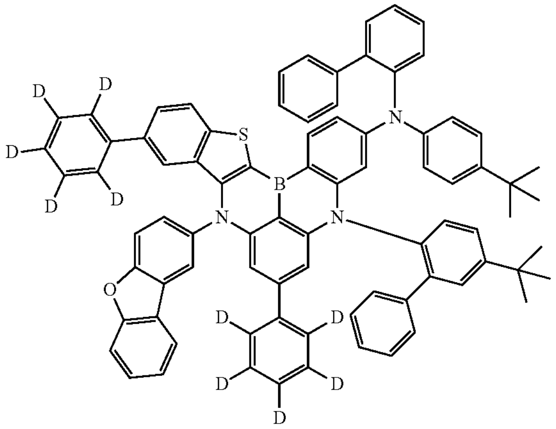
83
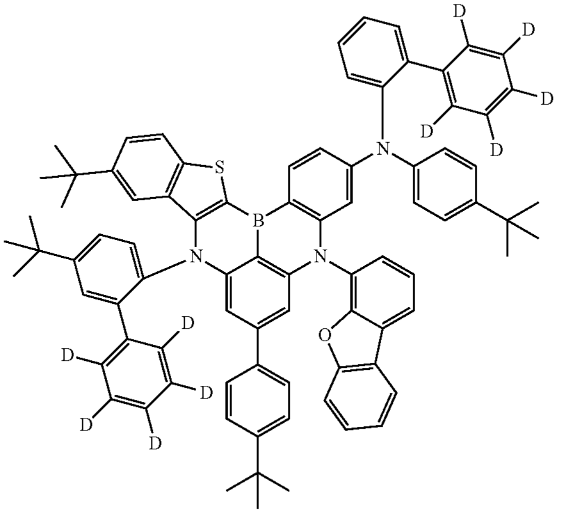
84
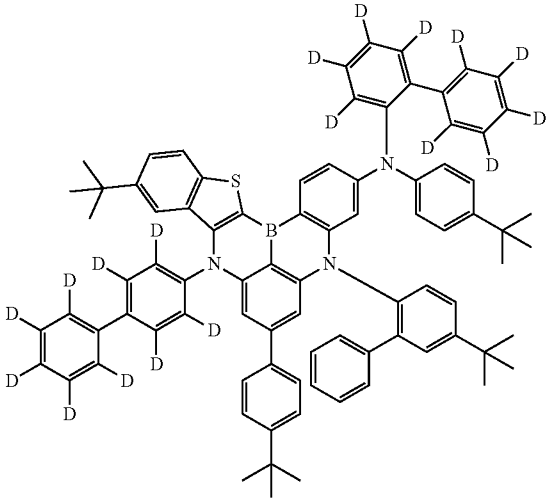

-continued
85
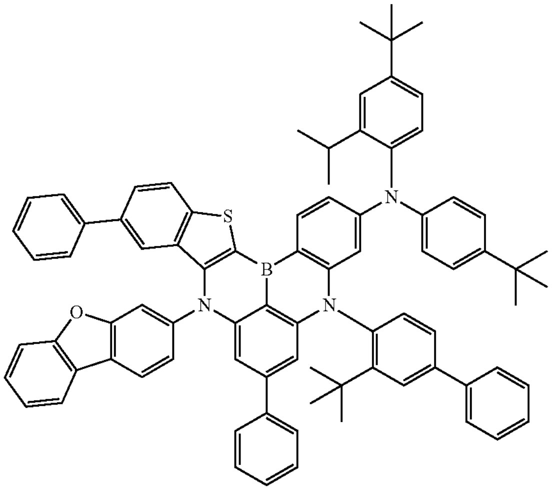
86
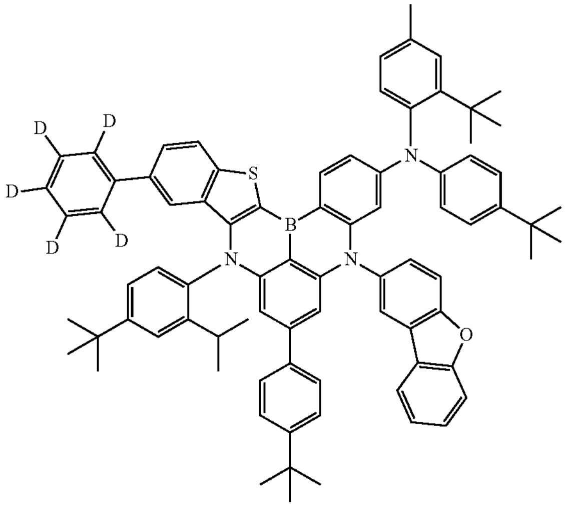
87
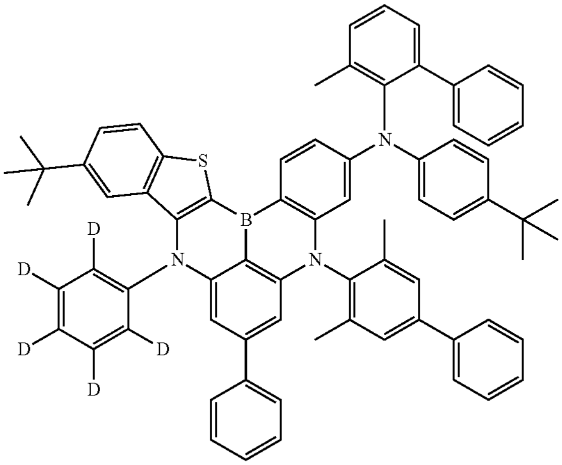
The specific substituents in Formula A-1 can be clearly seen from the structures of the compounds 1 to 87.
More specifically, the compound represented by Formula 1 may be selected from the group consisting of, but not limited to, the following compounds 1-1:
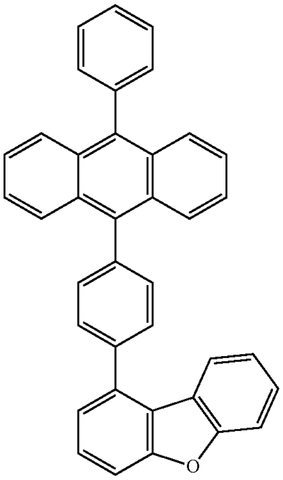
-continued
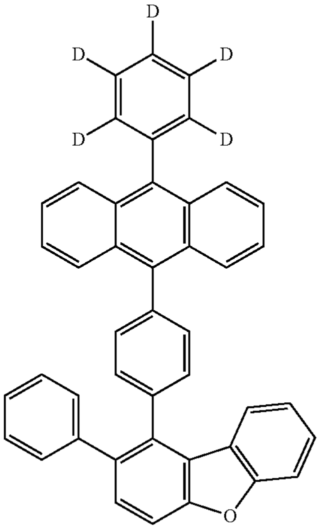

-continued
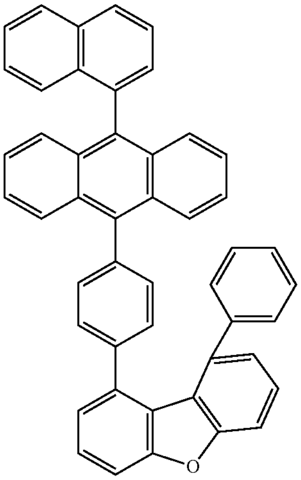
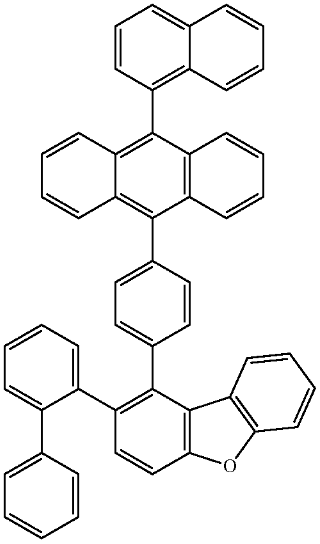
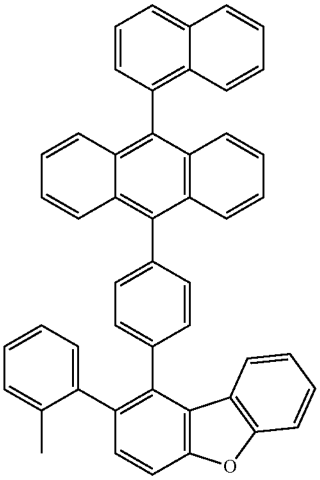
-continued
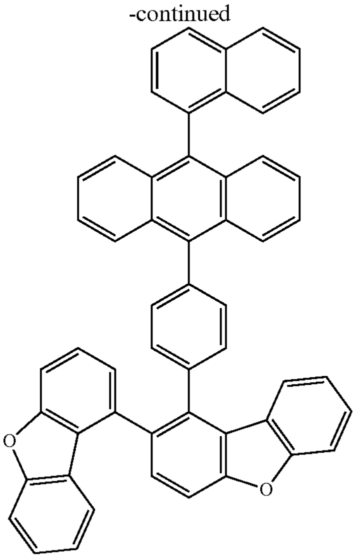
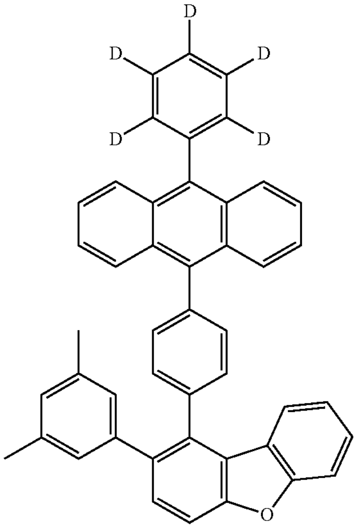
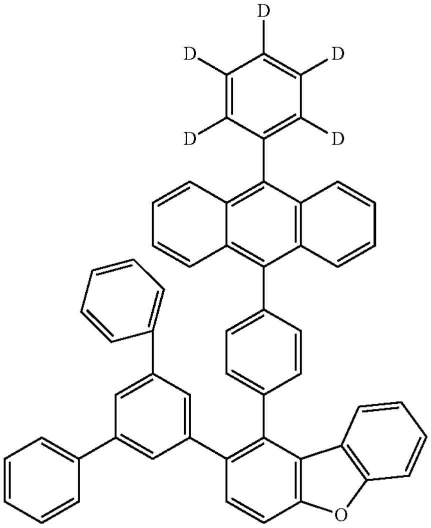

-continued
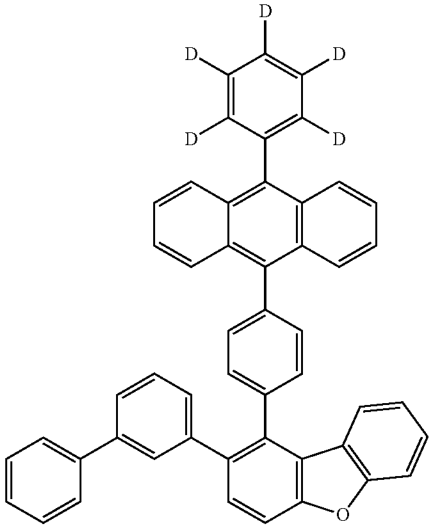
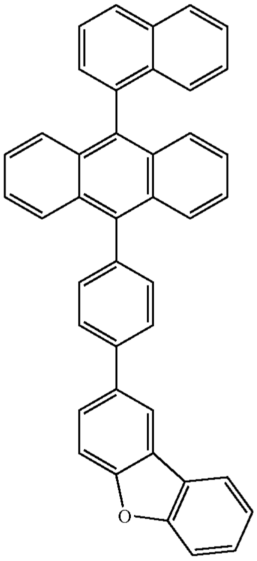
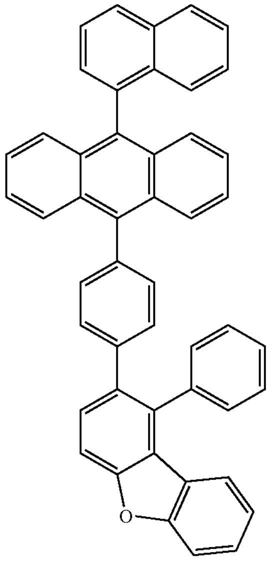
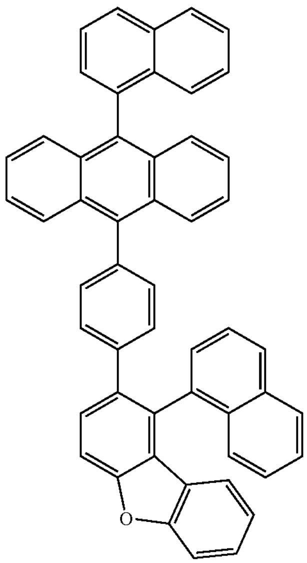
-continued
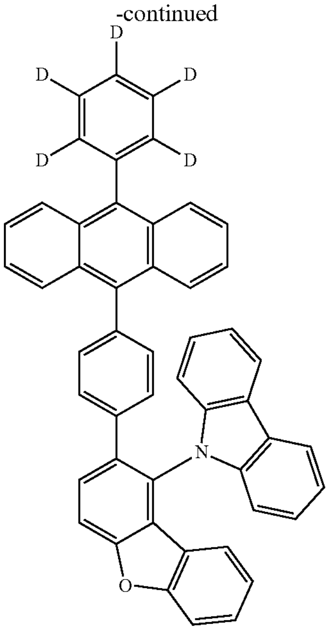
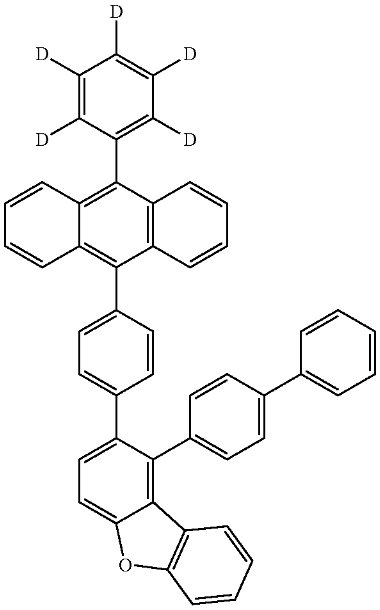

-continued
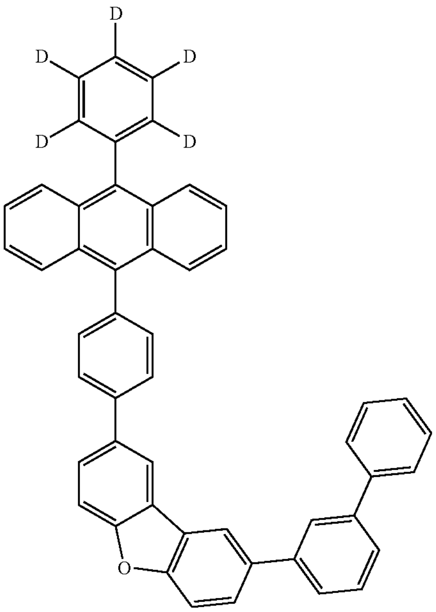
-continued
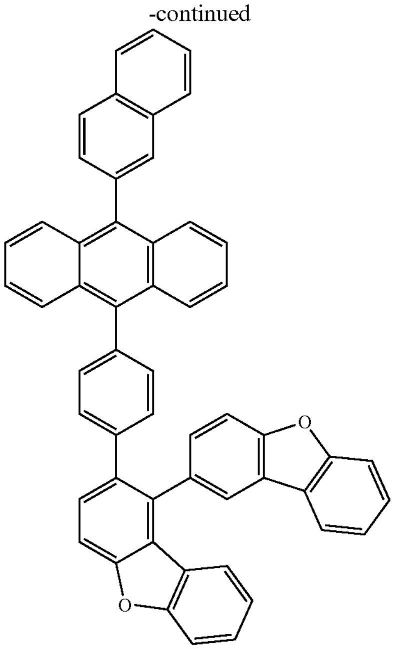
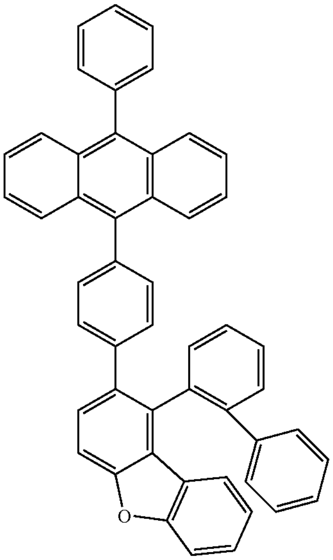
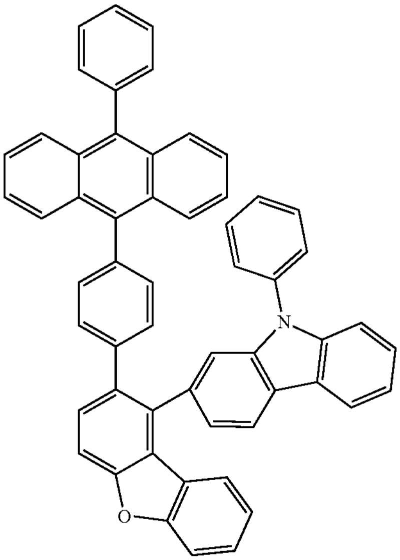

-continued
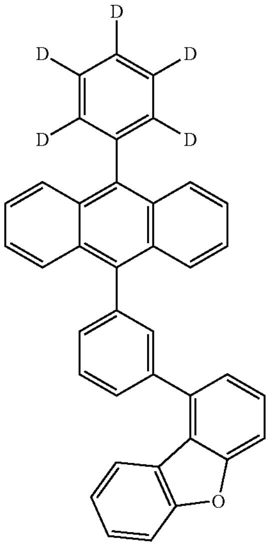
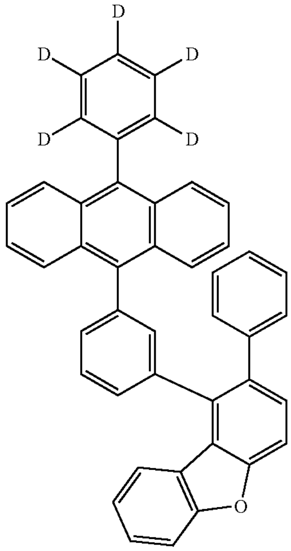
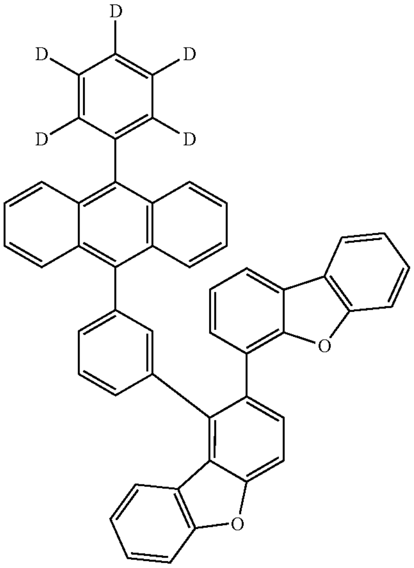
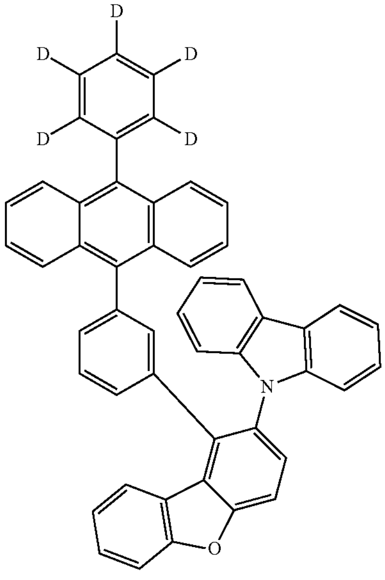
-continued
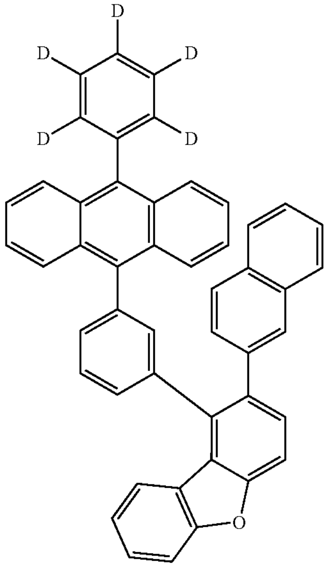
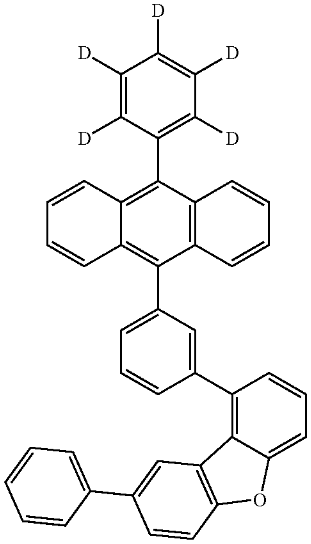
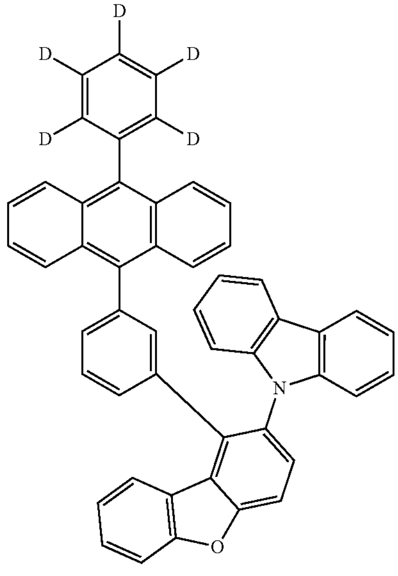

-continued
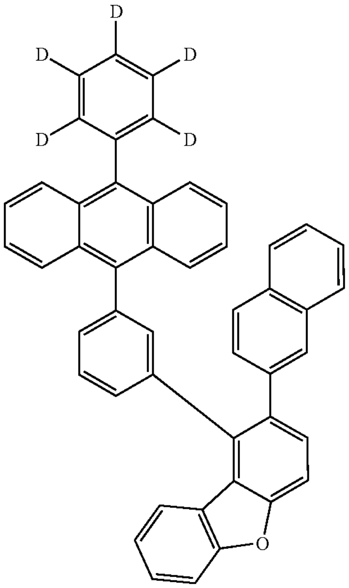
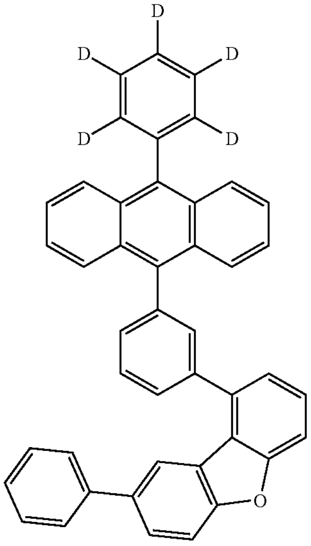
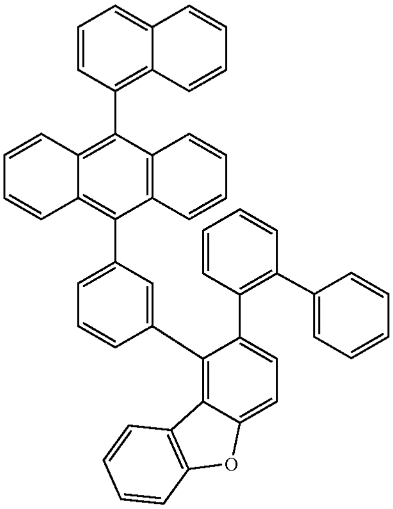
-continued
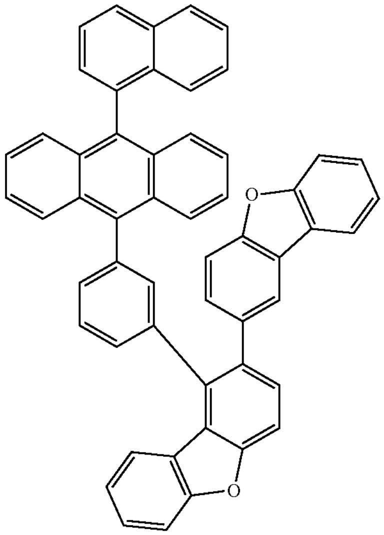
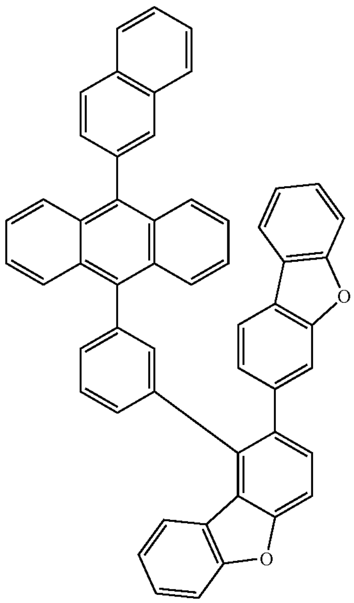

-continued
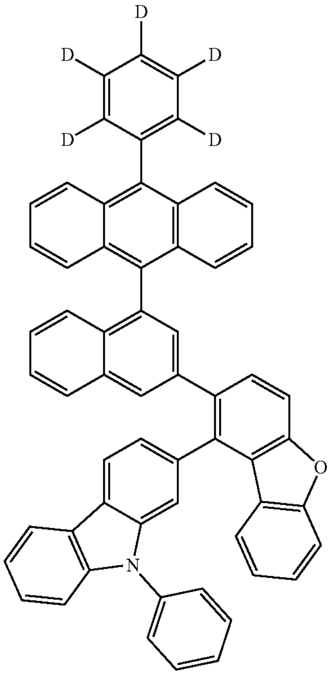
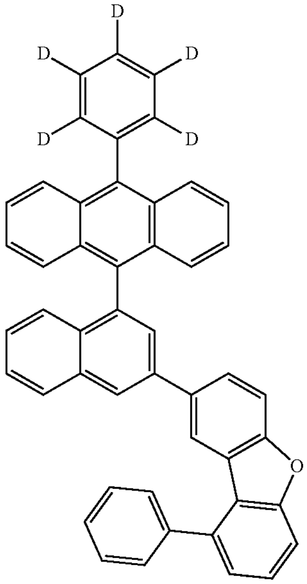
-continued
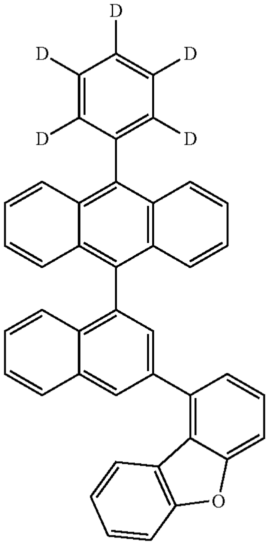
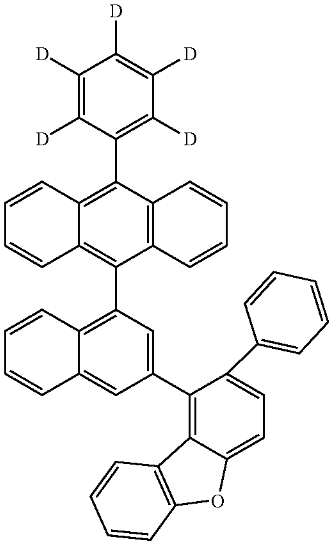
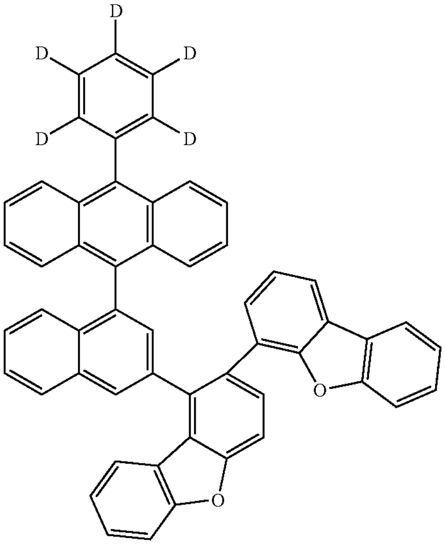

-continued
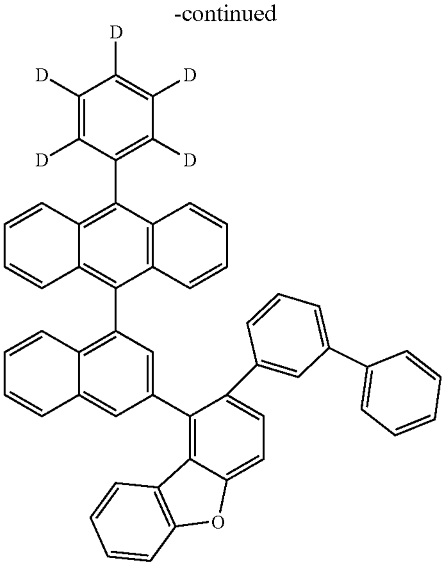
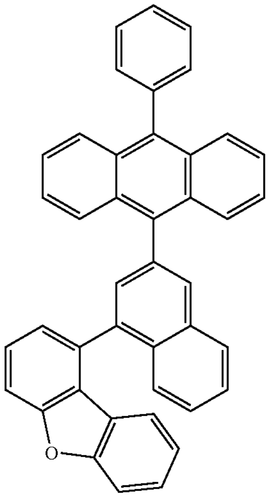
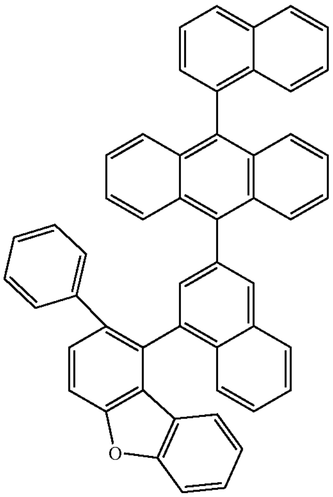
-continued
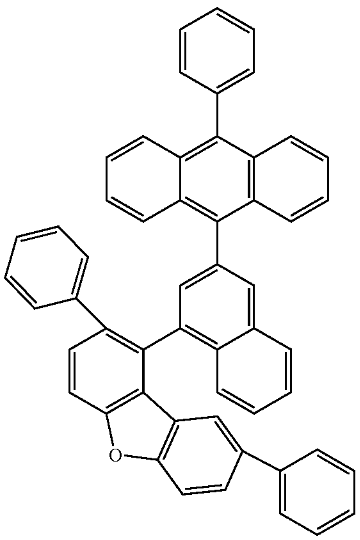
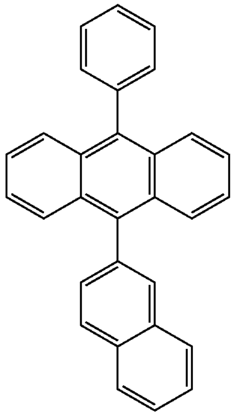
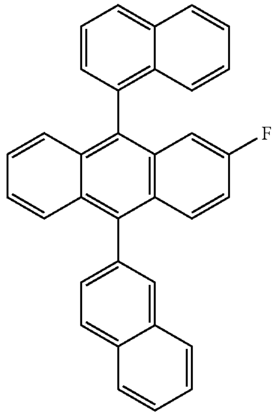
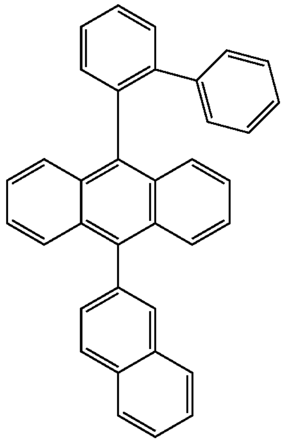

-continued
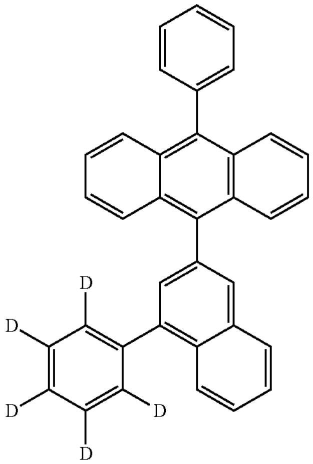
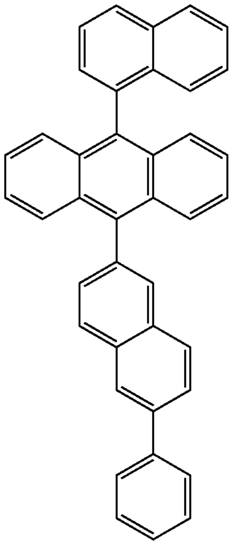
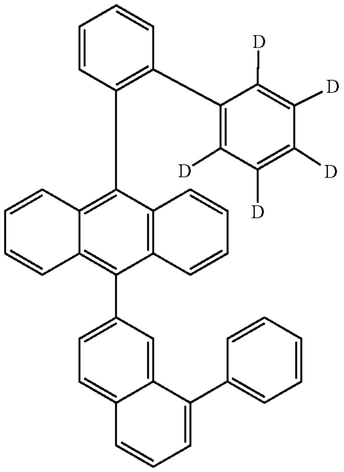
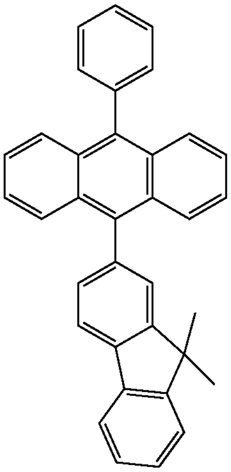
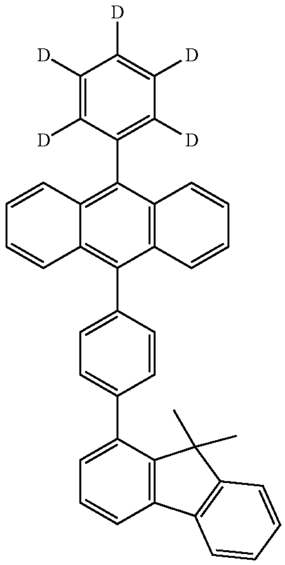
-continued
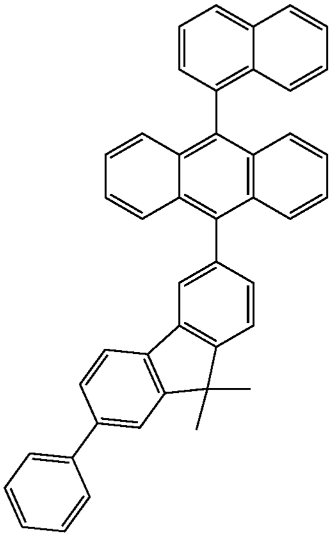
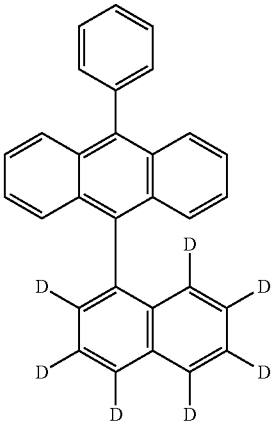
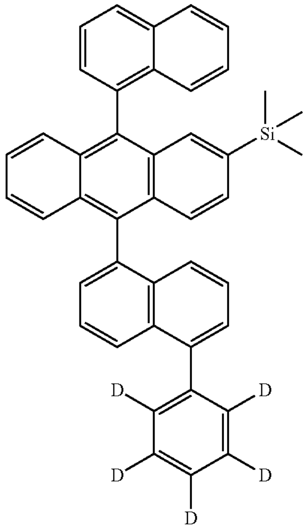

-continued
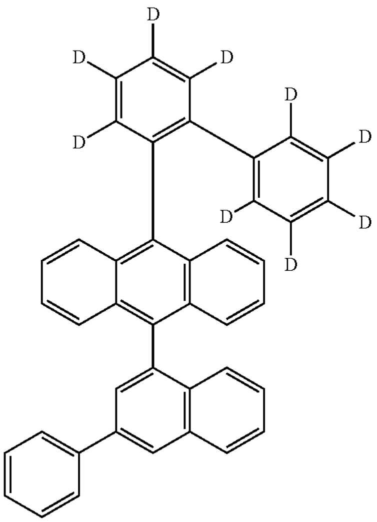
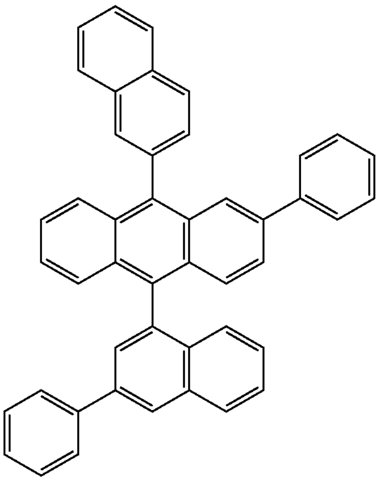
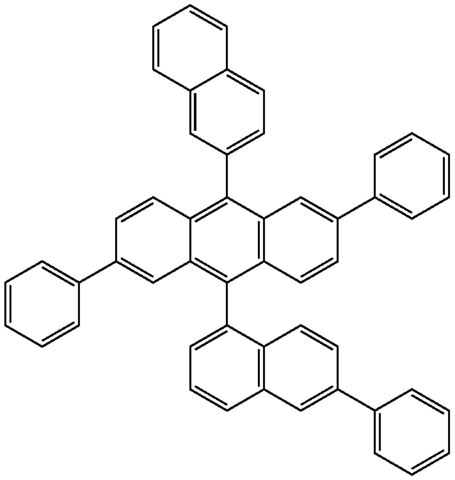
-continued
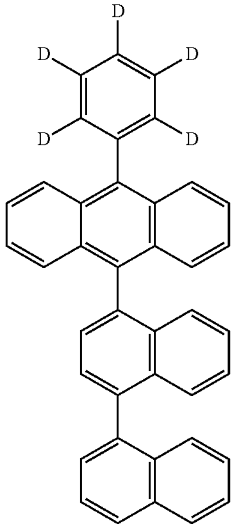
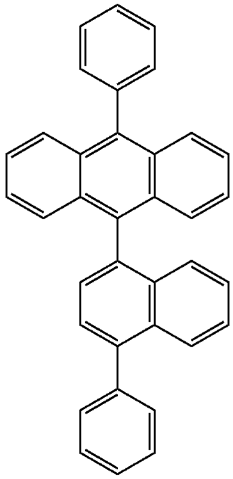
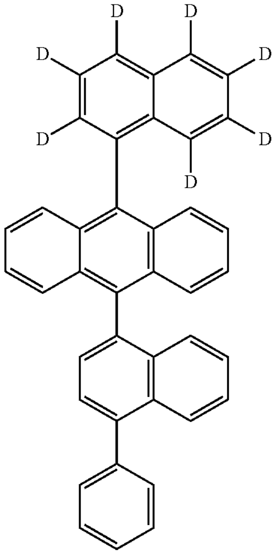
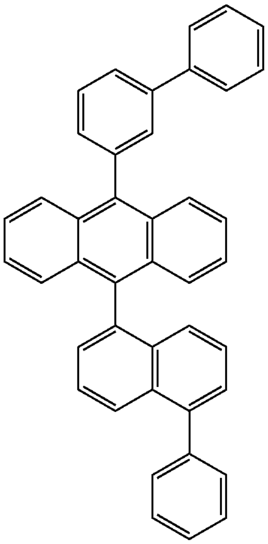
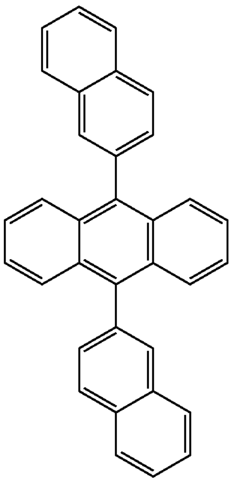
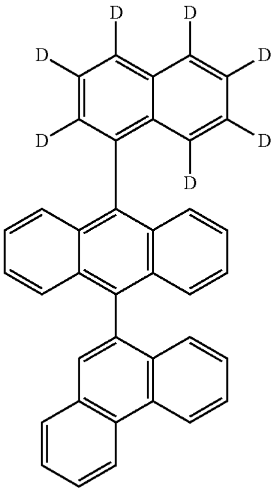

-continued
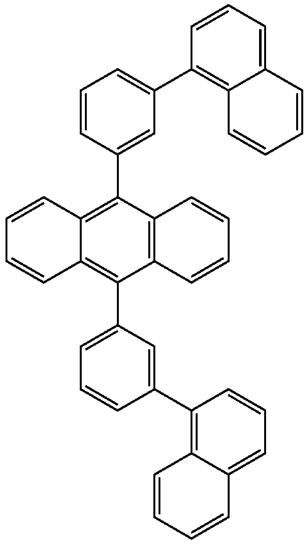
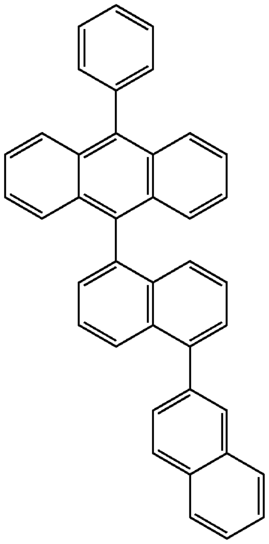
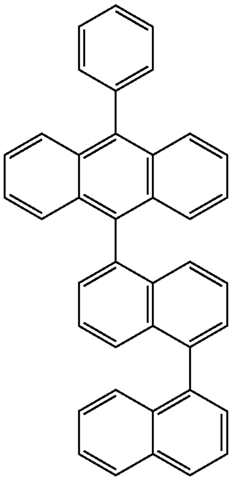
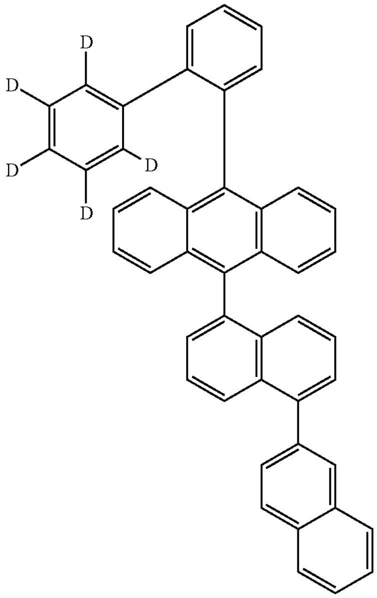
-continued
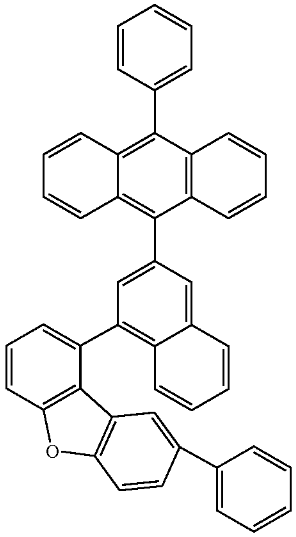
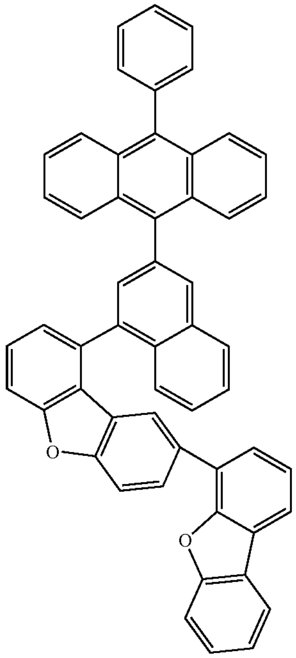

-continued
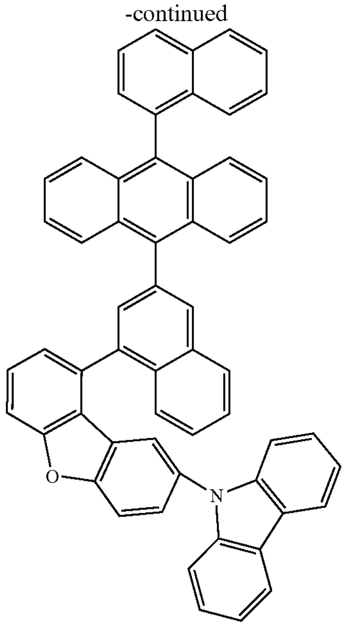
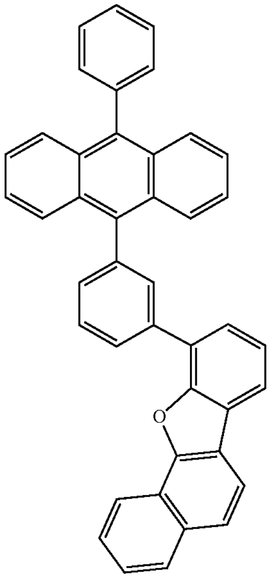
-continued
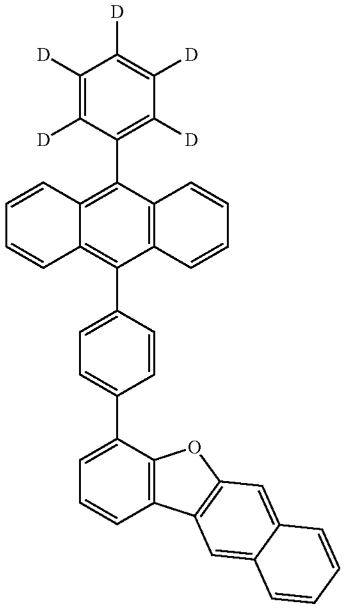
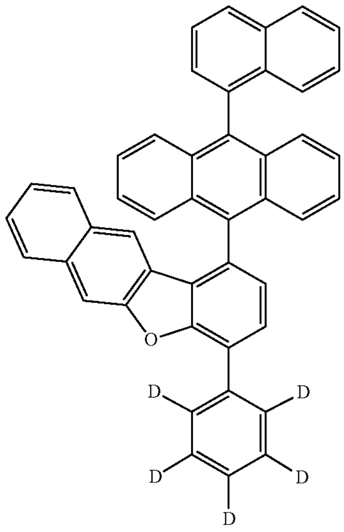
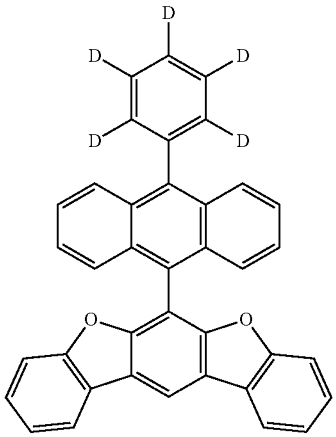

-continued
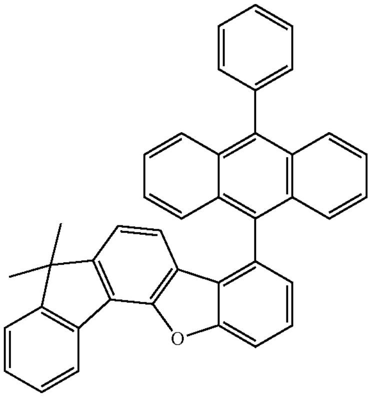
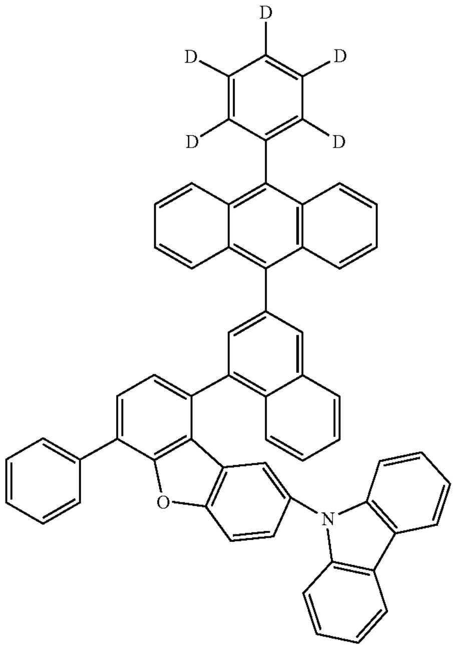
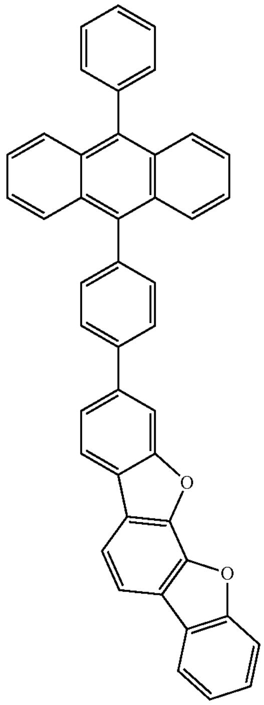
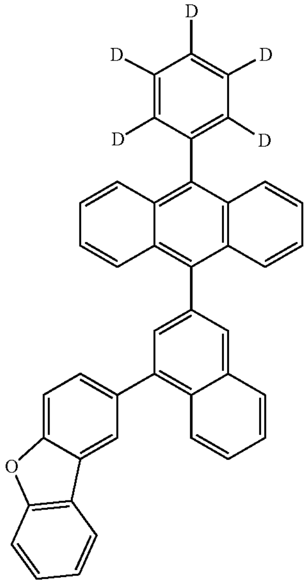
-continued

-continued
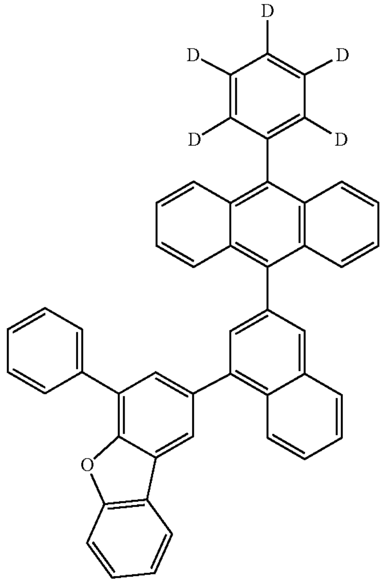
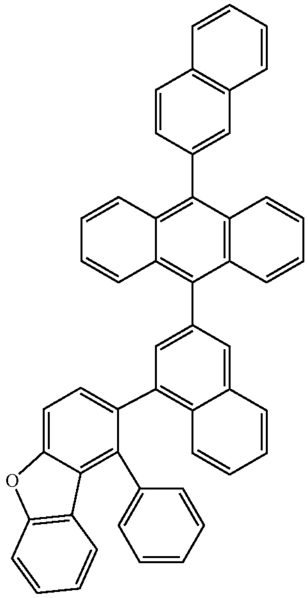
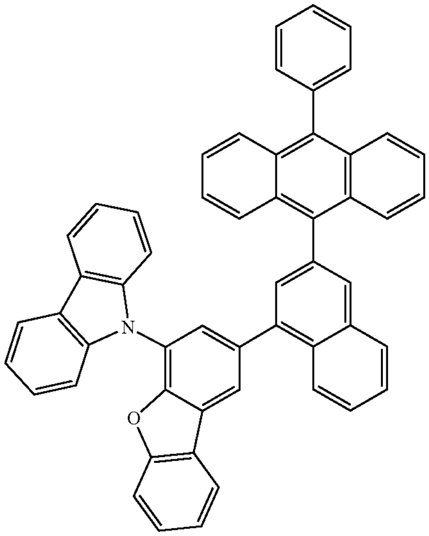
-continued
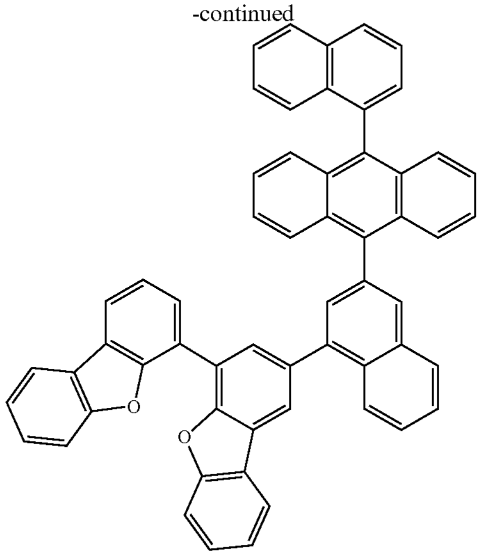
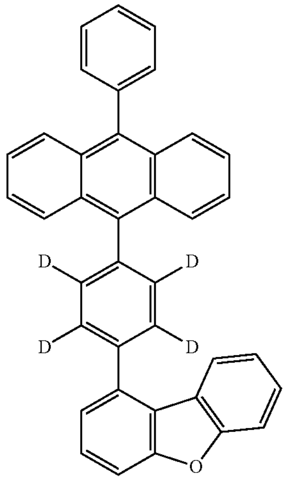
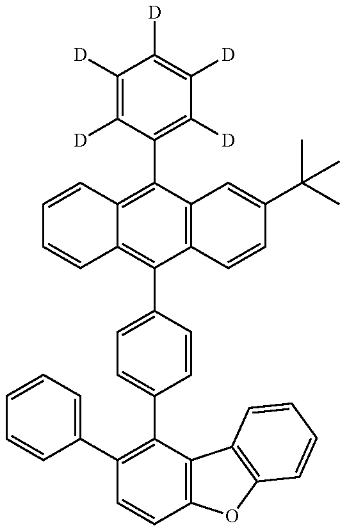

-continued
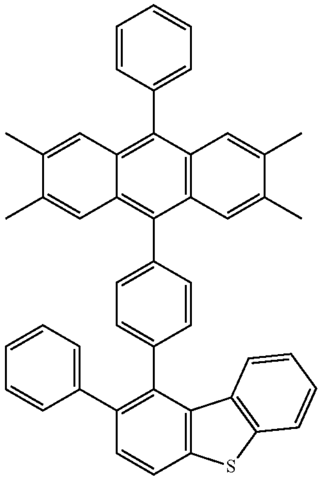
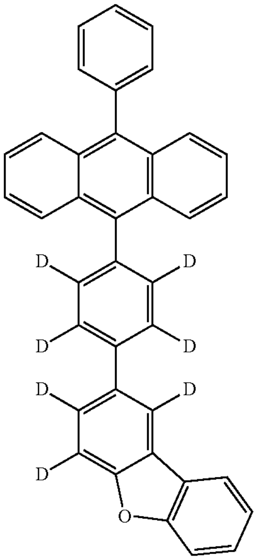
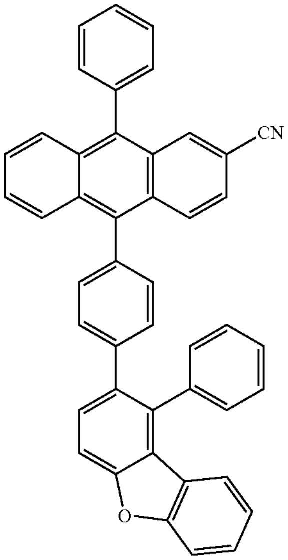
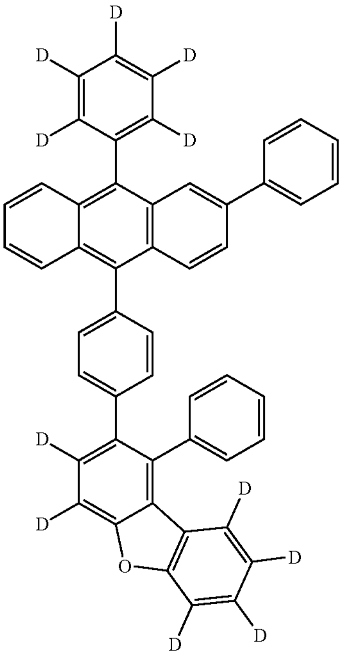
-continued
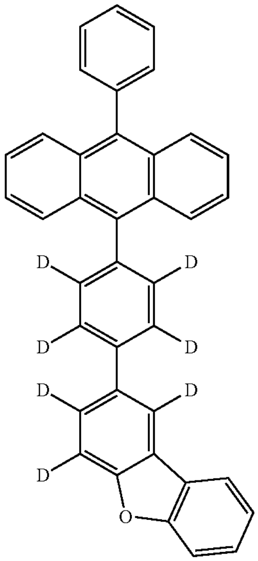
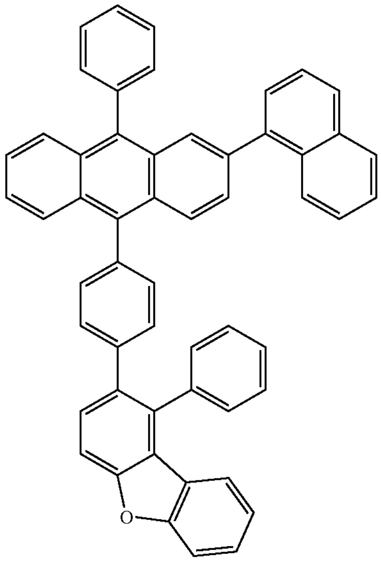

-continued
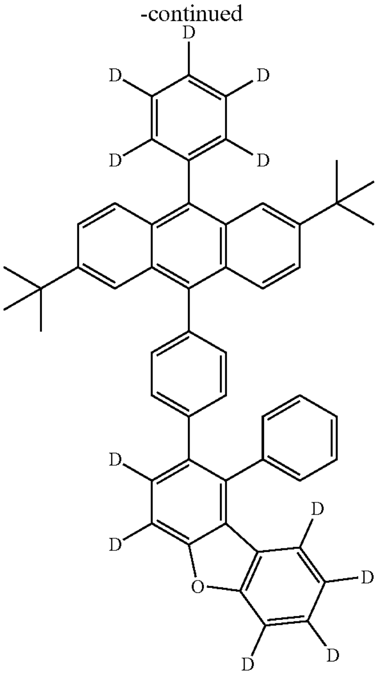
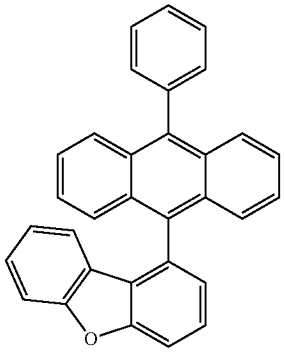
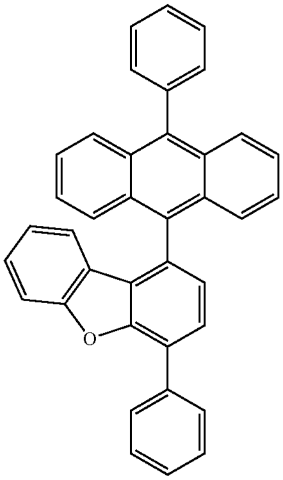
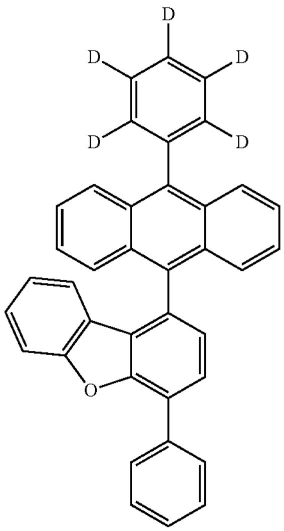
-continued
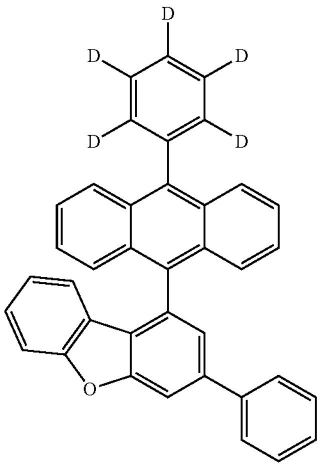
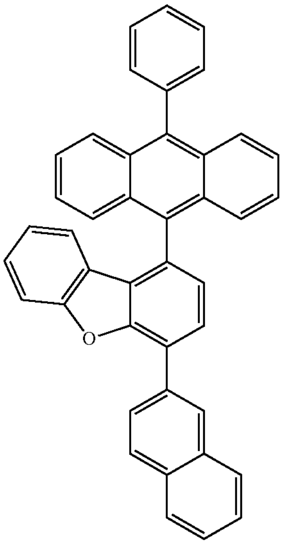
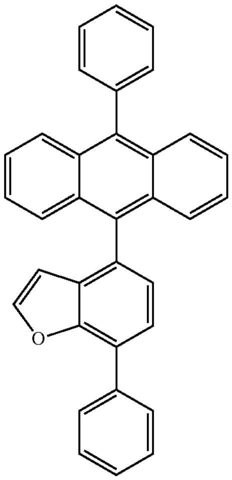
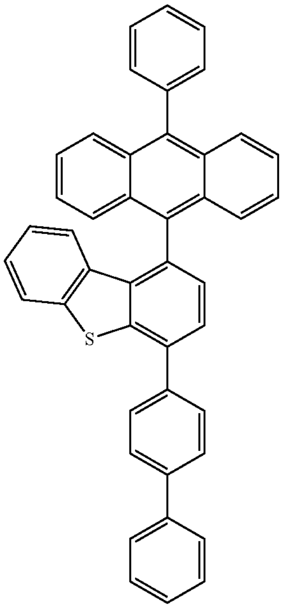
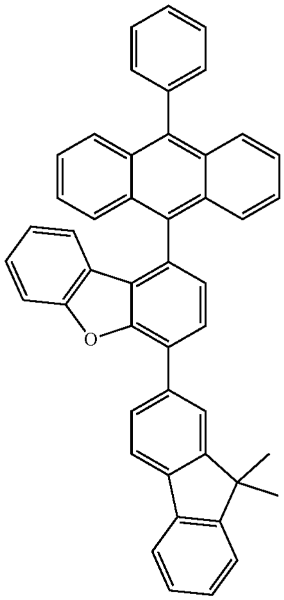

-continued
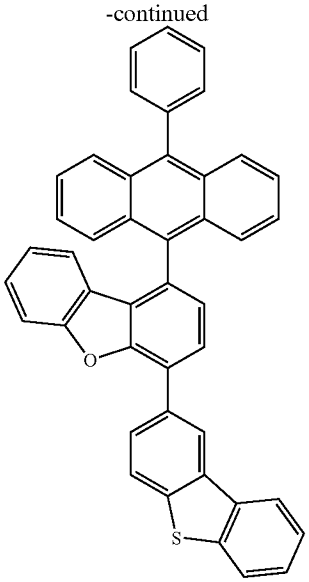
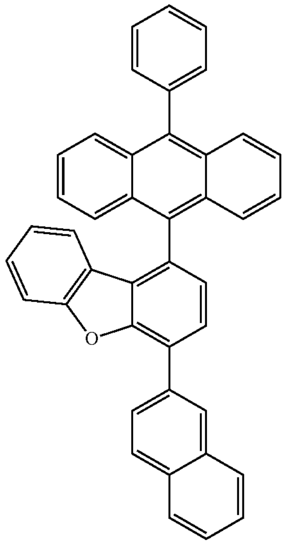
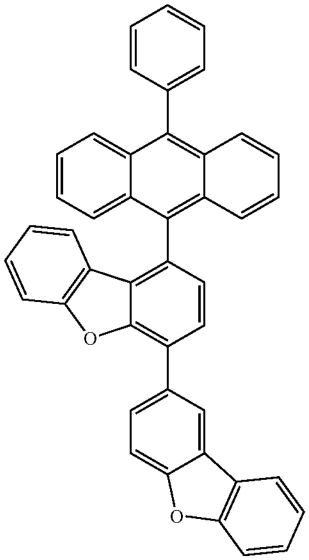
-continued
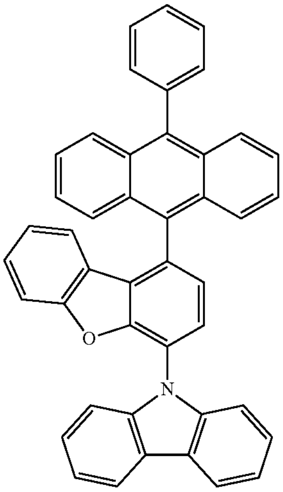
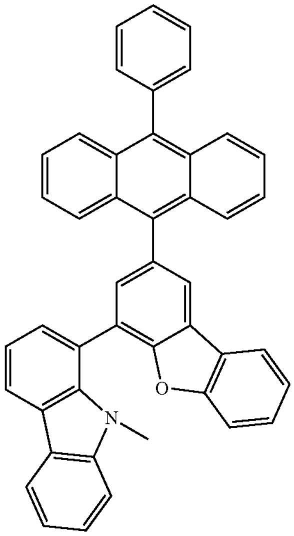
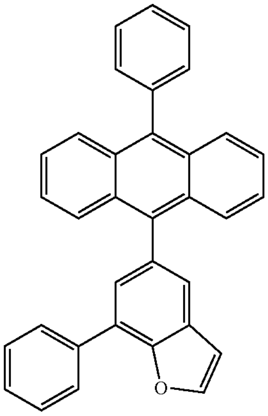
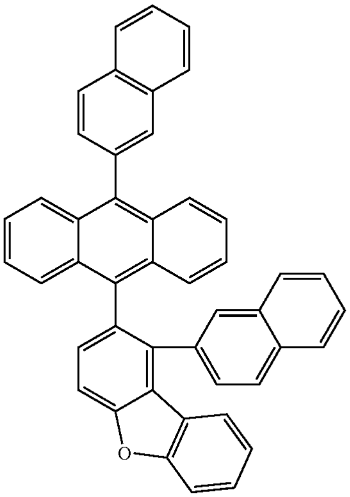

-continued
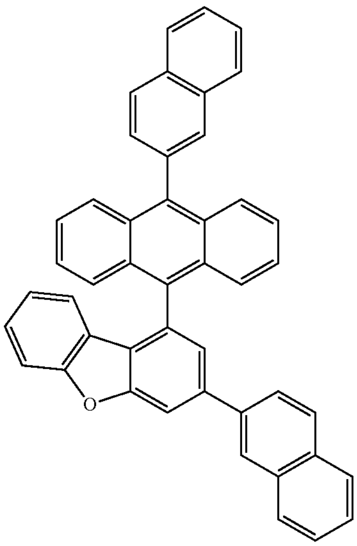
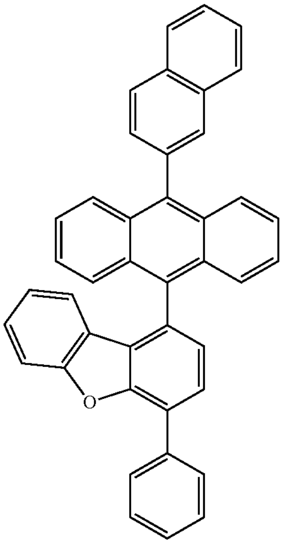
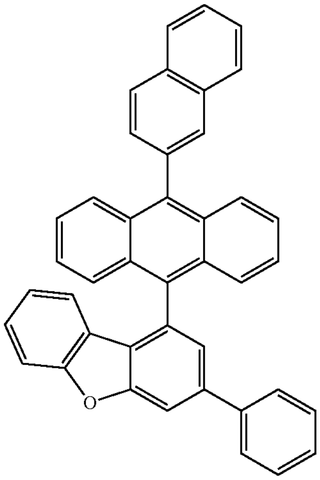
-continued
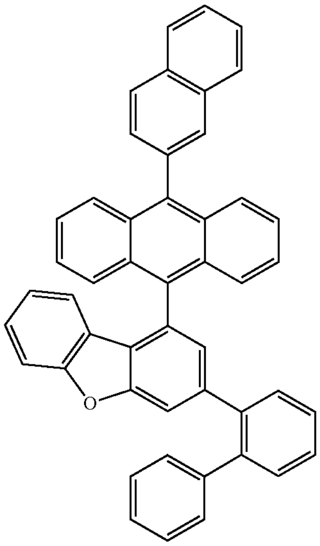
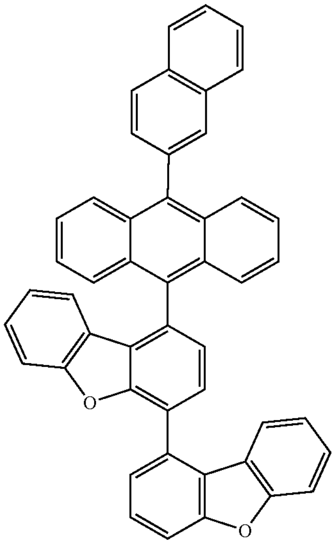
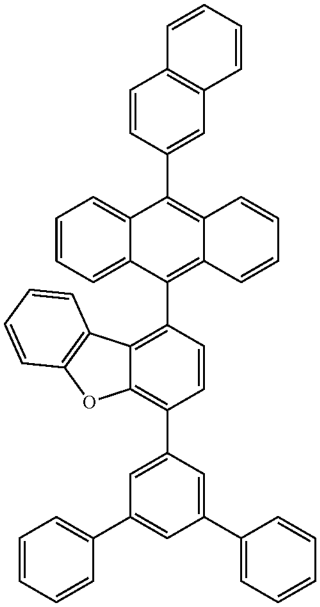

-continued
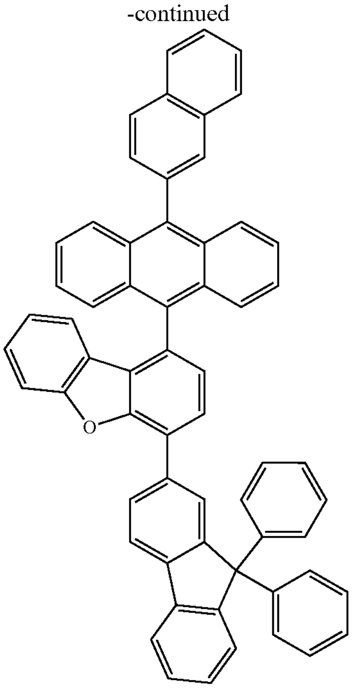
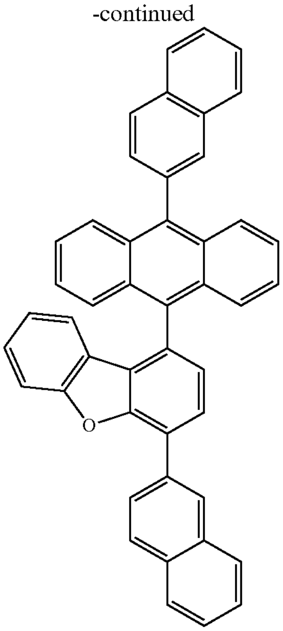
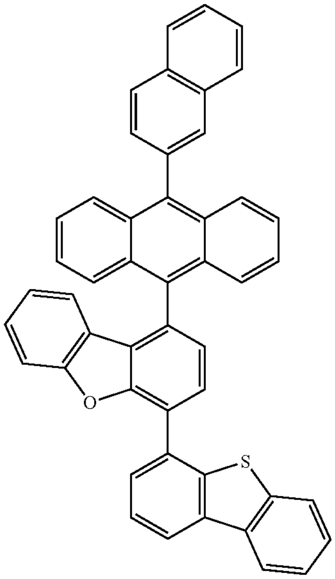
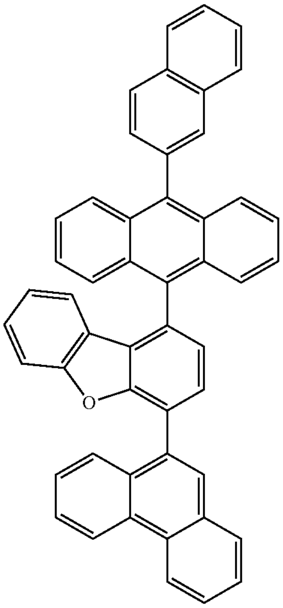
-continued

-continued
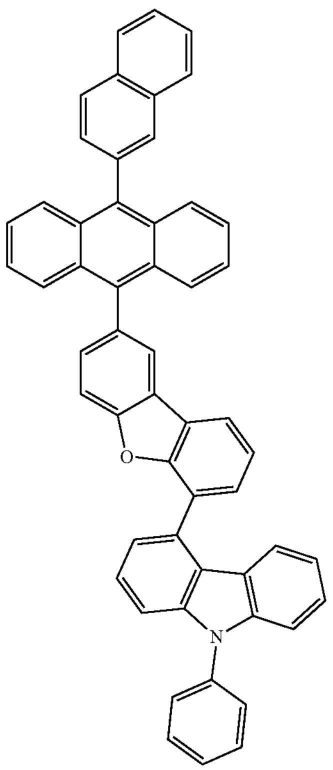
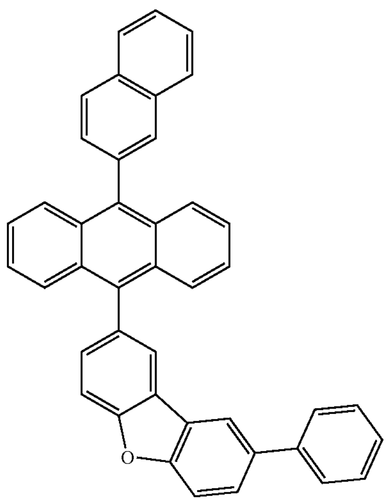
-continued
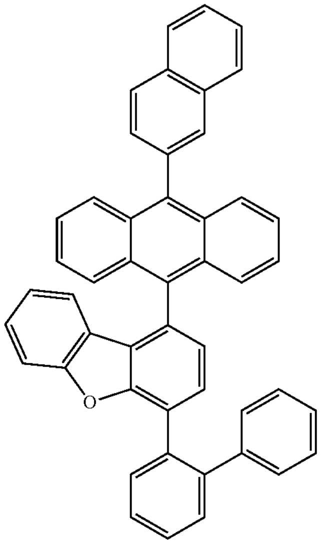
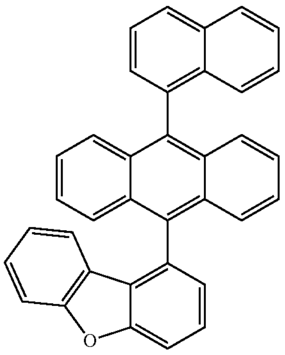
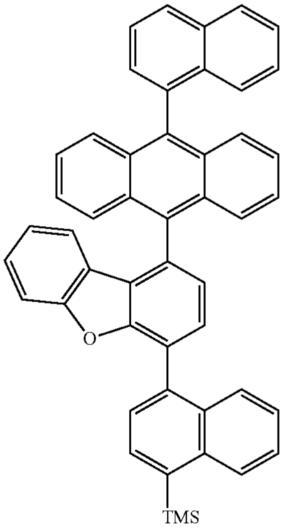
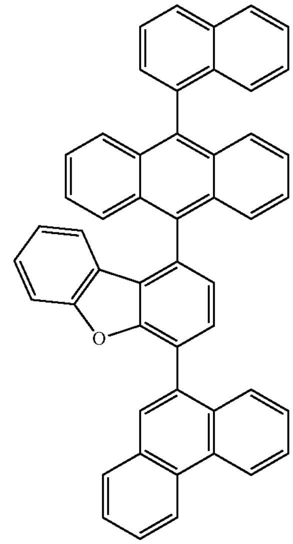

-continued
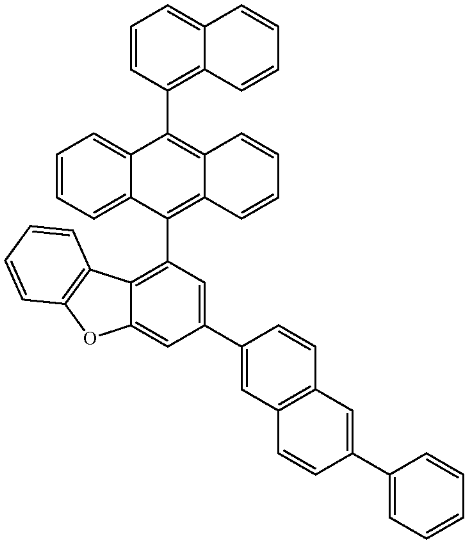
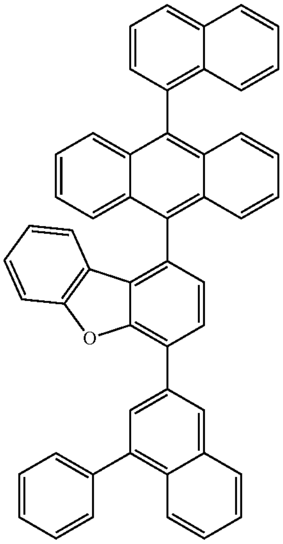
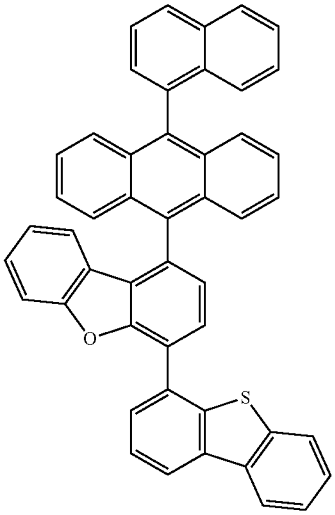
-continued
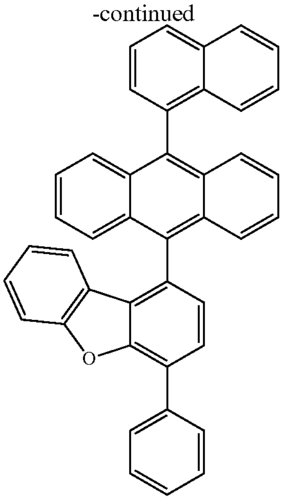
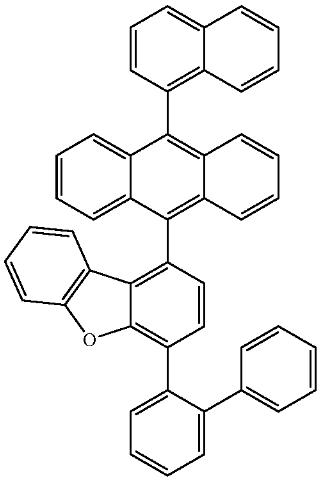
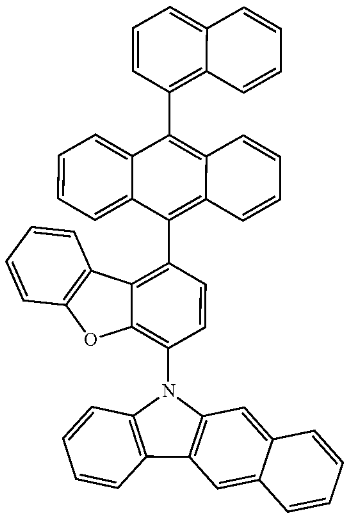

-continued
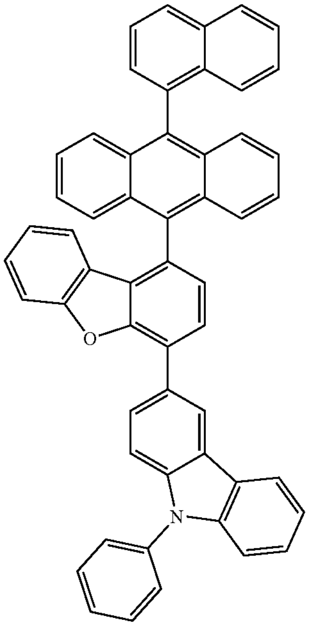
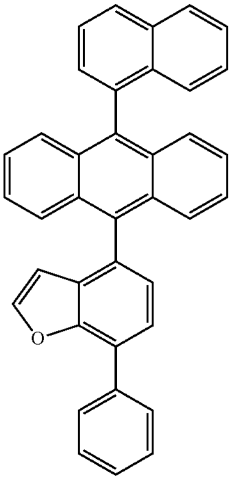
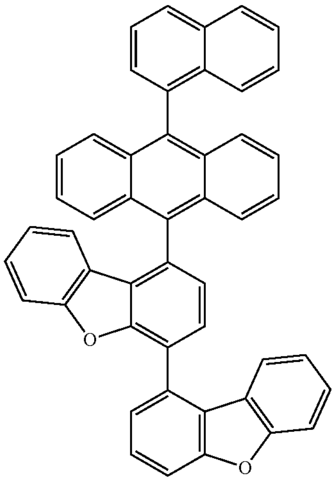
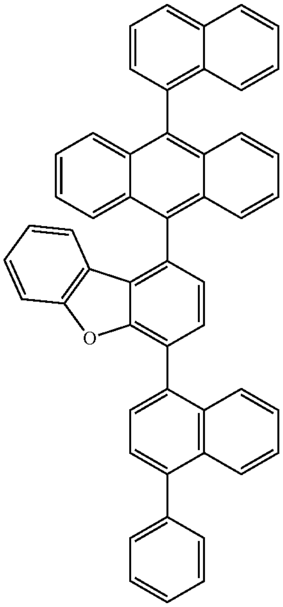
-continued
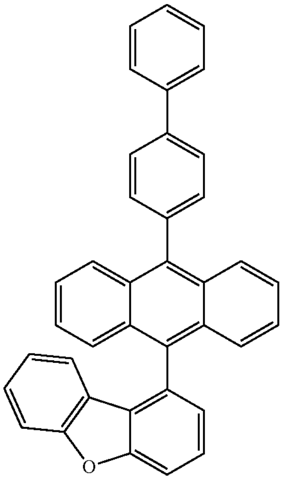
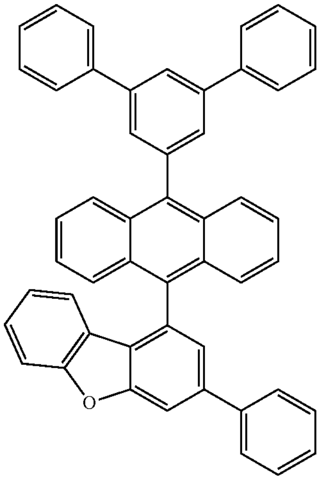
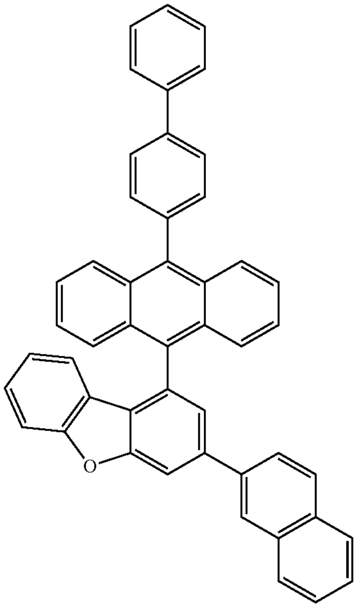

-continued
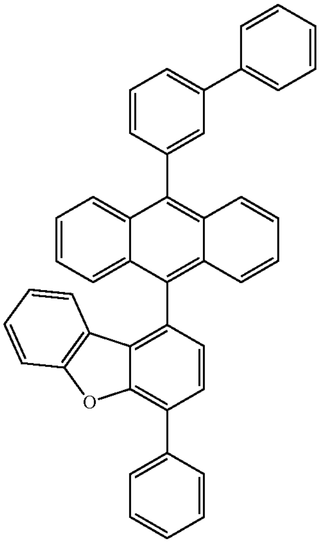
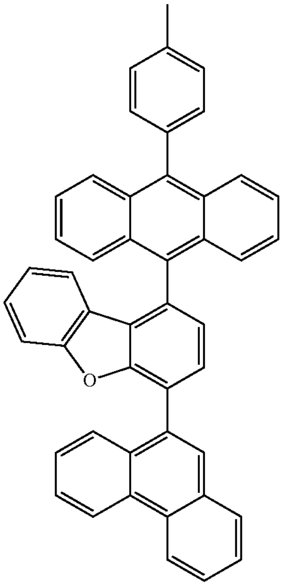
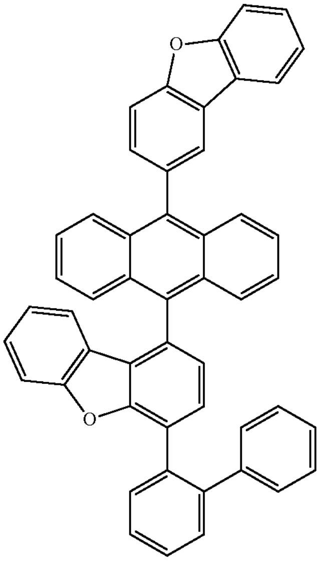
-continued
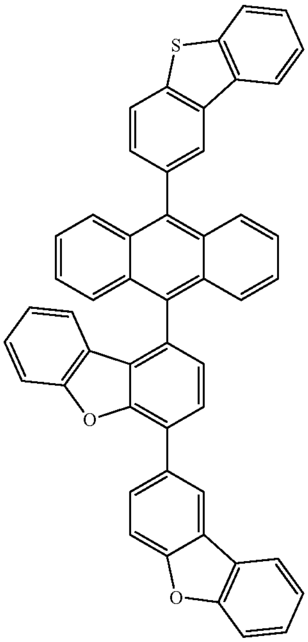
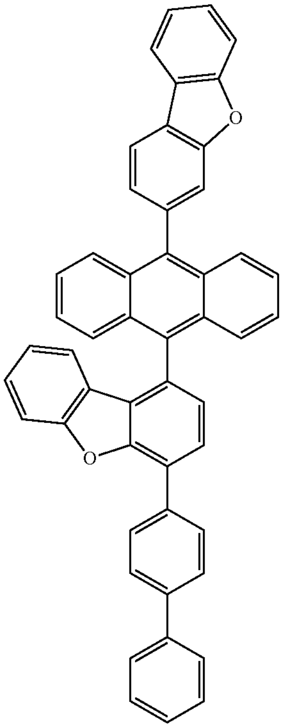
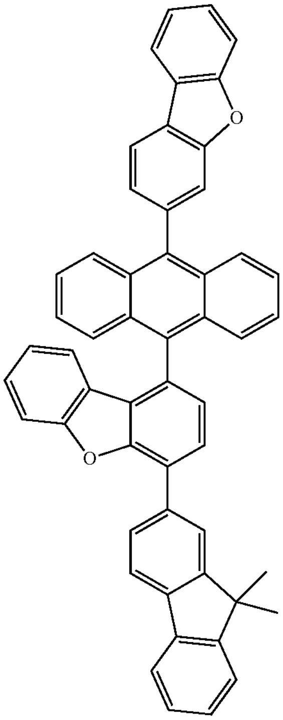

-continued
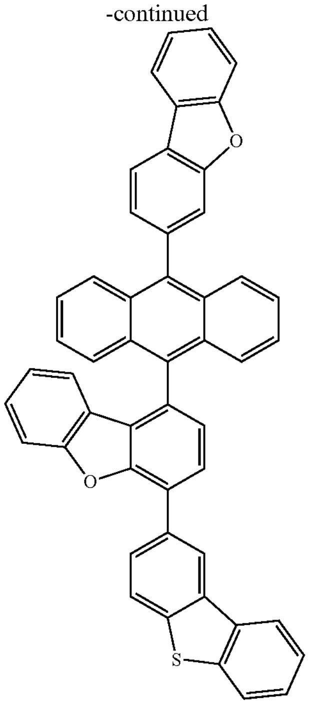
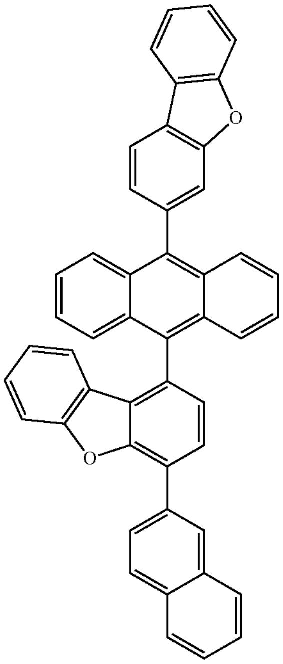
-continued
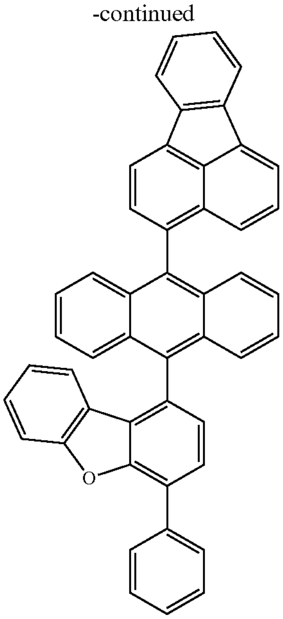
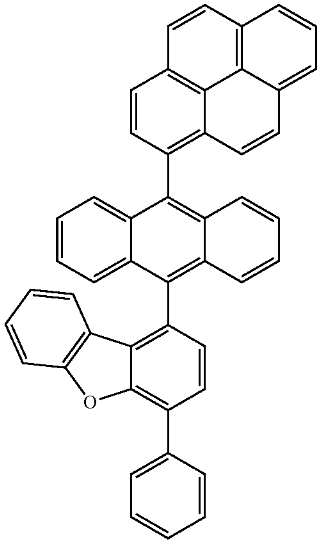
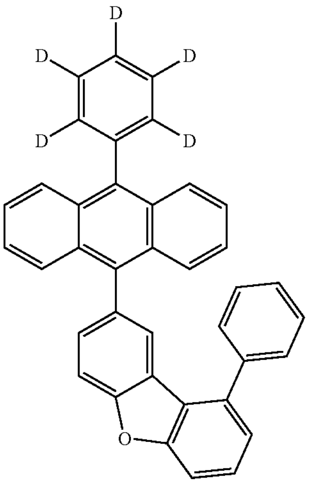

-continued
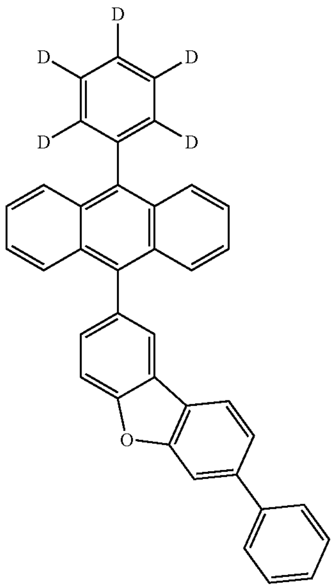
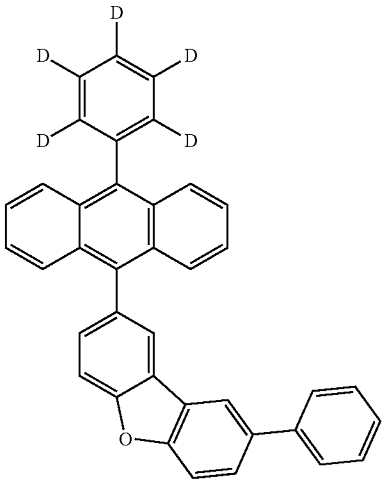
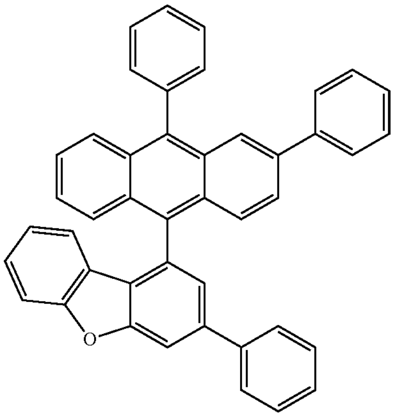
-continued
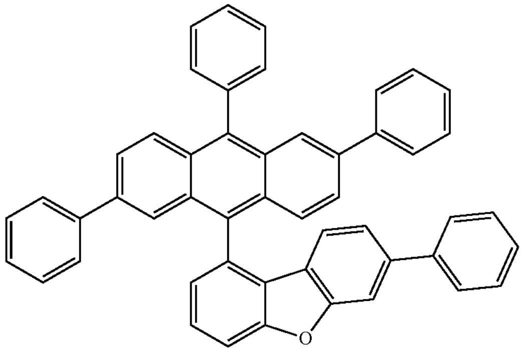
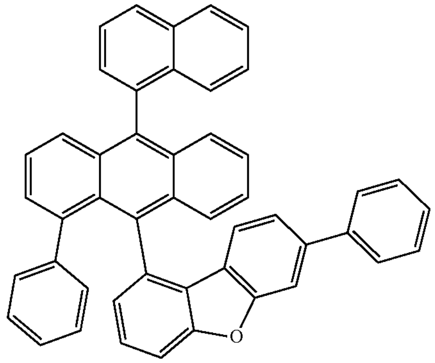
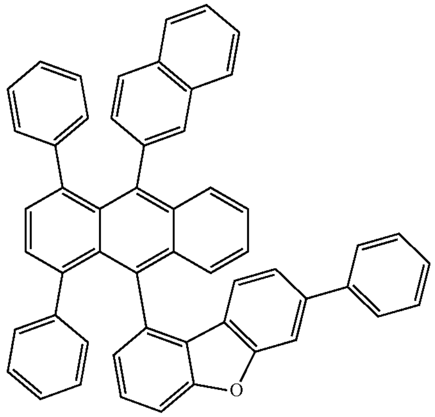
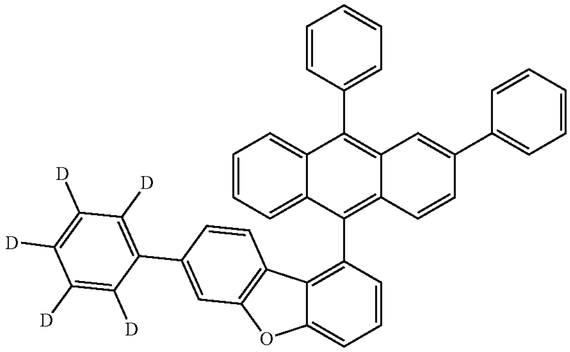

-continued
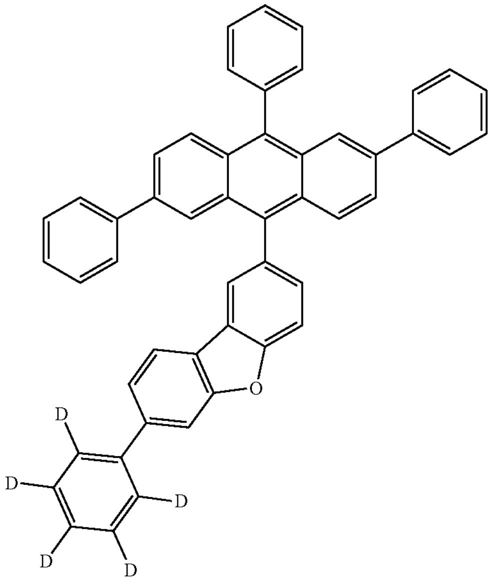
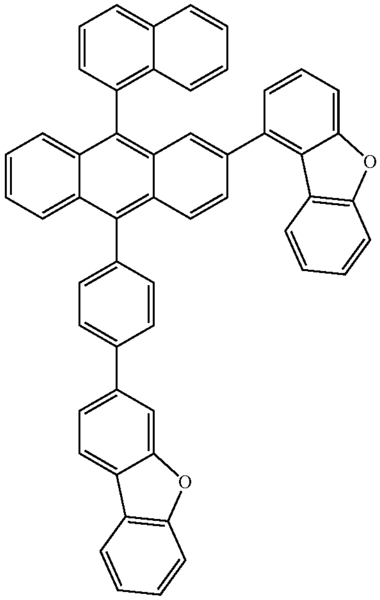
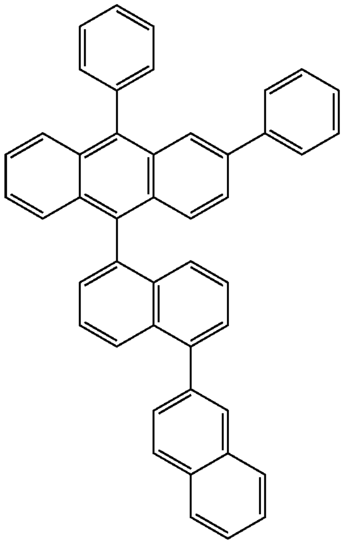
-continued
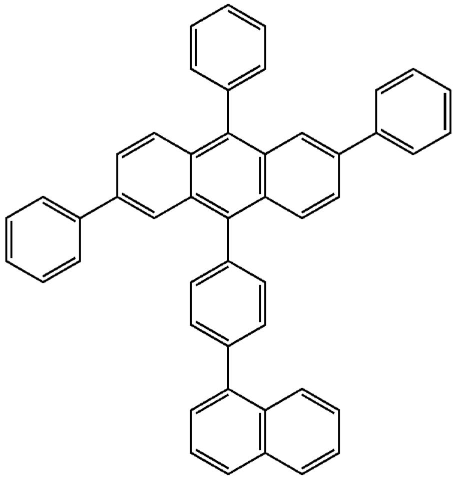
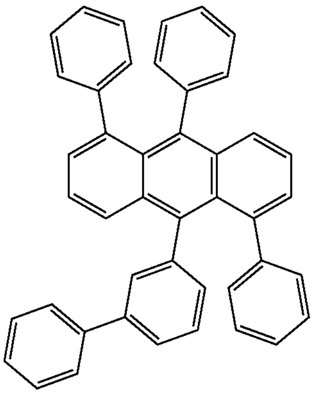
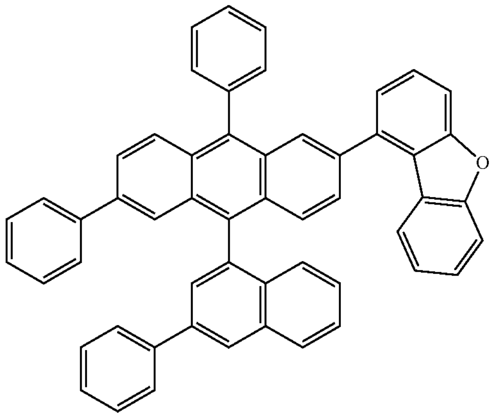

-continued
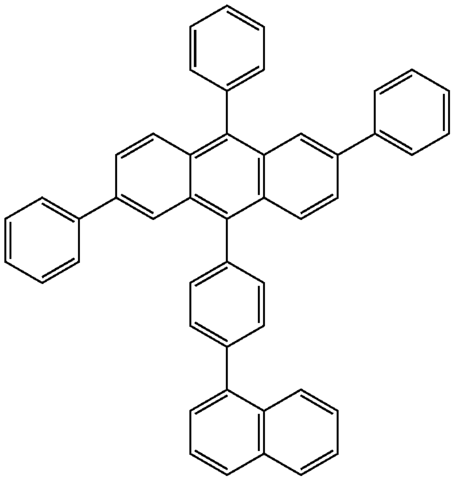
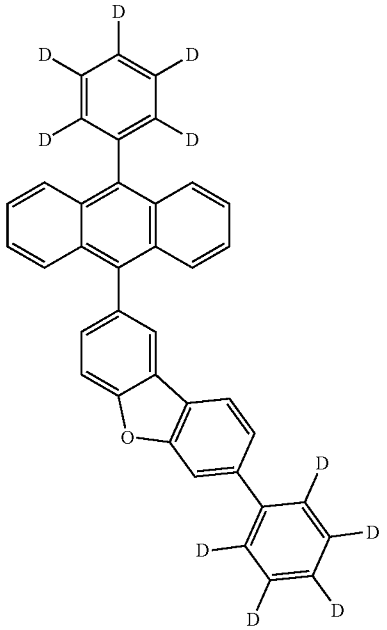
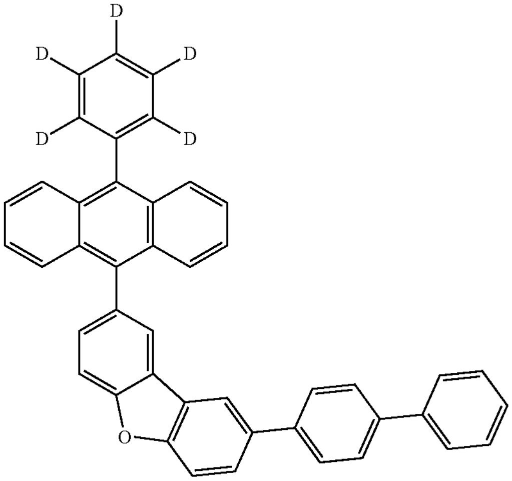
-continued
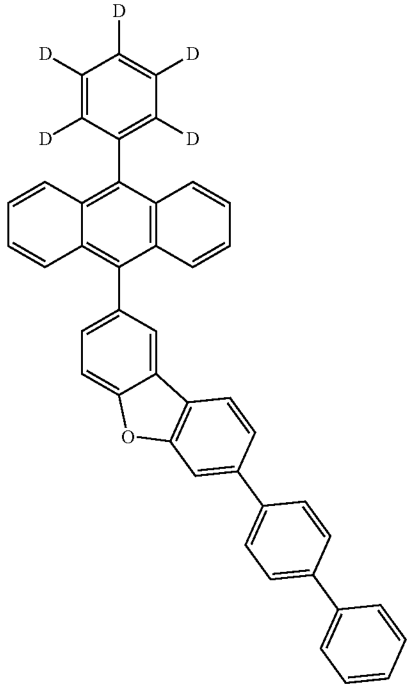
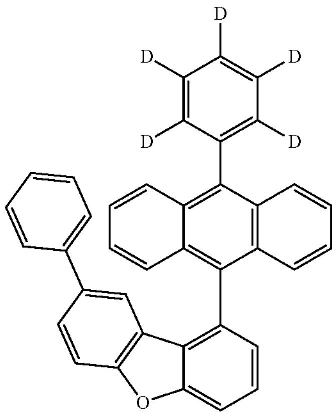
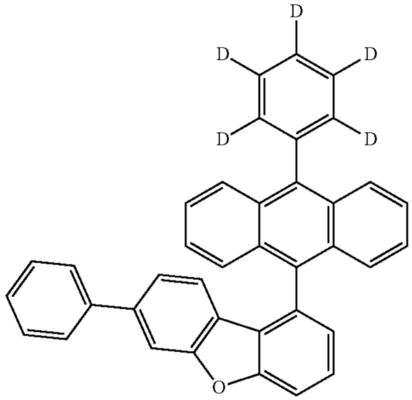

-continued
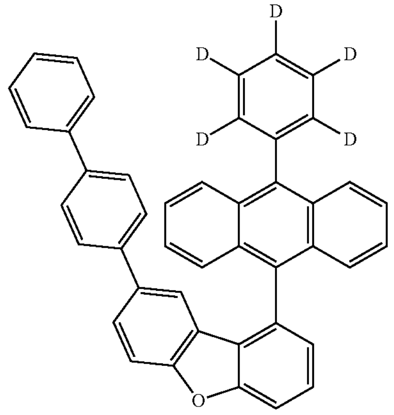
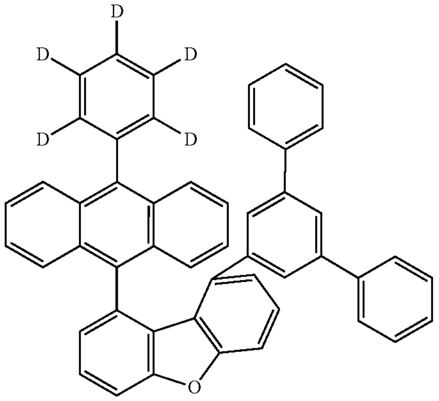
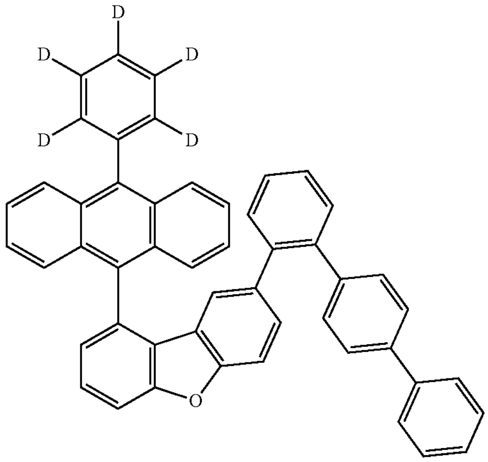
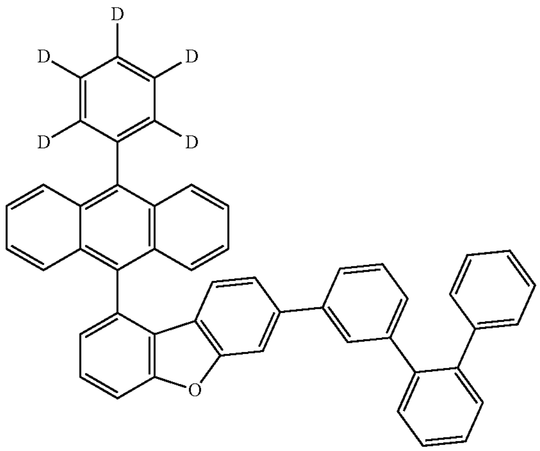
-continued
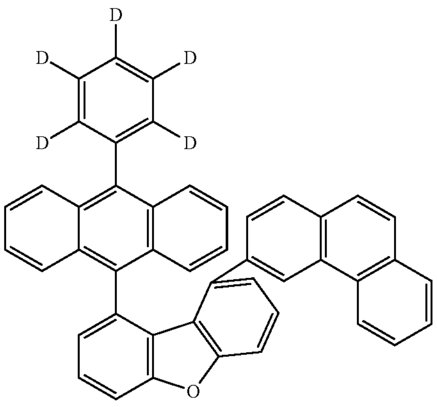
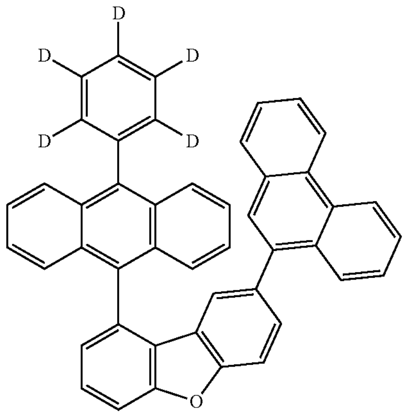
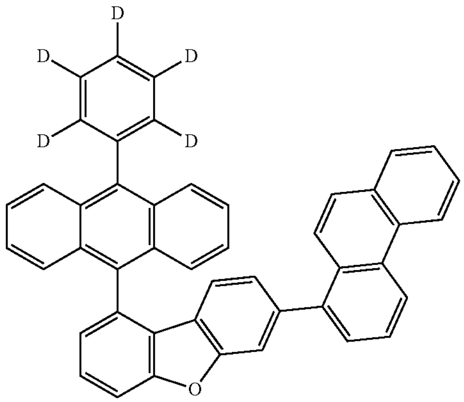
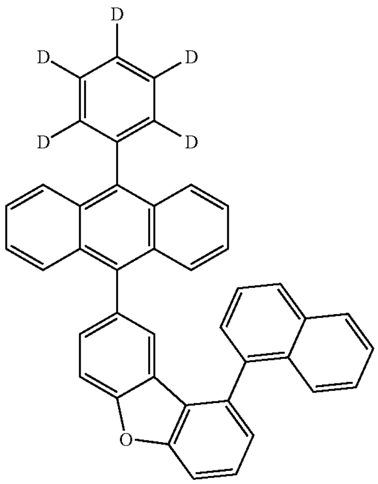

-continued
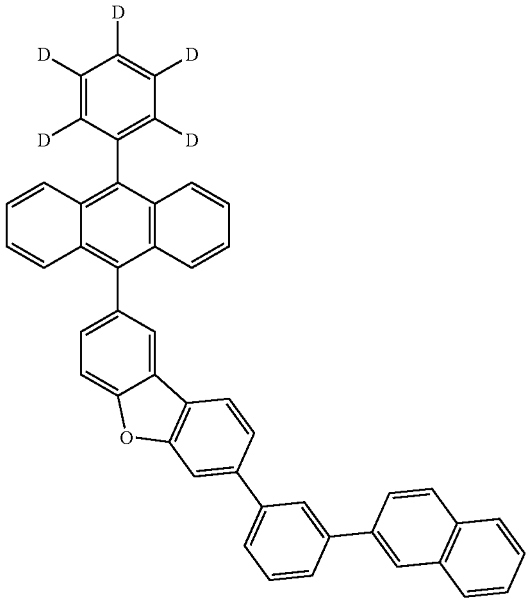
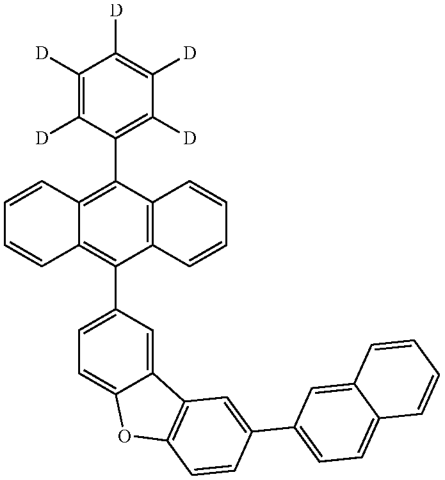
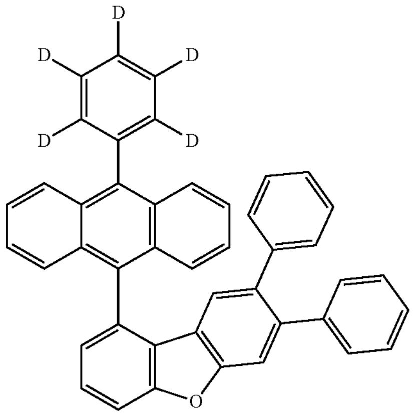
-continued
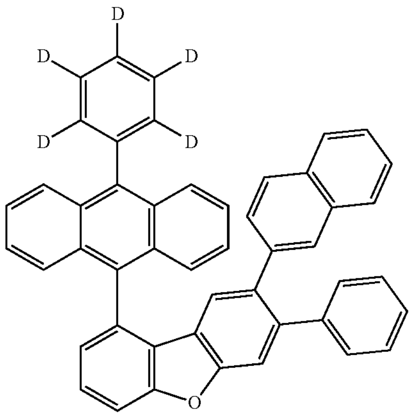
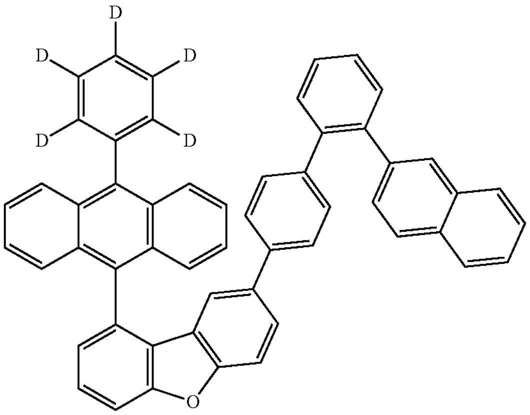
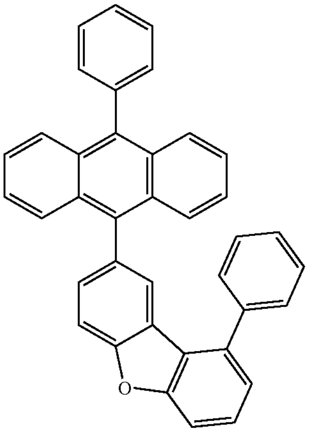
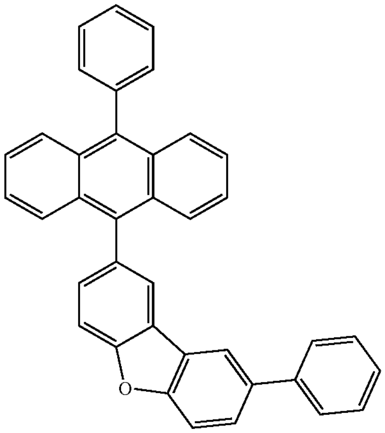

-continued
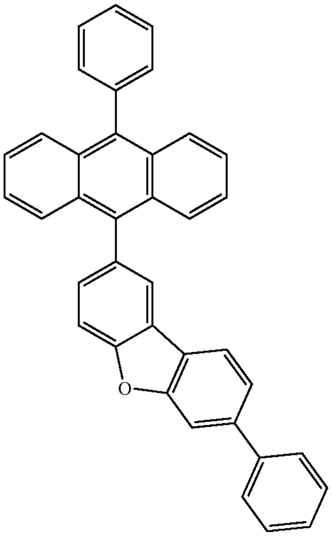
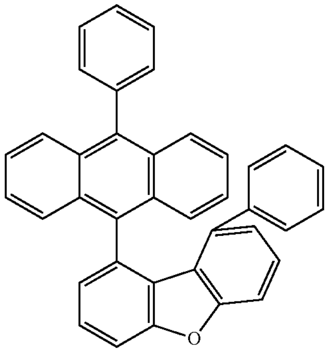
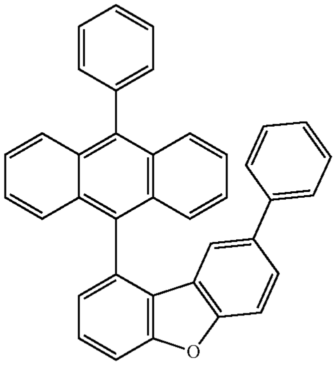
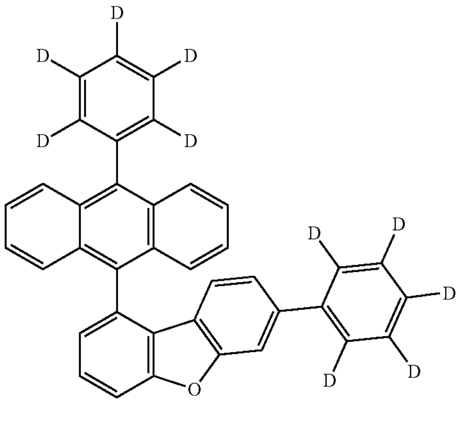
-continued
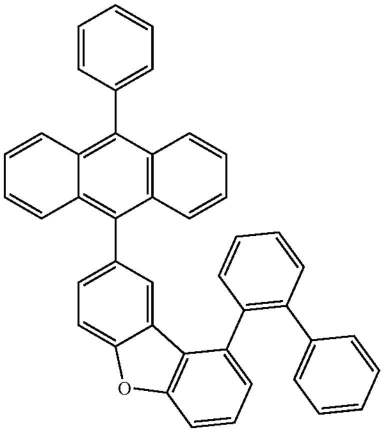
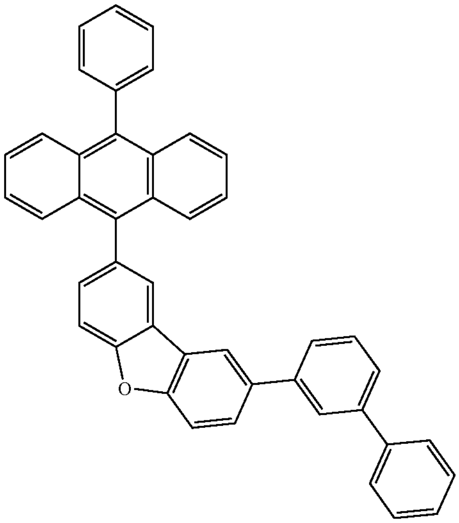
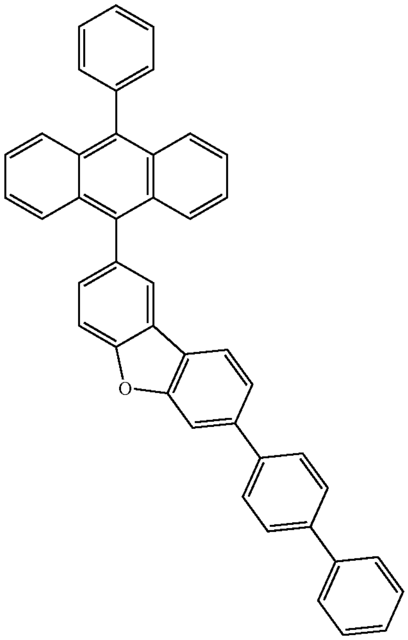

-continued
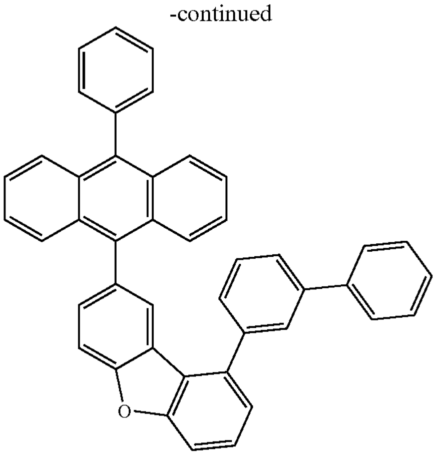
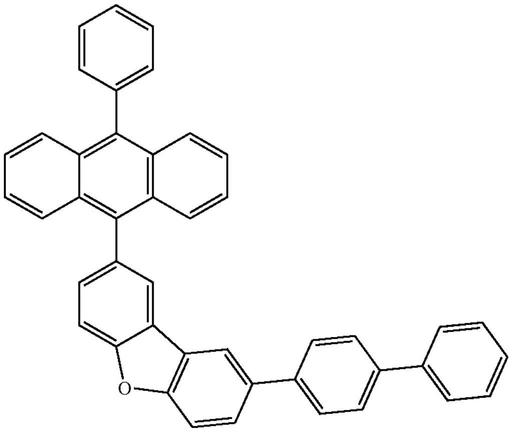
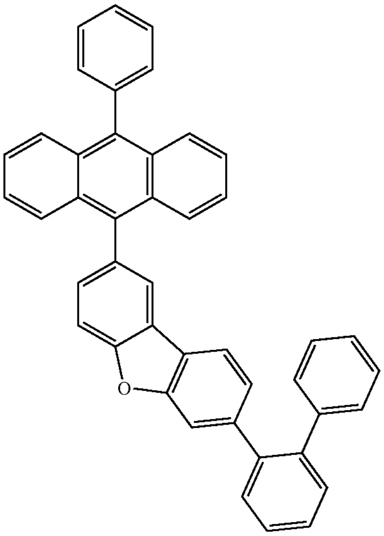
-continued
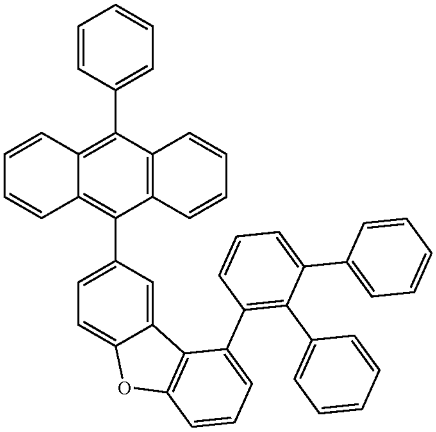
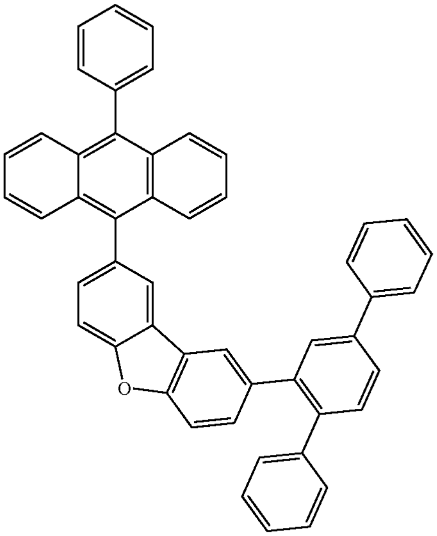
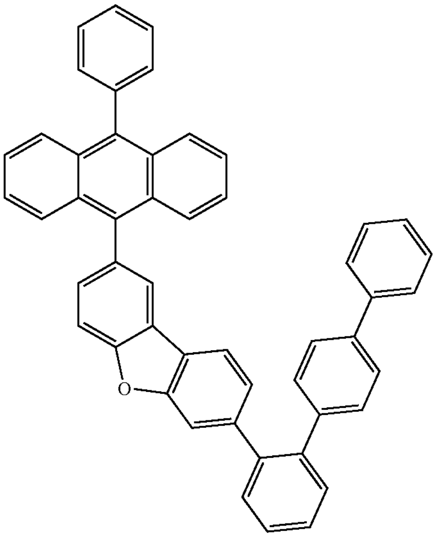

-continued
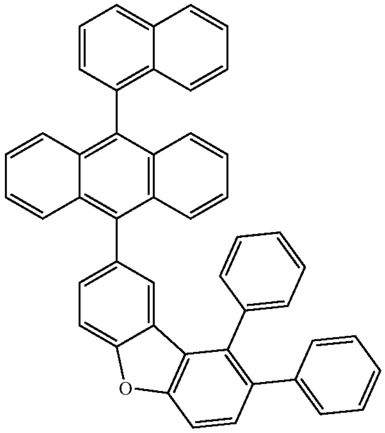
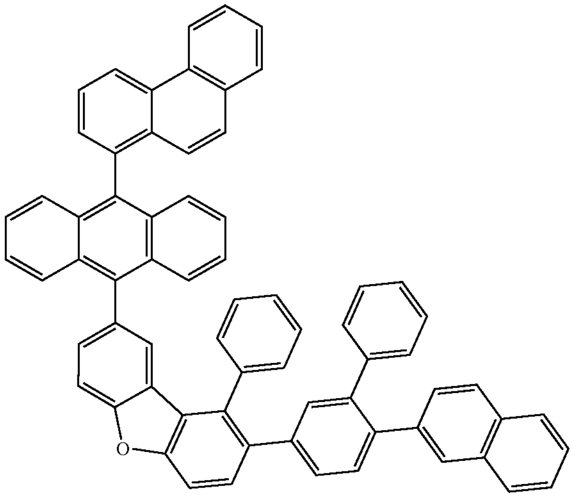
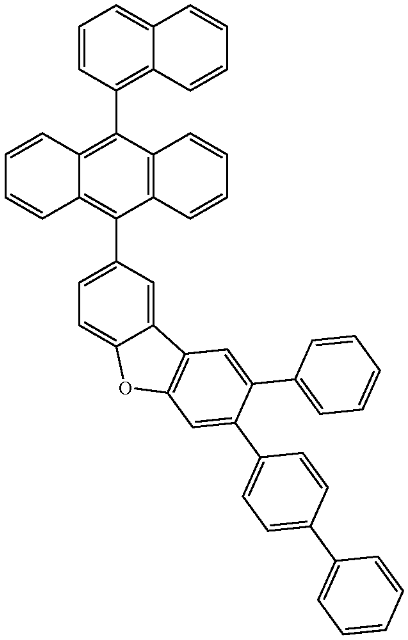
-continued
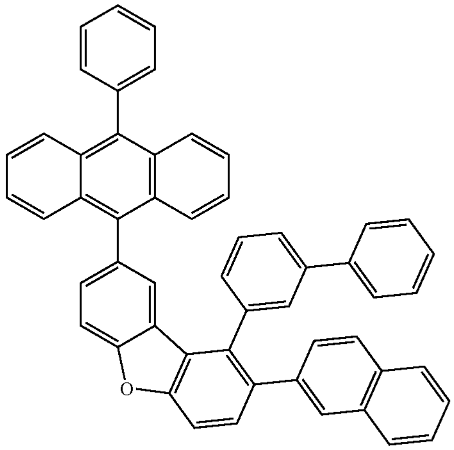
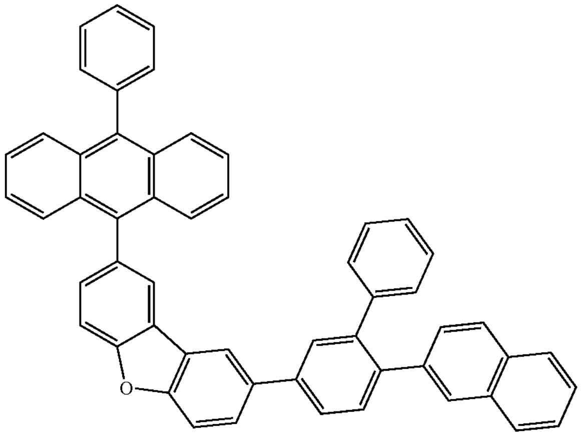
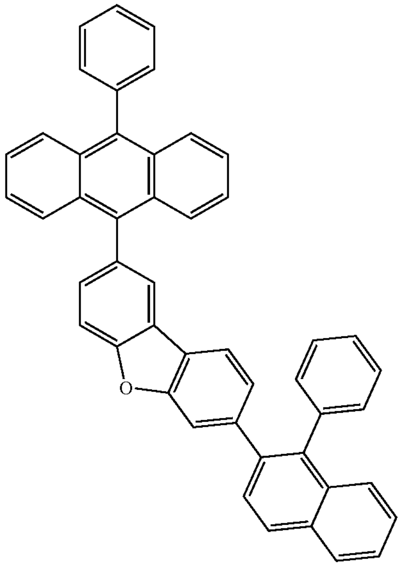

-continued
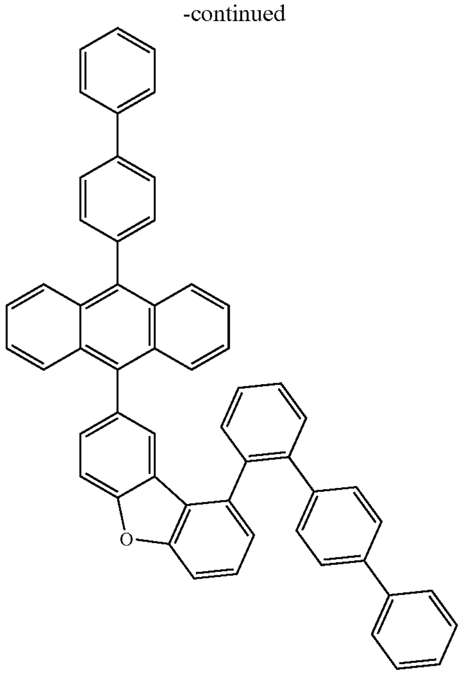
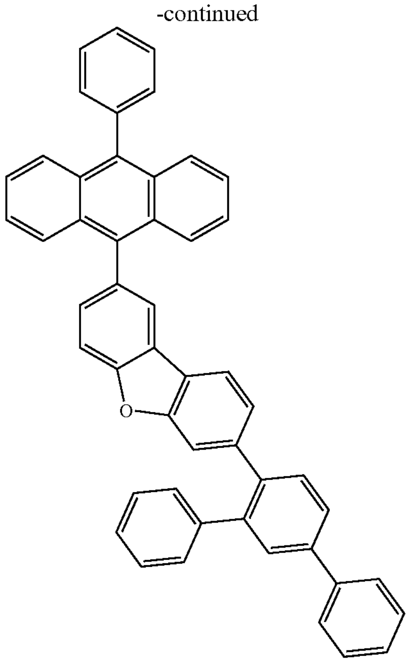
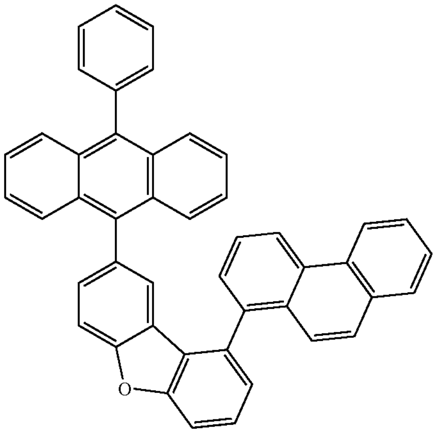
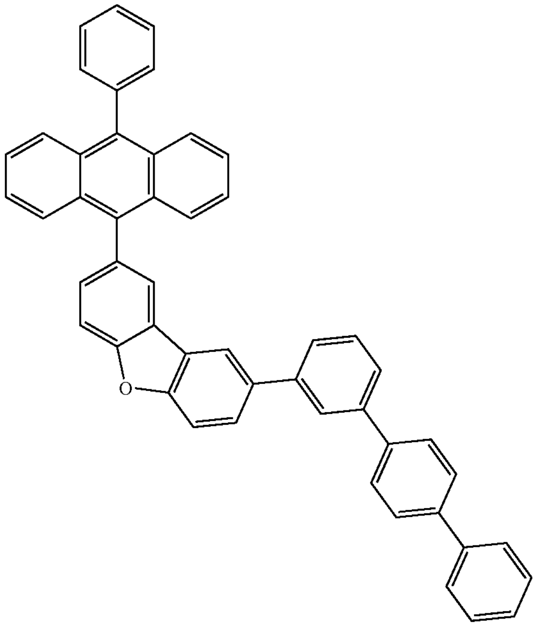
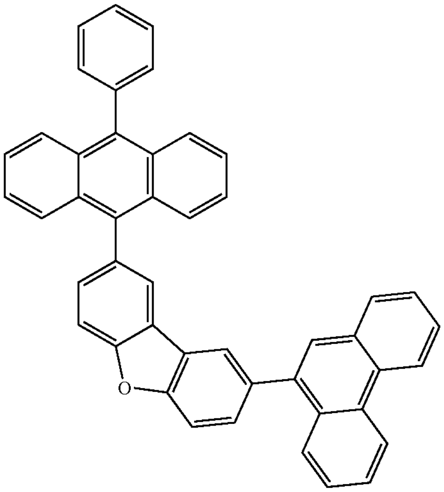

-continued
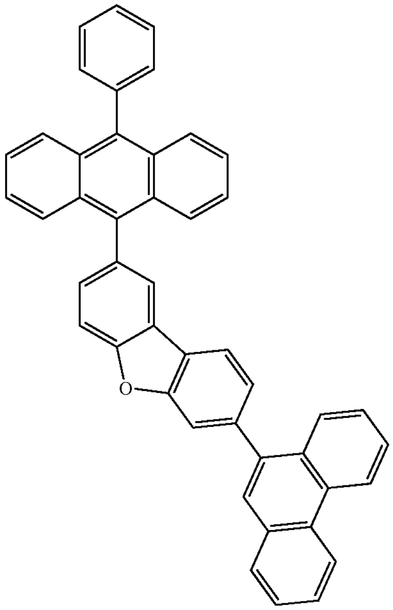
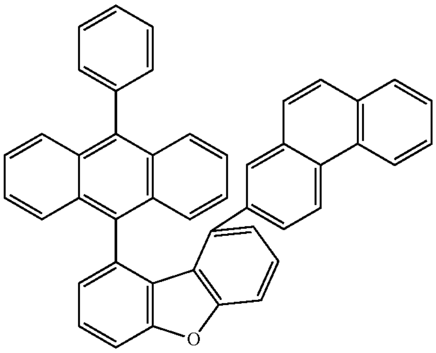
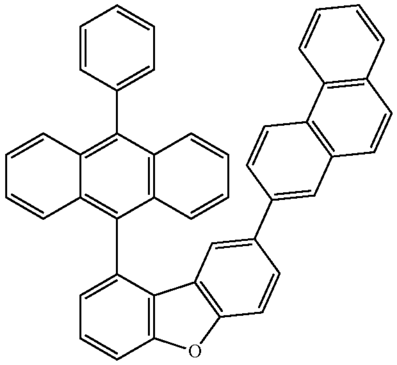
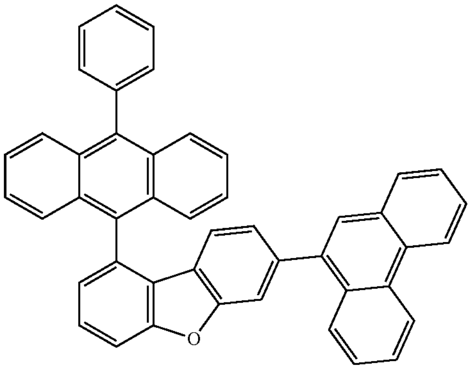
-continued
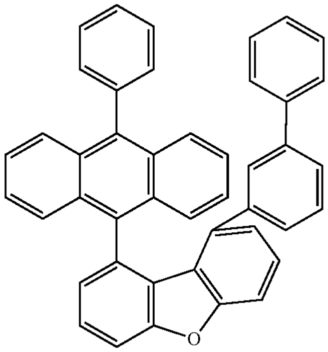
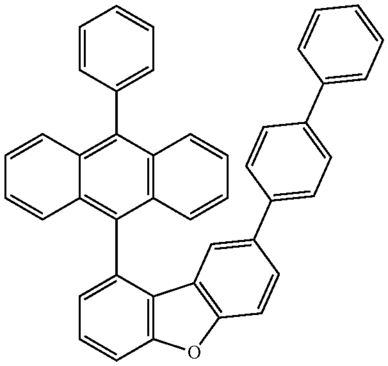
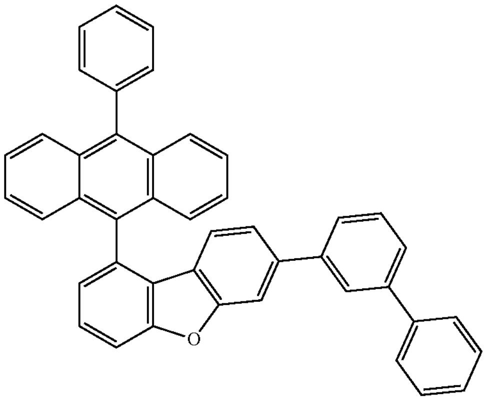
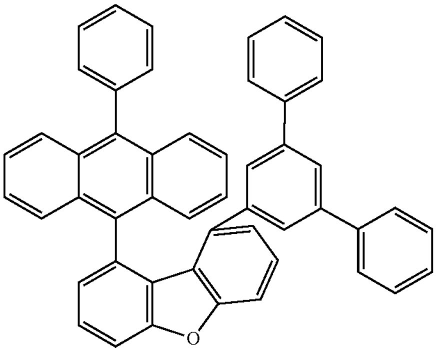

-continued
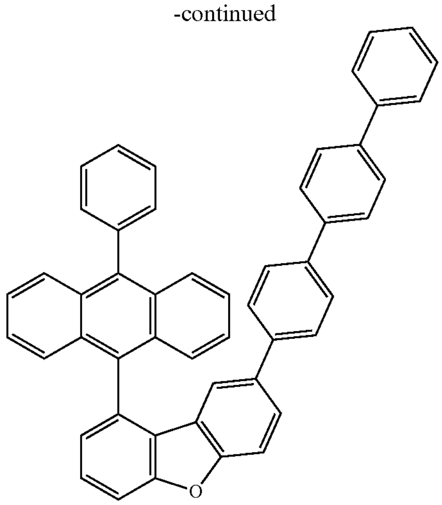
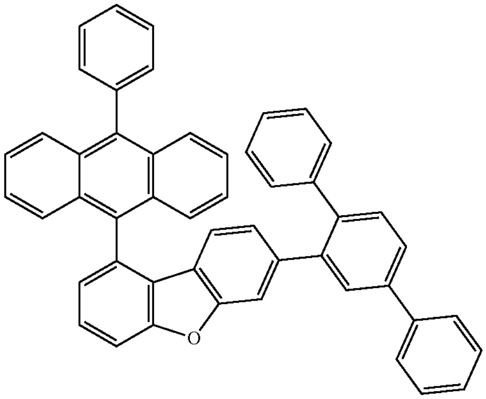
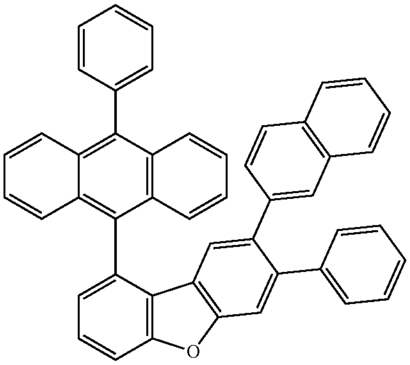
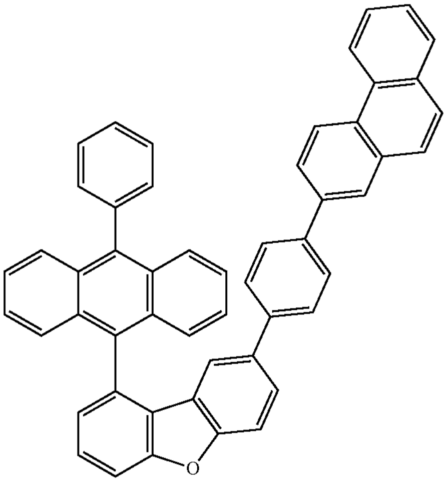
-continued
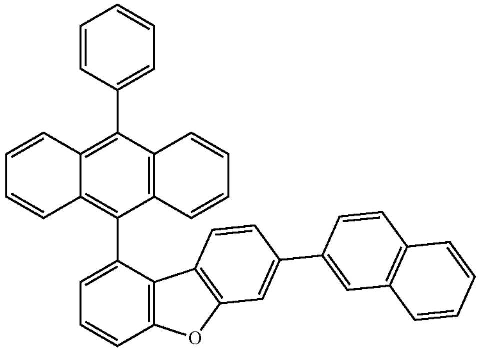
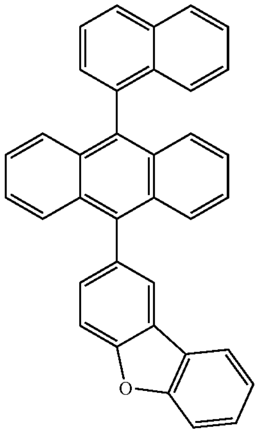
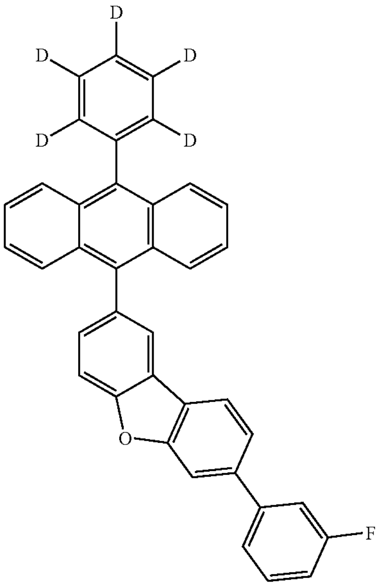

-continued
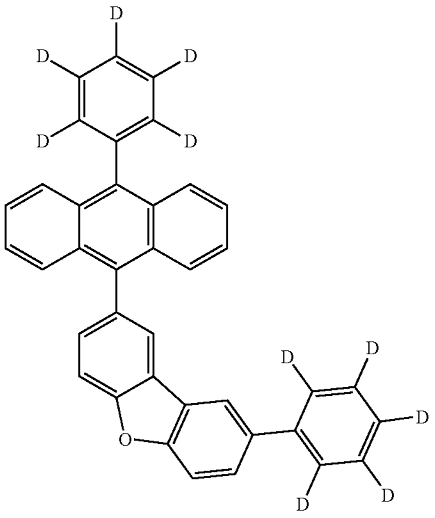
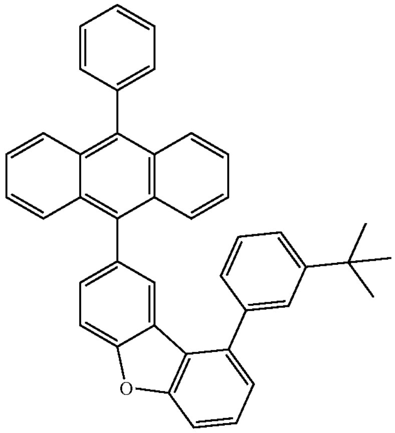
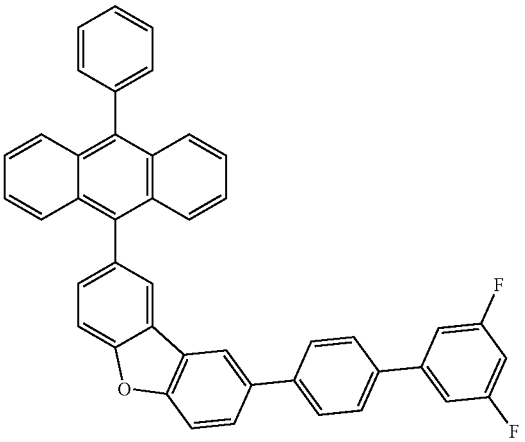
-continued
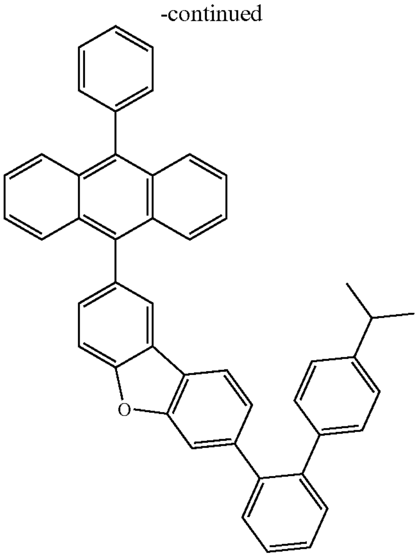
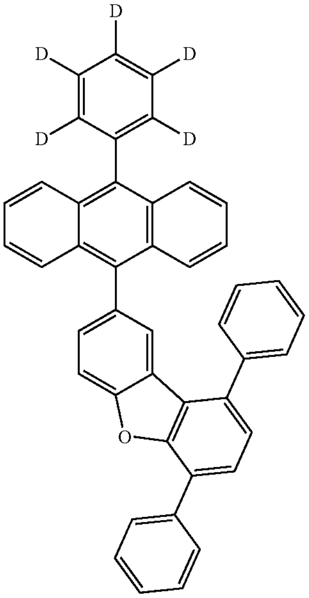
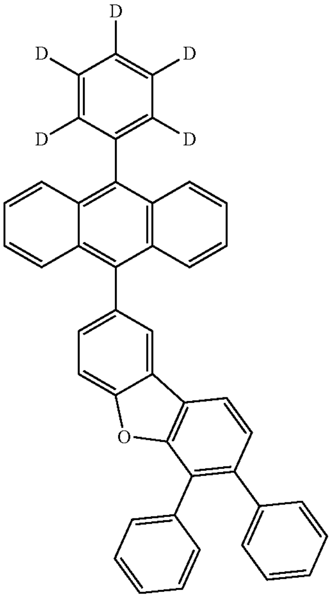

-continued
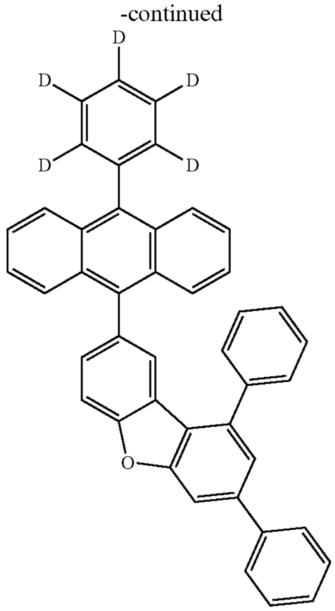
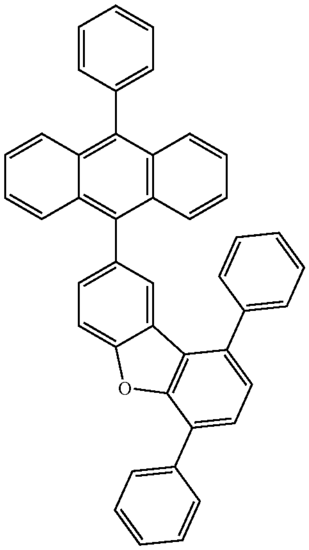
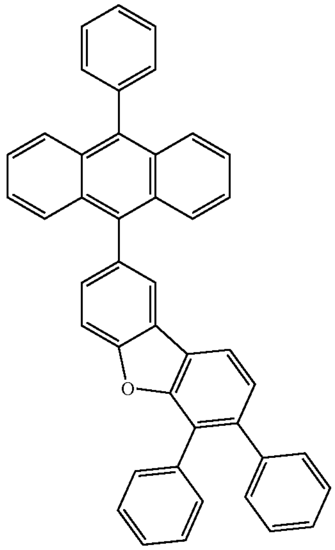
-continued
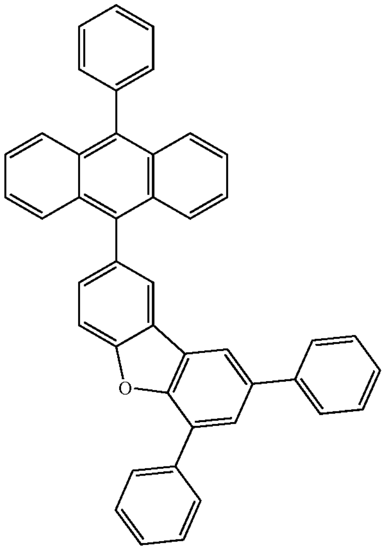
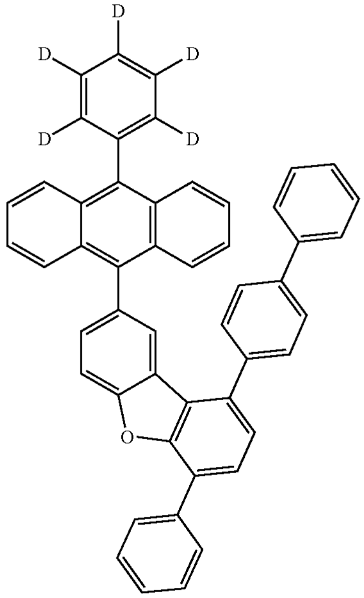

-continued
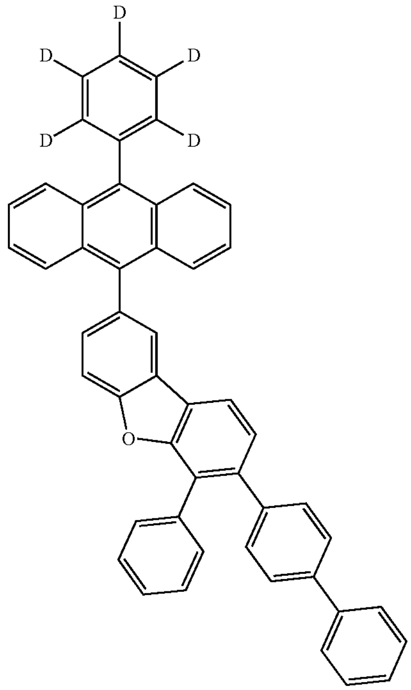
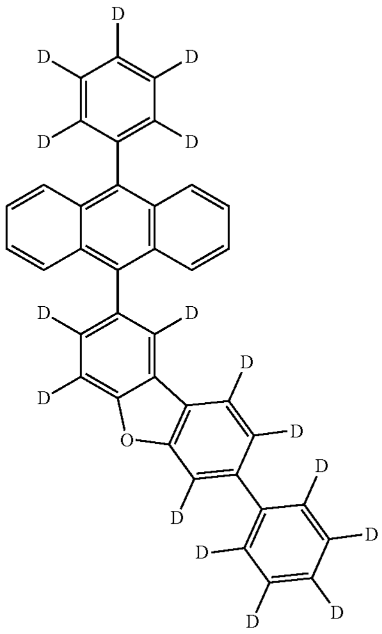
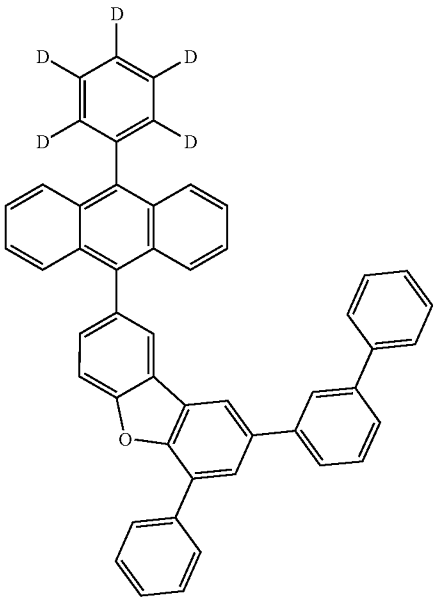
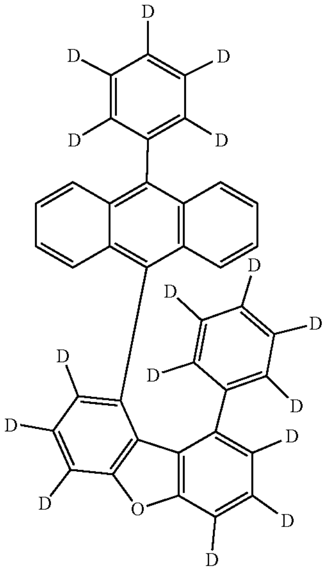

-continued
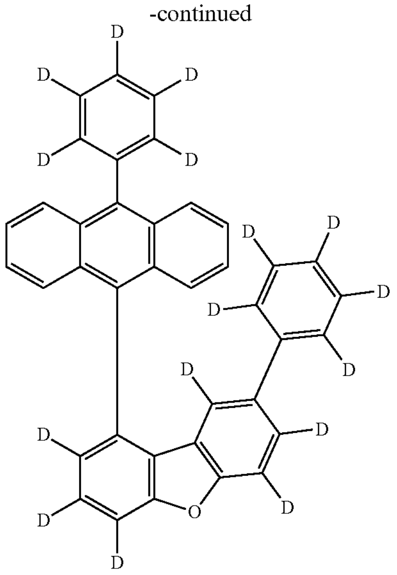
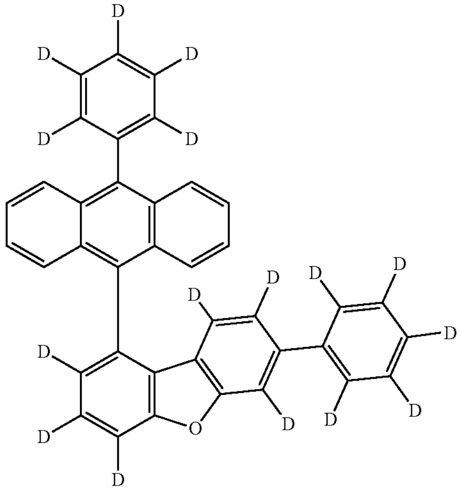
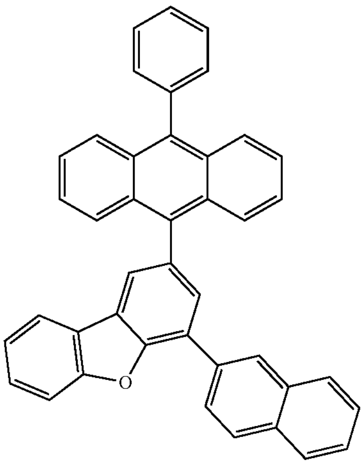
-continued
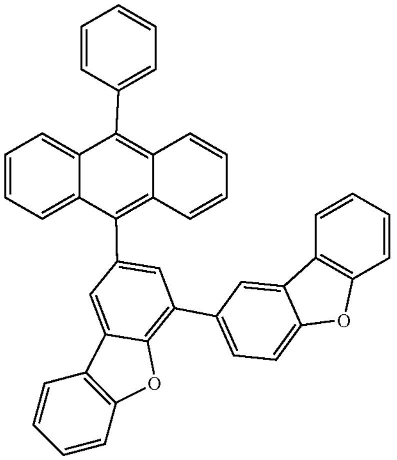
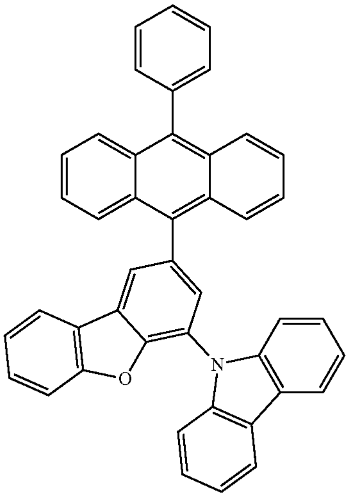
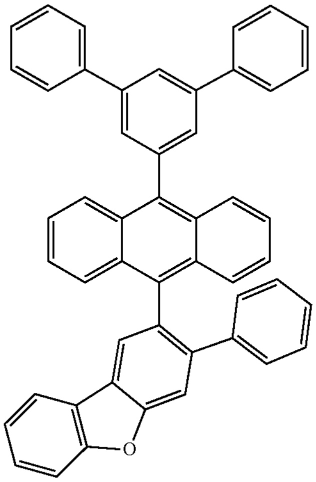

-continued
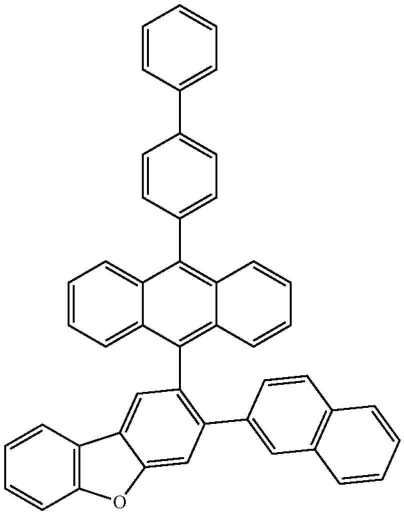
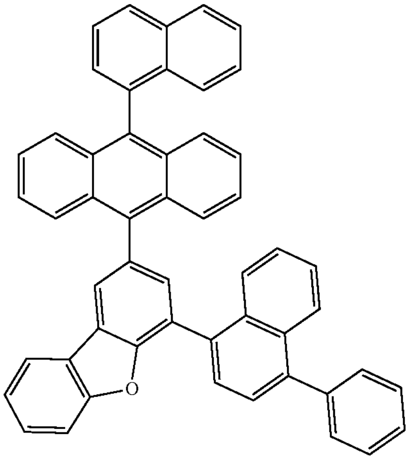
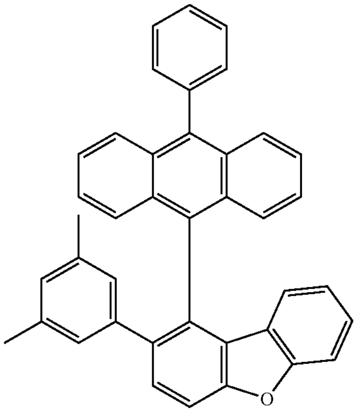
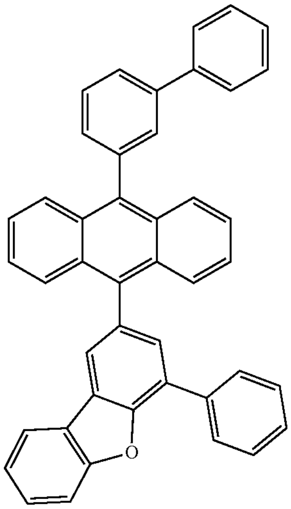
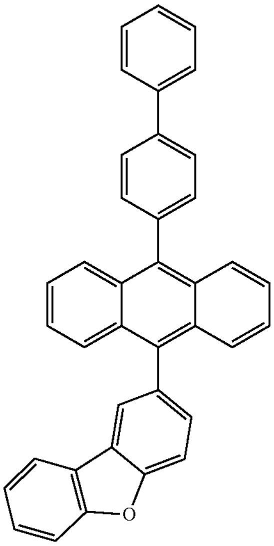
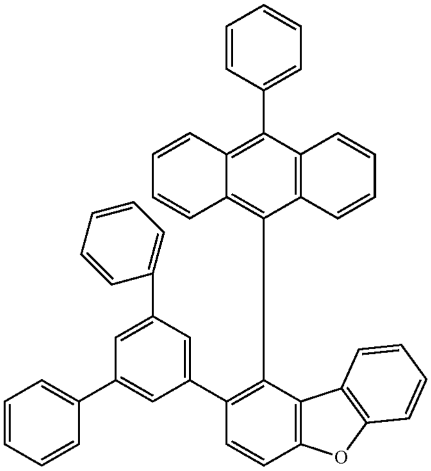
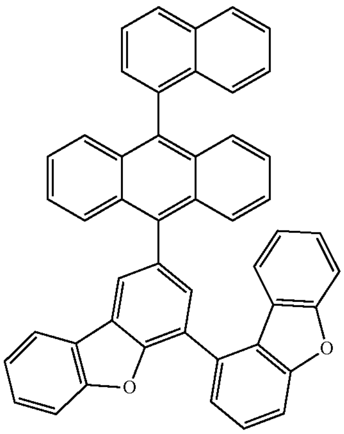
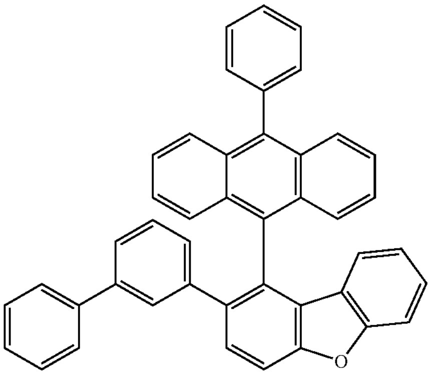

-continued
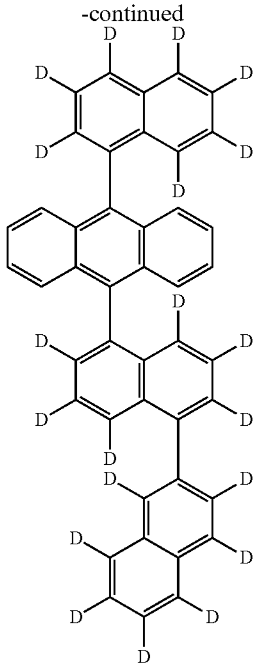
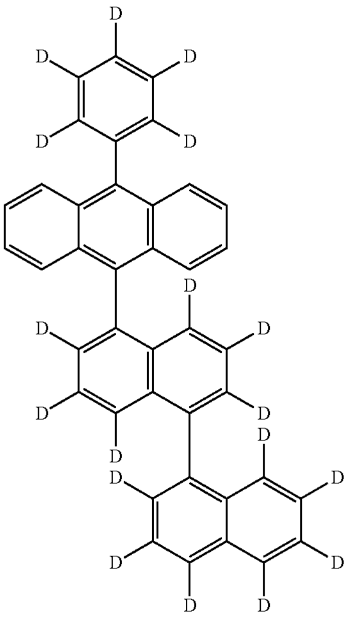
-continued
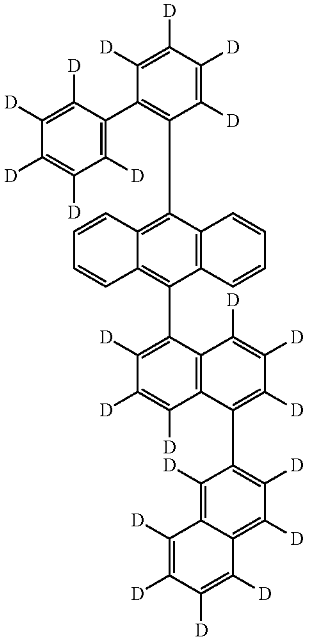
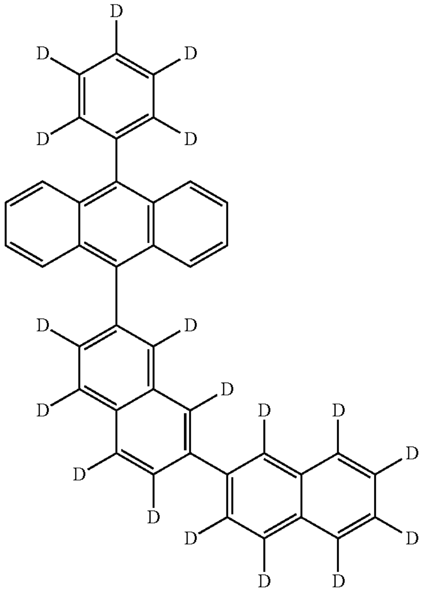
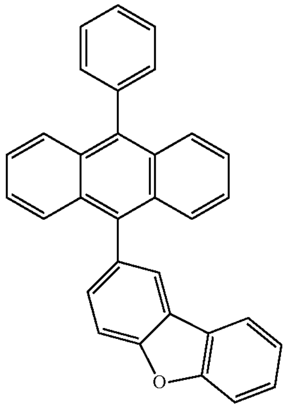

-continued
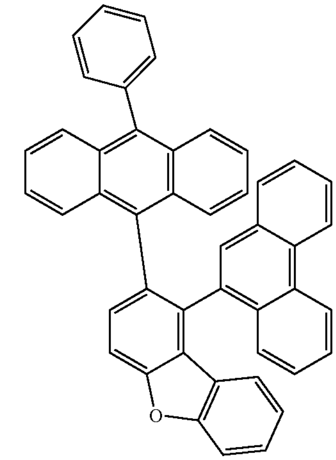
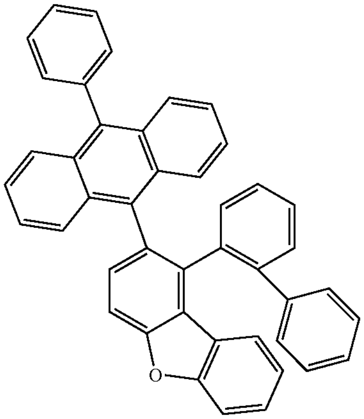
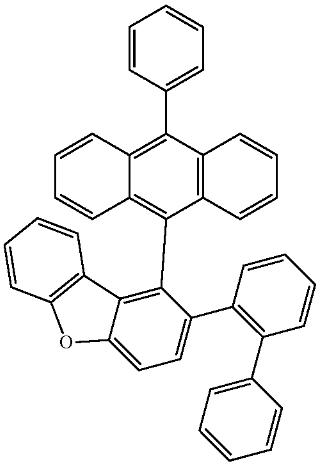
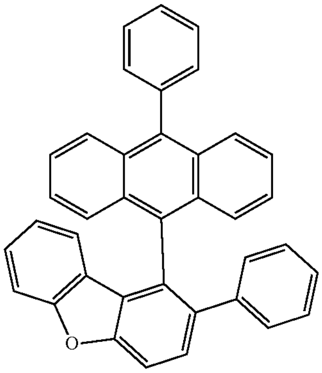
-continued
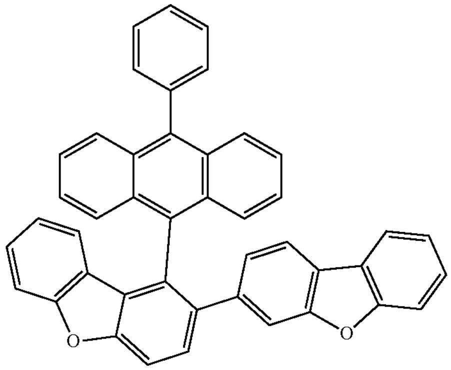
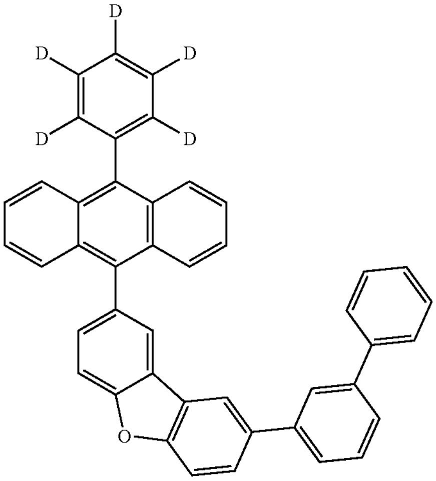
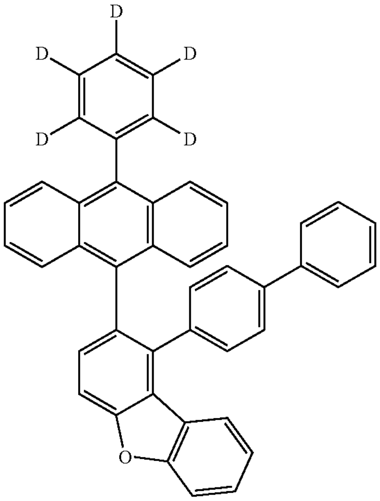

-continued
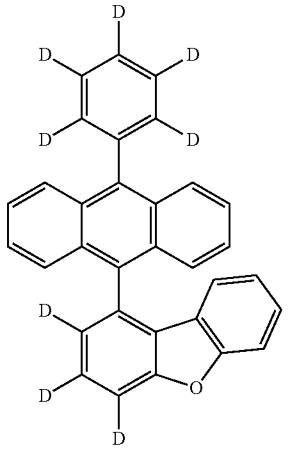
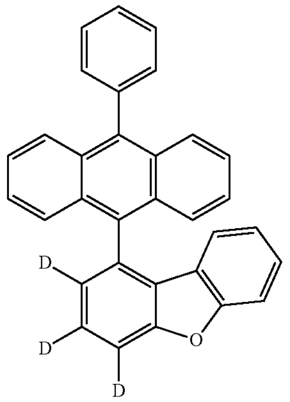
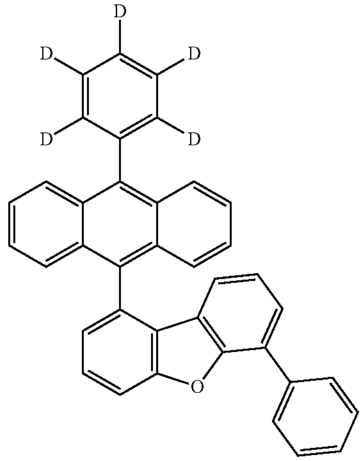
-continued
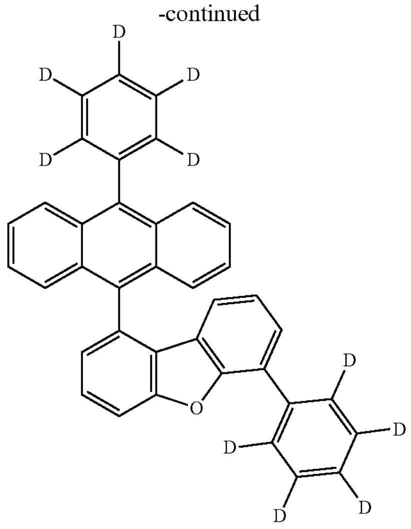
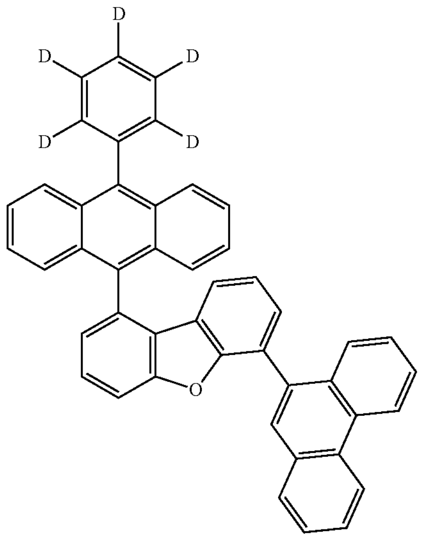
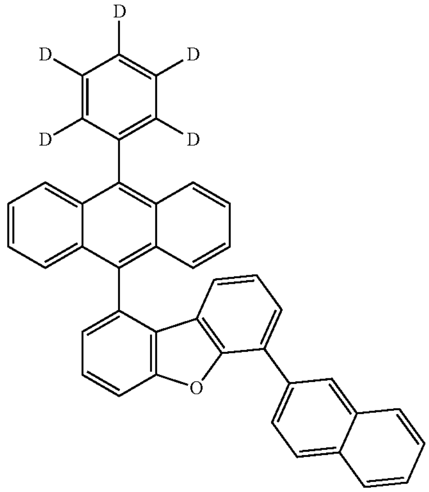

-continued
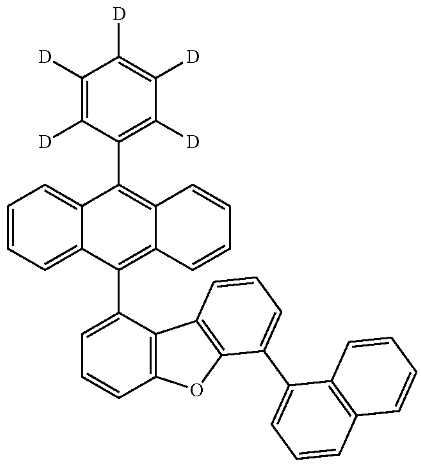
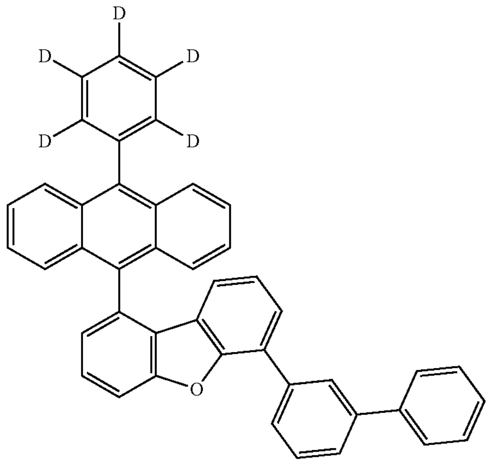
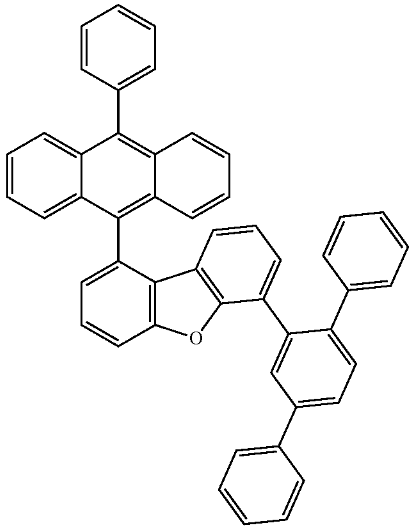
-continued
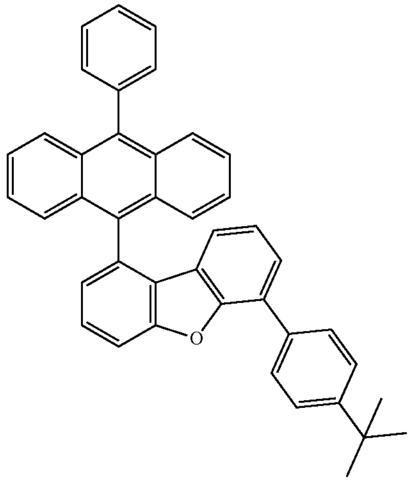
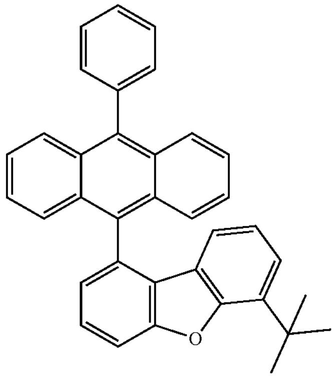
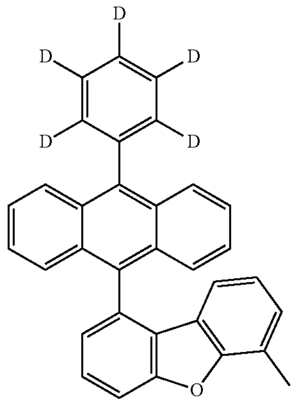

-continued
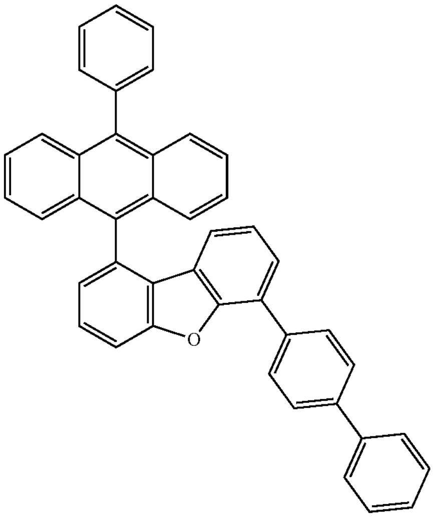
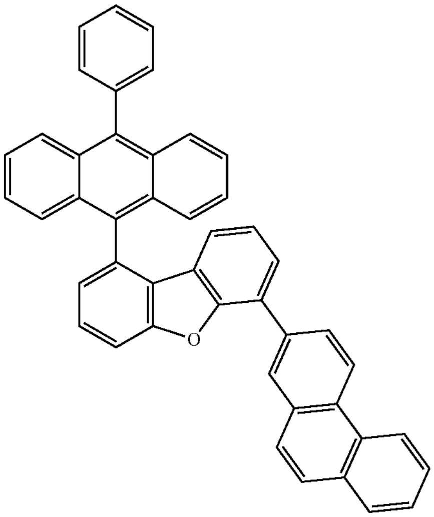
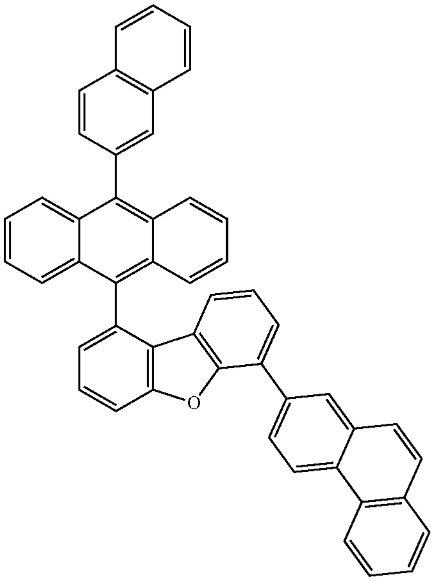
-continued
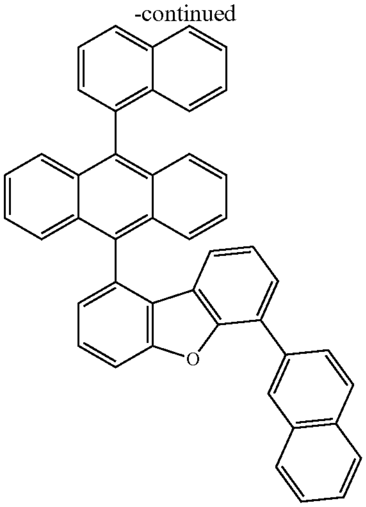
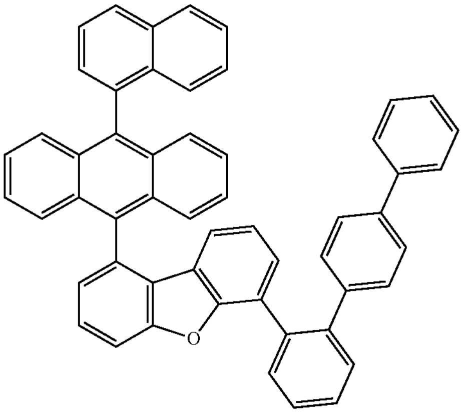
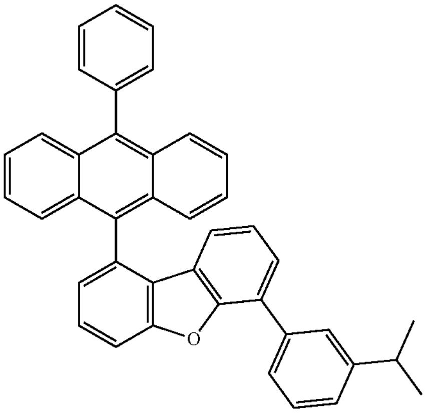
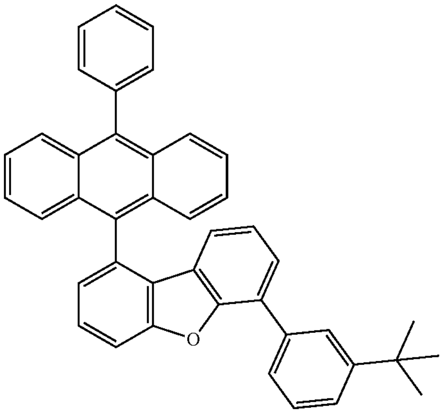

-continued
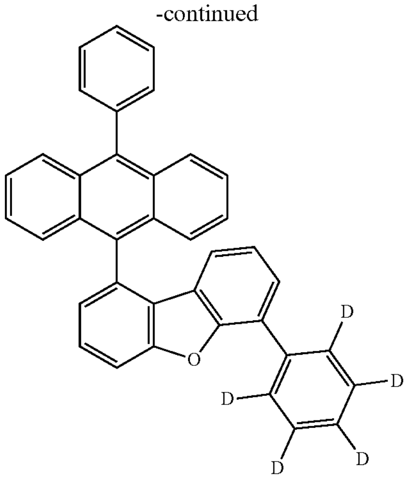
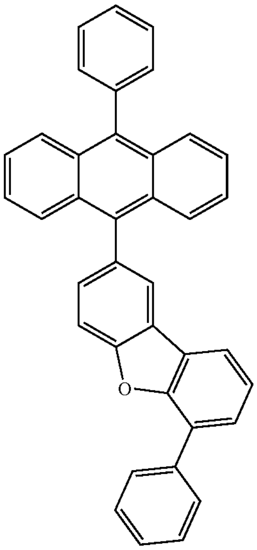
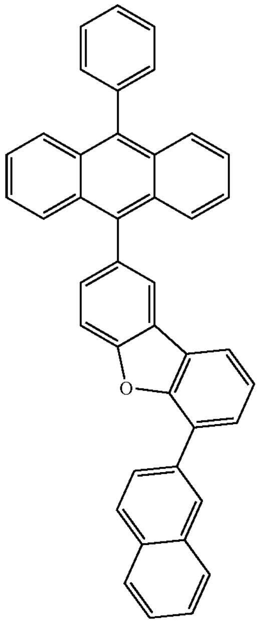
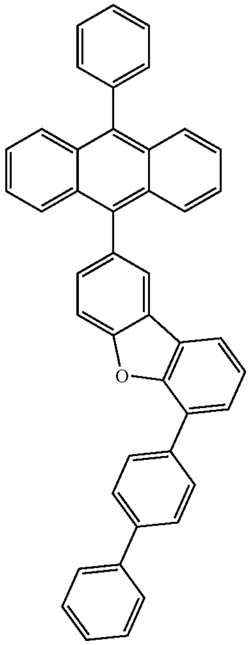
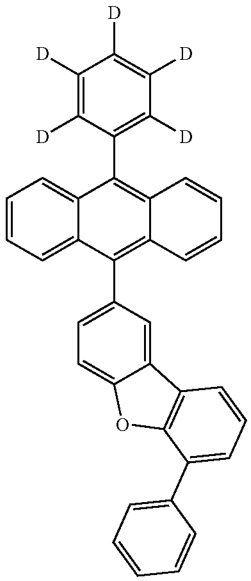
-continued
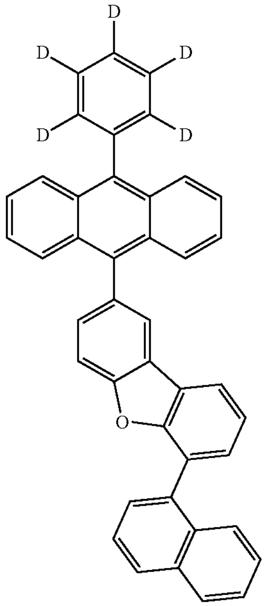
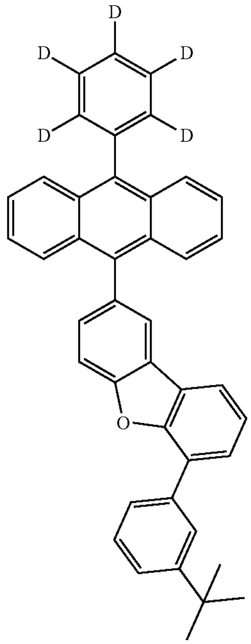
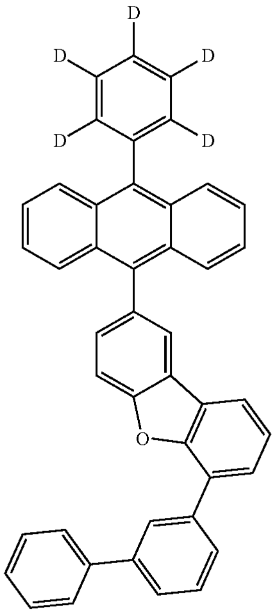

-continued
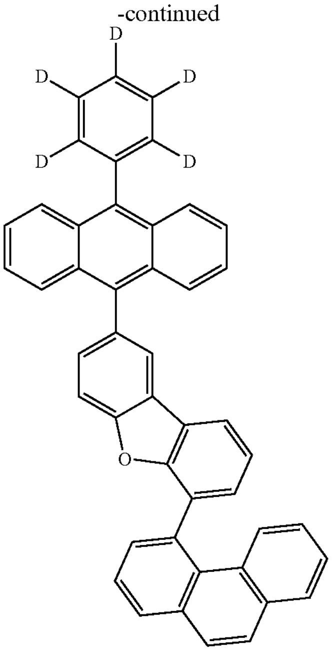
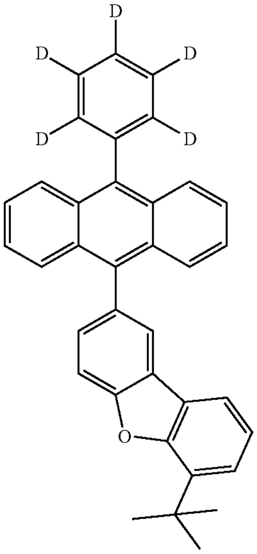
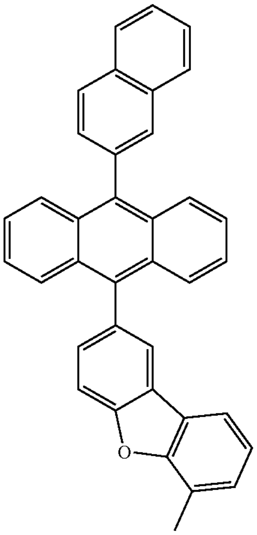
-continued
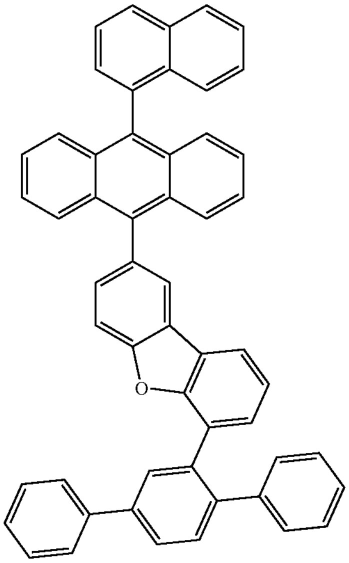
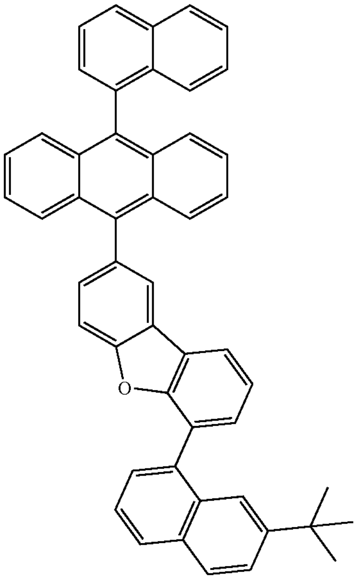
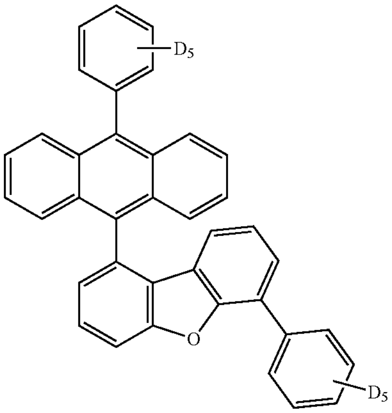

-continued
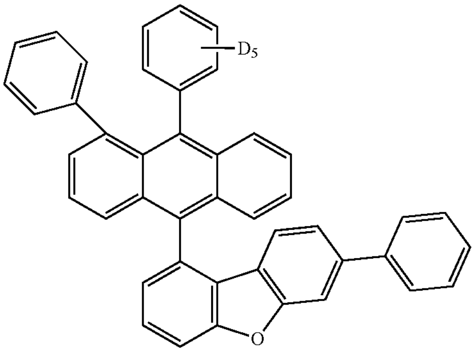
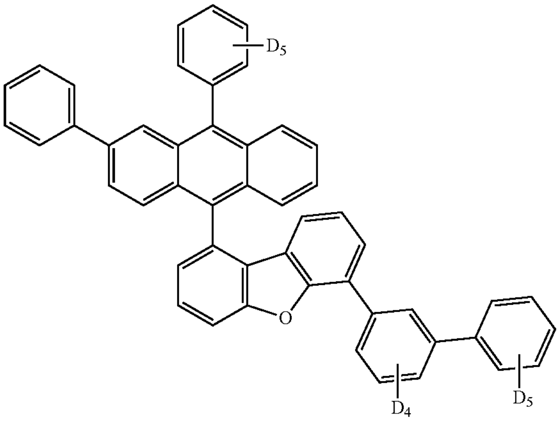
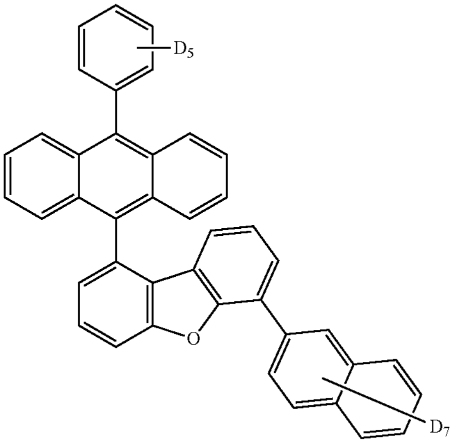
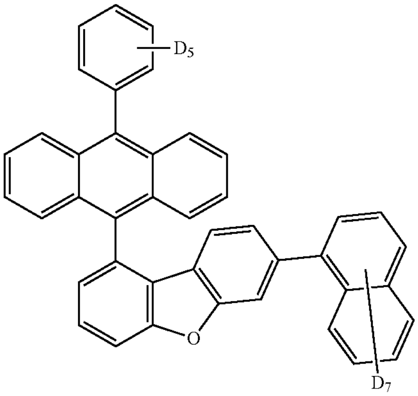
-continued
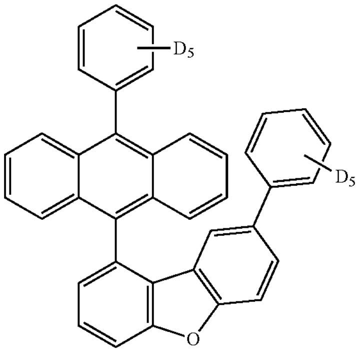
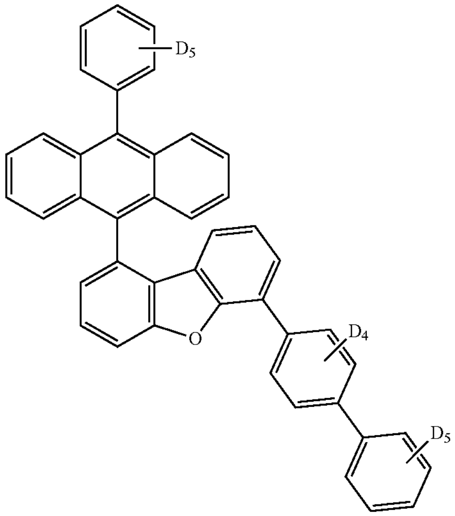
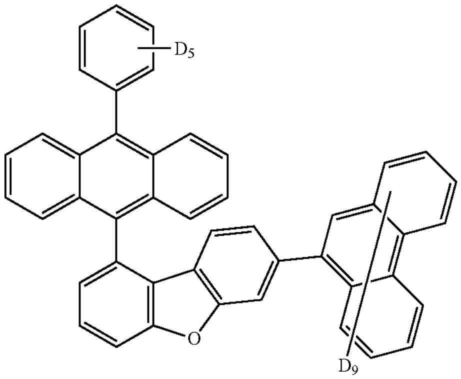

-continued
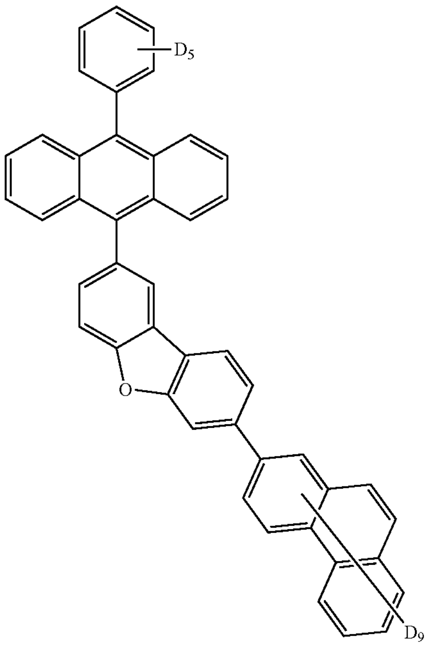
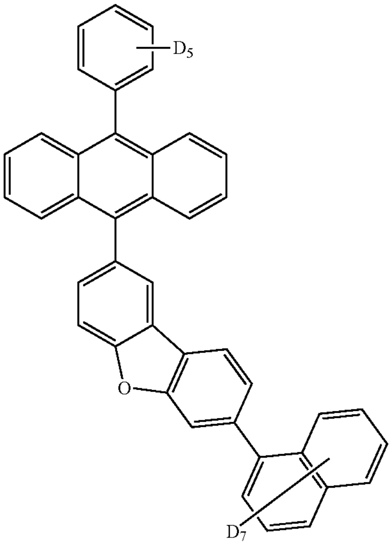
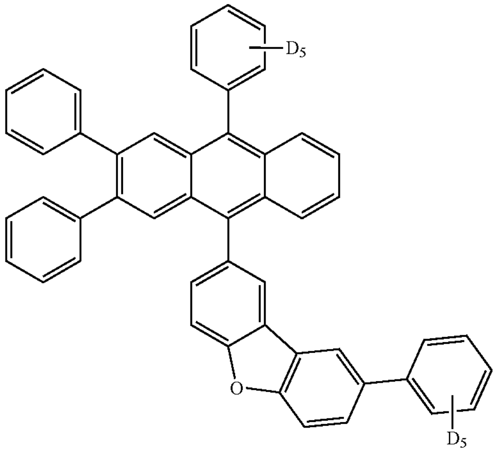
-continued
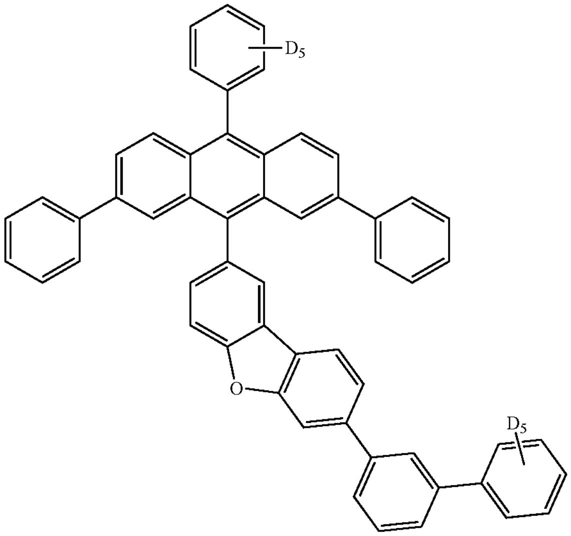
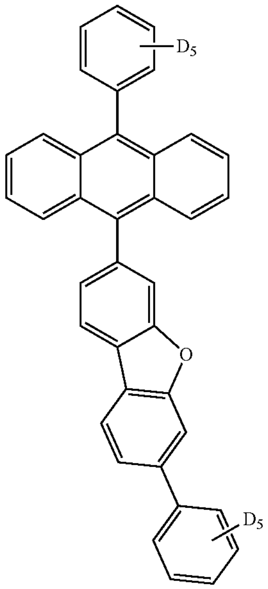
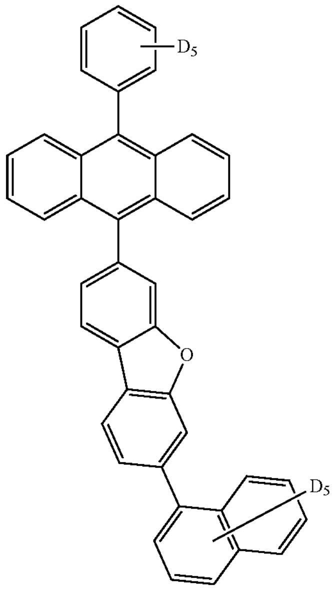

-continued
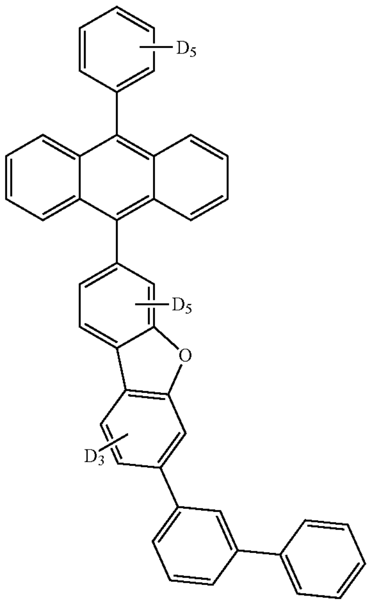
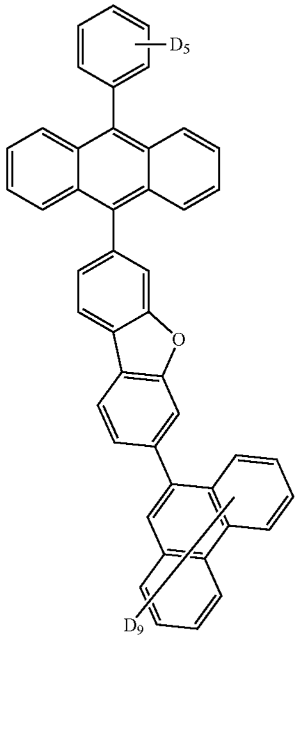
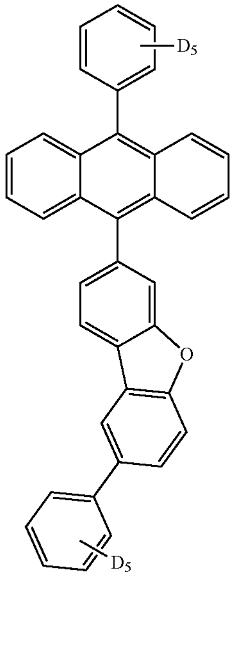
-continued
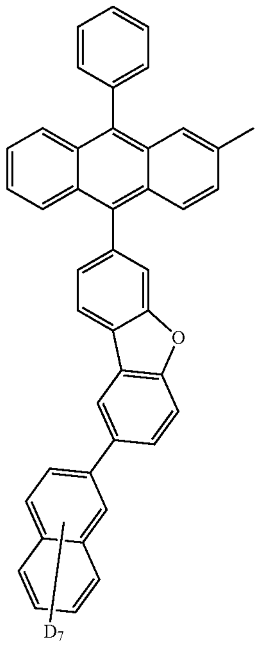
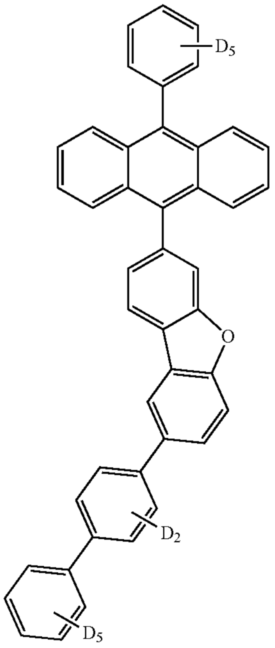
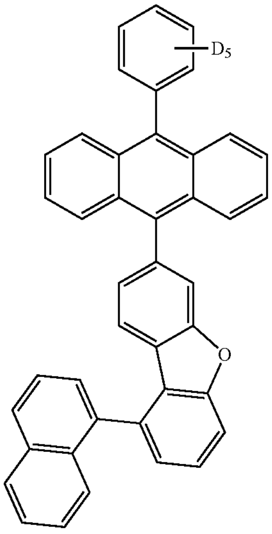
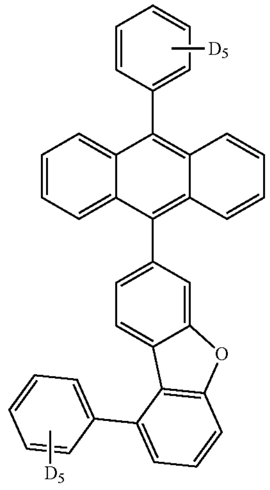
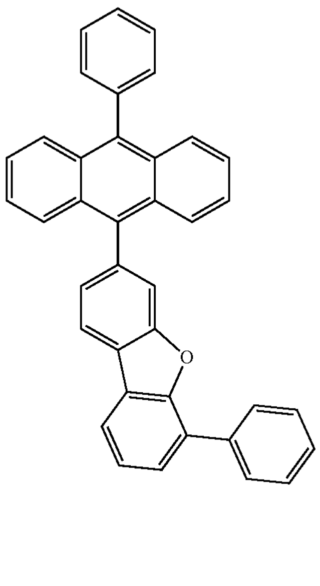

-continued
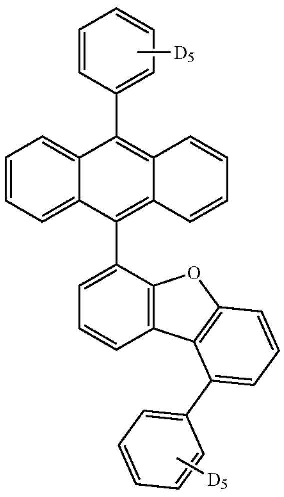
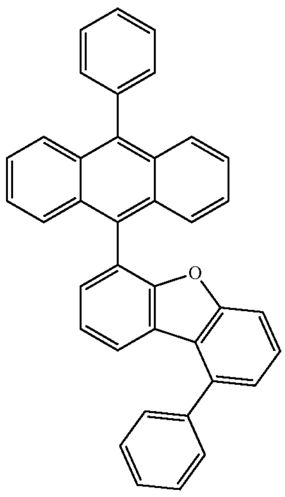
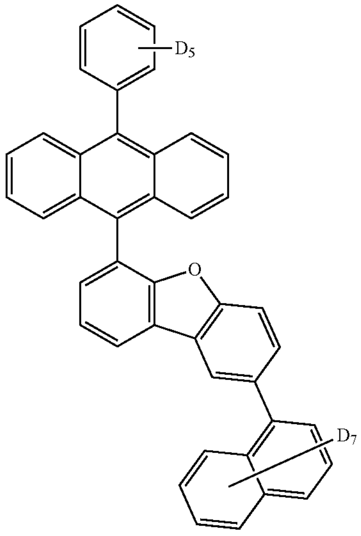
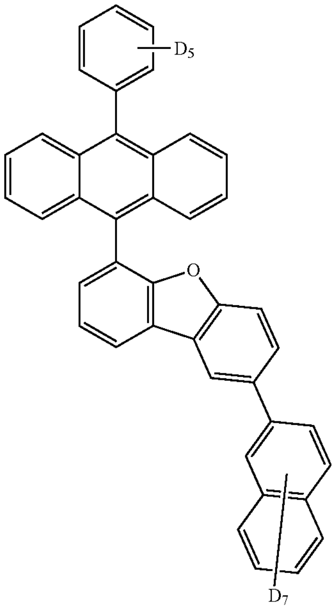
-continued
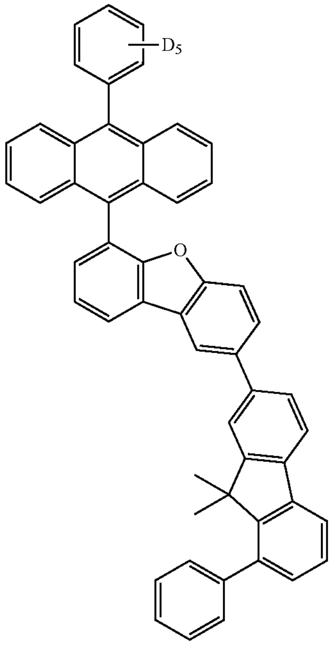
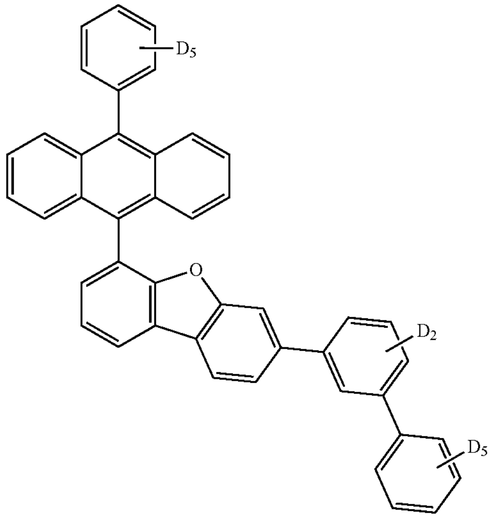
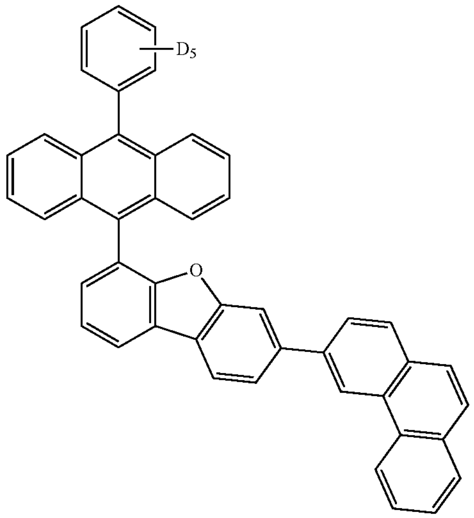

-continued
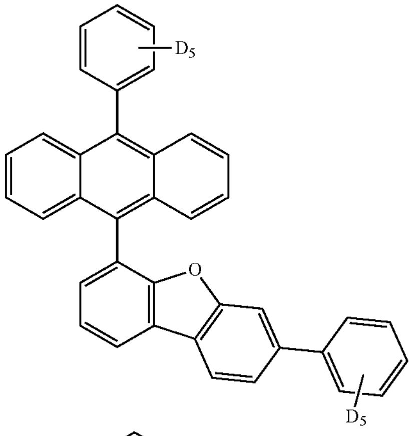
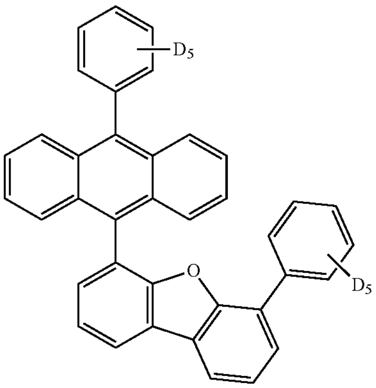
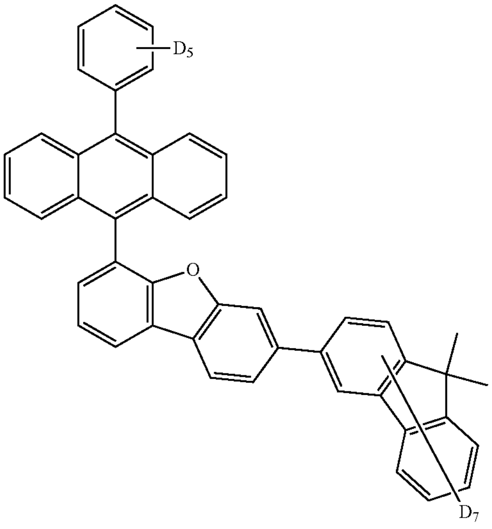
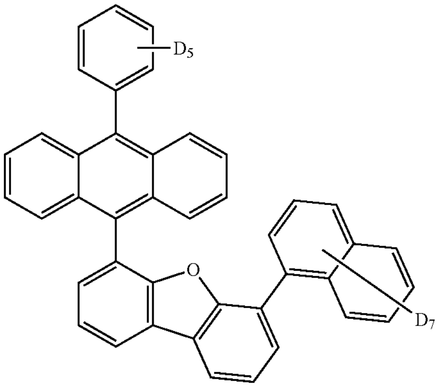
-continued
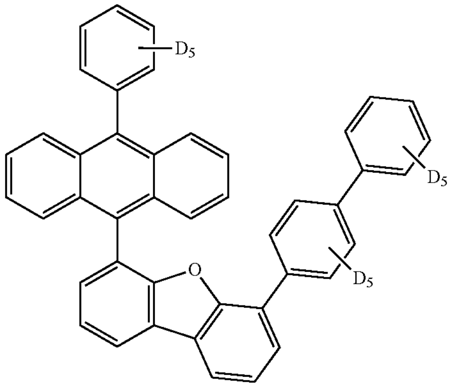
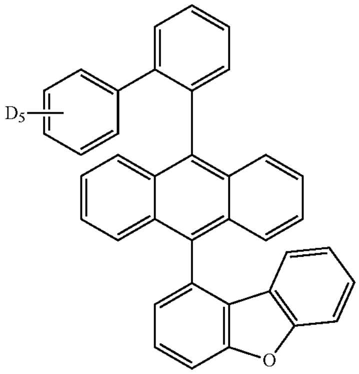
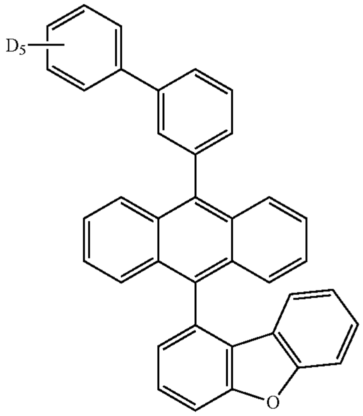
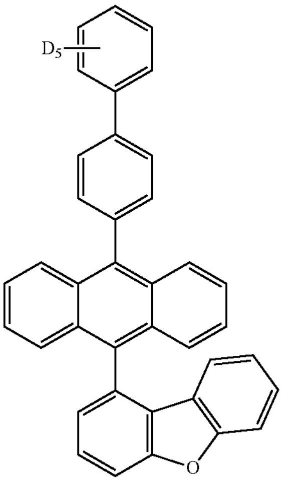

-continued
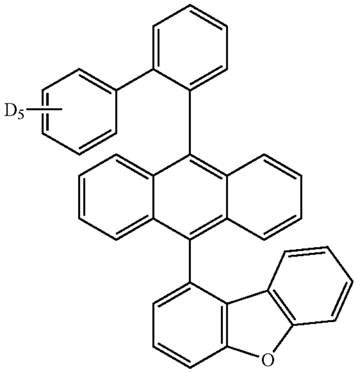
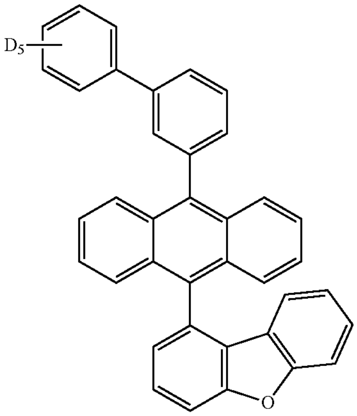
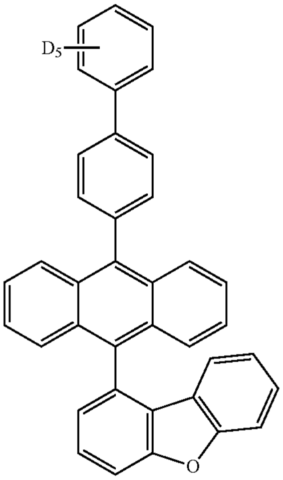
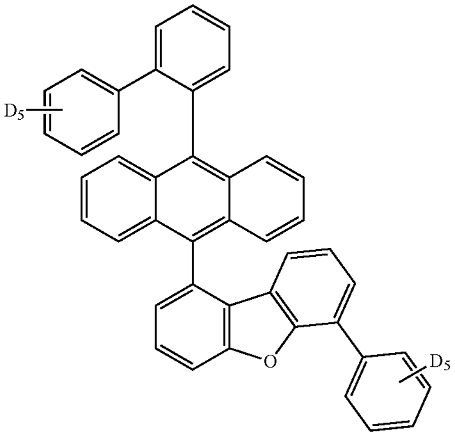
-continued
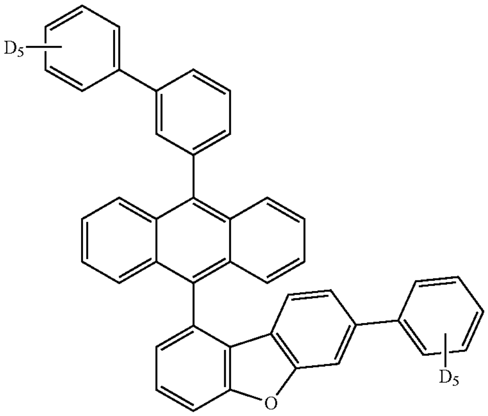
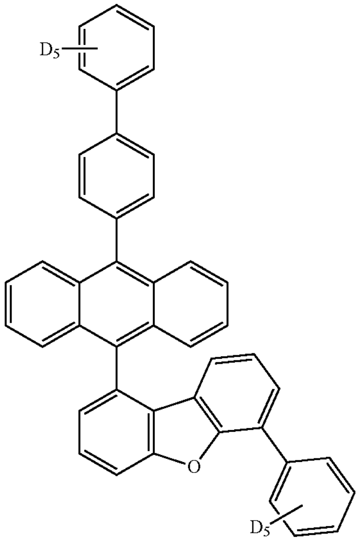
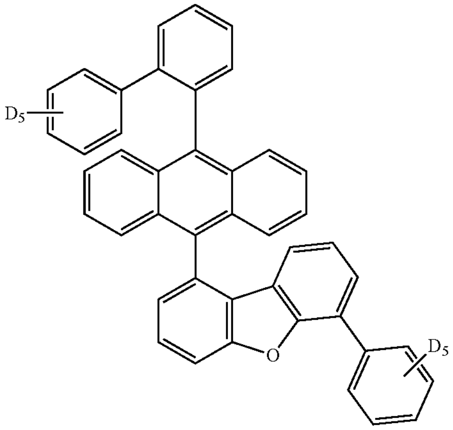

-continued
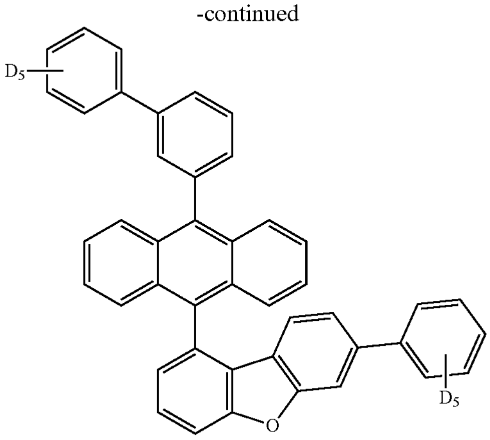
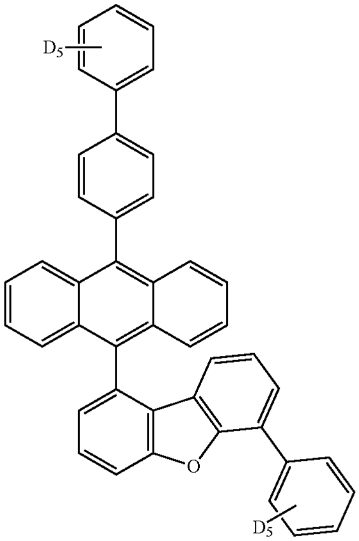
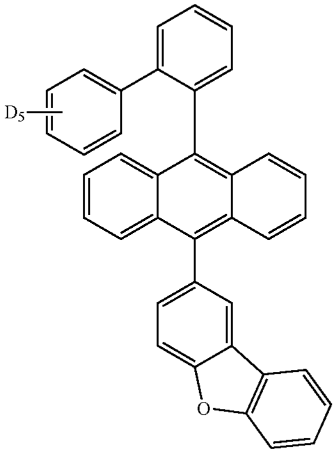
-continued
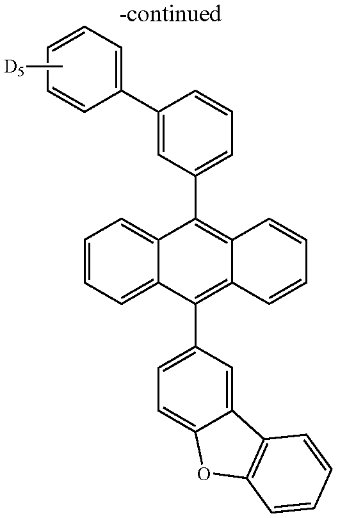
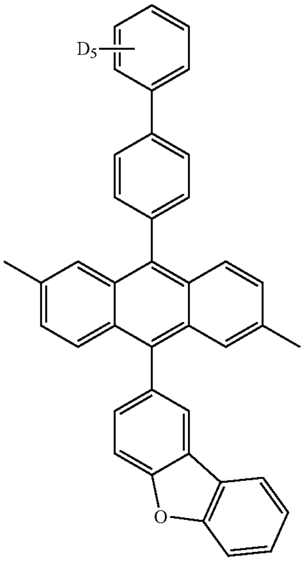
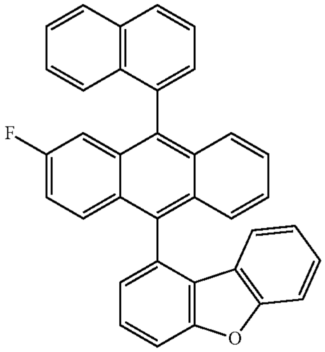

-continued
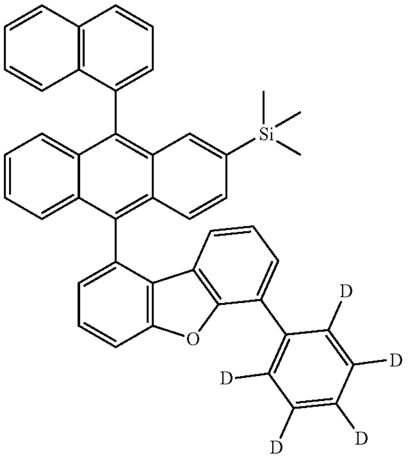
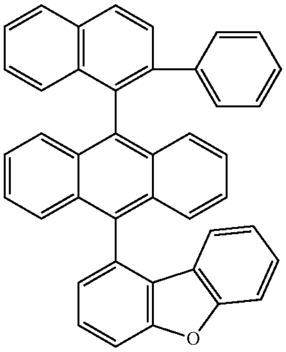
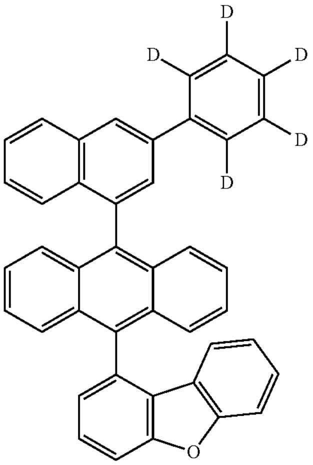
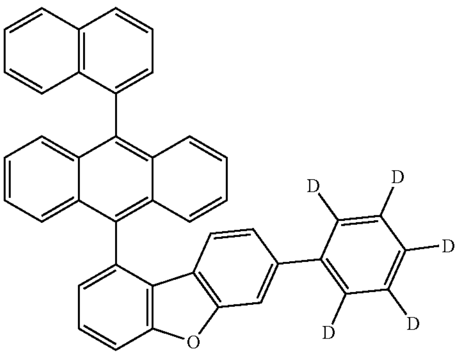
-continued
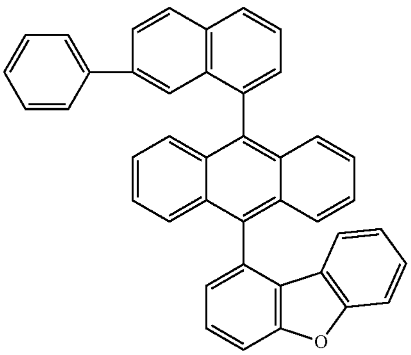
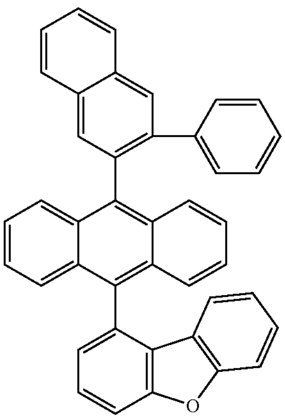
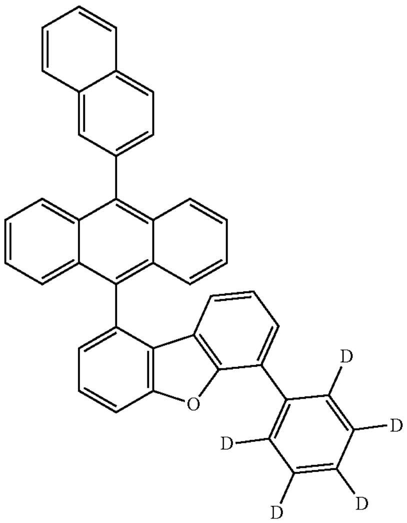

-continued
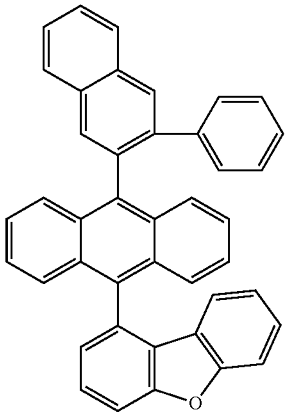
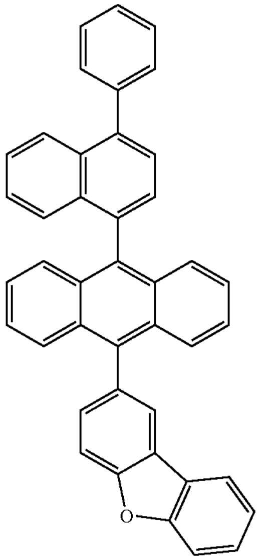
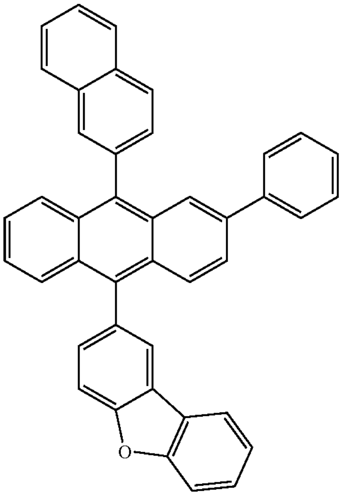
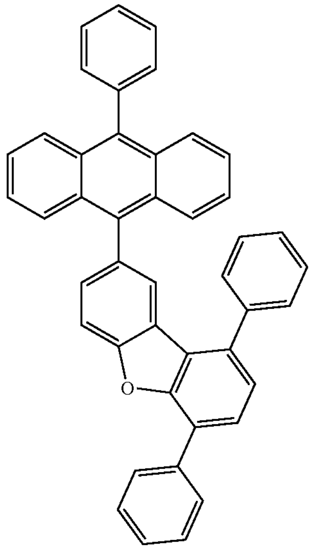
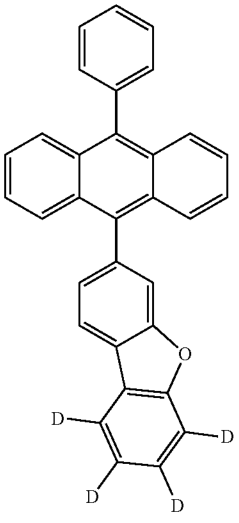
-continued
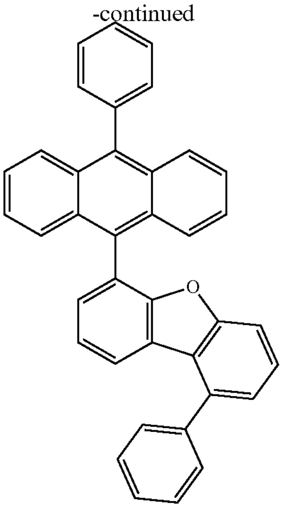
The specific substituents in Formula 1 can be clearly seen from the structures of the compounds 1-1.
More specifically, the compound represented by Formula 1 may be selected from the group consisting of, but not limited to, the following compounds 1-2:
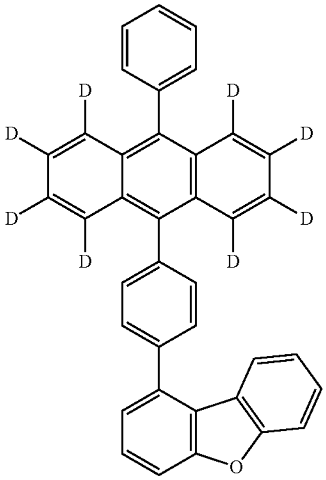
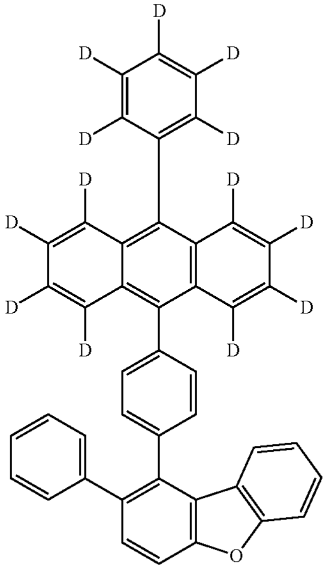

-continued
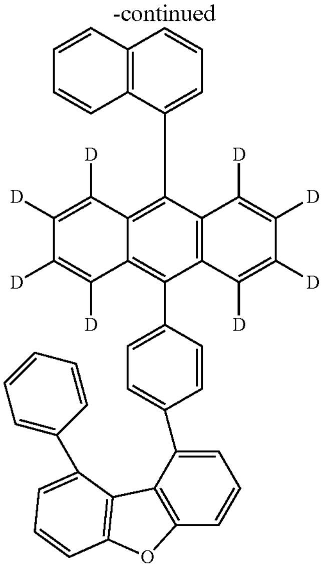
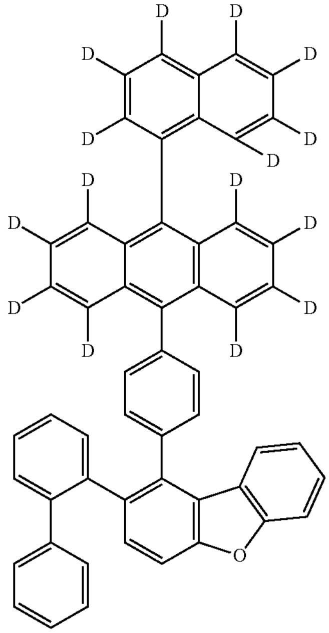
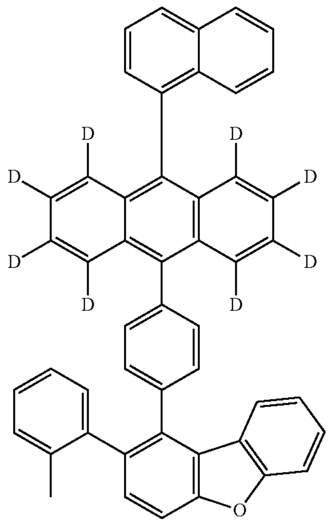
-continued
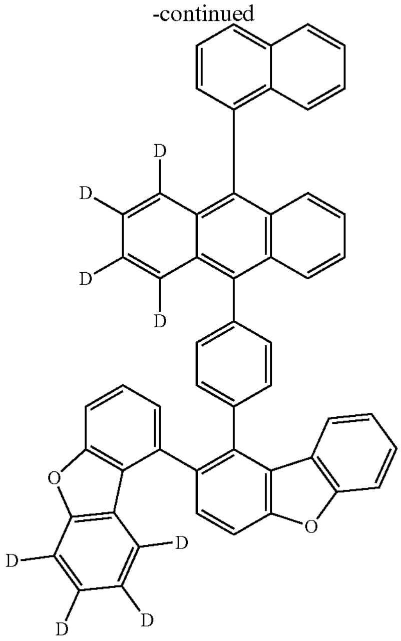
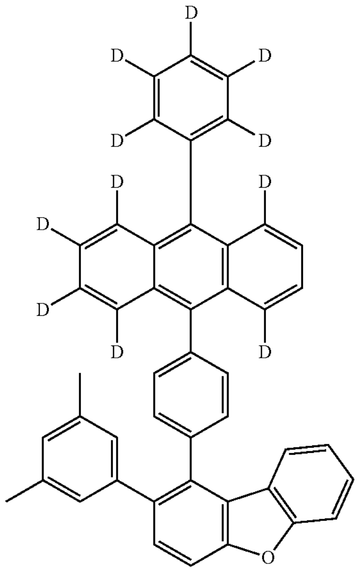

-continued
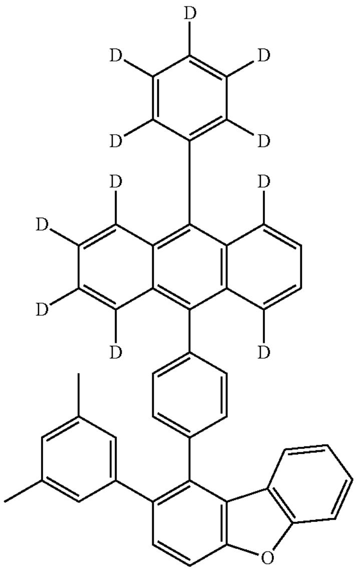
-continued
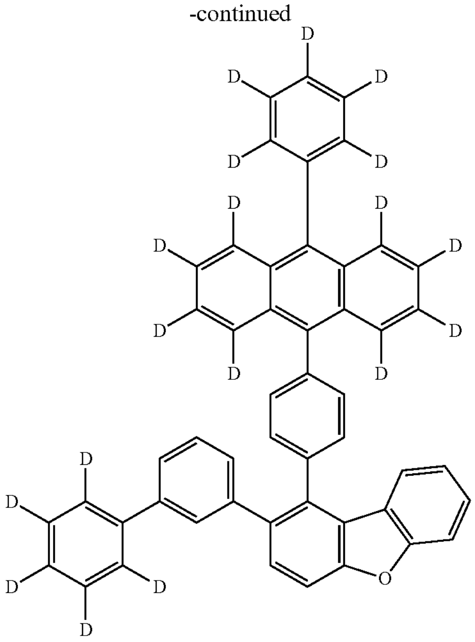
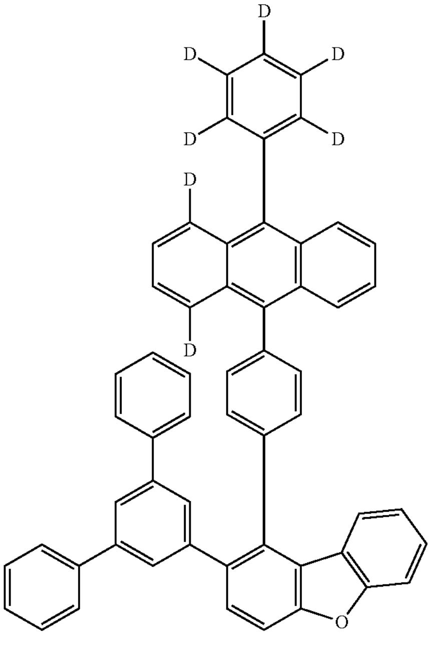
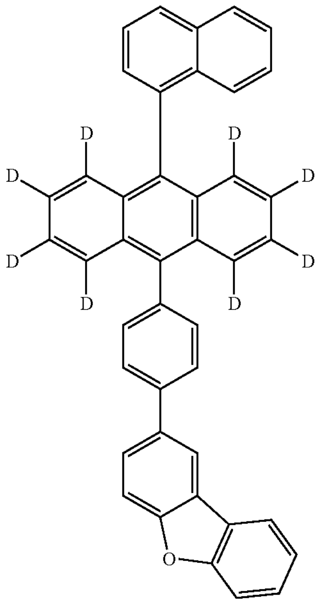

-continued
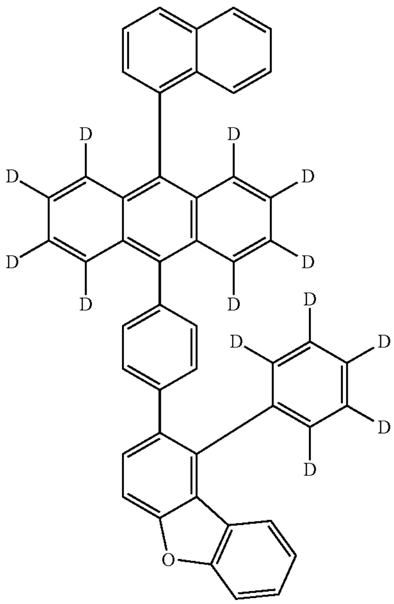
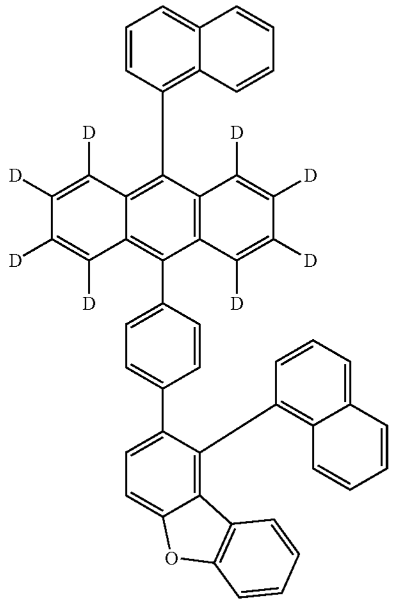
-continued
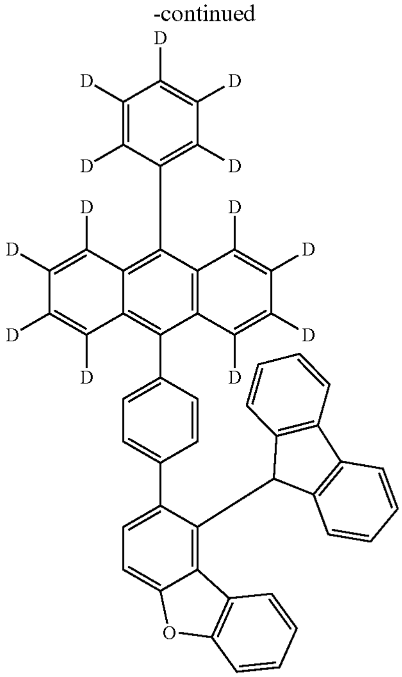
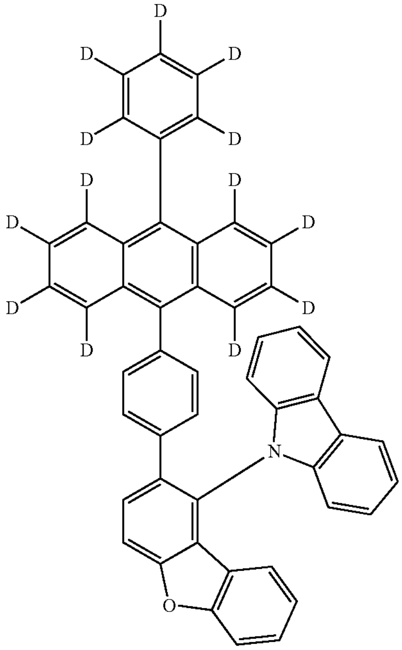

-continued
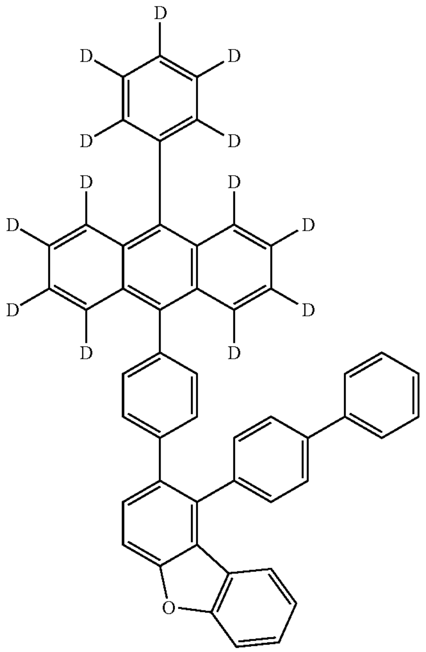
-continued
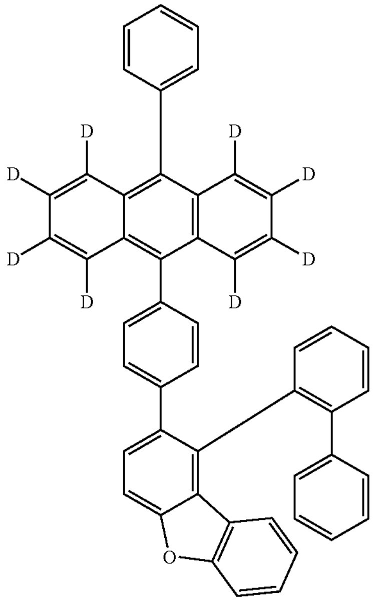
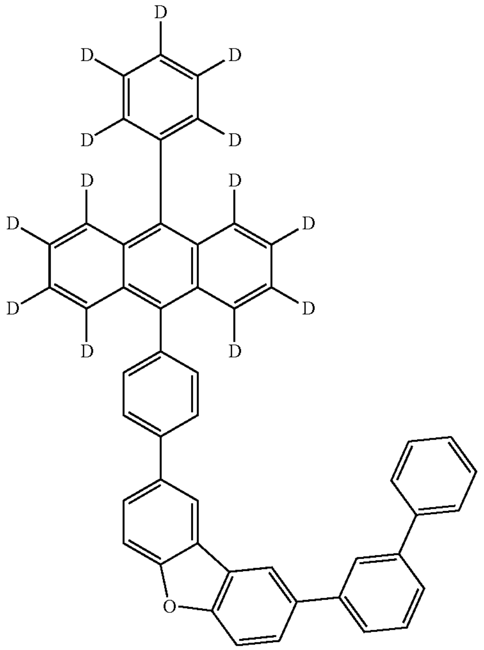
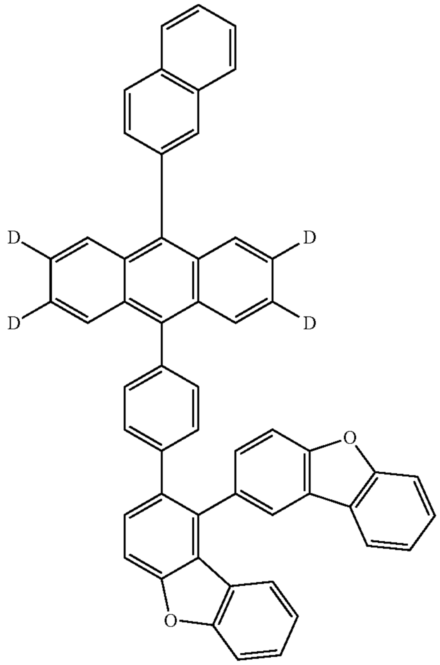

-continued
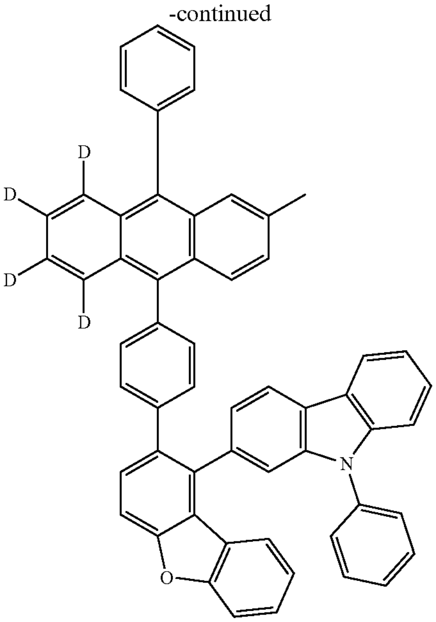
-continued
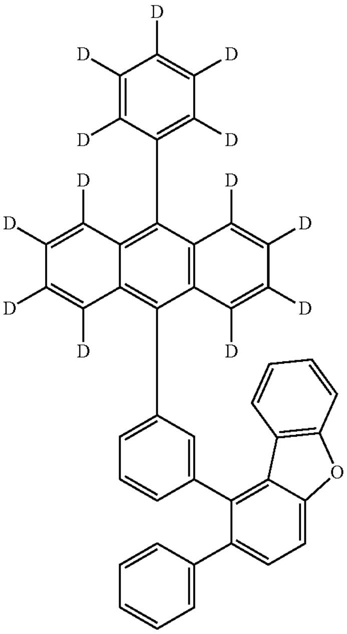
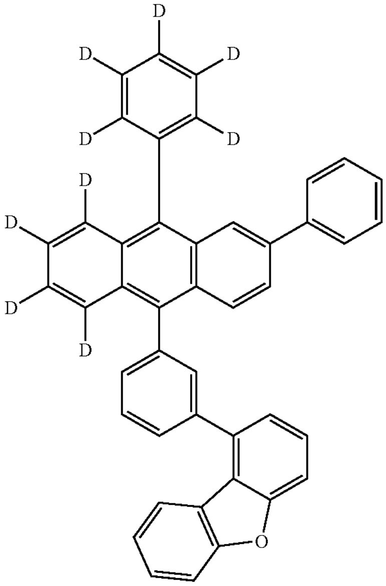
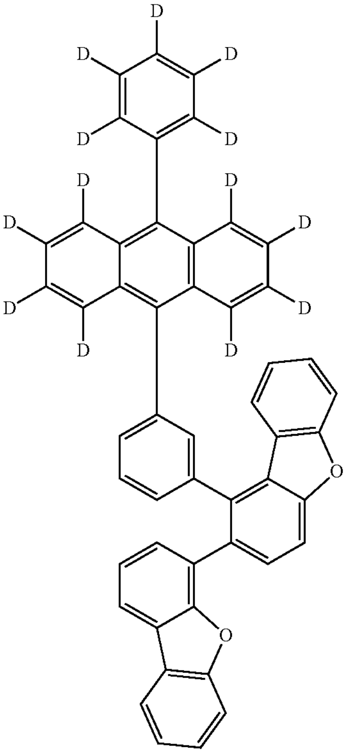

-continued
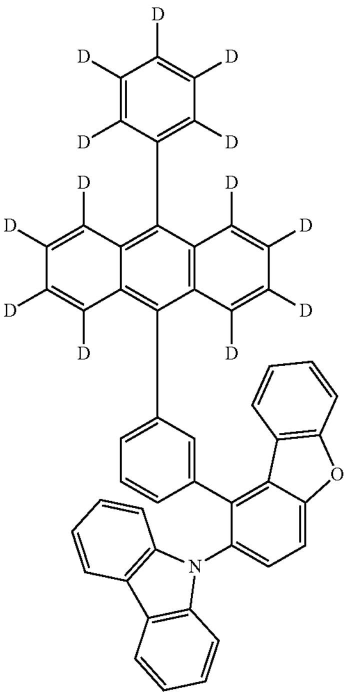
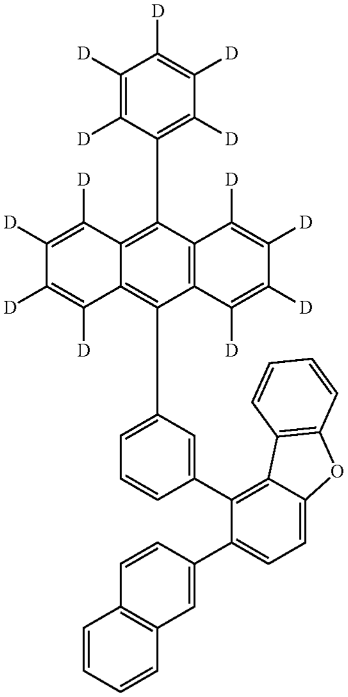
-continued
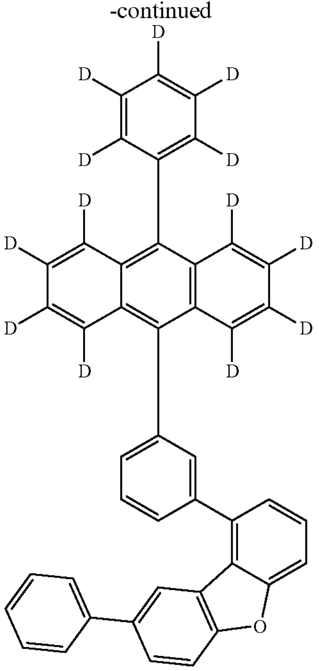
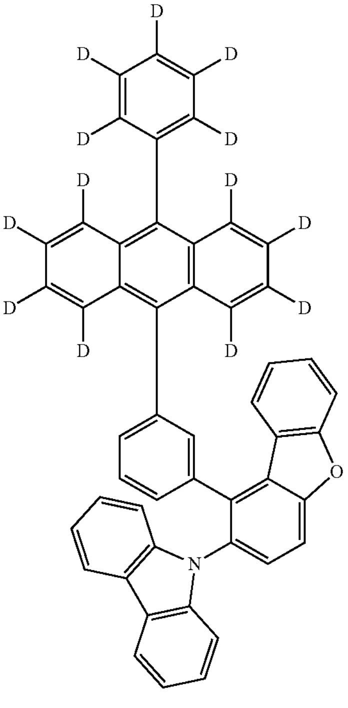

-continued
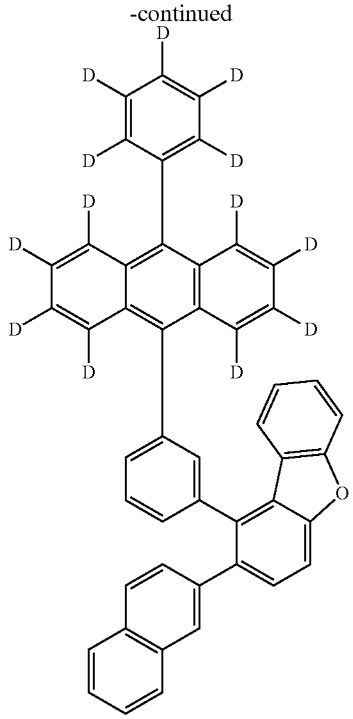
-continued
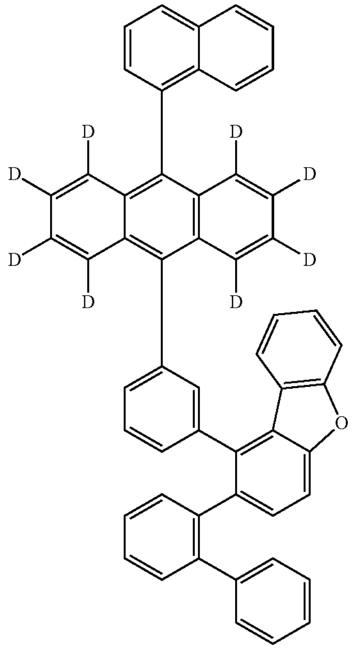
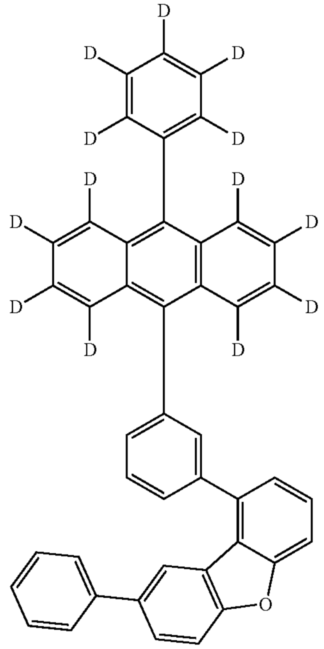
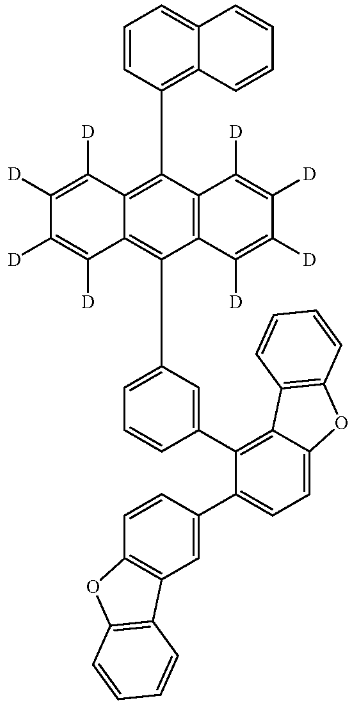

-continued
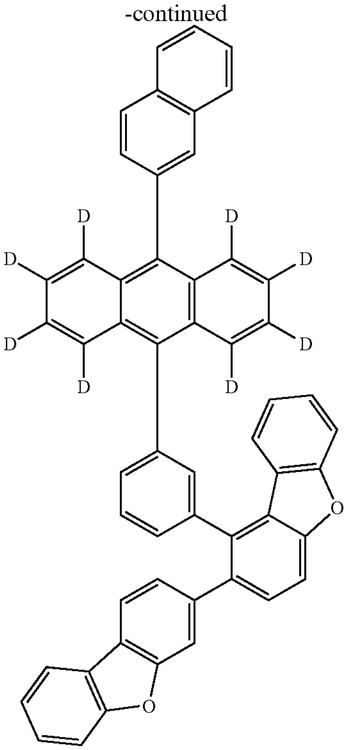
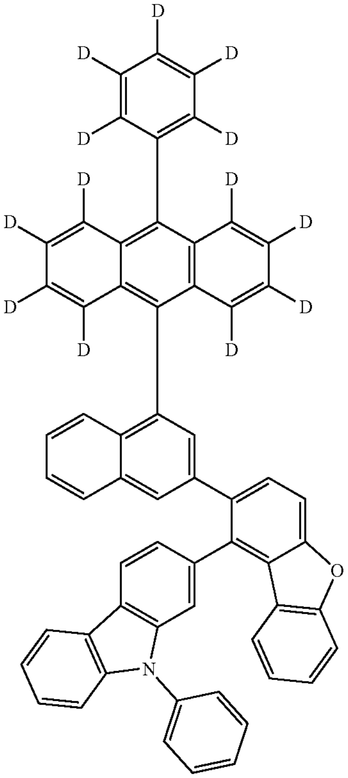
-continued
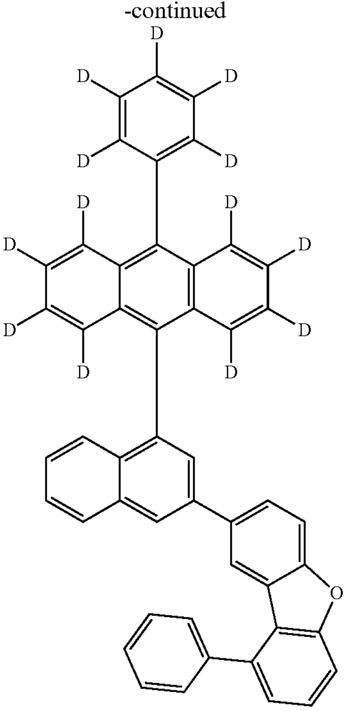
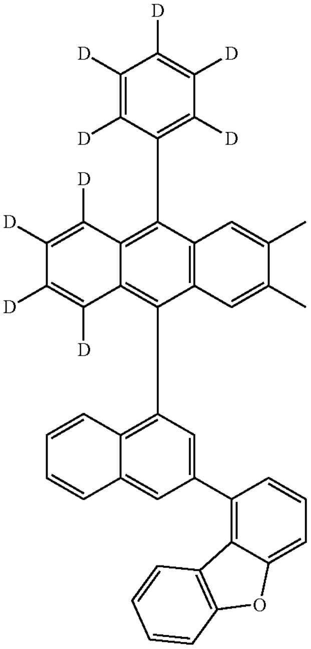

-continued
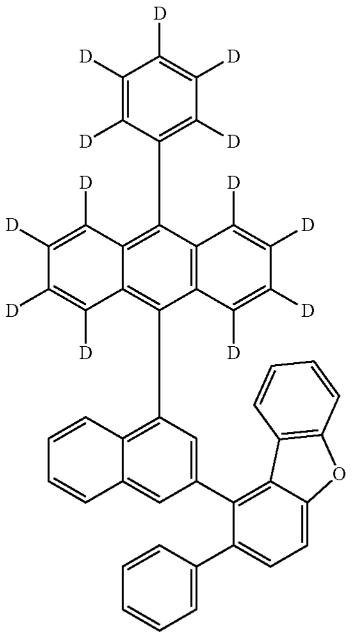
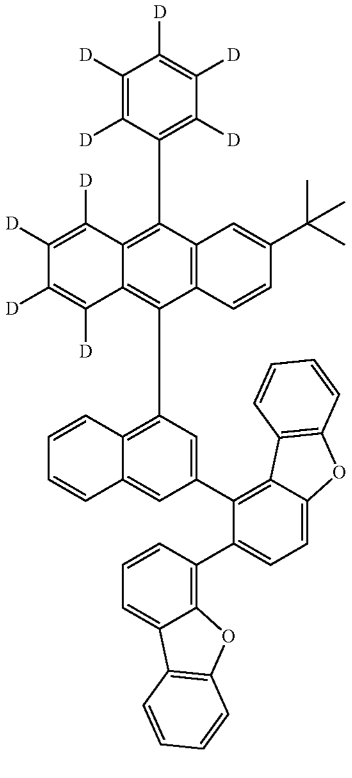
-continued
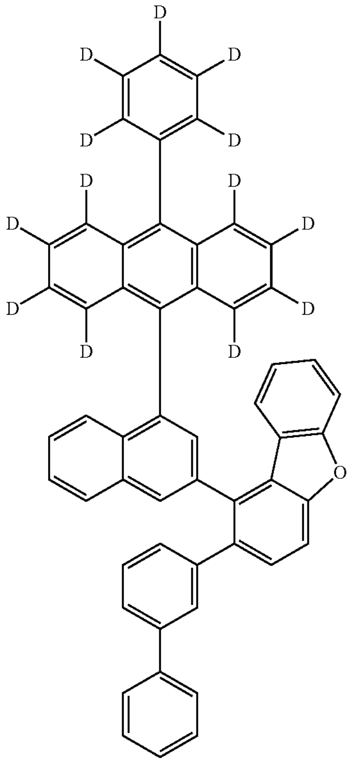
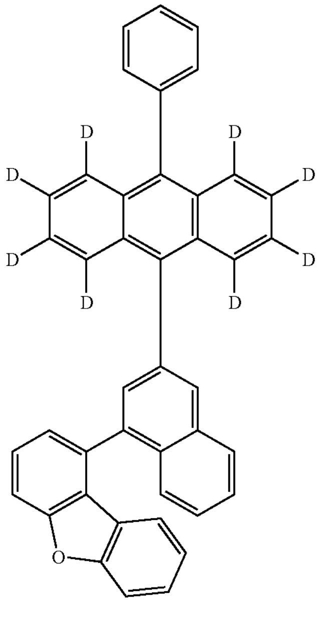

-continued
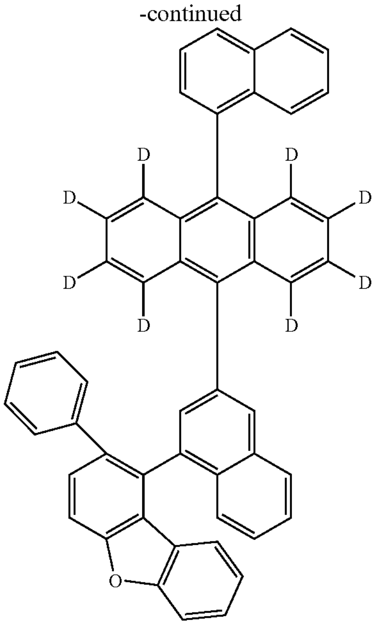
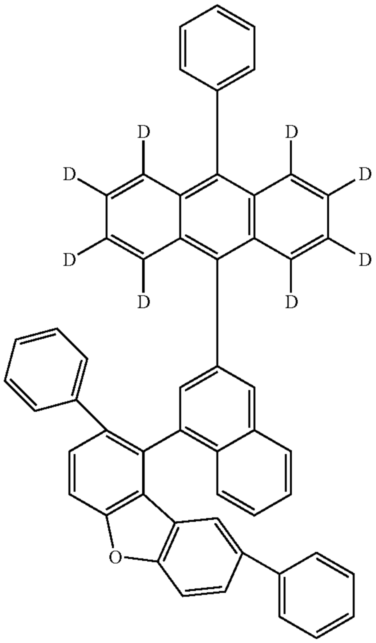
-continued
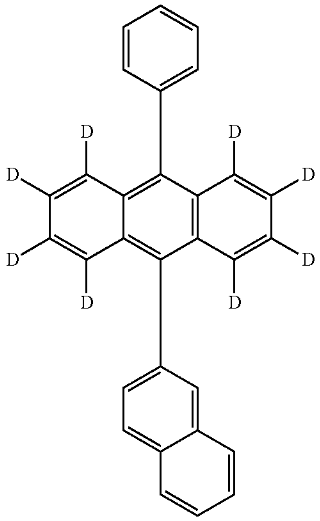
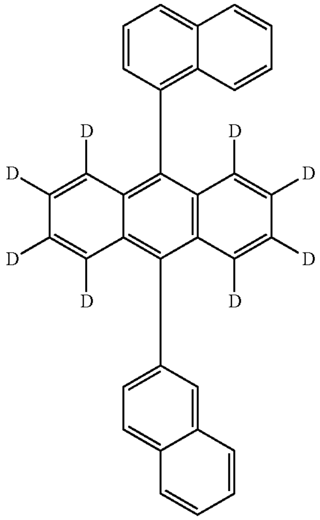
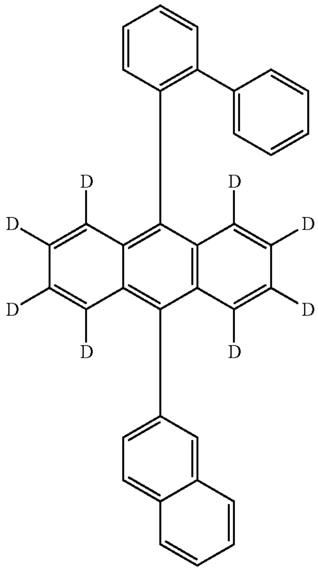

-continued
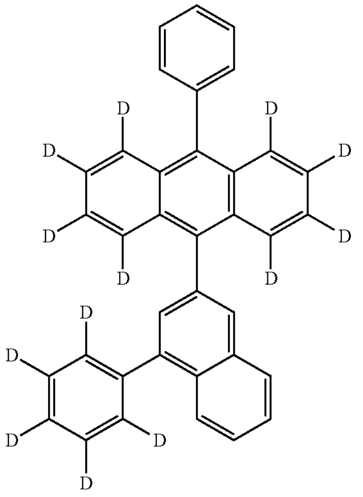
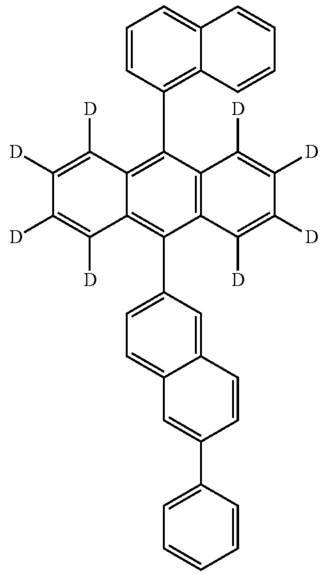
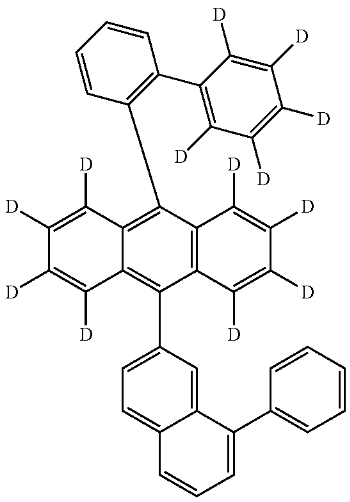
-continued
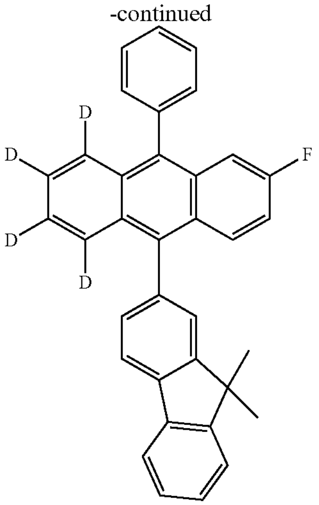
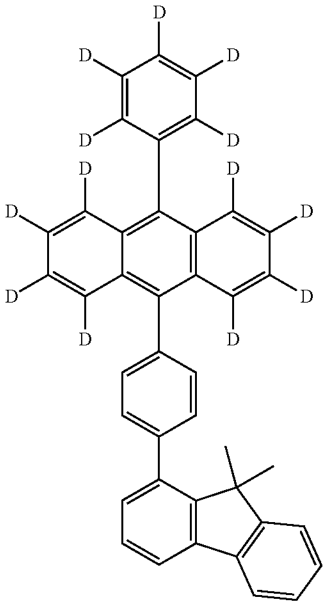
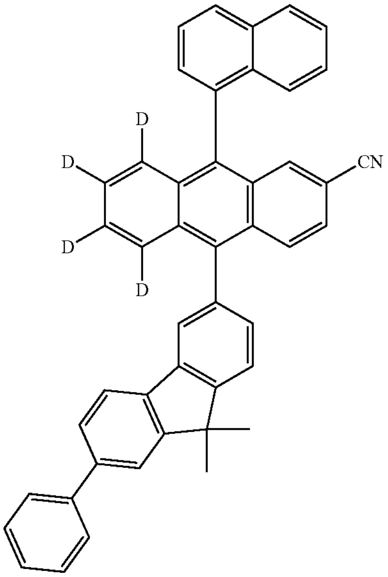

-continued
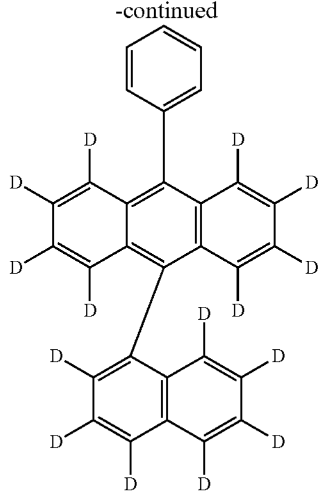
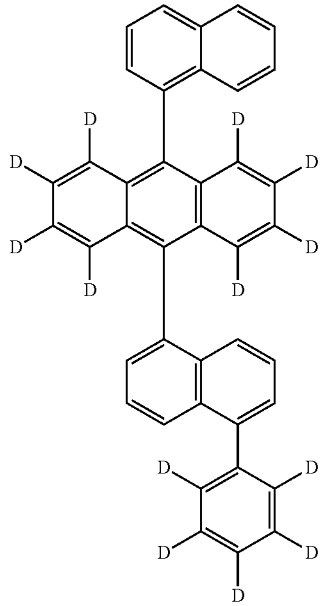
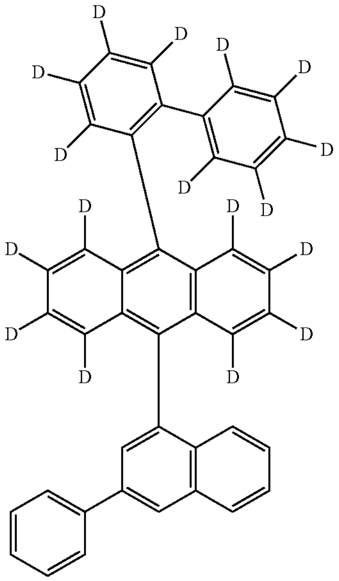
-continued
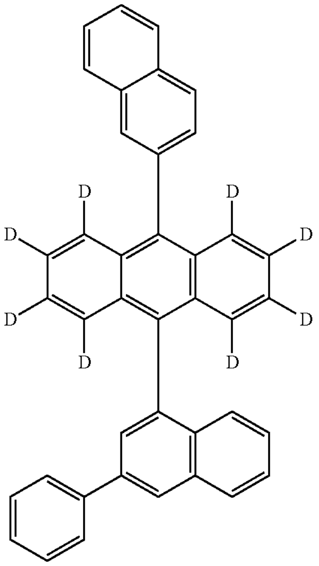
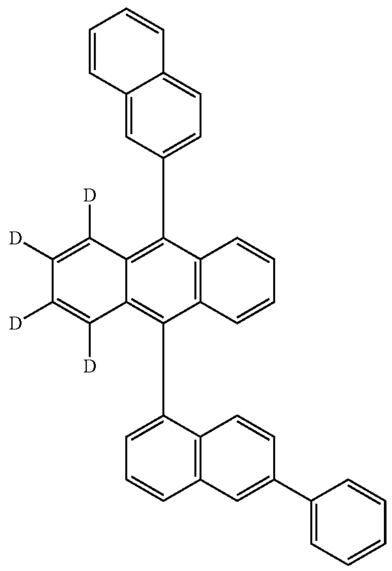

-continued
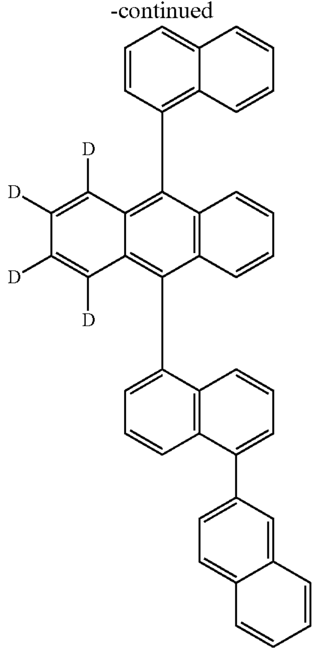
-continued
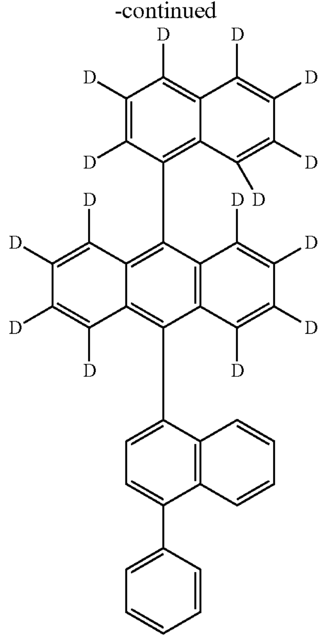
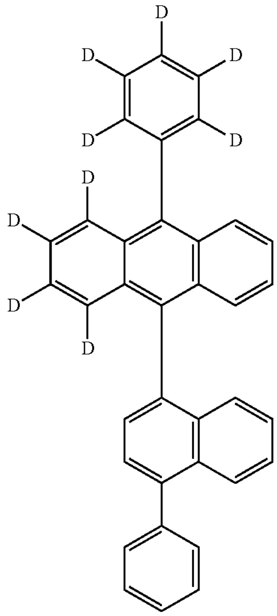
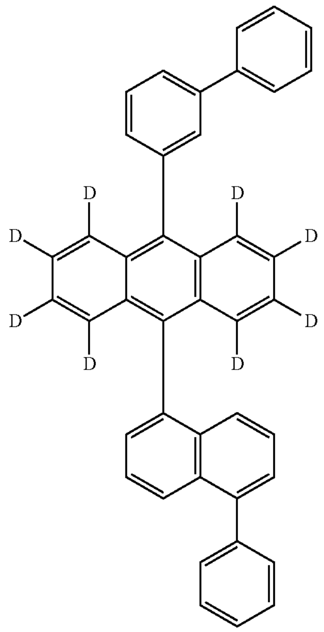

-continued
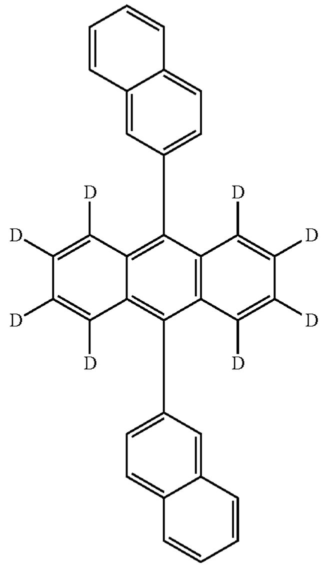
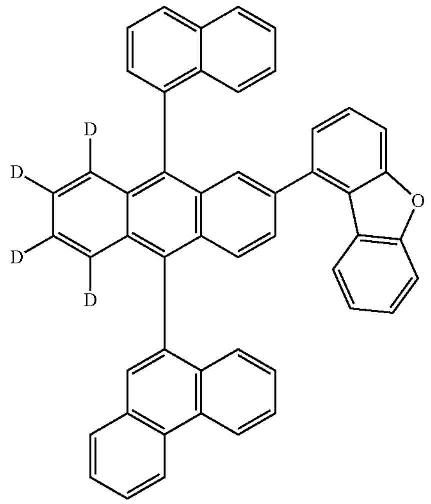
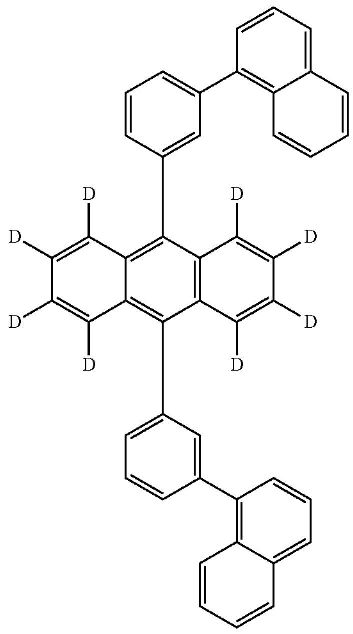
-continued
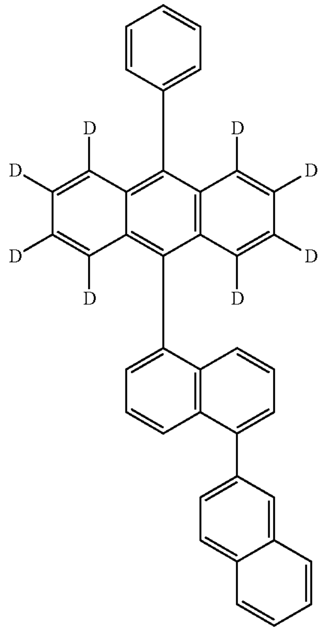
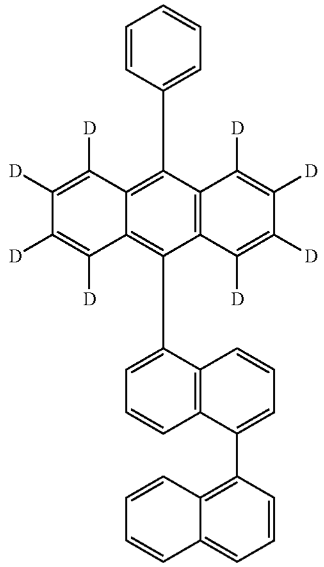

-continued
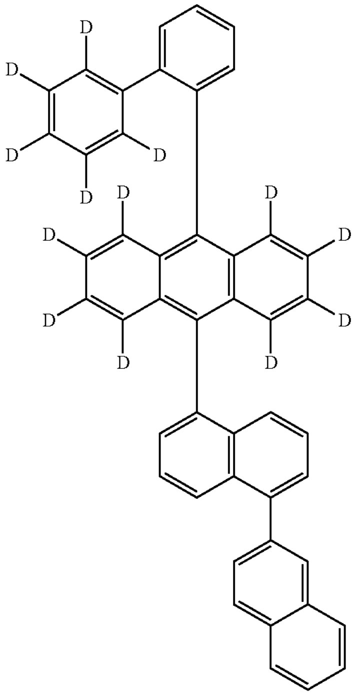
-continued
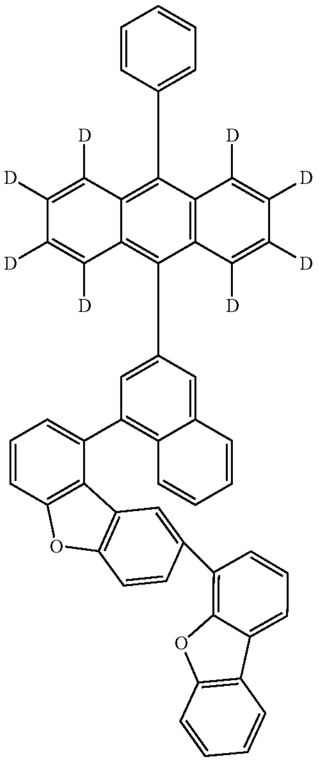
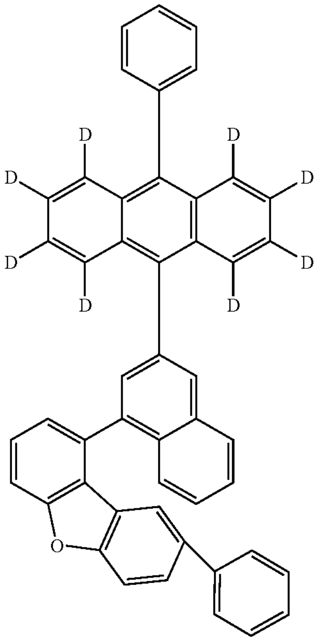
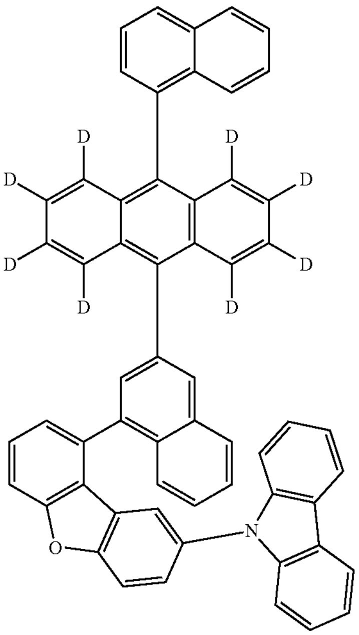

-continued
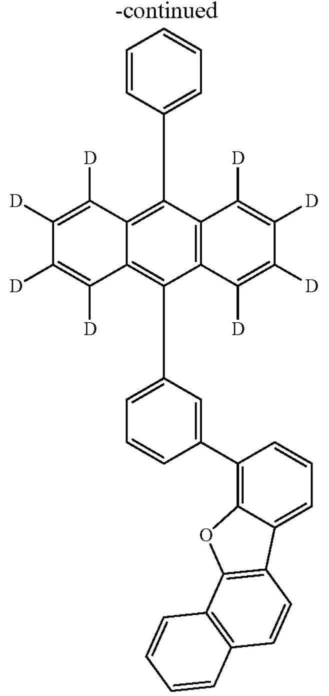
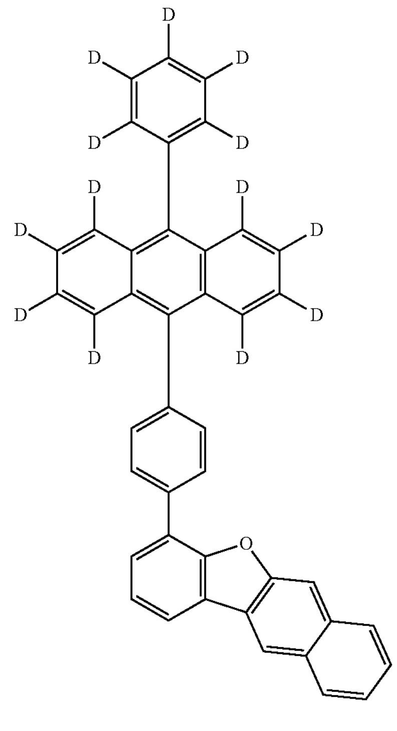
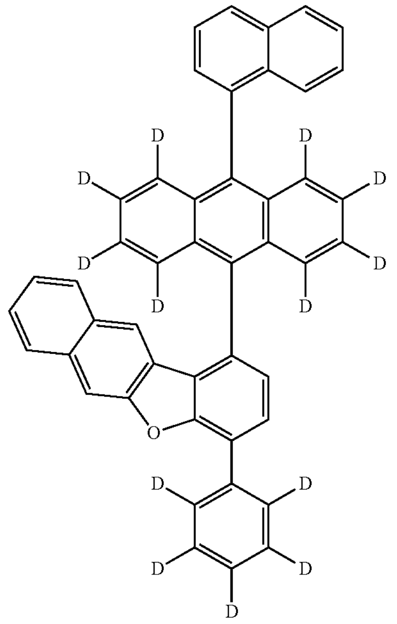
-continued
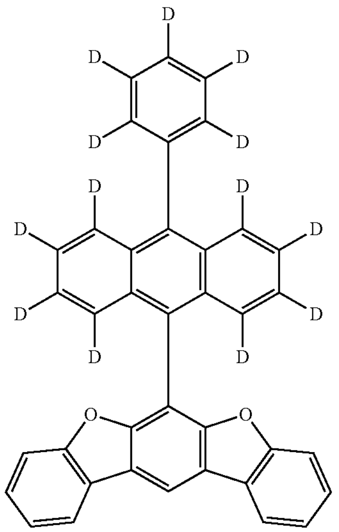
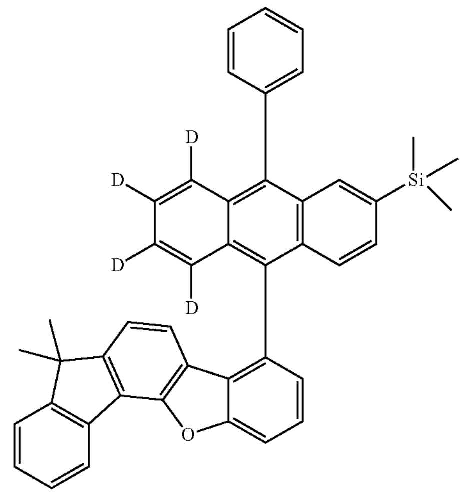

-continued
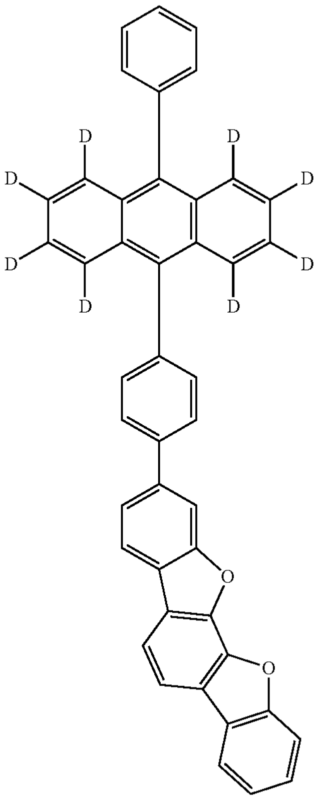
-continued
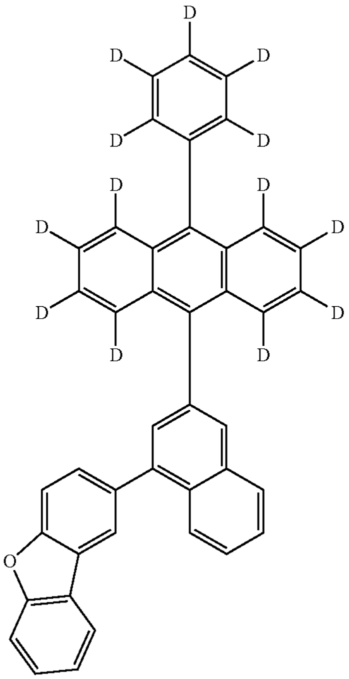
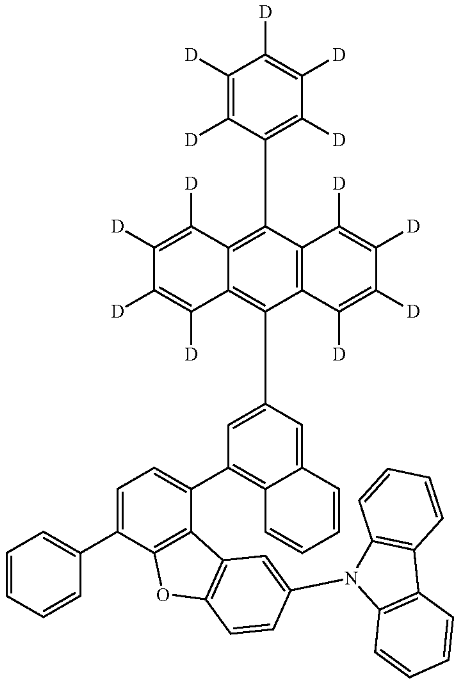
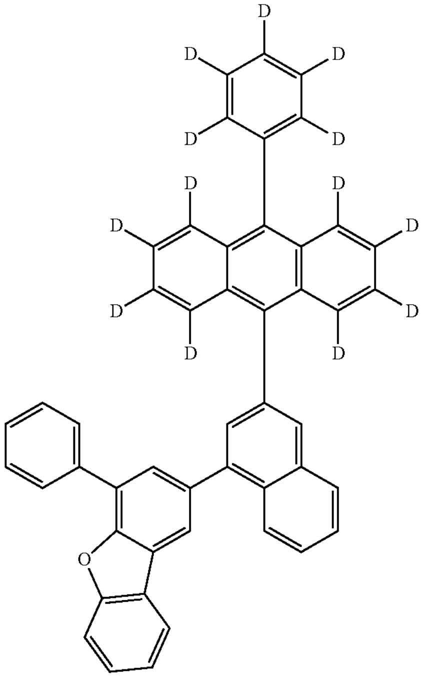

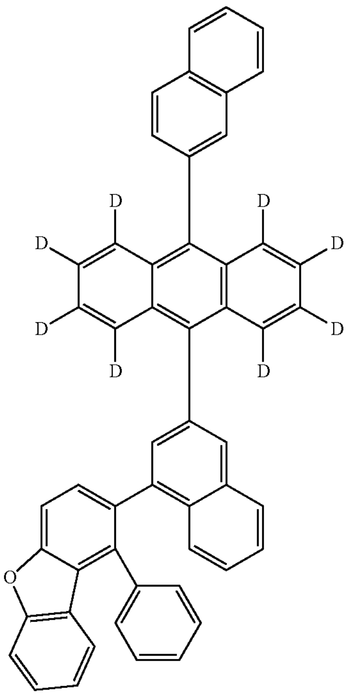
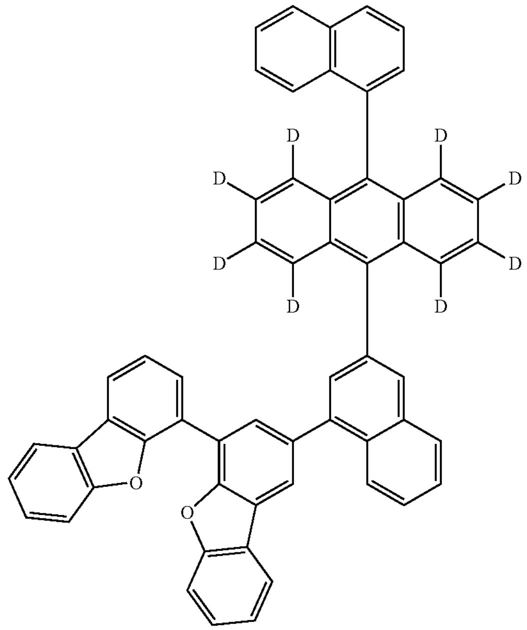
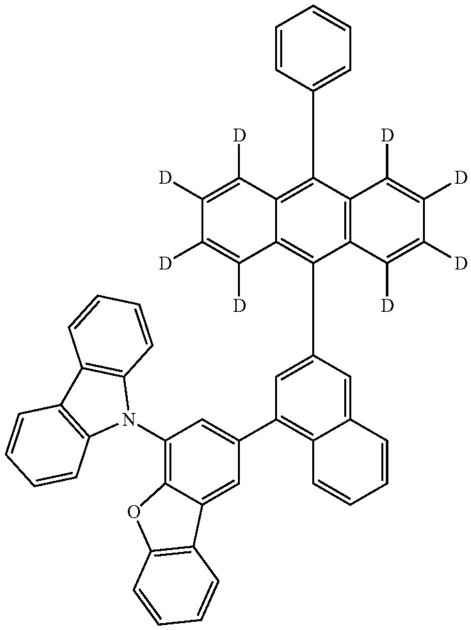
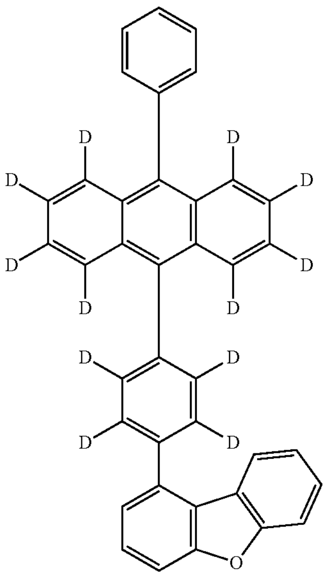

-continued
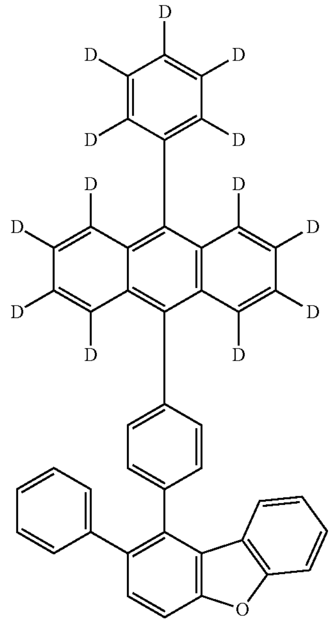
-continued
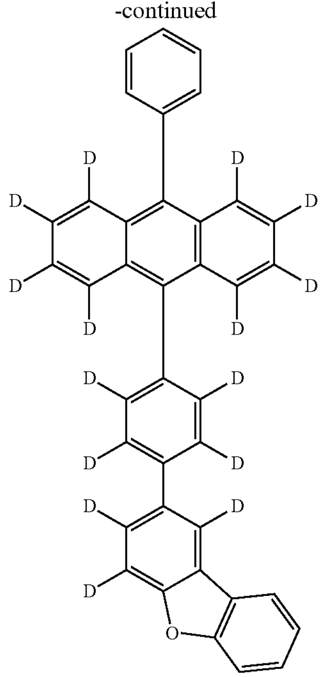
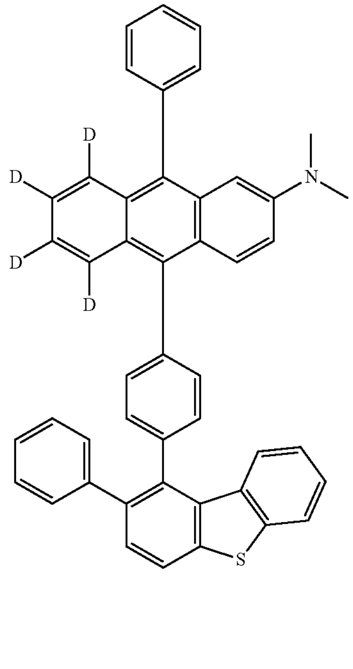
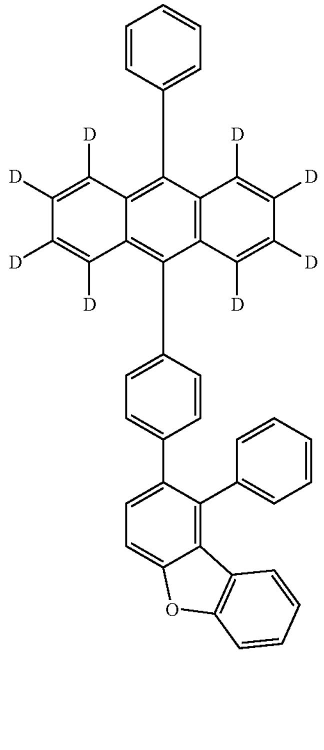

-continued
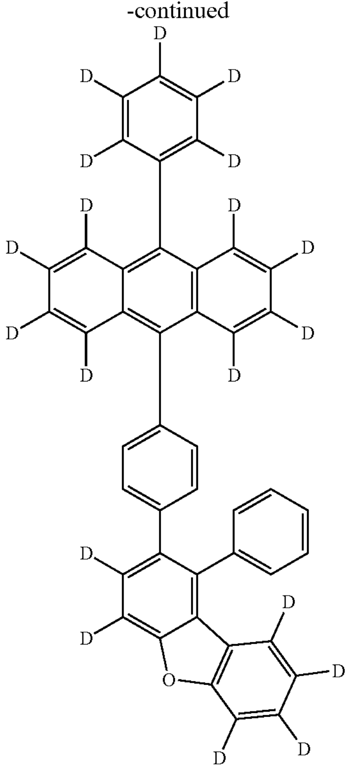
-continued
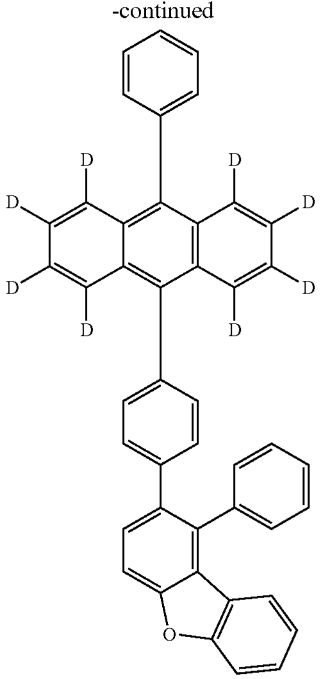
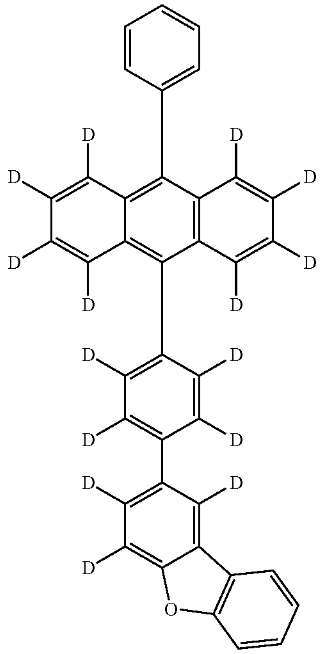
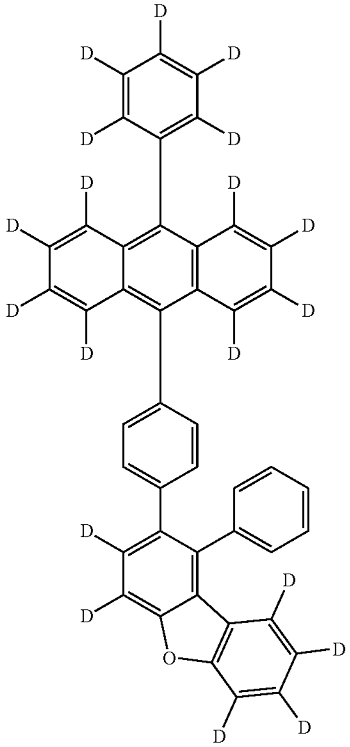

-continued
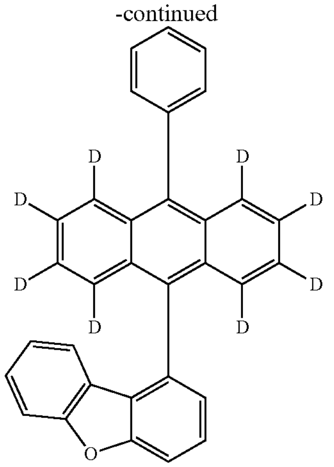
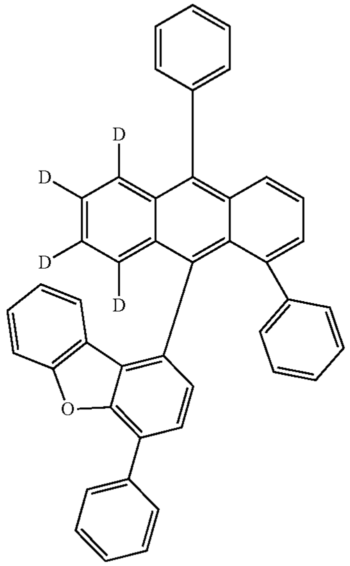
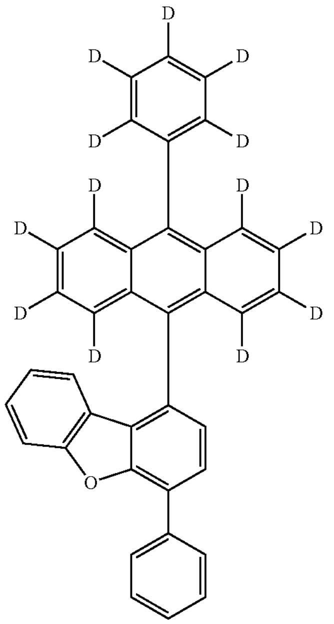
-continued
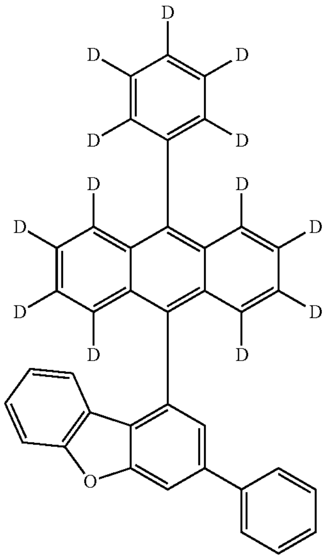
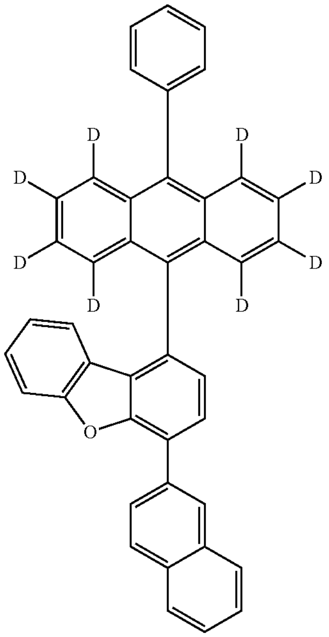

-continued
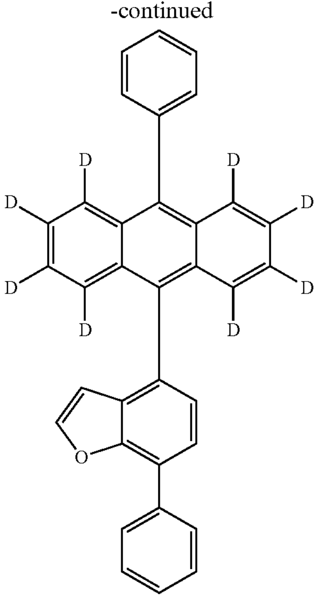
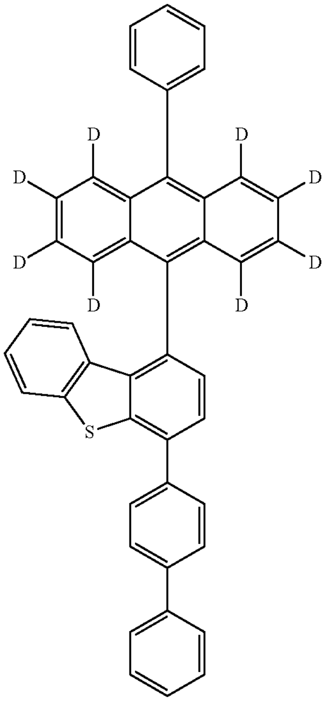
-continued
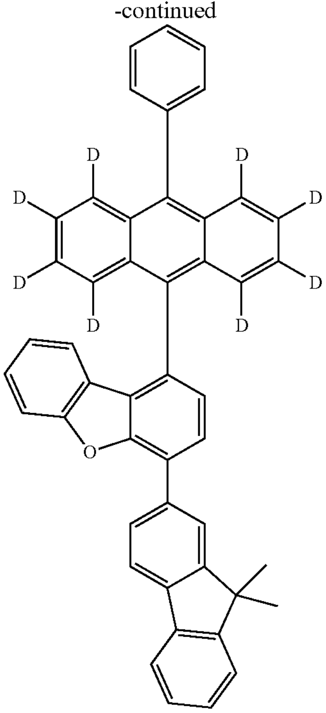
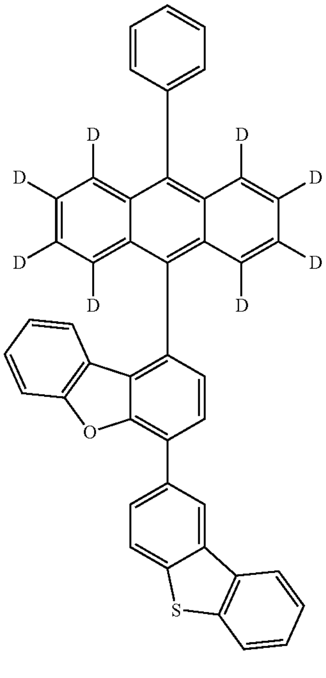

-continued
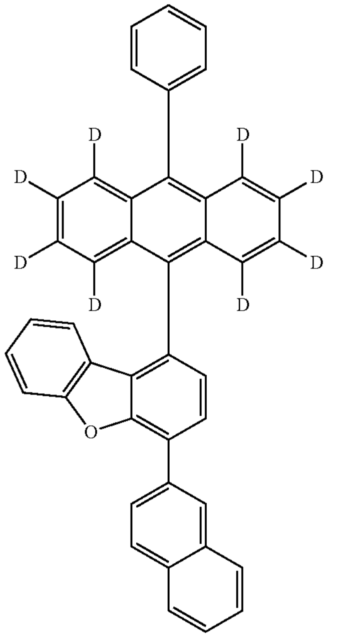
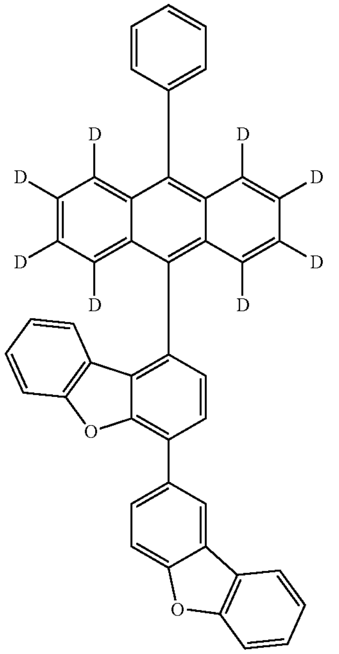
-continued
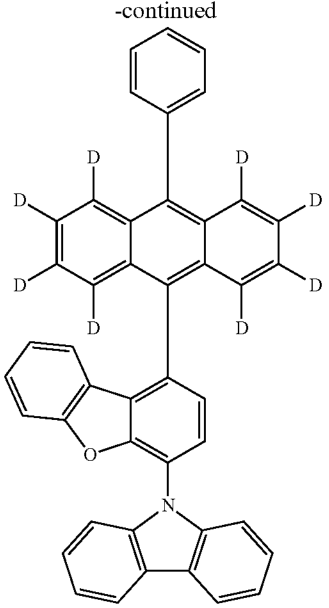
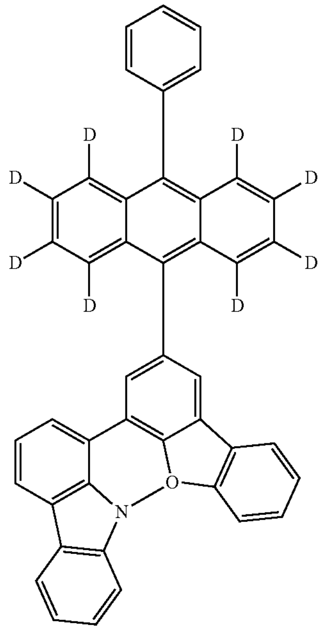
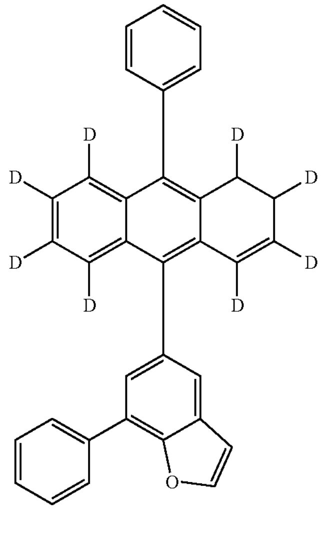

-continued
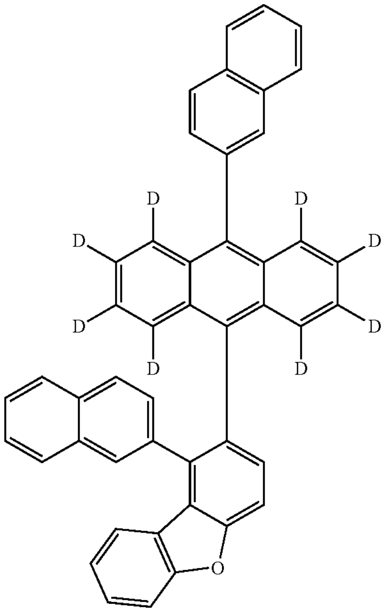
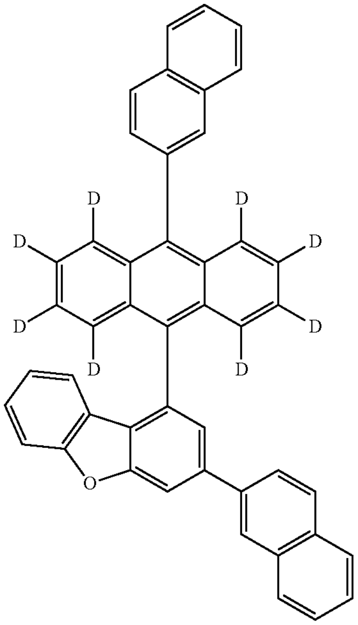
-continued
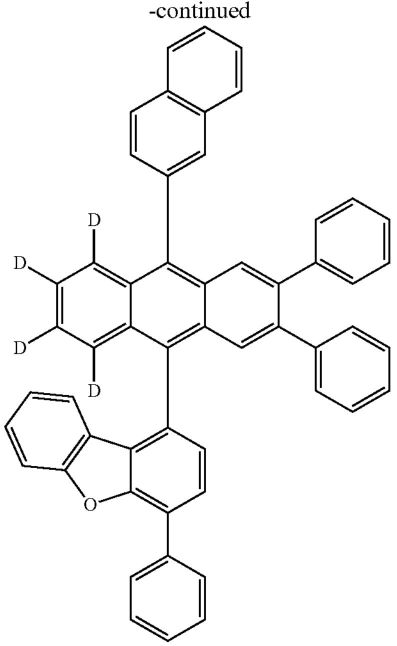
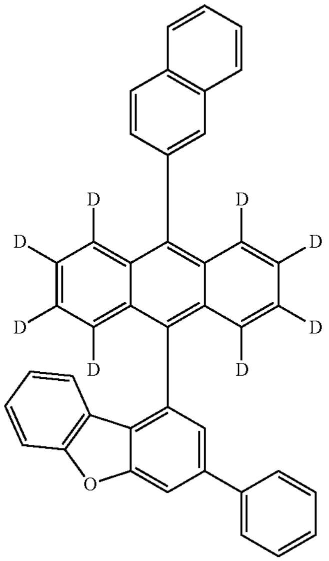

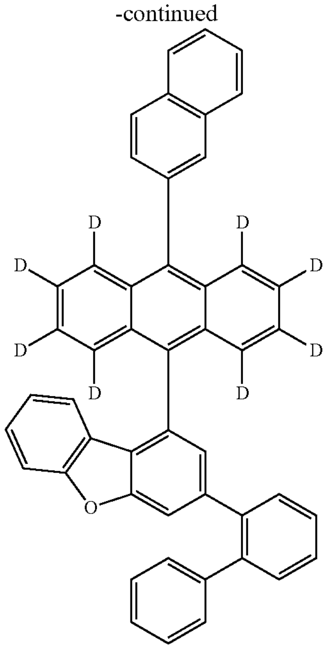
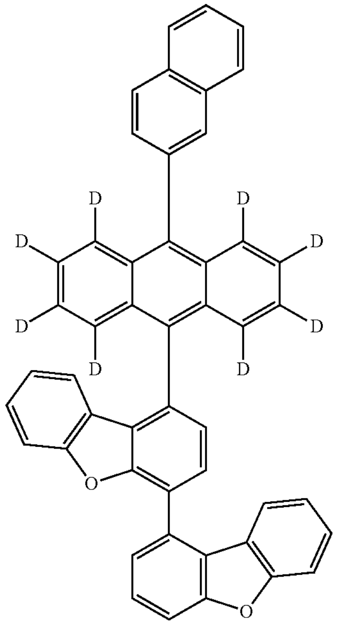
-continued
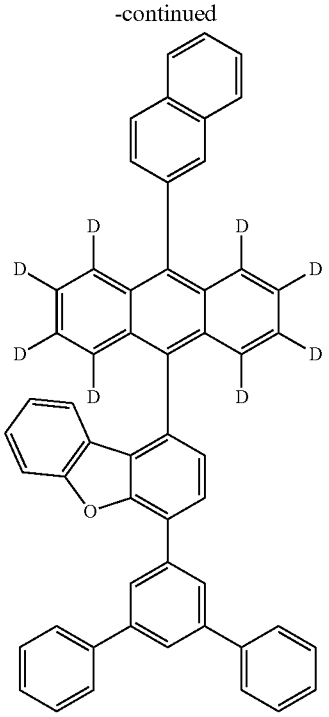
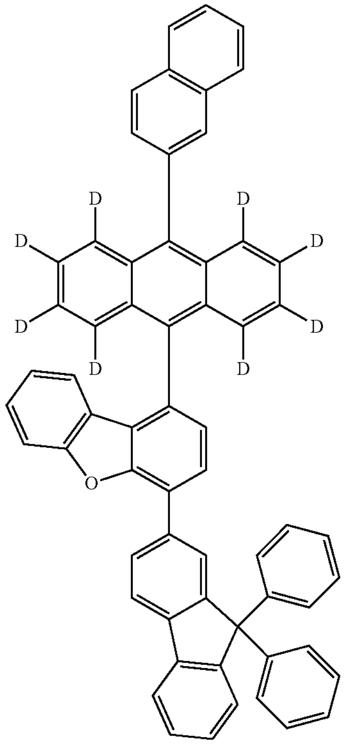

-continued
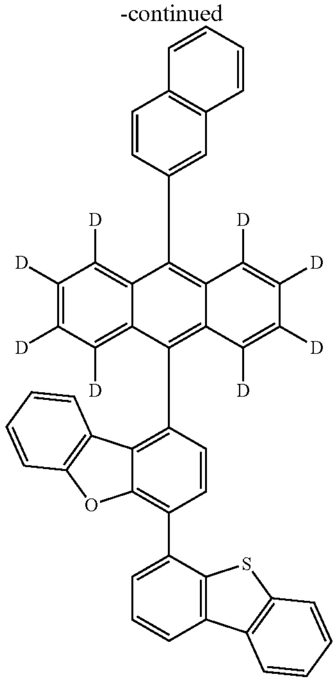
-continued
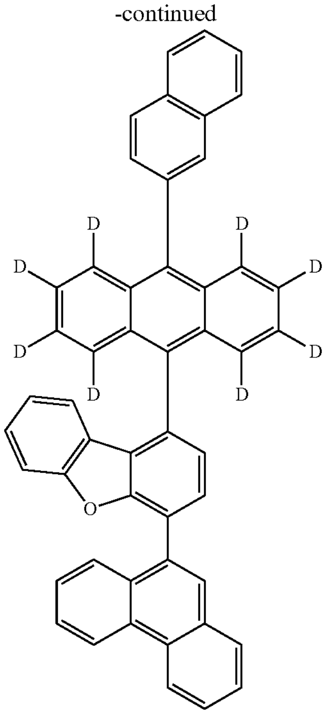
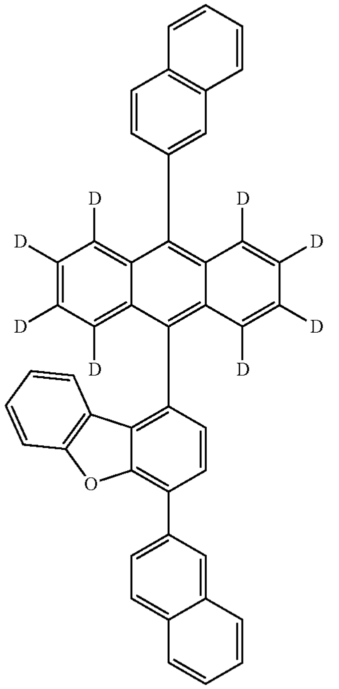
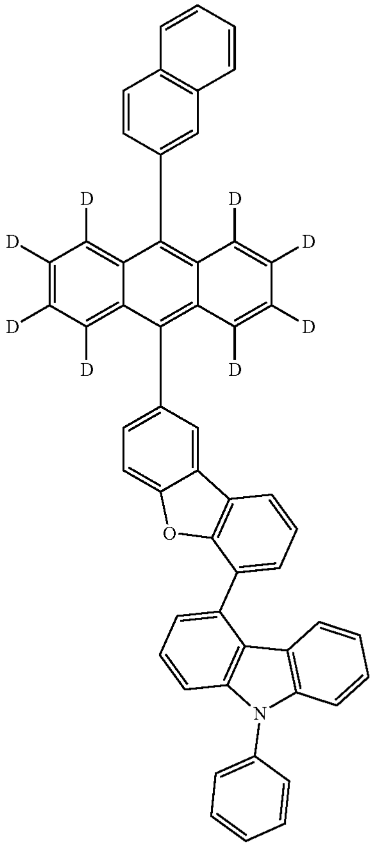

-continued
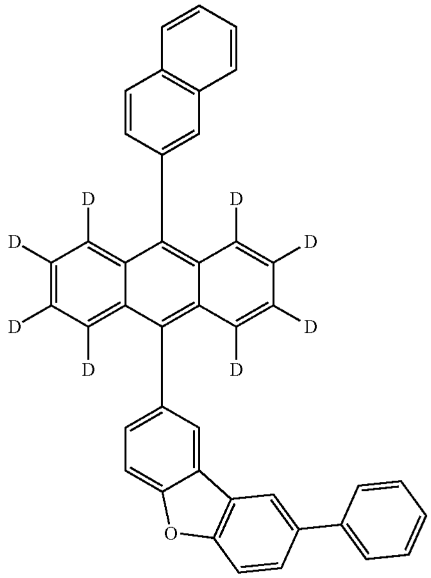
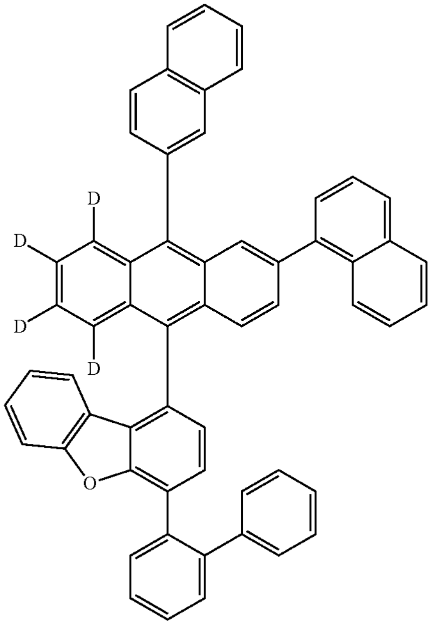
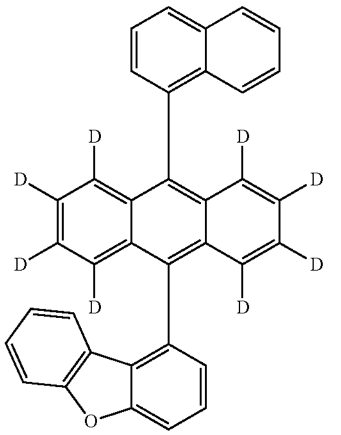
-continued
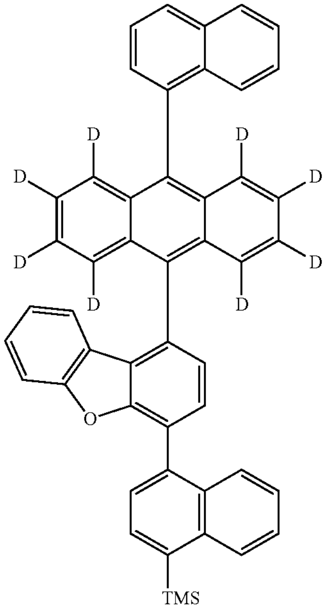
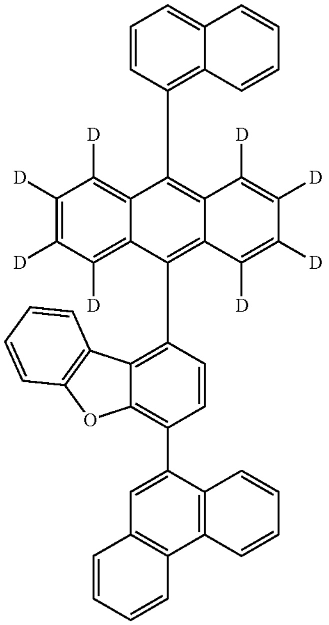

-continued
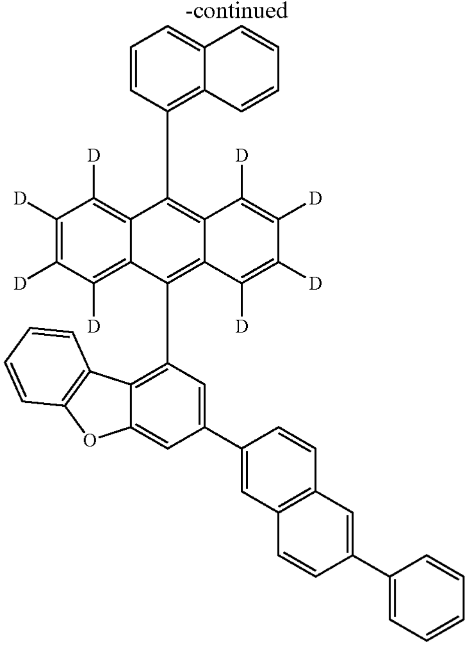
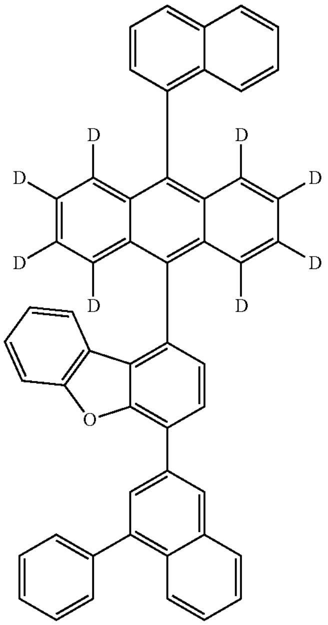
-continued
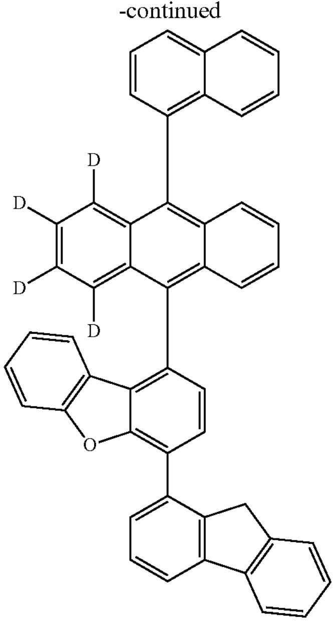
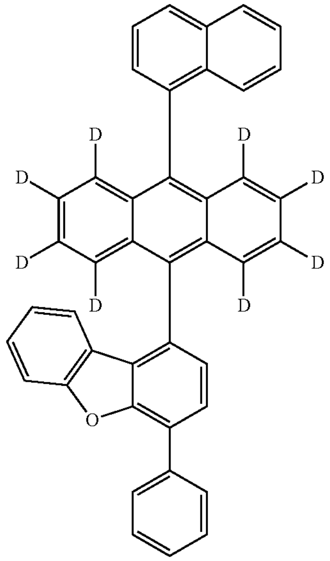
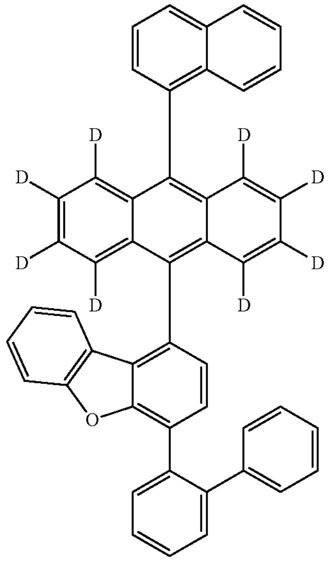

-continued
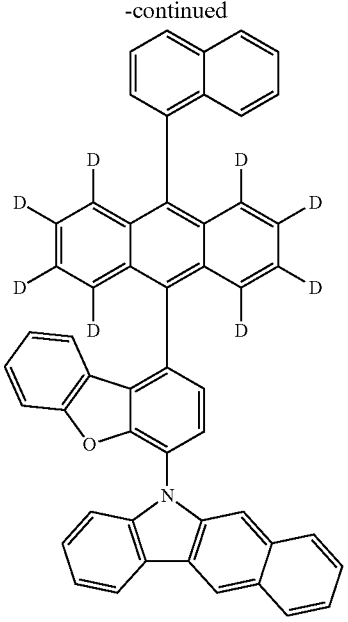
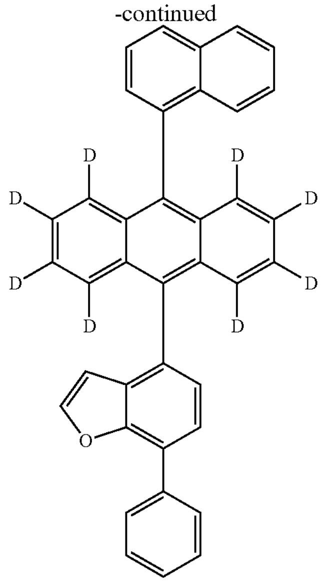
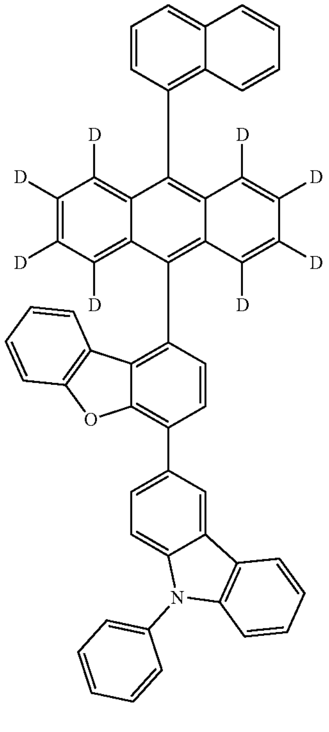
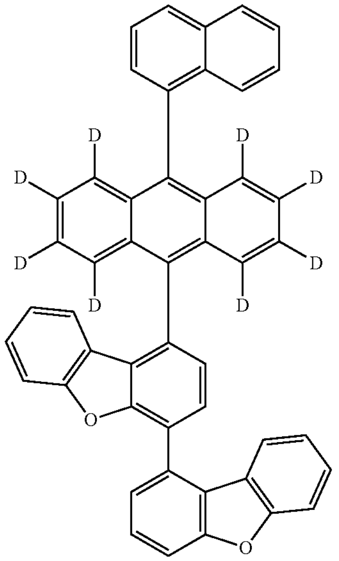
-continued

-continued
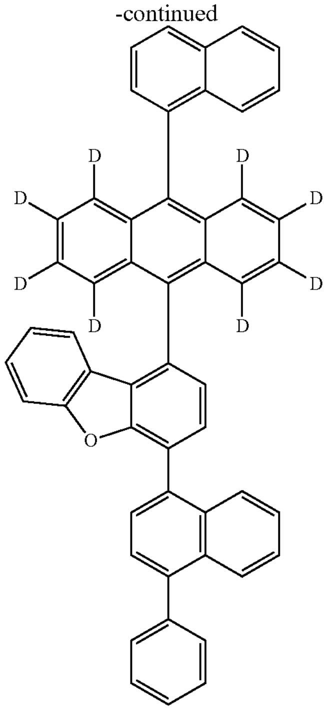
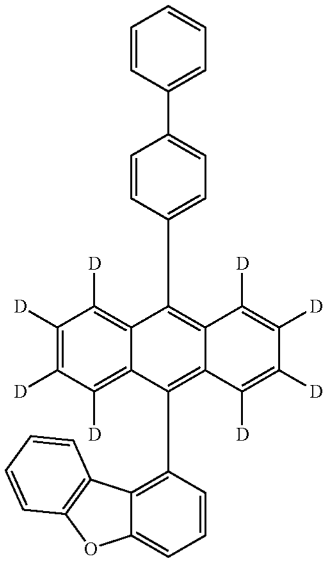
-continued
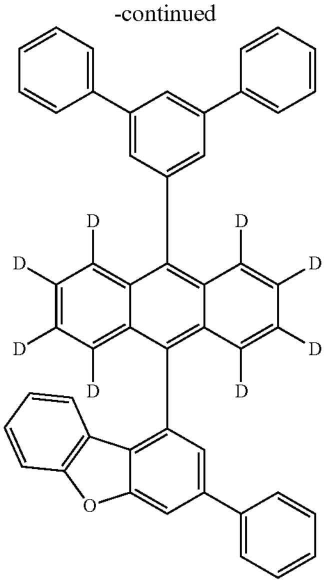
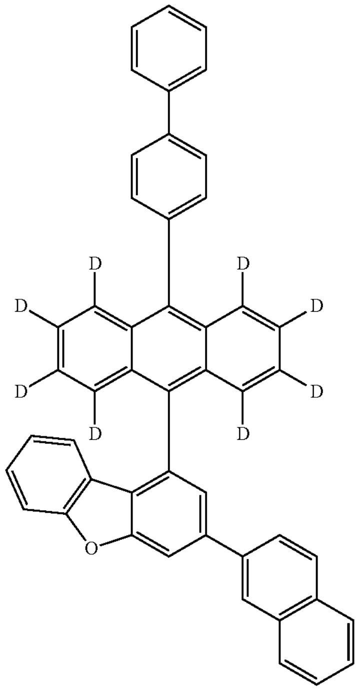

-continued
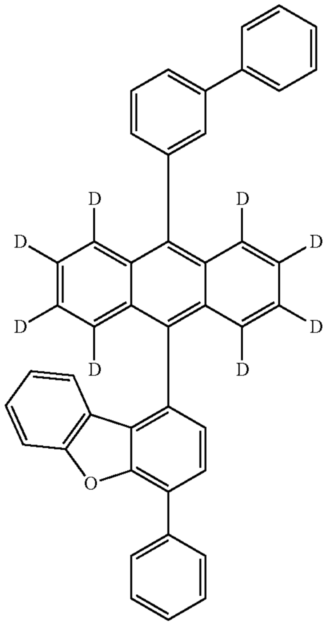
-continued
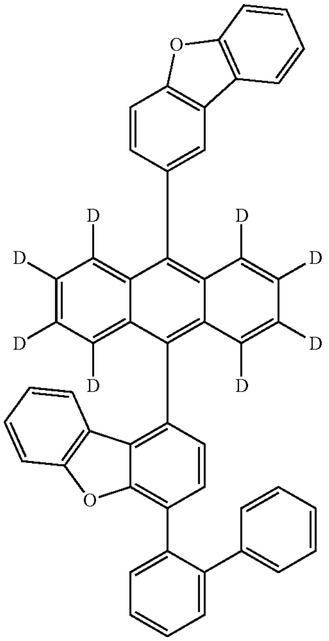
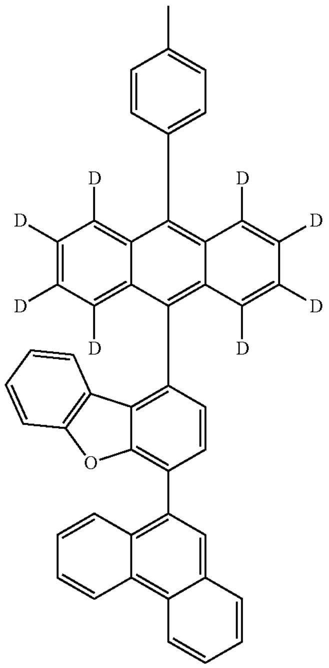
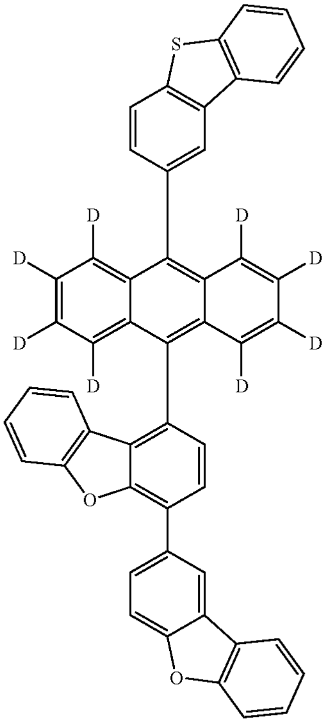

-continued
-continued
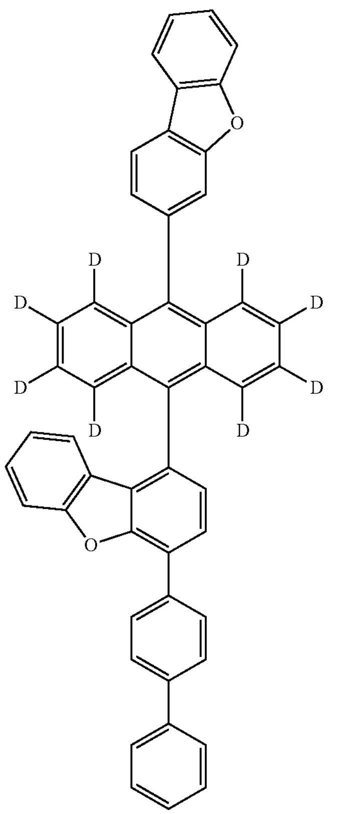
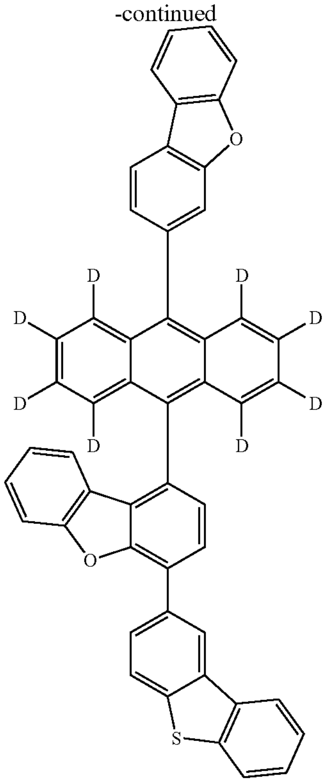
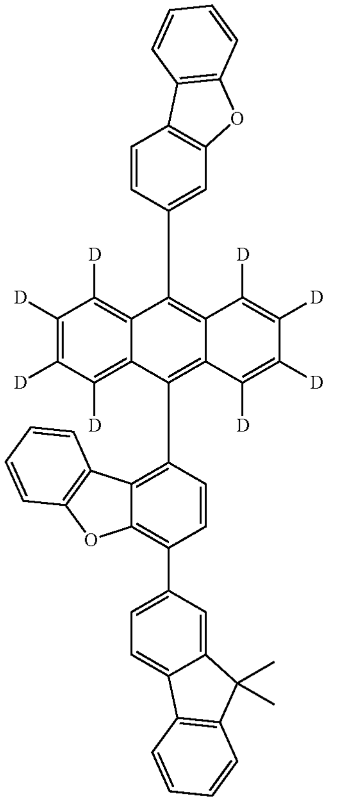
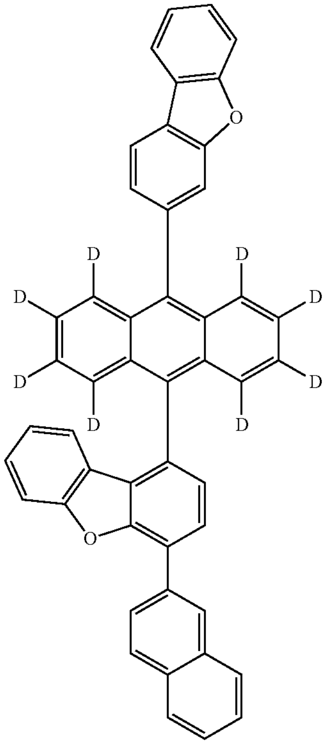

-continued
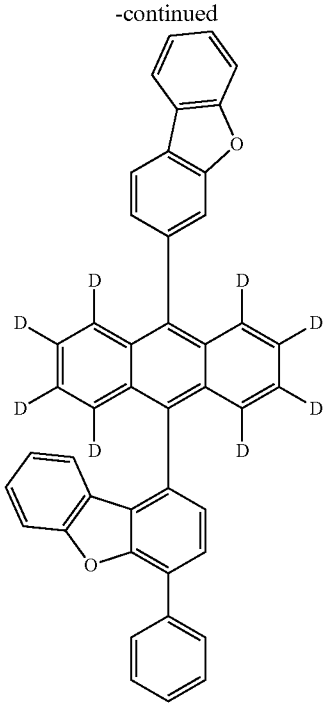
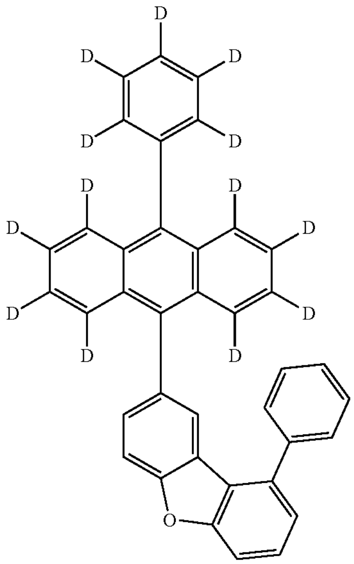
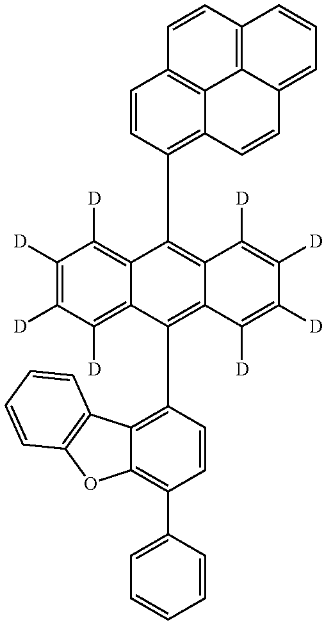
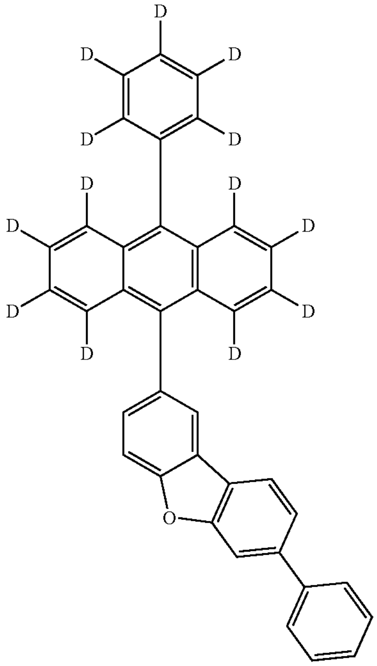

-continued
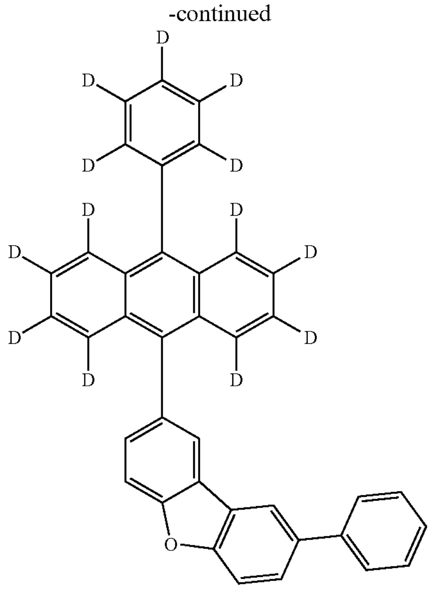
-continued
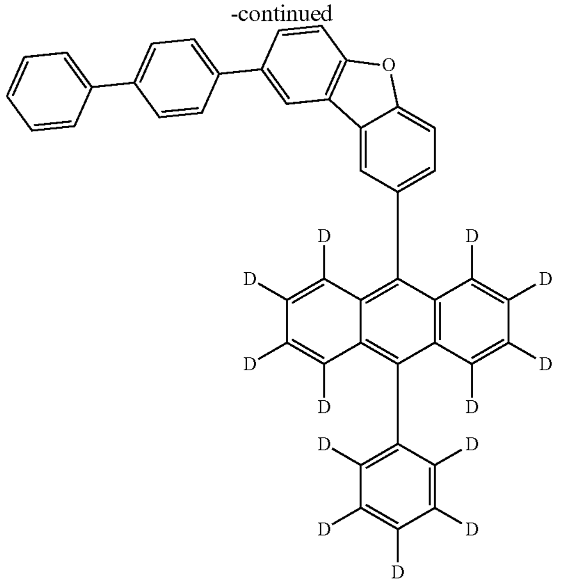
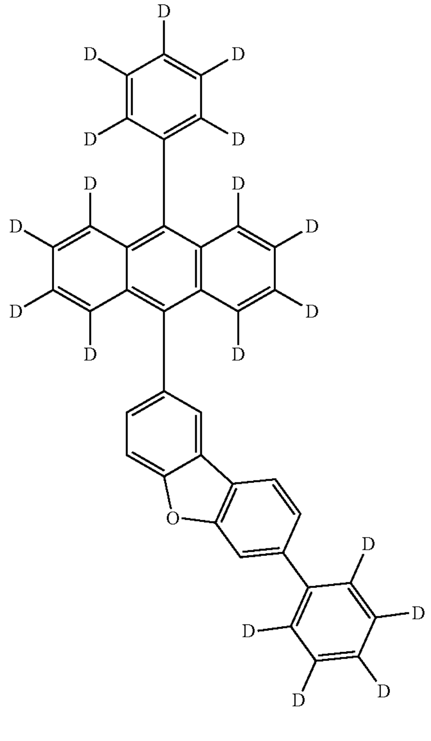
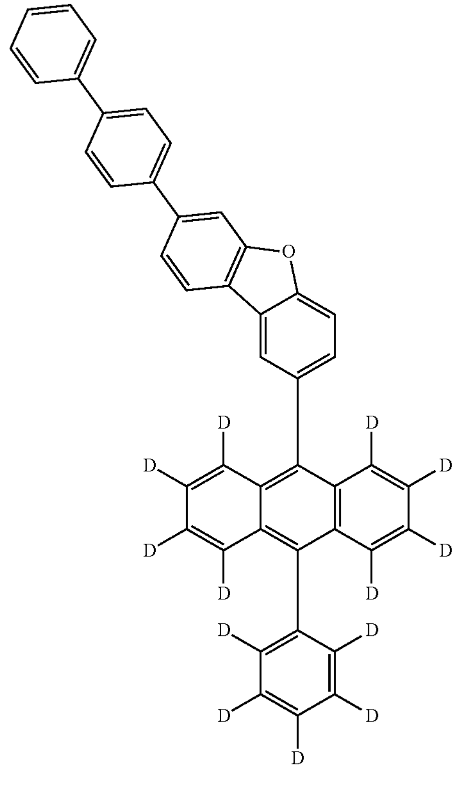

-continued
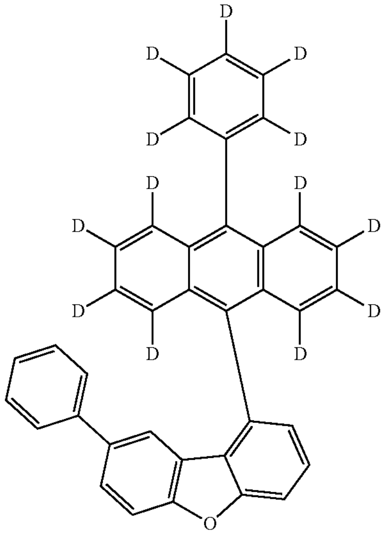
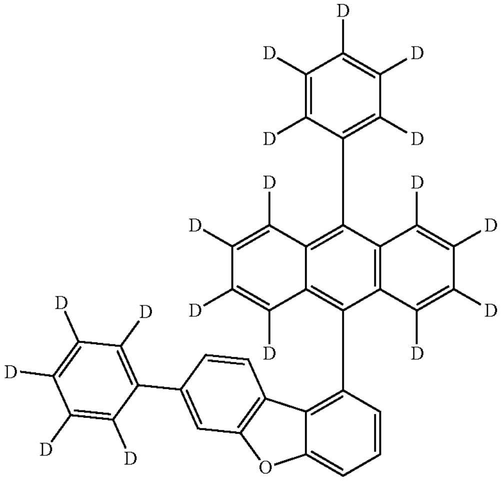
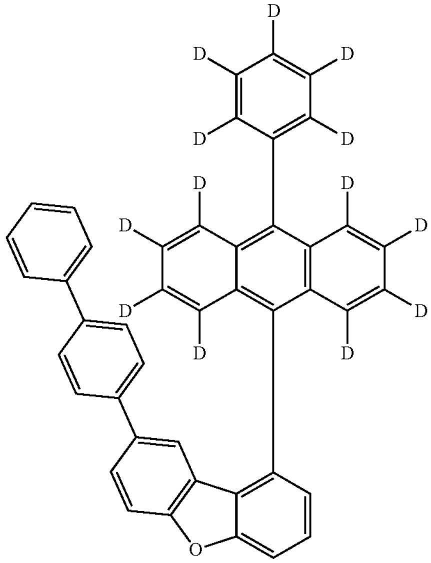
-continued
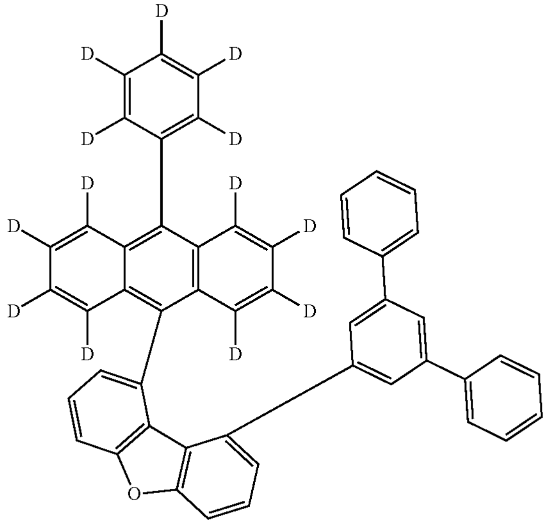
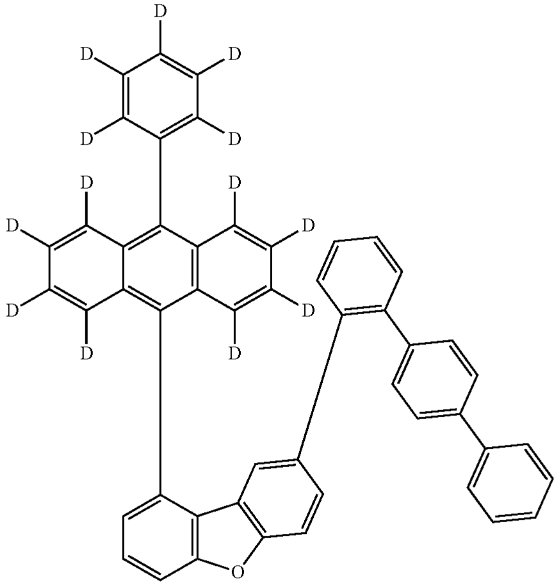
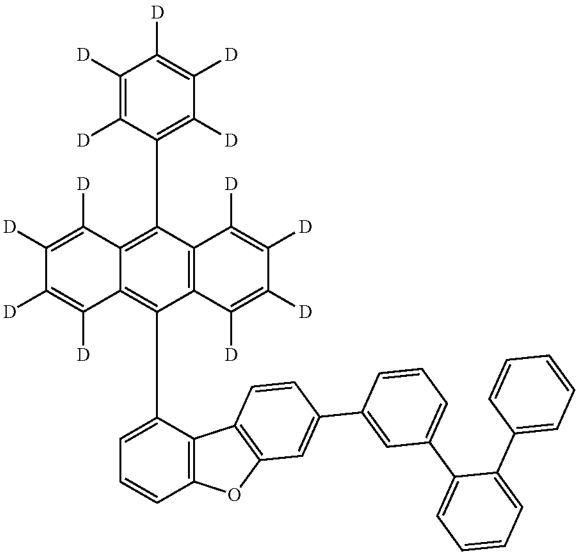

-continued
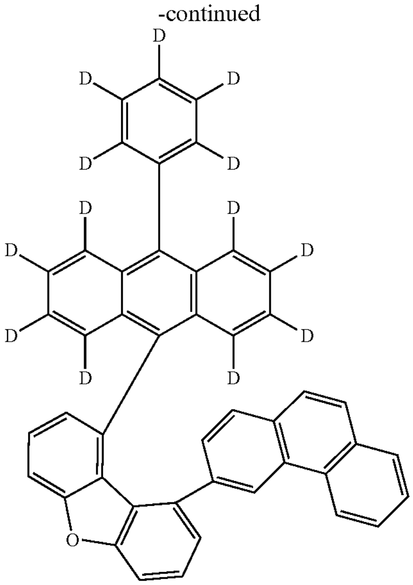
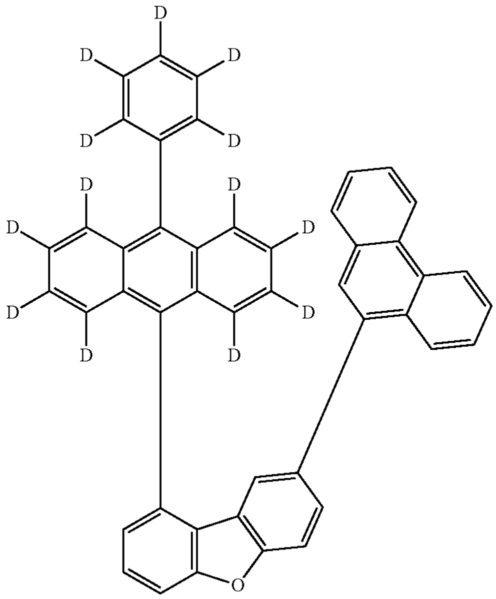
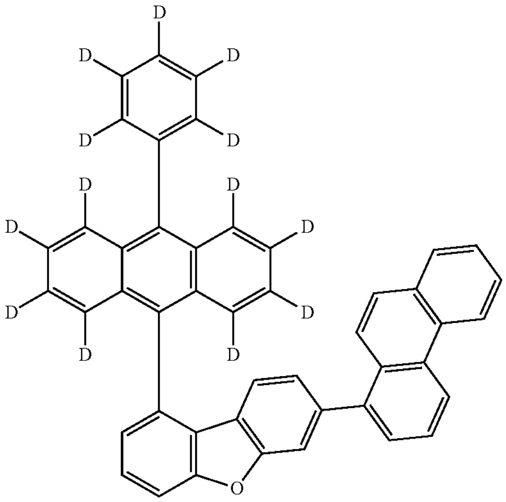
-continued
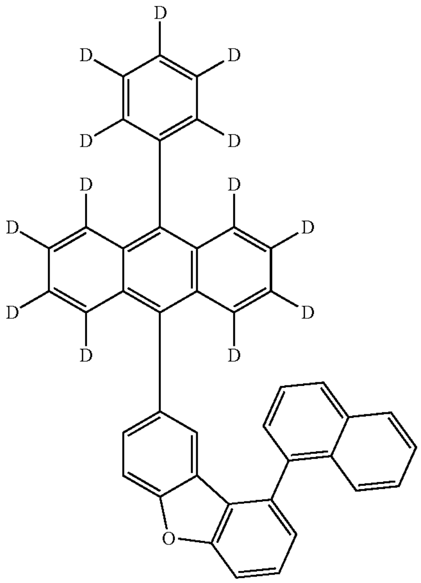
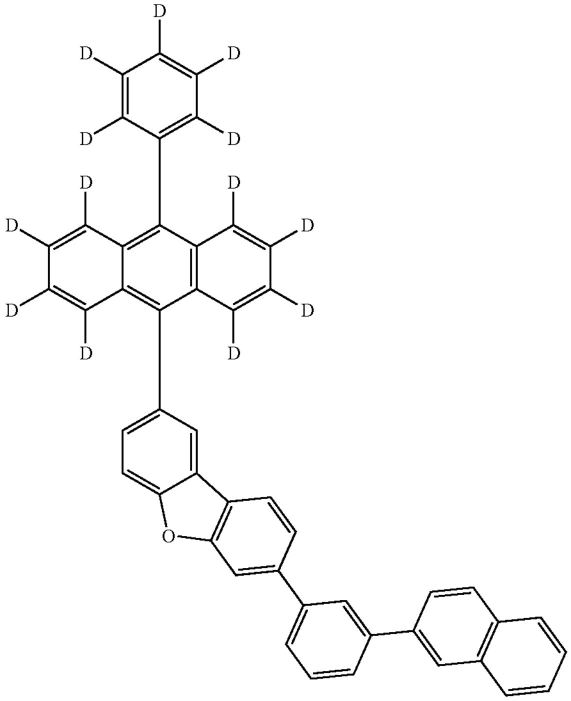

-continued
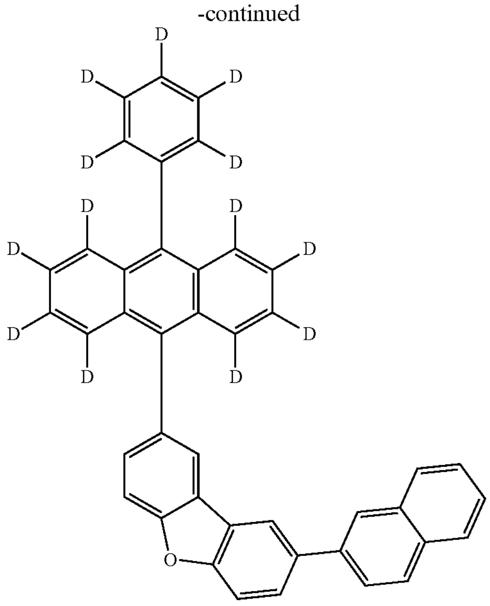
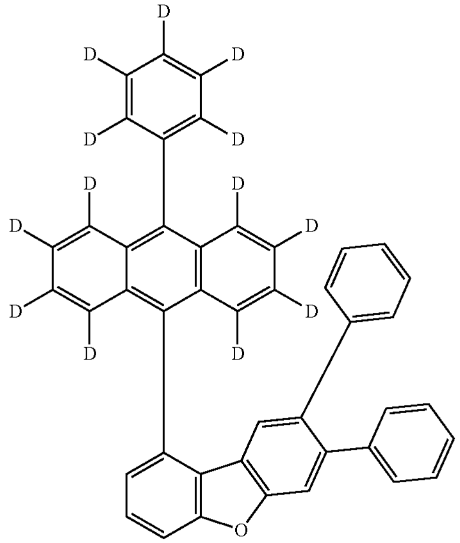
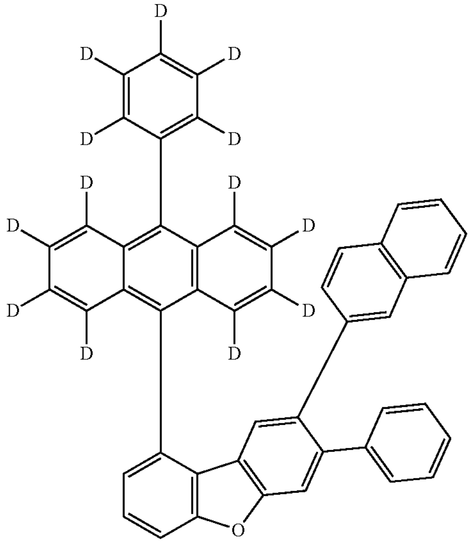
-continued
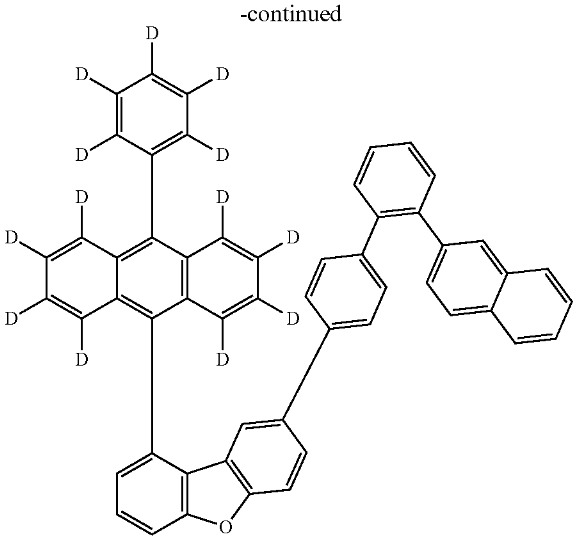
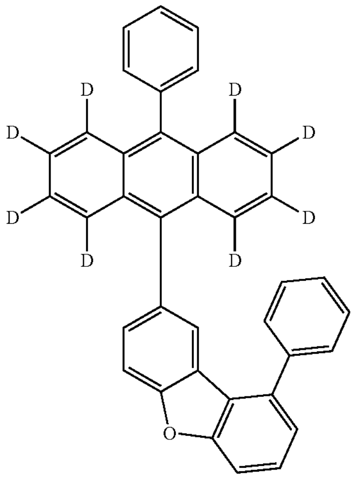
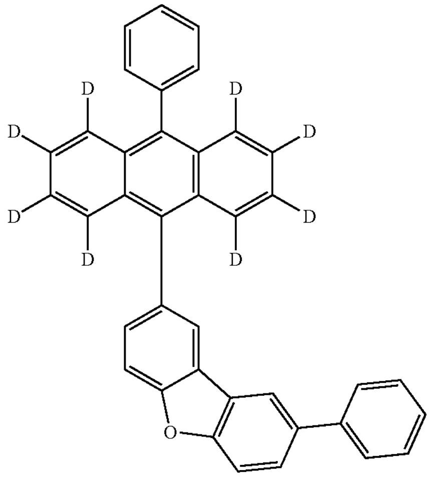

-continued
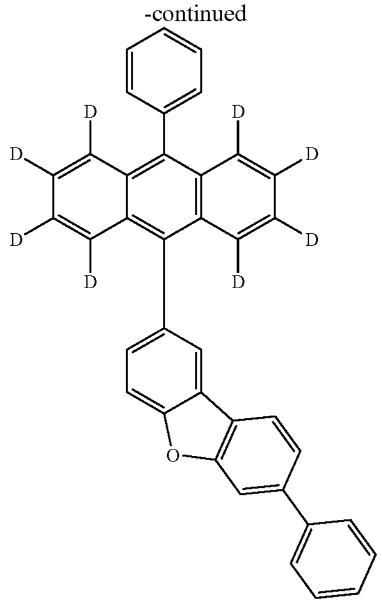
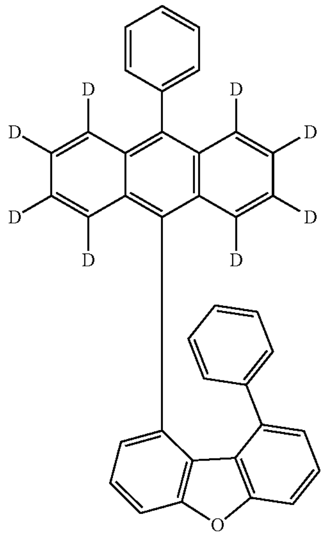
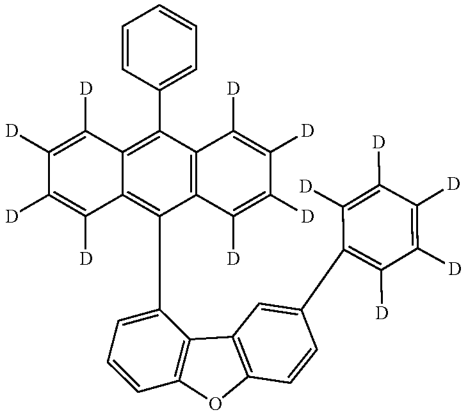
-continued
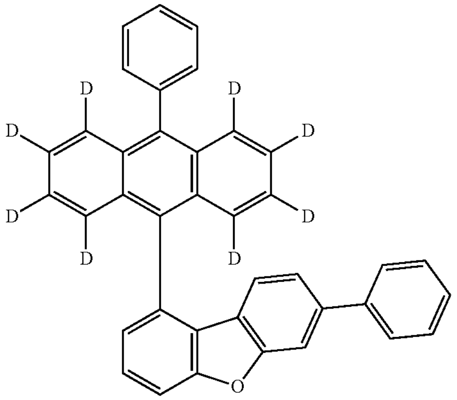
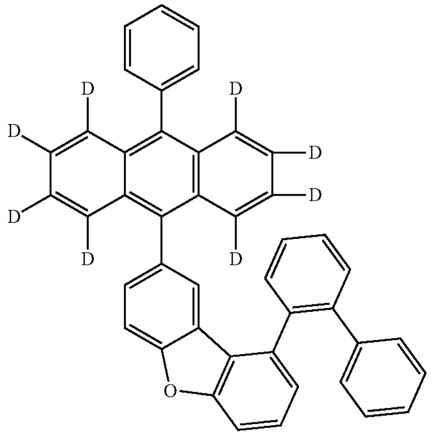
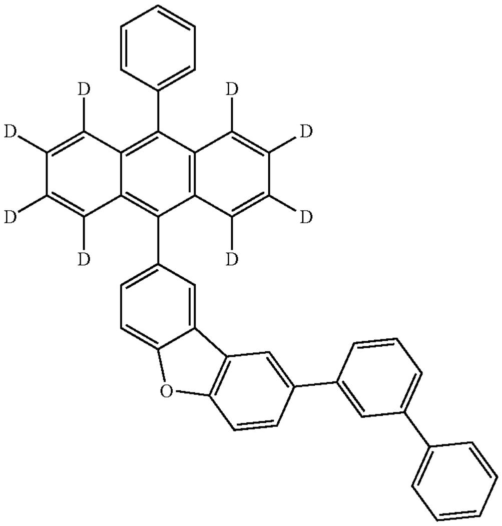

-continued
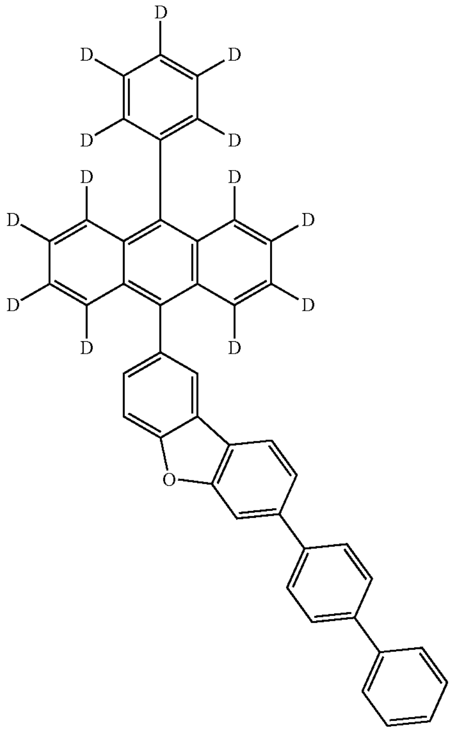
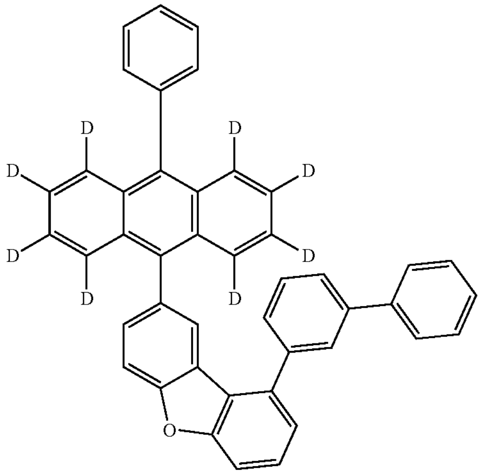
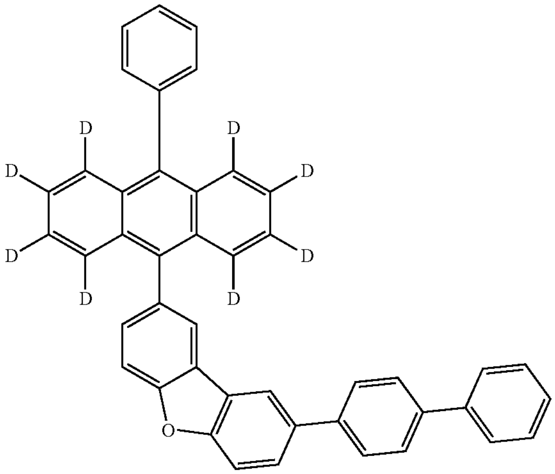
-continued
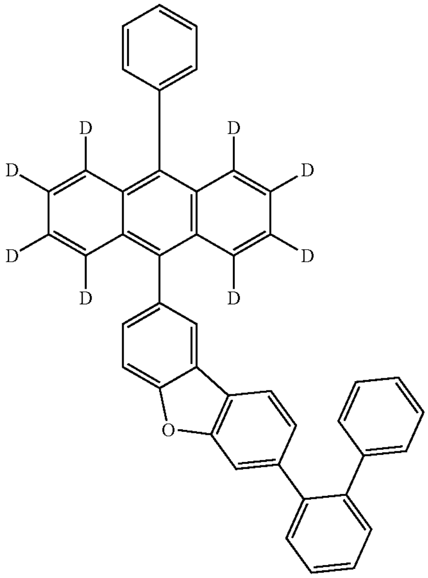
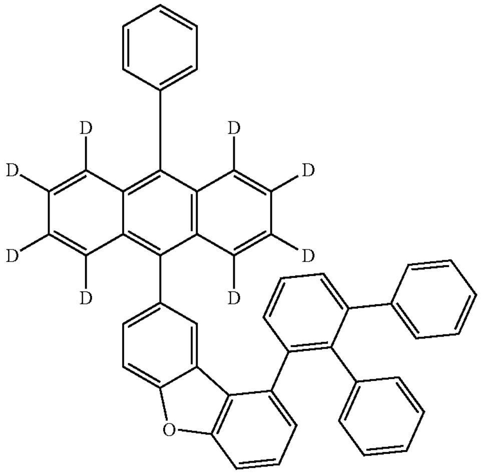
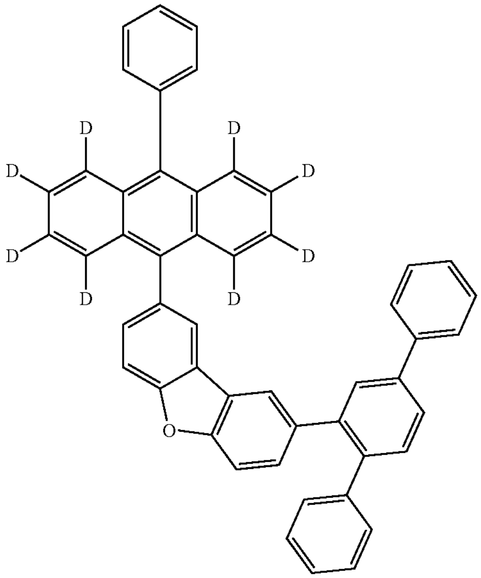

-continued
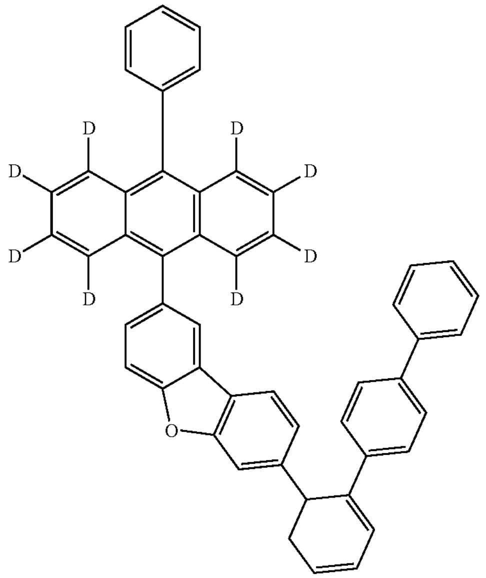
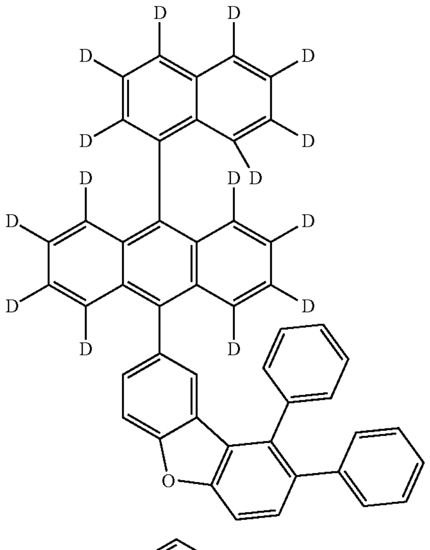
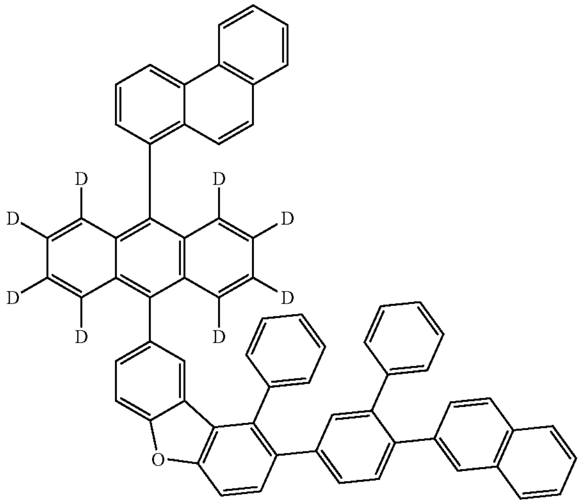
-continued
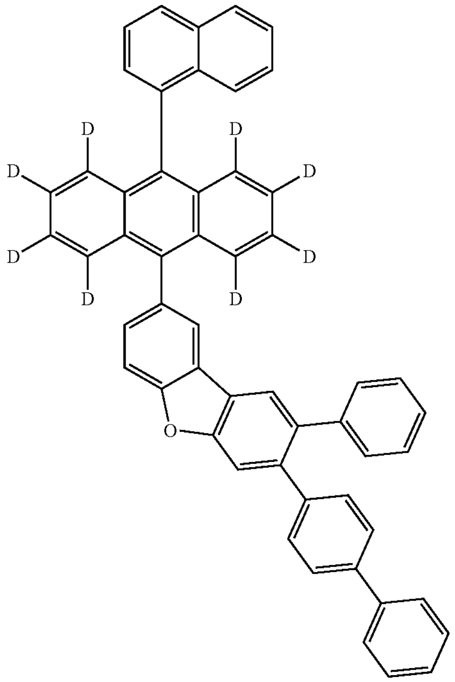
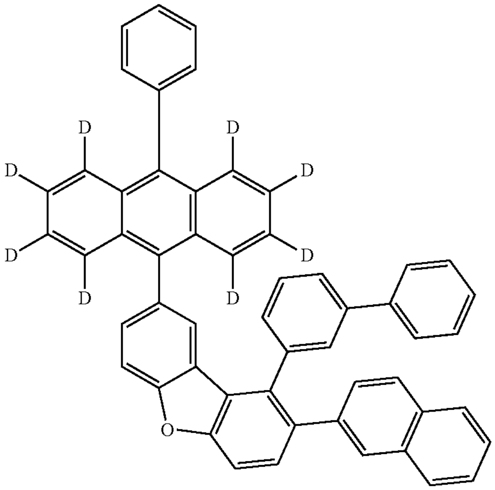
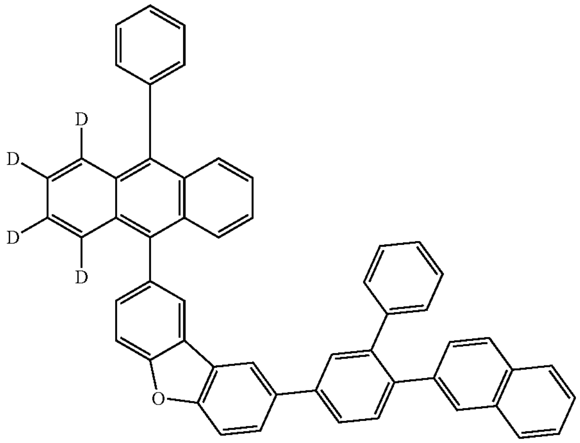

-continued
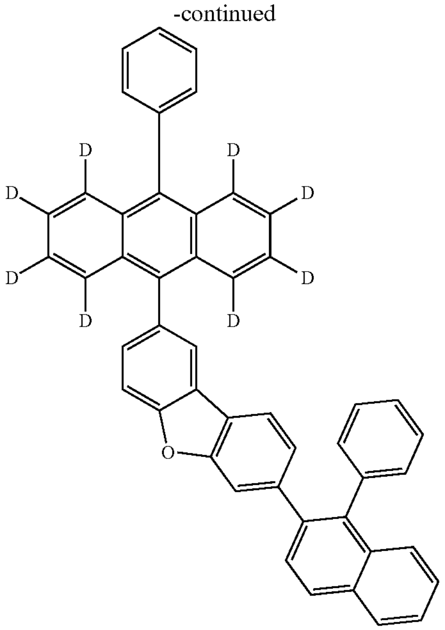
-continued
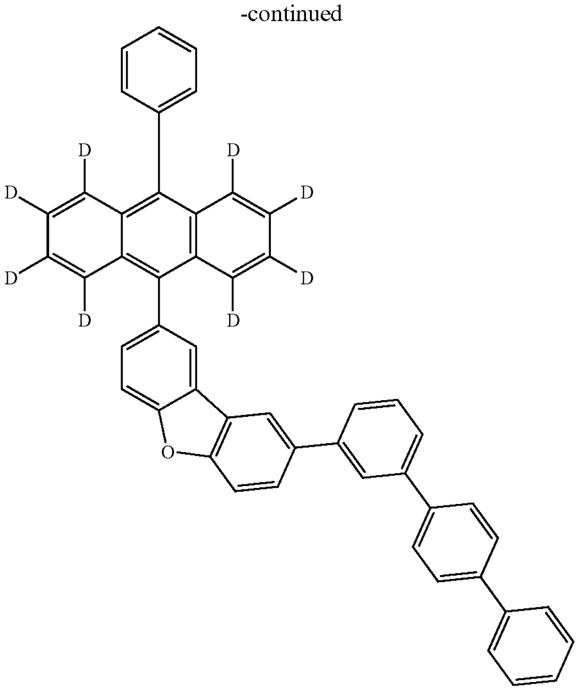
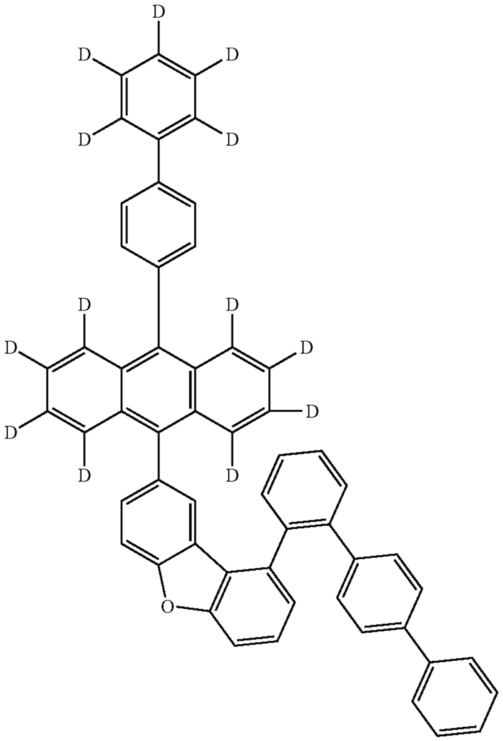
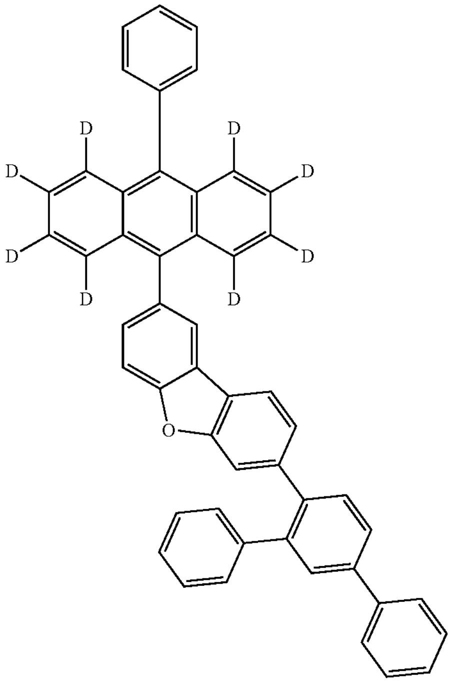

-continued
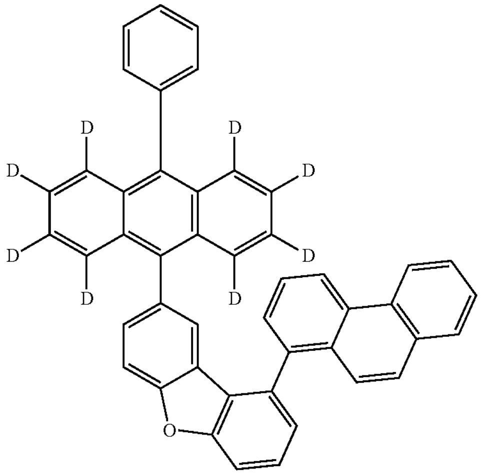
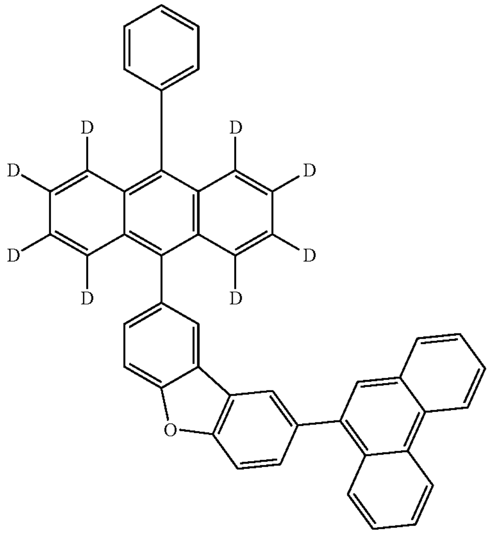
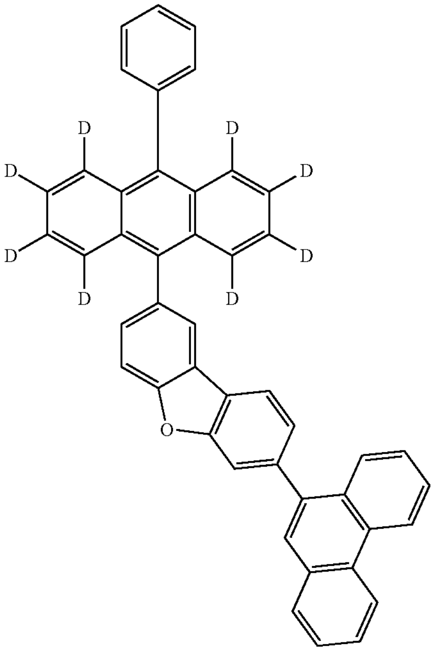
-continued
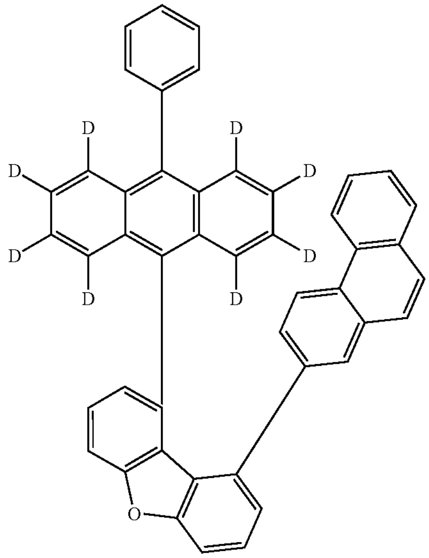
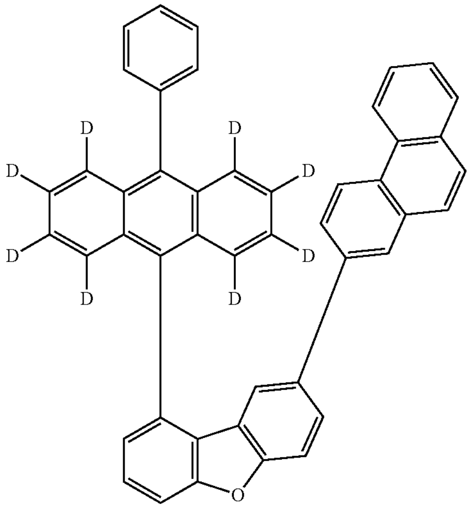
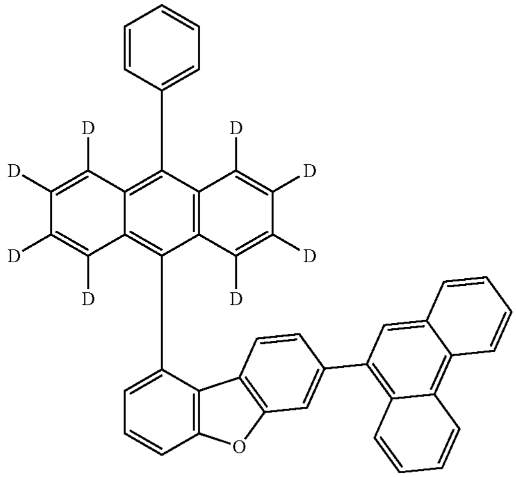

-continued
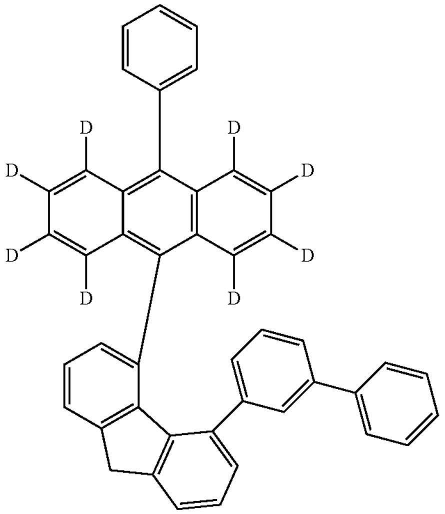
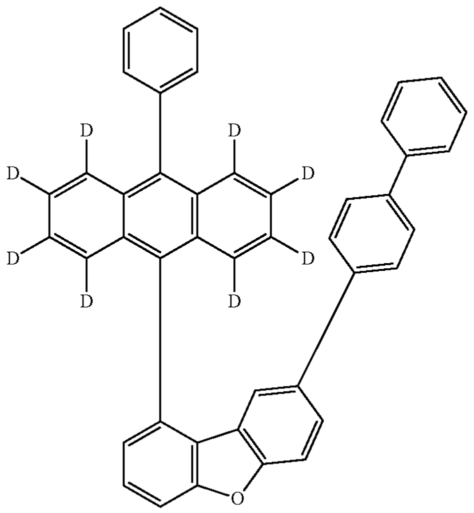
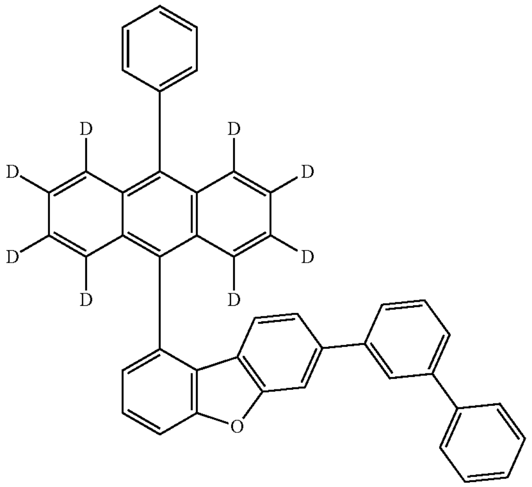
-continued
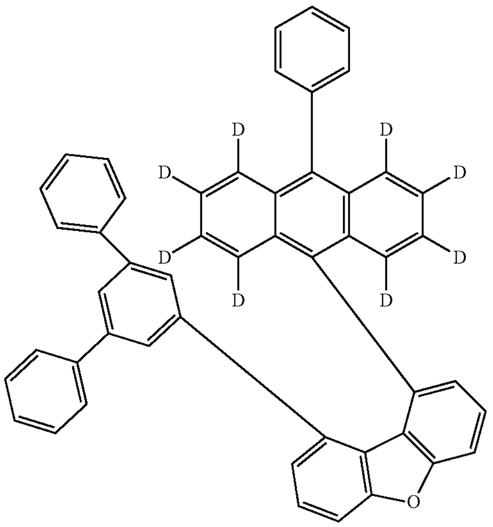
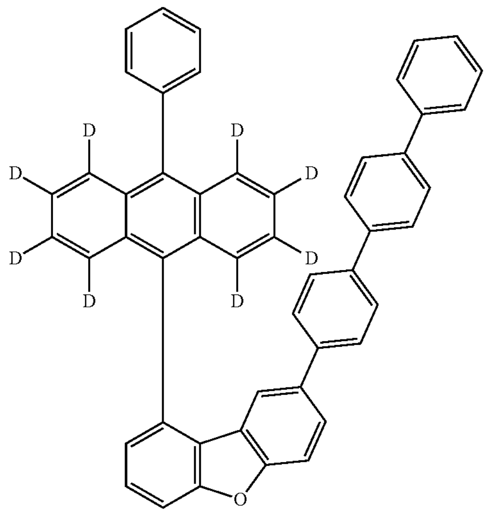
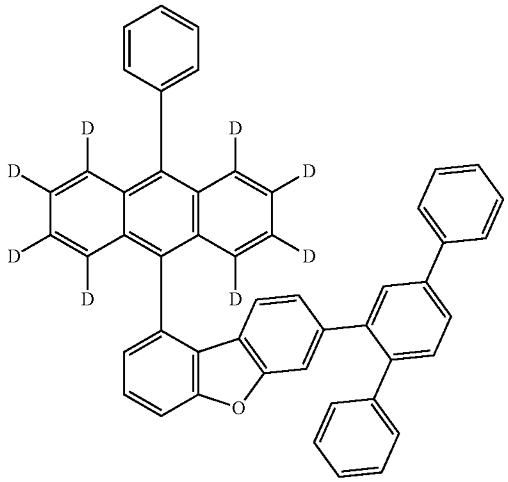

-continued
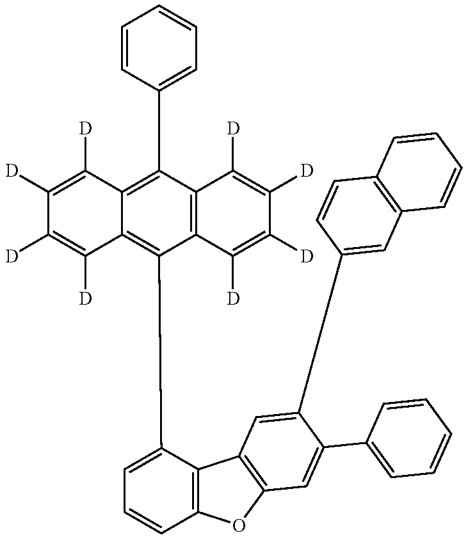
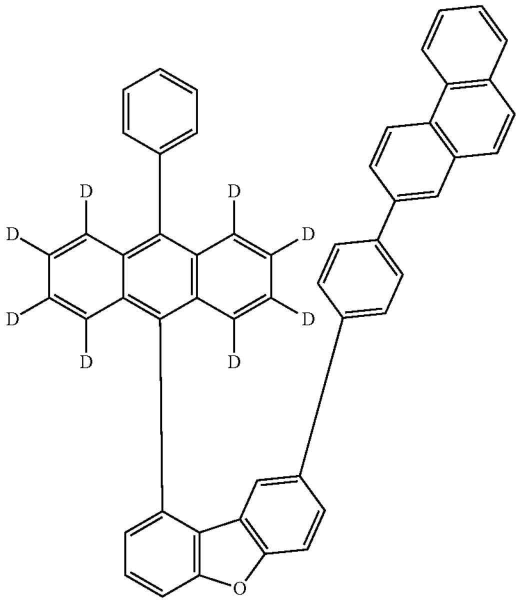
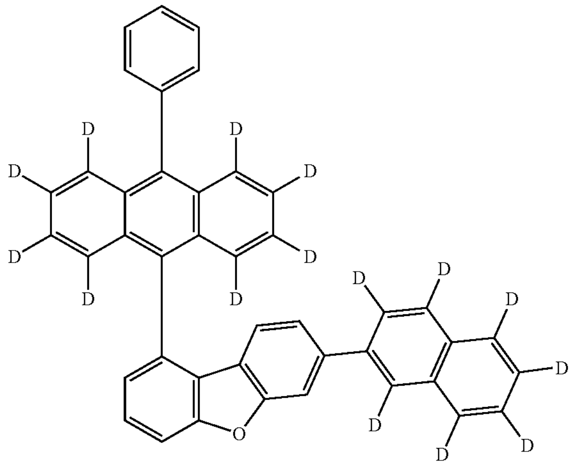
-continued
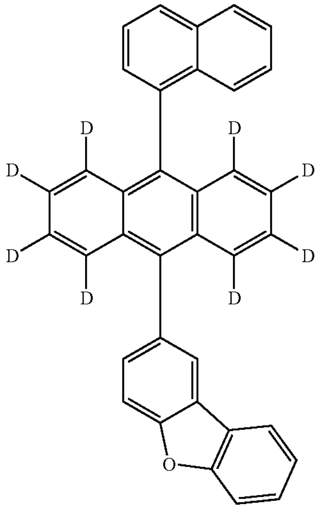
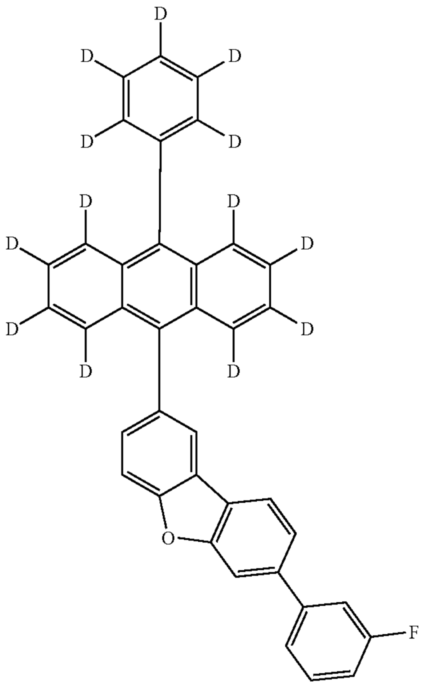

-continued
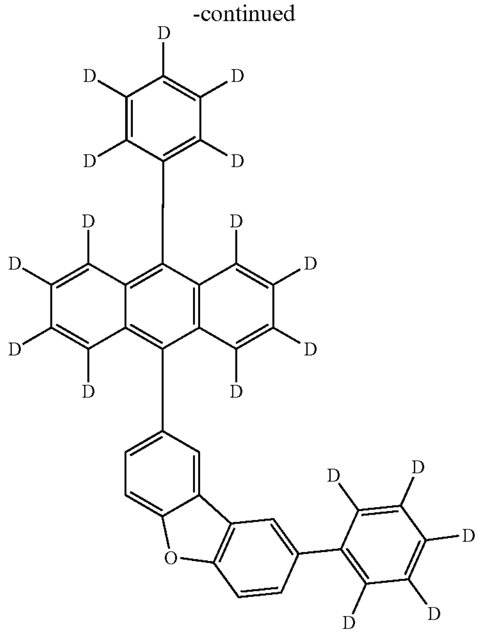
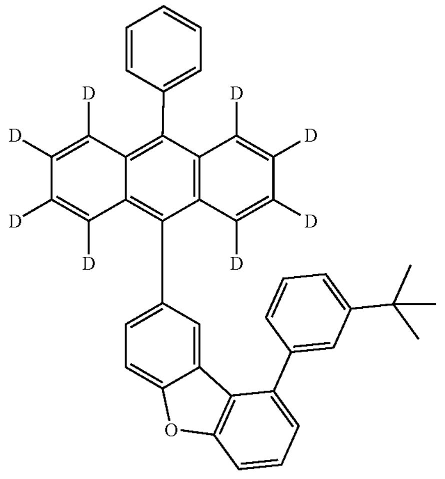
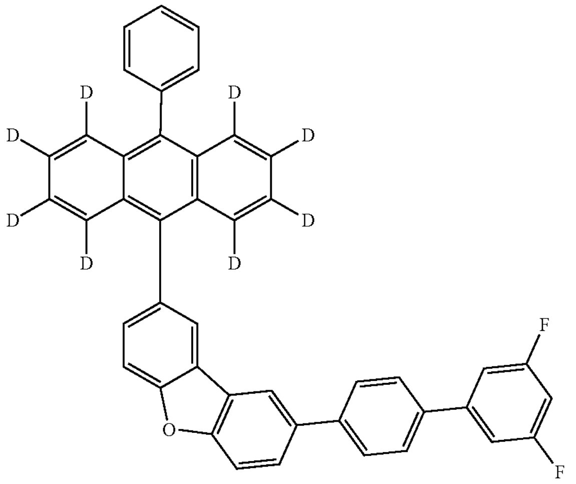
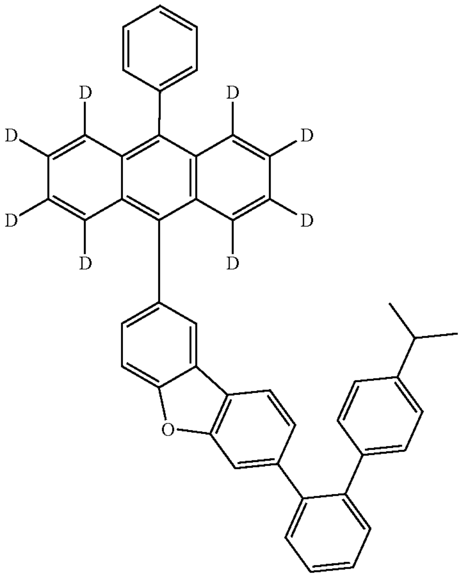
-continued
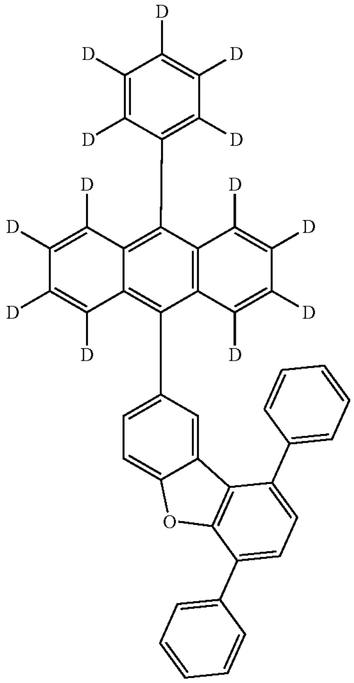

-continued
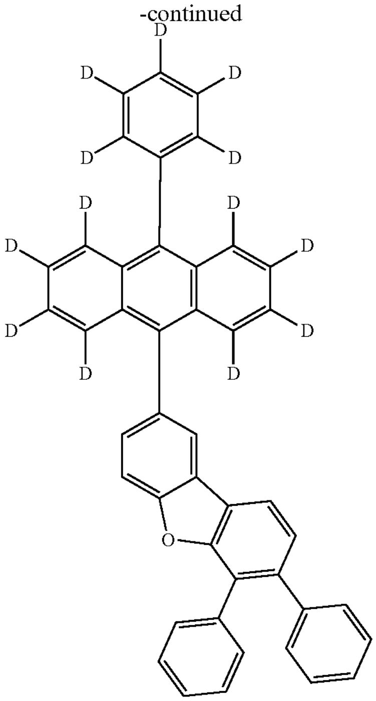
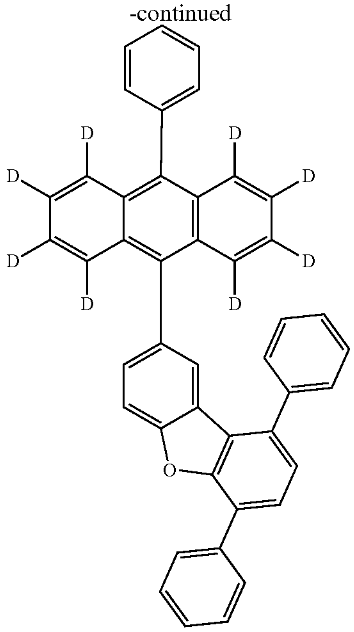
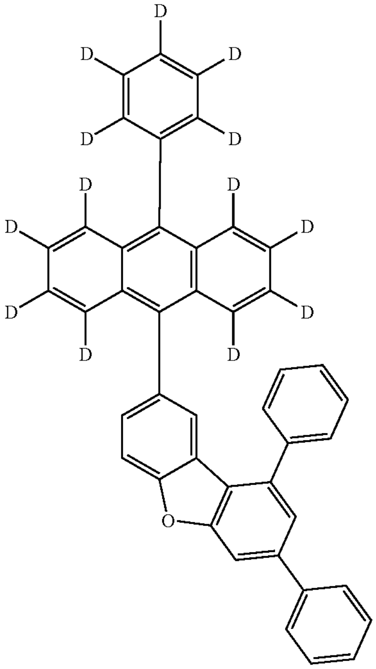
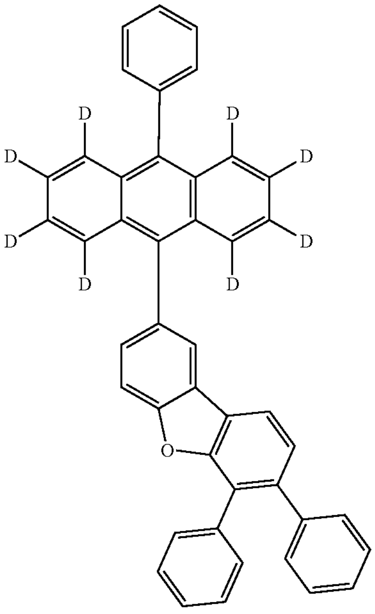

-continued
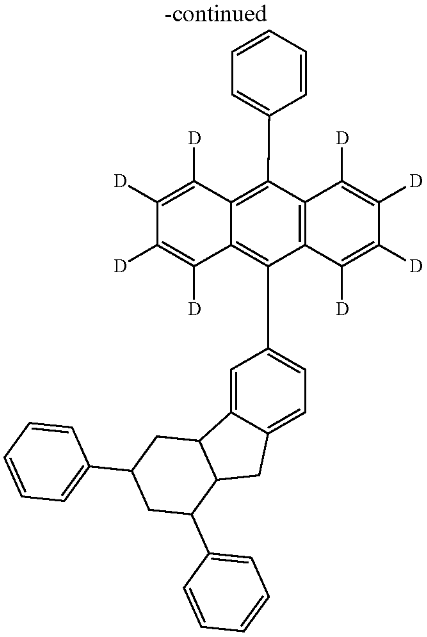
-continued
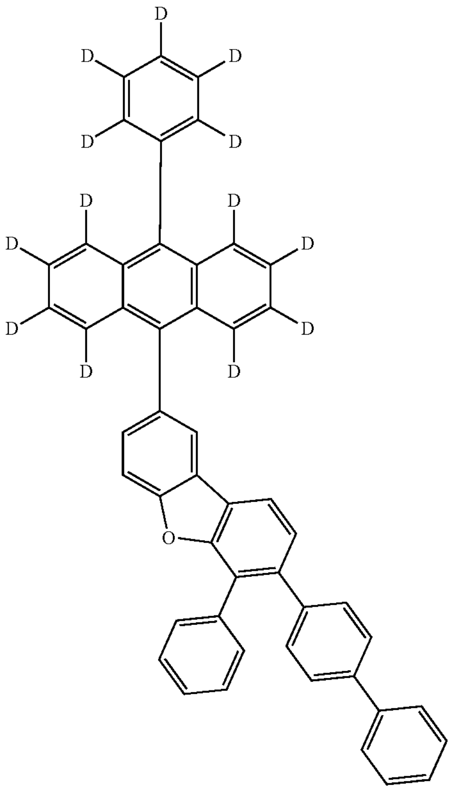
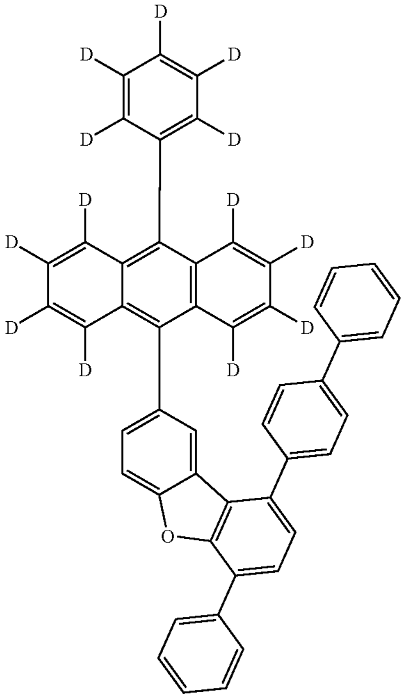
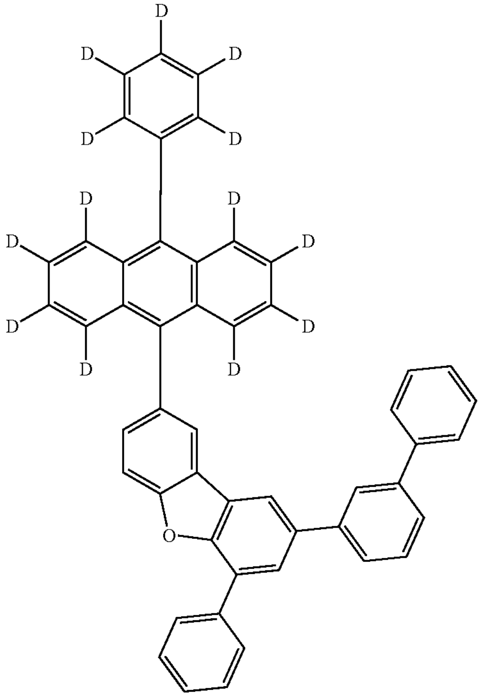

-continued
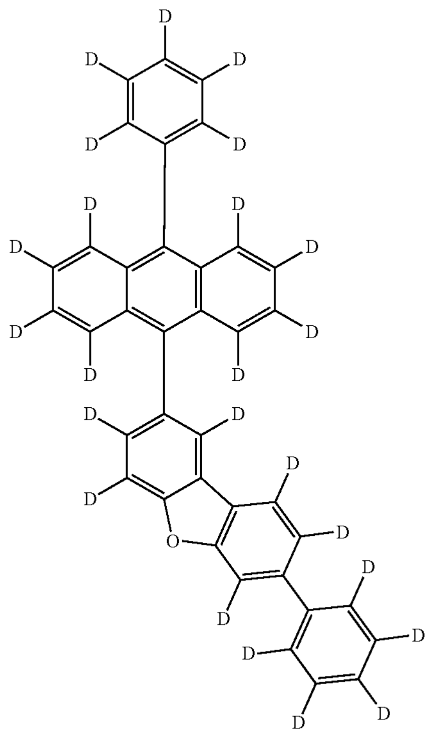
-continued
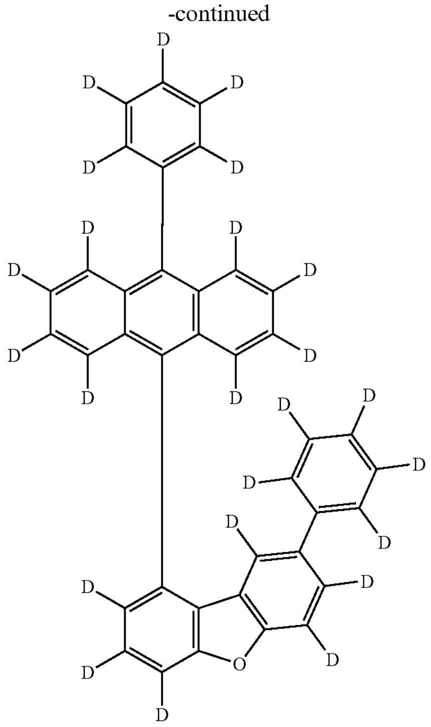
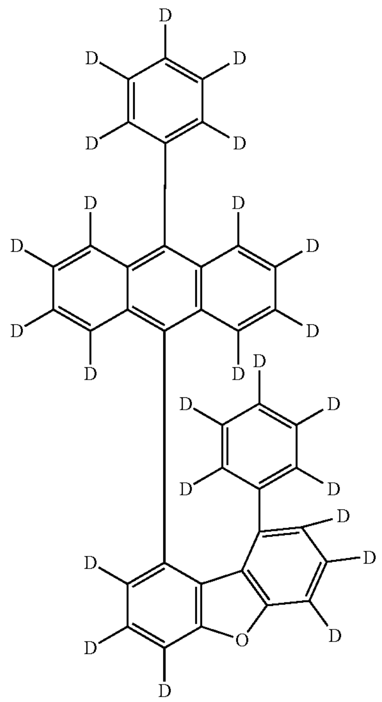
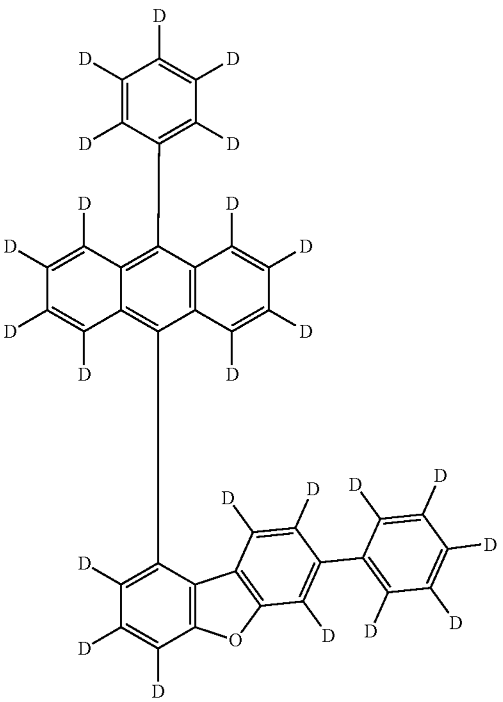

-continued
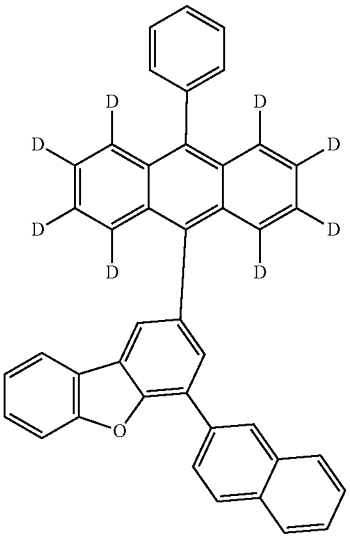
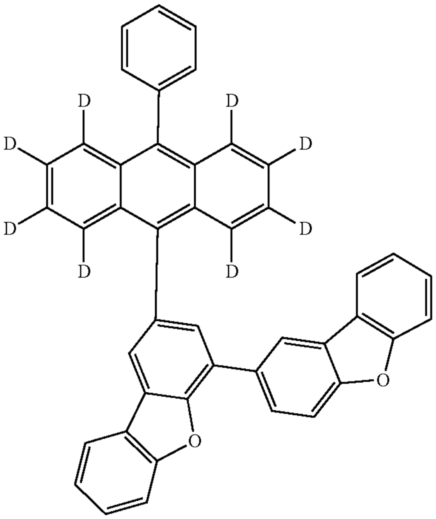
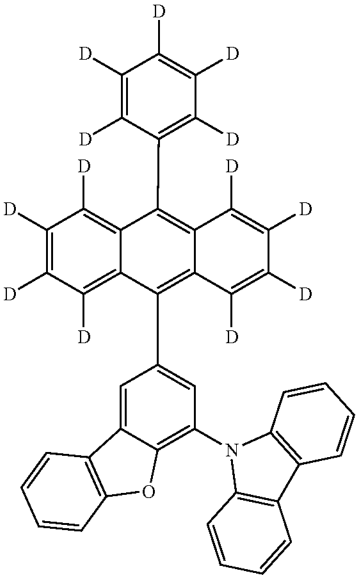
-continued
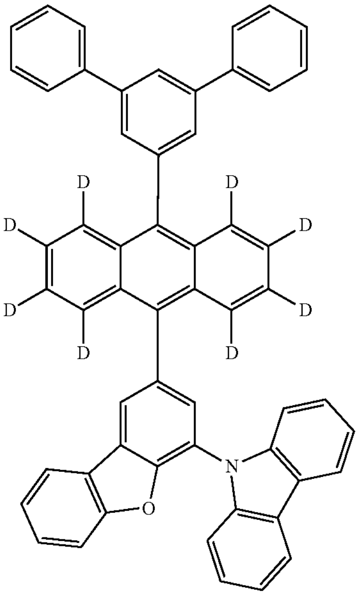
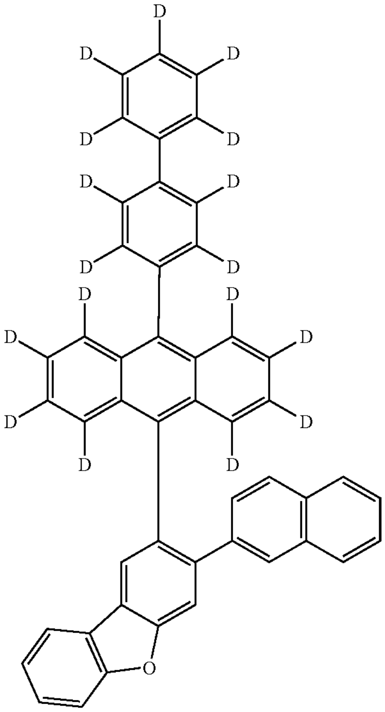

-continued
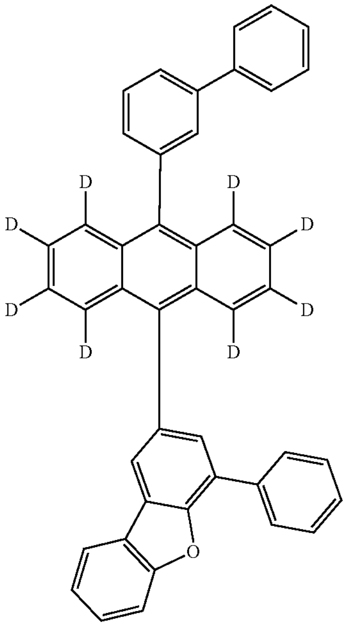
-continued
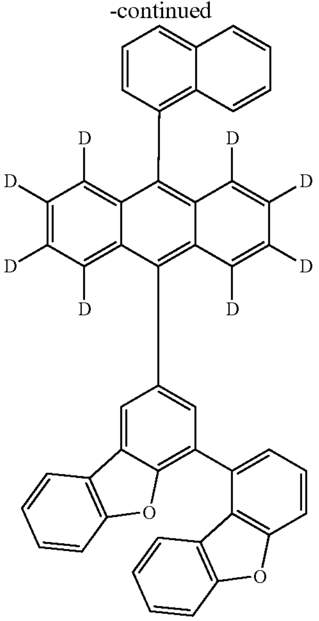
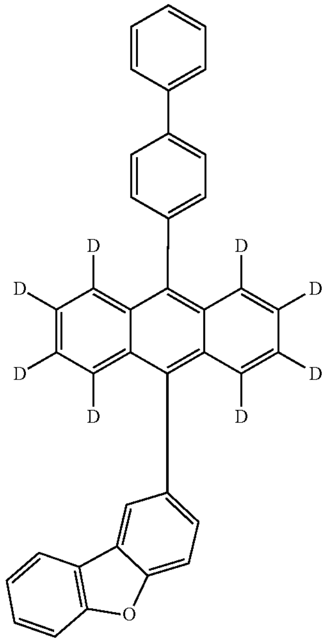
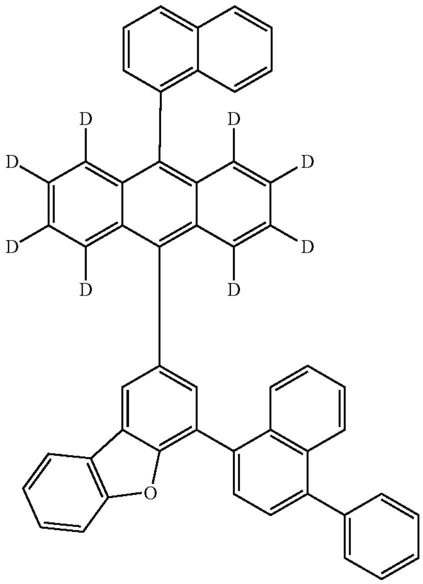

-continued
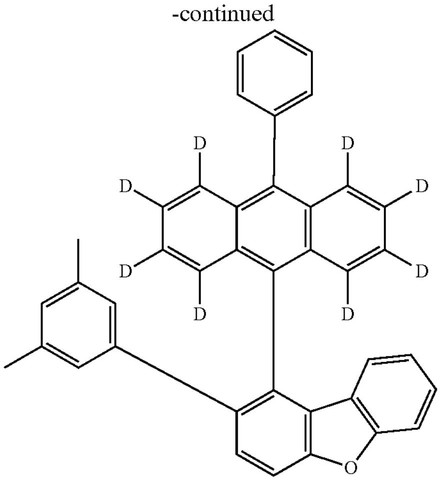
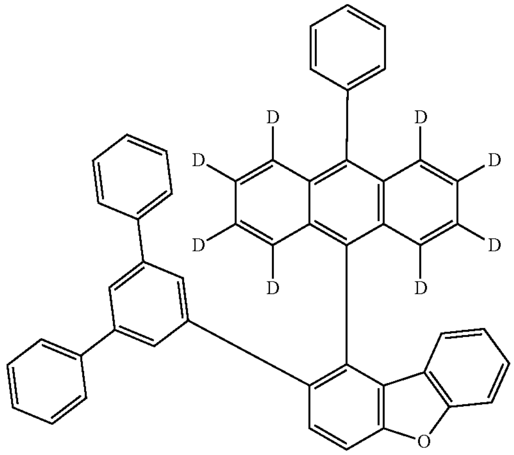
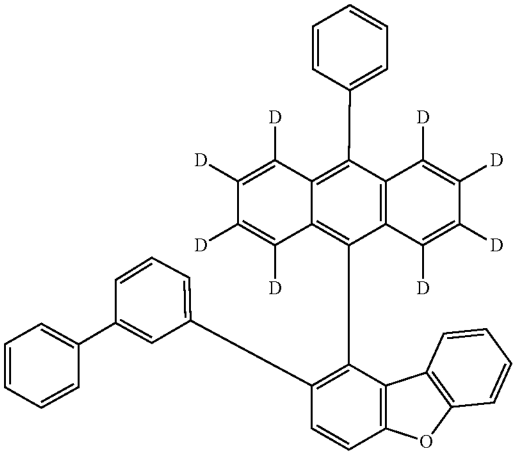
-continued
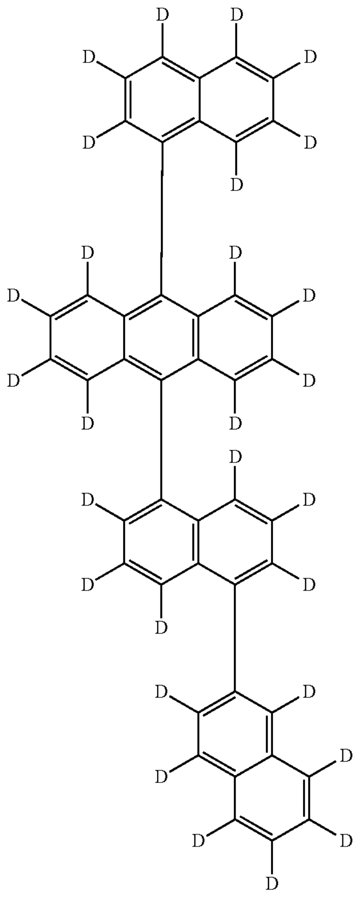
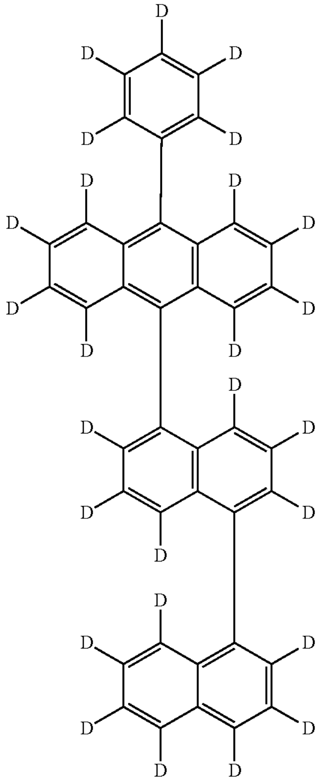

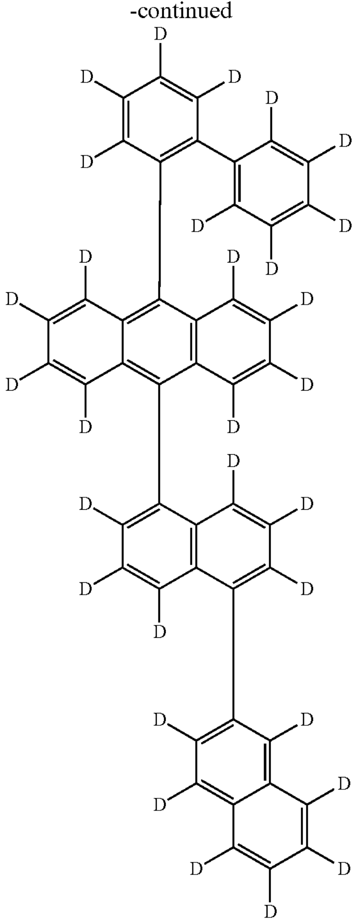
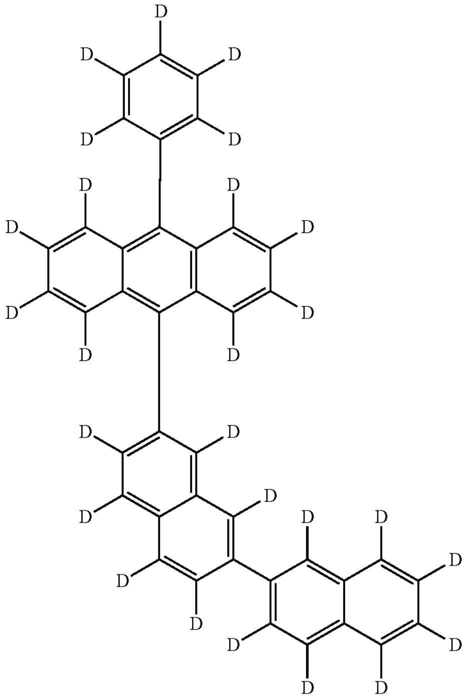
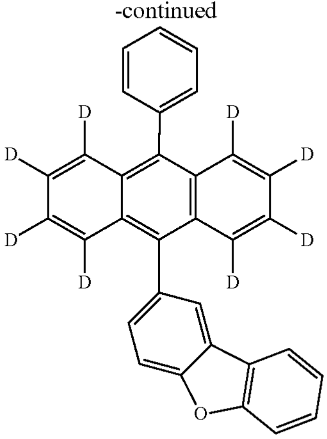
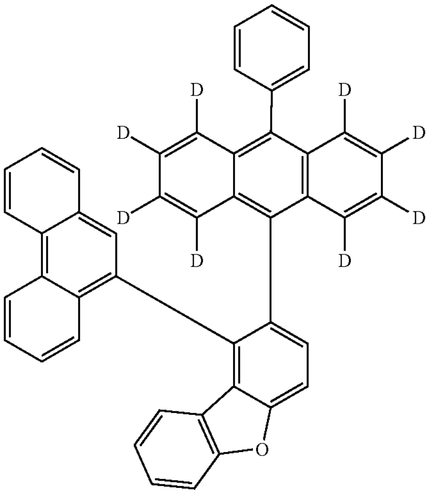
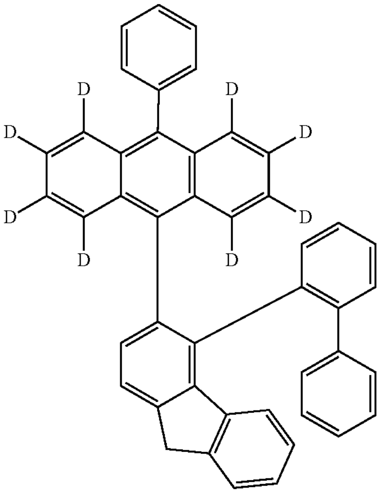

-continued
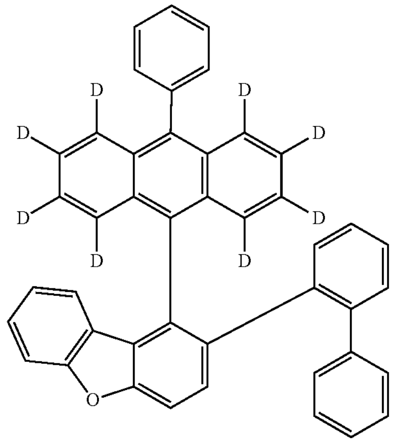
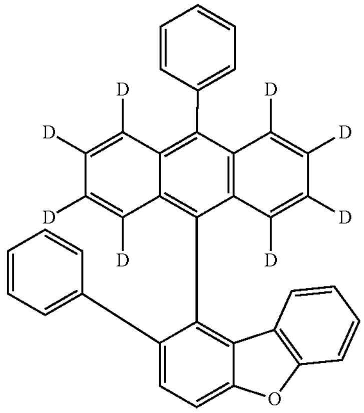
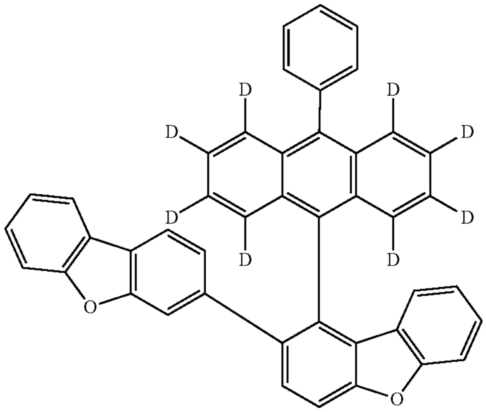
-continued
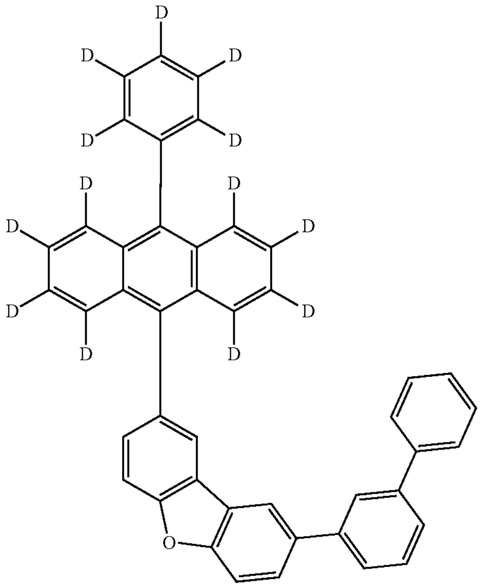
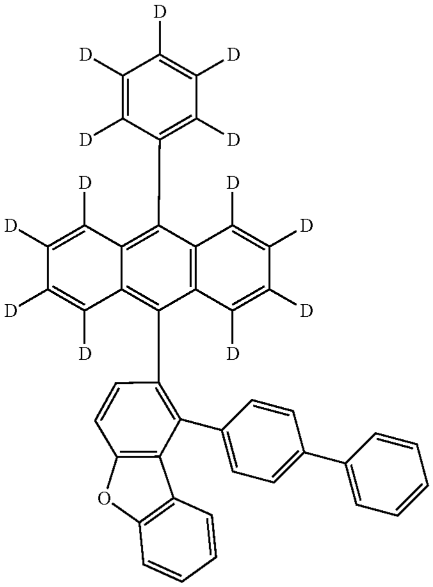
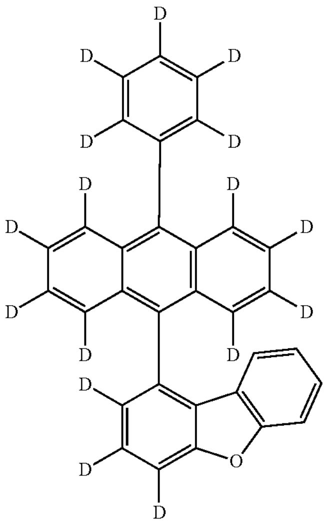

-continued
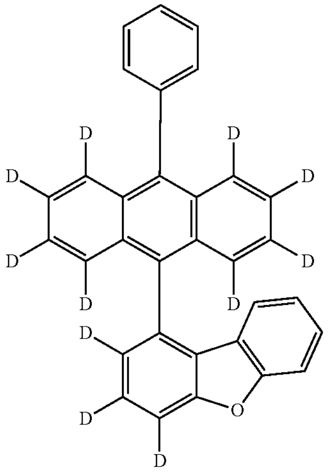
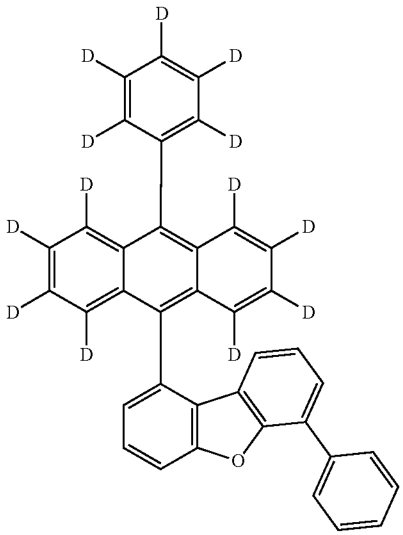
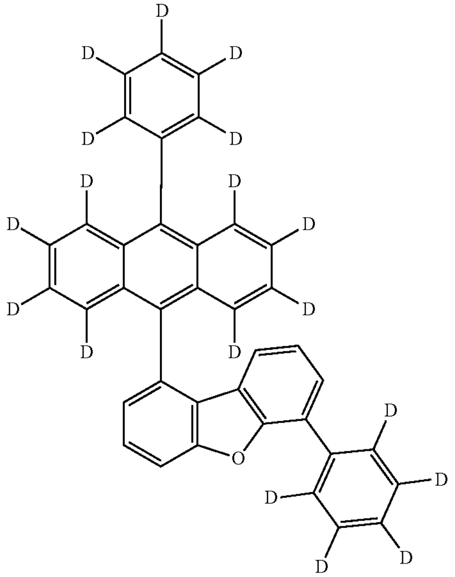
-continued
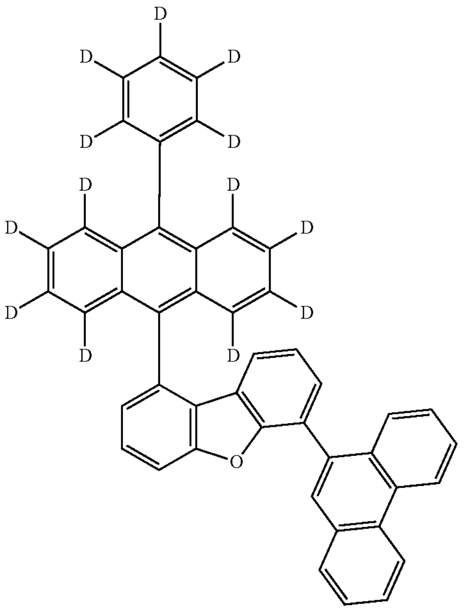
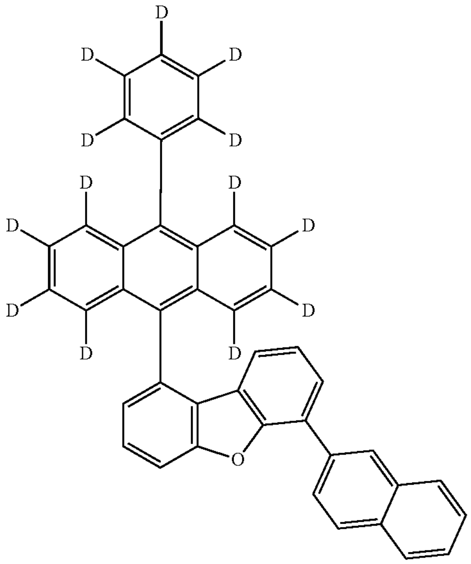
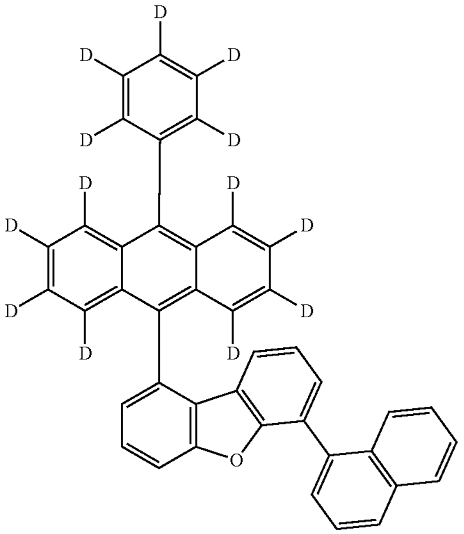

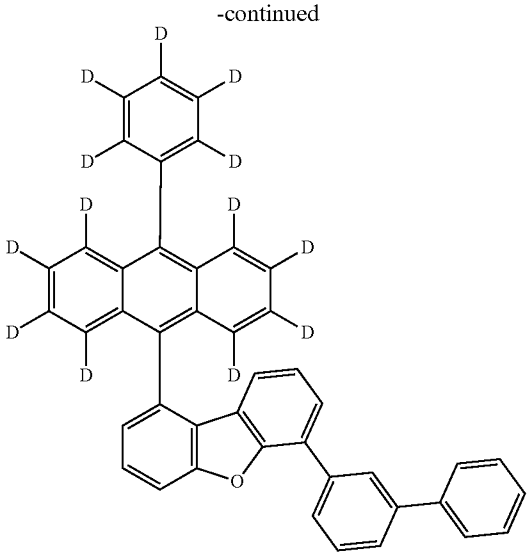
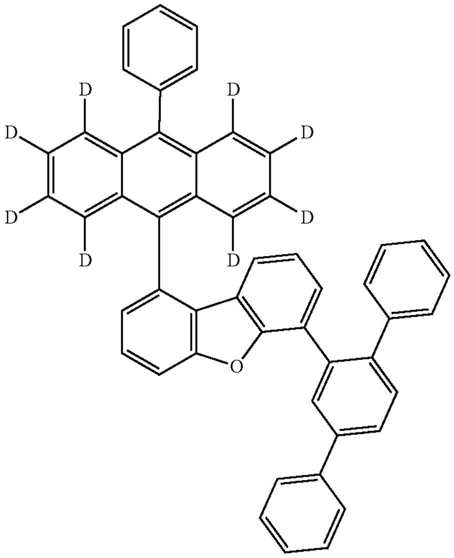
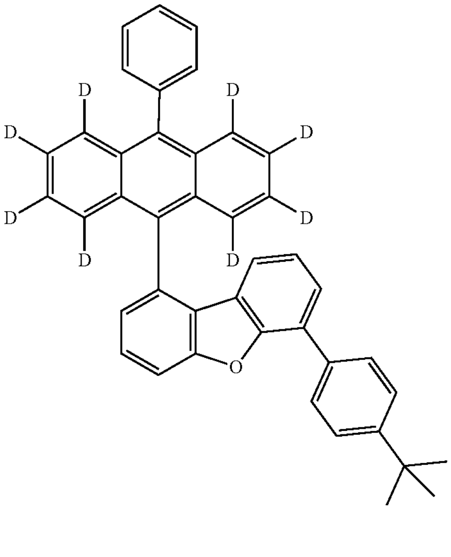
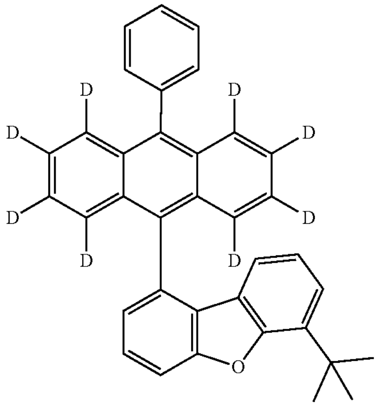
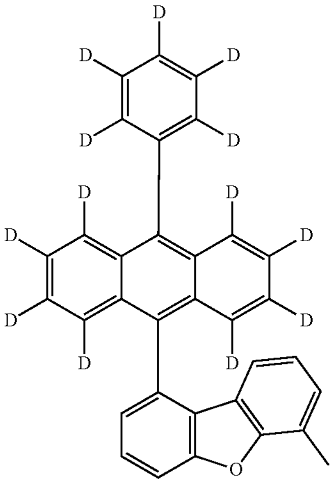
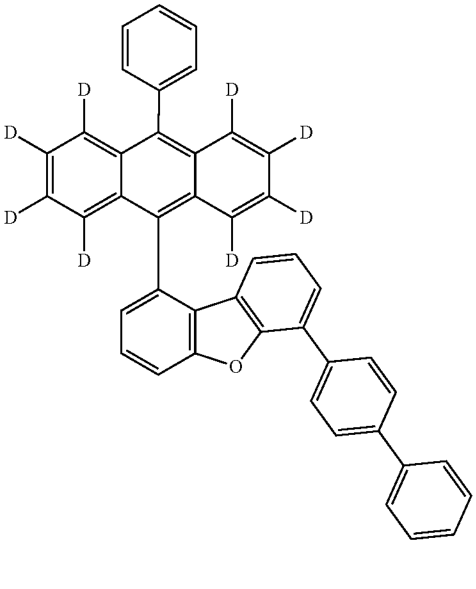

-continued
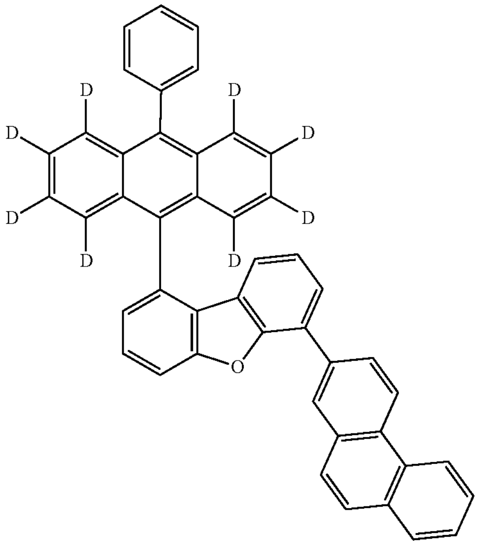
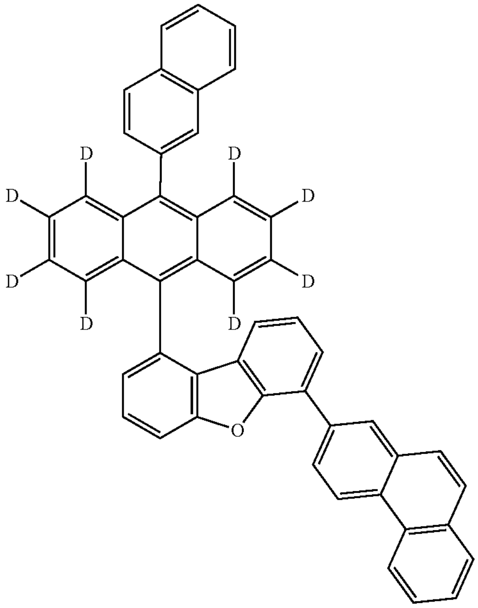
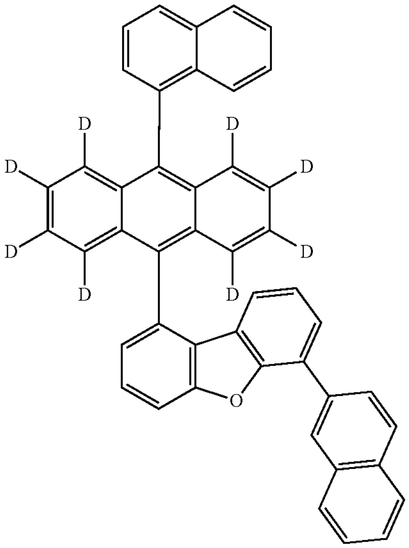
-continued
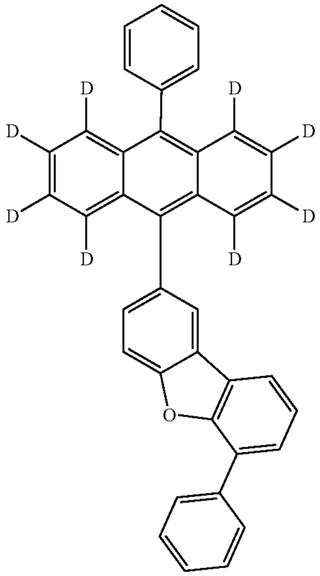
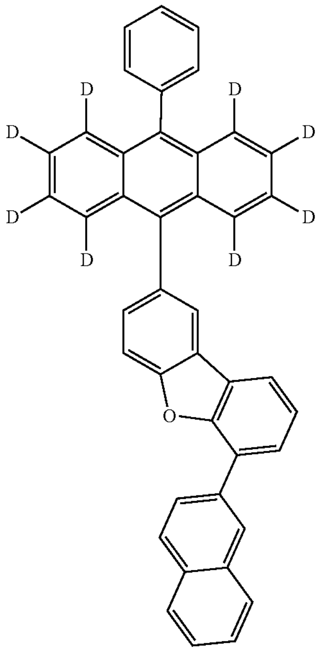

-continued
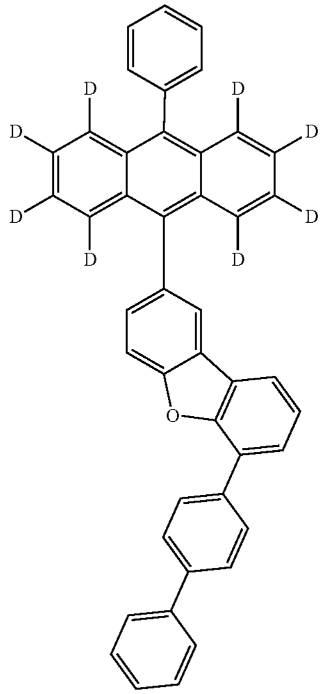
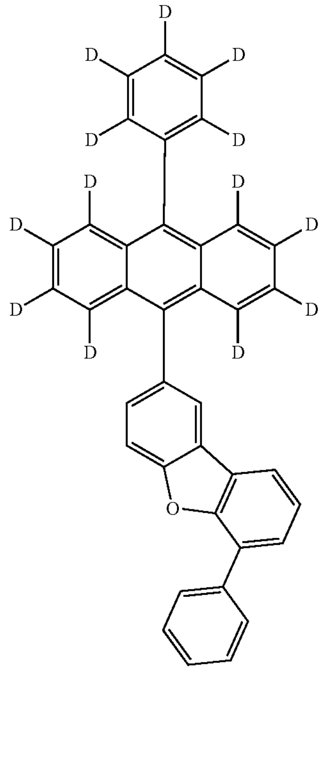
-continued
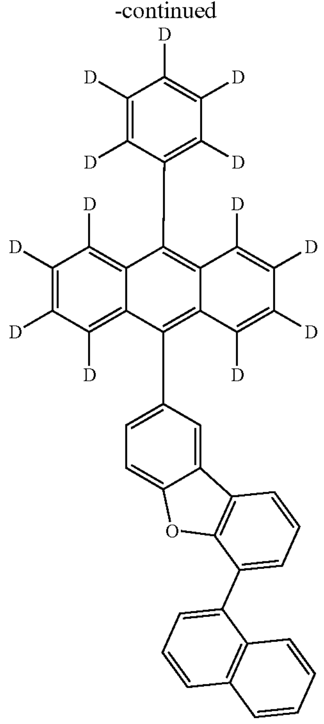
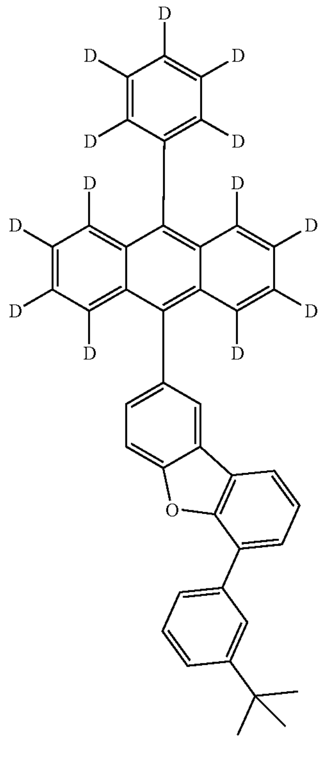

-continued
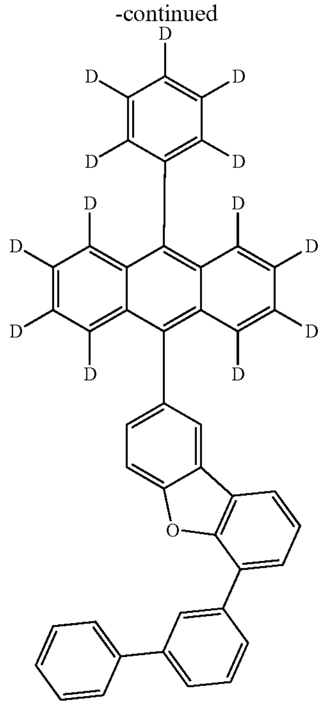
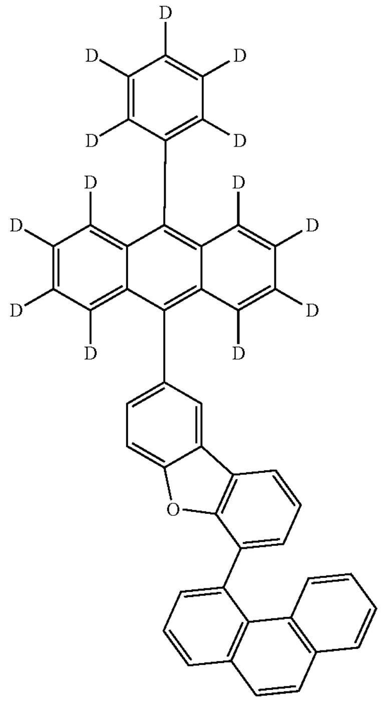
-continued
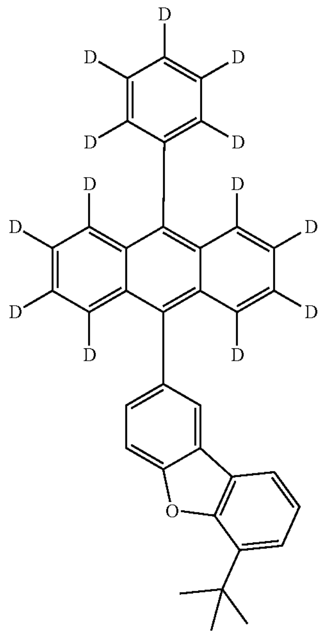
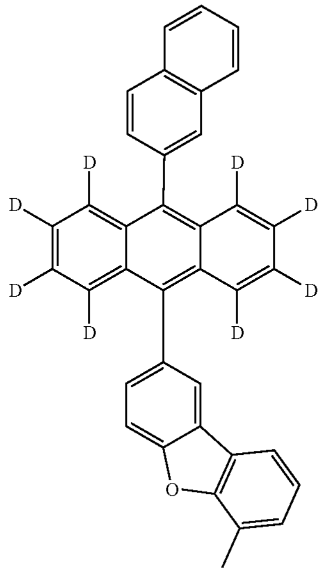

-continued
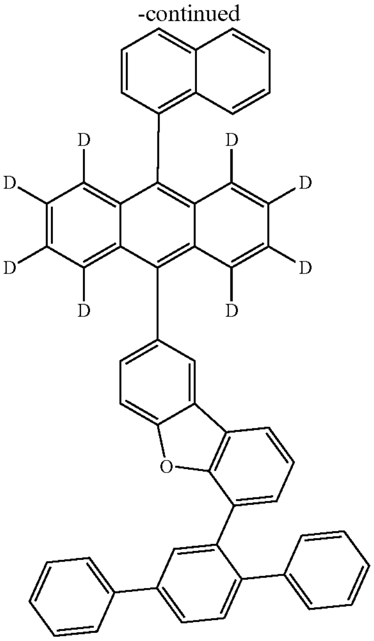
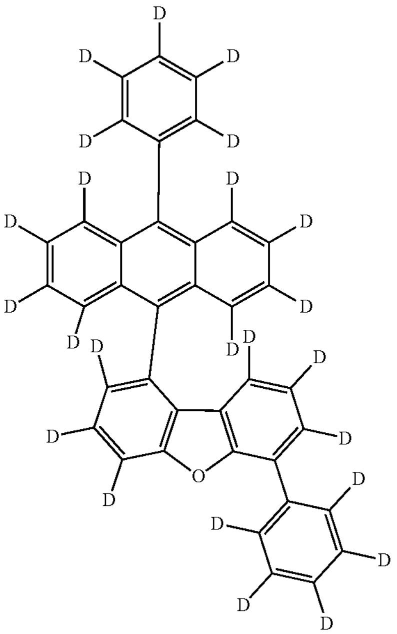
-continued
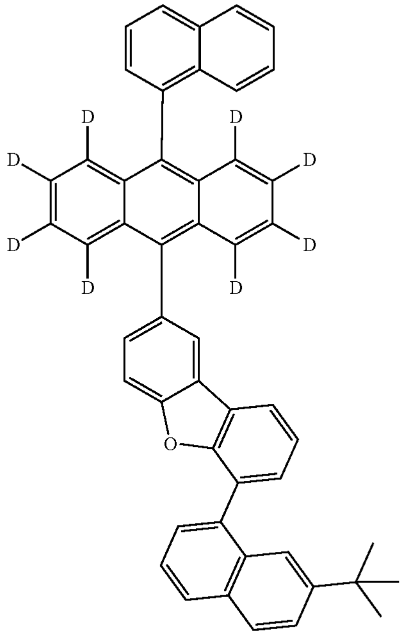
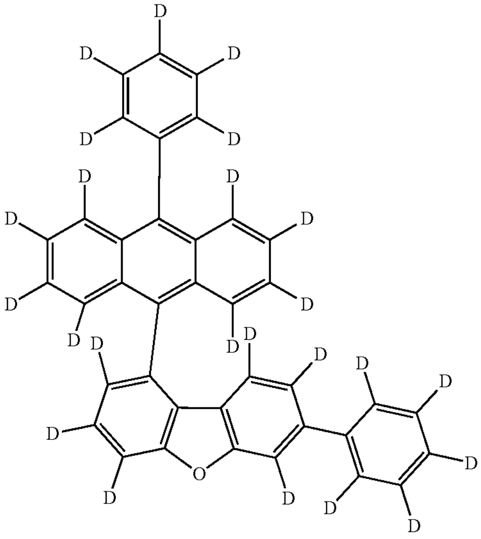

-continued
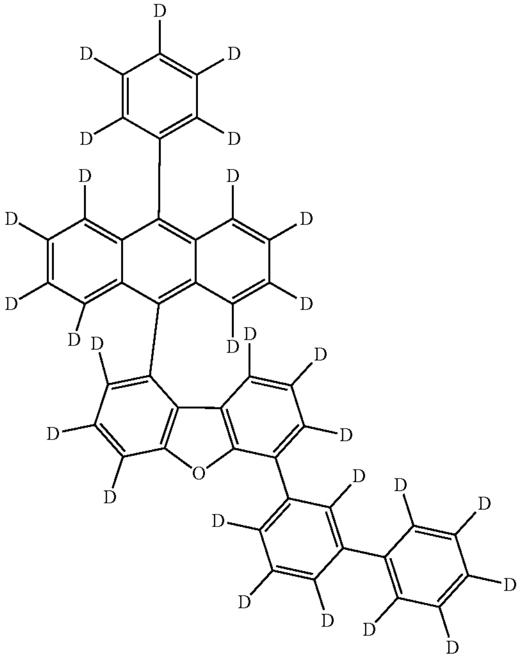
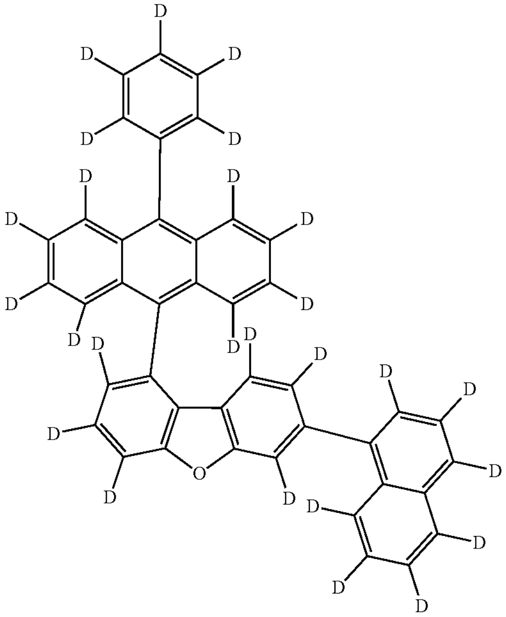
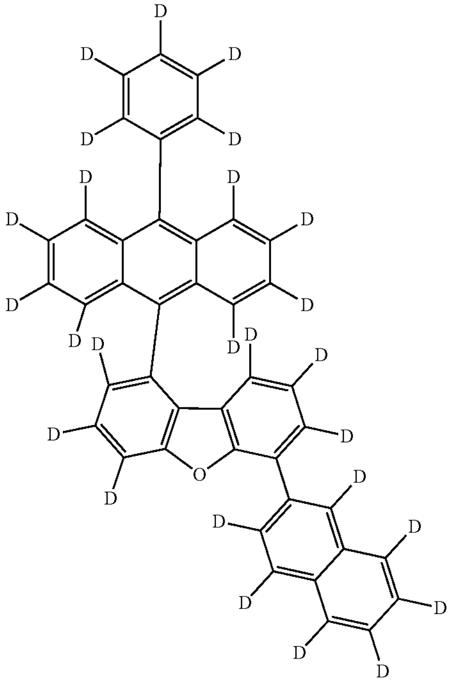
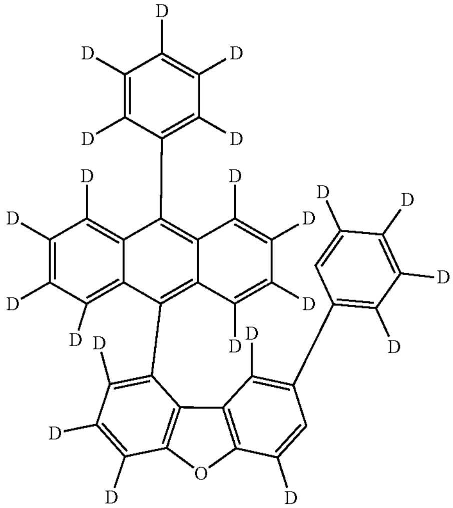

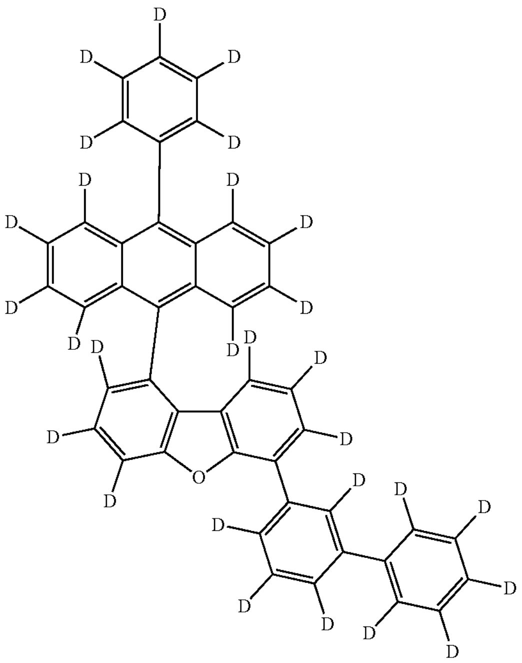
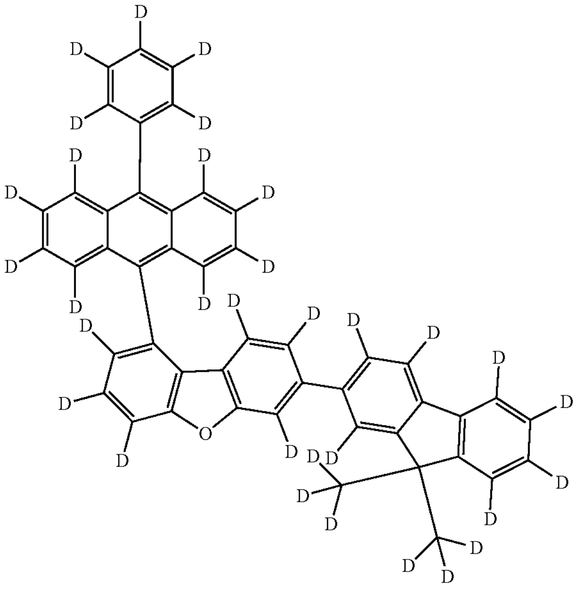
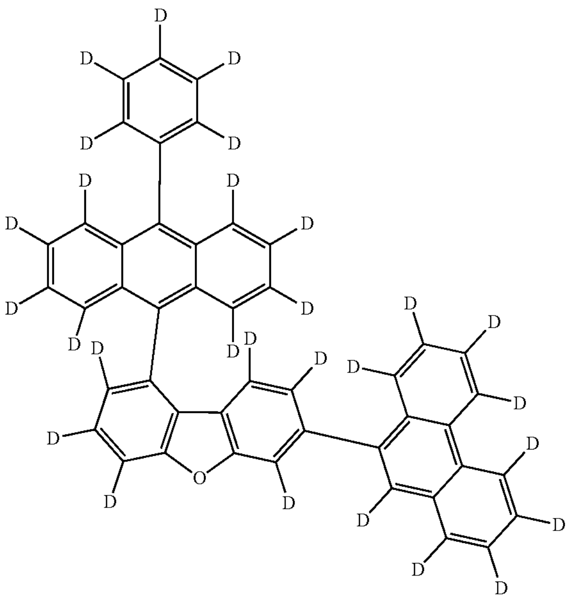
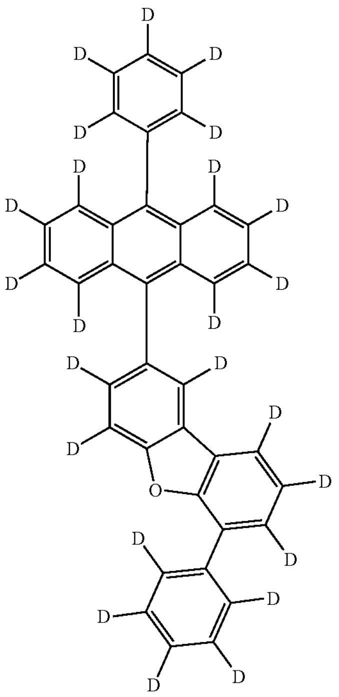

-continued
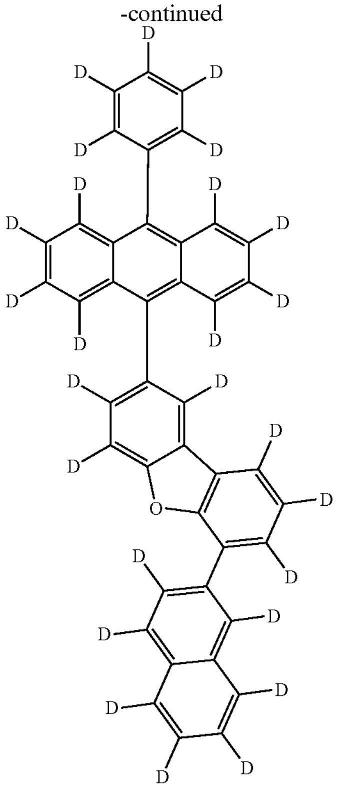
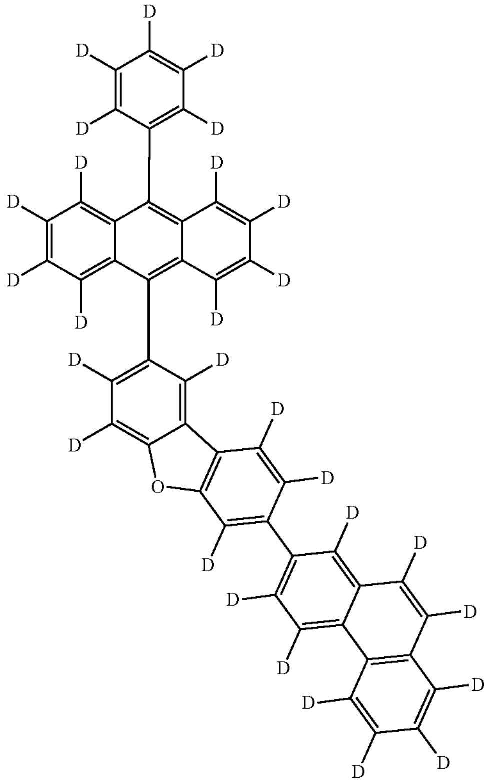
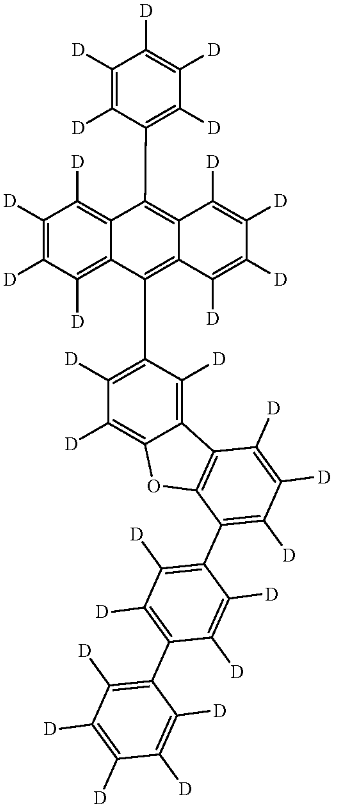
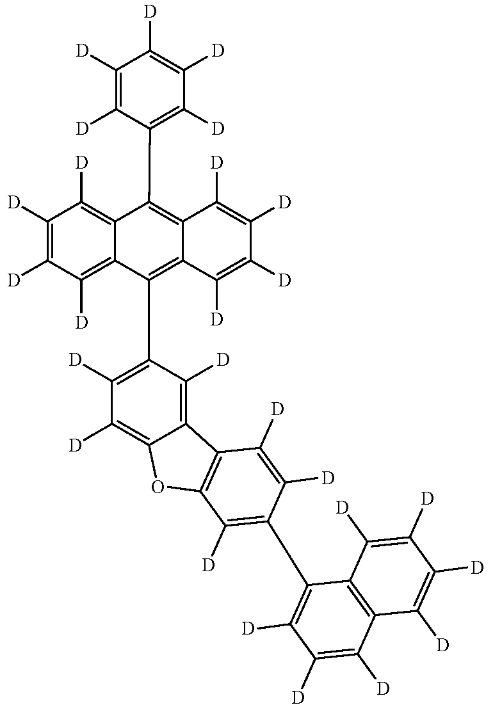
-continued

-continued
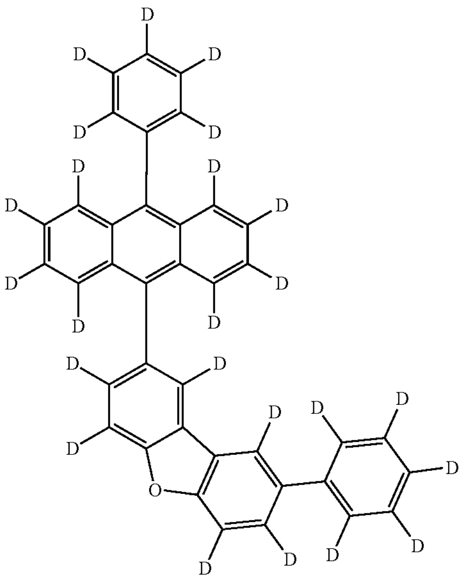
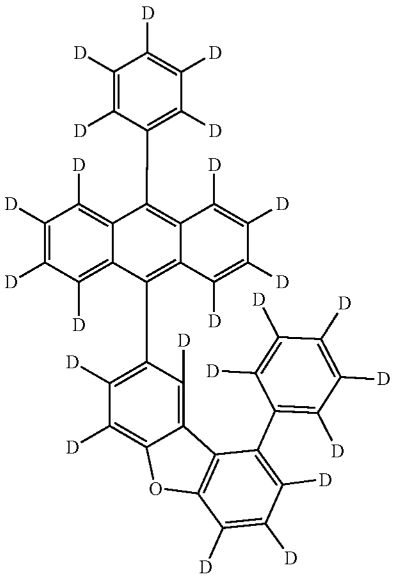
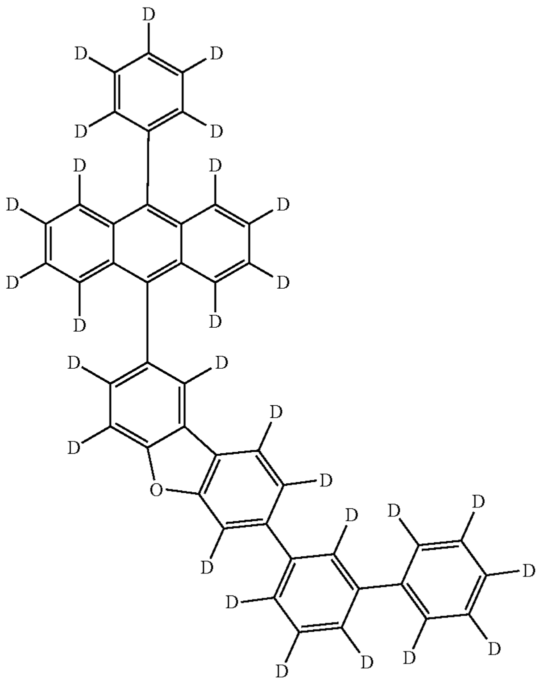
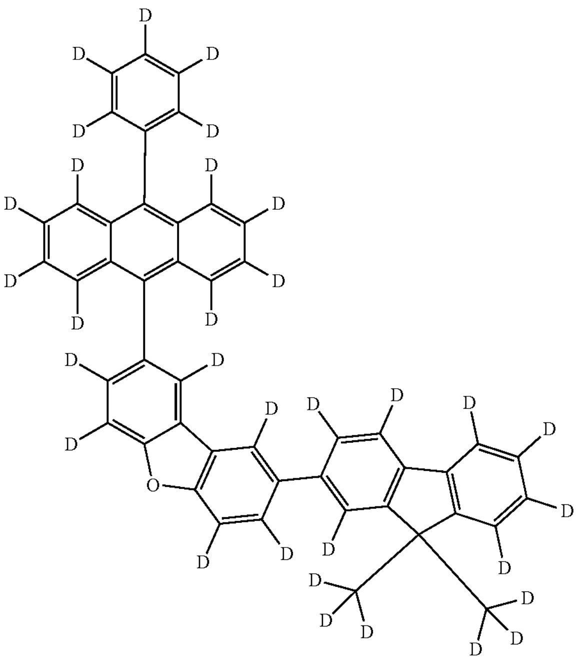

-continued
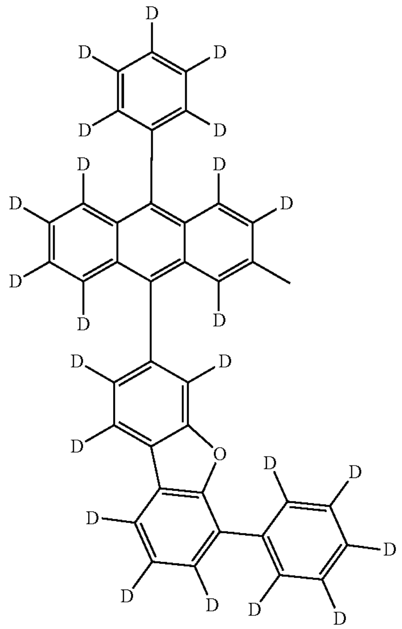
-continued
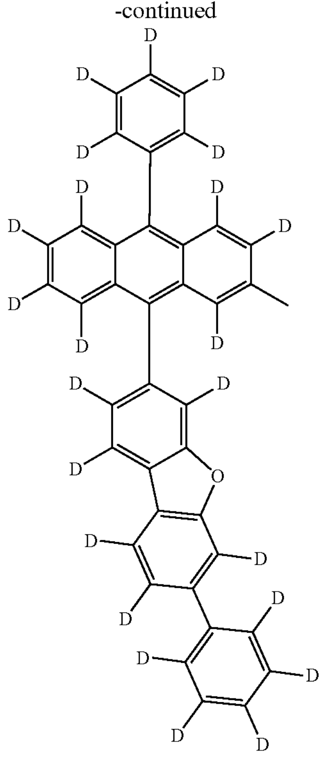
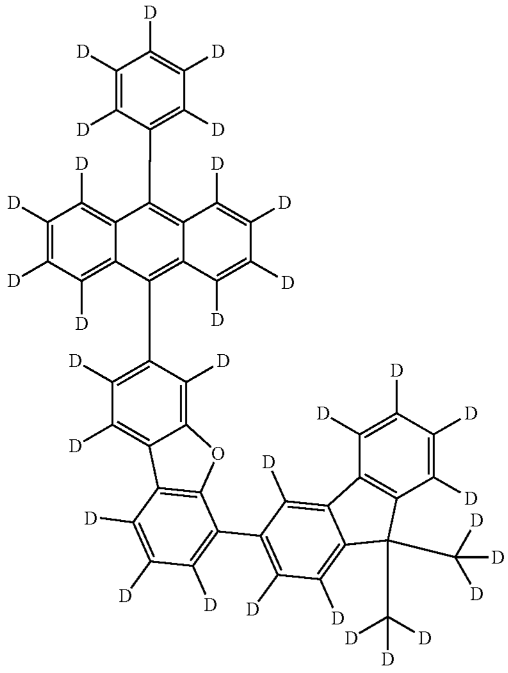
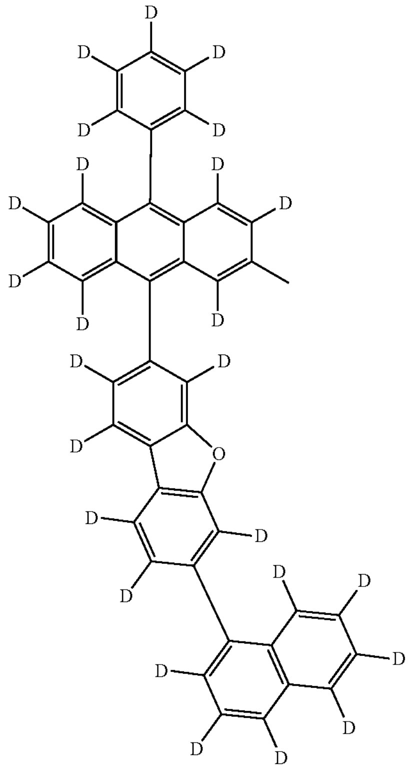

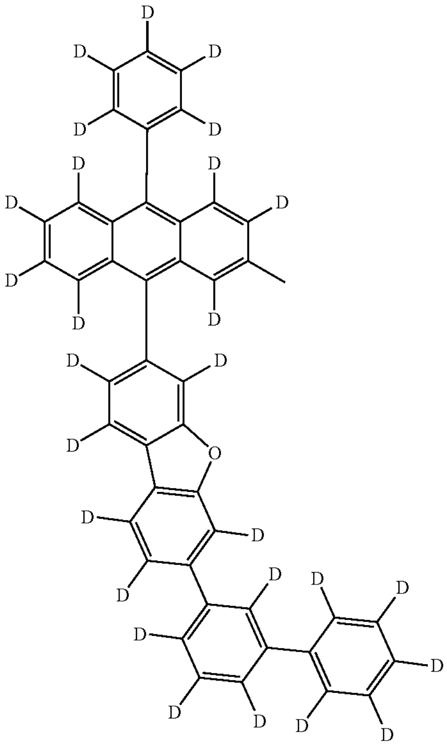
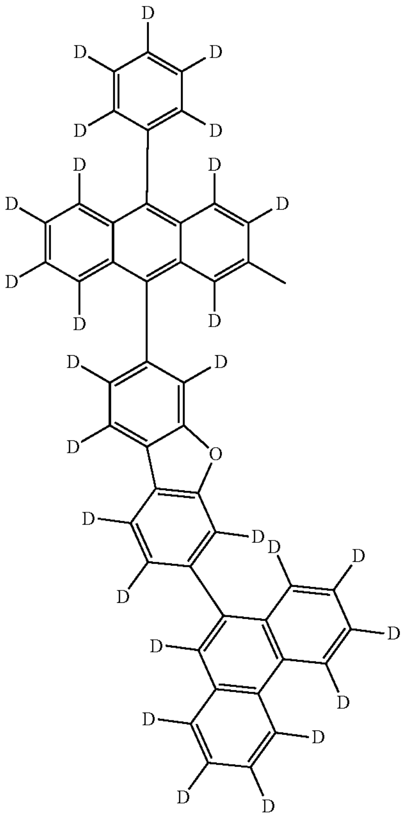
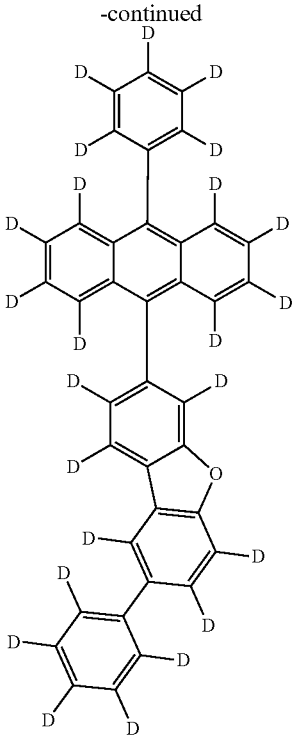
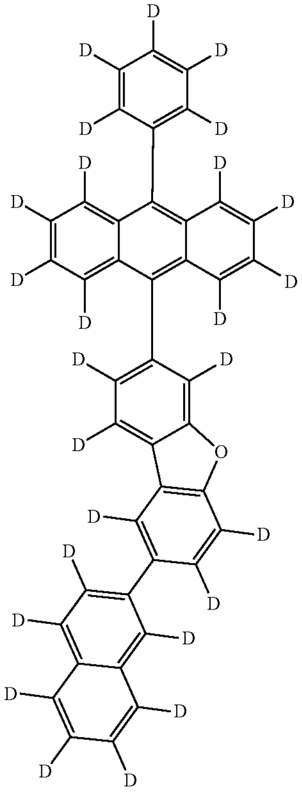

-continued
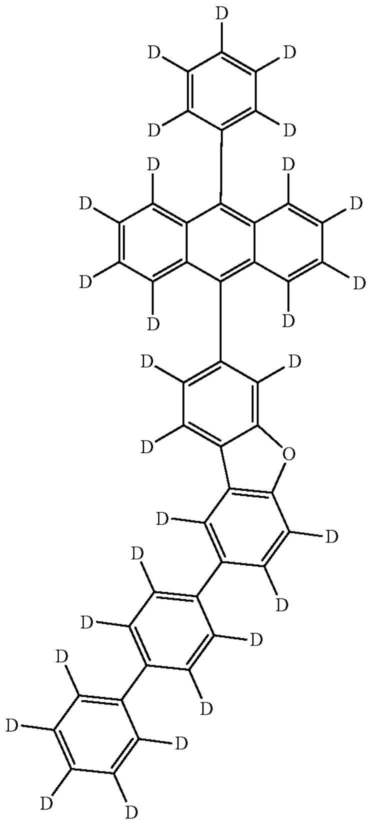
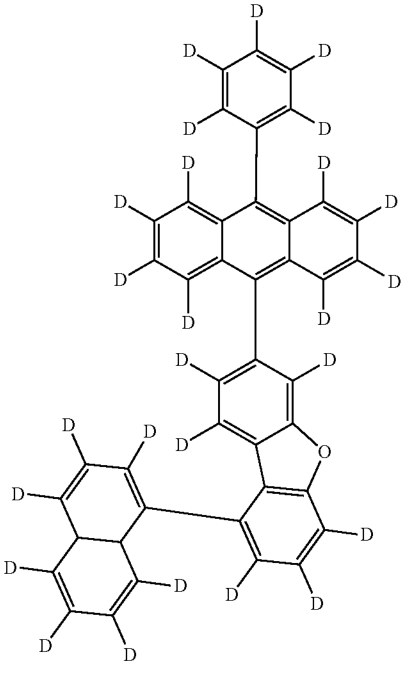
-continued
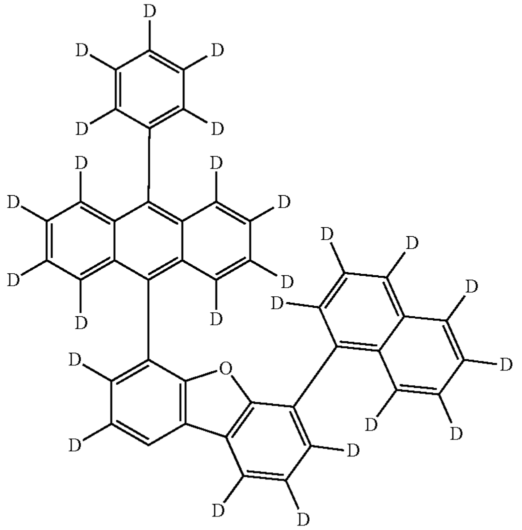
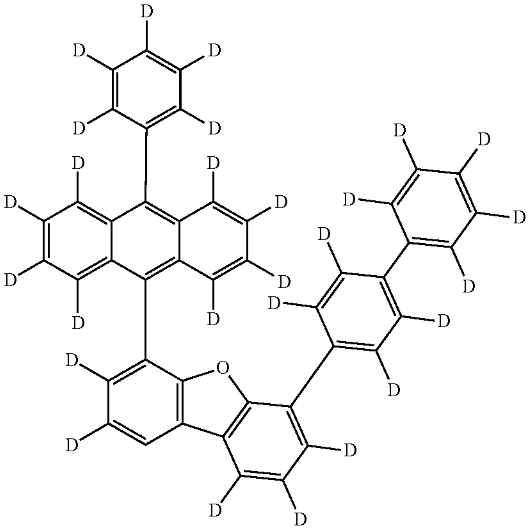
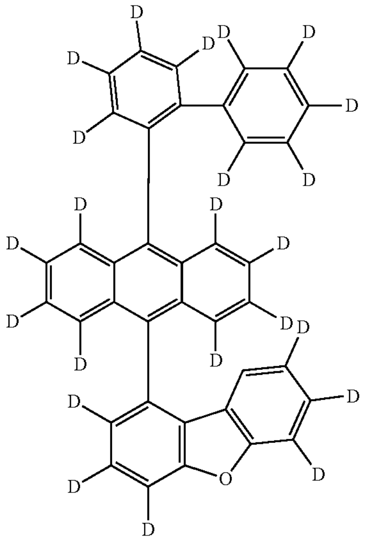

-continued
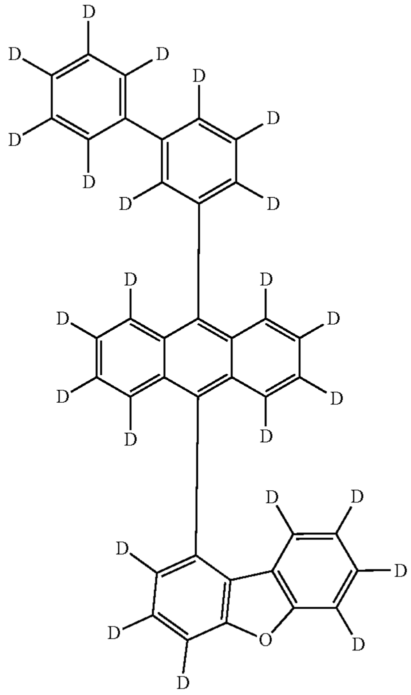
-continued
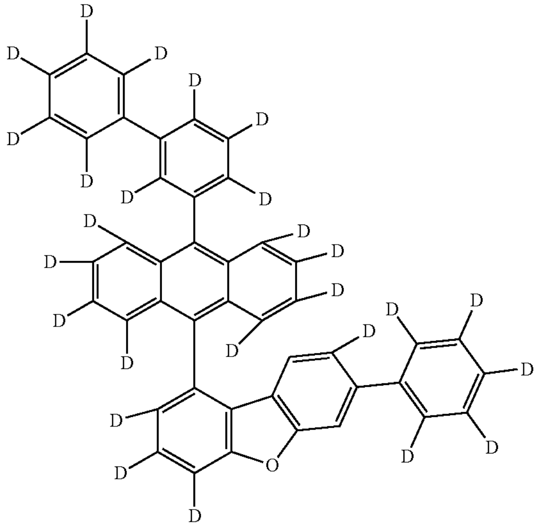
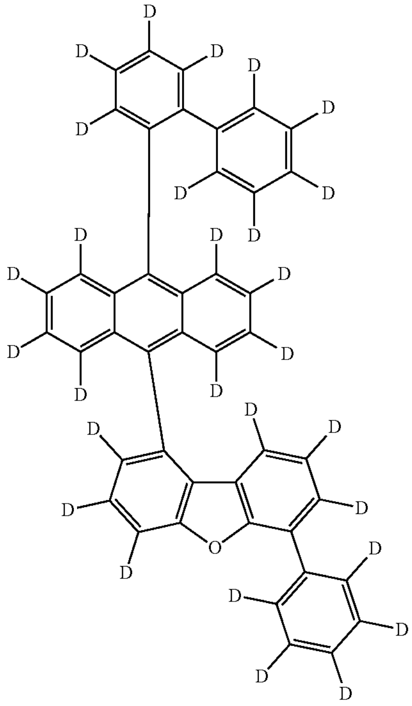
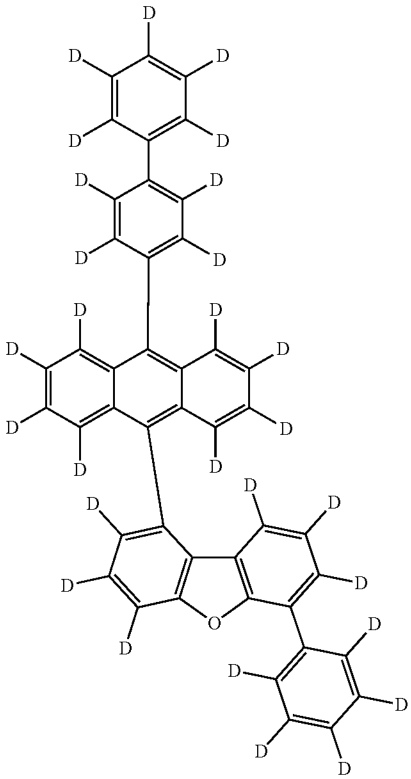

-continued

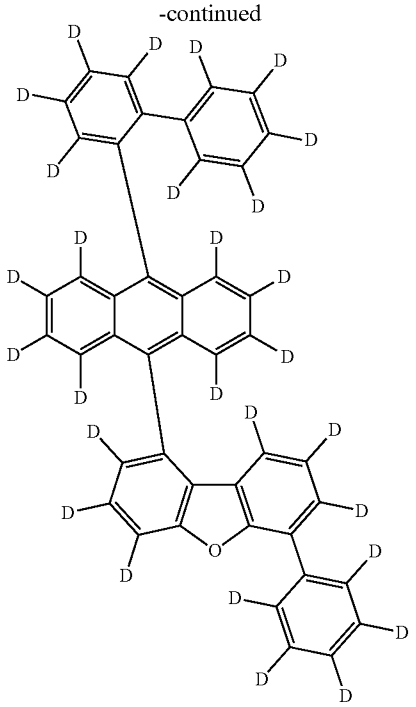

The specific substituents in Formula 1 can be clearly seen from the structures of the compounds 1-2.

As described above, the compounds have various polycyclic ring structures and characteristic substituents introduced at specific positions of the polycyclic ring structures. The compounds can be used to synthesize organic materials having inherent characteristics of the skeleton structures and the introduced substituents. The use of the organic materials for light emitting layers of organic electroluminescent devices makes the devices highly efficiency and long lasting.

In addition, the compound, whose structure is characterized by a boron-containing moiety and which has a polycyclic skeleton structure, and the anthracene derivative including one or more deuterium atoms in its anthracene skeleton can be used as a dopant and a host in a light emitting layer of an organic electroluminescent device, respectively. In this case, the device has high efficiency and long lifetime as well as improved performance.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer.

According to a preferred embodiment of the present invention, one of the organic layers interposed between the first and second electrodes may be a light emitting layer. The light emitting layer may be composed of a host and a dopant. The light emitting layer may include the compound represented by Formula A-1 as a dopant and the compound represented by Formula 1 as a host.

A specific structure of the organic electroluminescent device according to one embodiment of the present invention, a method for fabricating the device, and materials for the organic layers are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide (SnO2) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexacarbonitrile (HAT-CN).

The hole transport material is not specially limited so long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine ($\alpha$-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, TAZ, BeBq2, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebg2), and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

The present invention will be explained more specifically with reference to the following examples. However, it will be obvious to those skilled in the art that these examples are in no way intended to limit the scope of the invention and many variations and modifications can be made without departing the scope and spirit of the invention.

SYNTHESIS EXAMPLE 1: SYNTHESIS OF 9

Synthesis Example 1-1: Synthesis of A-1

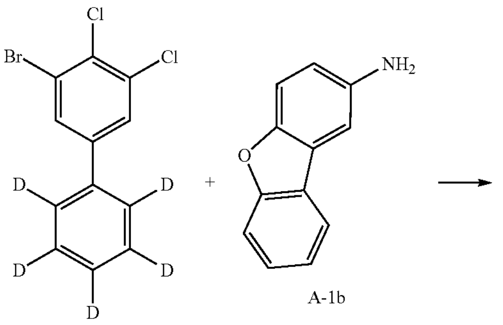

A-1a A-1b

-continued

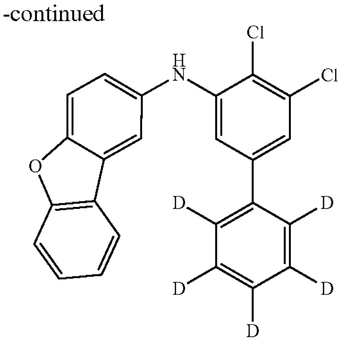

A-1

30 g of A-1a, 16.1 g of A-1b, 1.79 g of tris(dibenzylideneacetone)dipalladium(0), 1.22 g of bis(diphenylphosphino)-1,1'-binaphthyl, 18.8 g of sodium tert-butoxide, and 400 mL of toluene were placed in a reactor. The mixture was stirred under reflux for 3 h. The reaction mixture was cooled to room temperature and ethyl acetate and water were added thereto. The organic layer was separated and purified by silica gel chromatography to afford A-1 (29.2 g, 73.1%).

Synthesis Example 1-2: Synthesis of A-2

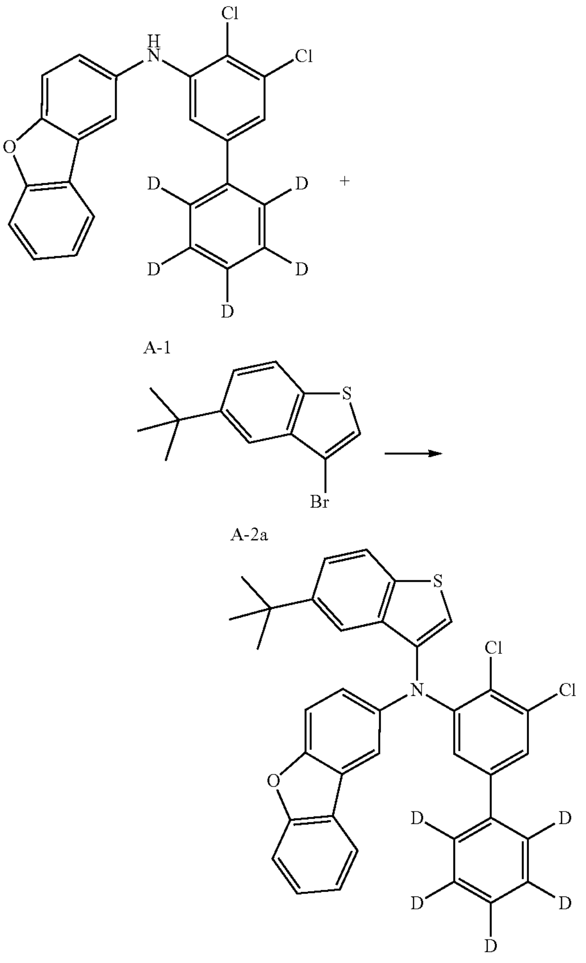

A-1 A-2a A-2

20 g of A-1, 14.5 g of A-2a, 0.5 g of bis(tri-tert-butylphosphine)palladium(0), 7 g of sodium tert-butoxide, and 300 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-2 (18.5 g, 63.4%).

Synthesis Example 1-3: Synthesis of A-3

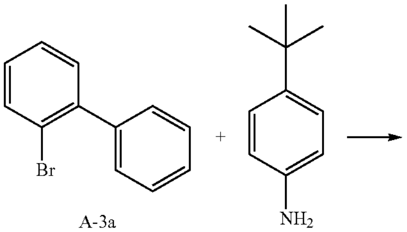

A-3a

A-3b

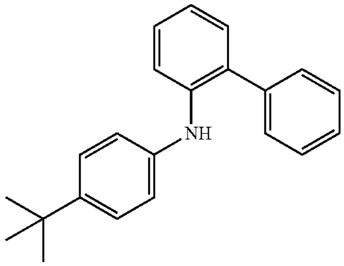

A-3

A-3 (yield 85.1%) was synthesized in the same manner as in Synthesis Example 1-1, except that A-3a and A-3b were used instead of A-1a and A-1b, respectively.

Synthesis Example 1-4: Synthesis of A-4

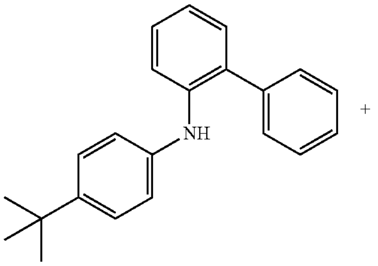

A-3

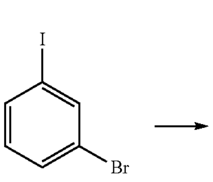

A-4a

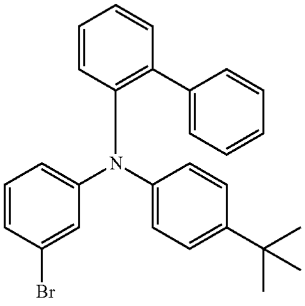

A-4

50 g of A-3, 56.3 g of A-4a, 0.4 g of palladium(II) acetate, 23.9 g of sodium tert-butoxide, 1 g of Xantphos, and 500 mL of toluene were placed in a reactor. The mixture was stirred under reflux for 16 h. The reaction mixture was cooled to room temperature and ethyl acetate and water were added thereto. The organic layer was separated and purified by silica gel chromatography to afford A-4 (35 g, 46.2%).

Synthesis Example 1-5: Synthesis of A-5

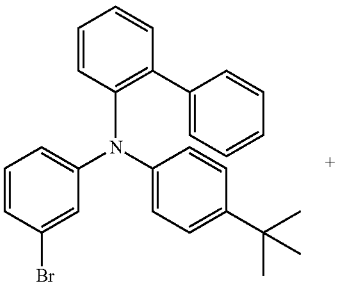

A-4

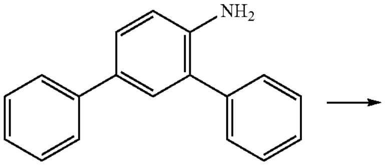

A-5a

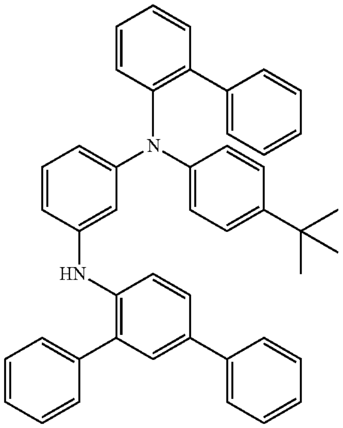

A-5

A-5 (yield 82.3%) was synthesized in the same manner as in Synthesis Example 1-1, except that A-4 and A-5a were used instead of A-1a and A-1b, respectively.

Synthesis Example 1-6: Synthesis of A-6

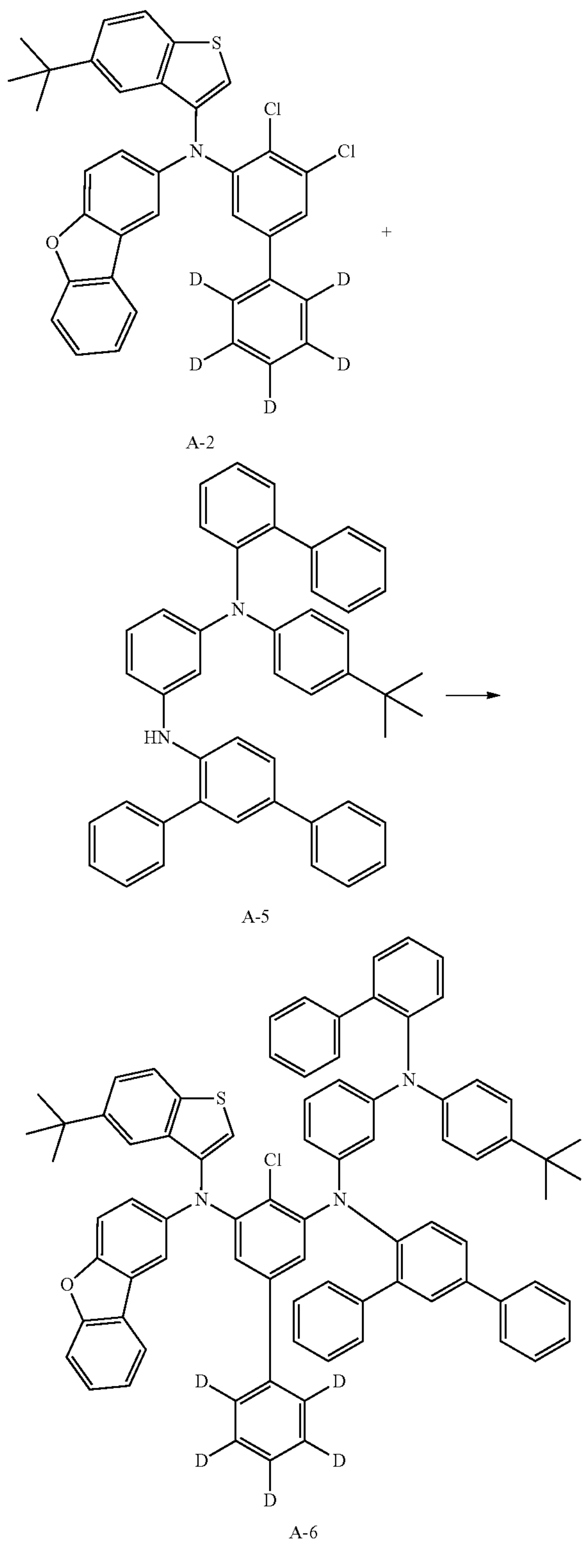

A-2, A-5, A-6

A-6 (yield 93%) was synthesized in the same manner as in Synthesis Example 1-2, except that A-5 and A-2 were used instead of A-1 and A-2a, respectively.

Synthesis Example 1-7: Synthesis of 9

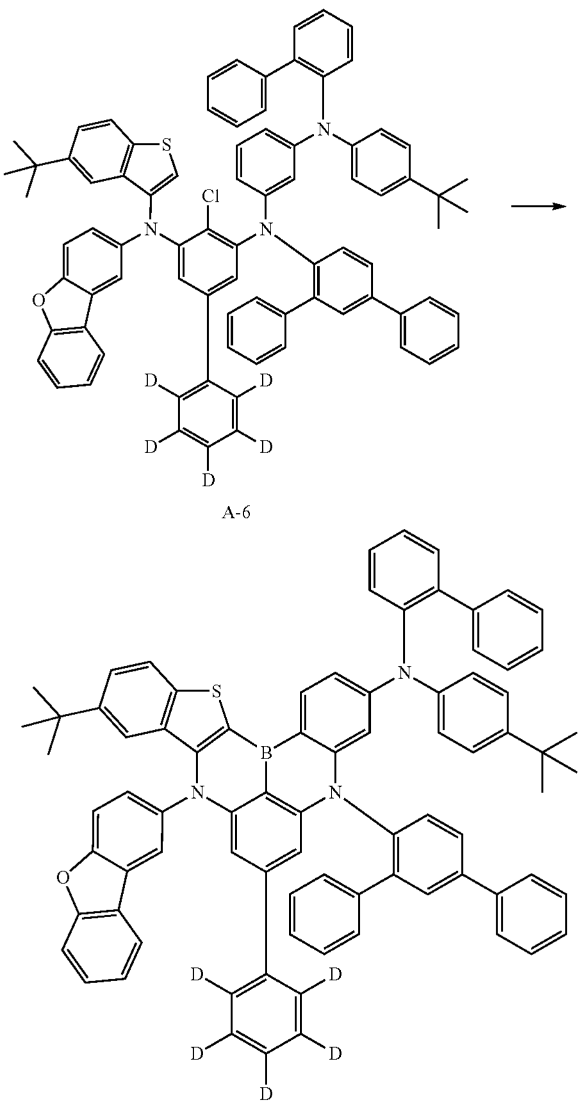

A-6, 9

40 g of A-6 and 480 mL of tert-butylbenzene were placed in a reactor and 60 mL of a 1.7 M tert-butyllithium pentane solution was added dropwise thereto at −78° C. The mixture was heated to 60° C., followed by stirring for 2 h. Then, nitrogen at 60° C. was blown into the mixture to completely remove pentane. After cooling to −78° C., 7 mL of boron tribromide was added dropwise. The resulting mixture was allowed to warm to room temperature, followed by stirring for 2 h. After cooling to 0° C., 12 mL of N,N-diisopropylethylamine was added dropwise. The mixture was heated to 120° C., followed by stirring for 16 h. The reaction mixture was cooled to room temperature and a 10% aqueous solution of sodium acetate and ethyl acetate were added thereto. The organic layer was separated, concentrated under reduced pressure, and purified by silica gel chromatography to afford 9 (5 g, 12.8%).

MS (MALDI-TOF): m/z 1154.52 [$M^+$]

SYNTHESIS EXAMPLE 2: SYNTHESIS OF 10

Synthesis Example 2-1: Synthesis of B-1

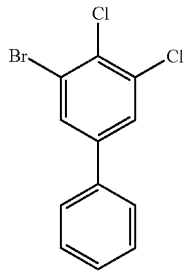
B-1a

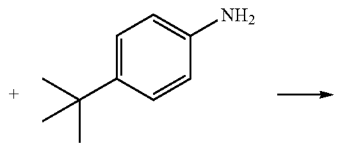
A-3b

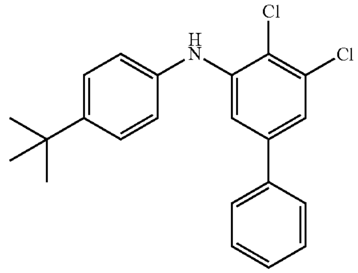
B-1

B-1 (yield 74.8%) was synthesized in the same manner as in Synthesis Example 1-1, except that B-1a and A-3b were used instead of A-1a and A-1b, respectively.

Synthesis Example 2-2: Synthesis of B-2

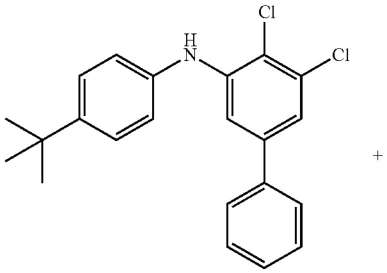
B-1

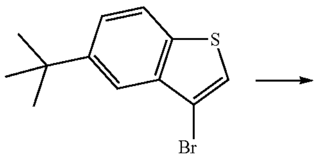
A-2a

-continued

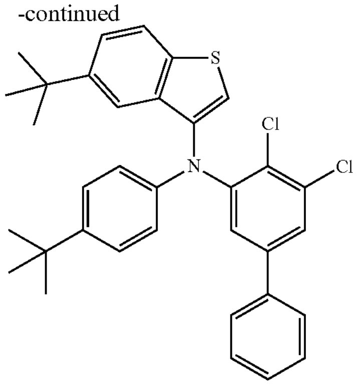
B-2

B-2 (yield 88.7%) was synthesized in the same manner as in Synthesis Example 1-2, except that B-1 was used instead of A-1.

Synthesis Example 2-3: Synthesis of B-3

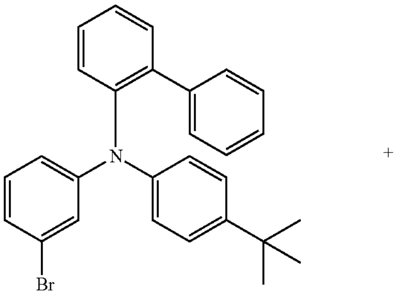
A-4

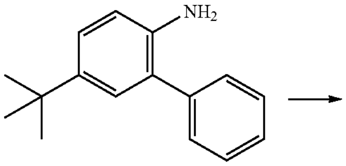
B-3a

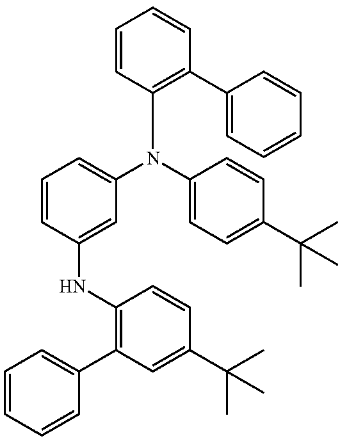
B-3

B-3 (yield 89.4%) was synthesized in the same manner as in Synthesis Example 1-5, except that B-3a was used instead of A-5a.

Synthesis Example 2-4: Synthesis of B-4

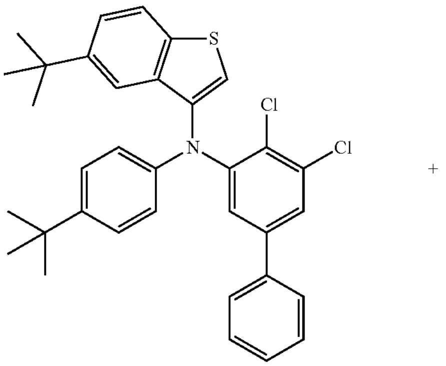

B-2

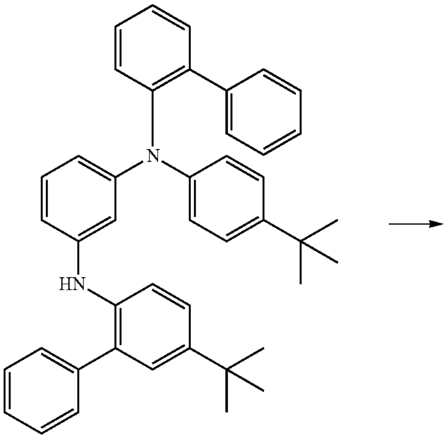

B-3

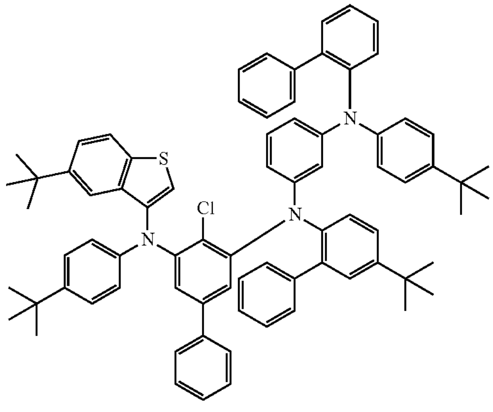

B-4

B-4 (yield 94.2%) was synthesized in the same manner as in Synthesis Example 1-6, except that B-2 and B-3 were used instead of A-2 and A-5, respectively.

Synthesis Example 2-5: Synthesis of 10

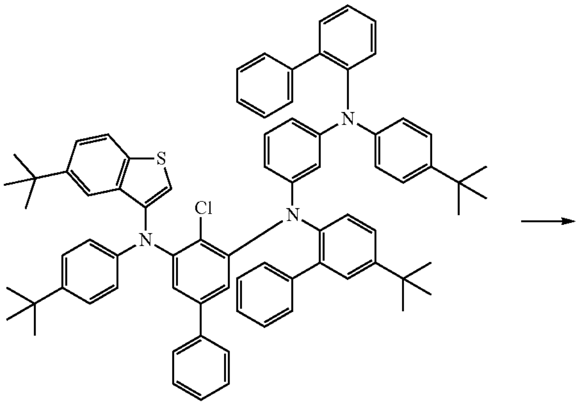

B-4

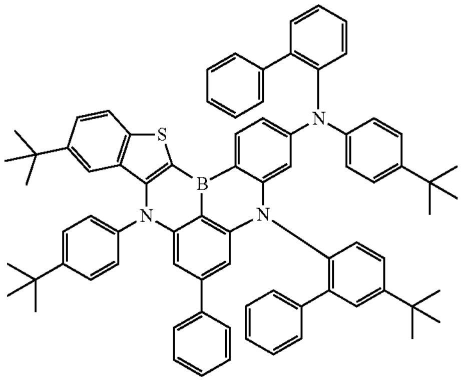

10

10 (yield 11.4%) was synthesized in the same manner as in Synthesis Example 1-7, except that B-4 was used instead of A-6.

MS (MALDI-TOF): m/z 1095.57 [$M^+$]

SYNTHESIS EXAMPLE 3: SYNTHESIS OF 13

13 (yield 12.5%) was synthesized in the same manner as in Synthesis Example 2, except that (1,1'-biphenyl)-4-amine was used instead of A-3b in Synthesis Example 2-1.

MS (MALDI-TOF): m/z 1115.54 [$M^+$]

SYNTHESIS EXAMPLE 4: SYNTHESIS OF 14

Synthesis Example 4-1: Synthesis of C-1

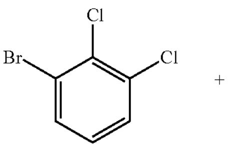

C-1a

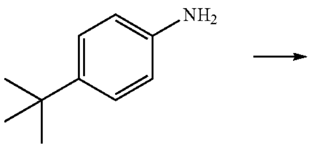

A-3b

-continued

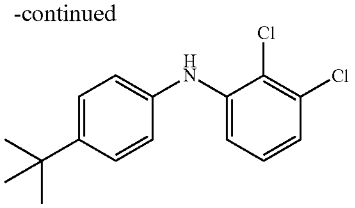

C-1

C-1 (yield 72.1%) was synthesized in the same manner as in Synthesis Example 2-1, except that C-1a was used instead of B-1a.

Synthesis Example 4-2: Synthesis of C-2

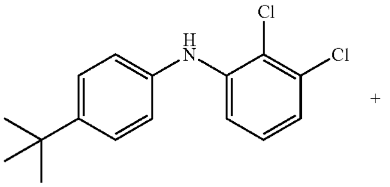

C-1

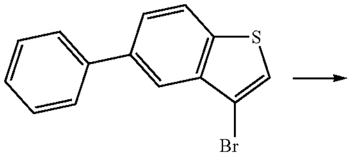

C-2a

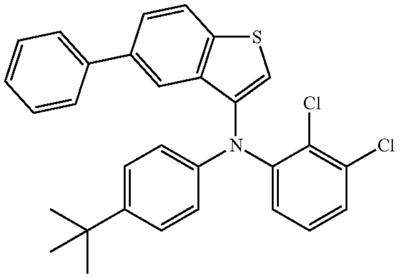

C-2

C-2 (yield 95.3%) was synthesized in the same manner as in Synthesis Example 1-2, except that C-1 and C-2a were used instead of A-1 and A-2a, respectively.

Synthesis Example 4-3: Synthesis of C-3

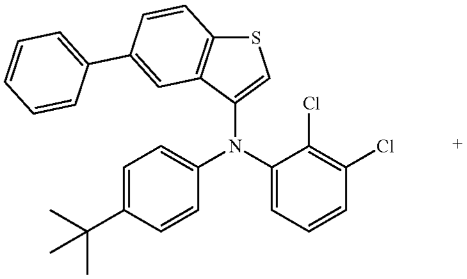

C-2

-continued

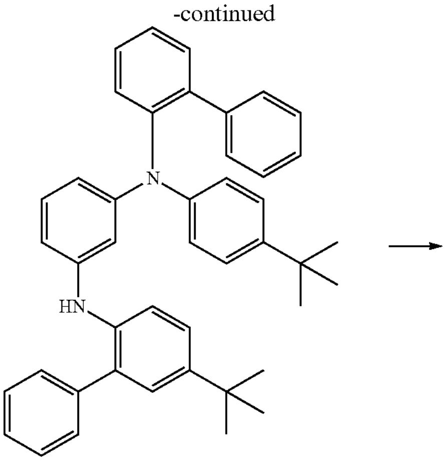

B-3

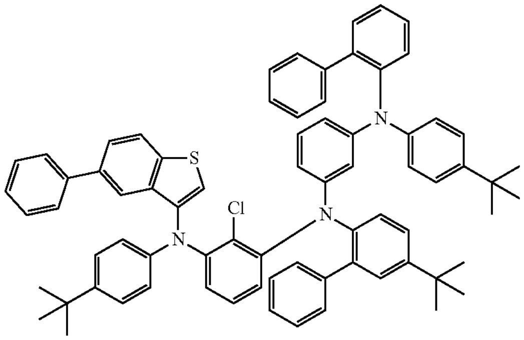

C-3

C-3 (yield 93.7%) was synthesized in the same manner as in Synthesis Example 2-4, except that C-2 was used instead of B-2.

Synthesis Example 4-4: Synthesis of 14

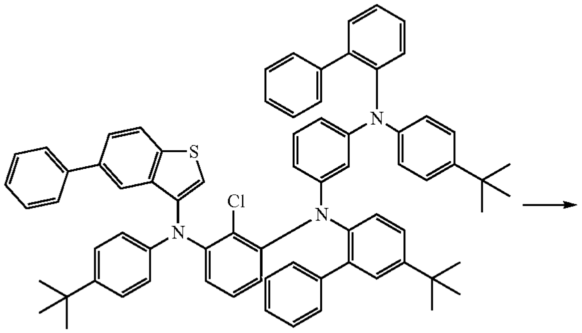

C-3

-continued

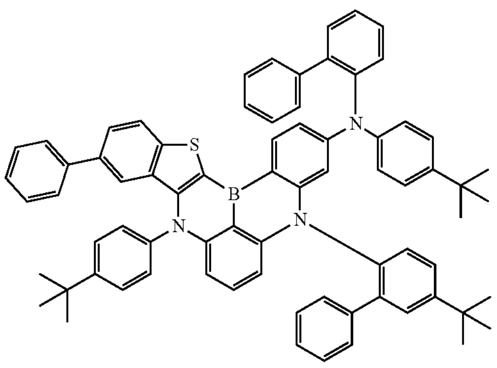

14

14 (yield 11.4%) was synthesized in the same manner as in Synthesis Example 1-7, except that C-3 was used instead of A-6.

MS (MALDI-TOF): m/z 1039.51 [$M^+$]

SYNTHESIS EXAMPLE 5: SYNTHESIS OF 18

Synthesis Example 5-1: Synthesis of D-1

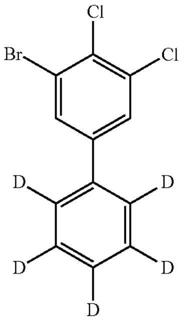

A-1a

+

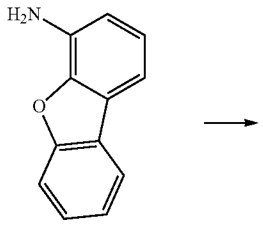

D-1a

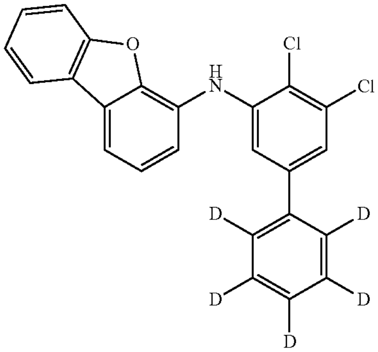

D-1

D-1 (yield 72.8%) was synthesized in the same manner as in Synthesis Example 1-1, except that D-1a was used instead of A-1b.

Synthesis Example 5-2: Synthesis of D-2

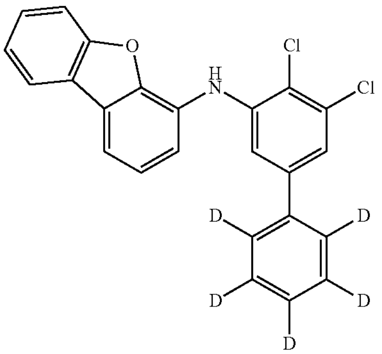

D-1

+

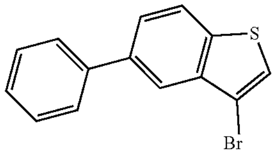

C-2a

+

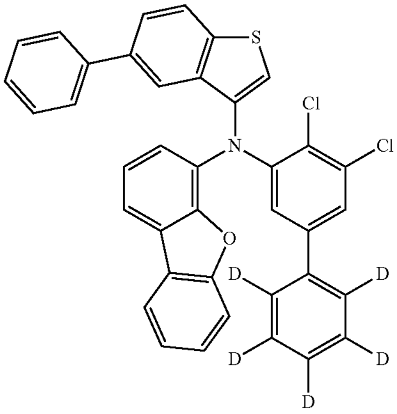

D-2

D-2 (yield 93.1%) was synthesized in the same manner as in Synthesis Example 4-2, except that D-1 was used instead of C-1.

Synthesis Example 5-3: Synthesis of D-3

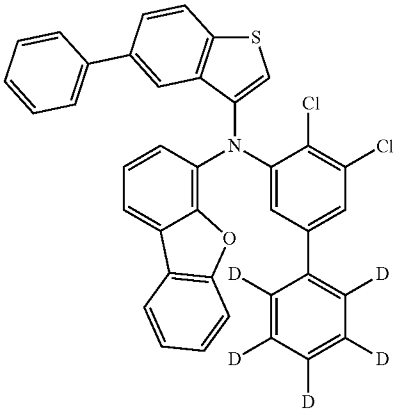

D-2

+

-continued
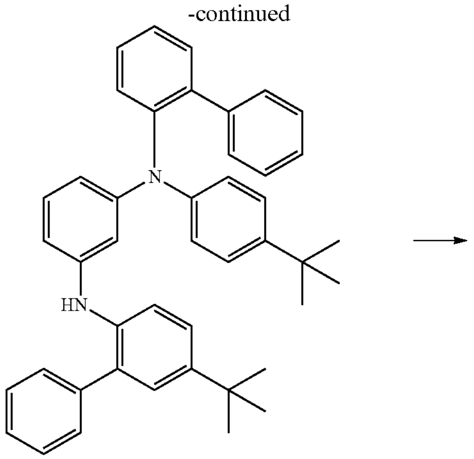
B-3
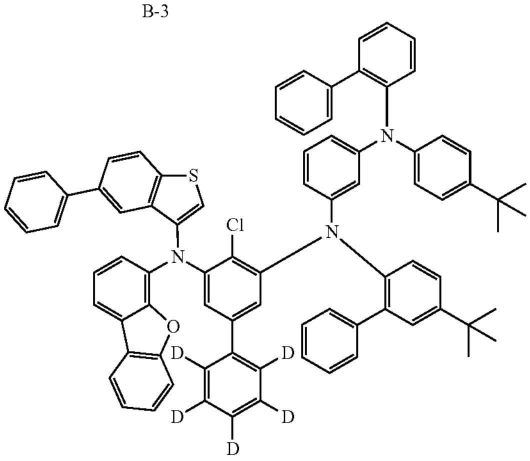
D-3
D-3 (yield 93.7%) was synthesized in the same manner as in Synthesis Example 2-4, except that D-2 was used instead of B-2.
Synthesis Example 5-4: Synthesis of 18
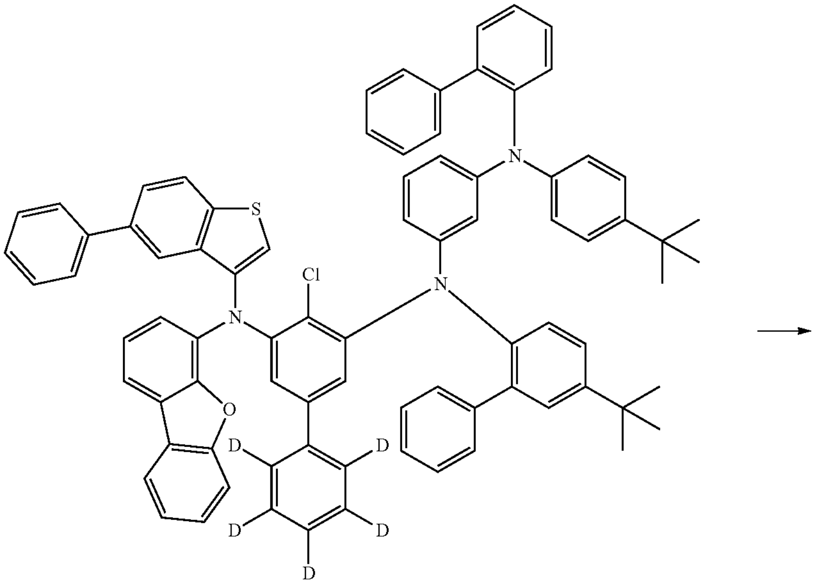
D-3

-continued
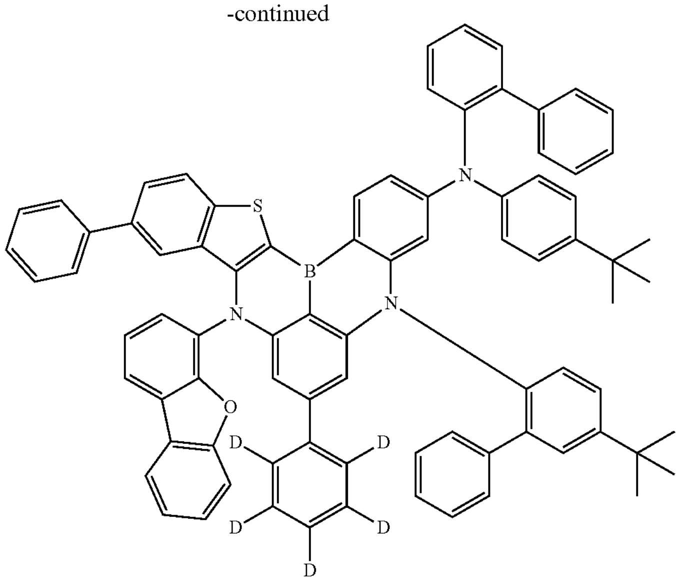
18
18 (yield 11.4%) was synthesized in the same manner as in Synthesis Example 1-7, except that D-3 was used instead of A-6.
MS (MALDI-TOF): m/z 1154.52 [$M^+$]
SYNTHESIS EXAMPLE 6: SYNTHESIS OF 31
Synthesis Example 6-1: Synthesis of E-1
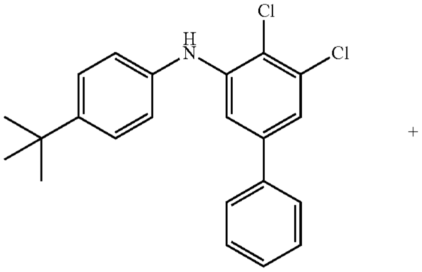
B-1
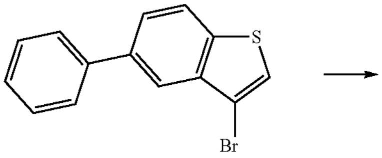
C-2a
-continued
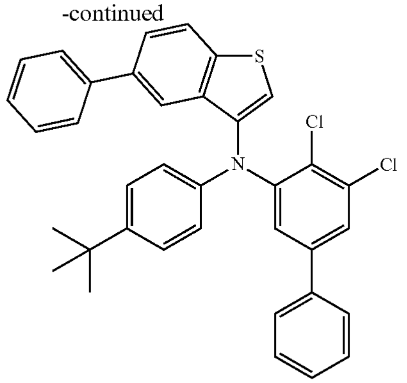
E-1
E-1 (yield 95.1%) was synthesized in the same manner as in Synthesis Example 2-2, except that C-2a was used instead of A-2a.
Synthesis Example 6-2: Synthesis of E-2
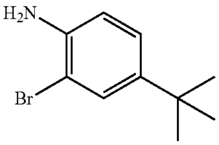
E-2a
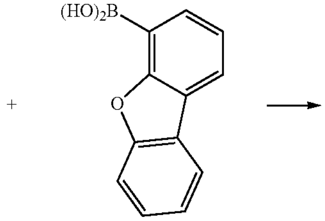
E-2b -continued

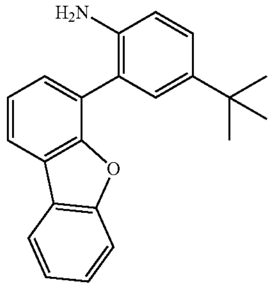

E-2

60 g of E-2a, 66.9 g of E-2b, 15.2 g of tetrakis(triphenylphosphine)palladium, 109.1 g of potassium carbonate, 300 mL of toluene, 180 mL of ethanol, and 180 mL of water were placed in a reactor. The mixture was stirred under reflux for 16 h. The reaction mixture was cooled to room temperature and ethyl acetate and water were added thereto. The organic layer was separated and purified by silica gel chromatography to afford E-2 (44.5 g, 75%).

Synthesis Example 6-3: Synthesis of E-3

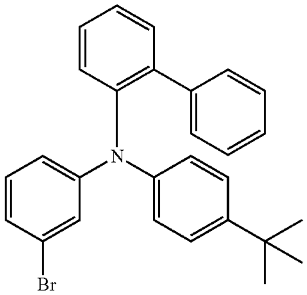

A-4

+

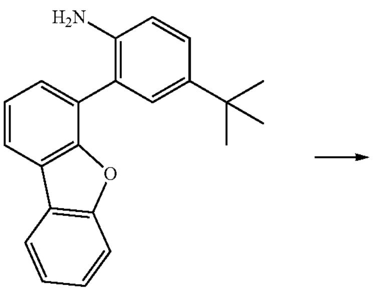

E-2

-continued

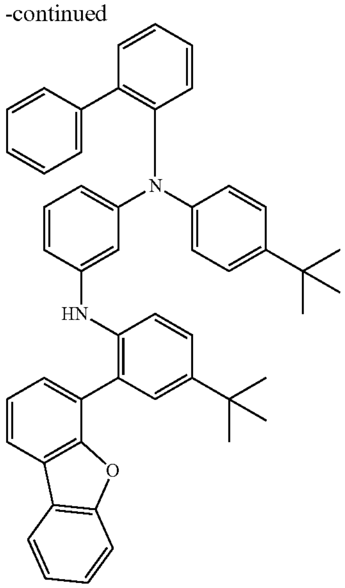

E-3

E-3 (yield 79.2%) was synthesized in the same manner as in Synthesis Example 1-5, except that E-2 was used instead of A-5a.

Synthesis Example 6-4: Synthesis of E-4

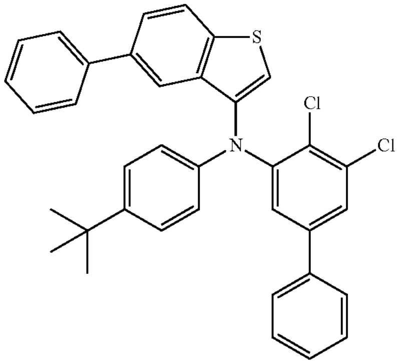

+

E-1

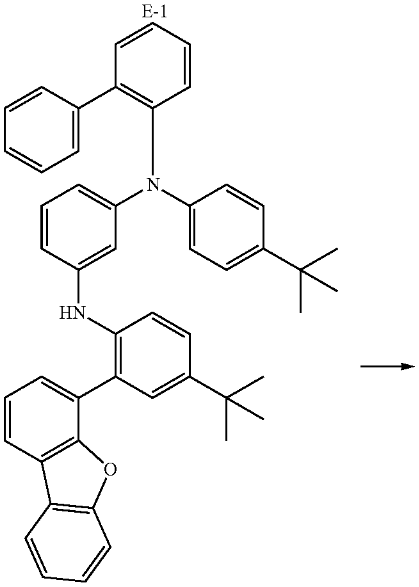

E-3

-continued

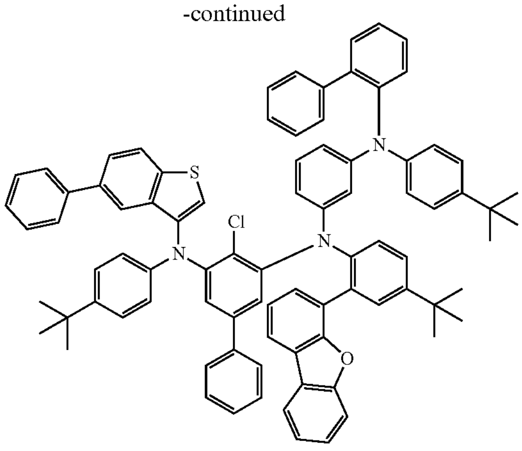

E-4

E-4 (yield 91.6%) was synthesized in the same manner as in Synthesis Example 1-6, except that E-1 and E-3 were used instead of A-2 and A-5, respectively.

Synthesis Example 6-5: Synthesis of 31

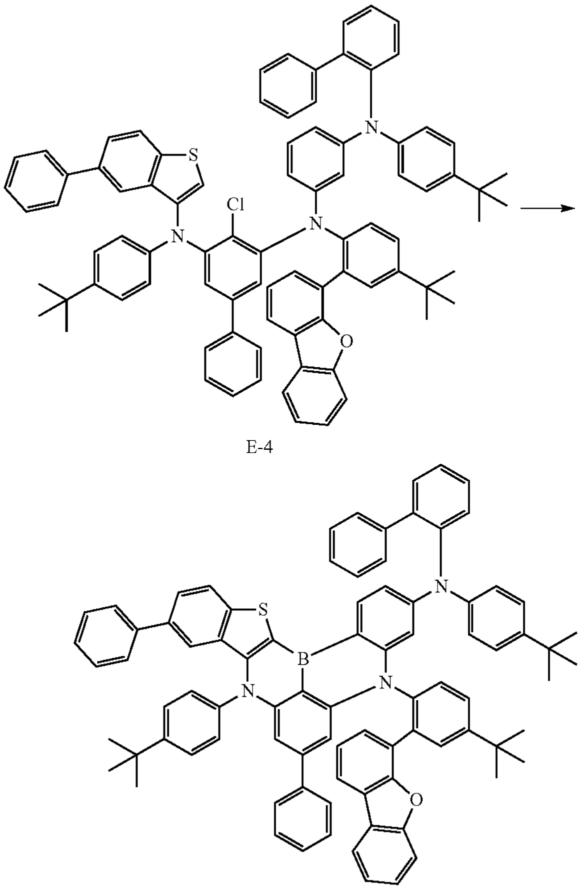

E-4

31

31 (yield 11.4%) was synthesized in the same manner as in Synthesis Example 1-7, except that E-4 was used instead of A-6.

MS (MALDI-TOF): m/z 1205.55 [M+]

SYNTHESIS EXAMPLE 7: SYNTHESIS OF 36

Synthesis Example 7-1: Synthesis of F-1

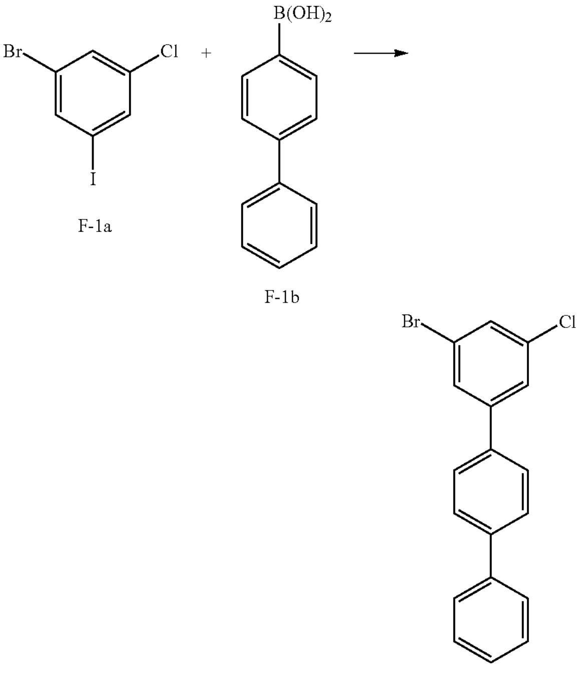

F-1a

F-1b

F-1

F-1 (yield 81%) was synthesized in the same manner as in Synthesis Example 6-2, except that F-1a and F-1b were used instead of E-2a and E-2b, respectively.

Synthesis Example 7-2: Synthesis of F-2

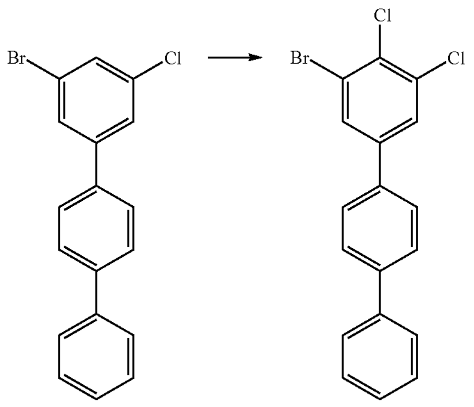

F-1

F-2

53.1 g of F-1 and 424 mL of tetrahydrofuran were placed in a reactor and 116 mL of a 2.0 M lithium diisopropylamide solution was added dropwise thereto at −78° C. After stirring at −78° C. for 2 h, hexachloroethane was slowly added. The mixture was allowed to warm to room temperature, followed by stirring. To the reaction mixture were added ethyl acetate and water. The organic layer was separated and purified by silica gel chromatography to afford F-2 (19 g, 32%).

Synthesis Example 7-3: Synthesis of F-3

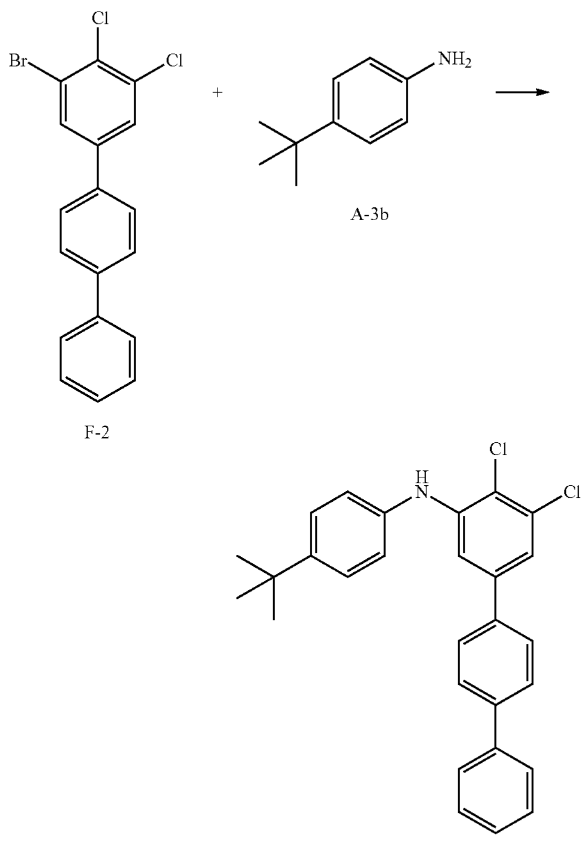

F-2

A-3b

F-3

F-3 (yield 72.5%) was synthesized in the same manner as in Synthesis Example 2-1, except that F-2 was used instead of B-1a.

Synthesis Example 7-4: Synthesis of F-4

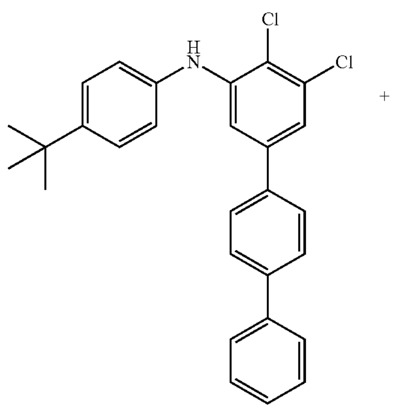

F-3

-continued

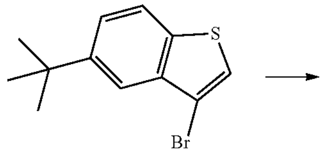

A-2a

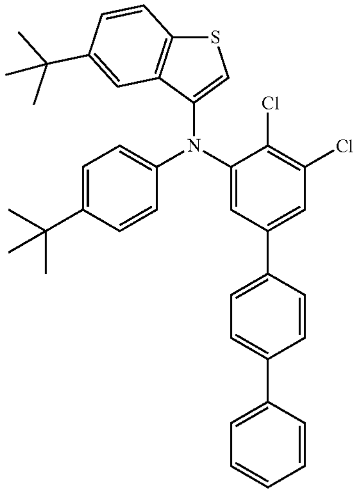

F-4

F-4 (yield 73.7%) was synthesized in the same manner as in Synthesis Example 1-2, except that F-3 was used instead of A-1.

Synthesis Example 7-5: Synthesis of F-5

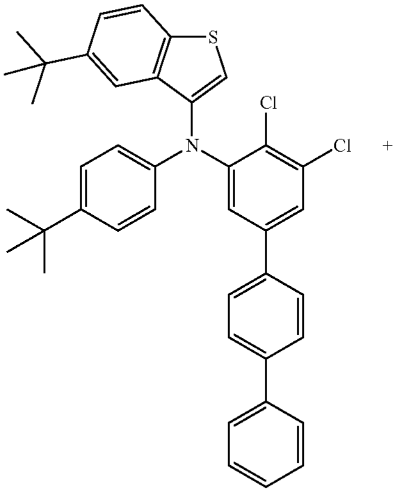

F-4

-continued

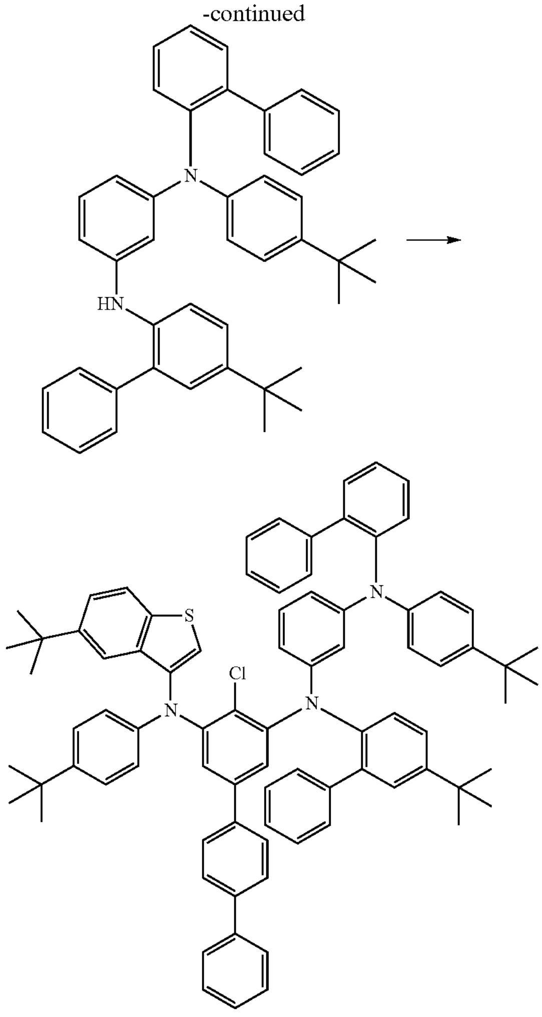

F-5

F-5 (yield 93.3%) was synthesized in the same manner as in Synthesis Example 1-6, except that F-4 and B-3 were used instead of A-2 and A-5, respectively.

Synthesis Example 7-6: Synthesis of 36

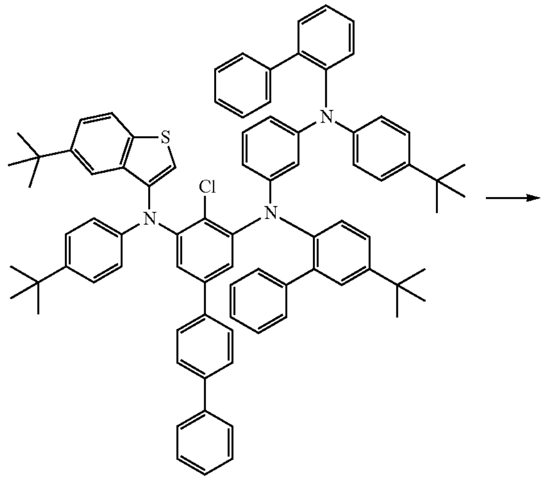

F-5

-continued

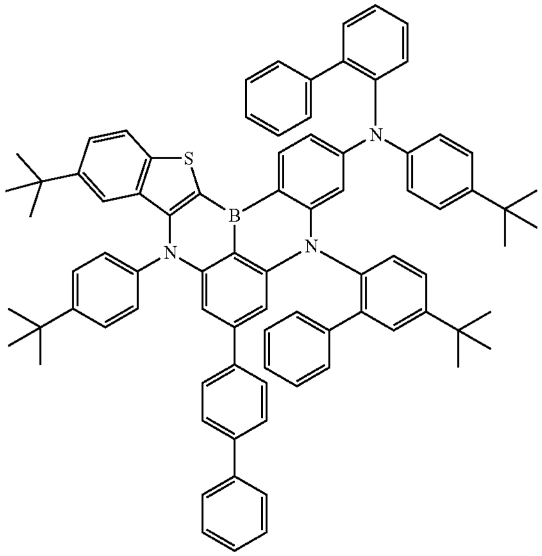

36

36 (yield 12.1%) was synthesized in the same manner as in Synthesis Example 1-7, except that F-5 was used instead of A-6.

MS (MALDI-TOF): m/z 1171.60 [$M^+$]

SYNTHESIS EXAMPLE 8: SYNTHESIS OF 61

Synthesis Example 8-1: Synthesis of G-1

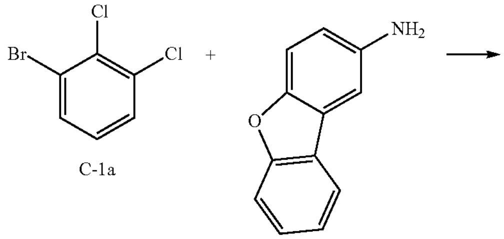

C-1a

A-1b

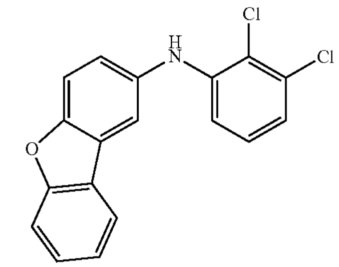

G-1

G-1 (yield 72.7%) was synthesized in the same manner as in Synthesis Example 1-1, except that C-1a was used instead of A-1a.

Synthesis Example 8-2: Synthesis of G-2
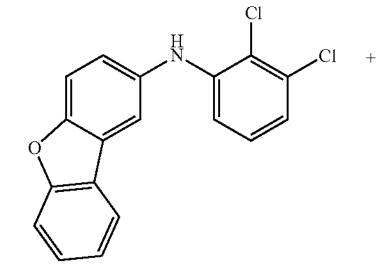
G-1
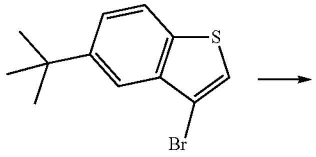
A-2a
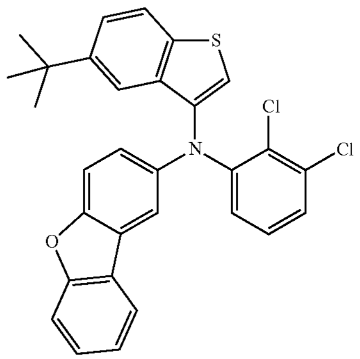
G-2
G-2 (yield 65.8%) was synthesized in the same manner as in Synthesis Example 1-2, except that G-1 was used instead of A-1.
Synthesis Example 8-3: Synthesis of G-3
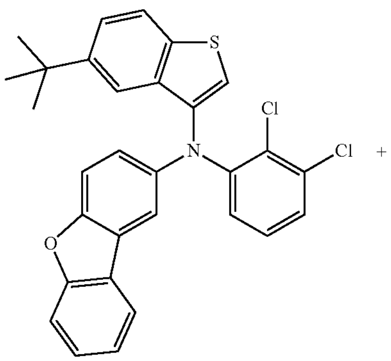
G-2
-continued
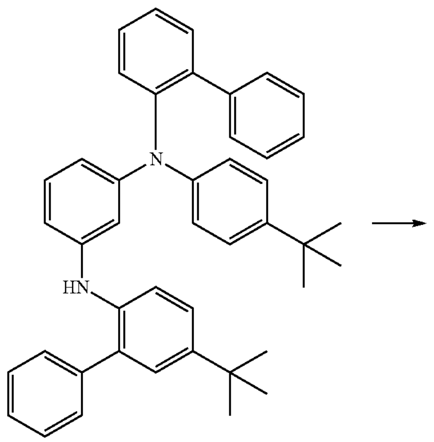
B-3
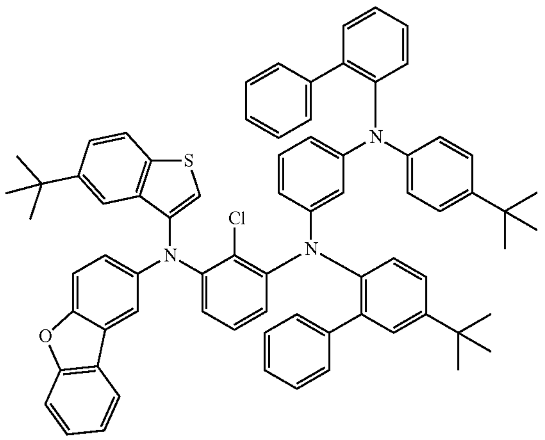
G-3
G-3 (yield 92.8%) was synthesized in the same manner as in Synthesis Example 2-4, except that G-2 was used instead of B-2.
Synthesis Example 8-4: Synthesis of 61
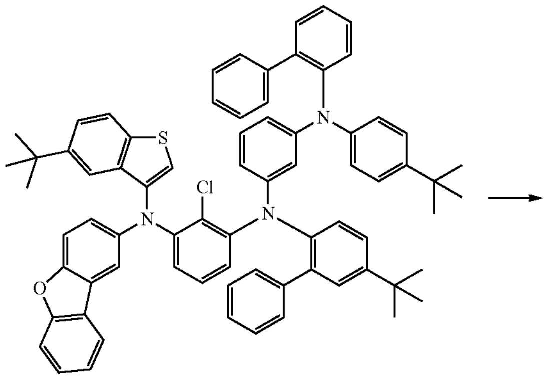
G-3

-continued

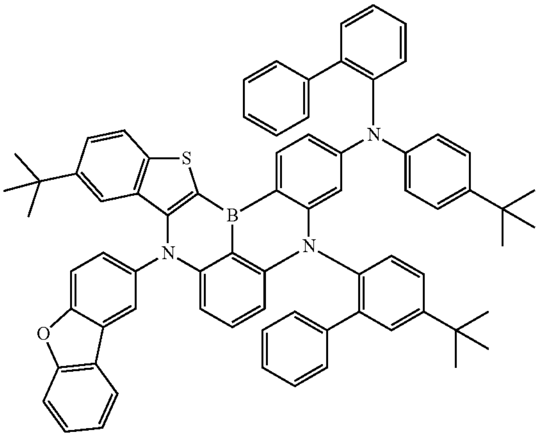

61

61 (yield 12.2%) was synthesized in the same manner as in Synthesis Example 1-7, except that G-3 was used instead of A-6.

MS (MALDI-TOF): m/z 1053.49 [$M^+$]

SYNTHESIS EXAMPLE 9: SYNTHESIS OF 70

Synthesis Example 9-1: Synthesis of H-1

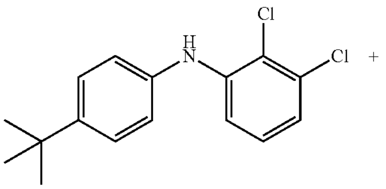

C-1

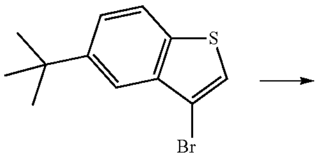

A-2a

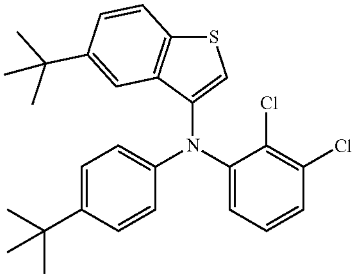

H-1

H-1 (yield 86.4%) was synthesized in the same manner as in Synthesis Example 1-2, except that C-1 was used instead of A-1.

Synthesis Example 9-2: Synthesis of H-2

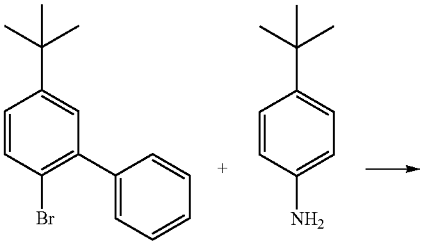

H-2a A-3b

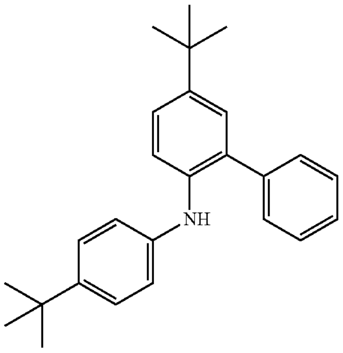

H-2

H-2 (yield 84.7%) was synthesized in the same manner as in Synthesis Example 1-3, except that H-2a was used instead of A-3a.

Synthesis Example 9-3: Synthesis of H-3

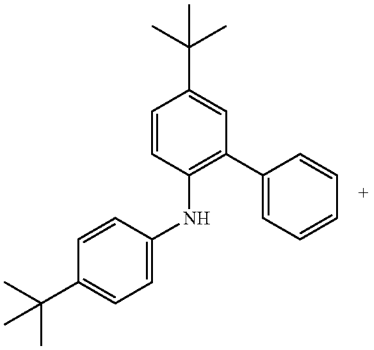

H-2

-continued
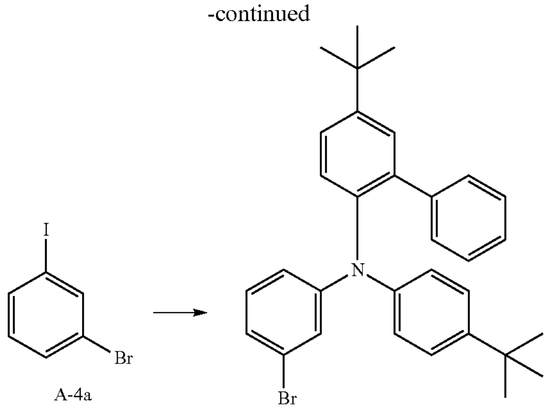
A-4a
H-3
H-3 (yield 47.3%) was synthesized in the same manner as in Synthesis Example 1-4, except that H-2 was used instead of A-3.
Synthesis Example 9-4: Synthesis of H-4
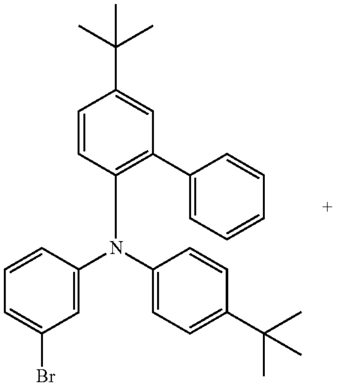
H-3
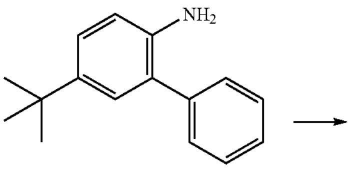
B-3a
-continued
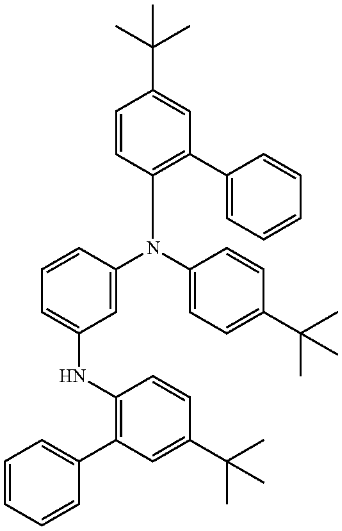
H-4
H-4 (yield 88.2%) was synthesized in the same manner as in Synthesis Example 2-3, except that H-3 was used instead of A-4.
Synthesis Example 9-5: Synthesis of H-5
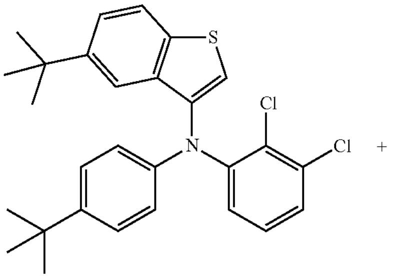
H-1
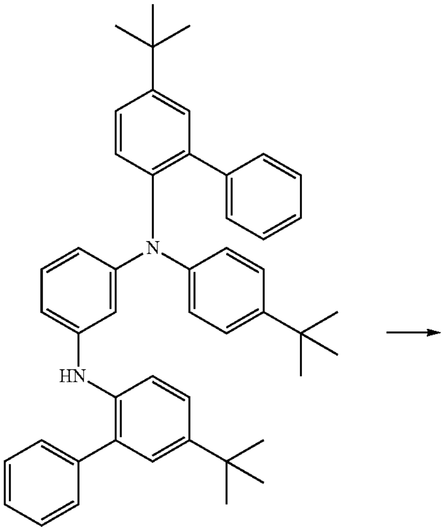
H-4

-continued

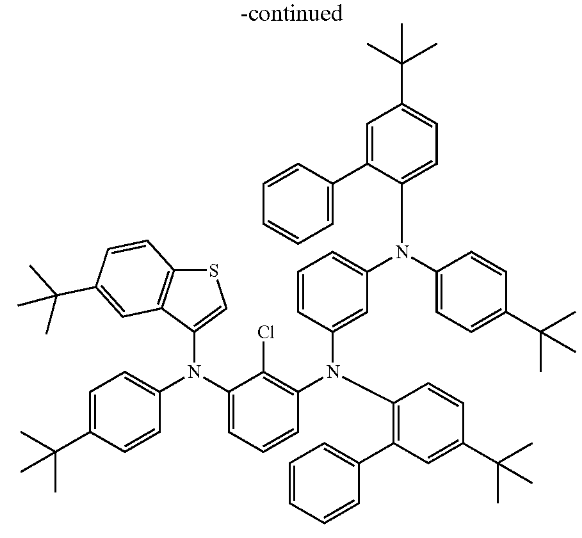

H-5

H-5 (yield 92.3%) was synthesized in the same manner as in Synthesis Example 1-6, except that H-1 and H-4 were used instead of A-2 and A-5, respectively.

Synthesis Example 9-6: Synthesis of 70

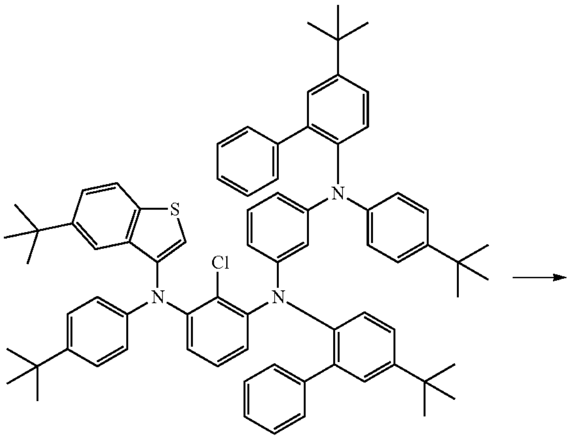

H-5

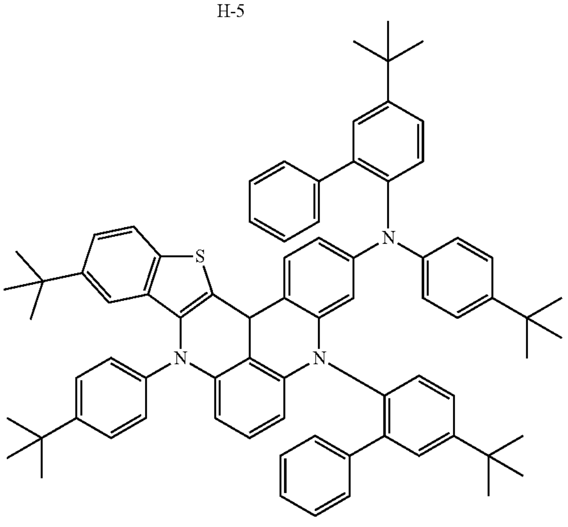

70

70 (yield 12.1%) was synthesized in the same manner as in Synthesis Example 1-7, except that H-5 was used instead of A-6.

MS (MALDI-TOF): m/z 1075.60 [$M^+$]

EXAMPLES 1-9: FABRICATION OF ORGANIC ELECTROLUMINESCENT DEVICES

ITO glass was patterned to have a light emitting area of 2 mm×2 mm, followed by cleaning. After the cleaned ITO glass was mounted in a vacuum chamber, the base pressure was adjusted to $1\times10^{-7}$ torr. The compound represented by Acceptor-1 as an electron acceptor and the compound represented by Formula F were deposited in a ratio of 2:98 on the ITO to form a 100 Å thick hole injecting layer. The compound represented by Formula F was used to form a 550 Å thick hole transport layer. Subsequently, the compound represented by Formula G was used to form a 50 Å thick electron blocking layer. A mixture of the host represented by BH-1 and the inventive compound (2 wt %) shown in Table 1 was used to form a 200 Å thick light emitting layer. Thereafter, the compound represented by Formula H was used to form a 50 Å hole blocking layer on the light emitting layer. A mixture of the compound represented by Formula E-1 and the compound represented by Formula E-2 in a ratio of 1:1 was used to form a 250 Å thick electron transport layer on the hole blocking layer. The compound represented by Formula E-2 was used to form a 10 Å thick electron injection layer on the electron transport layer. Al was used to form a 1000 Å thick Al electrode on the electron injection layer, completing the fabrication of an organic electroluminescent device. The luminescent properties of the organic electroluminescent device were measured at 0.4 mA.

[Formula F]

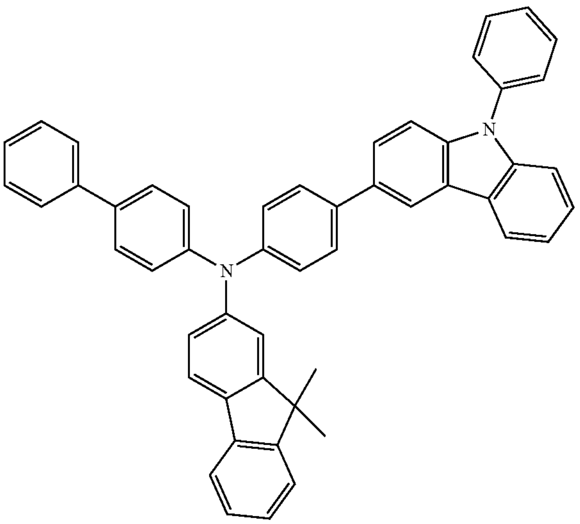

-continued

[Formula G]

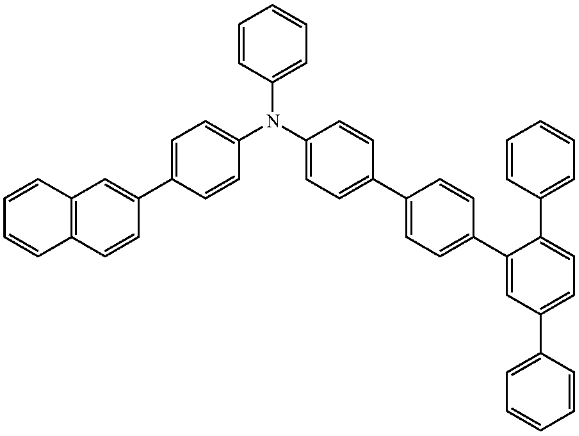

[Formula H]

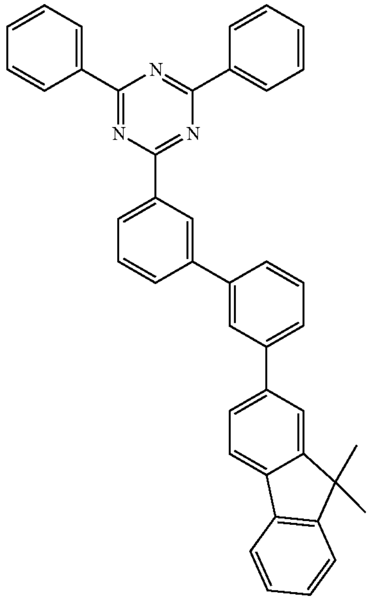

[Formula E-1]

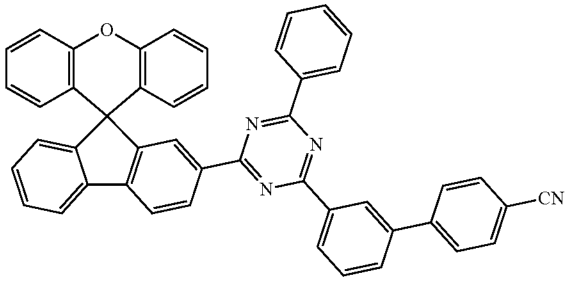

[Formula E-2]

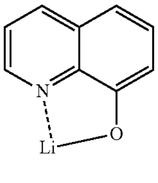

-continued

[Acceptor-1]

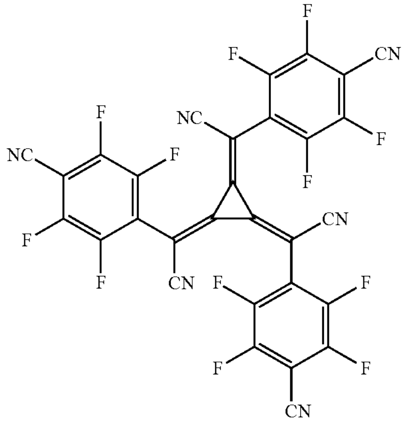

[BH-1]

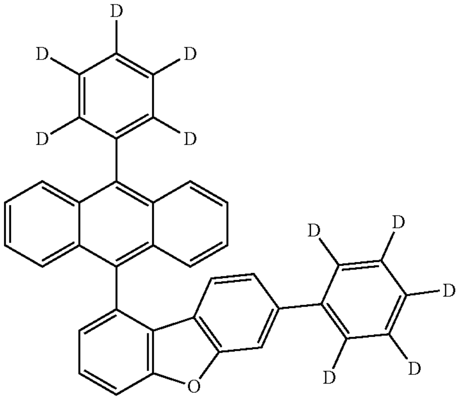

COMPARATIVE EXAMPLES 1-5

Organic electroluminescent devices were fabricated in the same manner as in Examples 1-9, except that BD1, BD2, BD3, BD4 or BD5 was used as a dopant instead of the inventive compound. The luminescent properties of the organic electroluminescent devices were measured at 0.4 mA. The structures of BD1 to BD5 are as follow:

[BD1]
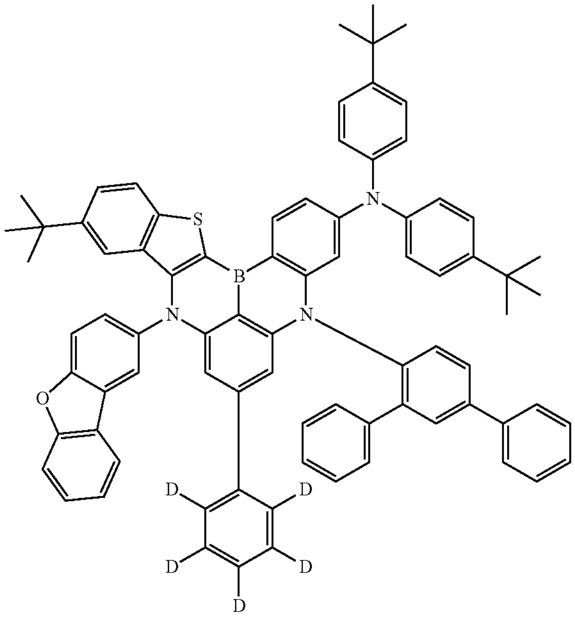
[BD2]
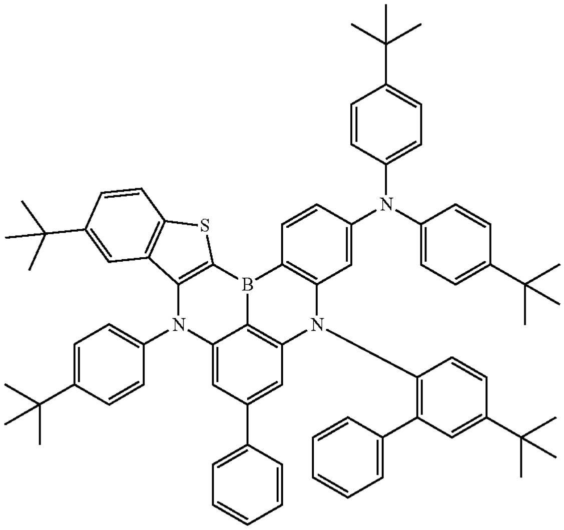
-continued
[BD3]
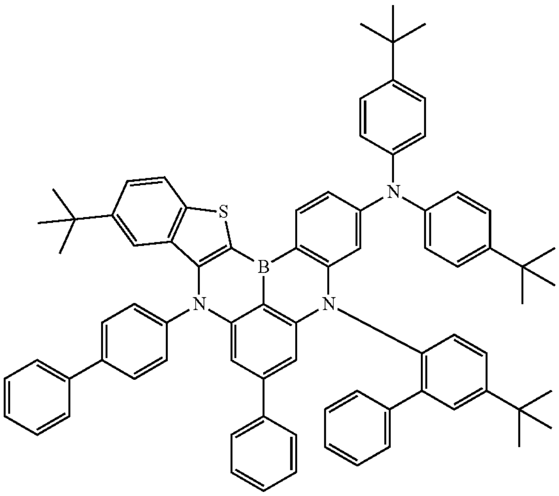
[BD4]
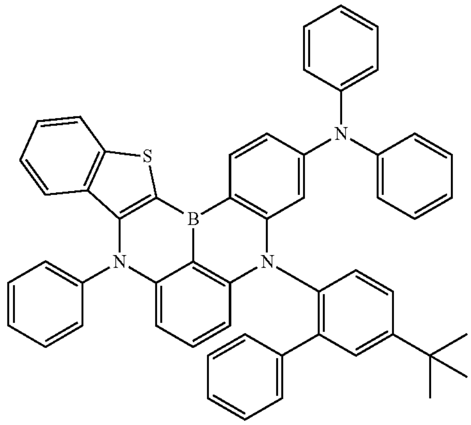
[BD5]
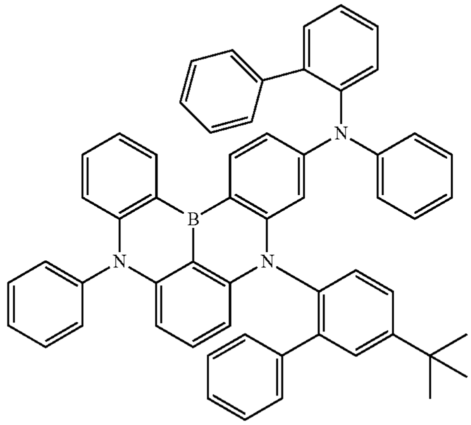
The organic electroluminescent devices of Examples 1-9 and Comparative Examples 1-5 were measured for voltage, external quantum efficiency, and lifetime. The results are shown in Table 1.
TABLE 1
| Example No. | Host | Dopant | Voltage (V) | Efficiency (EQE, %) | Lifetime (T97, hr) |
|---|---|---|---|---|---|
| Example 1 | BH-1 | 9 | 3.4 | 10.83 | 240 |
| Example 2 | BH-1 | 10 | 3.4 | 11.71 | 250 |

TABLE 1-continued

| Example No. | Host | Dopant | Voltage (V) | Efficiency (EQE, %) | Lifetime (T97, hr) |
|---|---|---|---|---|---|
| Example 3 | BH-1 | 13 | 3.4 | 10.71 | 235 |
| Example 4 | BH-1 | 14 | 3.4 | 11.53 | 290 |
| Example 5 | BH-1 | 18 | 3.4 | 10.58 | 273 |
| Example 6 | BH-1 | 31 | 3.4 | 10.64 | 221 |
| Example 7 | BH-1 | 36 | 3.4 | 10.38 | 237 |
| Example 8 | BH-1 | 61 | 3.4 | 10.66 | 240 |
| Example 9 | BH-1 | 70 | 3.4 | 10.91 | 261 |
| Comparative Example 1 | BH-1 | BD-1 | 3.4 | 9.62 | 190 |
| Comparative Example 2 | BH-1 | BD-2 | 3.4 | 9.96 | 165 |
| Comparative Example 3 | BH-1 | BD-3 | 3.4 | 9.75 | 158 |
| Comparative Example 4 | BH-1 | BD-4 | 3.4 | 8.74 | 87 |
| Comparative Example 5 | BH-1 | BD-5 | 3.4 | 8.22 | 85 |

As can be seen from the results in Table 1, the organic electroluminescent devices of Examples 1-9, each of which employed the inventive compound as a dopant, showed significantly improved life characteristics and high external quantum efficiencies compared to the devices of Comparative Examples 1-5, each of which employed a compound whose structural features were contrasted with those of the inventive compound. These results concluded that the use of the inventive compounds makes the organic electroluminescent devices highly efficient and long lasting.

EXPERIMENTAL EXAMPLE 1: MEASUREMENT OF EL MAXIMUM PEAK WAVELENGTHS AND SUBLIMATION TEMPERATURES

The EL maximum peak wavelengths and sublimation temperatures of 9, 10, and 13 were measured under the same conditions.

9

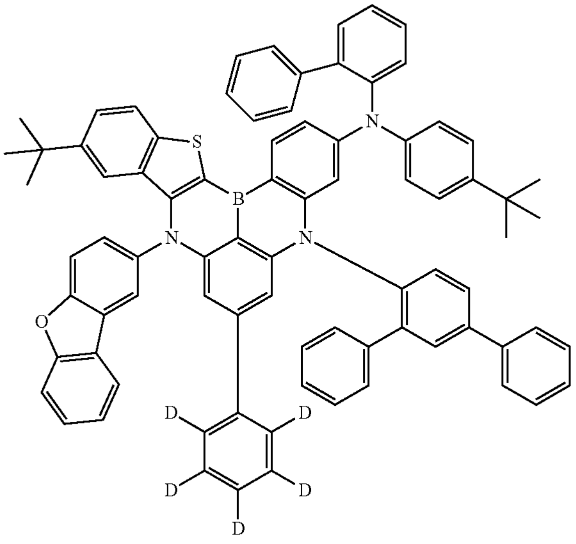

-continued

10

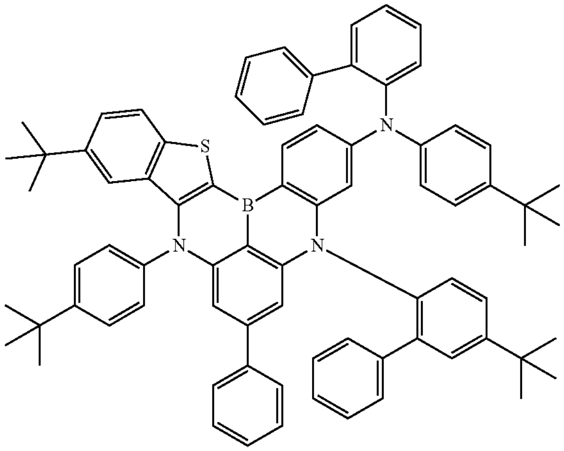

13

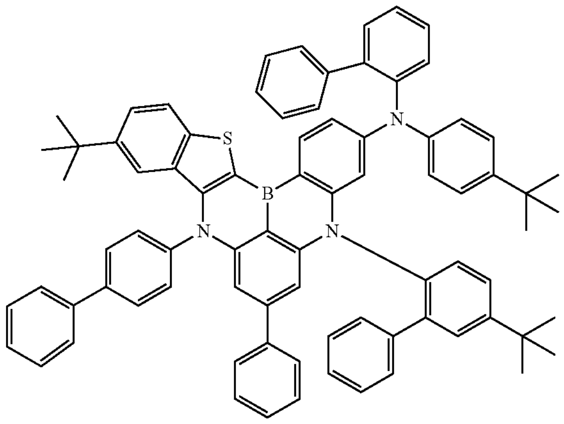

BD-1

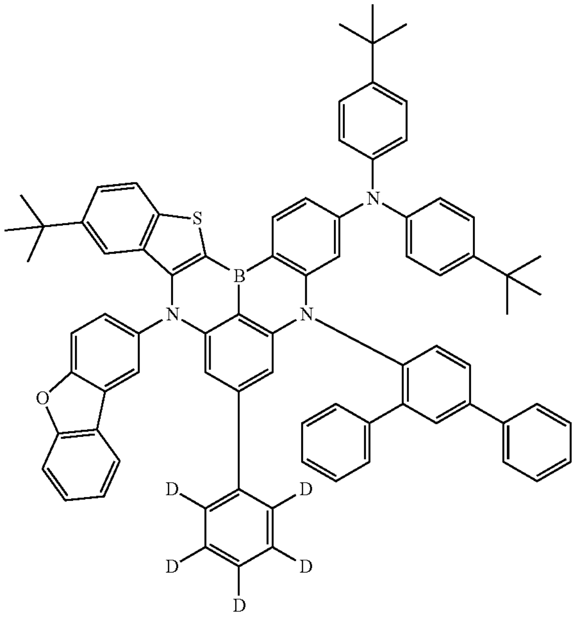

-continued

BD-2

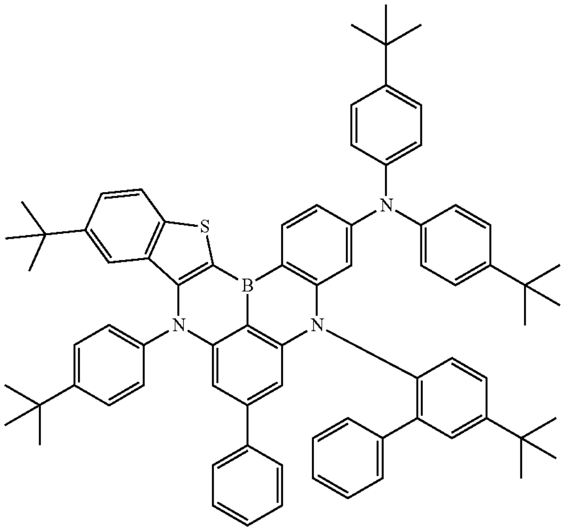

BD3

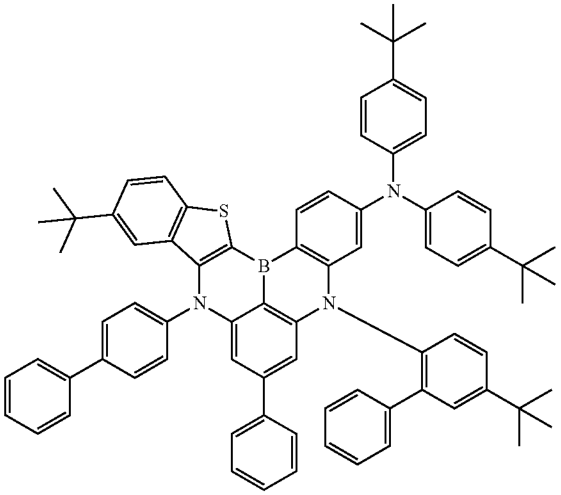

TABLE 2

| | 9 | 10 | 13 | BD-1 | BD-2 | BD-3 |
|---|---|---|---|---|---|---|
| EL $\lambda_{max}$ (nm) | 459 | 459 | 460 | 461 | 462 | 463 |
| Sub. T (° C.) | 340 | 345 | 355 | 375 | 370 | 375 |

The inventive compounds 9, 10, and 13 represented by Formula A-1 are different from BD-1, BD-2, and BD-3 in that the phenyl derivative is substituted ortho to at least one of the aryl groups bonded to the amine atom in the structure of the diarylamine moiety of each of the compounds 9, 10, and 13. Due to this difference, the sublimation temperatures of the inventive compounds were reduced by 20-30° C. compared to those of the comparative compounds, as shown in Table 2. As a result, the inventive compounds can be prevented from thermal decomposition during high-temperature sublimation for purification and can improve the lifetimes of the electroluminescent devices without significant degradation during long-term driving.

In addition, the EL maximum peaks of the inventive compounds were shifted to shorter wavelengths (blue shifted) compared to those of the comparative compounds. As a result, the use of the inventive compounds as dopants in the light emitting layers of the organic electroluminescent devices can achieve blue light emission with improved color purity.

EXAMPLES 10-13: FABRICATION OF ORGANIC ELECTROLUMINESCENT DEVICES

ITO glass was patterned to have a light emitting area of 2 mm×2 mm, followed by cleaning. After the cleaned ITO glass was mounted in a vacuum chamber, the base pressure was adjusted to $1\times10^{-7}$ torr. The compound represented by Acceptor-1 as an electron acceptor and the compound represented by Formula F were deposited in a ratio of 2:98 on the ITO to form a 100 Å thick hole injecting layer. The compound represented by Formula F was used to form a 550 Å thick hole transport layer. Subsequently, the compound represented by Formula G was used to form a 50 Å thick electron blocking layer. A mixture of the host represented by BH-2 and the inventive compound (2 wt %) shown in Table 1 was used to form a 200 Å thick light emitting layer. Thereafter, the compound represented by Formula H was used to form a 50 Å hole blocking layer on the light emitting layer. A mixture of the compound represented by Formula E-1 and the compound represented by Formula E-2 in a ratio of 1:1 was used to form a 250 Å thick electron transport layer on the hole blocking layer. The compound represented by Formula E-2 was used to form a 10 Å thick electron injection layer on the electron transport layer. Al was used to form a 1000 Å thick Al electrode on the electron injection layer, completing the fabrication of an organic electroluminescent device. The luminescent properties of the organic electroluminescent device were measured at 0.4 mA.

Formula F

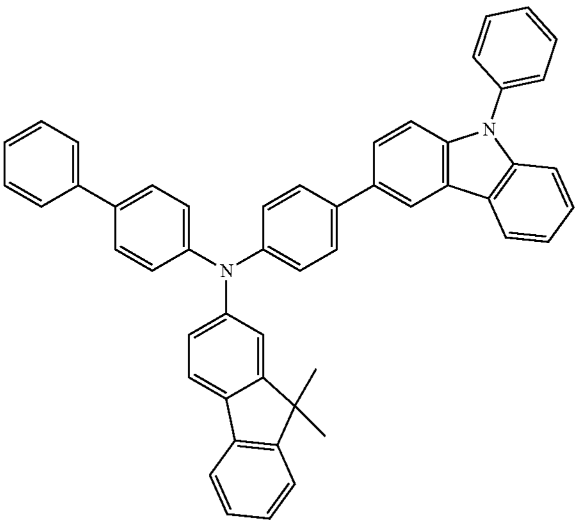

-continued

Formula G

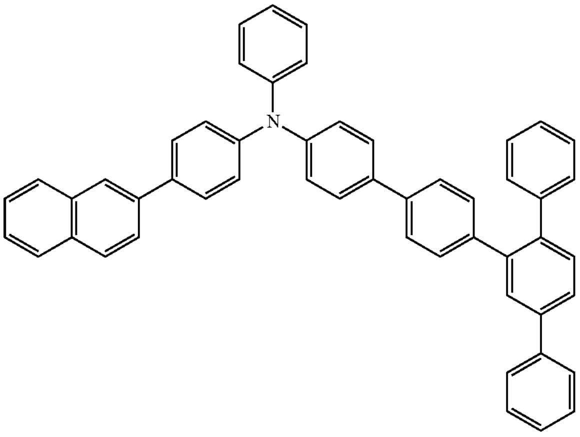

Formula H

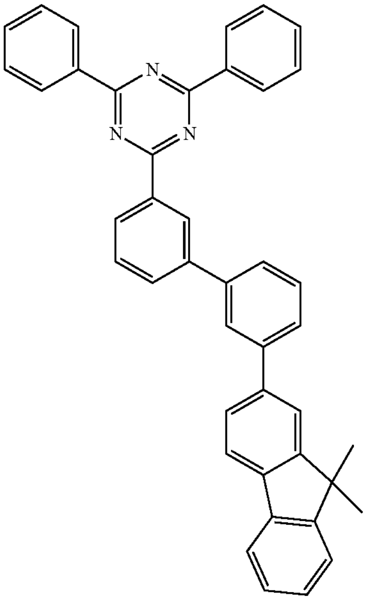

Formula E-1

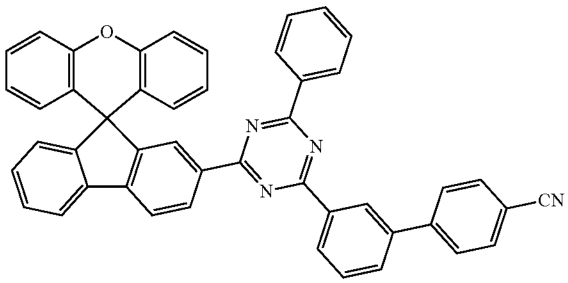

Formula E-2

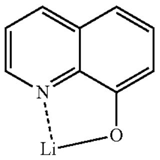

-continued

Acceptor-1

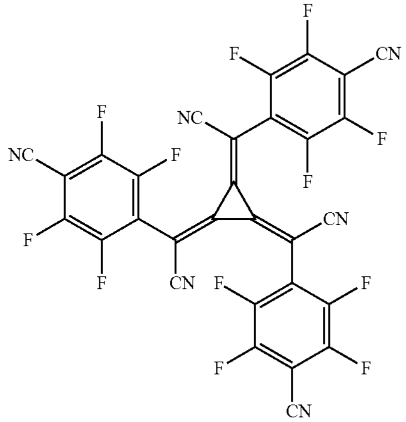

BH-2

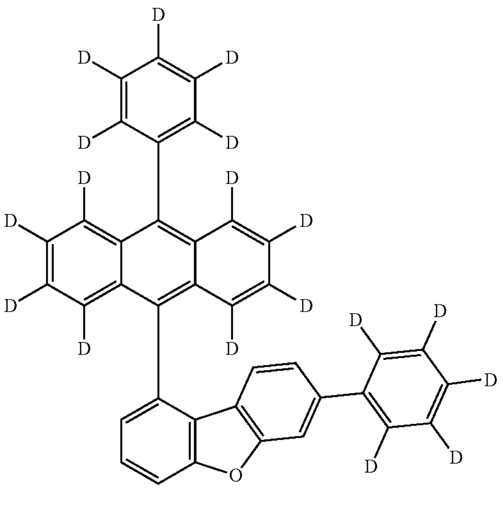

COMPARATIVE EXAMPLES 6-9

Organic electroluminescent devices were fabricated in the same manner as in Examples 10-13, except that BH-1 was used as a host compound to form a light emitting layer instead of BH-2. The luminescent properties of the organic electroluminescent devices were measured at 0.4 mA.

TABLE 3

| Example No. | Host | Dopant | Voltage (V) | Efficiency (EQE, %) | Lifetime (T97, hr) |
|---|---|---|---|---|---|
| Example 10 | BH-2 | 9 | 3.4 | 11.28 | 387 |
| Example 11 | BH-2 | 14 | 3.4 | 11.84 | 452 |
| Example 12 | BH-2 | 31 | 3.4 | 10.97 | 365 |
| Example 13 | BH-2 | 70 | 3.4 | 11.21 | 412 |
| Comparative Example 6 | BH-1 | 9 | 3.4 | 10.83 | 240 |
| Comparative Example 7 | BH-1 | 14 | 3.4 | 11.53 | 290 |

TABLE 3-continued

| Example No. | Host | Dopant | Voltage (V) | Efficiency (EQE, %) | Lifetime (T97, hr) |
|---|---|---|---|---|---|
| Comparative Example 8 | BH-1 | 31 | 3.4 | 10.64 | 221 |
| Comparative Example 9 | BH-1 | 70 | 3.4 | 10.97 | 261 |

The results in Table 3 compare data obtained from the organic electroluminescent devices of Examples 10-13 with those from the organic electroluminescent devices of Comparative Examples 6-9. The organic electroluminescent devices, each of which employed the inventive compound as a dopant and BH-2 as a host, showed significantly improved efficiencies and life characteristics compared to the devices employing BH-1, whose structure was contrasted with that of BH-2, as a host.

EXAMPLES 14-17: FABRICATION OF ORGANIC ELECTROLUMINESCENT DEVICES

Organic electroluminescent devices were fabricated in the same manner as in Examples 10-13, except that BH-3 was used as a host compound to form a light emitting layer instead of BH-2. The luminescent properties of the organic electroluminescent devices were measured at 0.4 mA. The structure of BH-3 is as follows:

BH-3

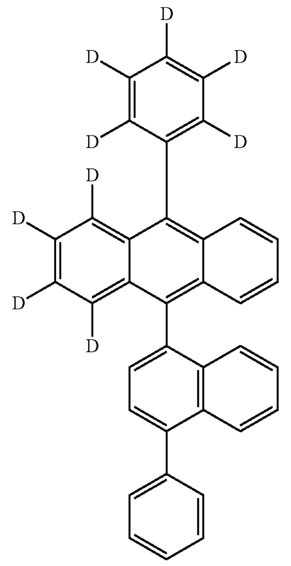

COMPARATIVE EXAMPLES 10-13

Organic electroluminescent devices were fabricated in the same manner as in Examples 14-17, except that BH-4 was used as a host compound to form a light emitting layer instead of BH-3. The luminescent properties of the organic electroluminescent devices were measured at 0.4 mA. The structure of BH-4 is as follows:

BH-4

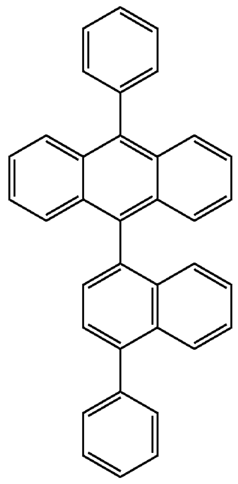

TABLE 4

| Example No. | Host | Dopant | Voltage (V) | Efficiency (EQE, %) | Lifetime (T97, hr) |
|---|---|---|---|---|---|
| Example 14 | BH-3 | 9 | 3.9 | 11.61 | 264 |
| Example 15 | BH-3 | 14 | 3.9 | 12.22 | 305 |
| Example 16 | BH-3 | 31 | 3.9 | 11.42 | 267 |
| Example 17 | BH-3 | 70 | 3.9 | 11.74 | 302 |
| Comparative Example 10 | BH-4 | 9 | 3.9 | 11.48 | 241 |
| Comparative Example 11 | BH-4 | 14 | 3.9 | 12.17 | 286 |
| Comparative Example 12 | BH-4 | 31 | 3.9 | 11.28 | 237 |
| Comparative Example 13 | BH-4 | 70 | 3.9 | 11.63 | 259 |

The results in Table 4 compare data obtained from the organic electroluminescent devices of Examples 14-17 with those from the organic electroluminescent devices of Comparative Examples 10-13. The organic electroluminescent devices, each of which employed the inventive compound as a dopant and BH-3 as a host, showed significantly improved life characteristics compared to the devices employing BH-4, whose structure was contrasted with that of BH-3, as a host. The efficiencies of the organic electroluminescent devices of Examples 14-17 were at a level comparable to those of the organic electroluminescent devices of Comparative Examples 10-13.

What is claimed is:

1. A compound represented by Formula A-1:

(A-1)

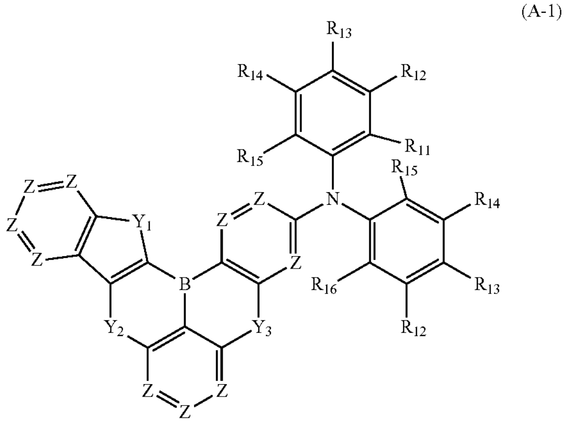

wherein each Z is independently CR or N,

R and $R_{12}$ to $R_{16}$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted germanium, substituted or unsubstituted boron, substituted or unsubstituted aluminum, phosphoryl, hydroxyl, selenium, tellurium, nitro, cyano, and halogen, with the proviso that each of $R_{12}$ to $R_{16}$ optionally forms an aliphatic or aromatic monocyclic or polycyclic ring with the other adjacent group(s), the moieties Z are identical to or different from each other, the groups R are identical to or different from each other, with the proviso that the groups R are optionally linked to each other to form an alicyclic or aromatic monocyclic or polycyclic ring, $Y_1$ is O or S, $Y_2$ and $Y_3$ are identical to or different from each other and are each independently selected from N—$R_1$, $CR_2R_3$, O, S, Se, and $SiR_4R_5$, $R_1$ to $R_5$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, $R_{11}$ is selected from substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, provided that when the adjacent Z is CR, each of $R_{15}$, $R_{16}$, and $R_1$ to $R_5$ optionally forms an alicyclic or aromatic monocyclic or polycyclic ring with R, with the proviso that $R_2$ and $R_3$ together optionally form an alicyclic or aromatic monocyclic or polycyclic ring and $R_4$ and $R_5$ together optionally form an alicyclic or aromatic monocyclic or polycyclic ring, with the proviso that at least one of $Y_2$ and $Y_3$ is represented by Structure A:

(A)

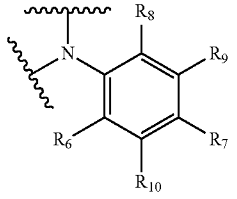

wherein $R_6$ is selected from substituted or unsubstituted $C_2$-$C_{20}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, $R_7$ is selected from hydrogen, deuterium, substituted or unsubstituted $C_1$-$C_{30}$ alkyl, substituted or unsubstituted $C_3$-$C_{30}$ cycloalkyl, substituted or unsubstituted $C_6$-$C_{50}$ aryl, and substituted or unsubstituted $C_2$-$C_{20}$ heteroaryl, and $R_8$ to $R_{10}$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, with the proviso that each of $R_6$ to $R_{10}$ optionally forms an alicyclic or aromatic monocyclic or polycyclic ring with an adjacent substituent.

2. An organic electroluminescent device comprising a first electrode, a second electrode opposite to the first electrode, and one or more organic layers interposed between the first and second electrodes wherein one of the organic layers is a light emitting layer composed of a host and a dopant and wherein the dopant is the compound represented by Formula A-1 according to claim 1.

3. An organic electroluminescent device comprising a first electrode, a second electrode opposite to the first electrode, and one or more organic layers interposed between the first and second electrodes wherein one of the organic layers is a light emitting layer comprising a host and a dopant and wherein the dopant comprises at least one compound represented by Formula A-1:

(A-1)

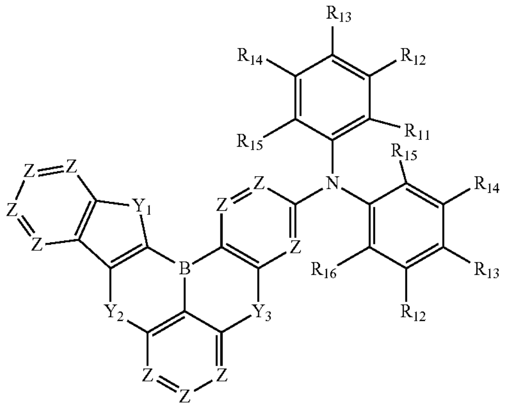

wherein each Z is independently CR or N,

R and $R_{12}$ to $R_{16}$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted germanium, substituted or unsubstituted boron, substituted or unsubstituted aluminum, phosphoryl, hydroxyl, selenium, tellurium, nitro, cyano, and halogen, with the proviso that each of $R_{12}$ to $R_{16}$ optionally forms an aliphatic or aromatic monocyclic or polycyclic ring with the other adjacent group(s), the moieties Z are identical to or different from each other, the groups R are identical to or different from each other, with the proviso that the groups R are optionally linked to each other to form an alicyclic or aromatic monocyclic or polycyclic ring, $Y_1$ is O or S, $Y_2$ and $Y_3$ are identical to or different from each other and are each independently selected from N—$R_1$, $CR_2R_3$, O, S, Se, and $SiR_4R_5$, $R_1$ to $R_5$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, $R_{11}$ is selected from substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, provided that when the adjacent Z is CR, each of $R_{15}$, $R_{16}$, and $R_1$ to $R_5$ optionally forms an alicyclic or aromatic monocyclic or polycyclic ring with R, with the proviso that $R_2$ and $R_3$ together optionally form an alicyclic or aromatic monocyclic or polycyclic ring and $R_4$ and $R_5$ together optionally form an alicyclic or aromatic monocyclic or polycyclic ring, with the proviso that at least one of $Y_2$ and $Y_3$ is represented by Structure A:

(A)

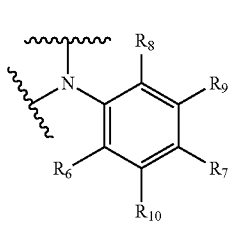

wherein $R_6$ is selected from substituted or unsubstituted $C_1$-$C_{30}$ alkyl, substituted or unsubstituted $C_6$-$C_{20}$ aryl, substituted or unsubstituted $C_2$-$C_{20}$ heteroaryl, substituted or unsubstituted $C_6$-$C_{50}$ fused polycyclic non-aromatic hydrocarbon rings, and substituted or unsubstituted $C_2$-$C_{50}$ fused polycyclic non-aromatic heterocyclic rings, $R_7$ is selected from hydrogen, deuterium, substituted or unsubstituted $C_1$-$C_{30}$ alkyl, substituted or unsubstituted $C_3$-$C_{30}$ cycloalkyl, substituted or unsubstituted $C_6$-$C_{50}$ aryl, and substituted or unsubstituted $C_2$-$C_{20}$ heteroaryl, and $R_8$ to $R_{10}$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ cycloalkenyl, substituted or unsubstituted $C_1$-$C_{30}$ heterocycloalkyl, substituted or unsubstituted $C_2$-$C_{50}$ heteroaryl, substituted or unsubstituted $C_6$-$C_{50}$ fused polycyclic non-aromatic hydrocarbon rings, substituted or unsubstituted $C_2$-$C_{50}$ fused polycyclic non-aromatic heterocyclic rings, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, with the proviso that each of $R_6$ to $R_{10}$ optionally forms an alicyclic or aromatic monocyclic or polycyclic ring with an adjacent substituent; and the host is an anthracene compound selected from the group consisting of the following compounds:

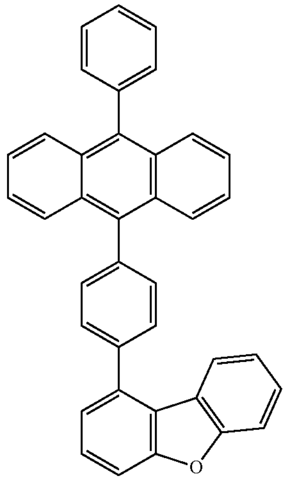

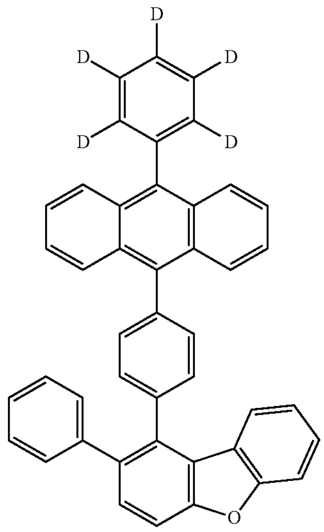

-continued

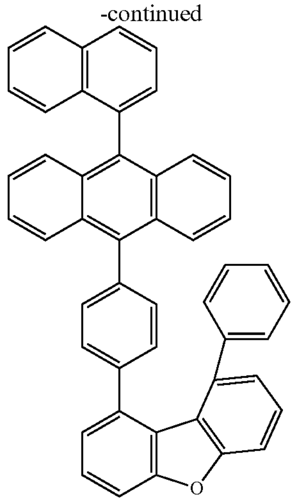

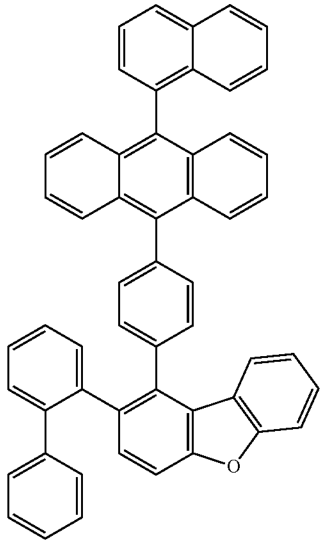

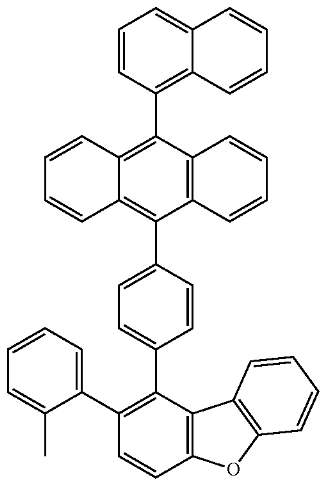

-continued
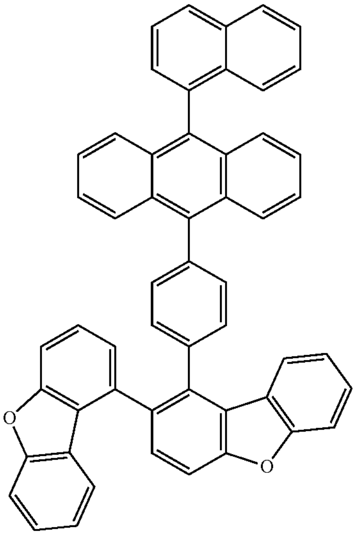
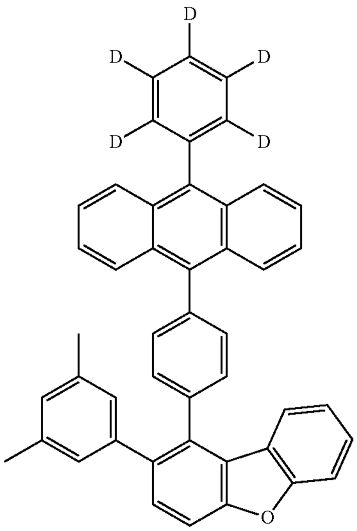
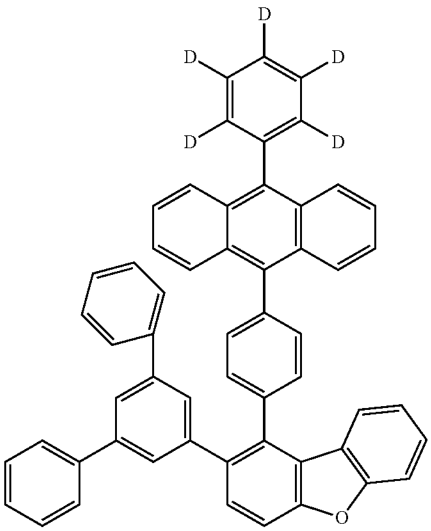
-continued
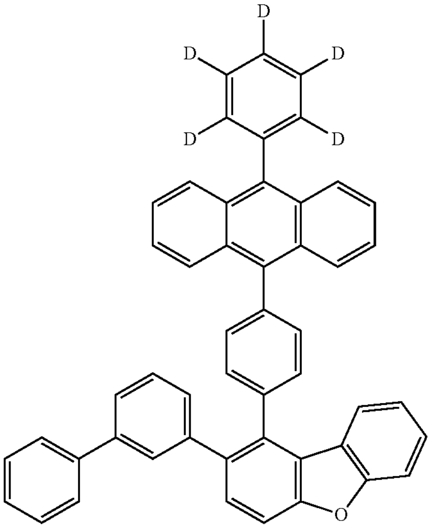
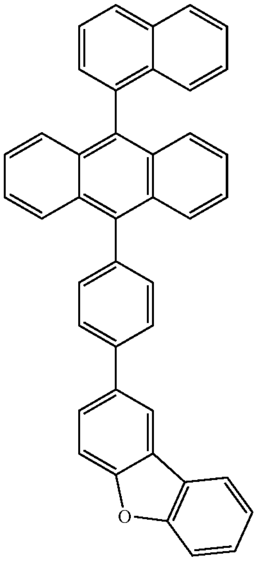
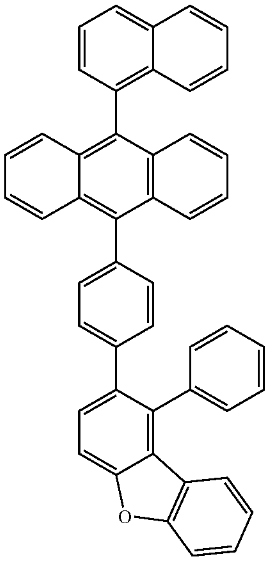

-continued
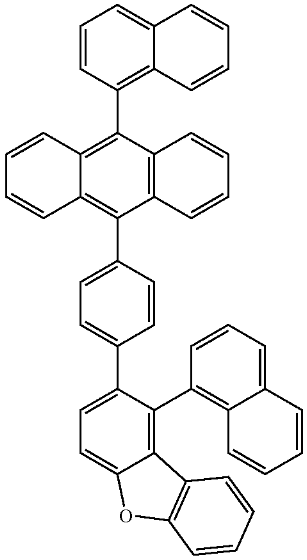
-continued
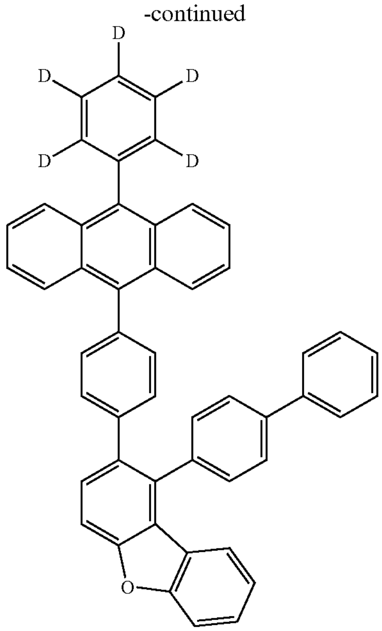
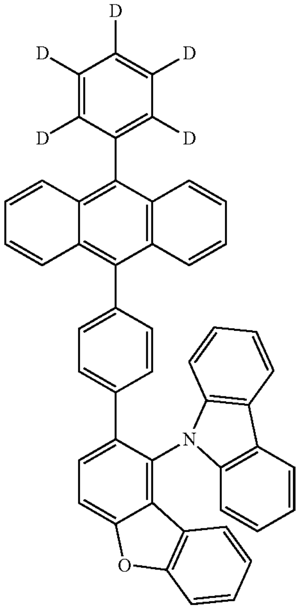
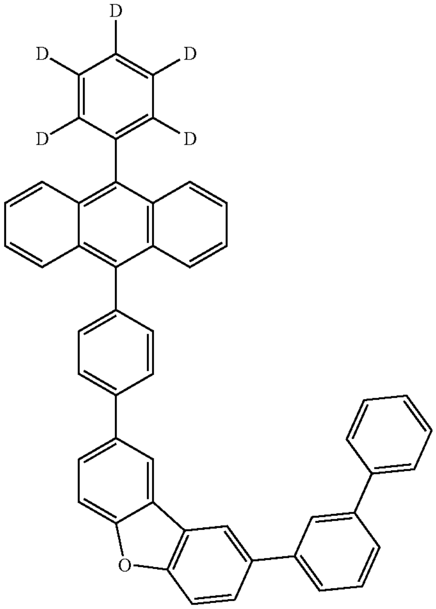

-continued
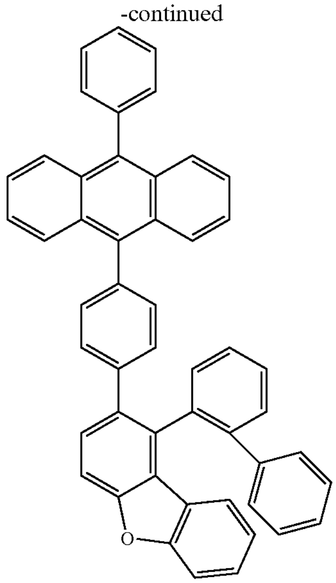
-continued
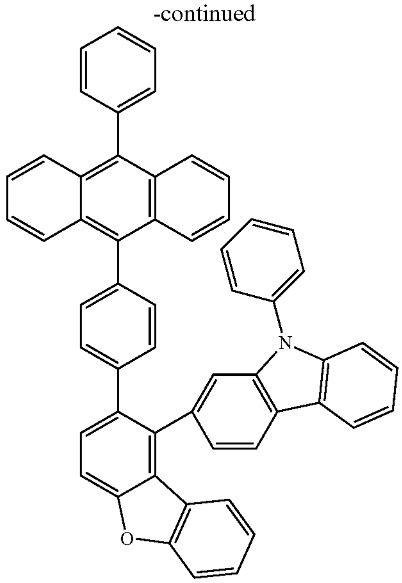
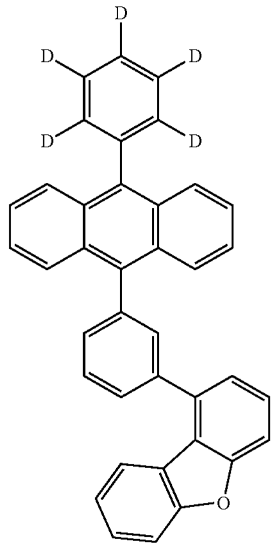
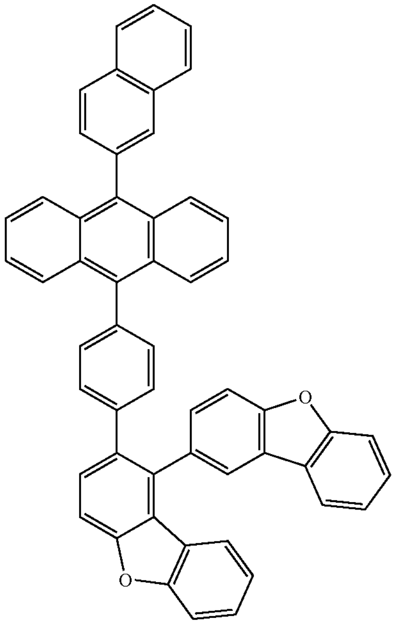
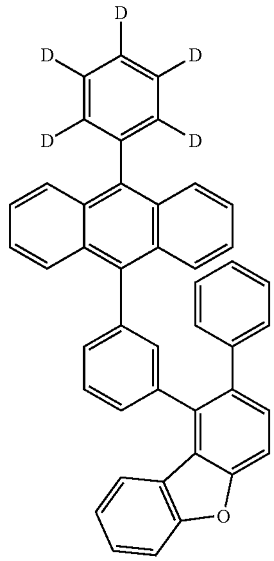

-continued
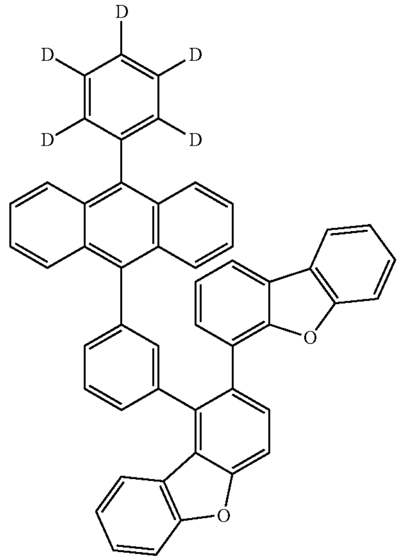
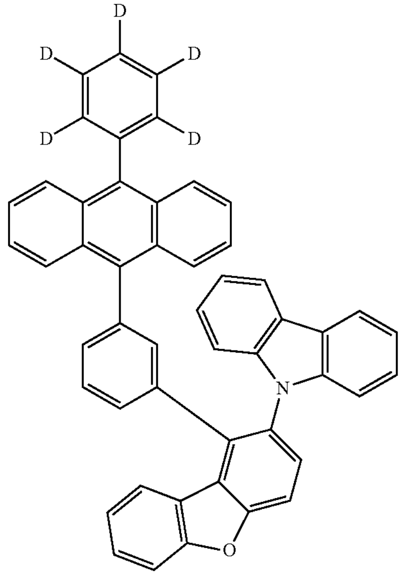
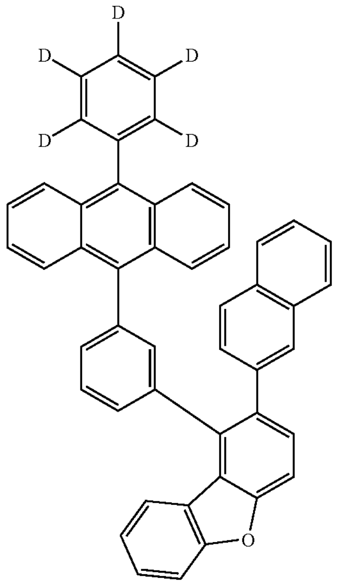
-continued
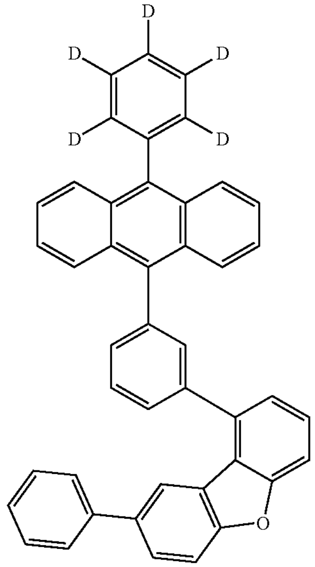
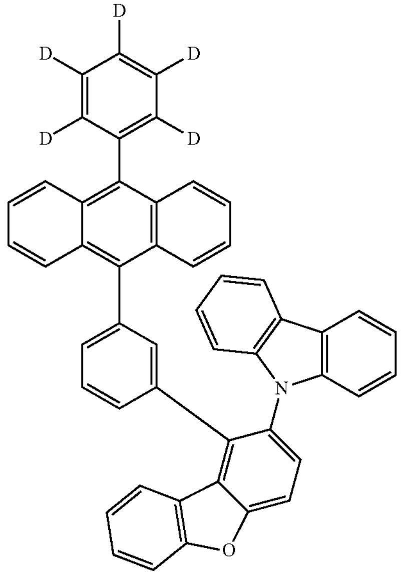
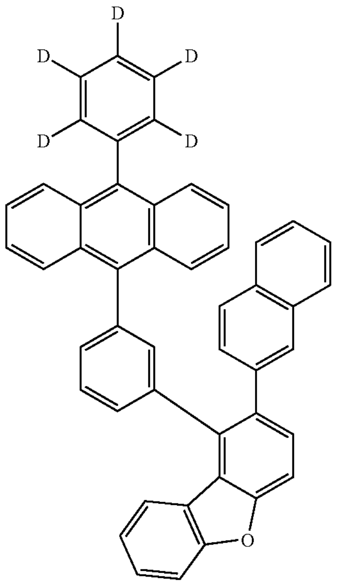

-continued
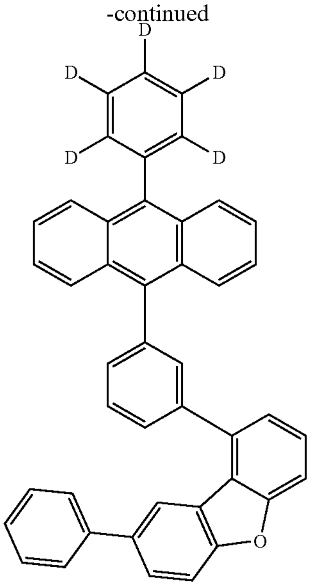
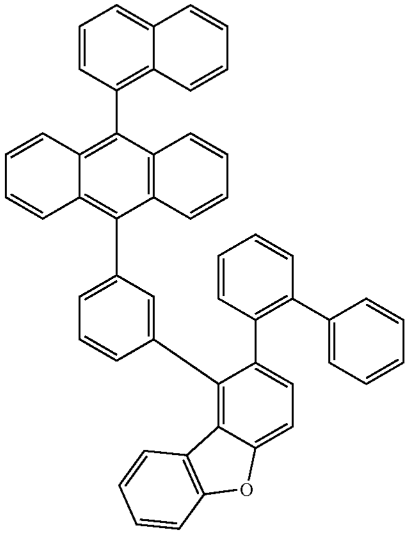
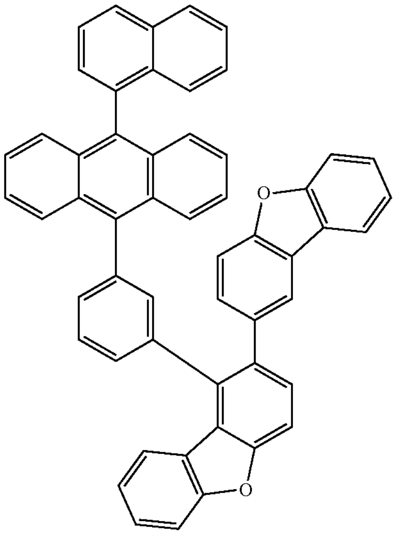
-continued
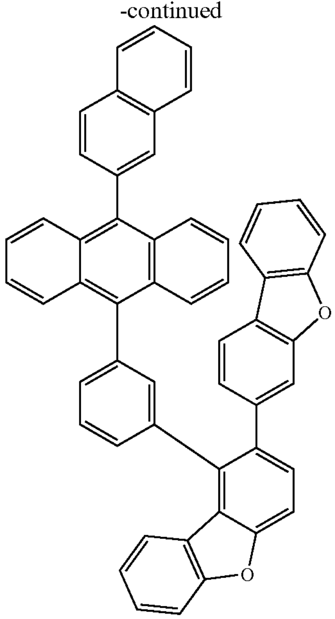
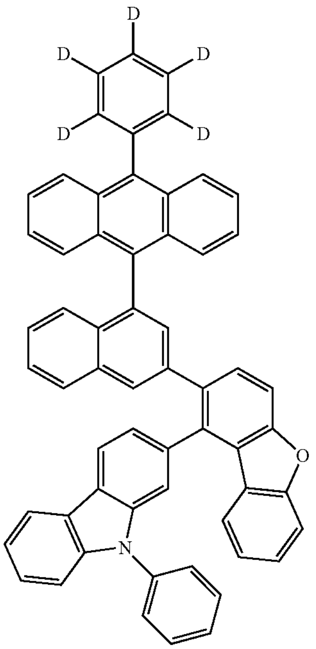

-continued
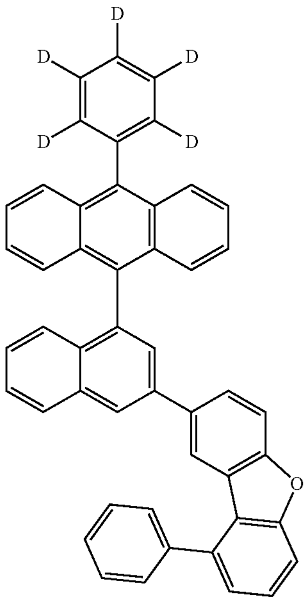
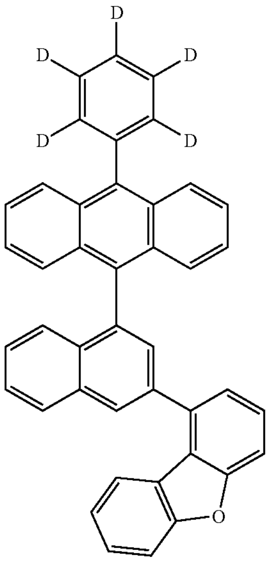
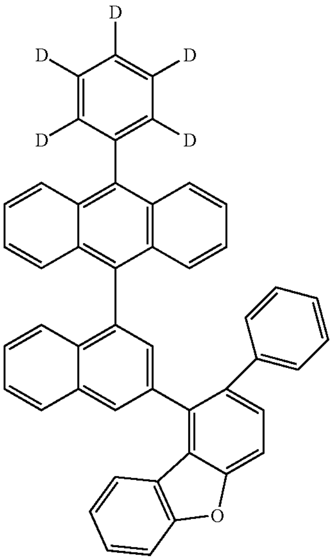
-continued
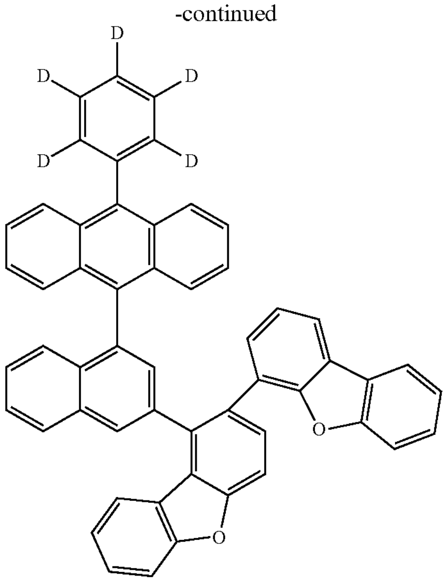
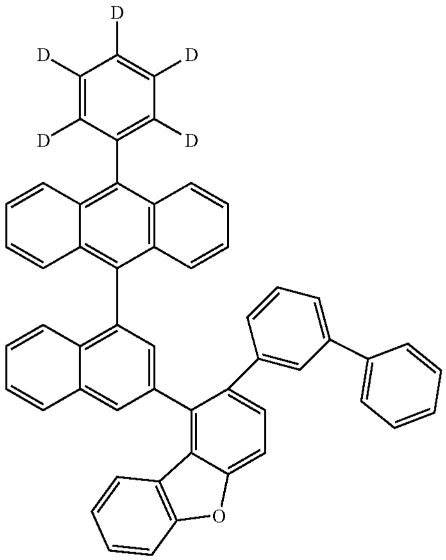
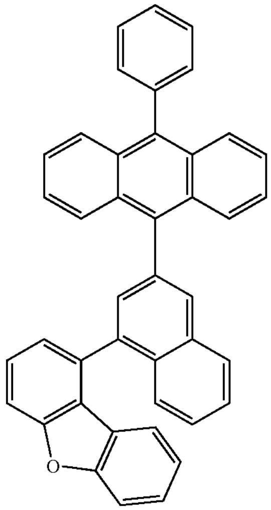

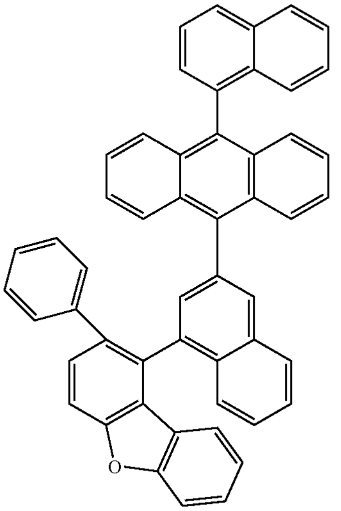
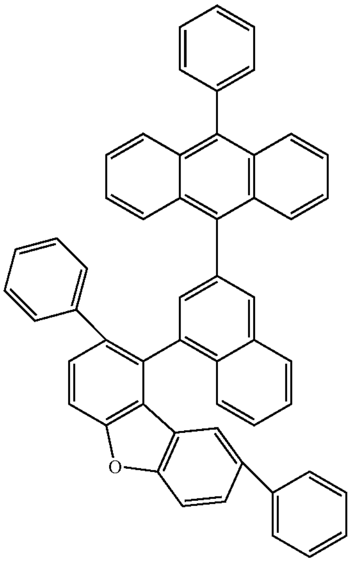
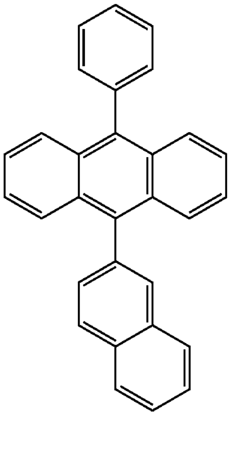
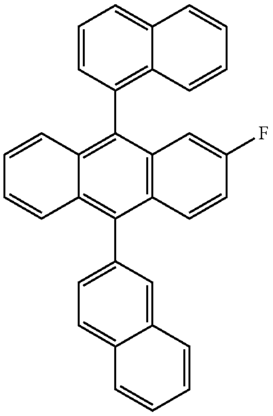
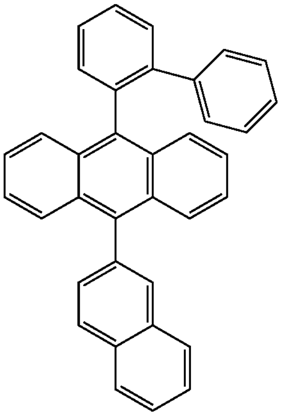
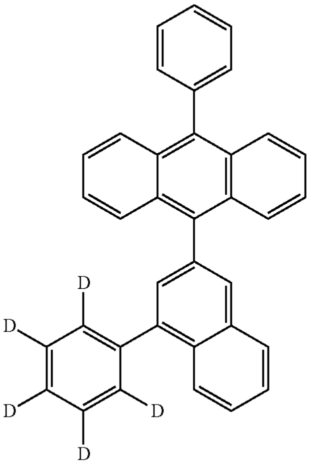

-continued
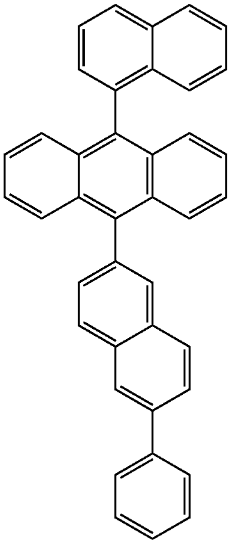
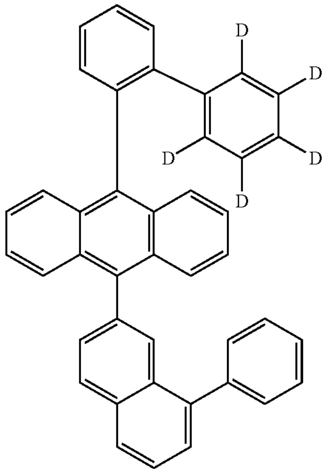
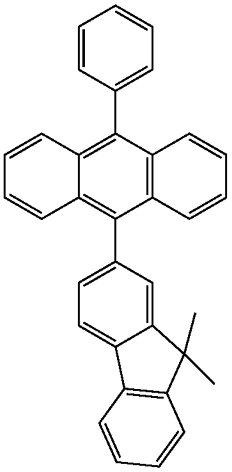
-continued
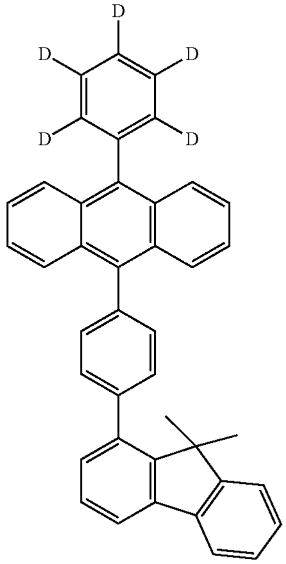
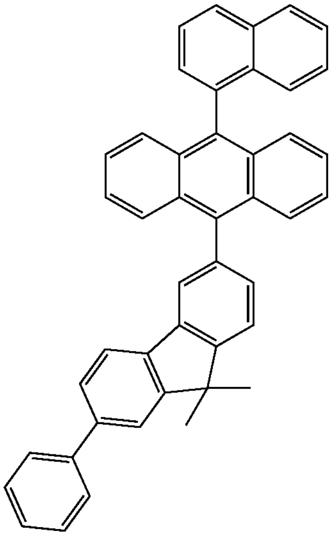
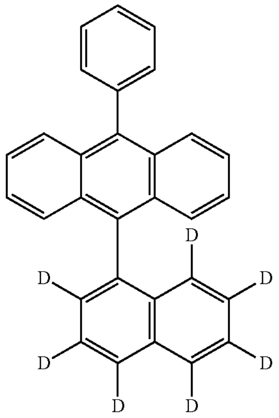

-continued
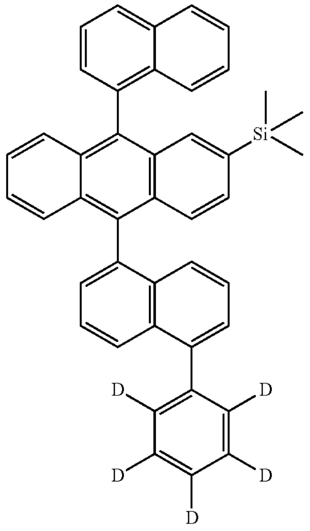
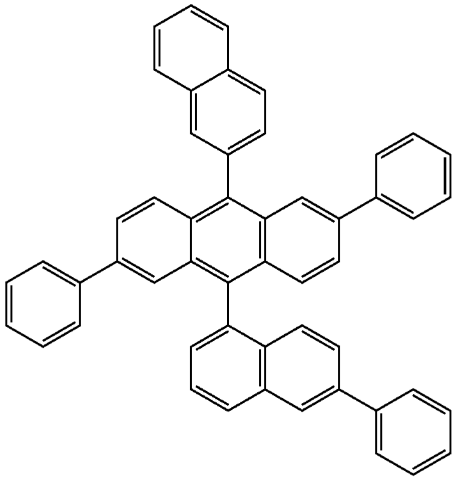
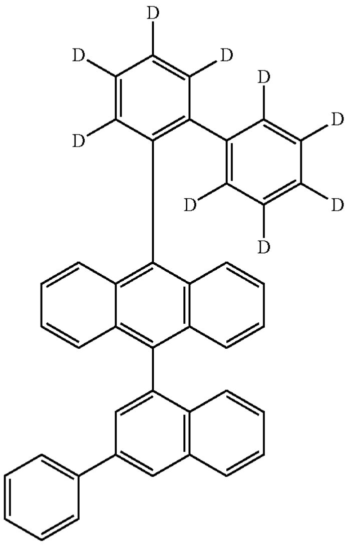
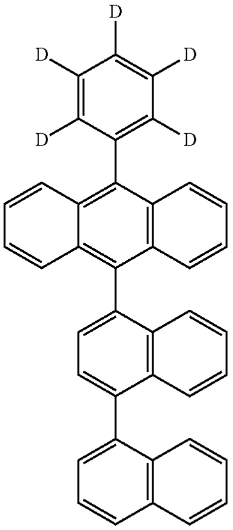
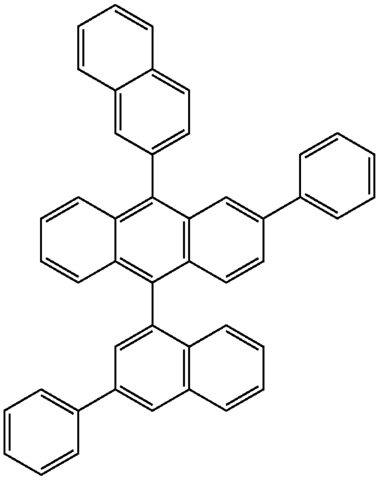
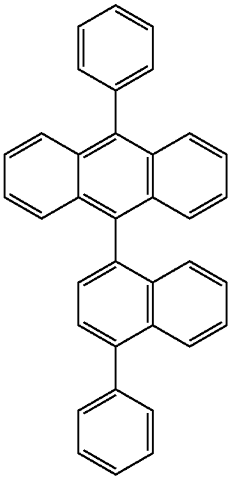

-continued
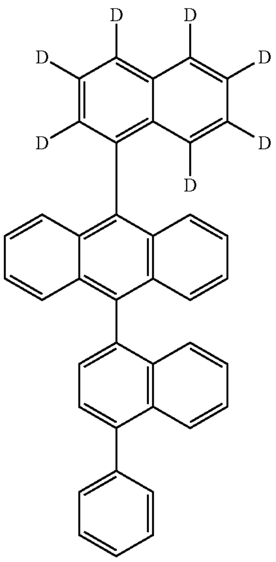
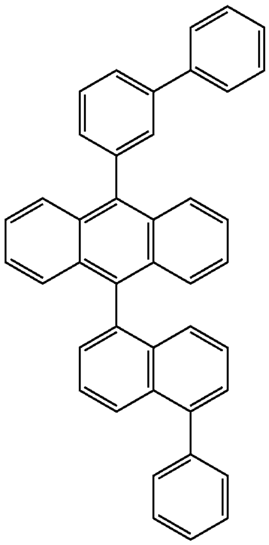
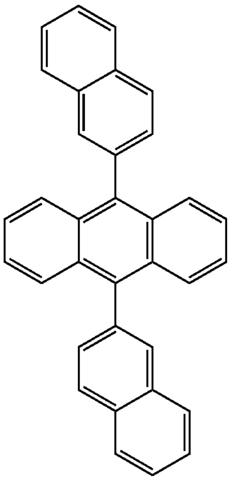
-continued
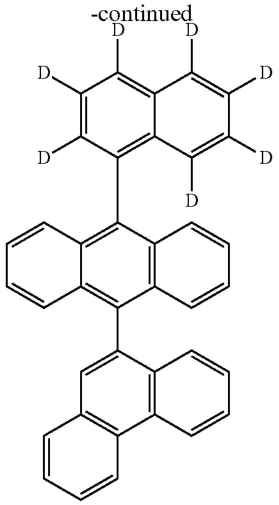
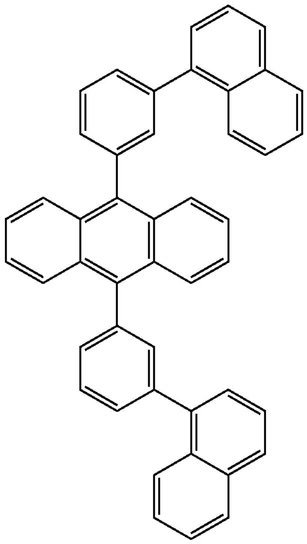
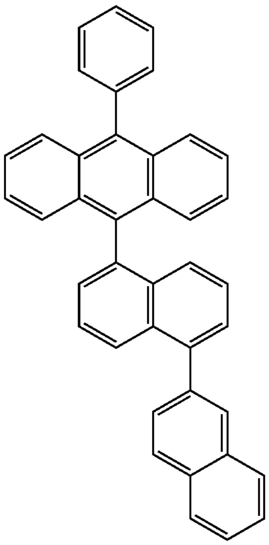

-continued
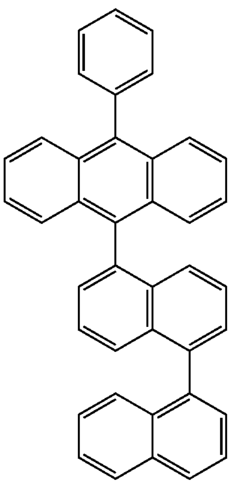
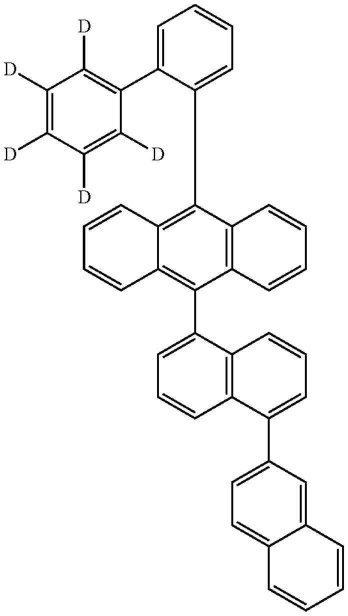
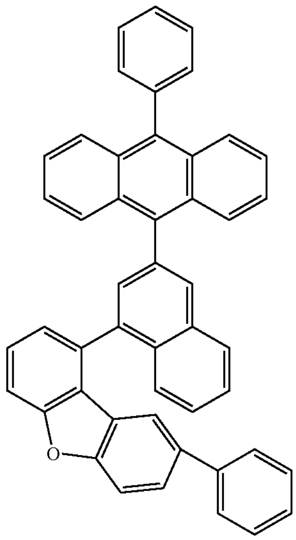
-continued
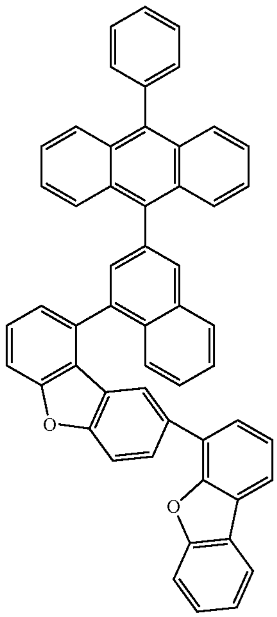
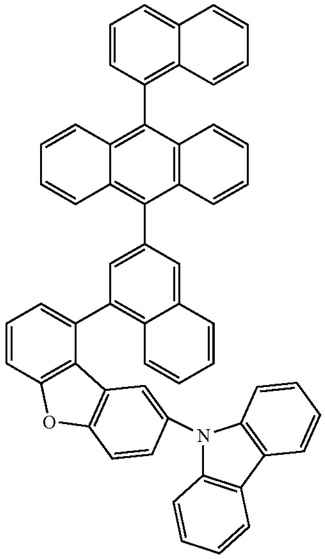
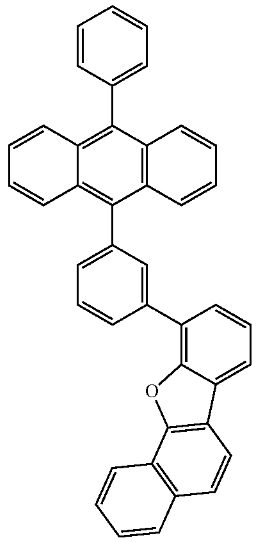

-continued
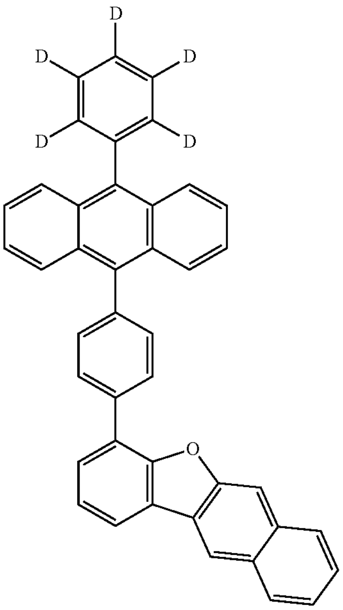
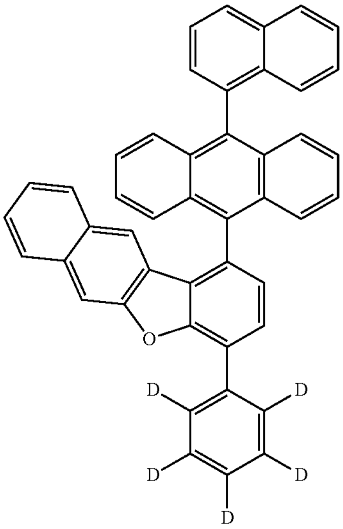
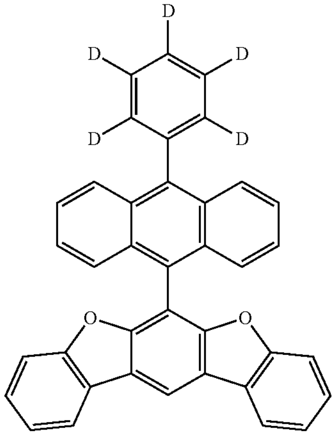
-continued
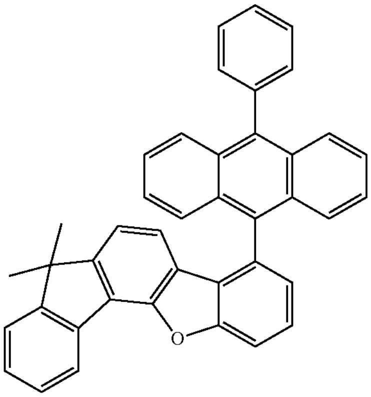
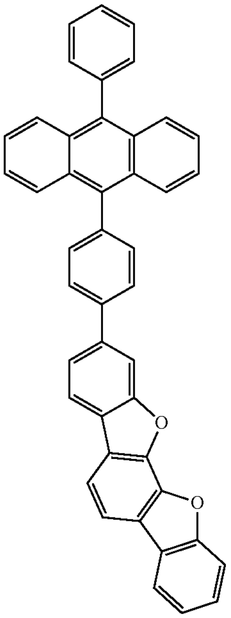
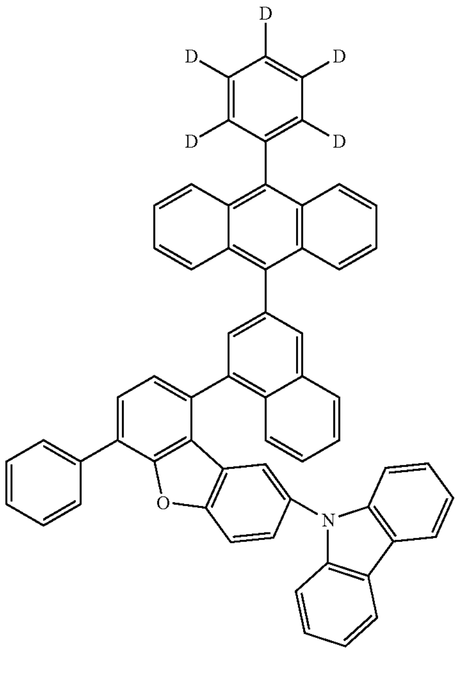

-continued
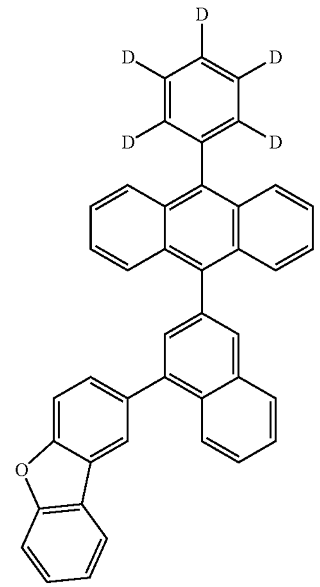
-continued
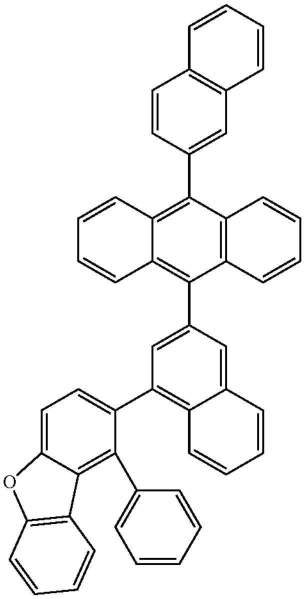
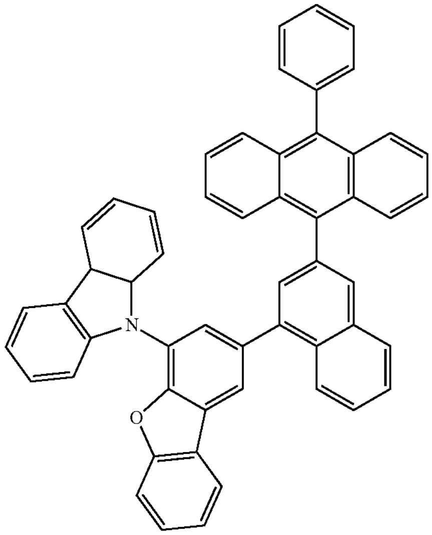
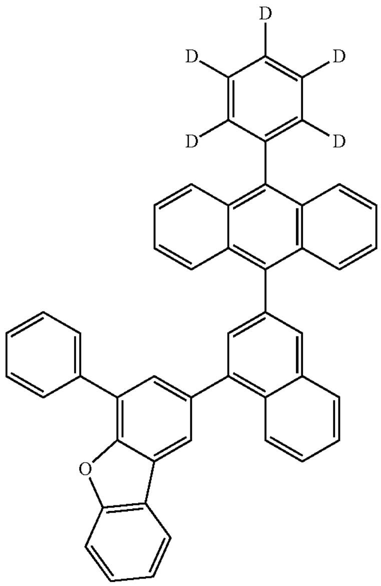
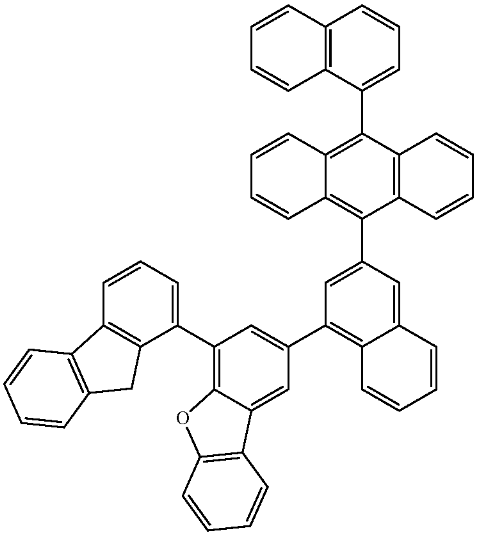

-continued
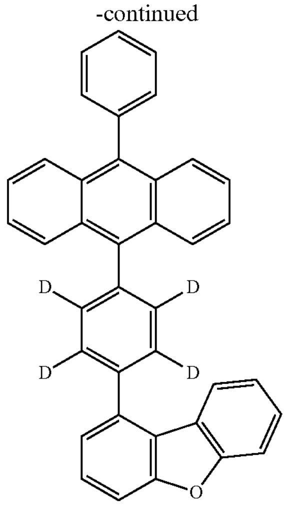
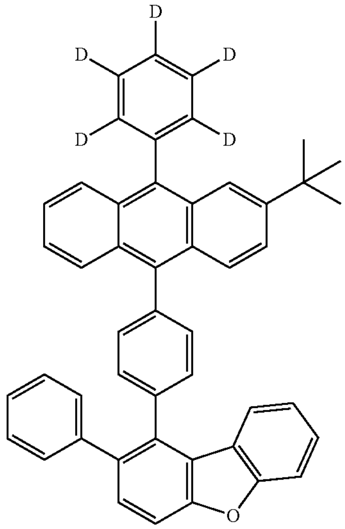
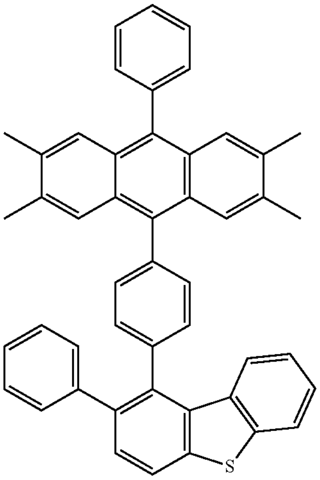
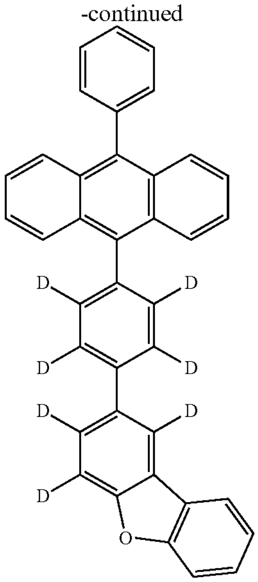
-continued
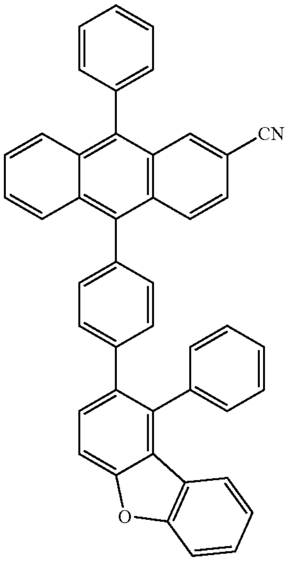

-continued
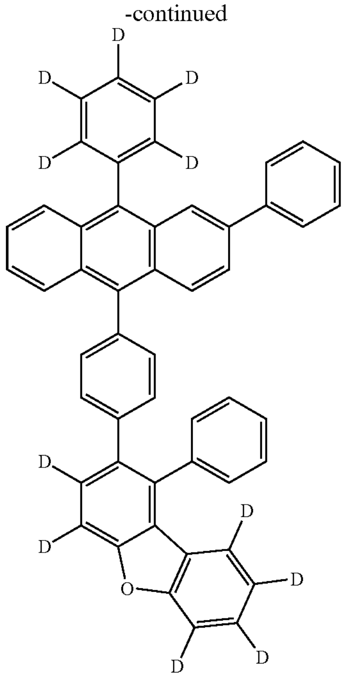
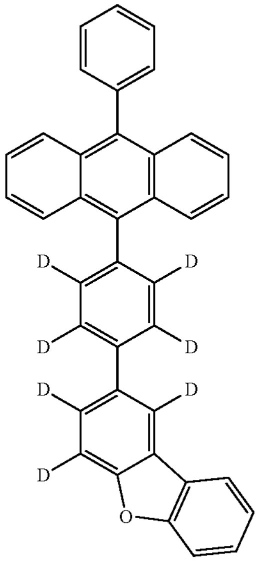
-continued
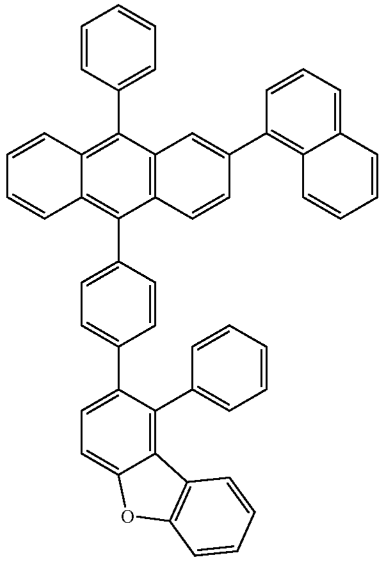
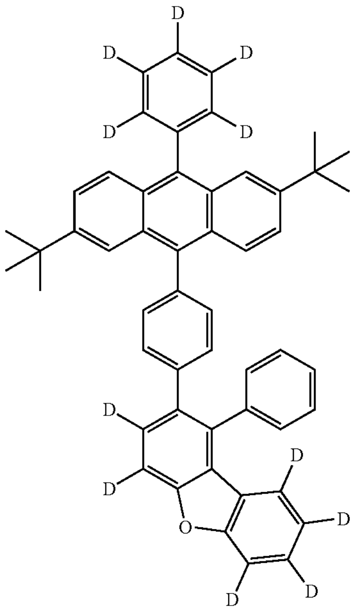
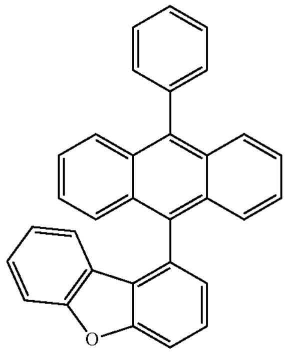

-continued
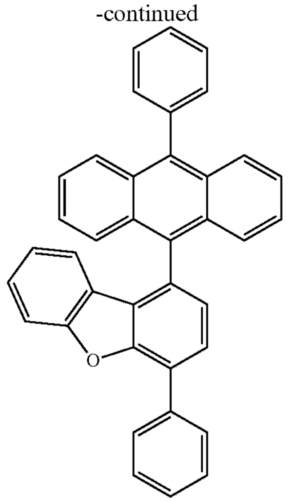
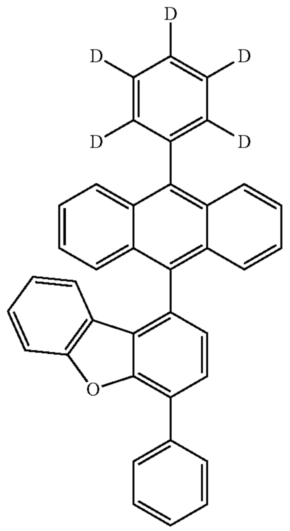
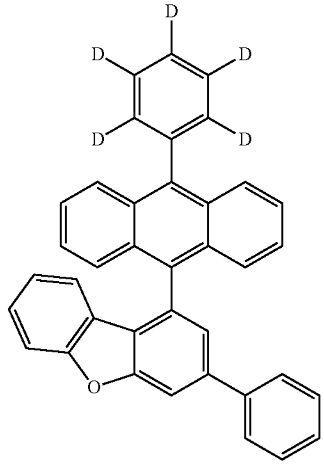
-continued
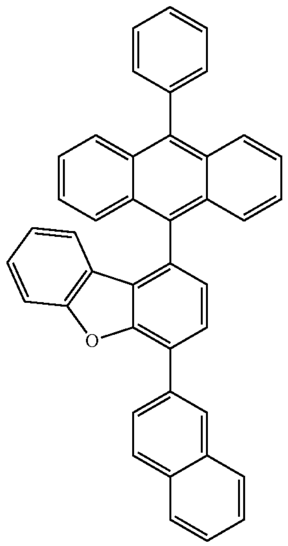
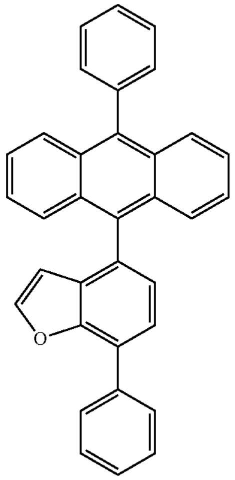
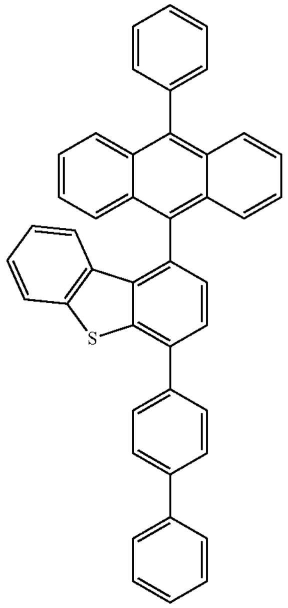

-continued
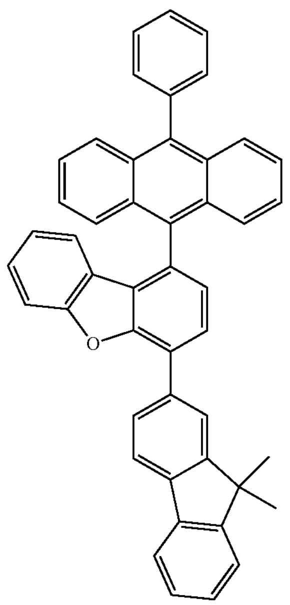
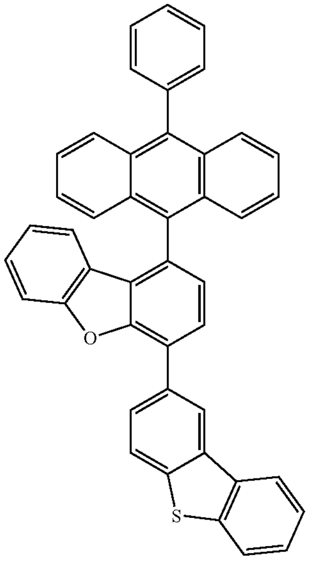
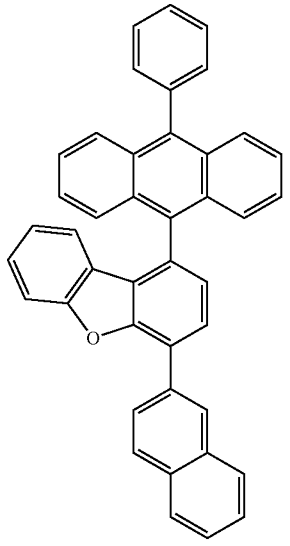
-continued
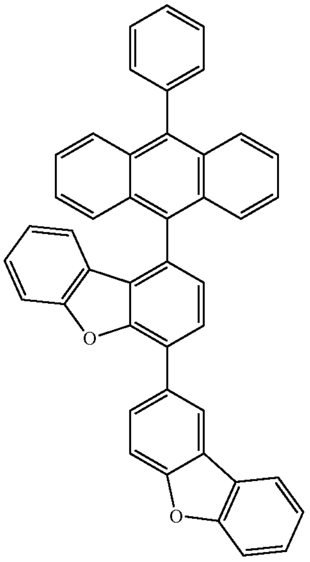
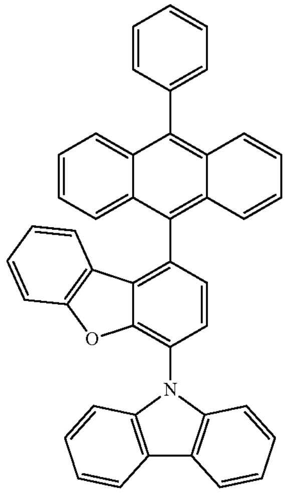
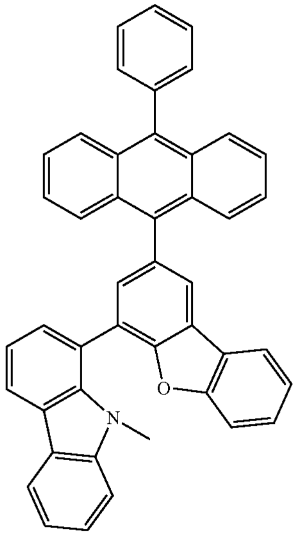

-continued
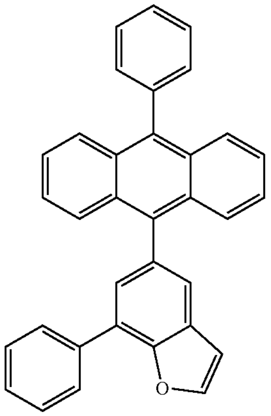
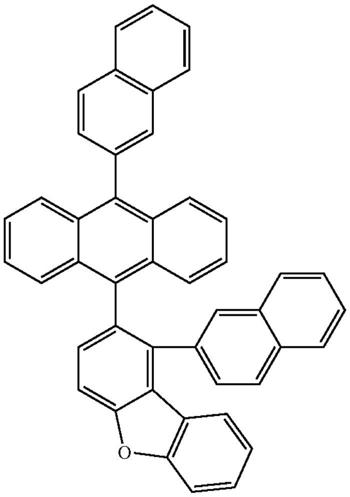
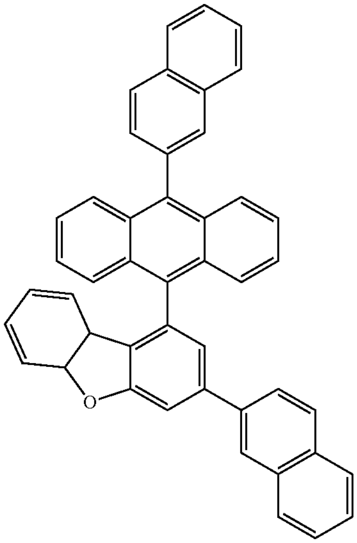
-continued
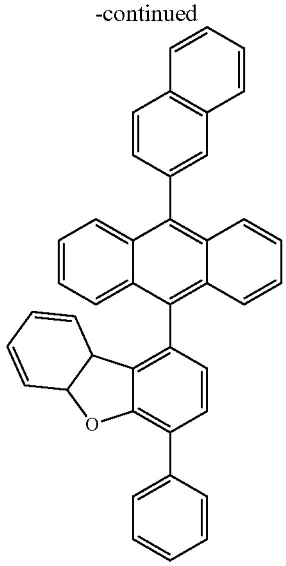
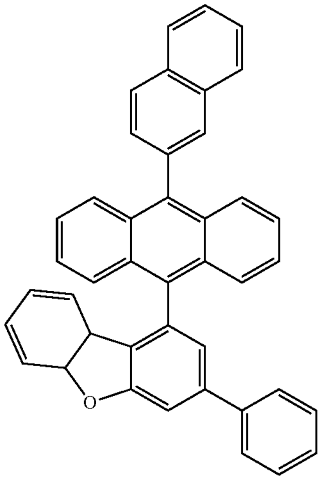
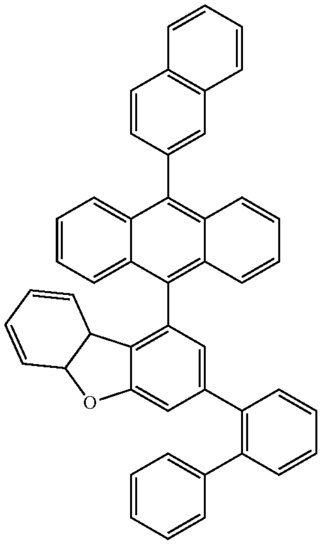

-continued
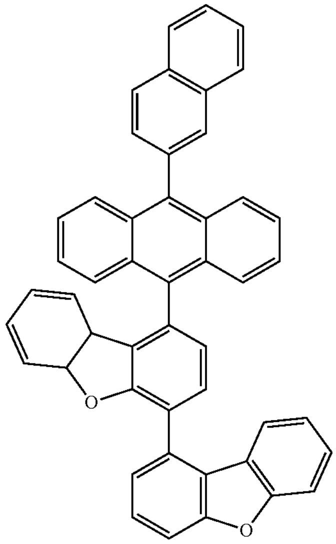
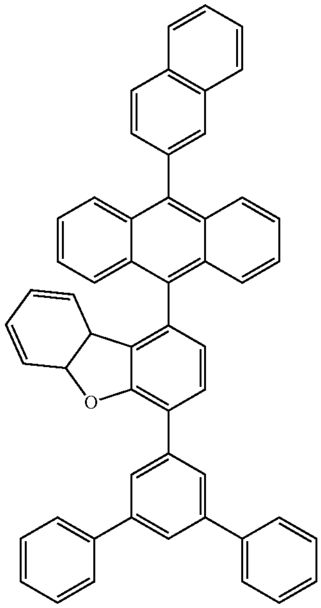
-continued
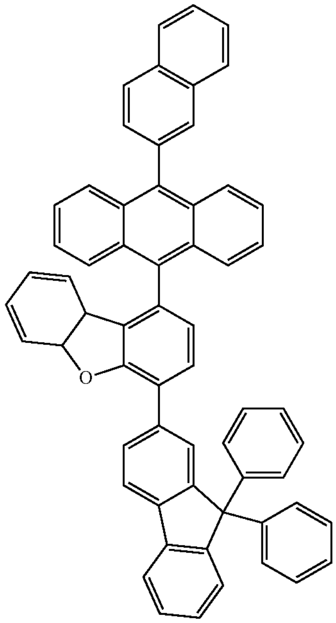
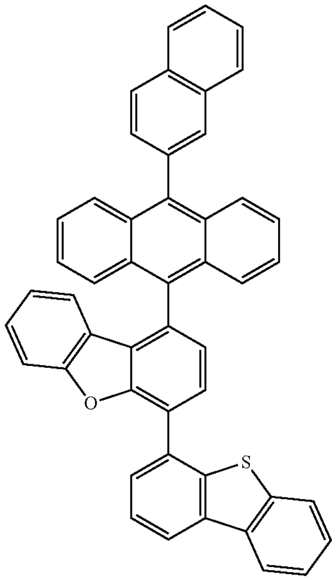

-continued
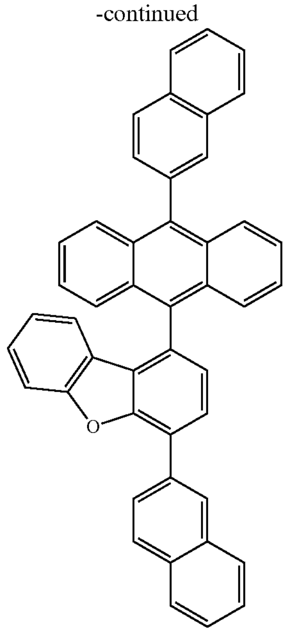
-continued
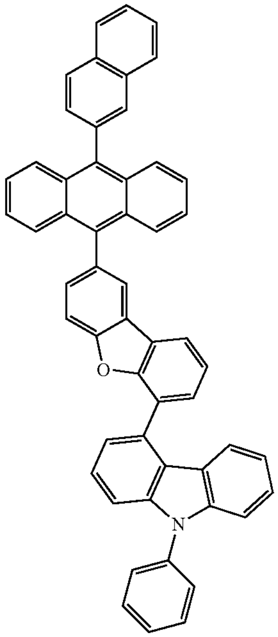
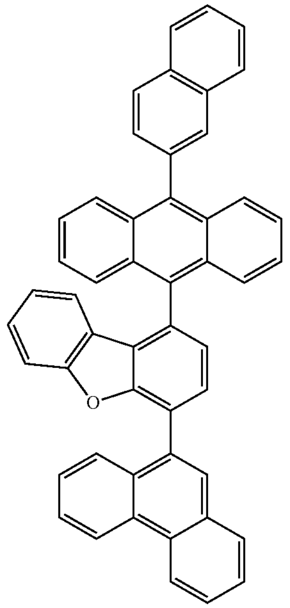
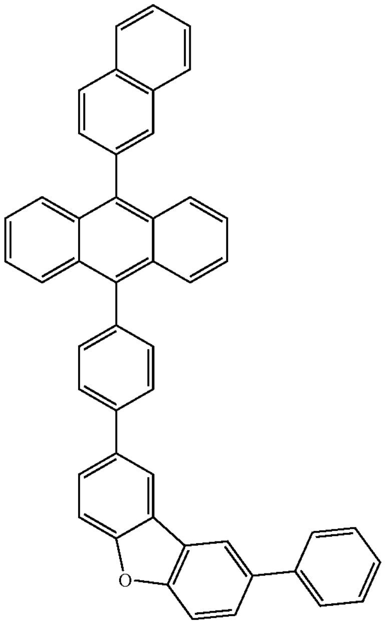

-continued
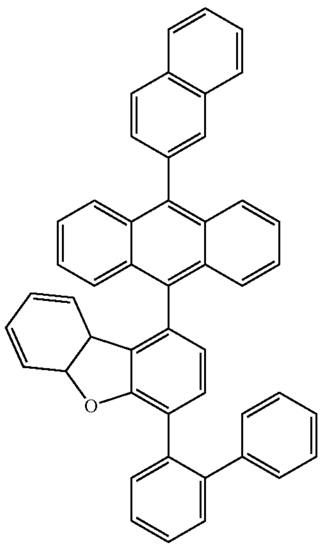
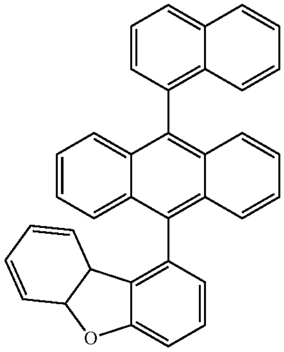
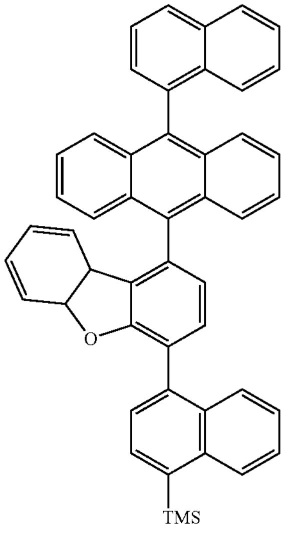
-continued
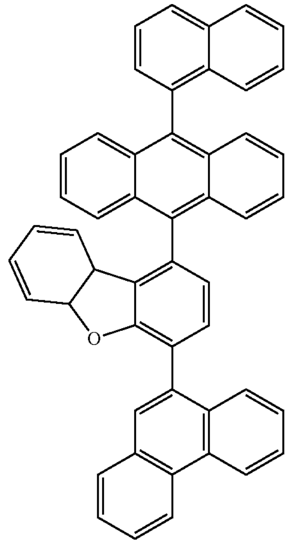
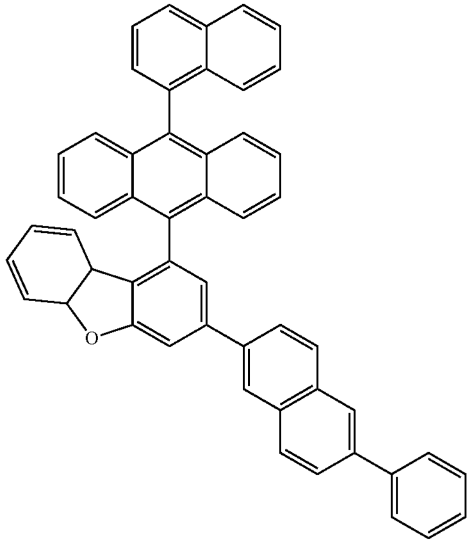
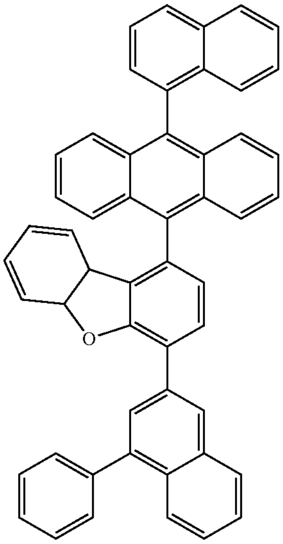

-continued
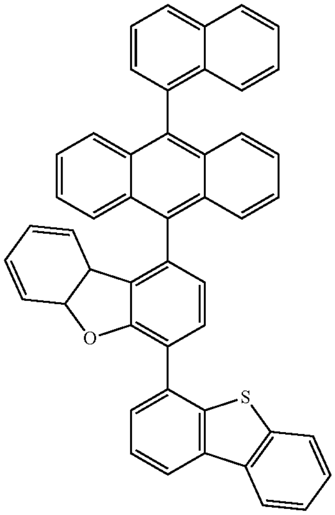
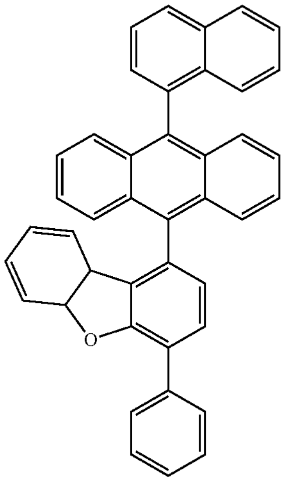
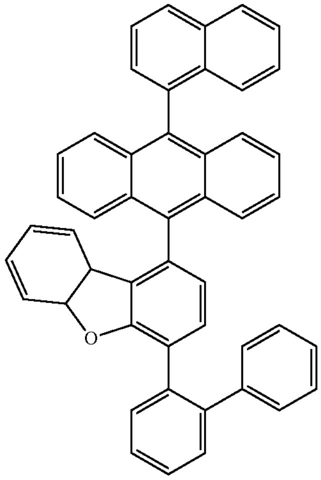
-continued
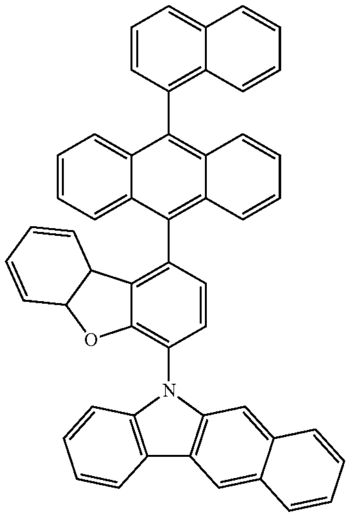
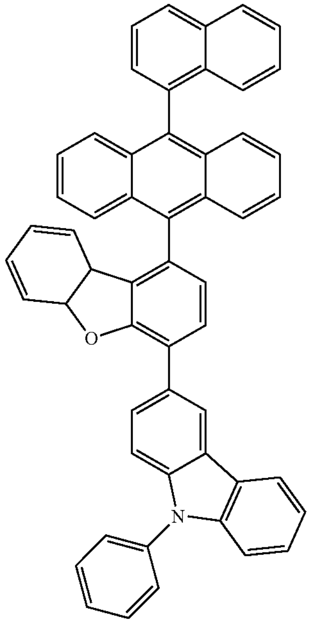
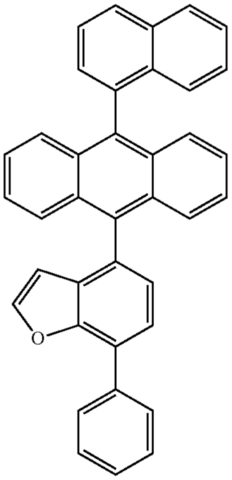

-continued
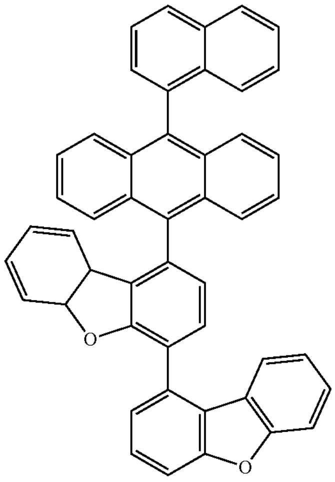
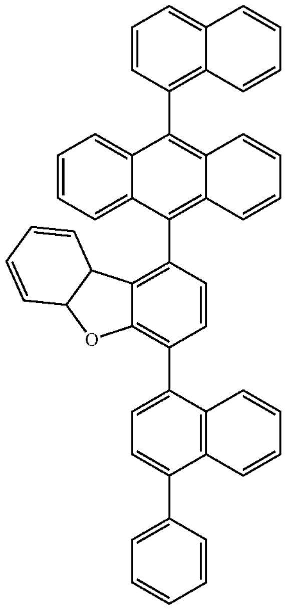
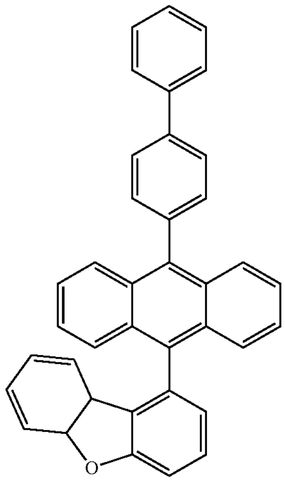
-continued
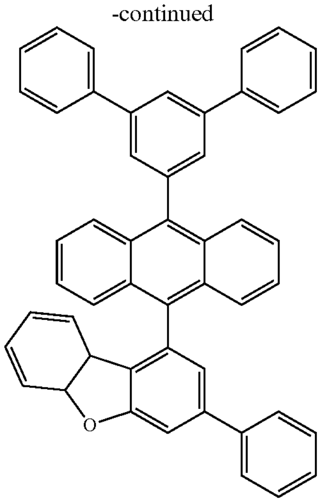
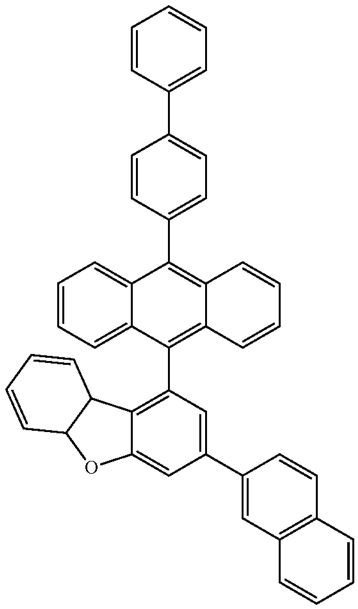
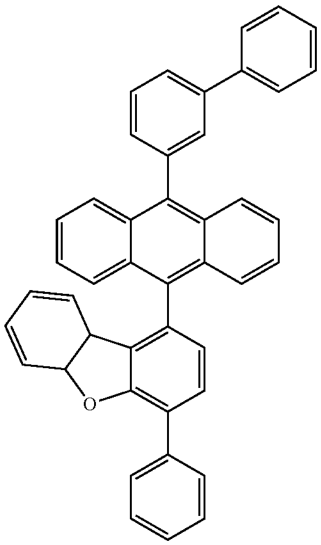

-continued
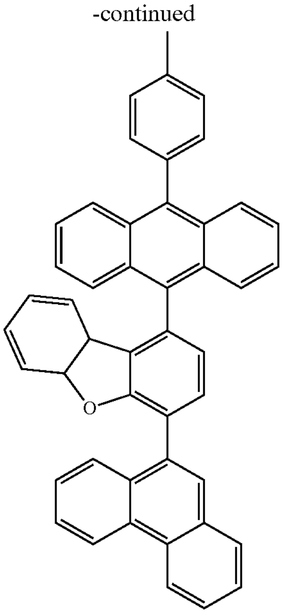
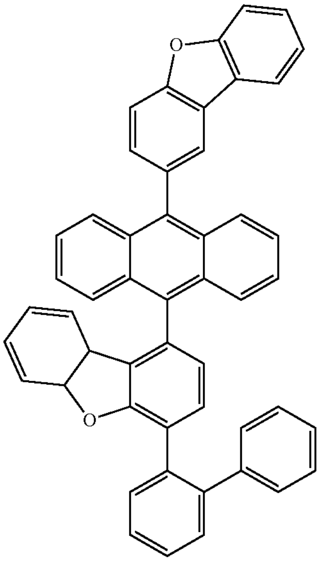
-continued
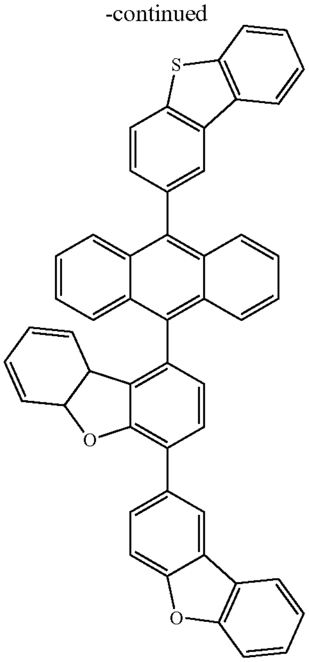
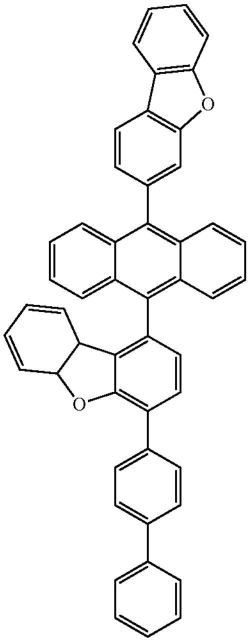

-continued
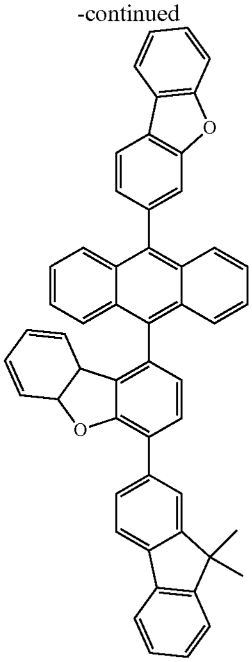
-continued
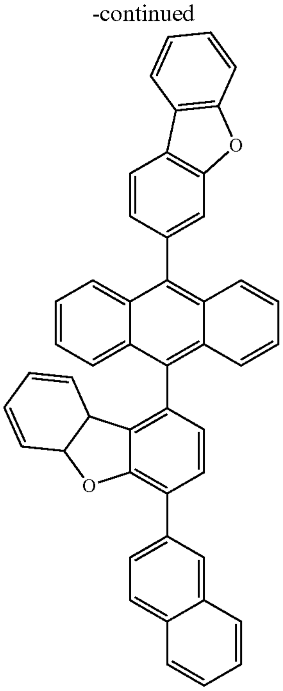
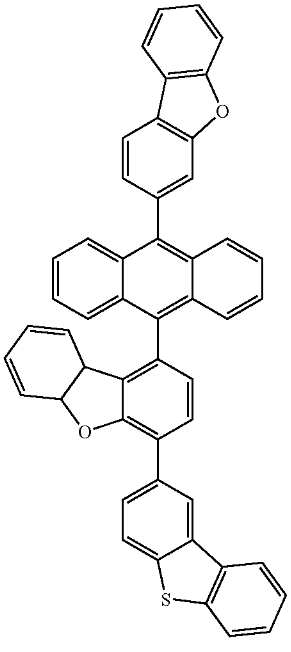
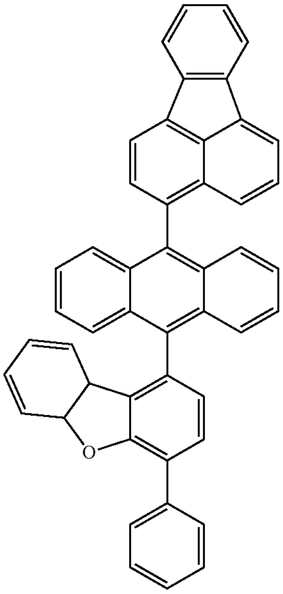

-continued
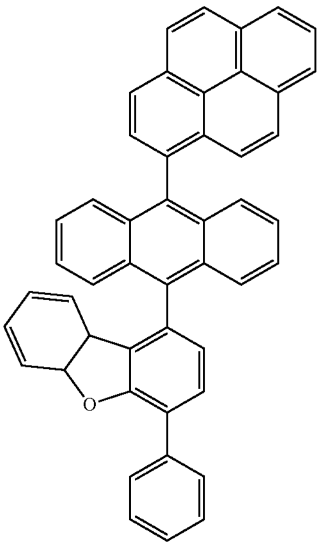
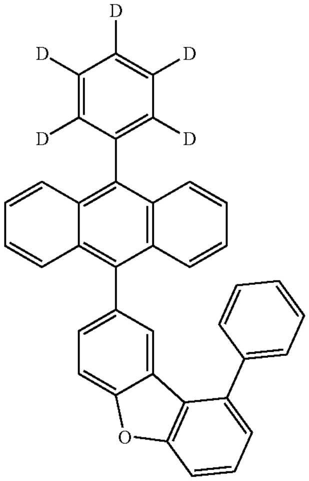
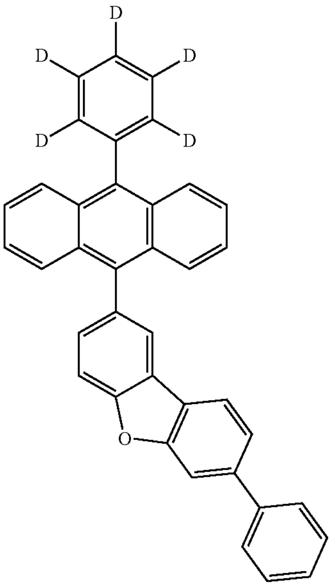
-continued
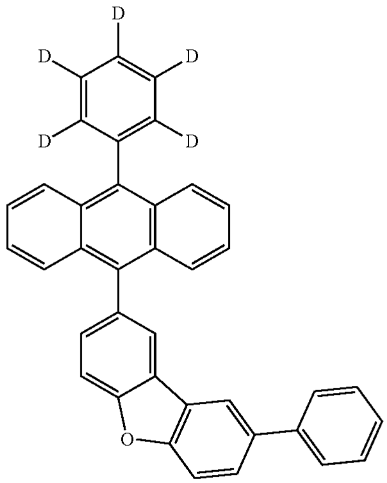
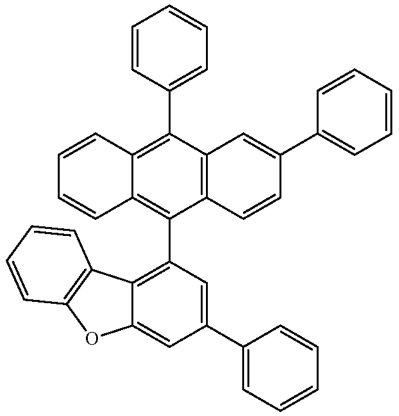
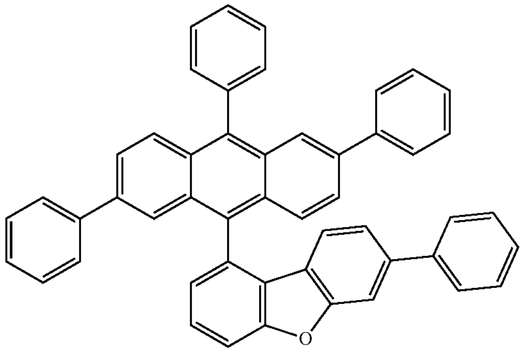
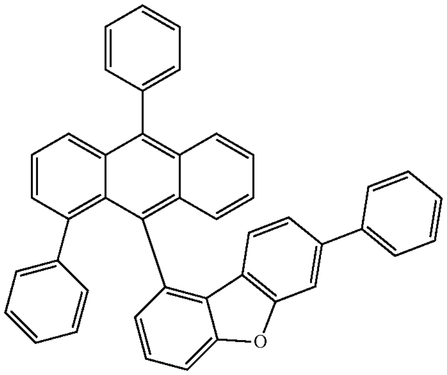

-continued
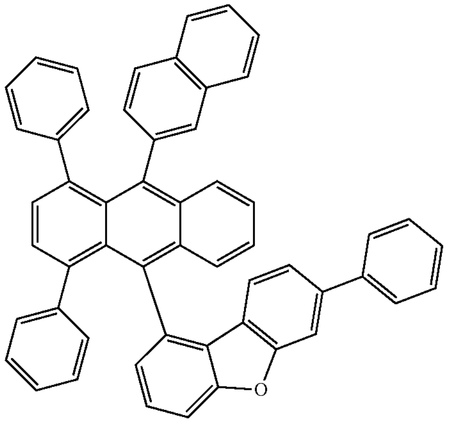
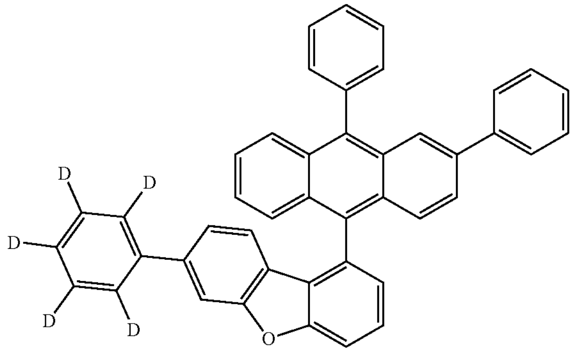
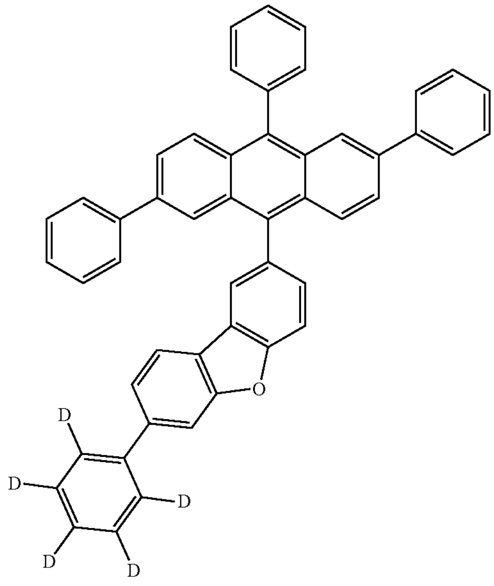
-continued
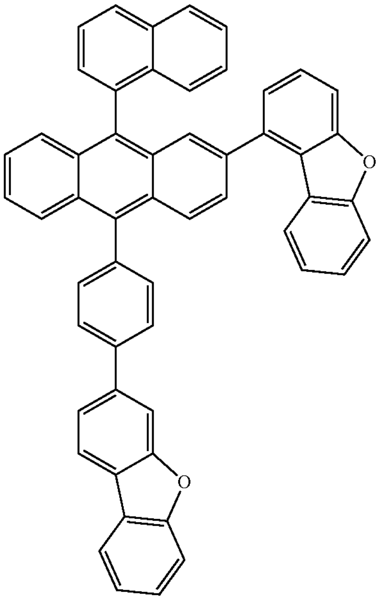
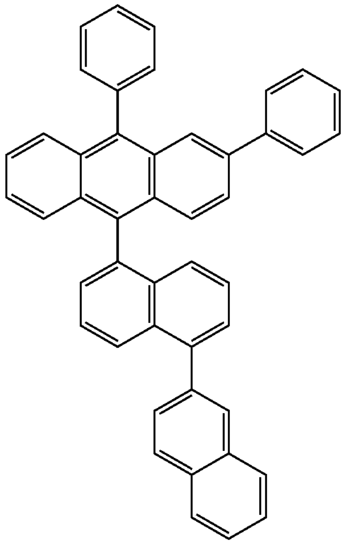
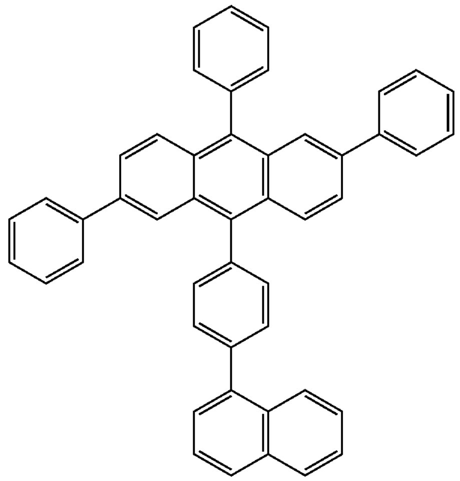

-continued
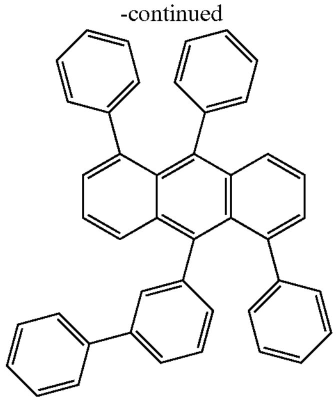
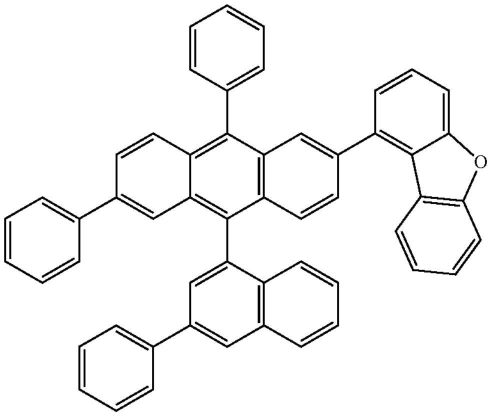
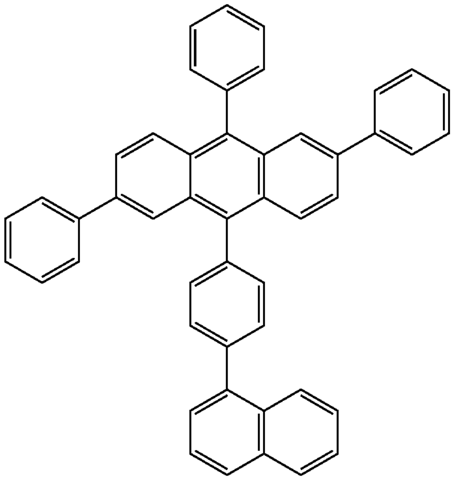
-continued
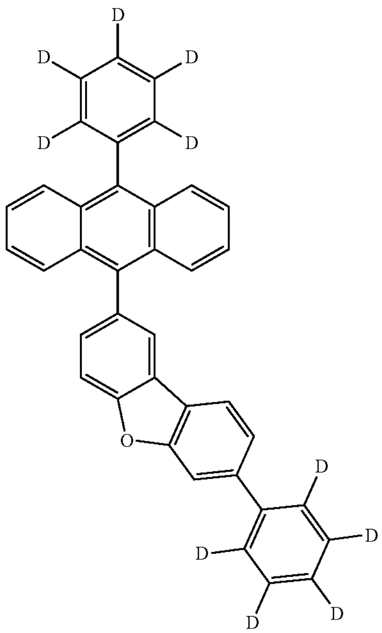
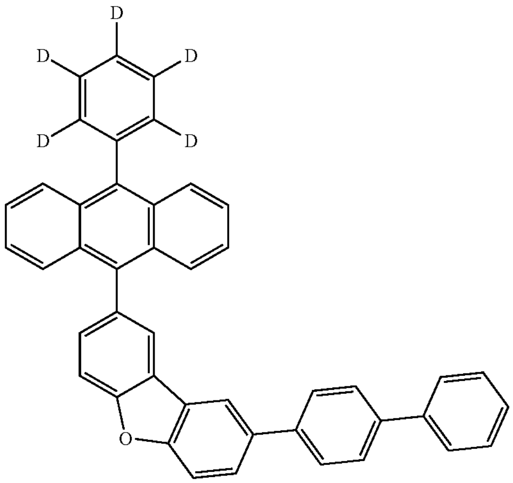

-continued
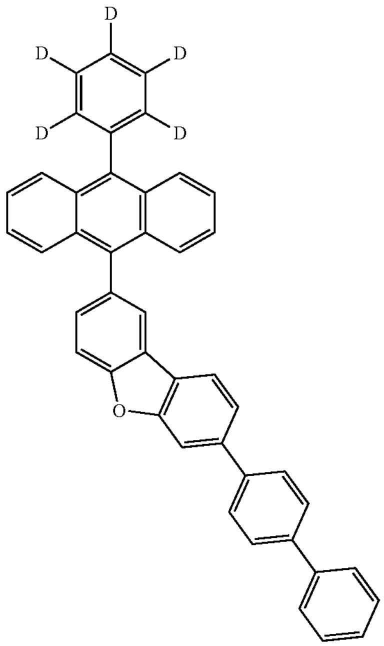
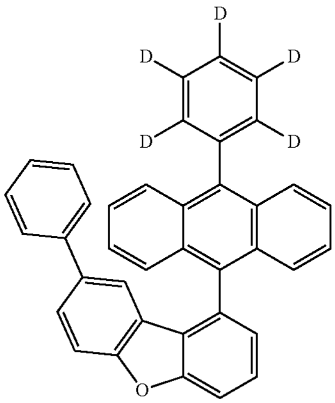
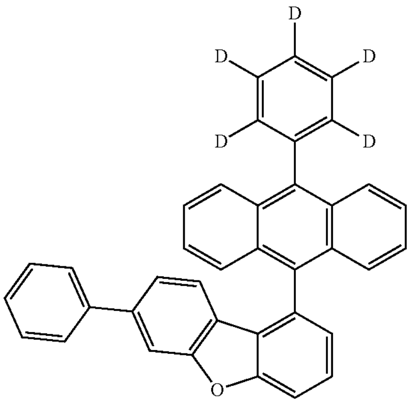
-continued
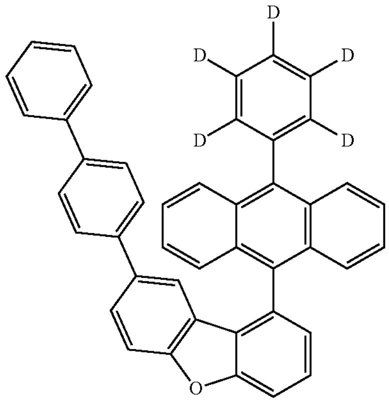
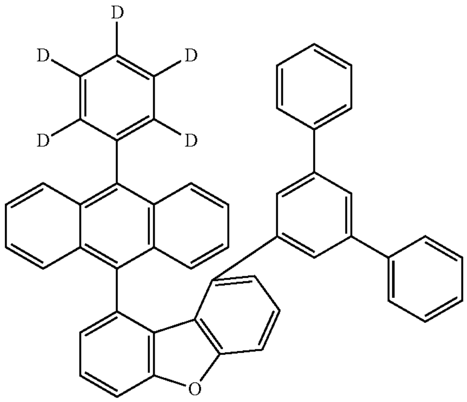
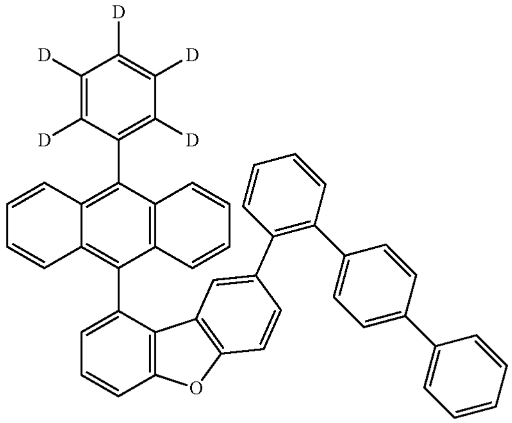
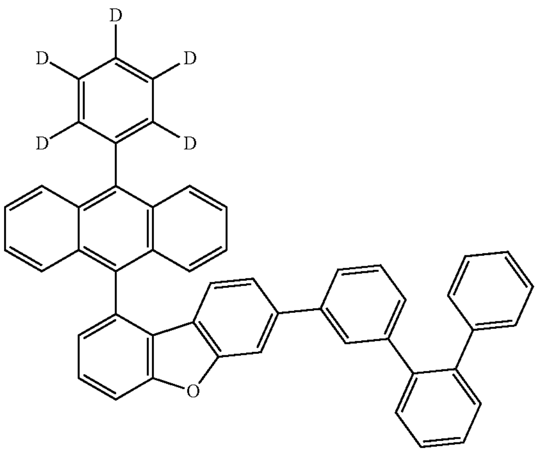

-continued
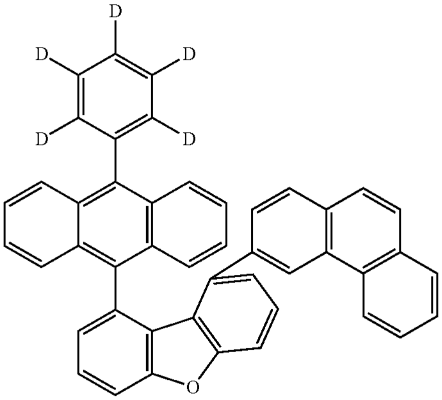
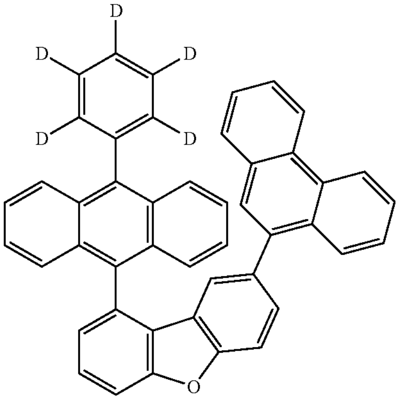
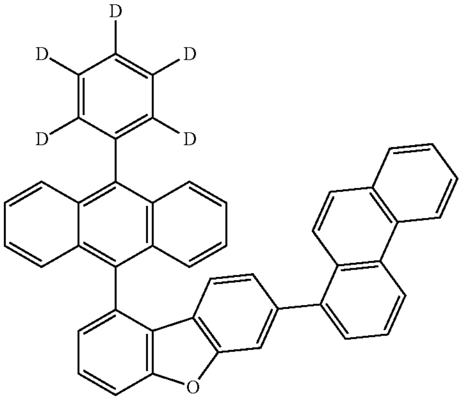
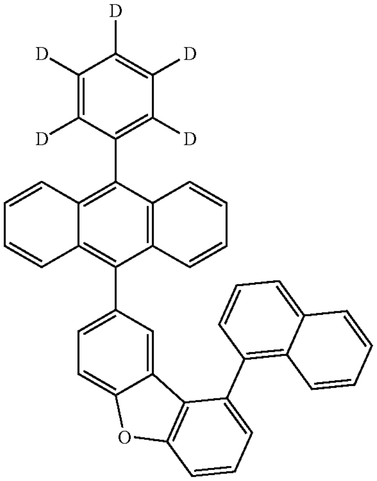
-continued
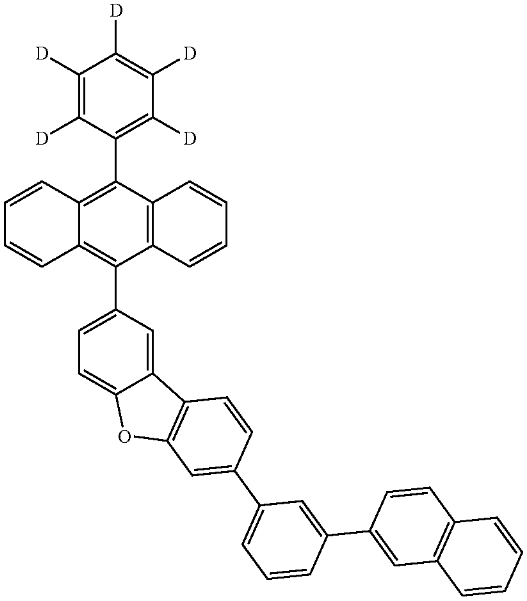
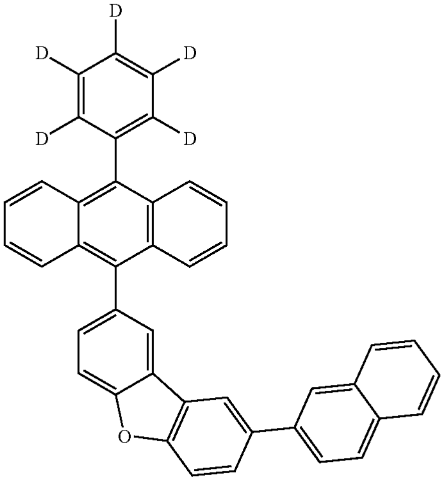
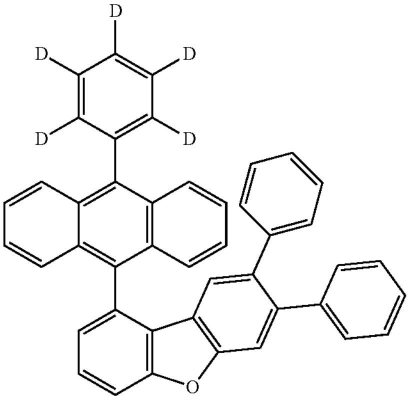

-continued
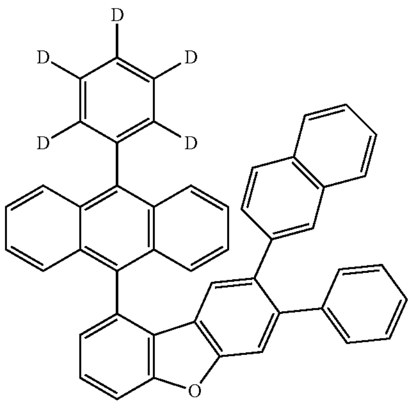
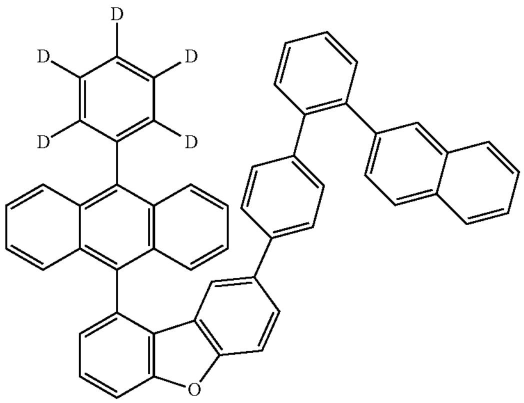
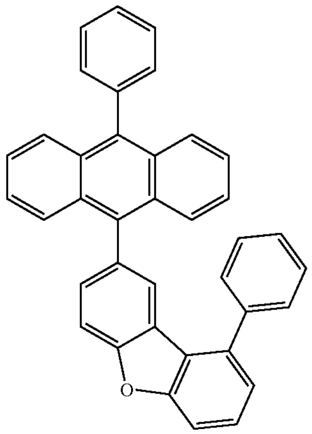
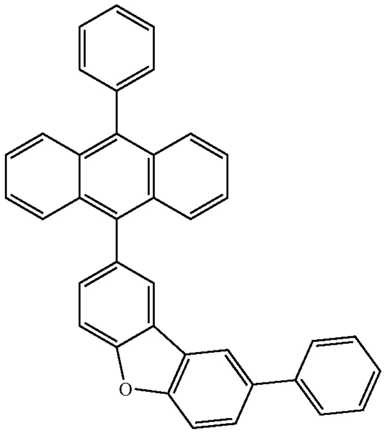
-continued
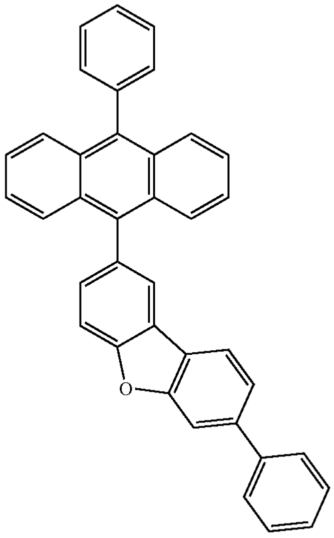
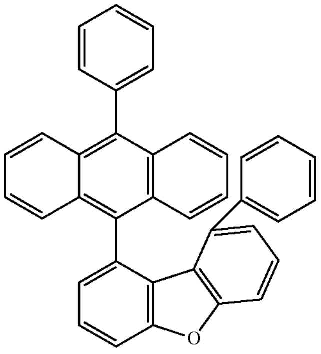
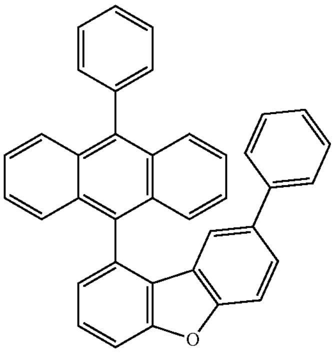
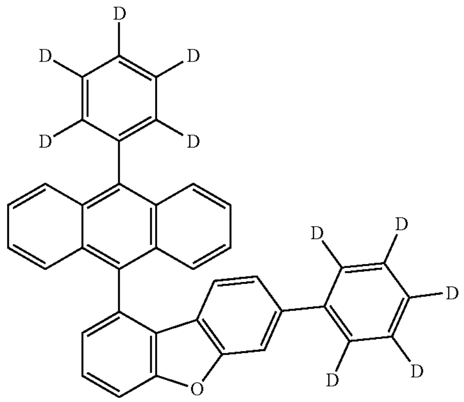

-continued
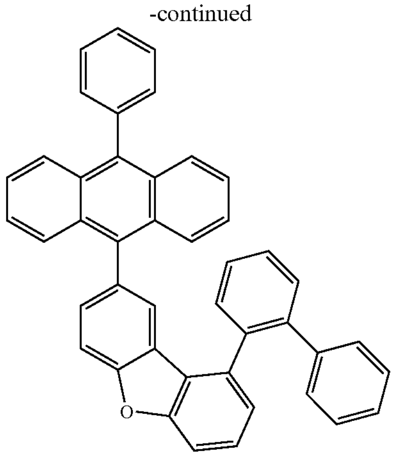
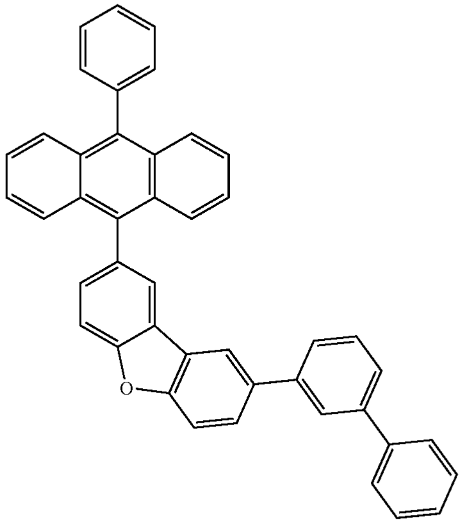
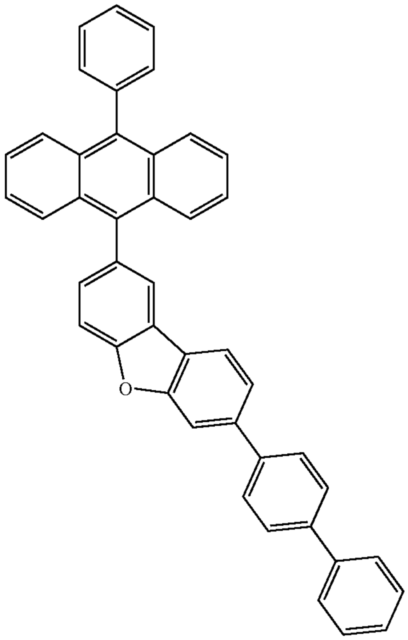
-continued
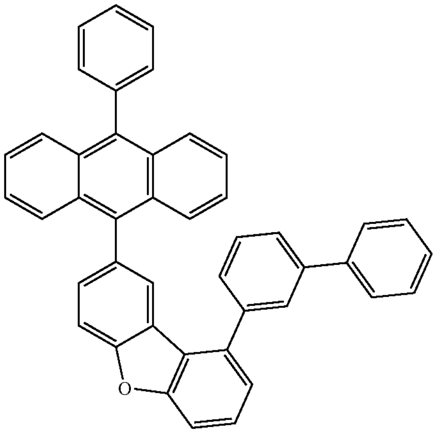
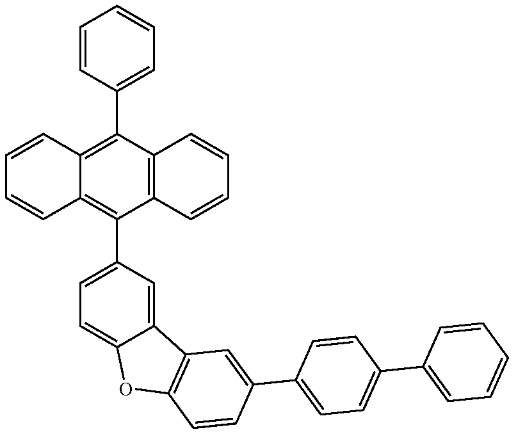
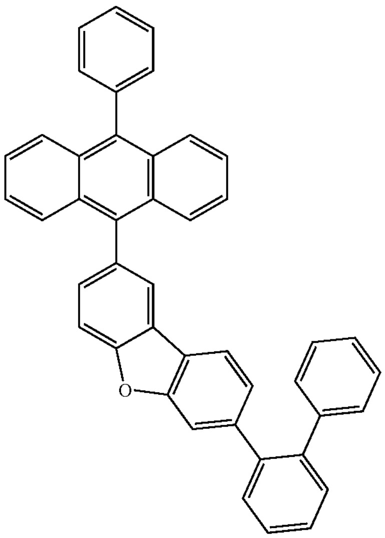

-continued
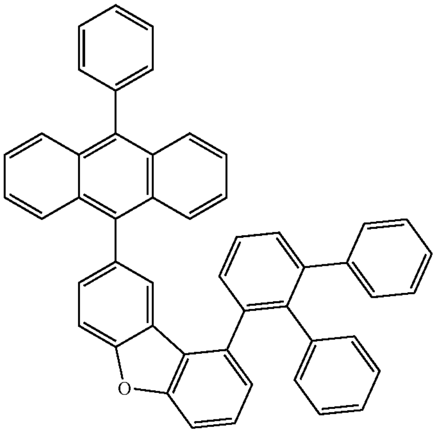
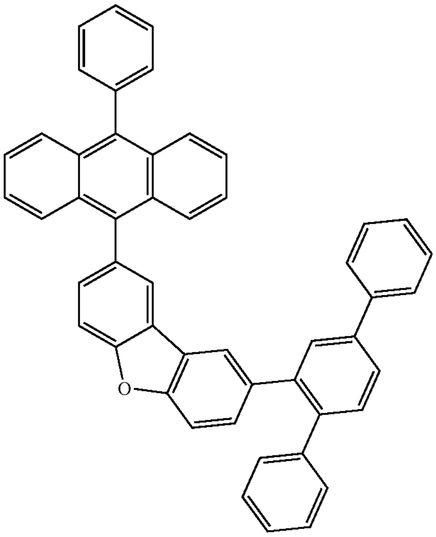
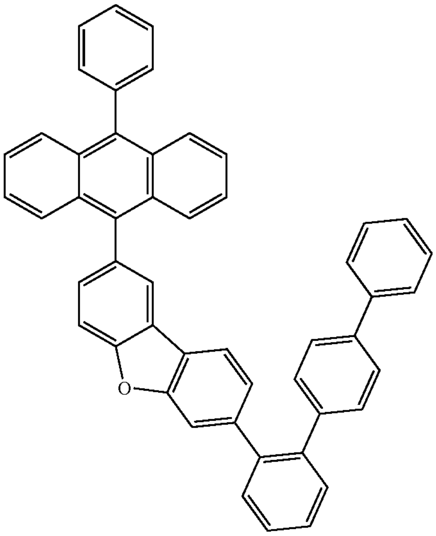
-continued
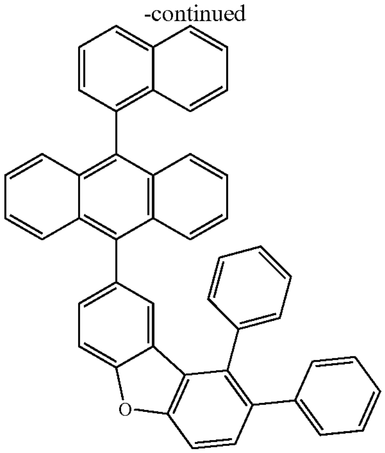
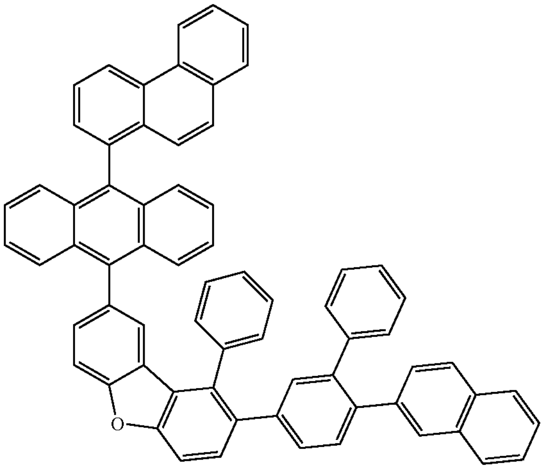
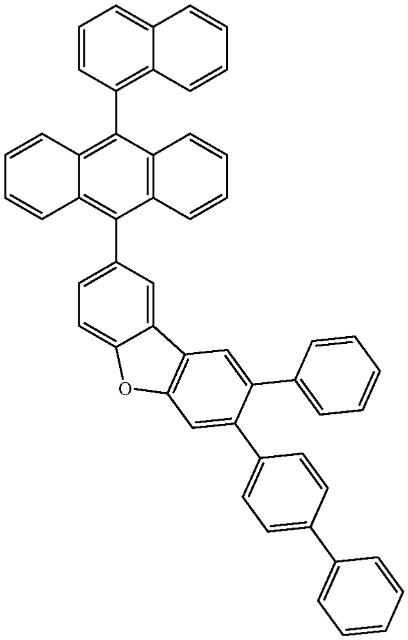

-continued
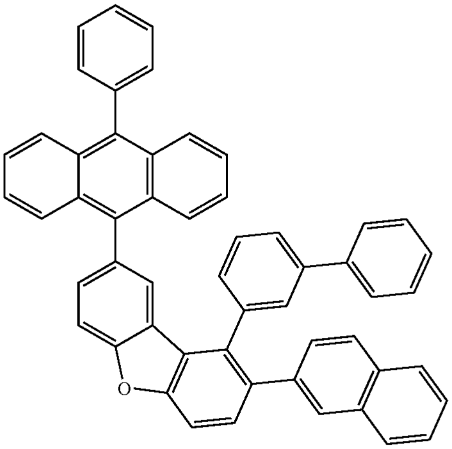
-continued
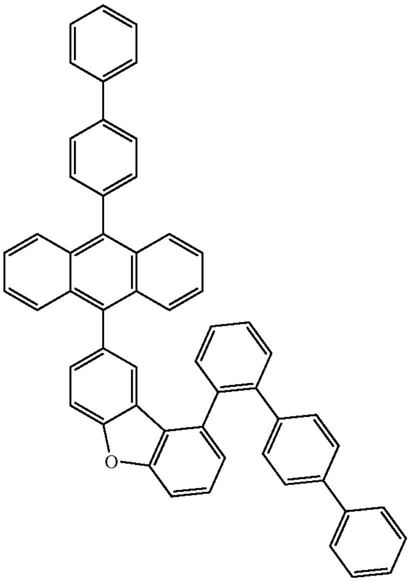
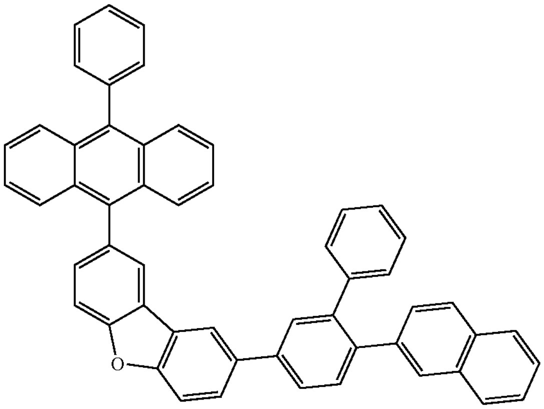
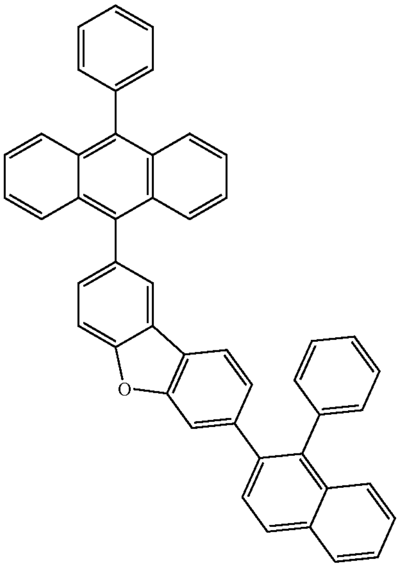
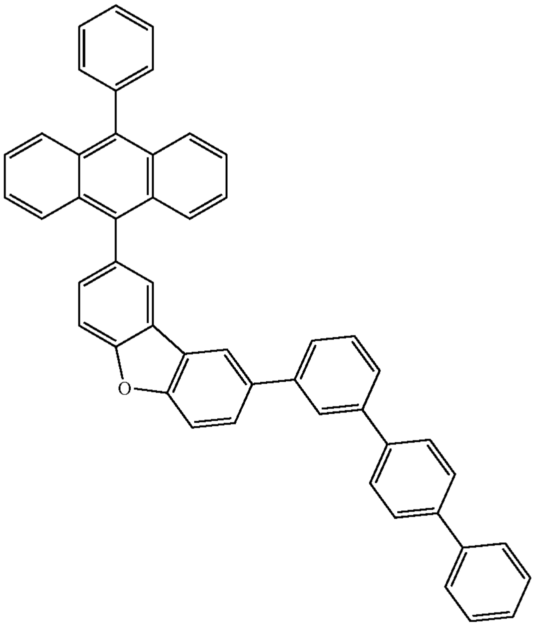

-continued
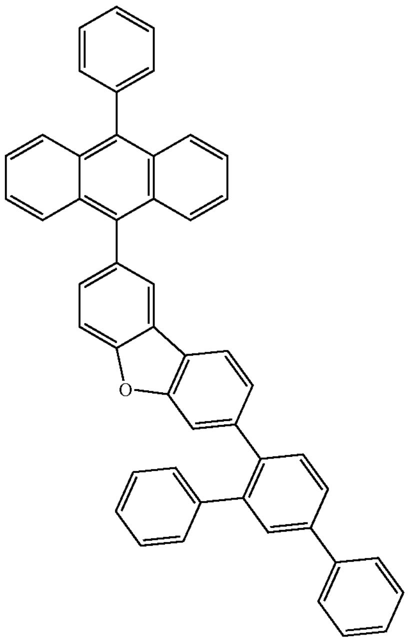
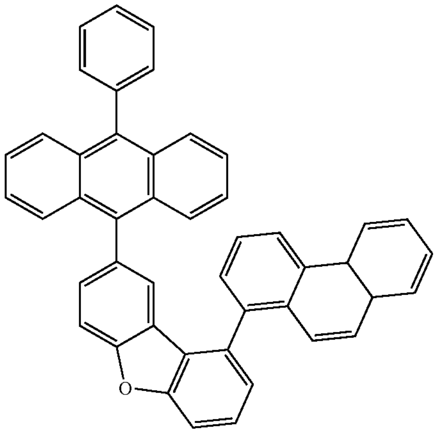
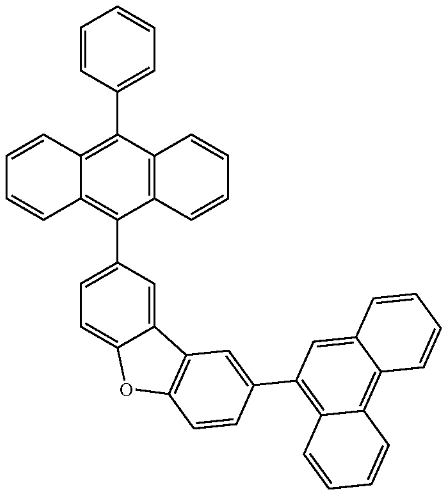
-continued
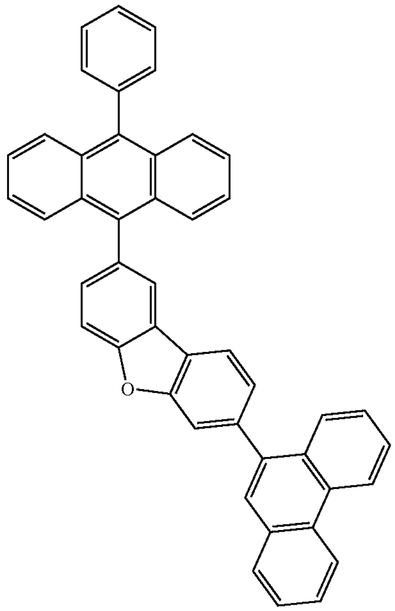
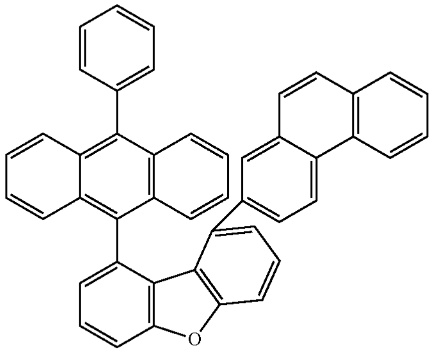
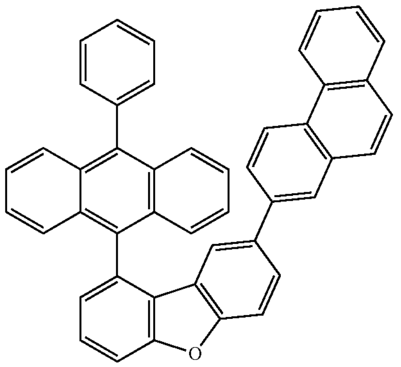
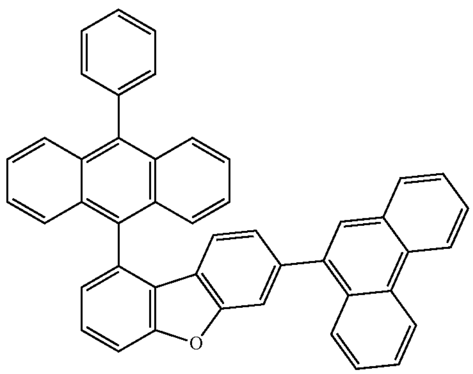

-continued
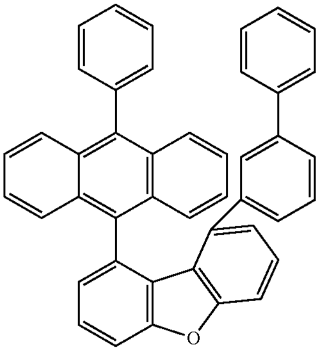
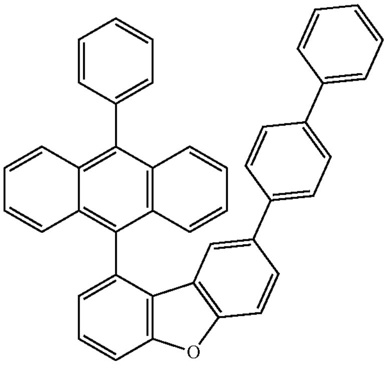
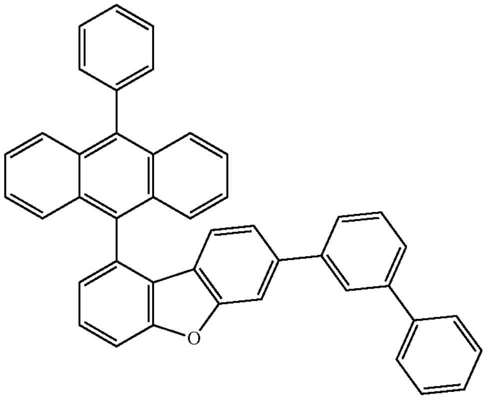
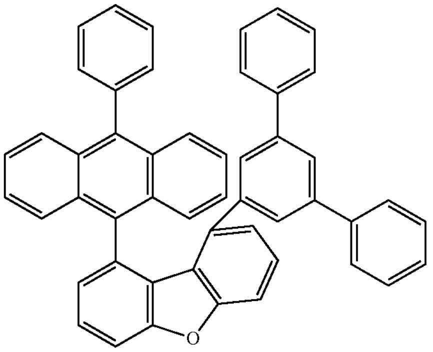
-continued
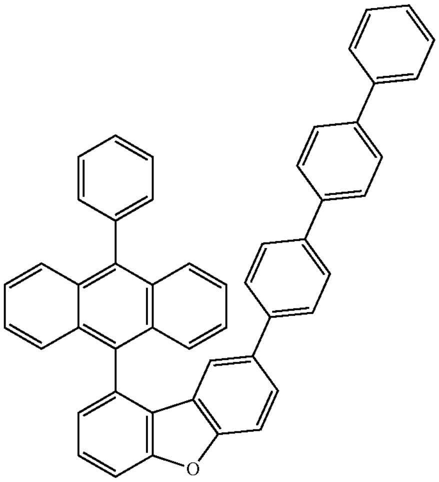
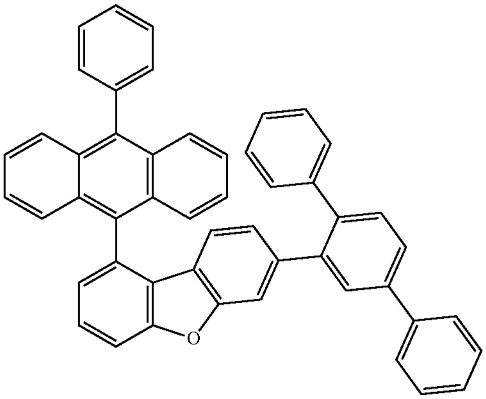
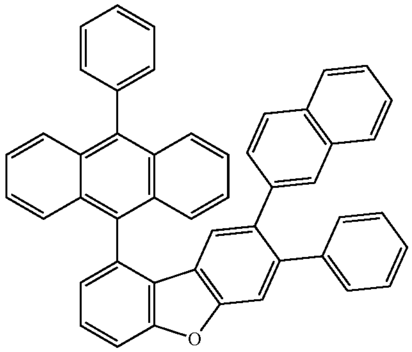
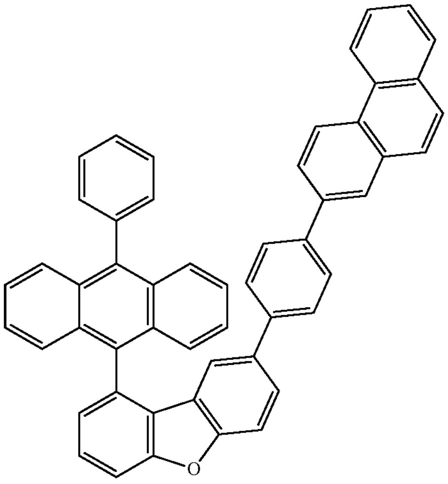

-continued
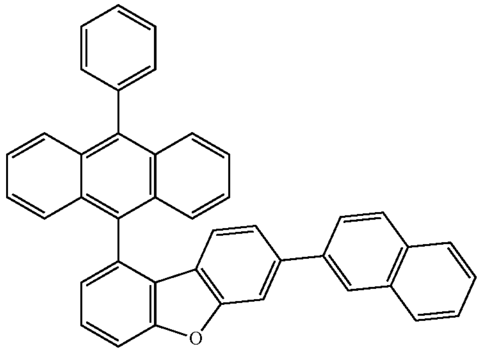
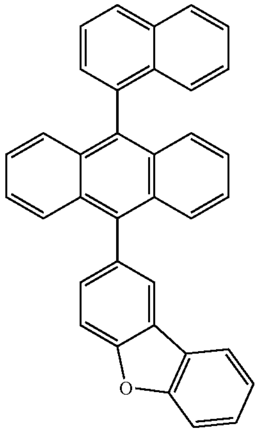
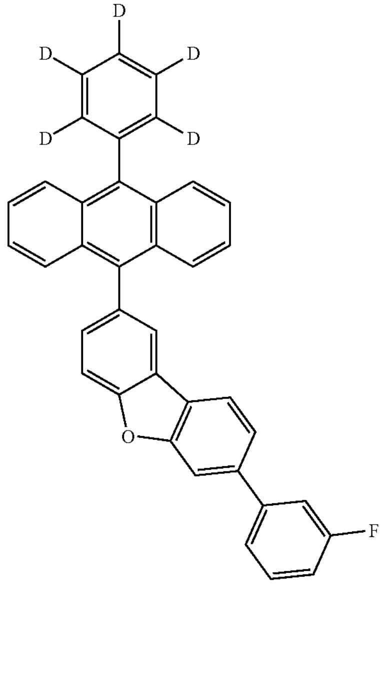
-continued
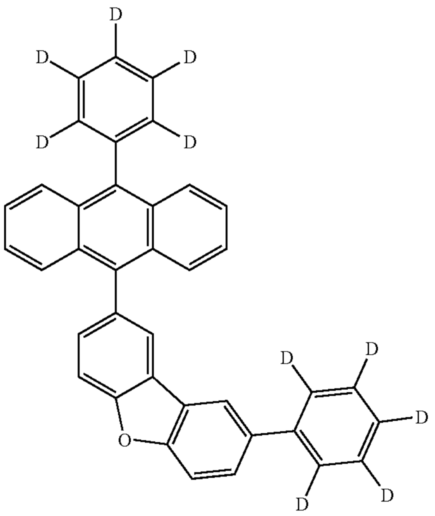
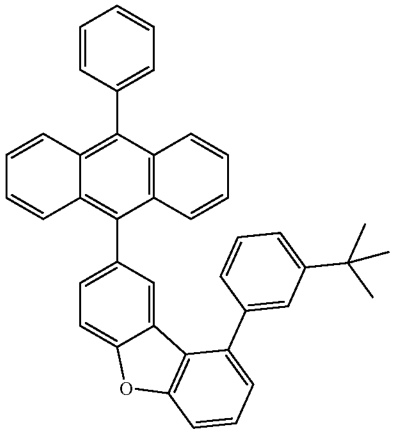
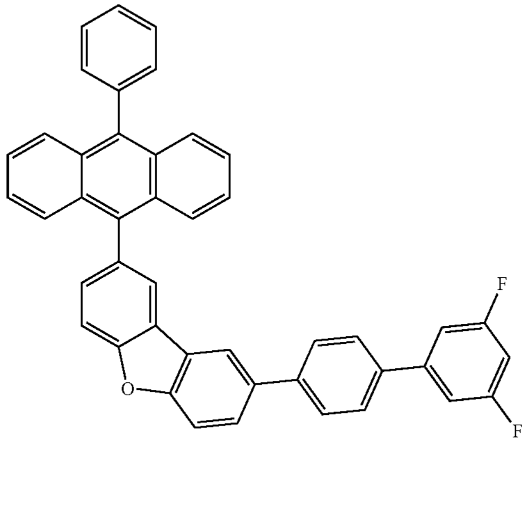

-continued
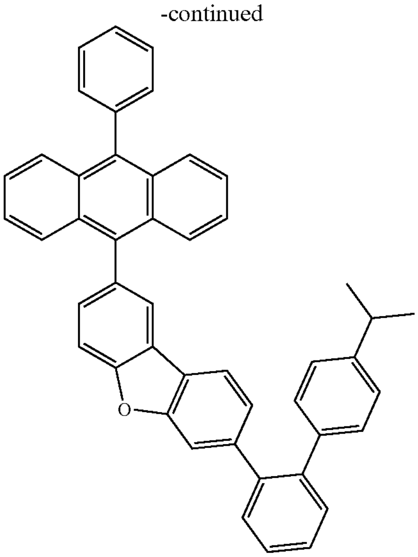
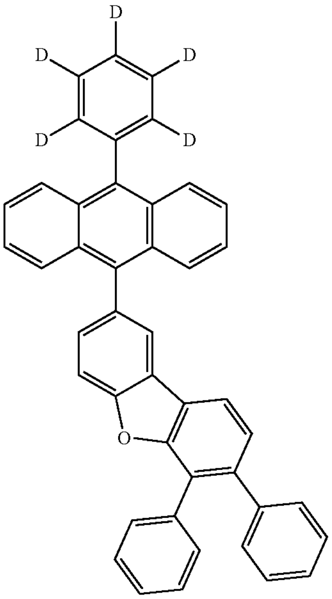
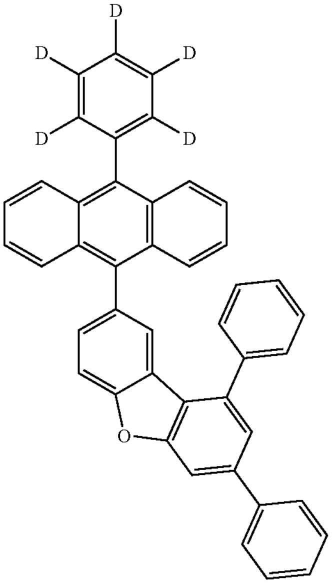
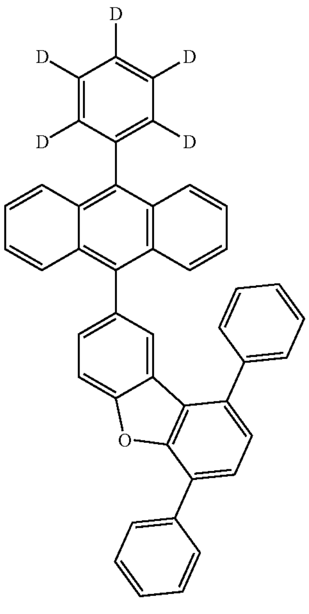
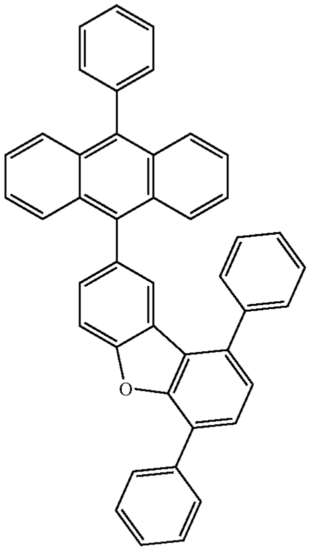

-continued
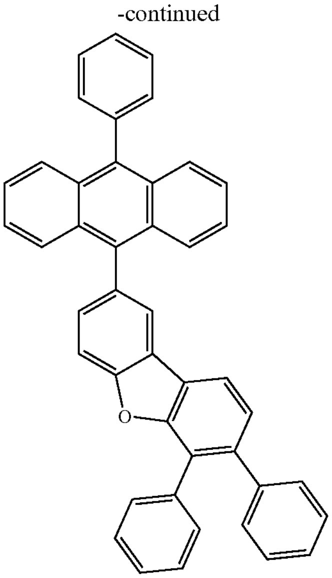
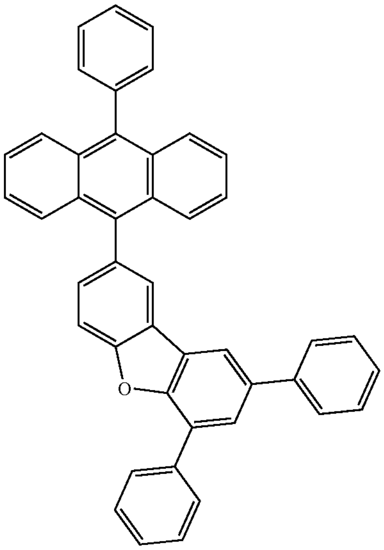
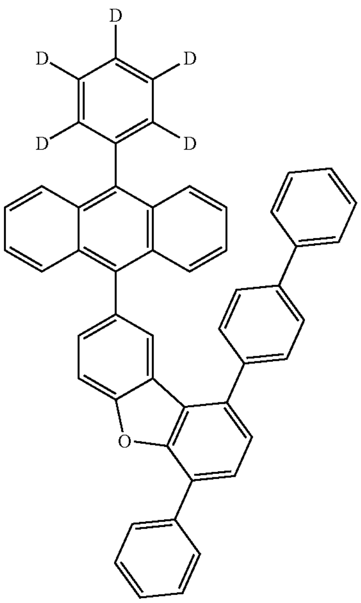
-continued
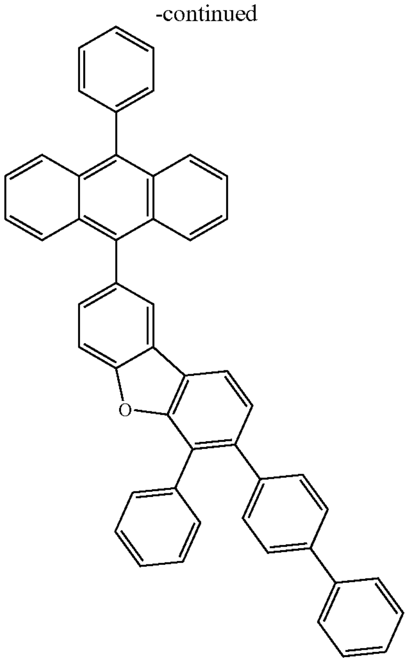
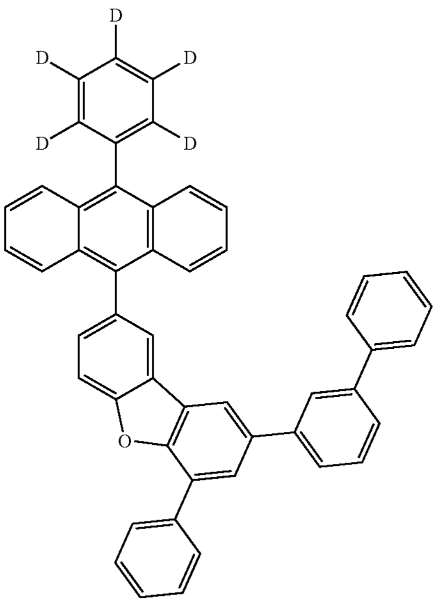

-continued
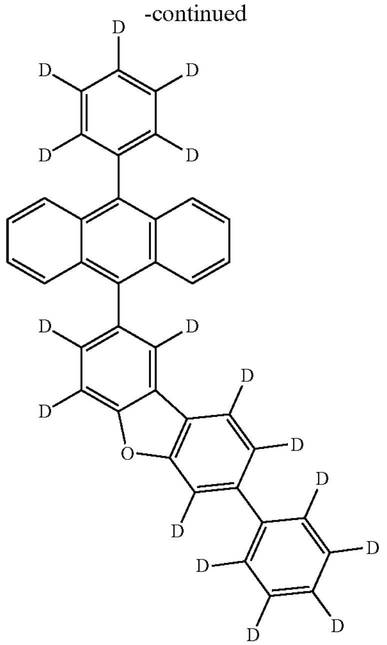
-continued
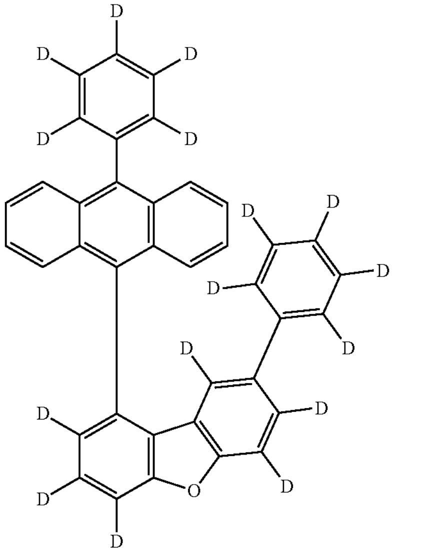
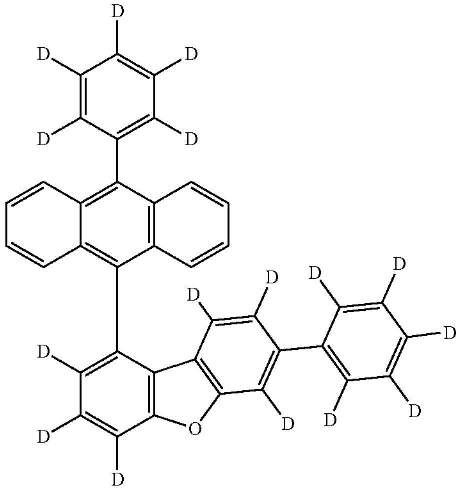
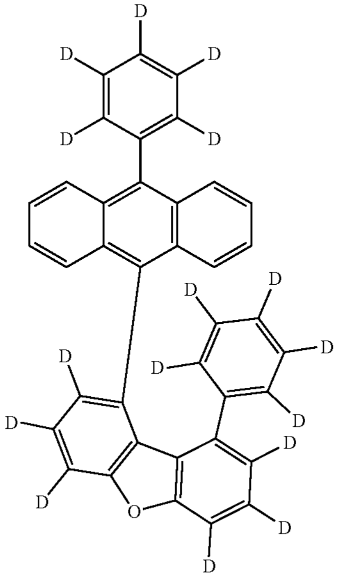
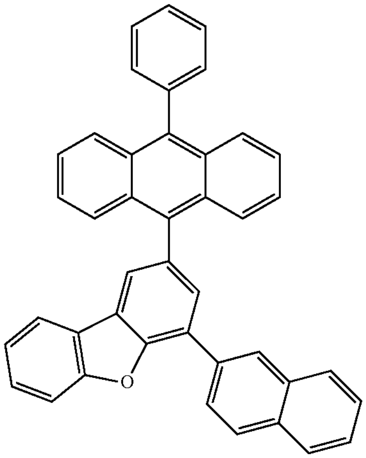

-continued
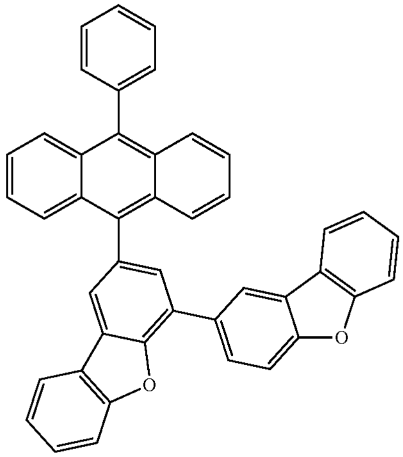
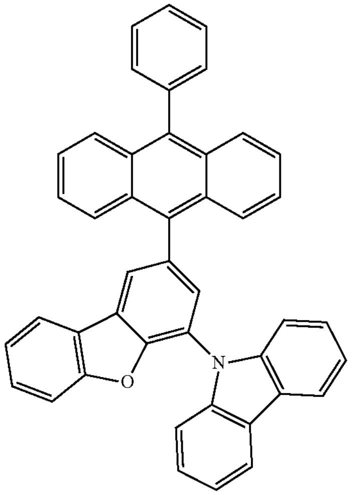
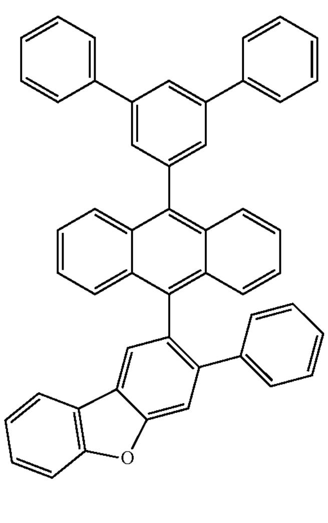
-continued
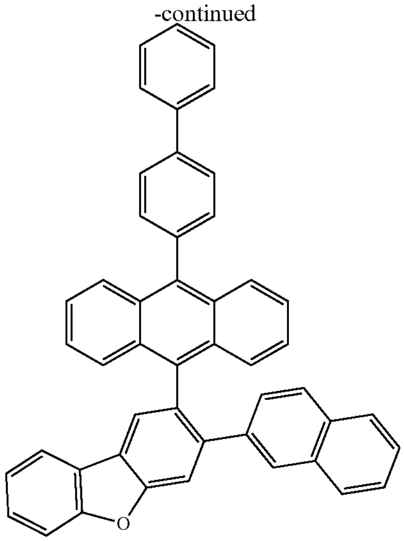
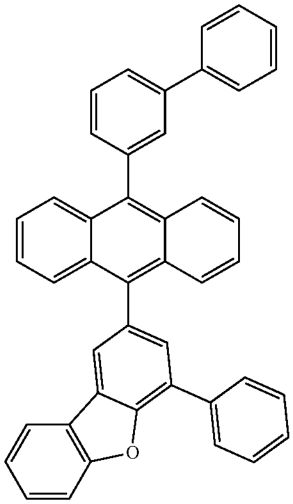
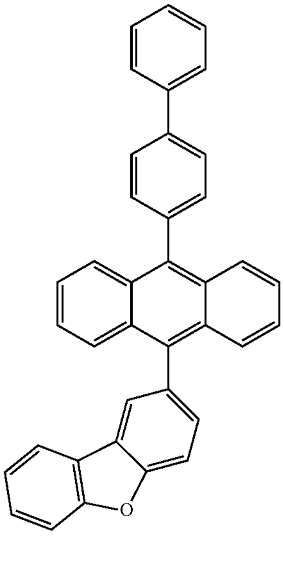

-continued
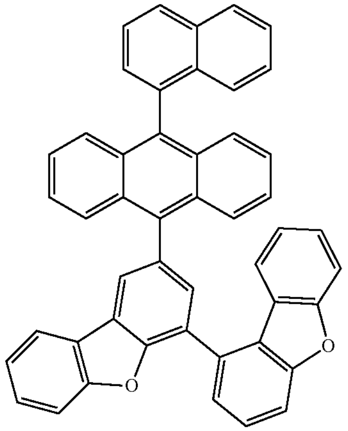
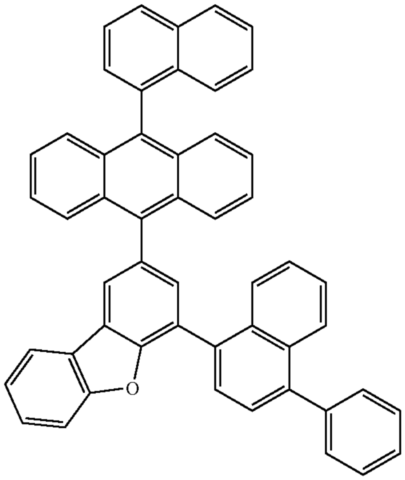
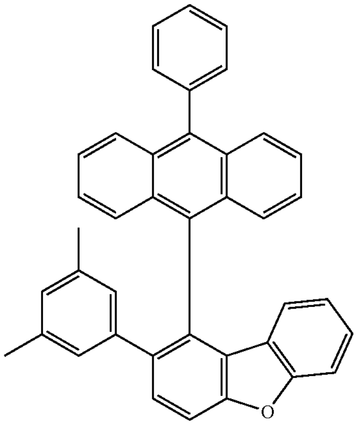
-continued
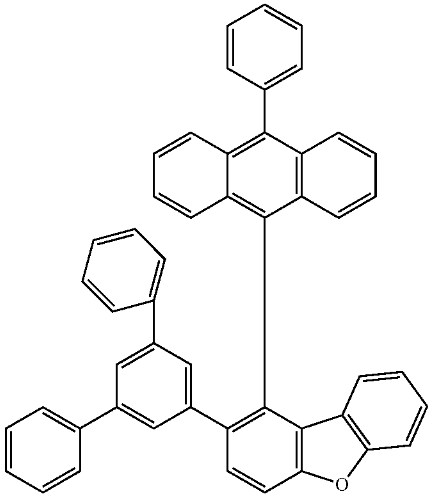
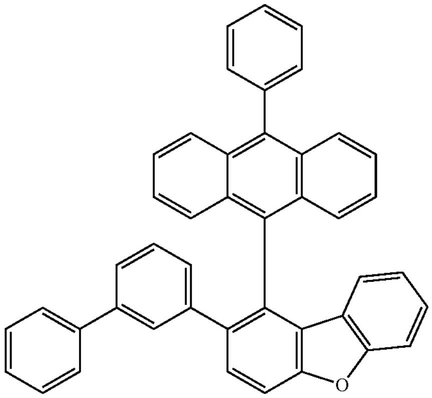
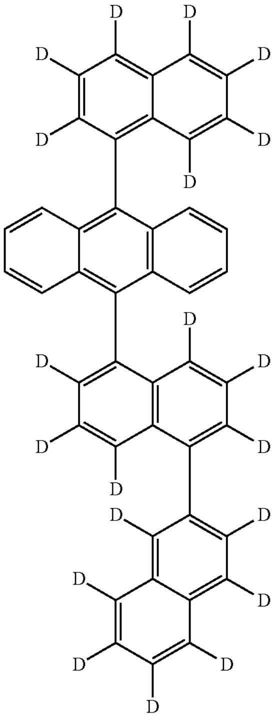

-continued
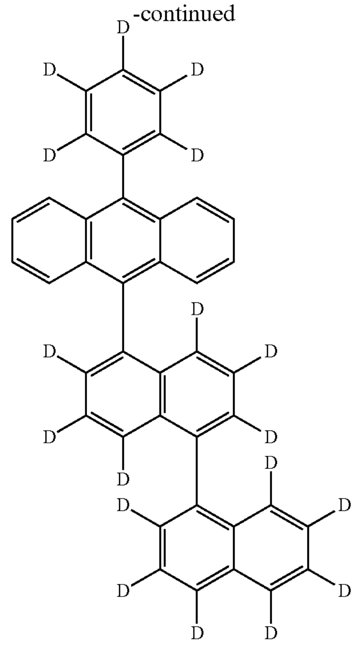
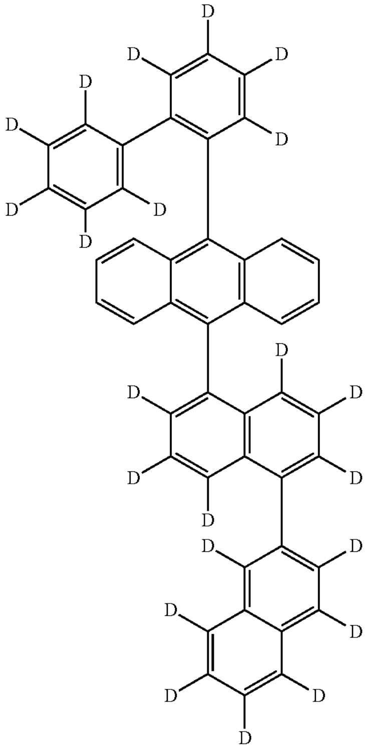
-continued
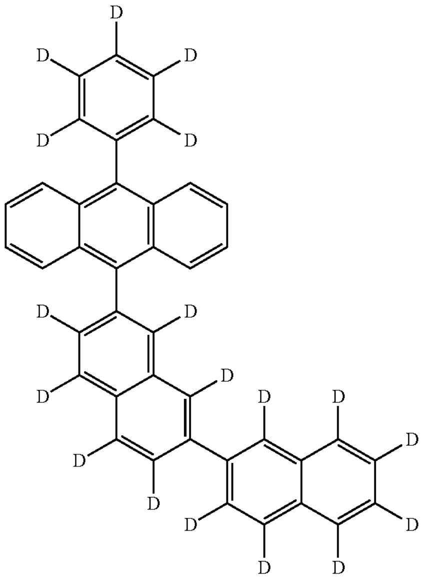
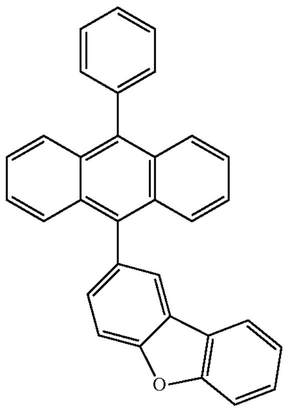
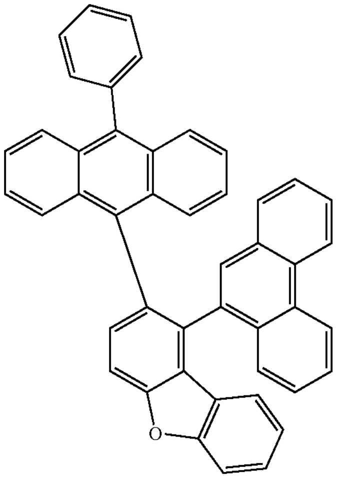

-continued
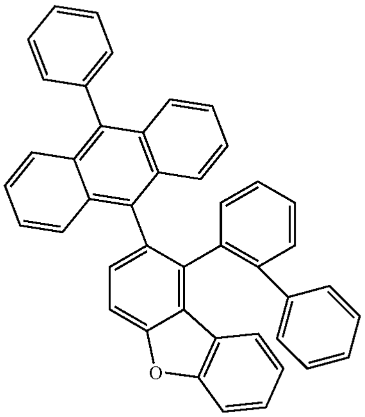
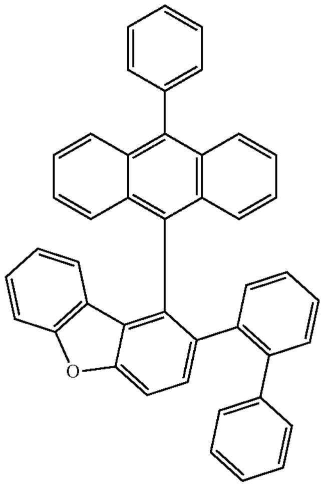
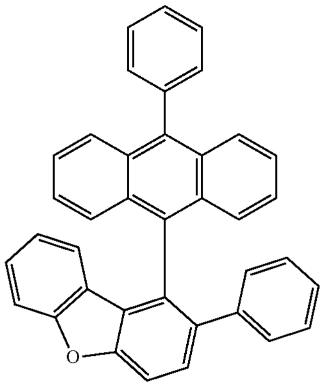
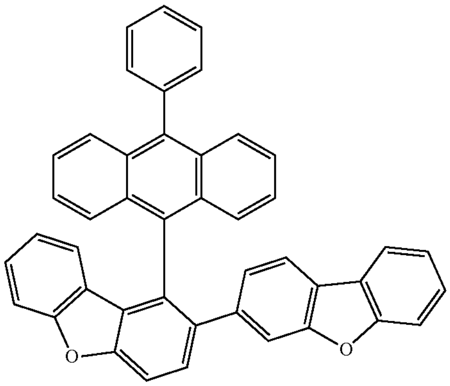
-continued
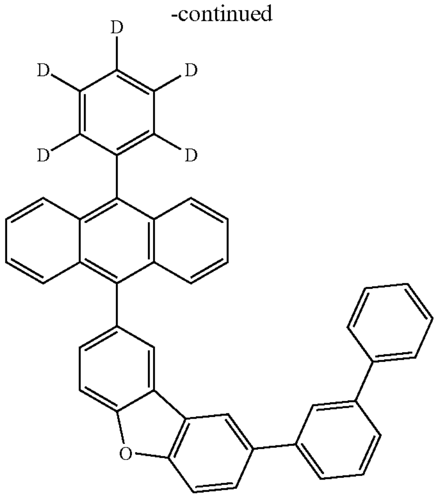
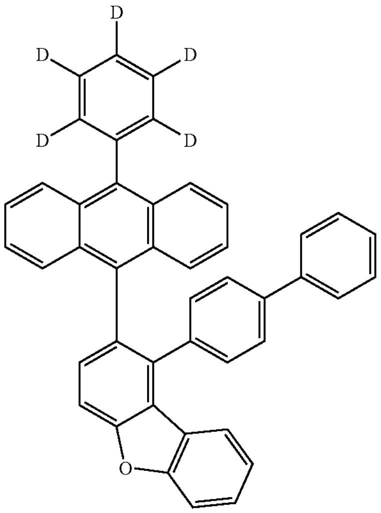
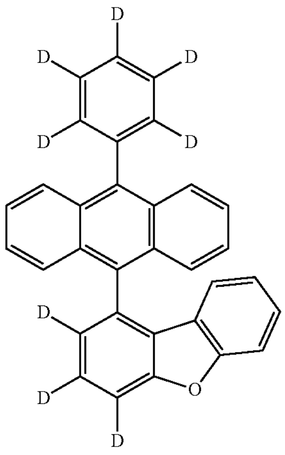
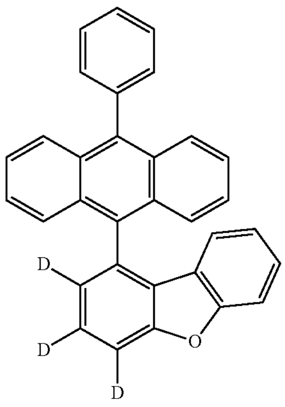

-continued
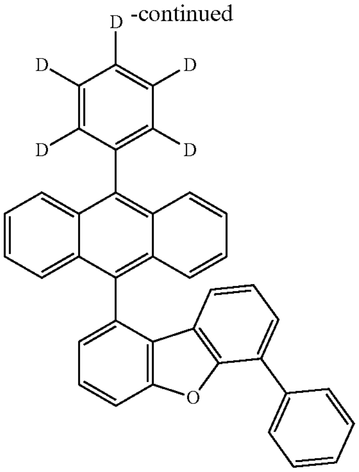
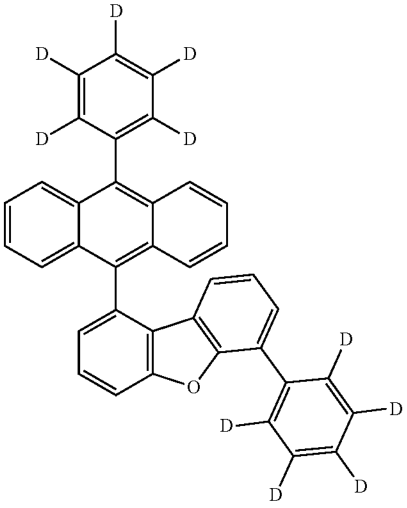
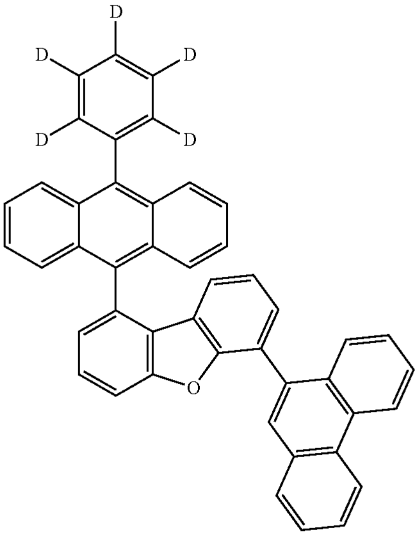
-continued
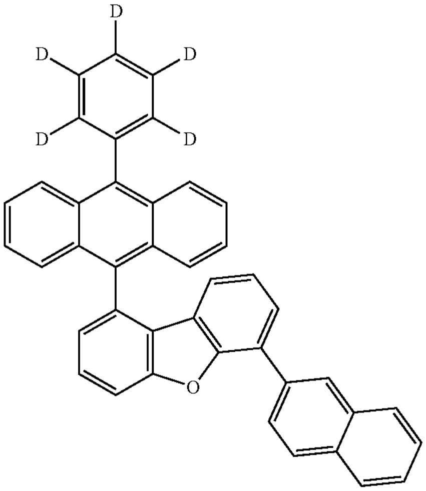
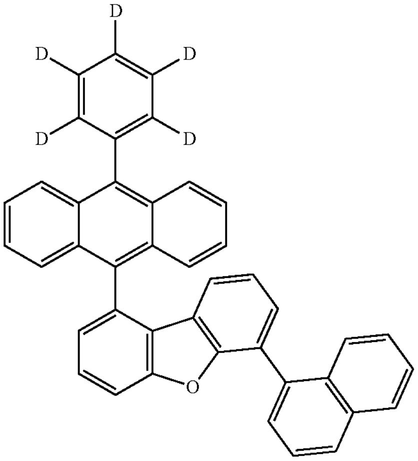
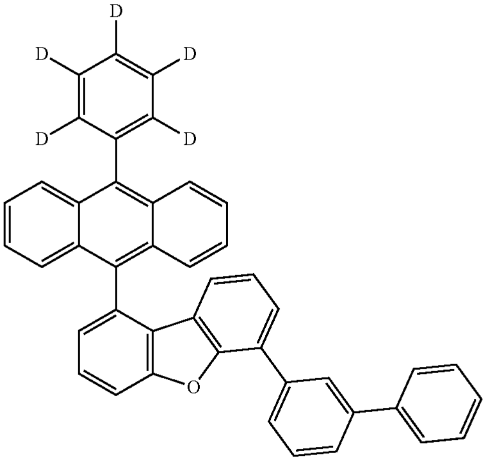

-continued
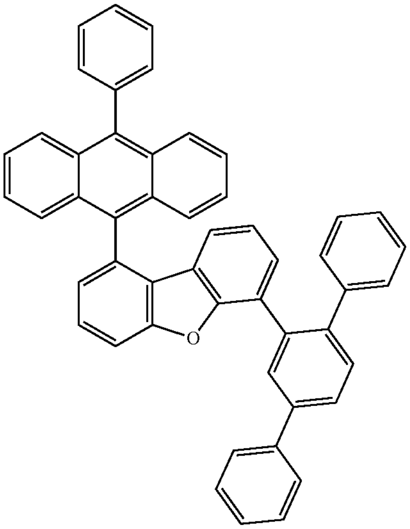
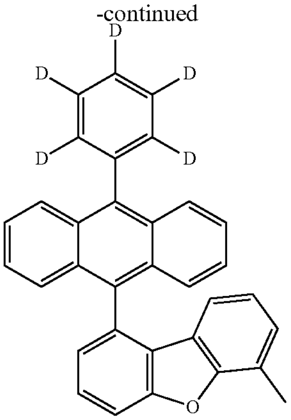
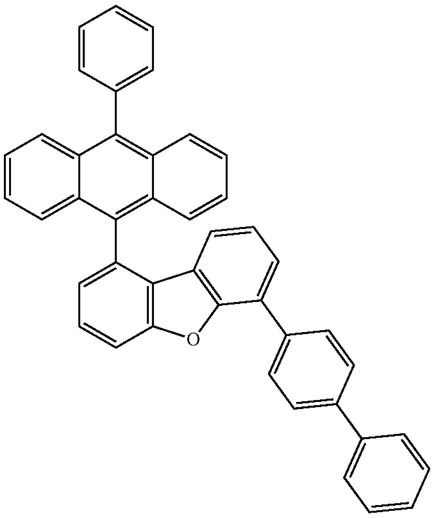
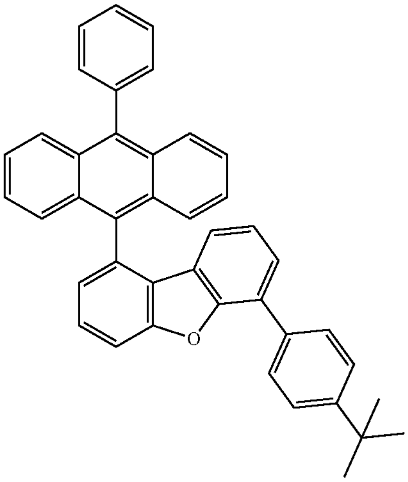
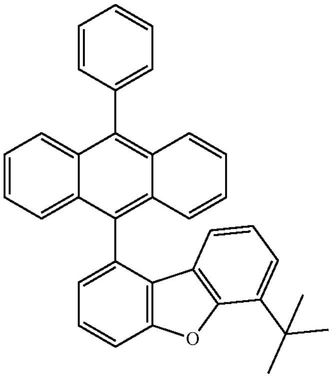
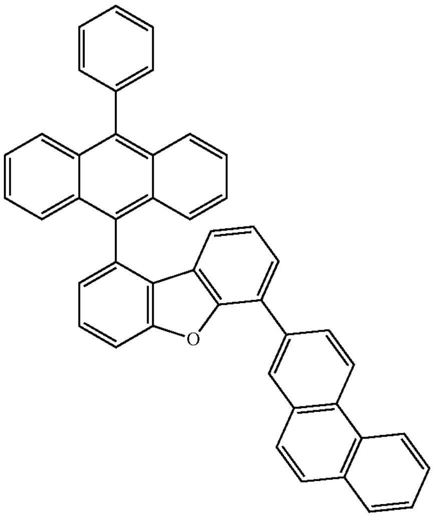

-continued
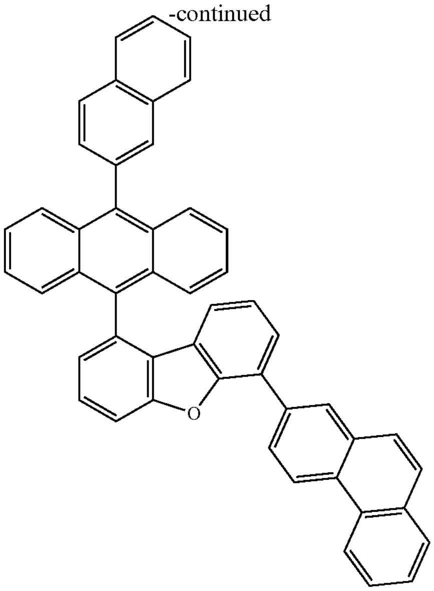
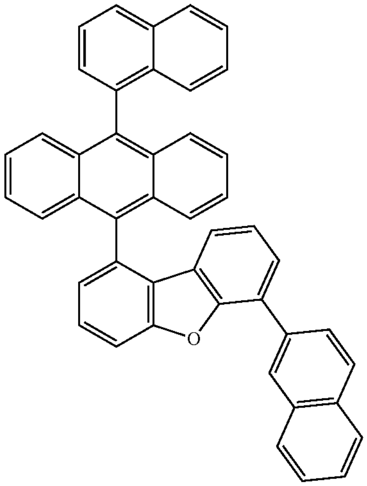
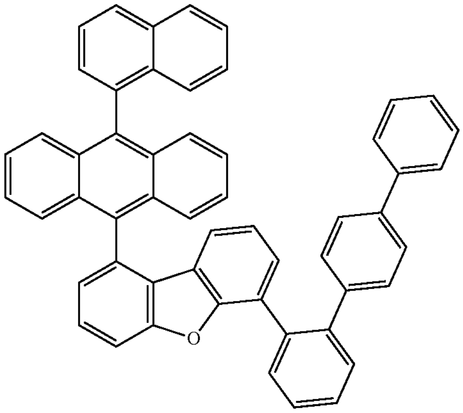
-continued
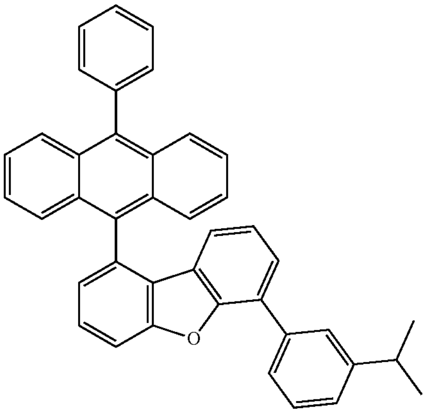
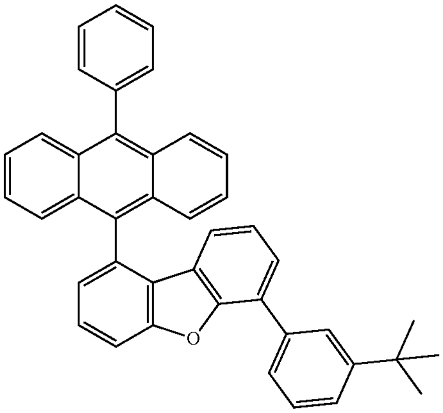
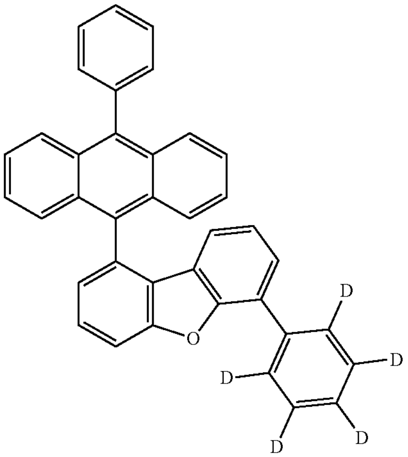

-continued
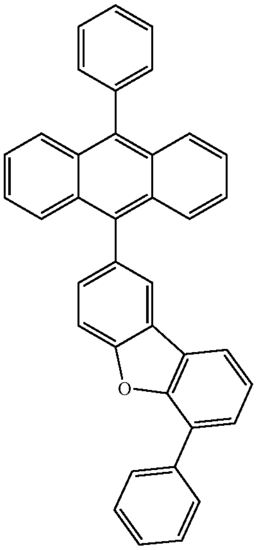
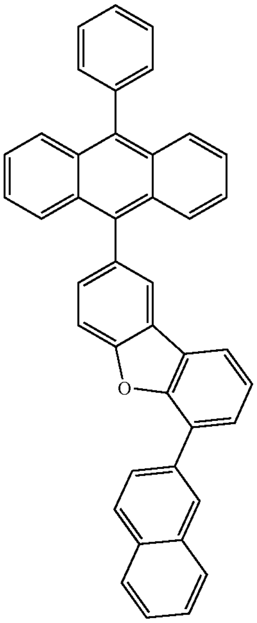
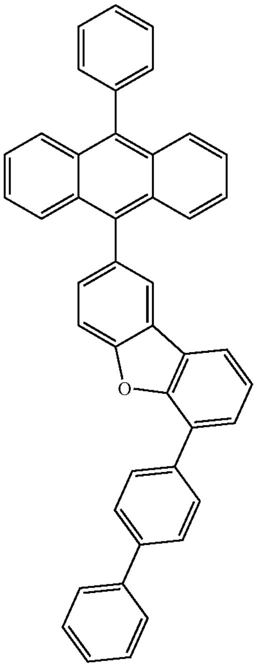
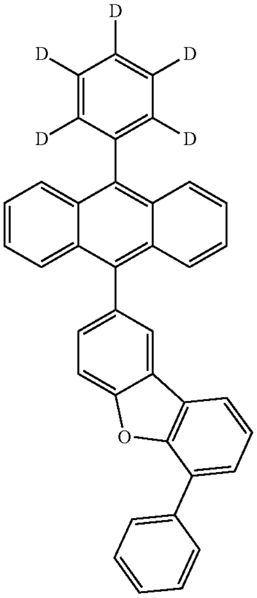
-continued
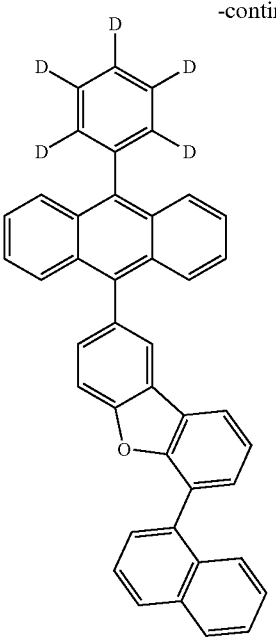
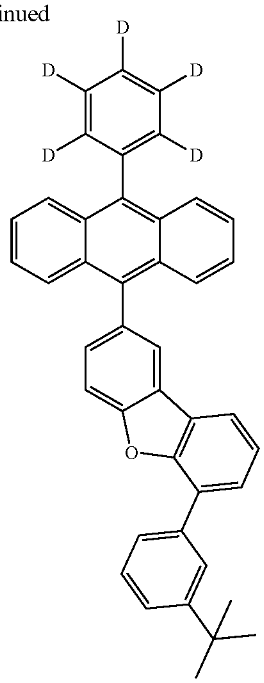
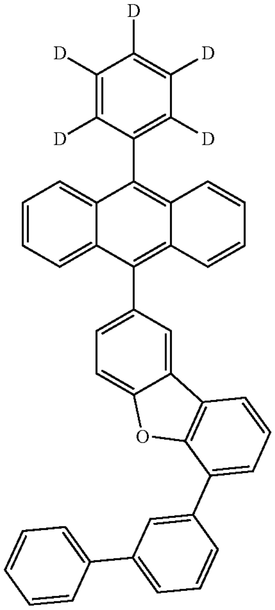

-continued
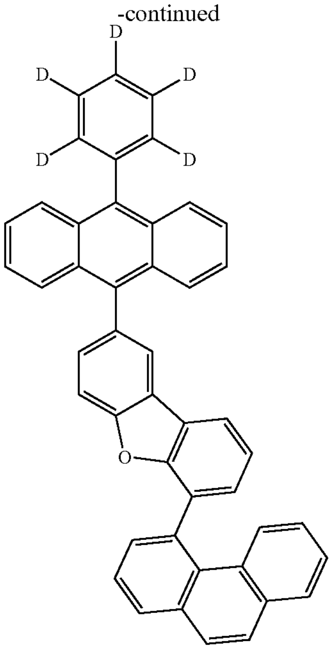
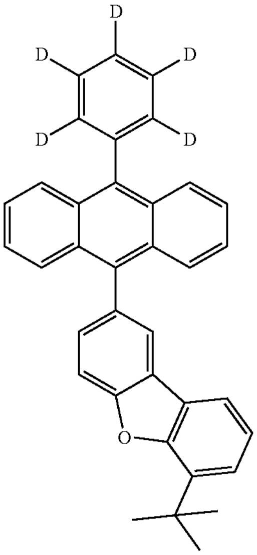
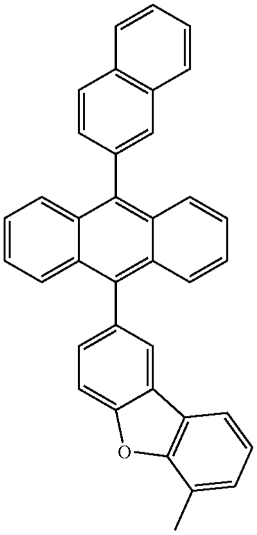
-continued
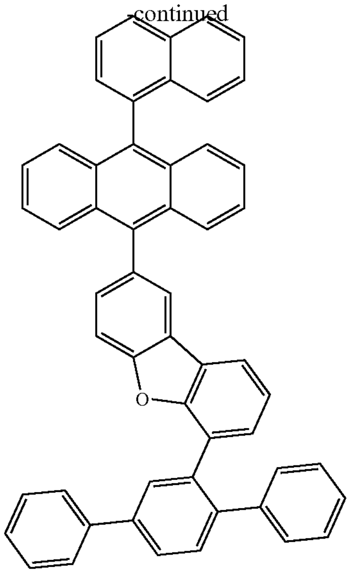
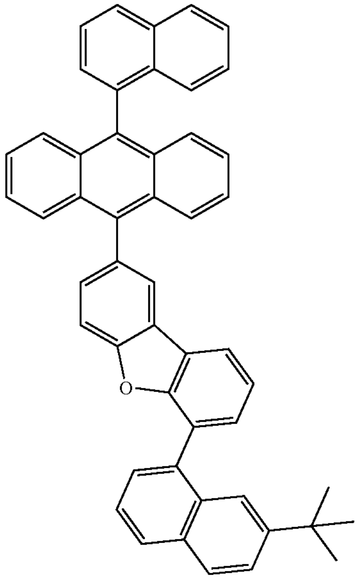
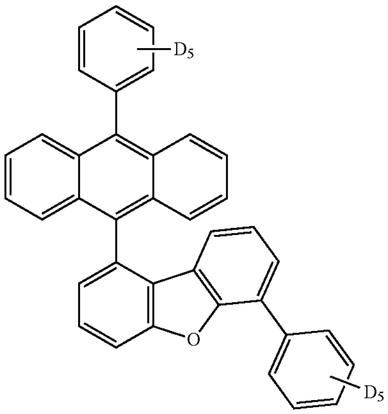

-continued
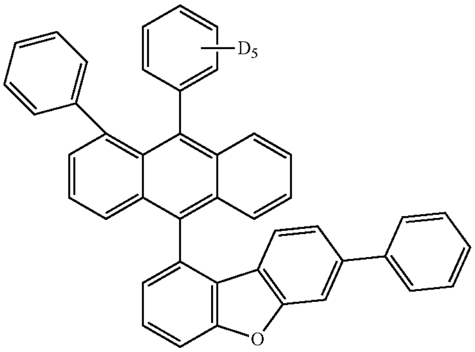
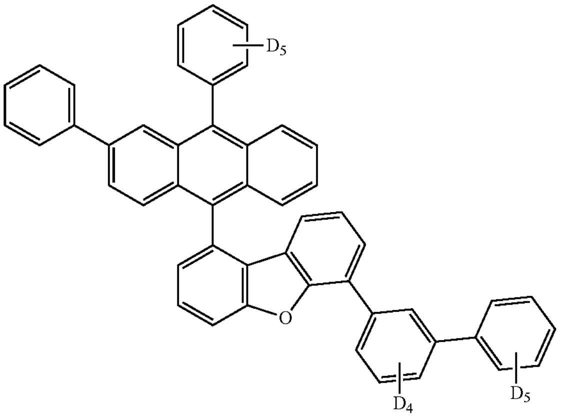
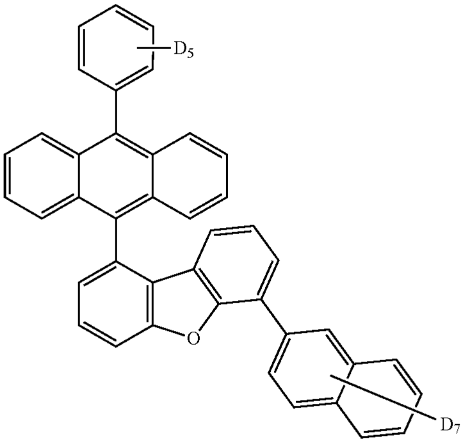
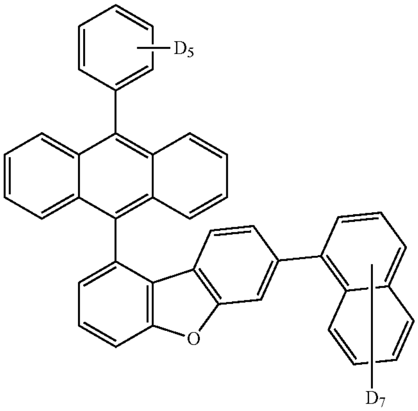
-continued
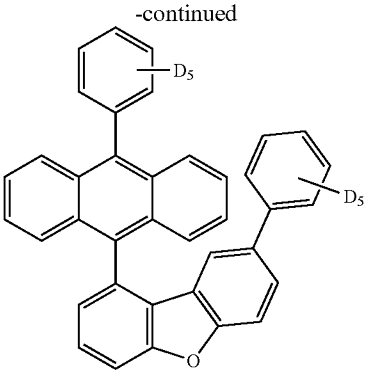
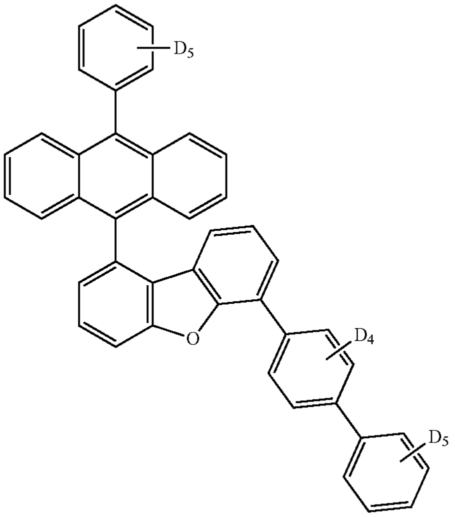
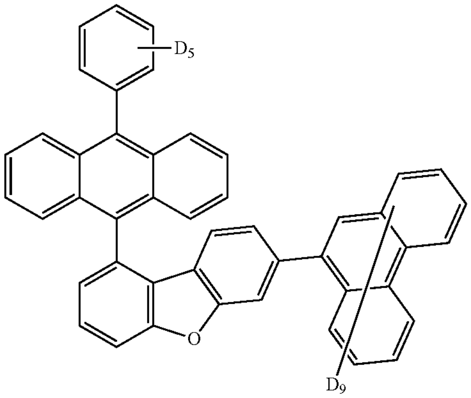

-continued
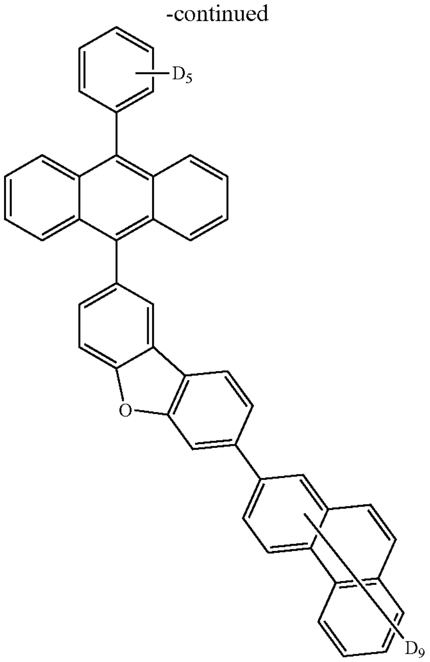
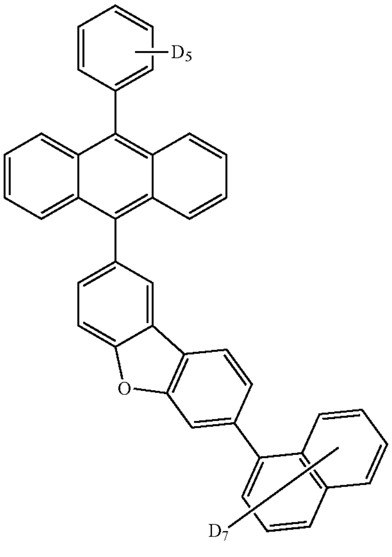
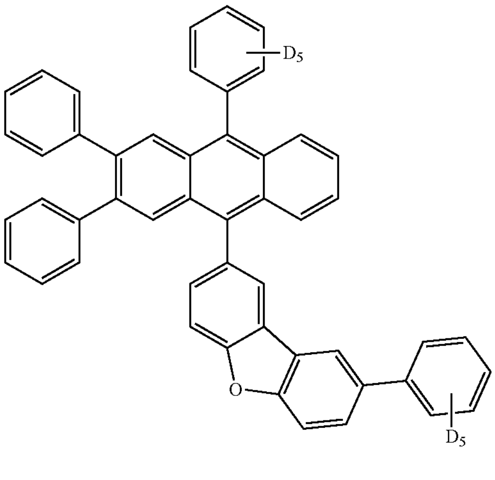
-continued
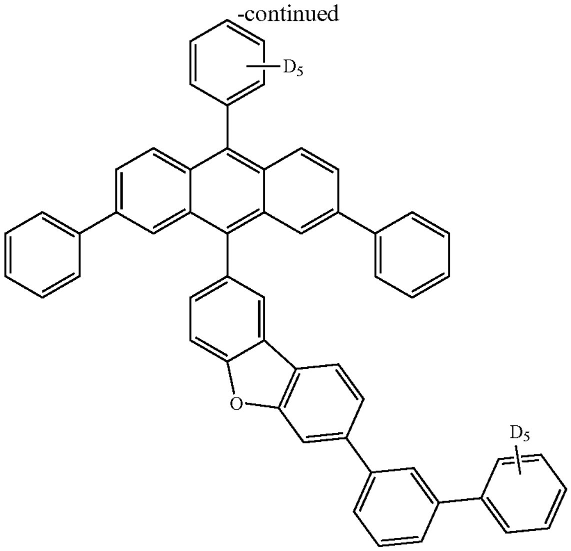
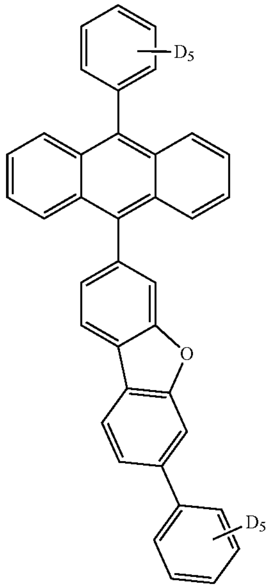
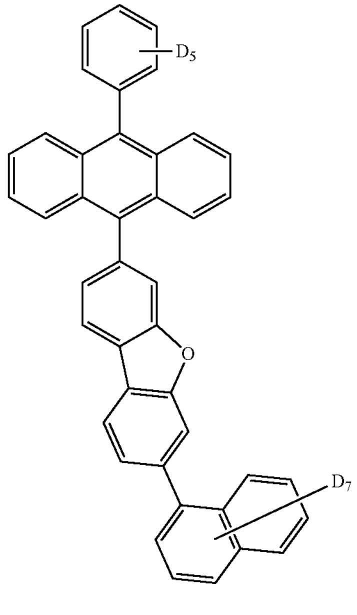

-continued
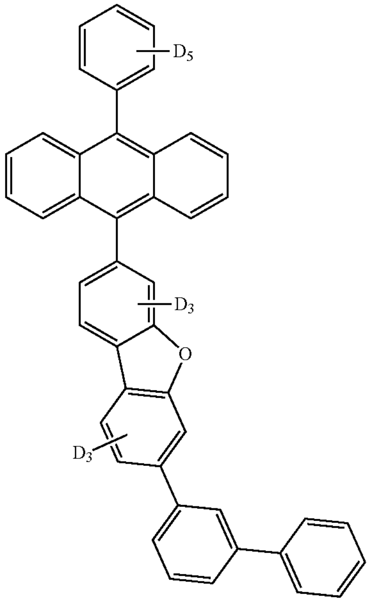
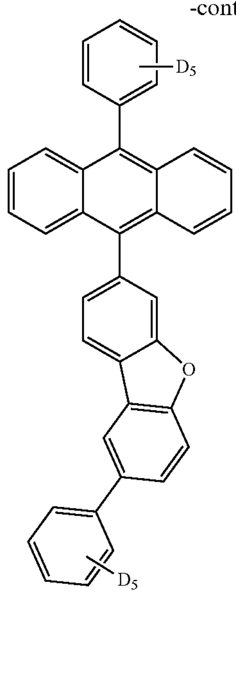
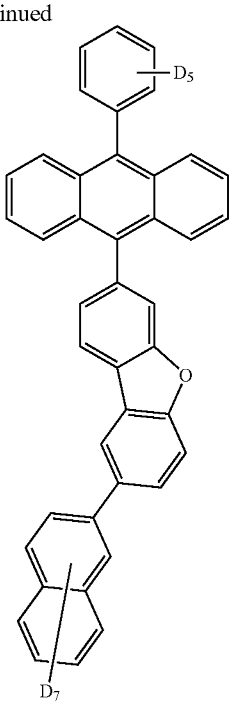
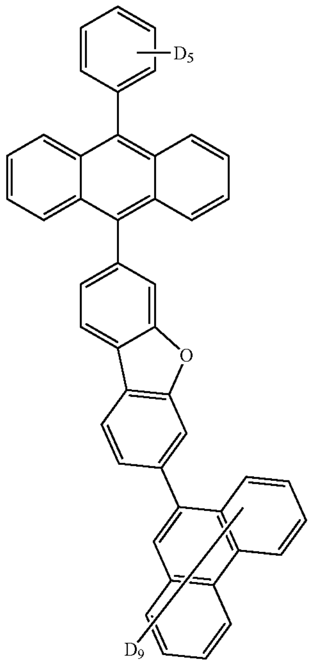
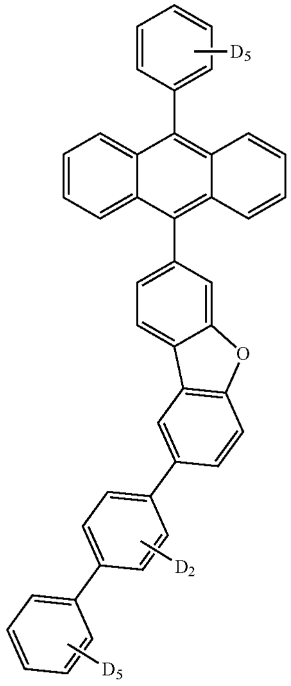
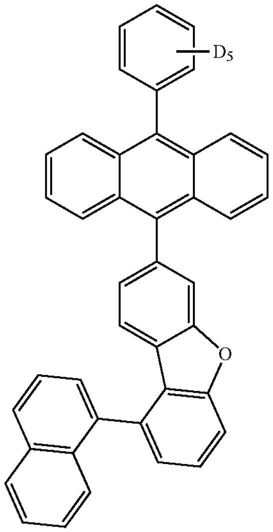

-continued
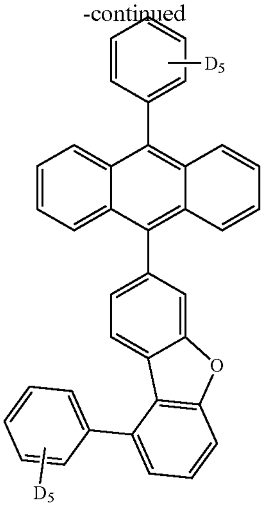
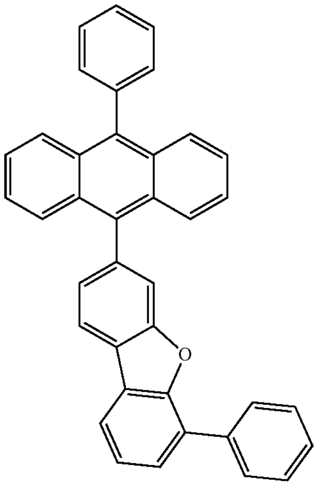
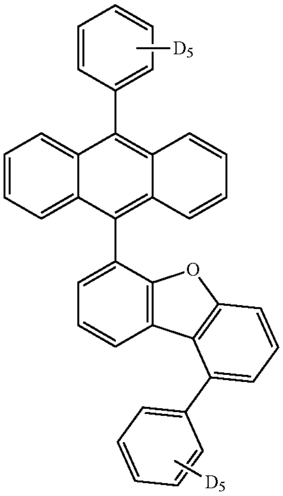
-continued
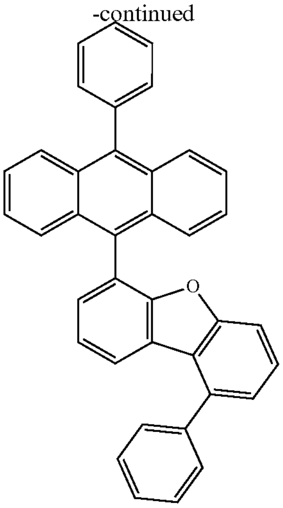
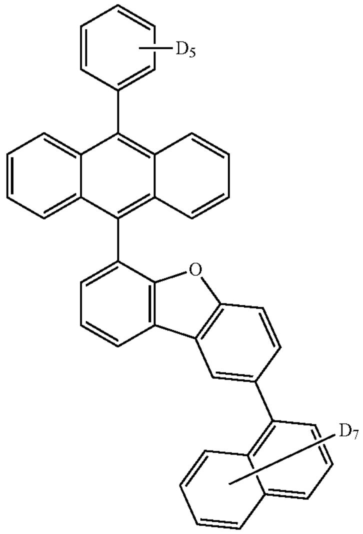
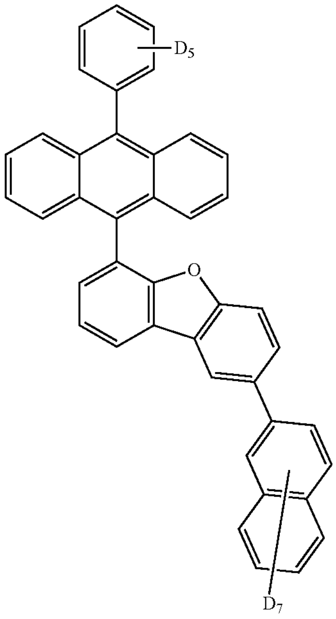

-continued
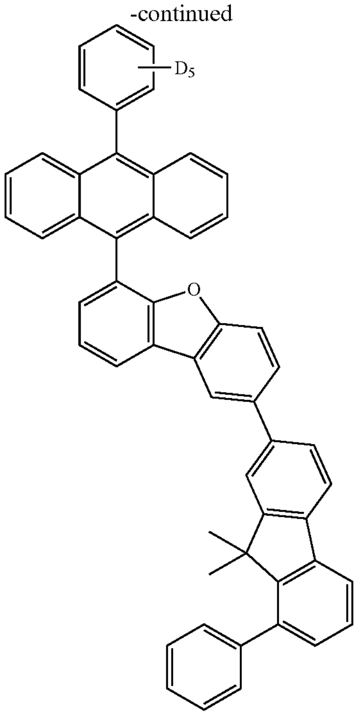
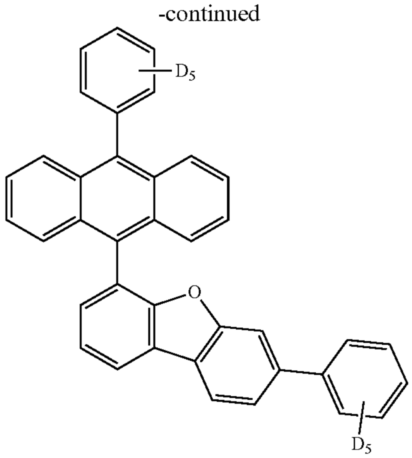
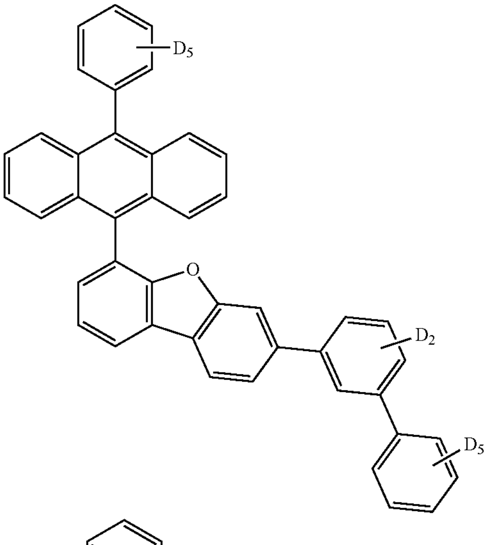
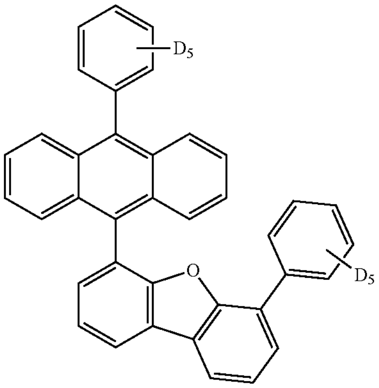
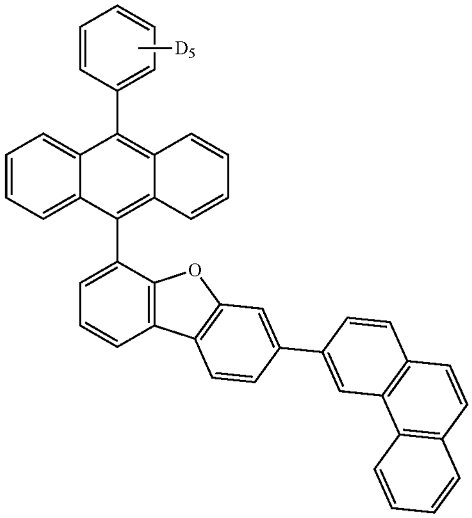
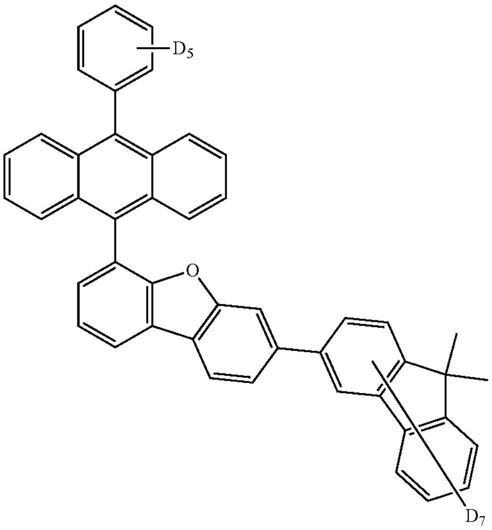
-continued -continued
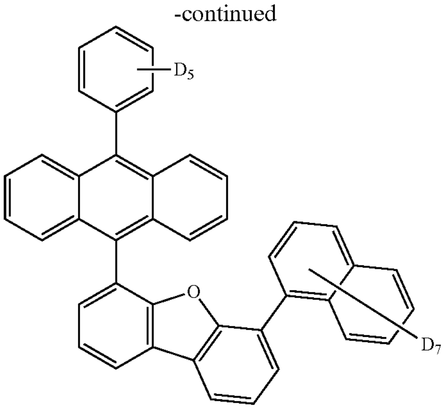
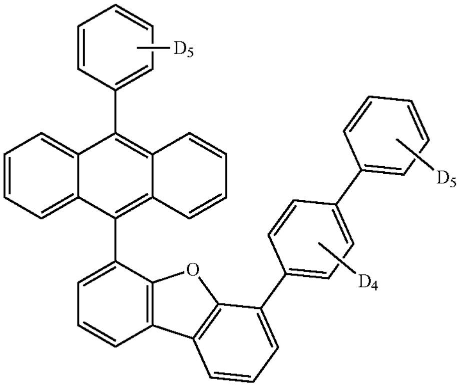
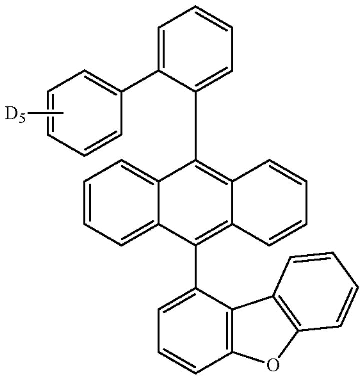
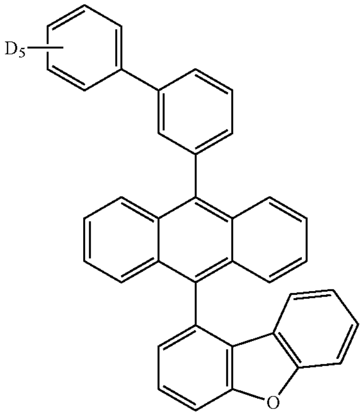
-continued
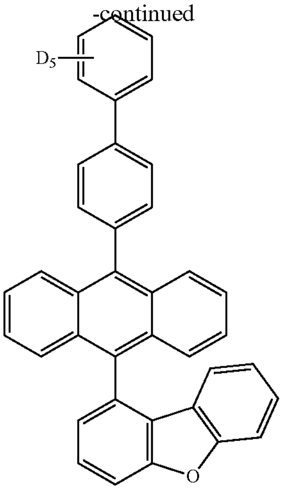
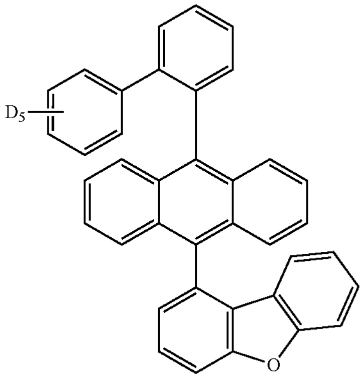
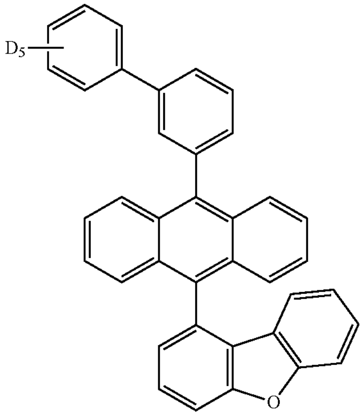

-continued
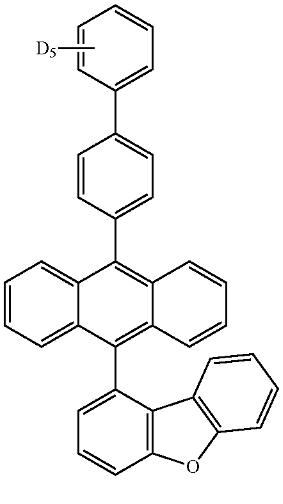
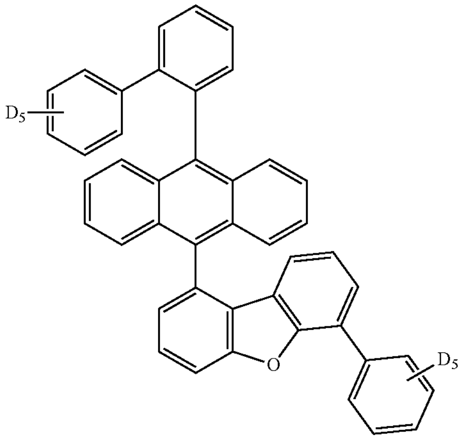
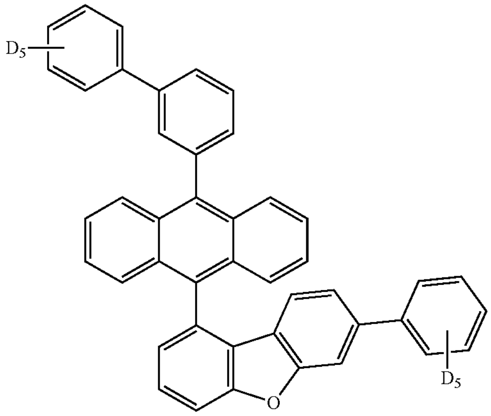
-continued
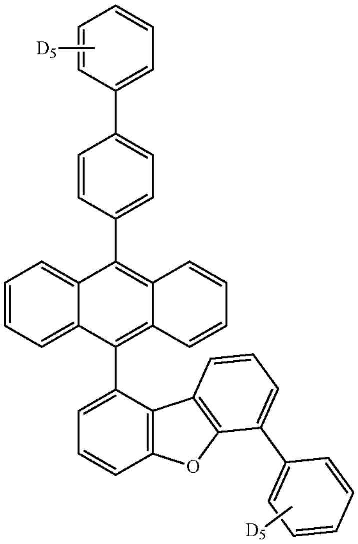
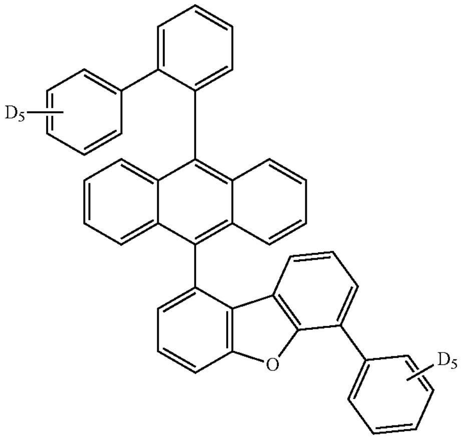
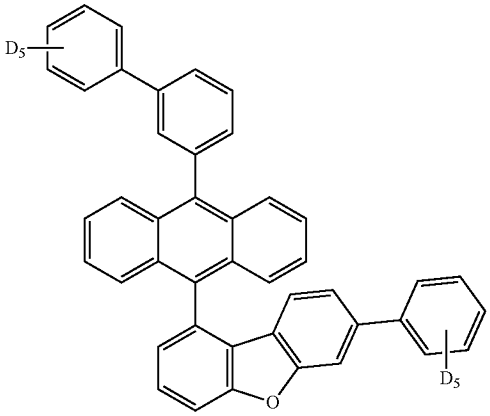

-continued
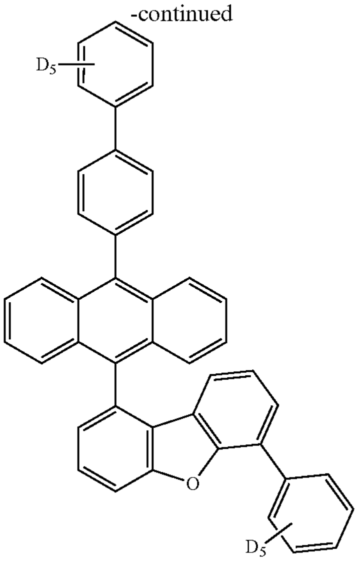
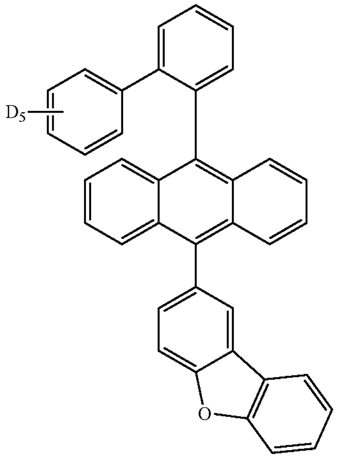
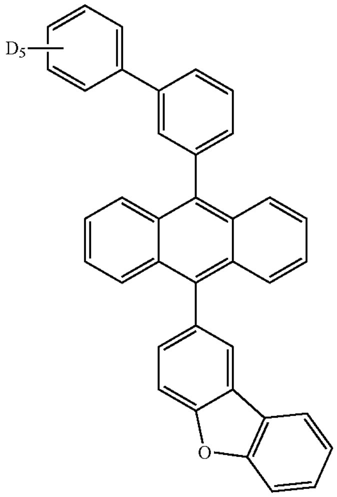
-continued
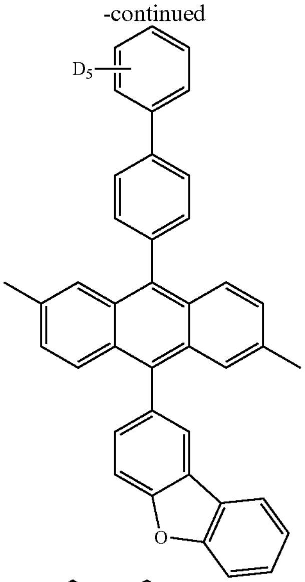
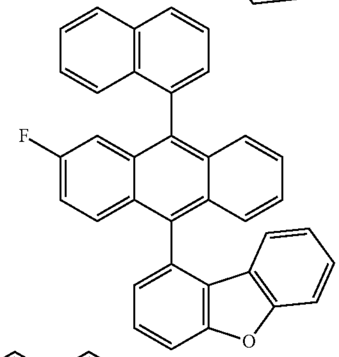
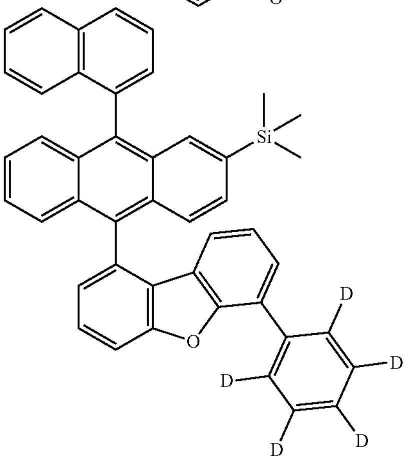
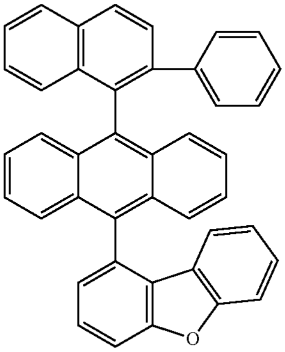

-continued
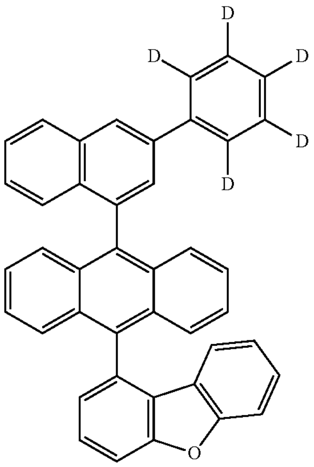
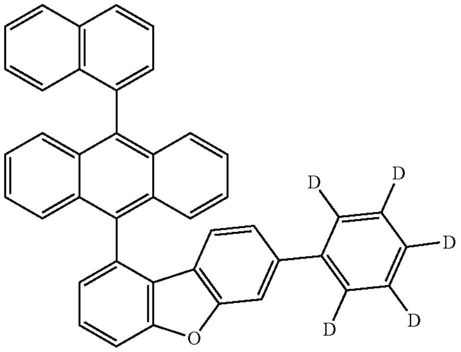
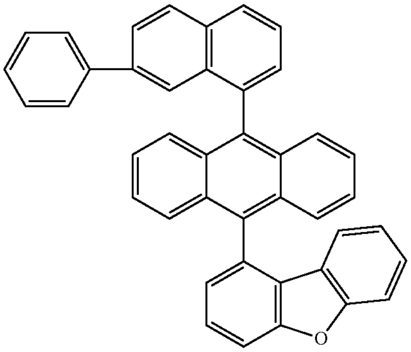
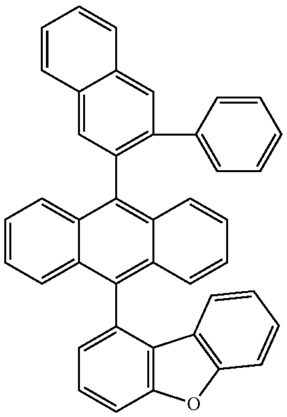
-continued
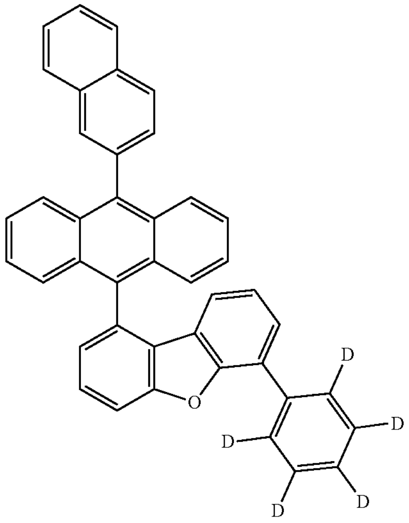
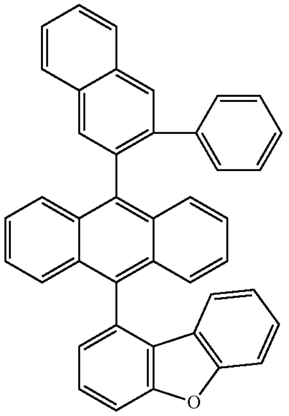
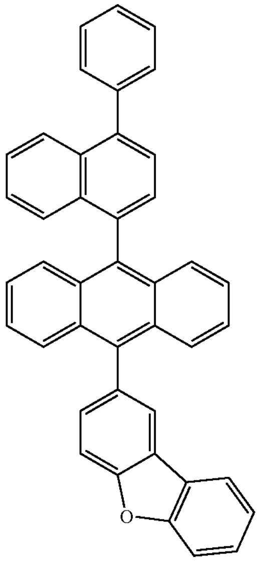
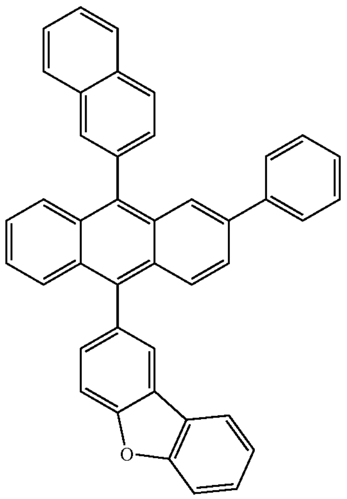

-continued
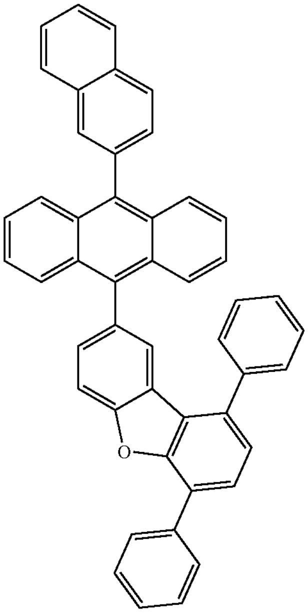
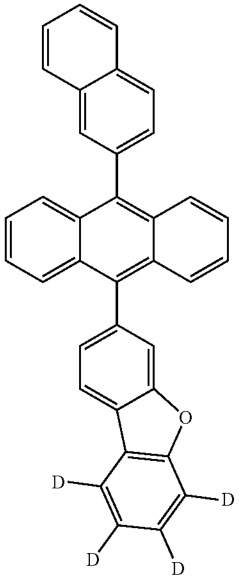
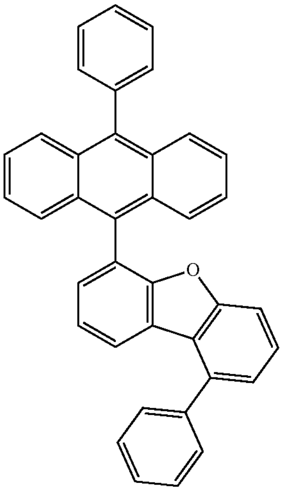
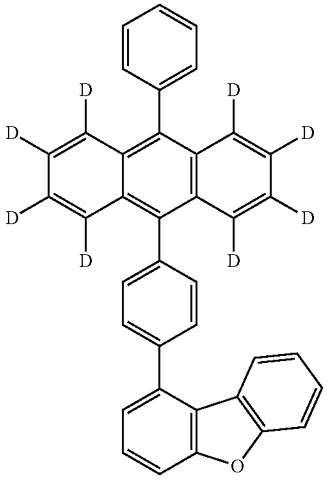
-continued
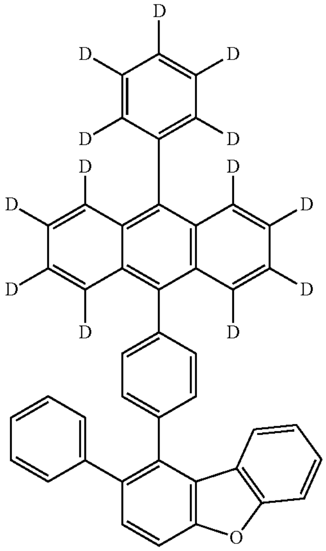
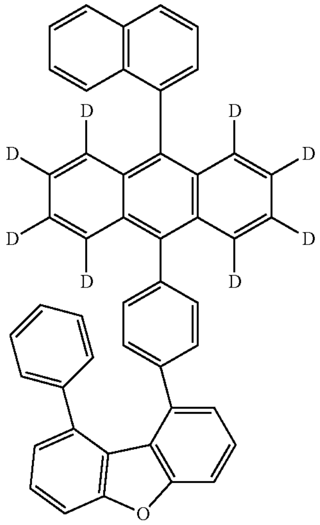
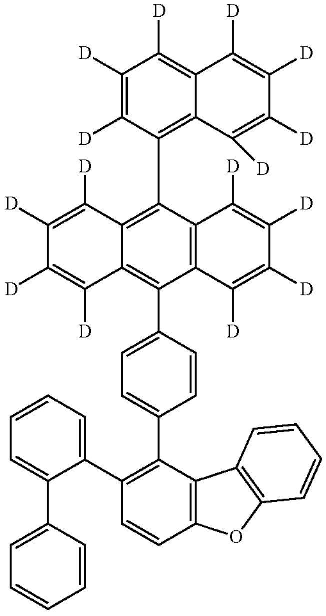

-continued
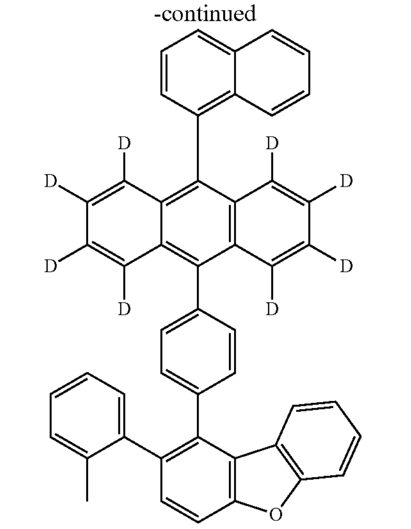
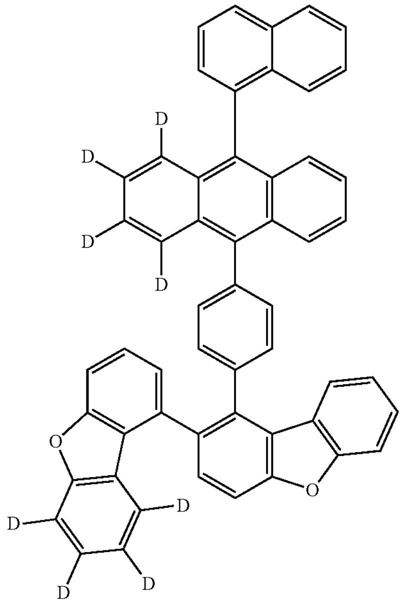
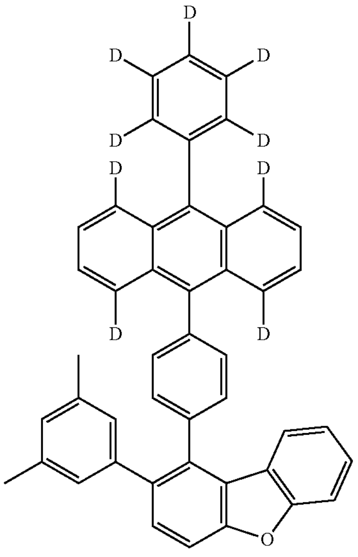
-continued
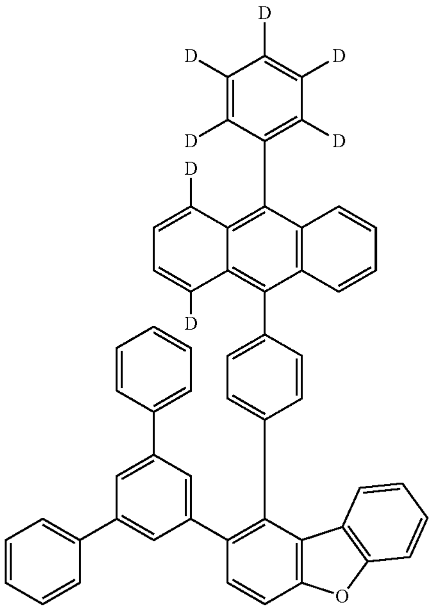
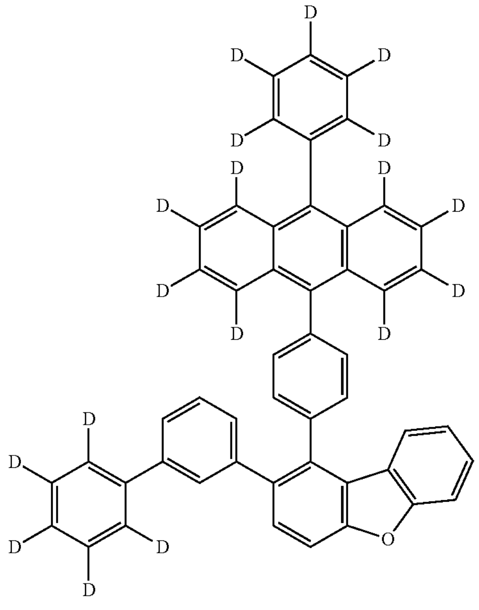

-continued
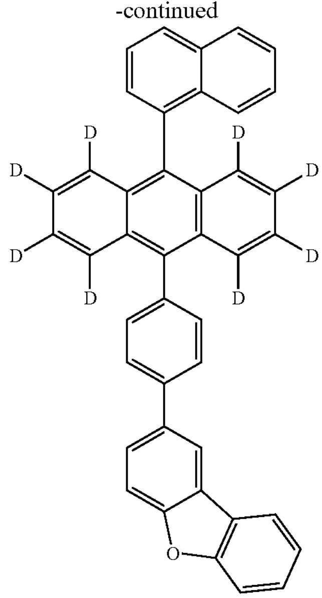
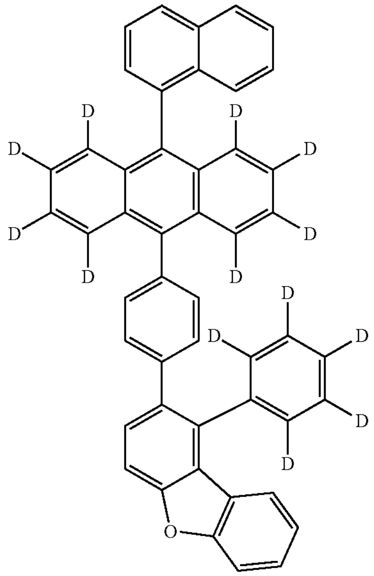
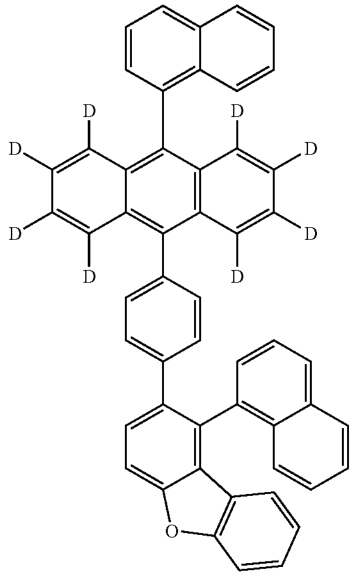
-continued
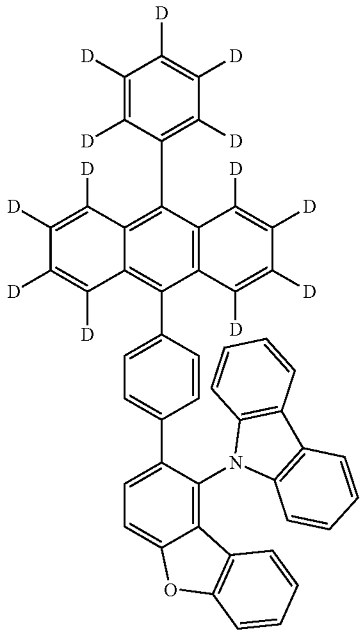
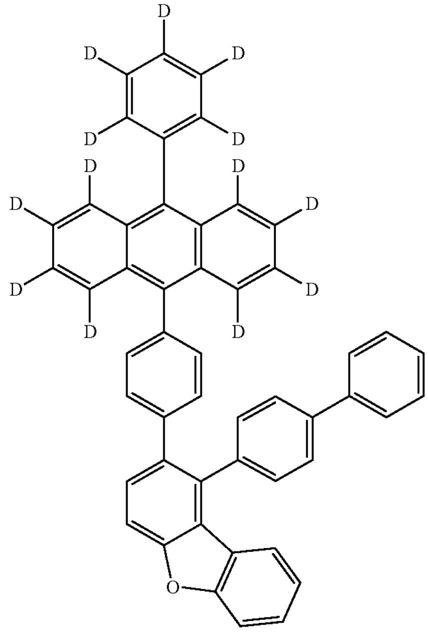

-continued
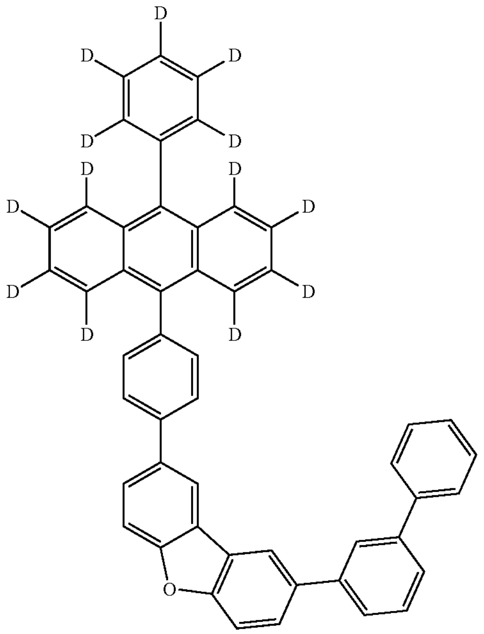
-continued
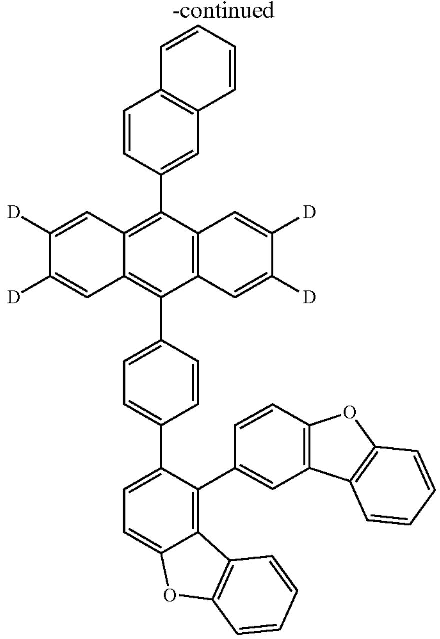
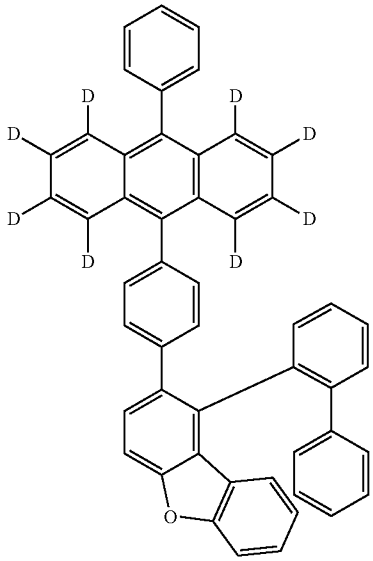
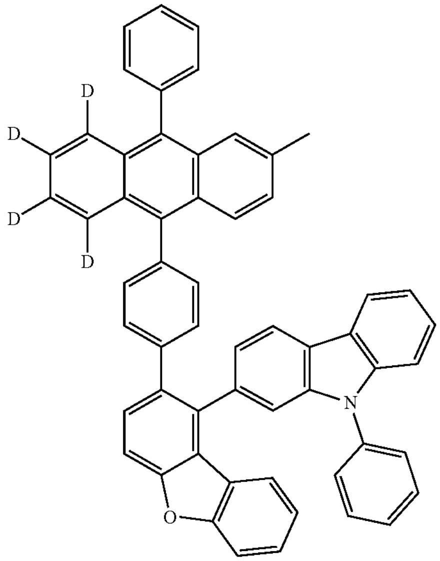

-continued
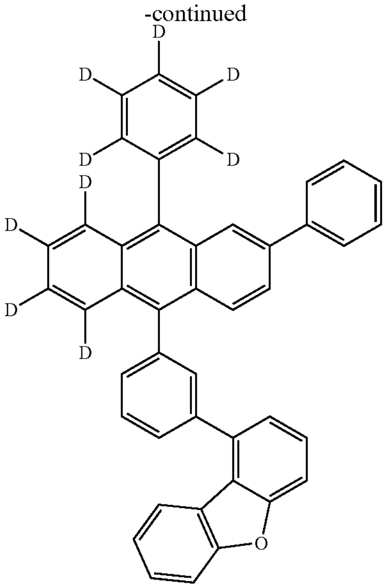
-continued
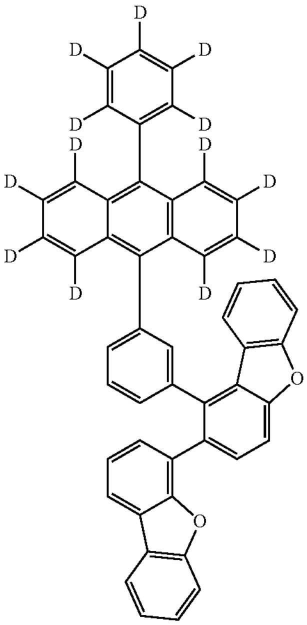
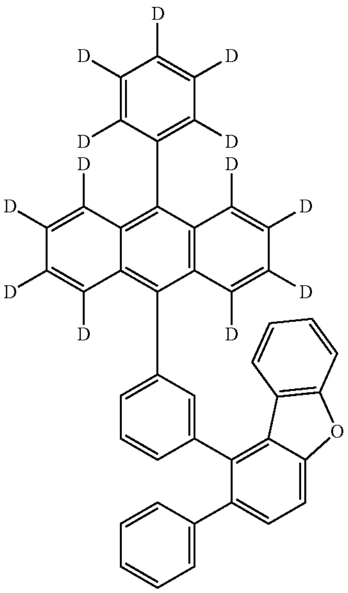
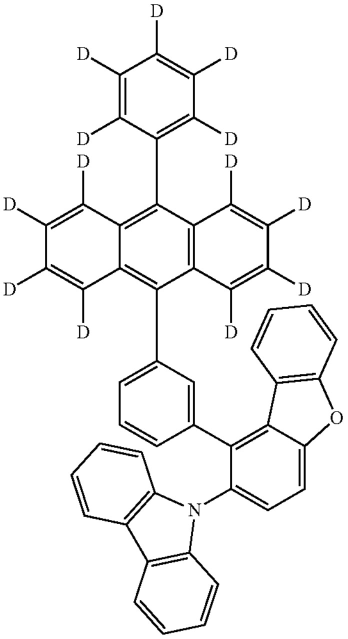

-continued
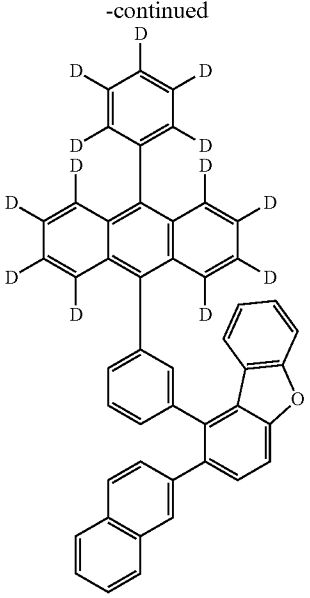
-continued
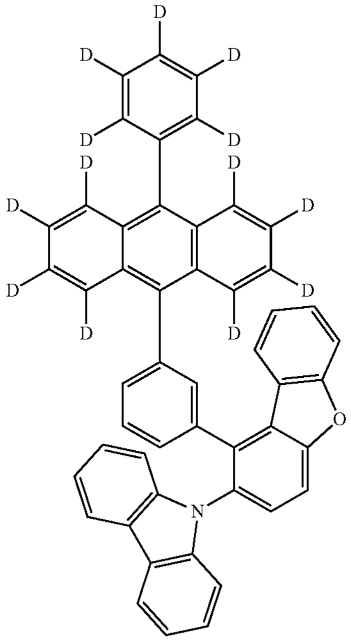
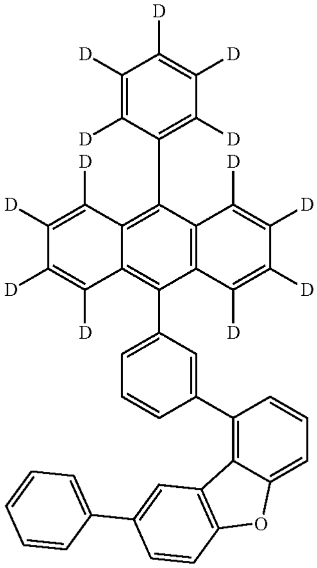
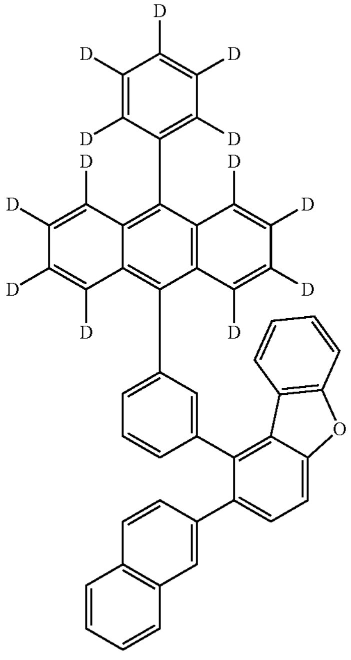

-continued
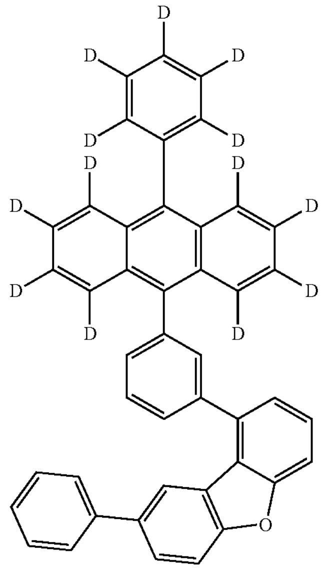
-continued
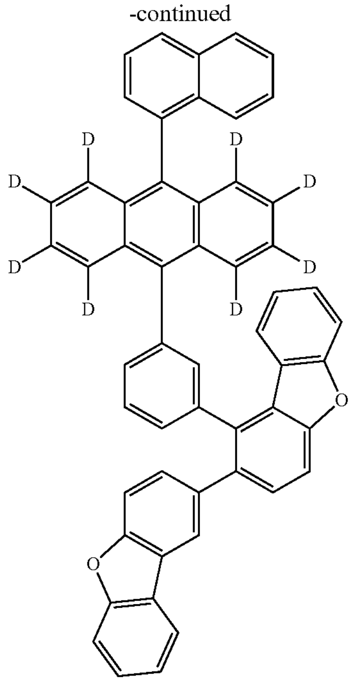
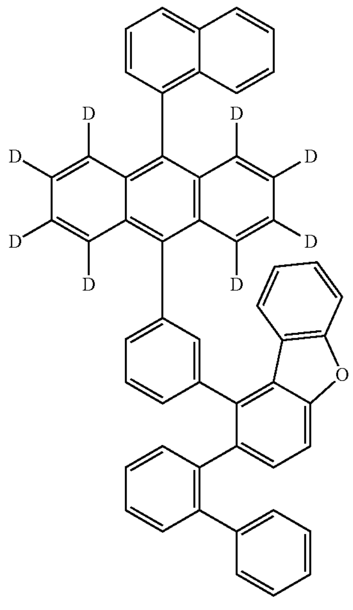
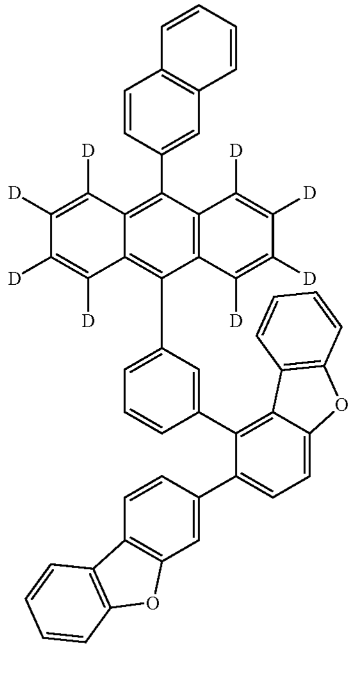

-continued
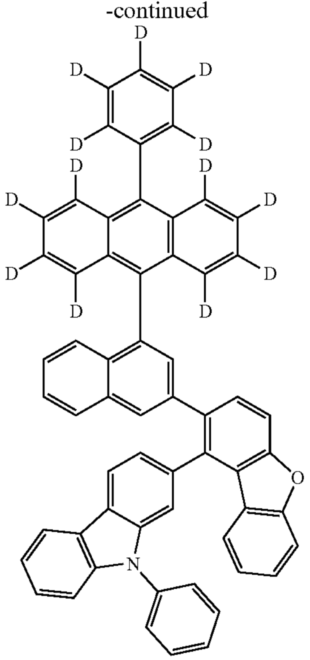
-continued
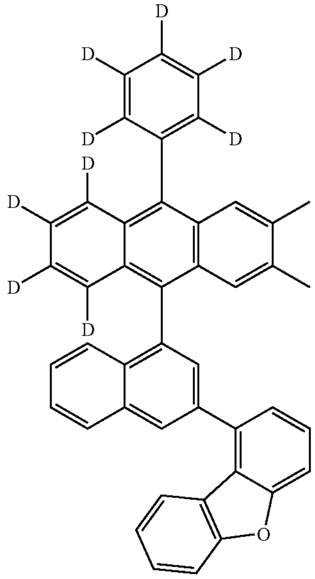
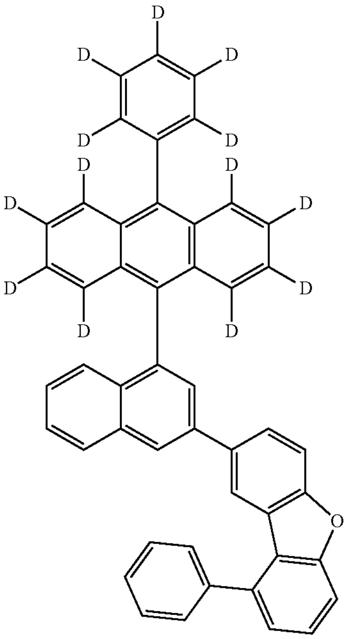
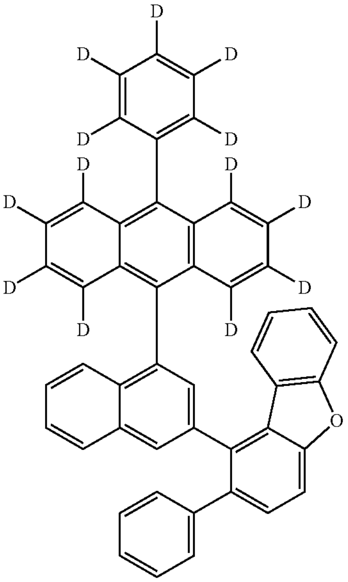

-continued
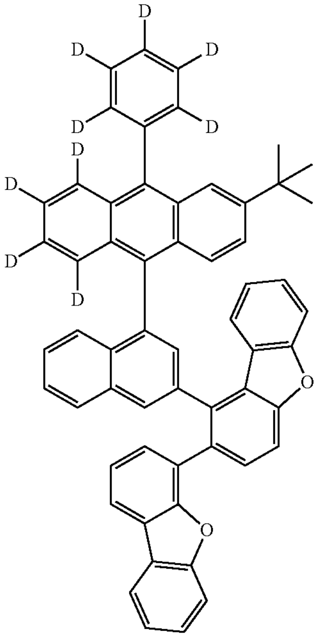
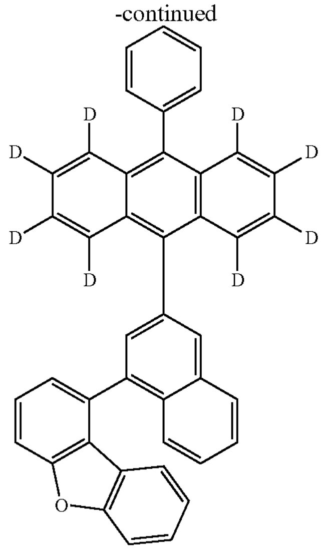
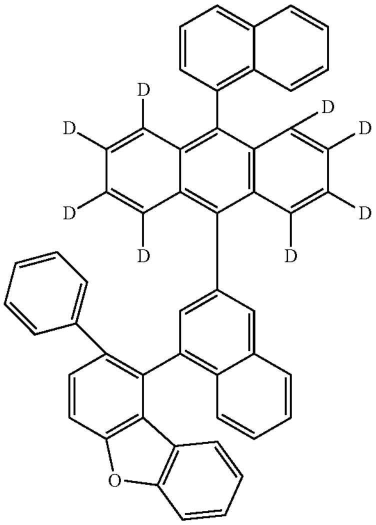
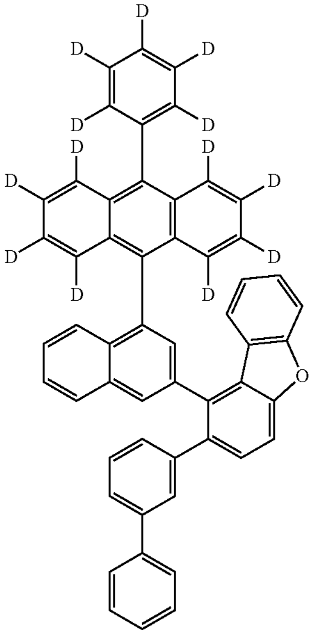
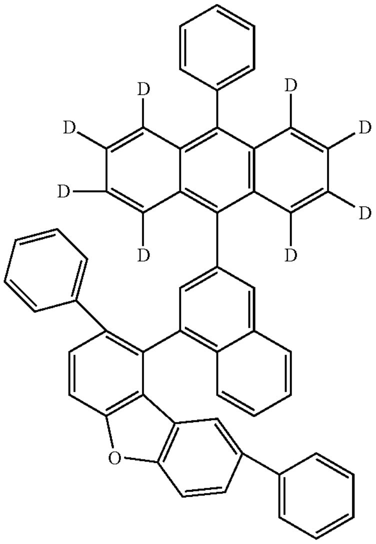
-continued -continued
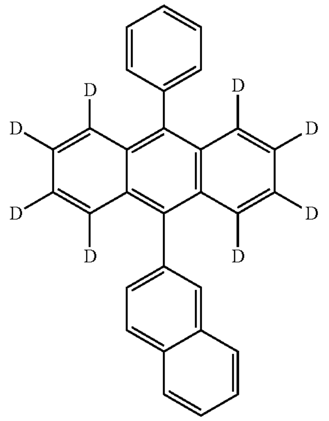
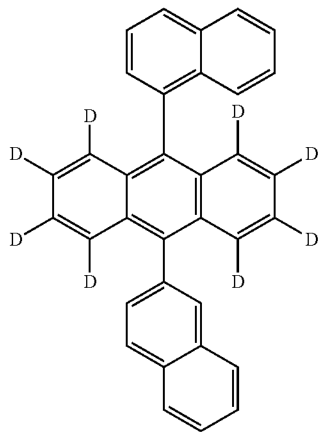
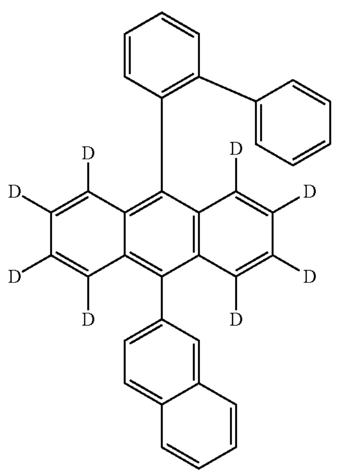
-continued
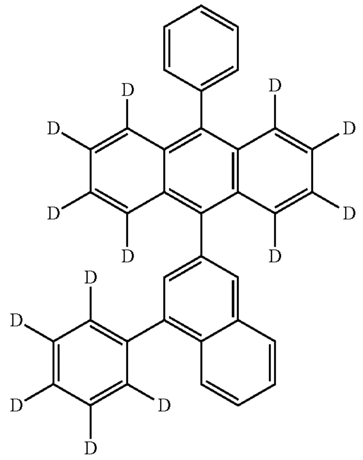
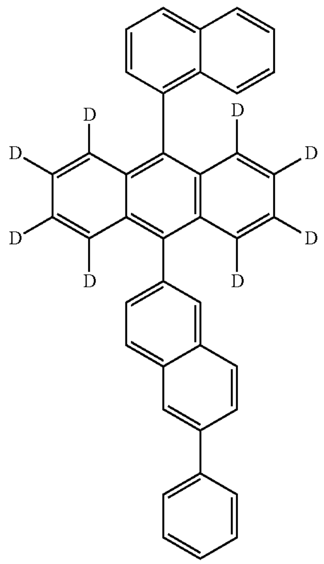
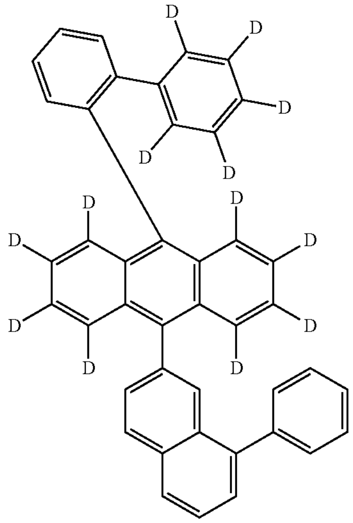

-continued
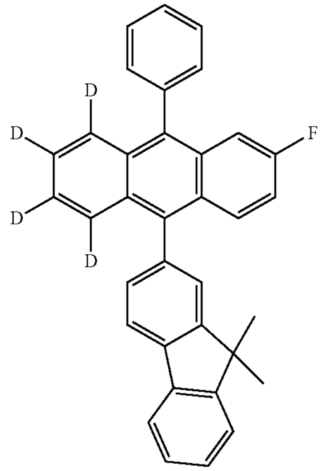
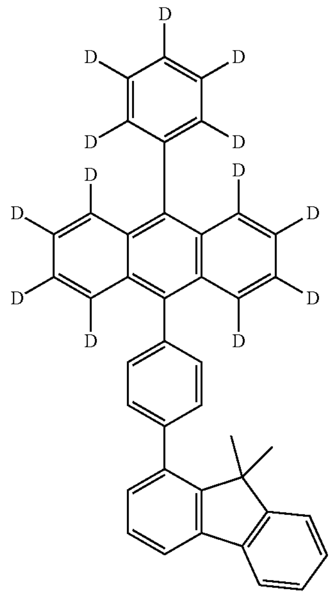
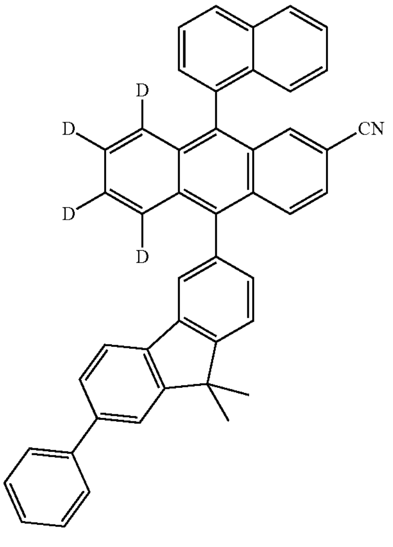
-continued
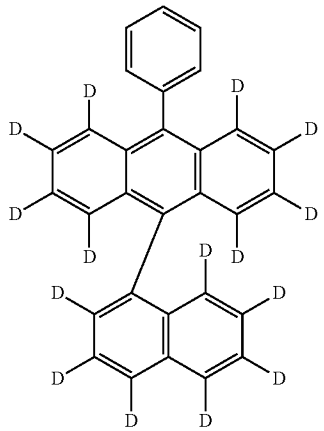
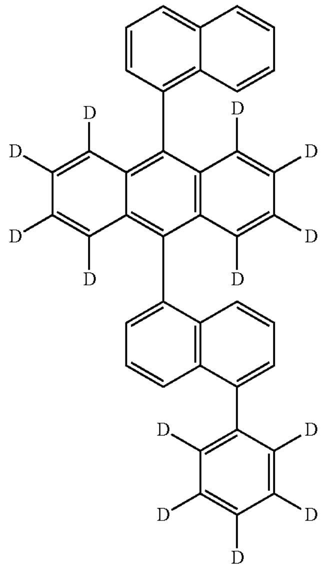
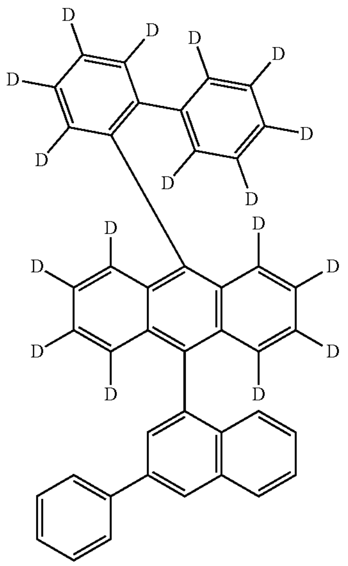

-continued
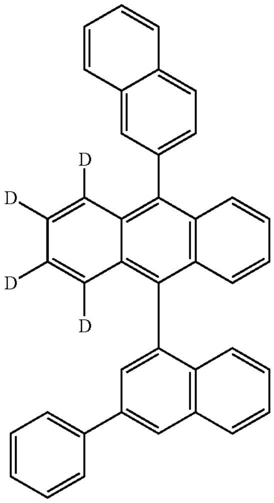
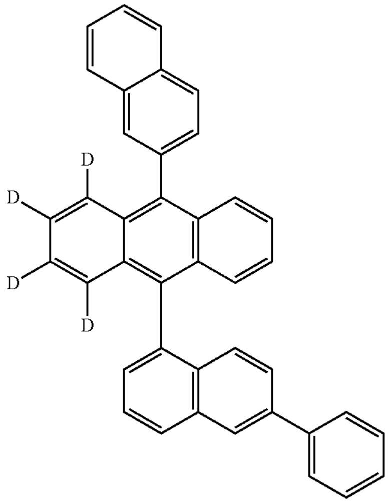
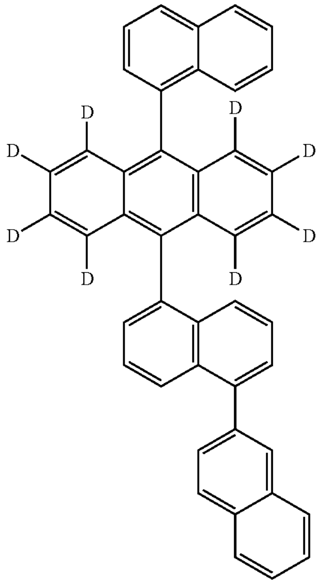
-continued
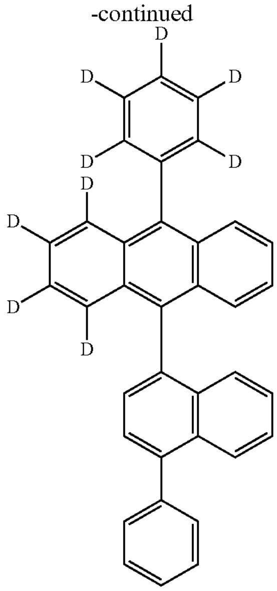
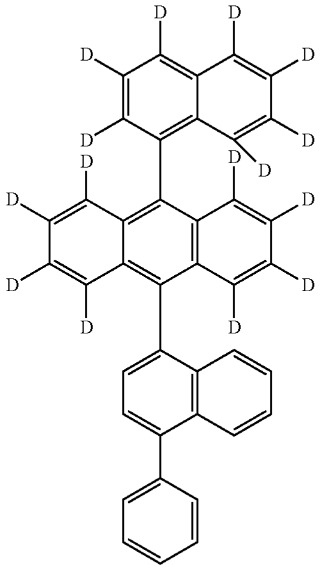
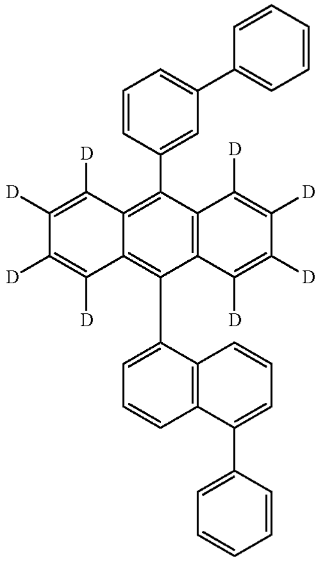

-continued
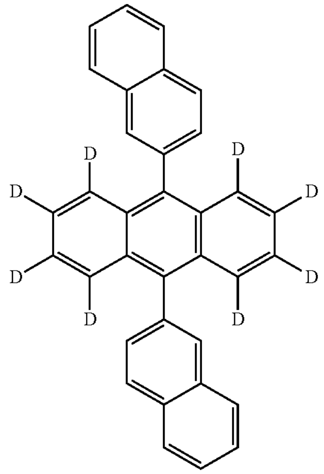
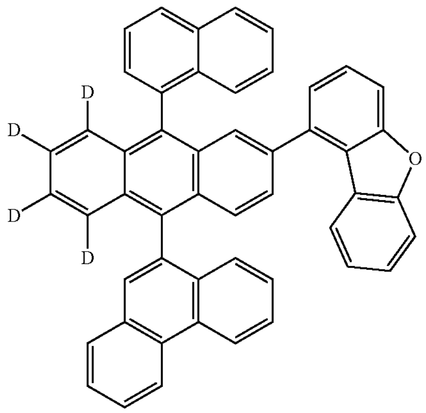
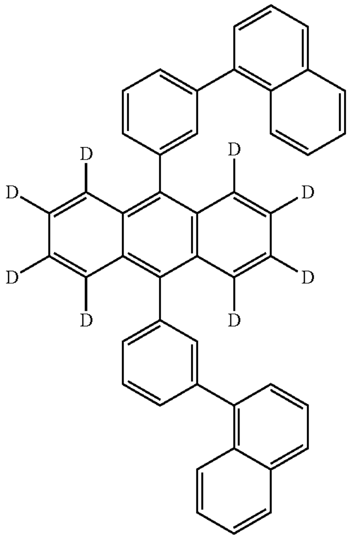
-continued
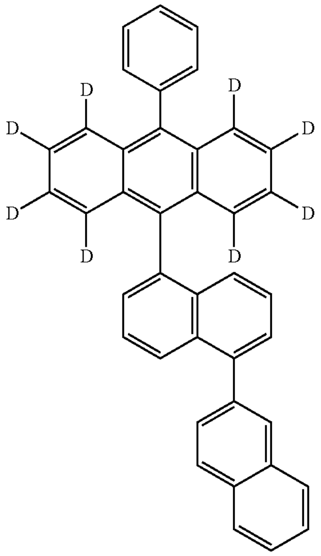
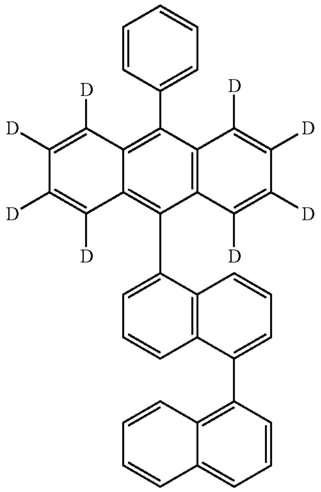
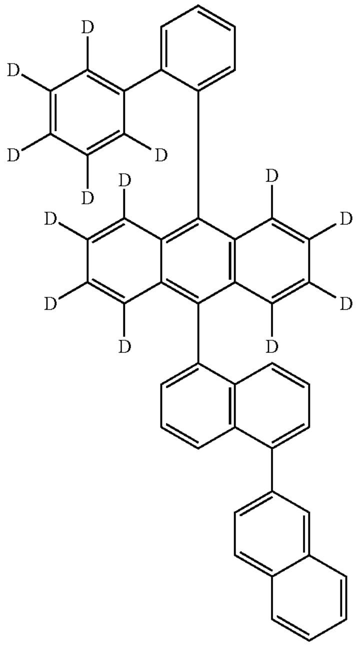

-continued
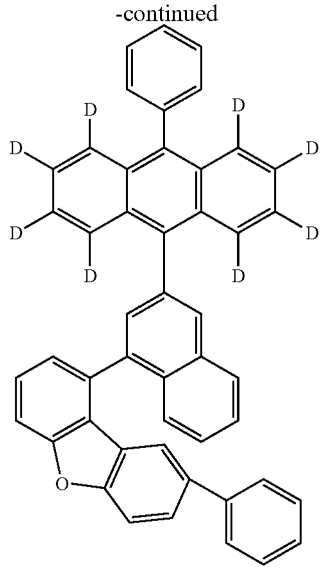
-continued
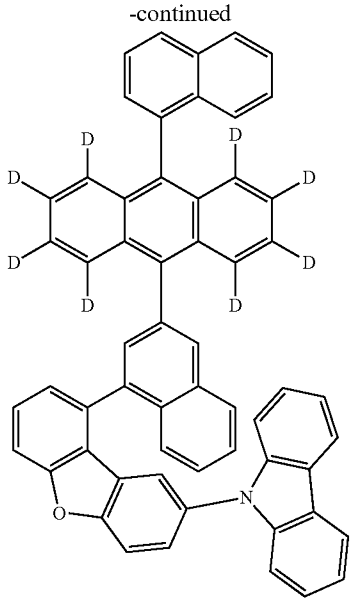
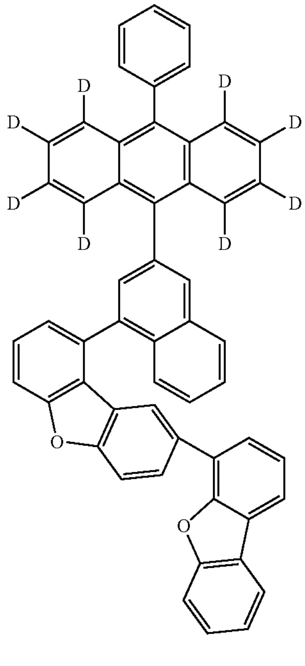
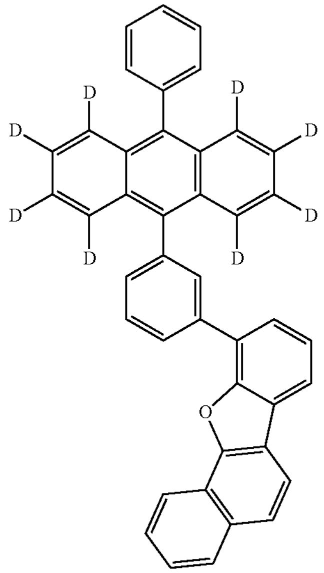

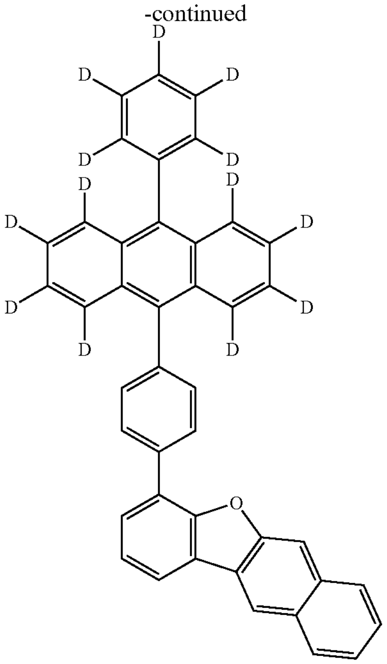
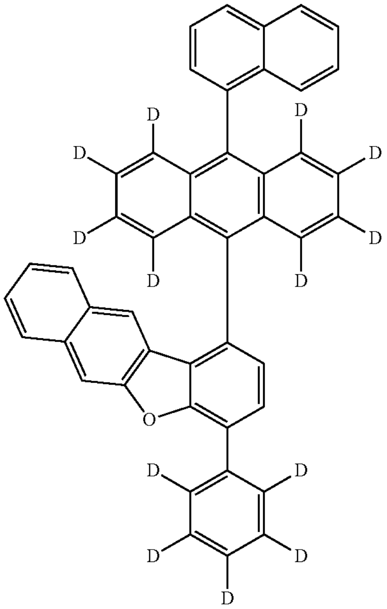
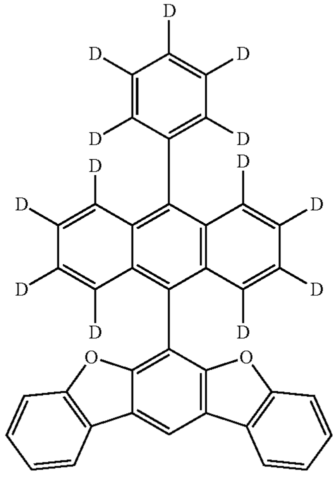
-continued
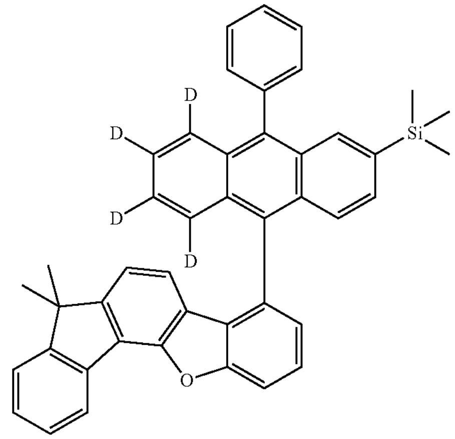
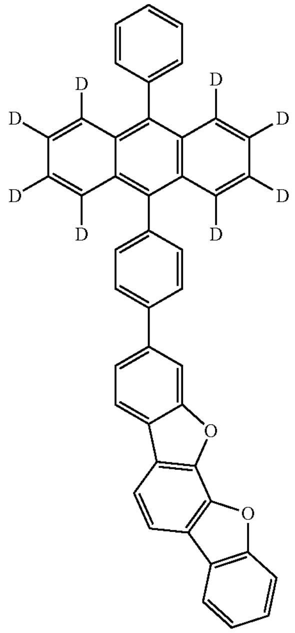
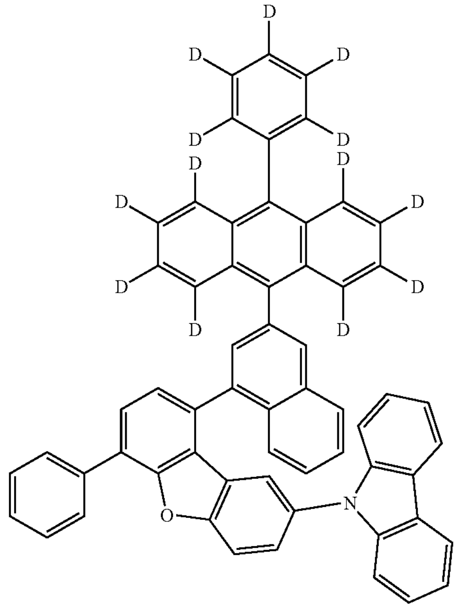

-continued
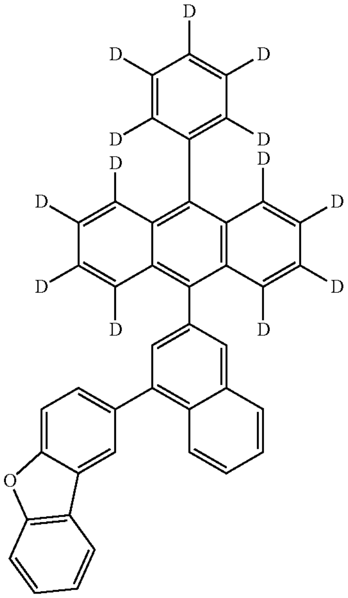
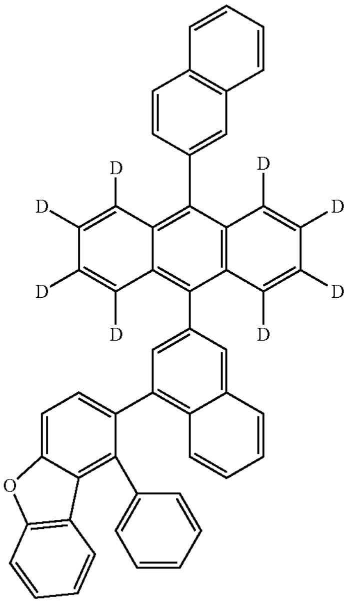
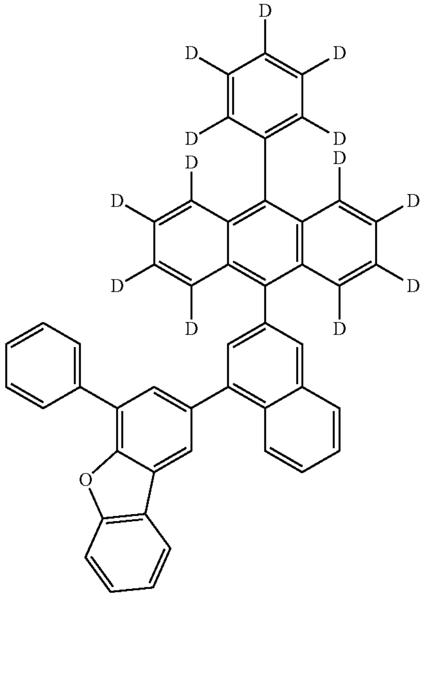
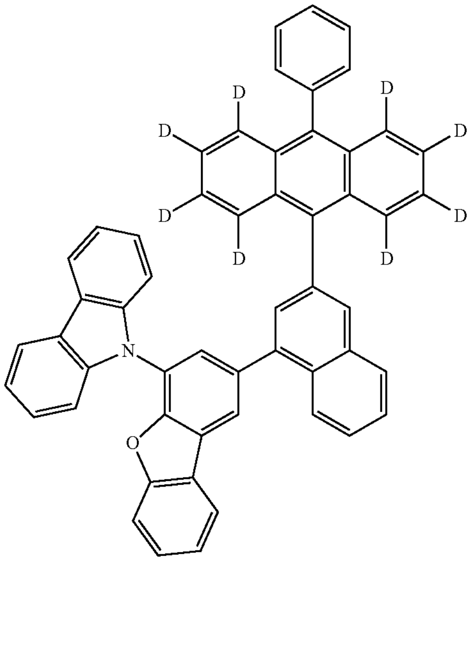

-continued
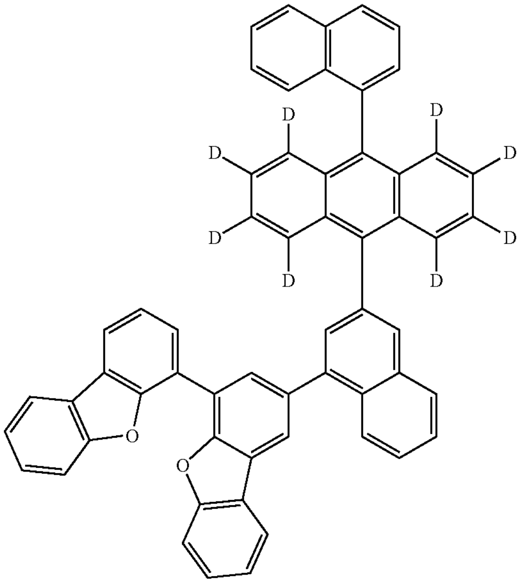
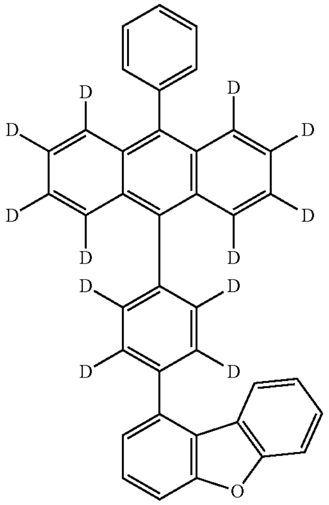
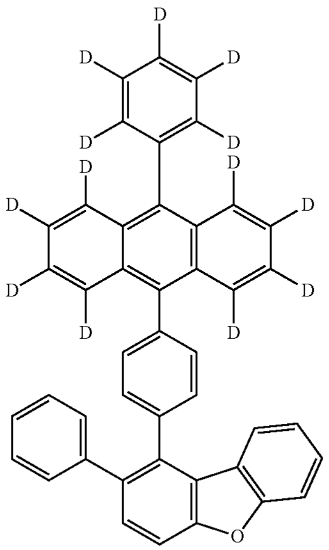
-continued
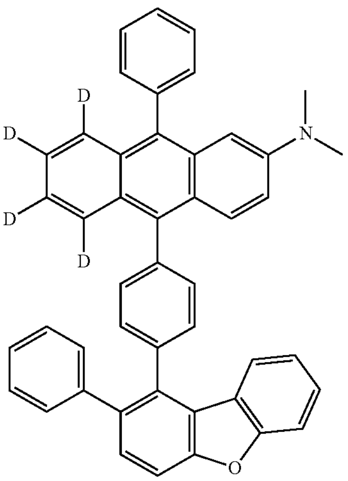
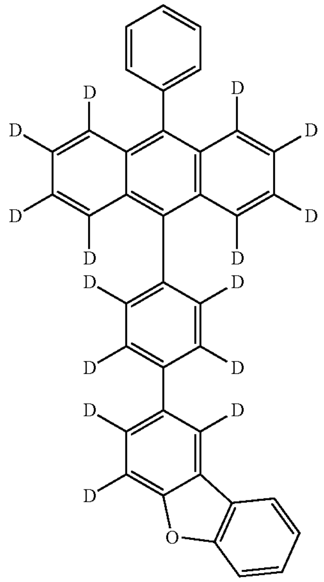
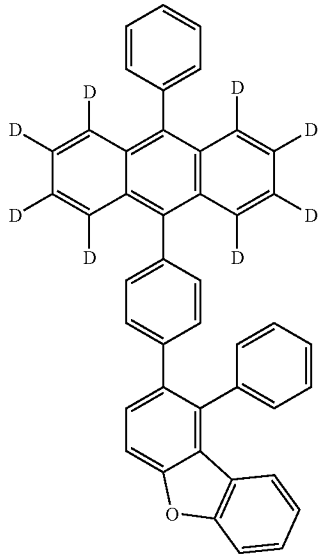

-continued
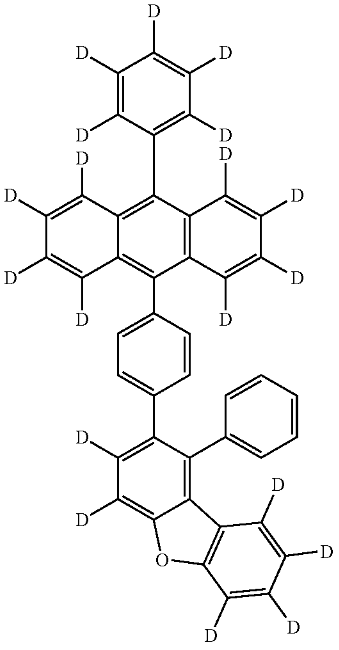
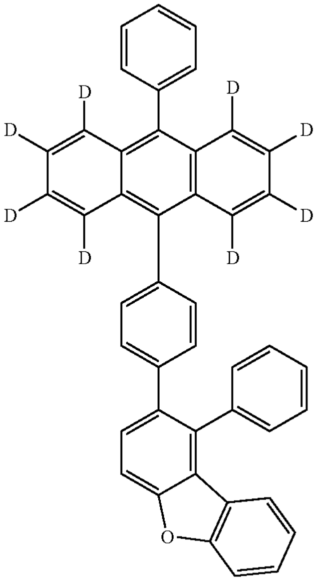
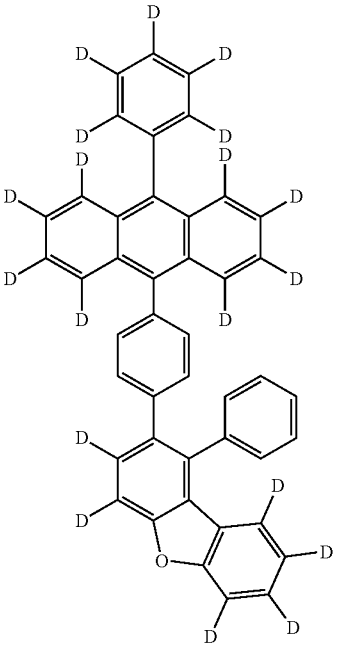
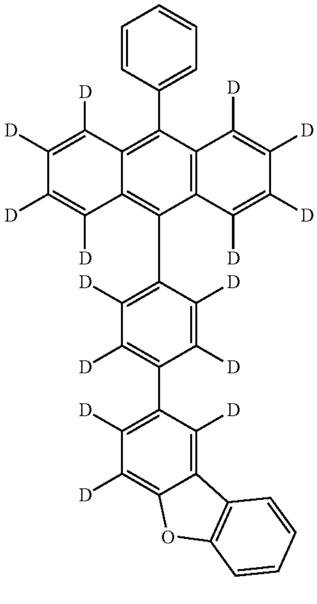
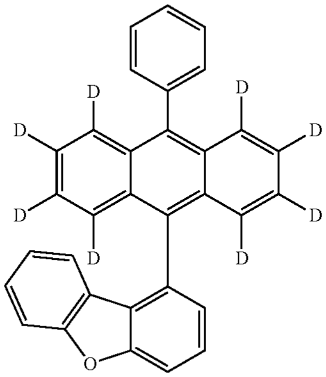

-continued
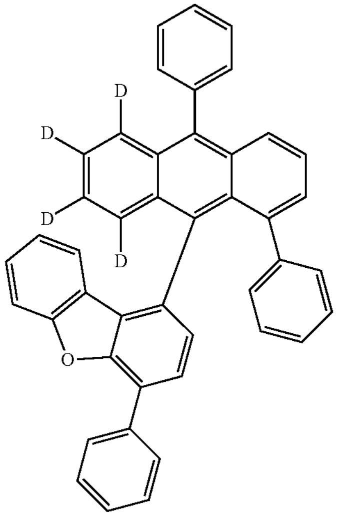
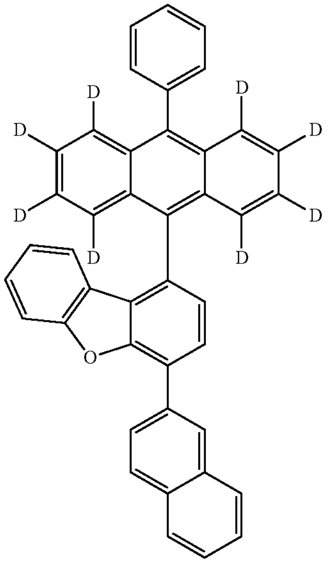
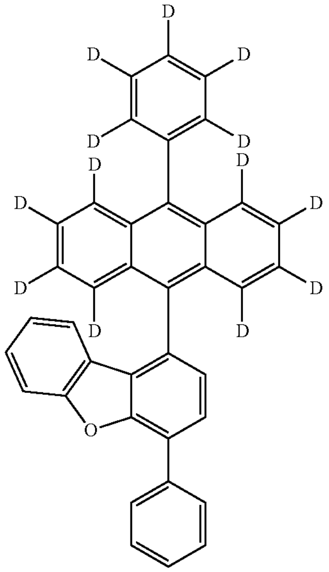
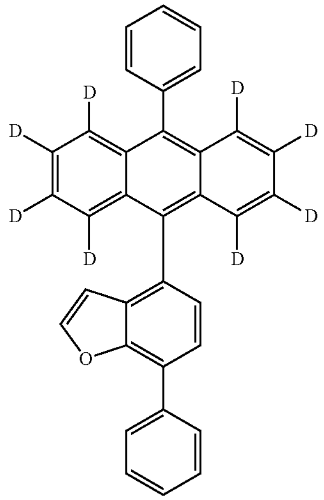
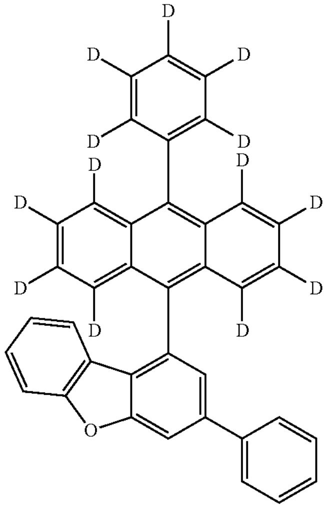
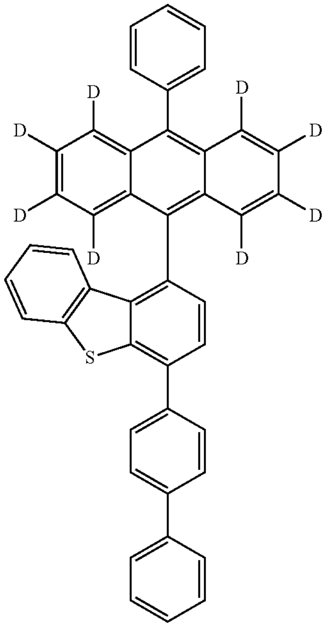
-continued

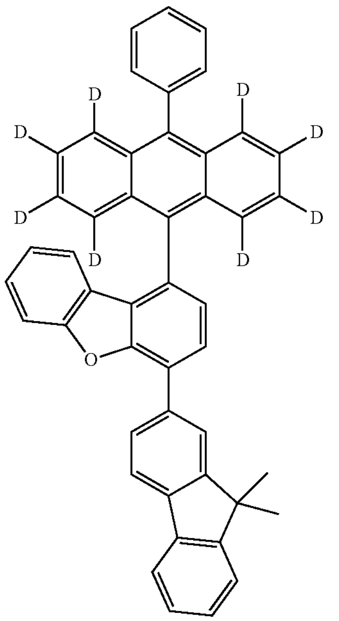
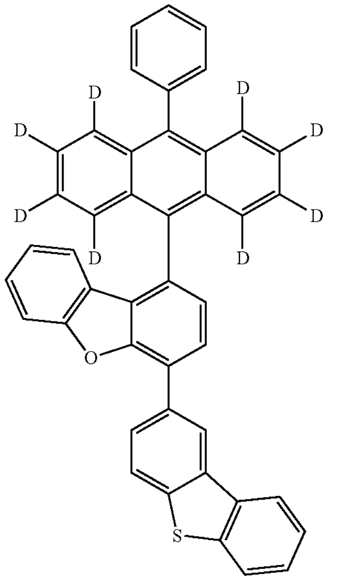
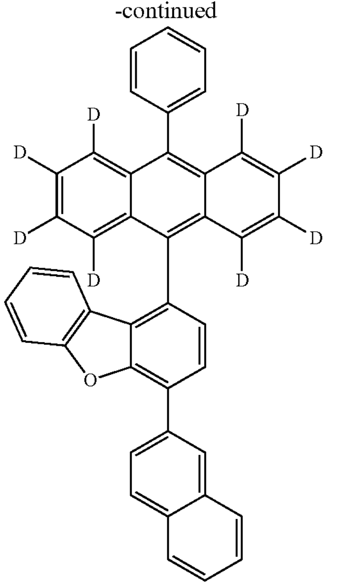
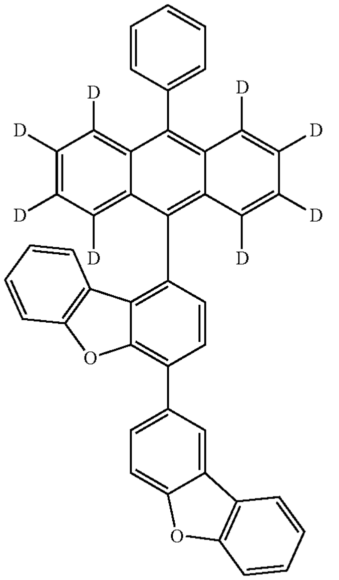
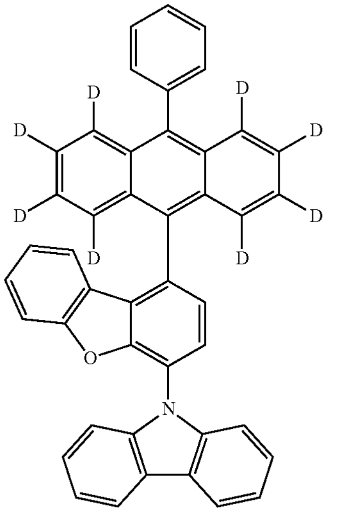

-continued
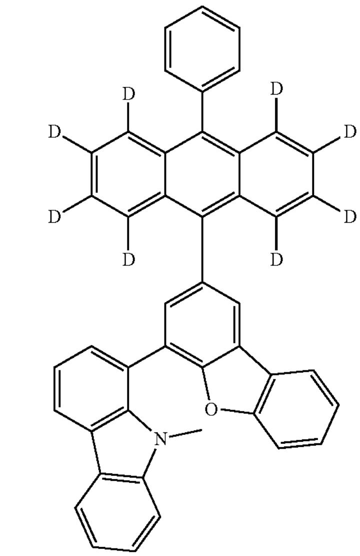
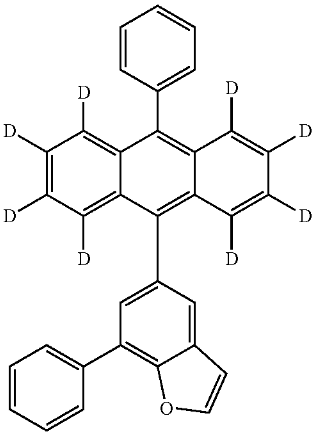
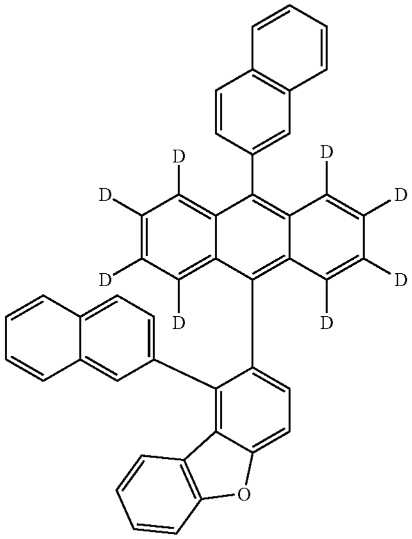
-continued
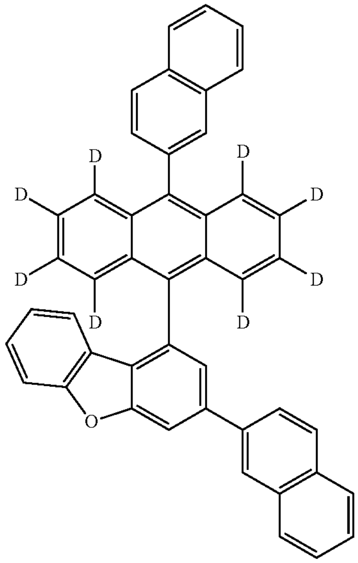
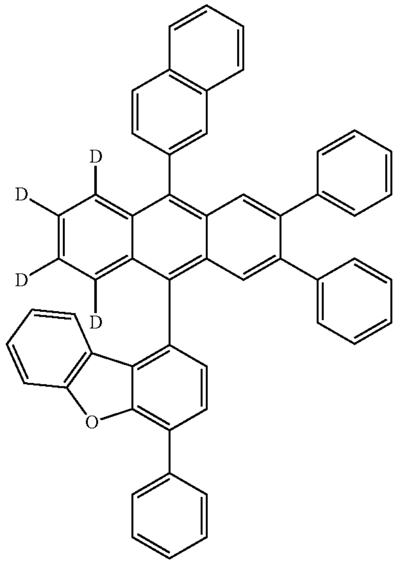
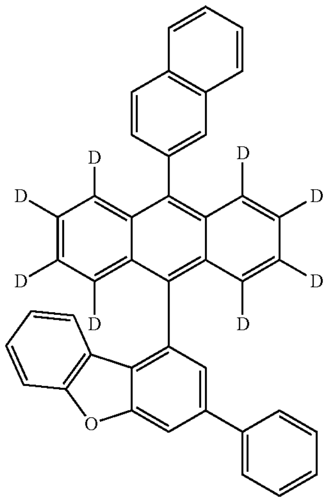

-continued
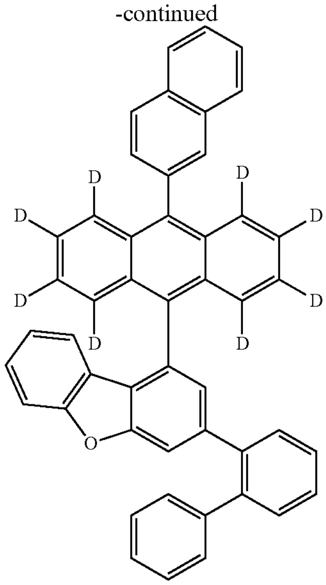
-continued
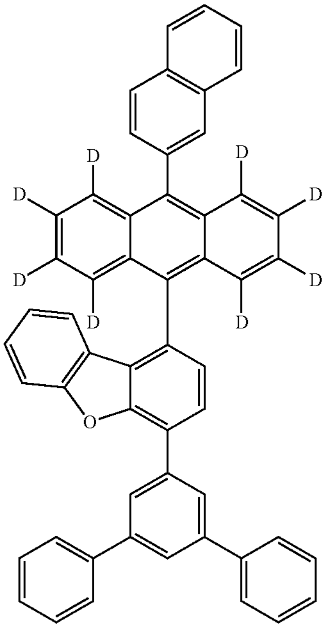
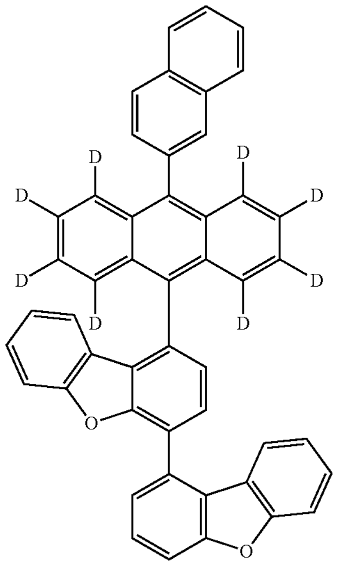
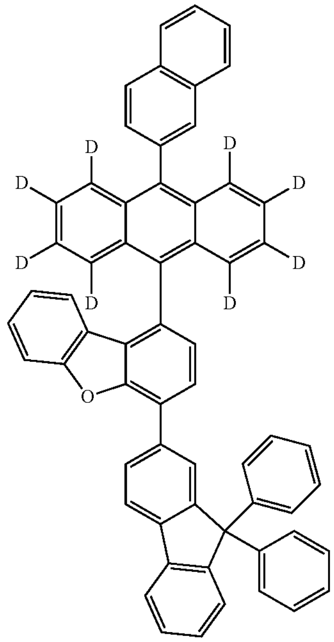

-continued
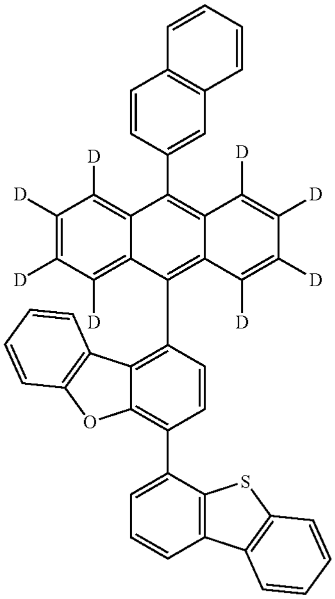
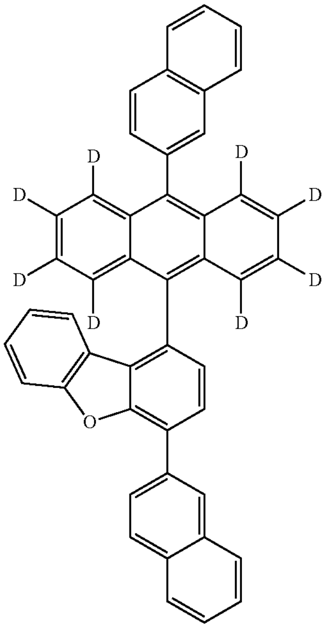
-continued
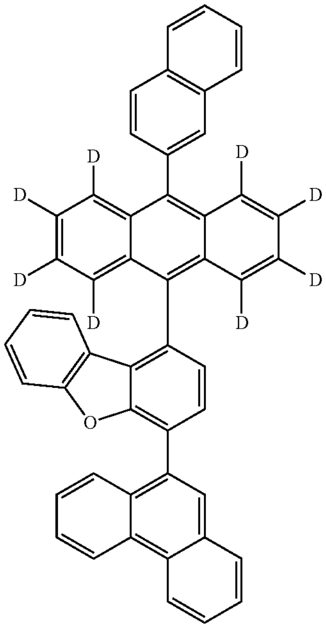
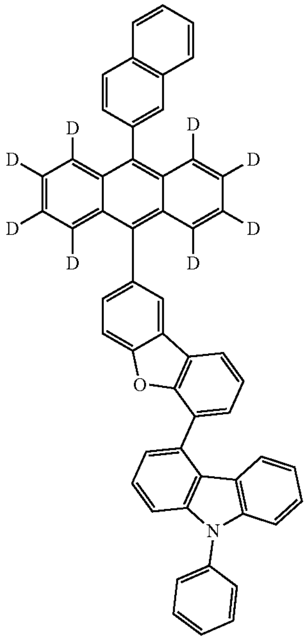

-continued
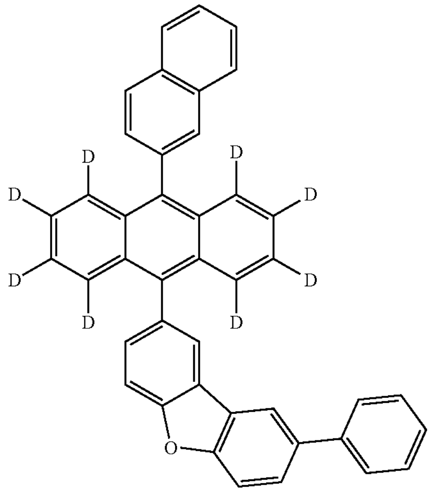
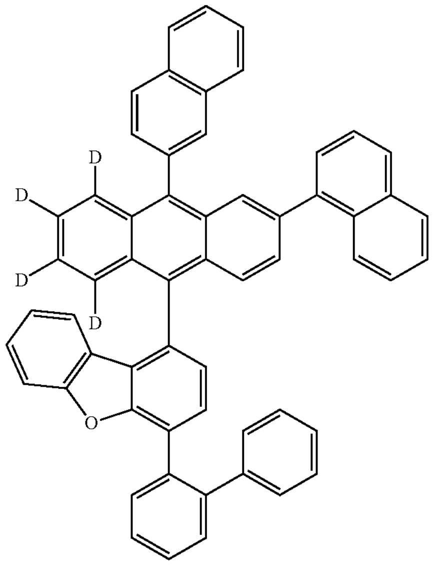
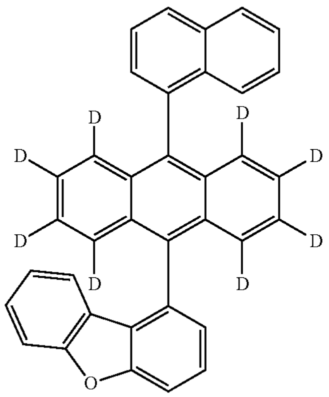
-continued
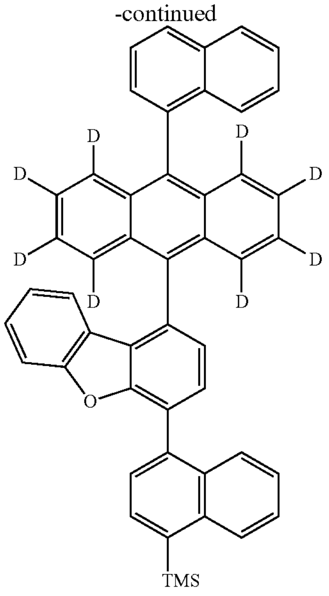
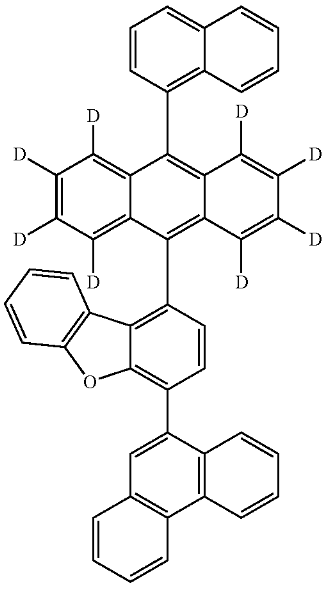

-continued
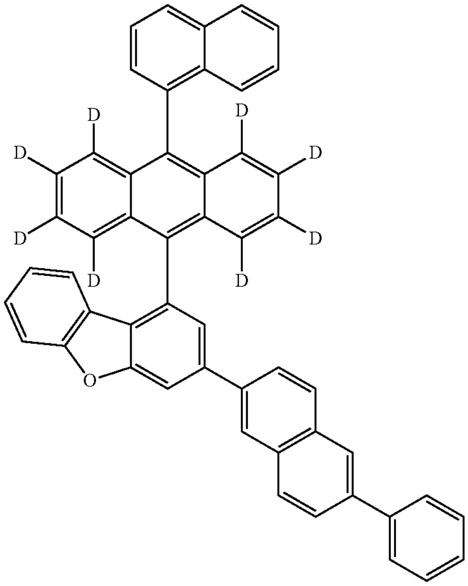
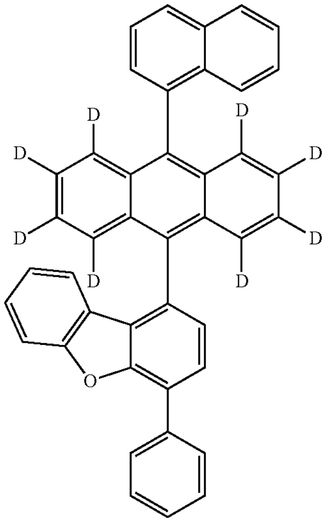
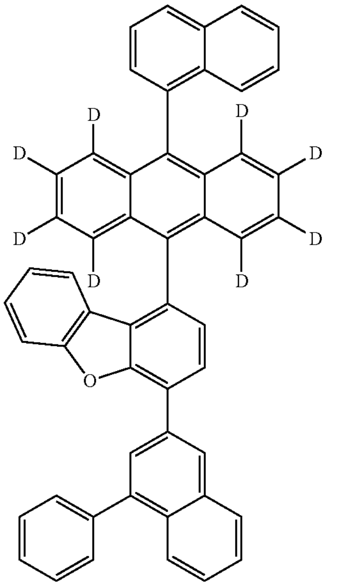
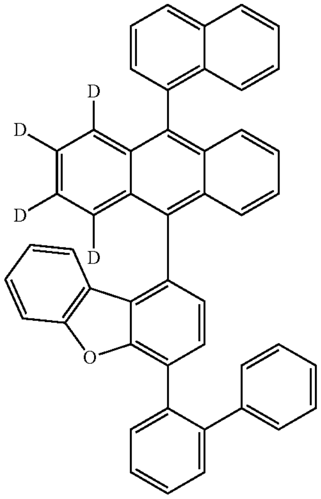
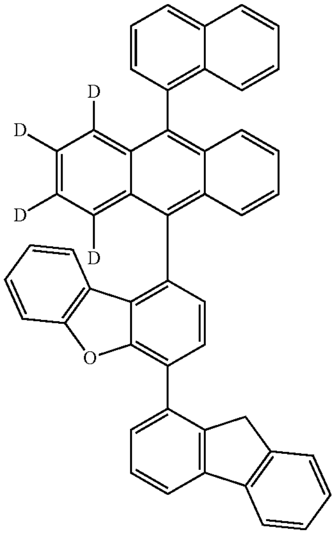
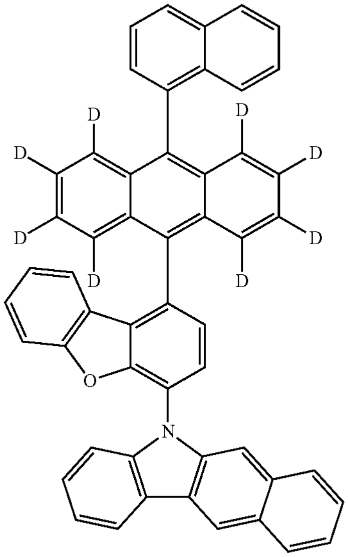

-continued
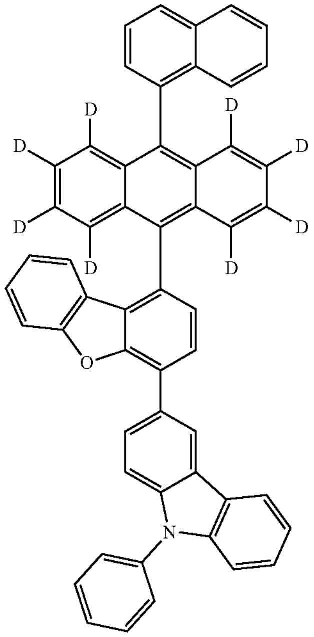
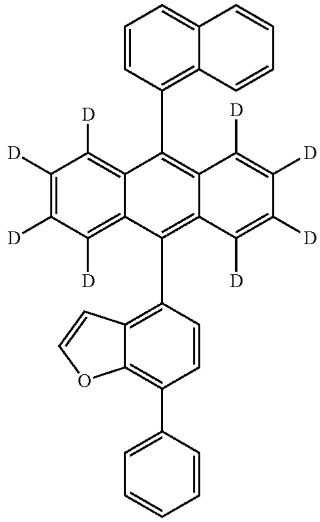
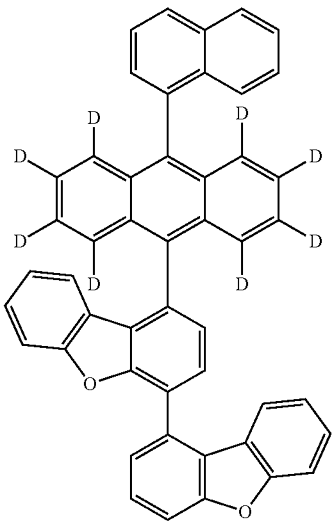
-continued
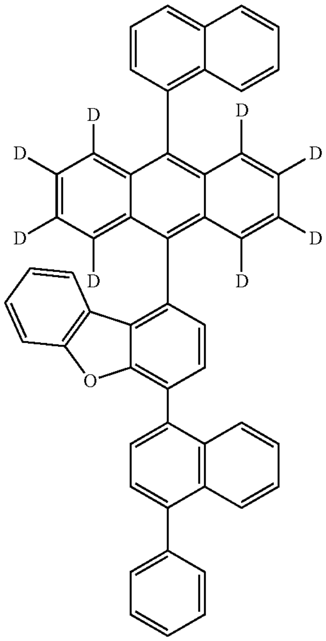
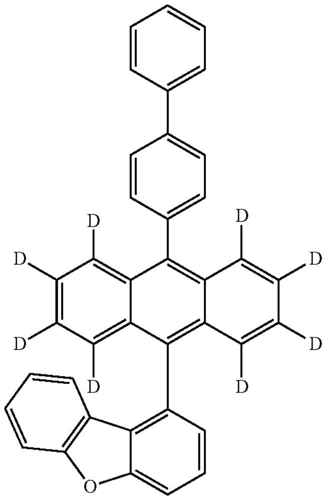
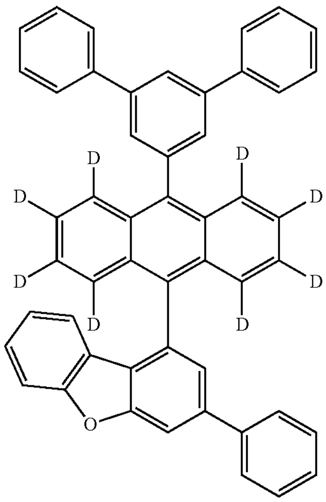

-continued
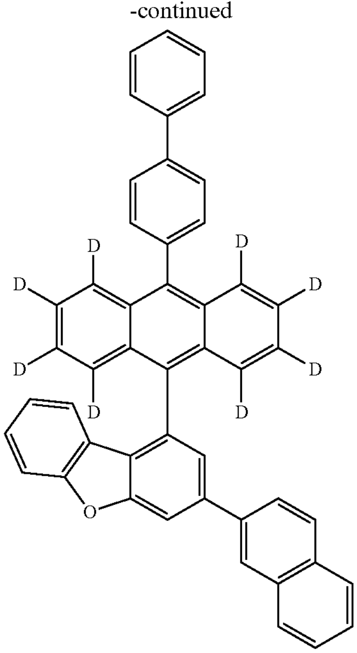
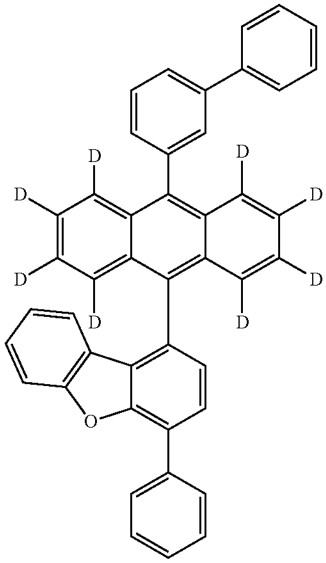
-continued
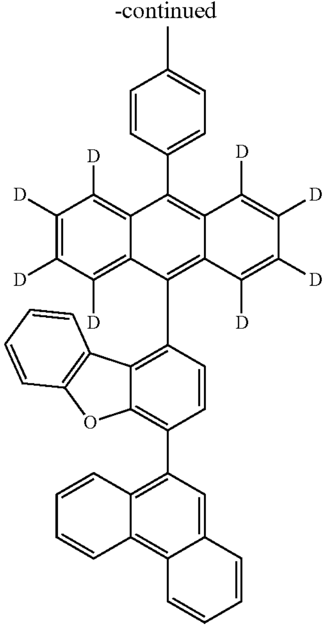
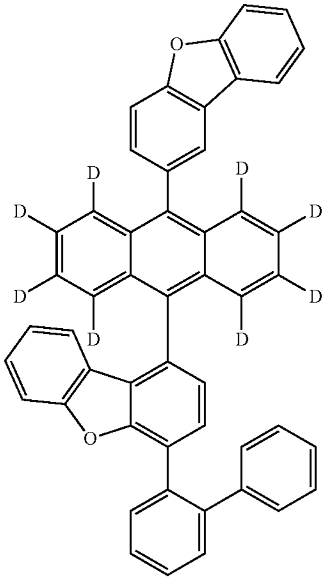

-continued
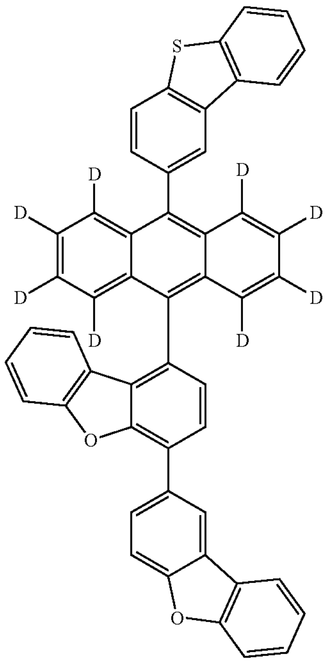
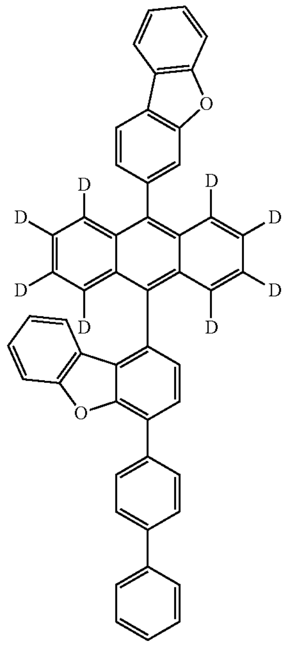
-continued
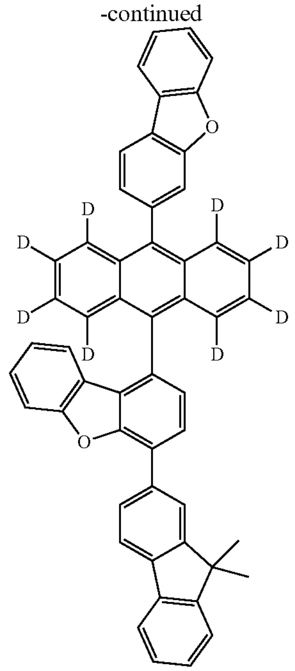
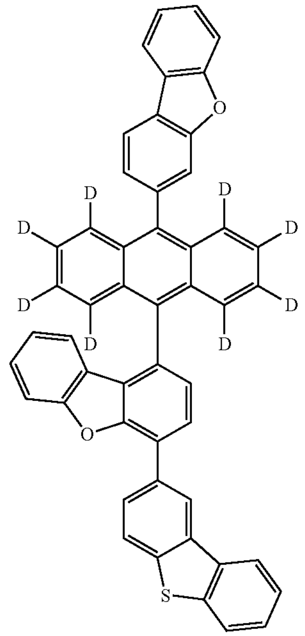

-continued
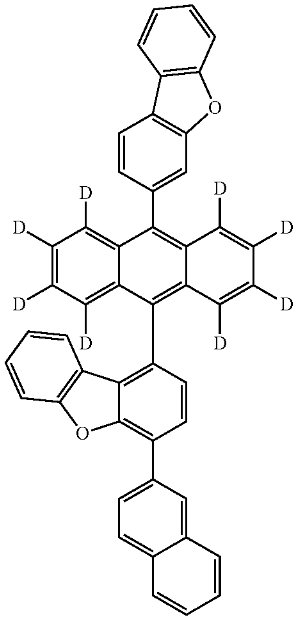
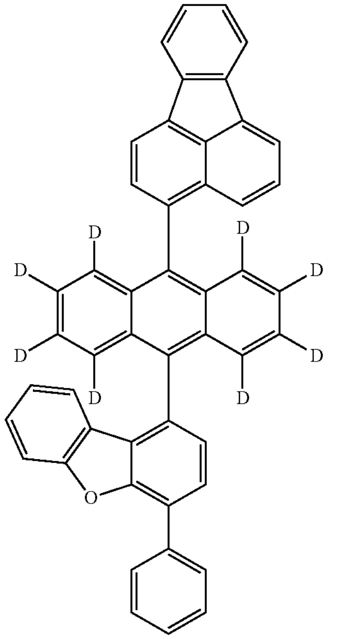
-continued
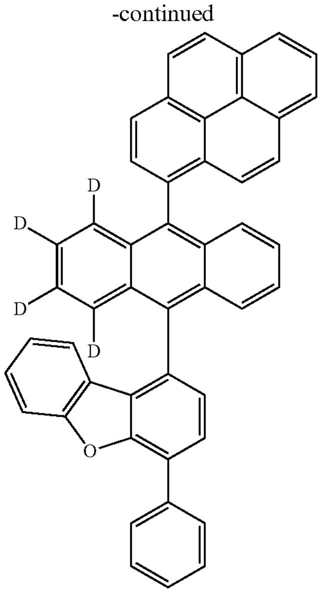
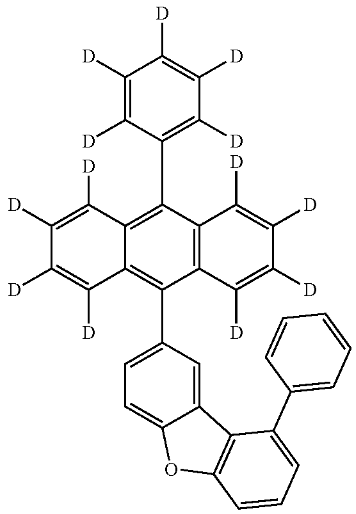
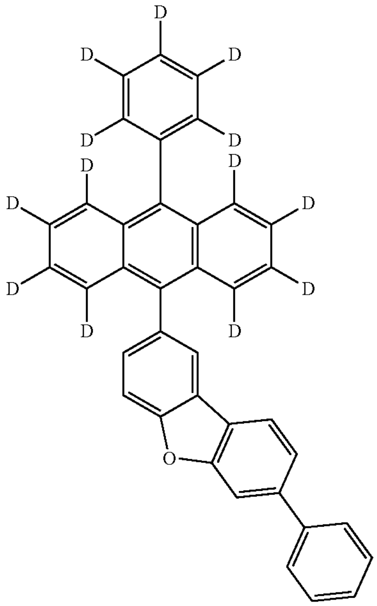

-continued
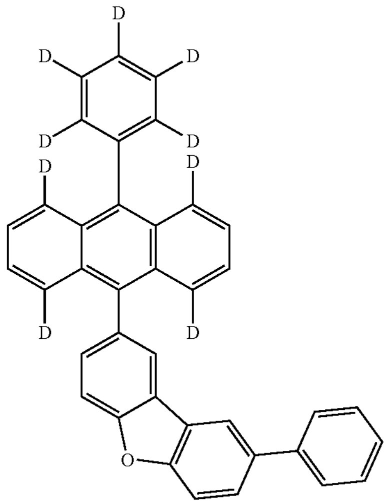
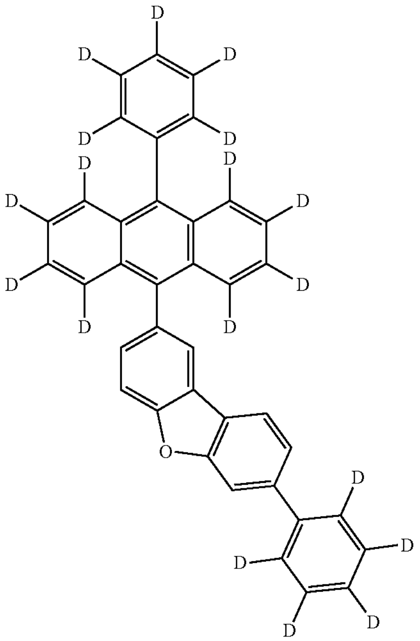
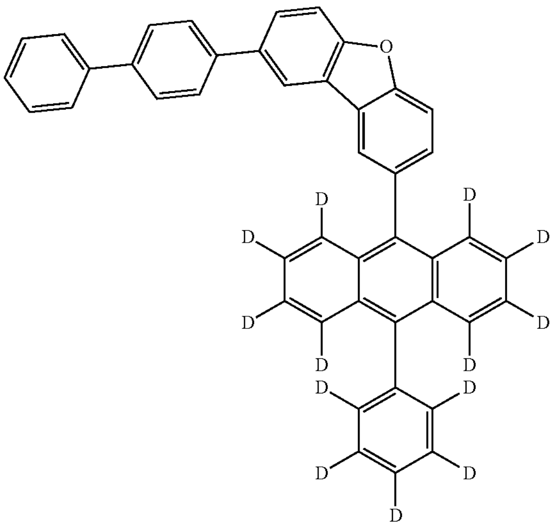
-continued
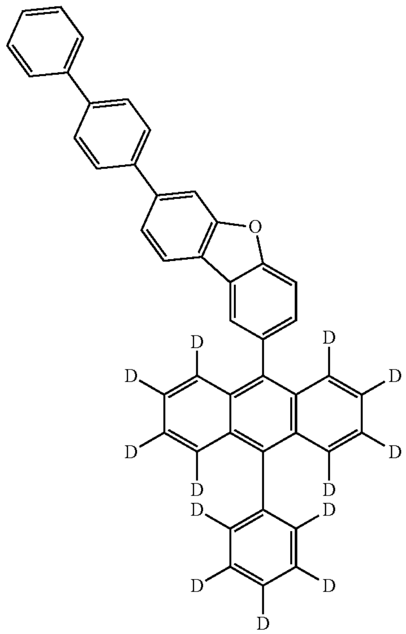
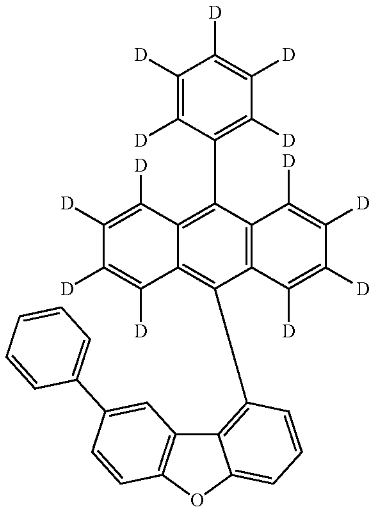
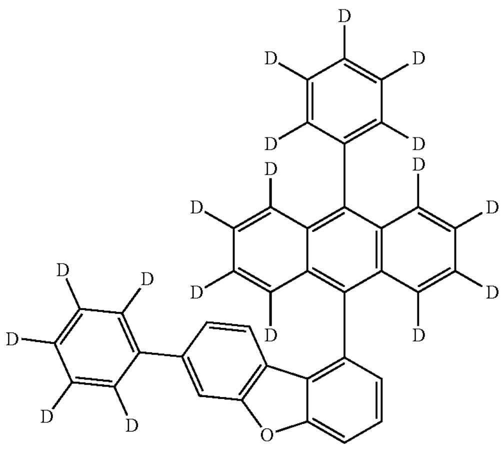

-continued
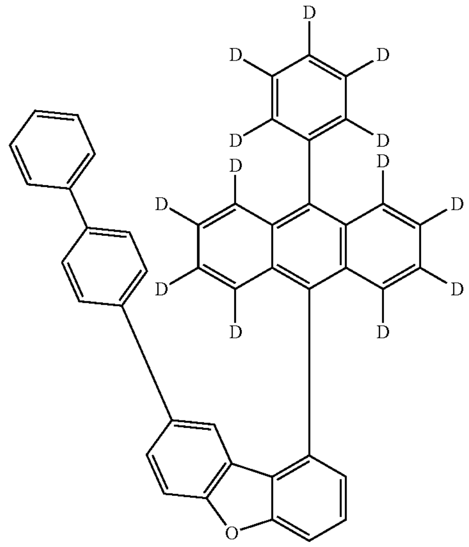
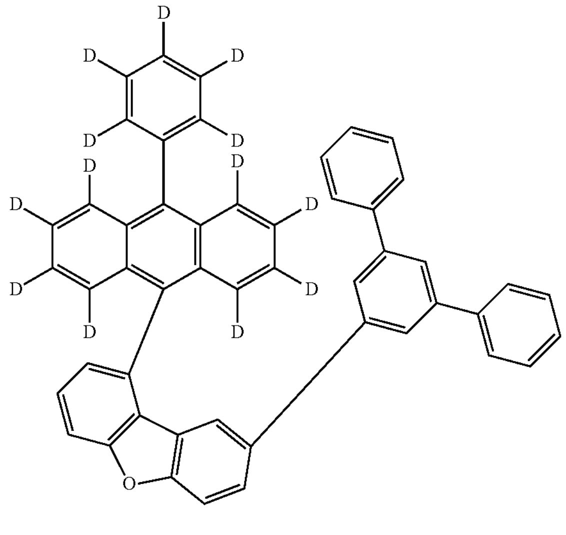
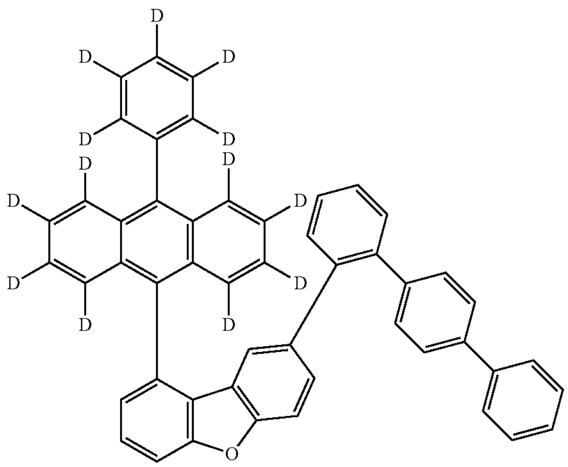
-continued
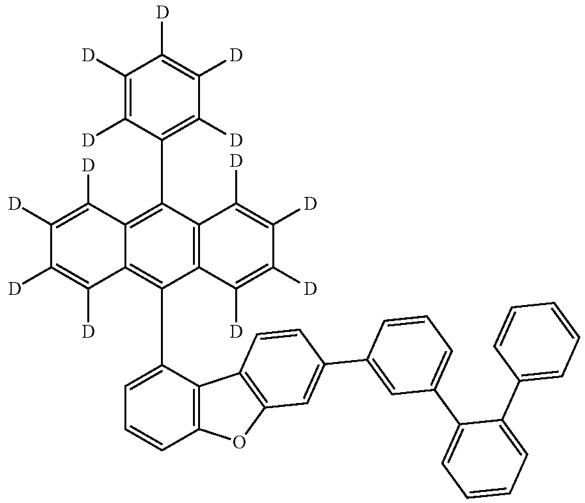
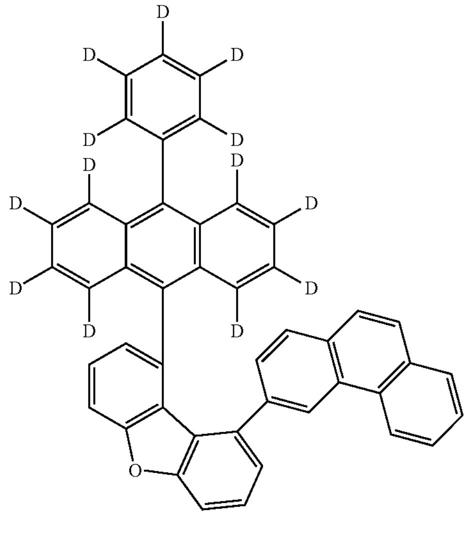
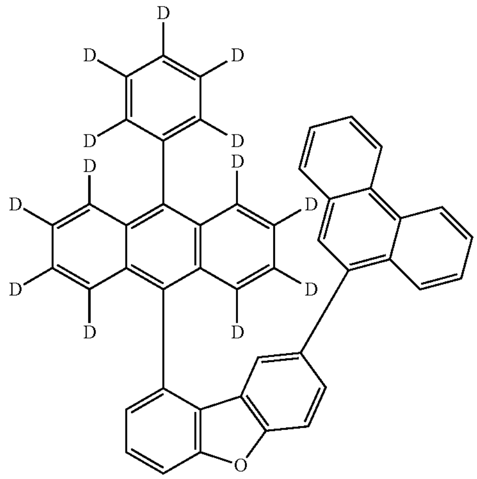

-continued
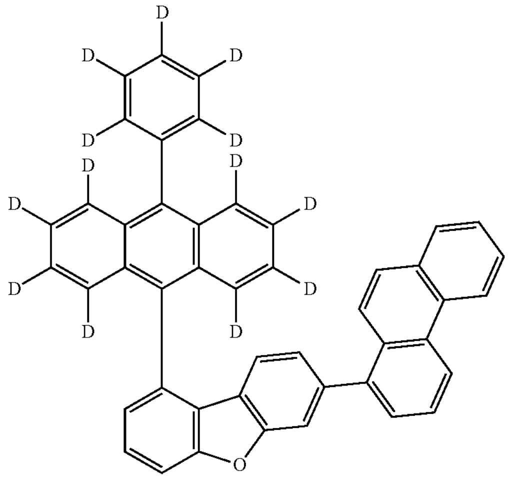
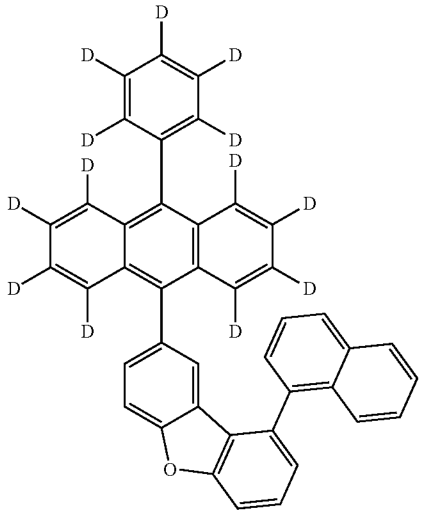
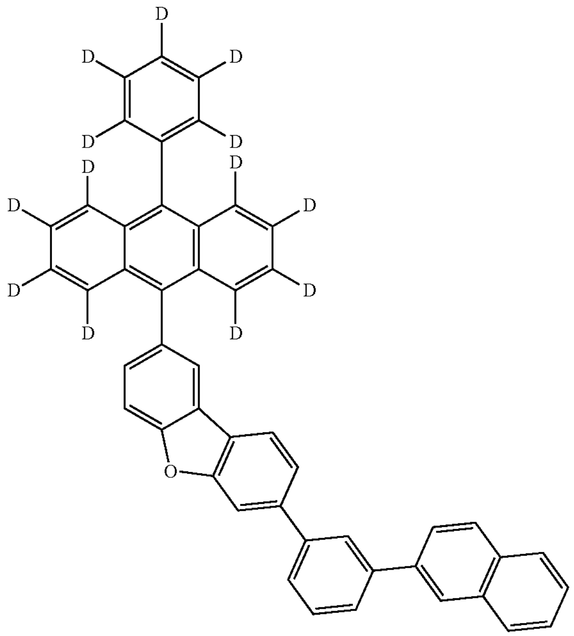
-continued
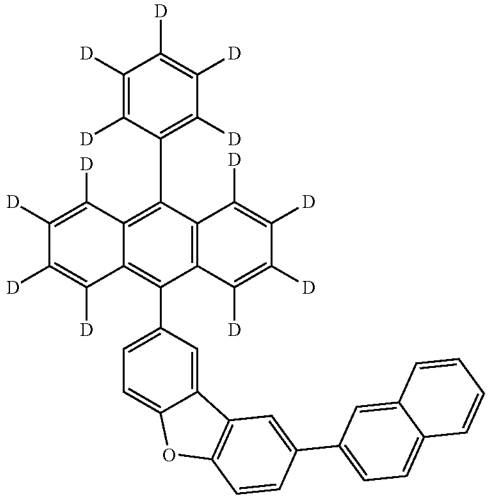
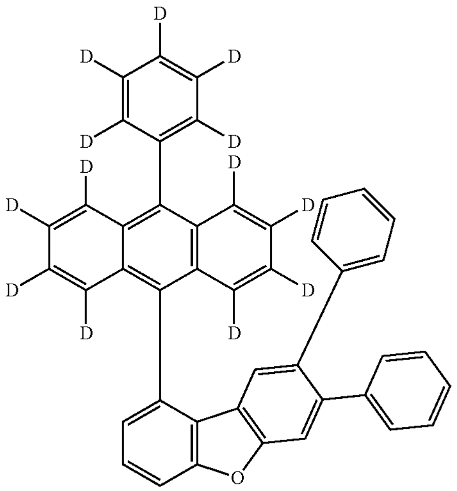
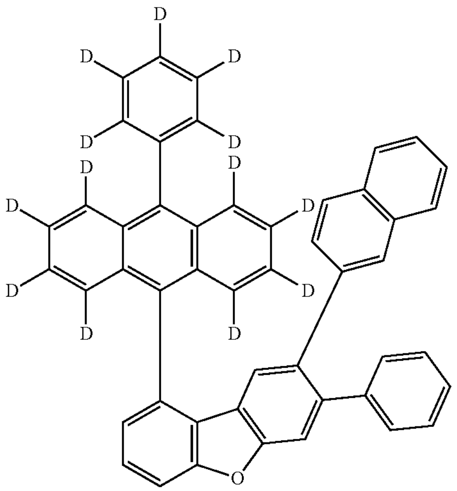

-continued
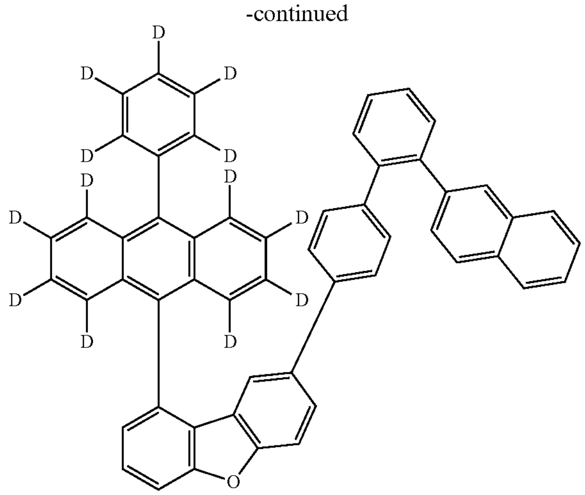
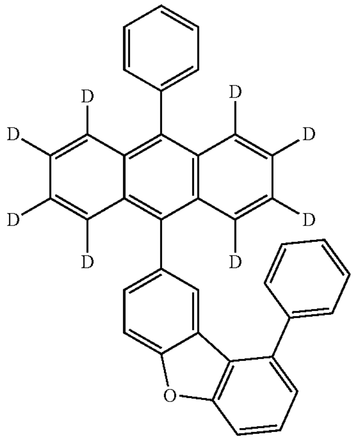
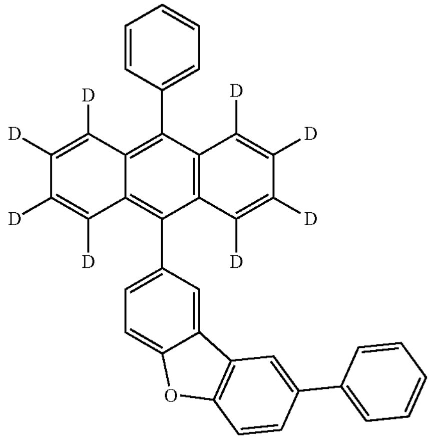
-continued
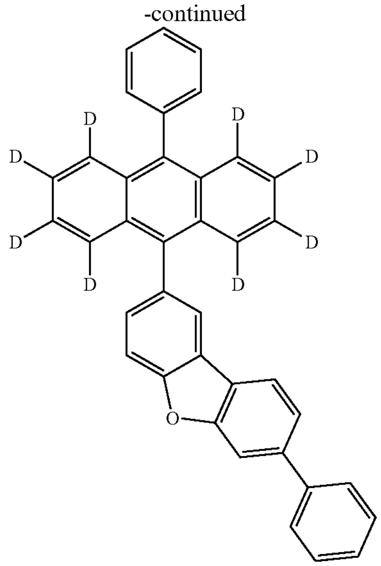
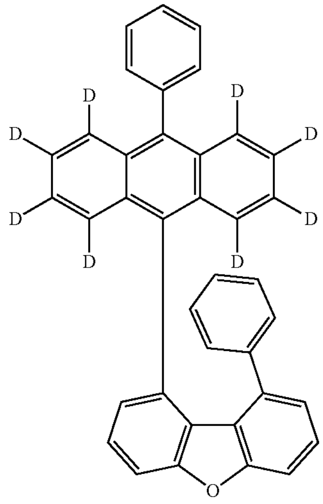
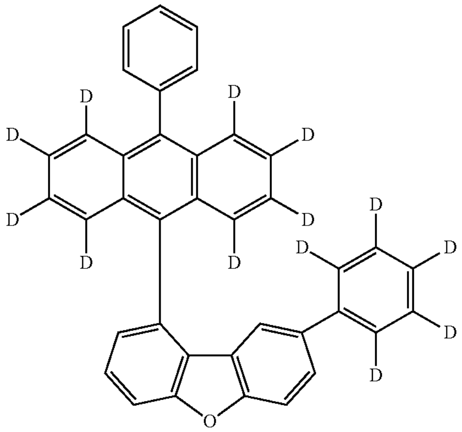

-continued
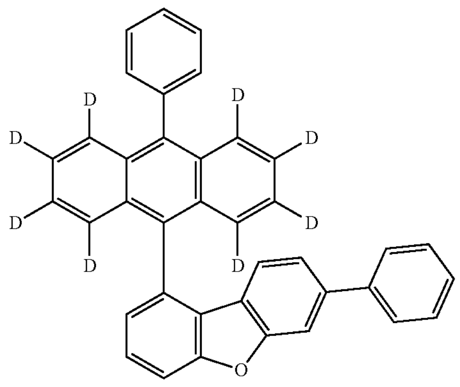
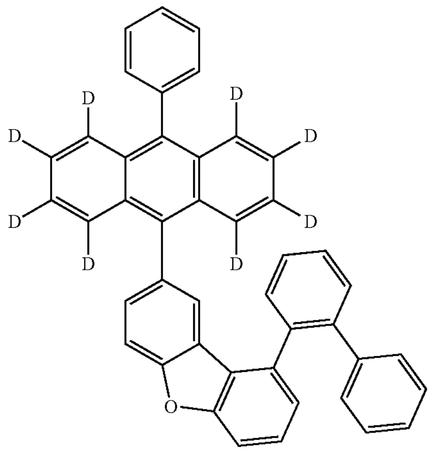
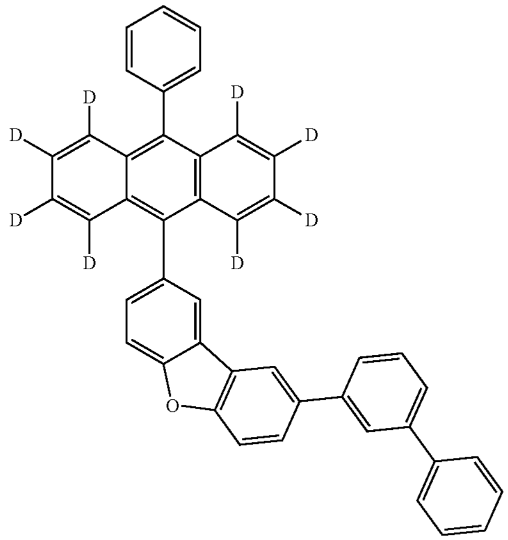
-continued
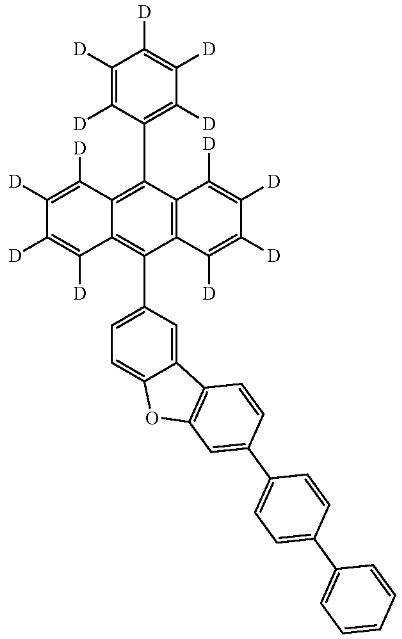
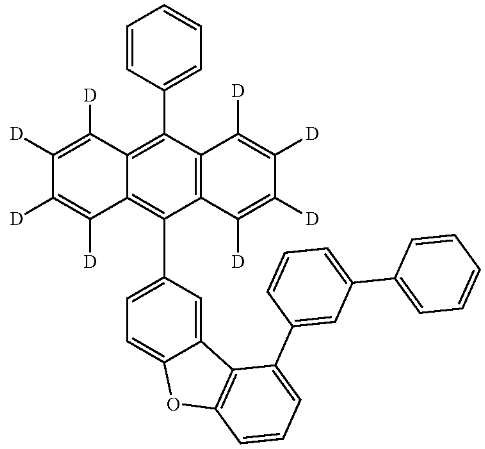
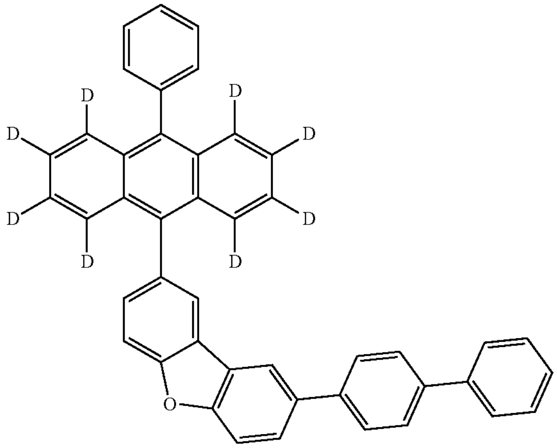

-continued
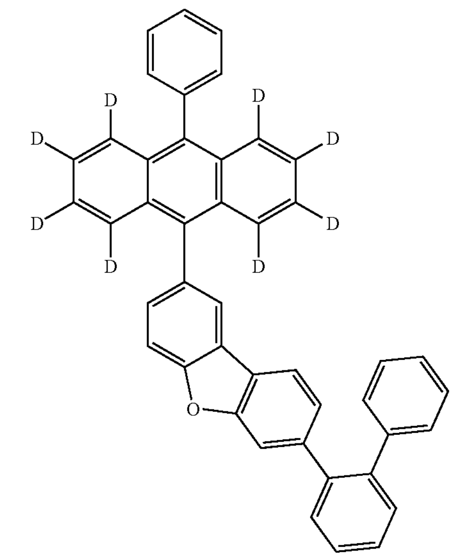
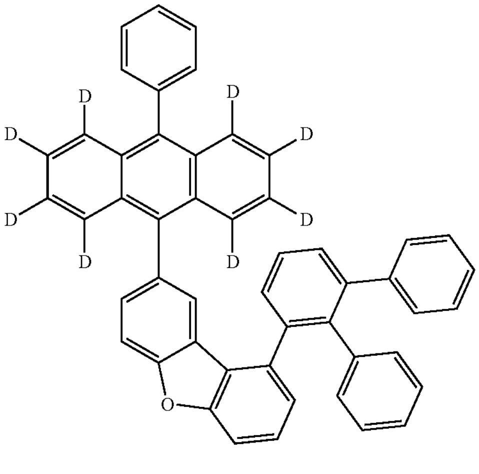
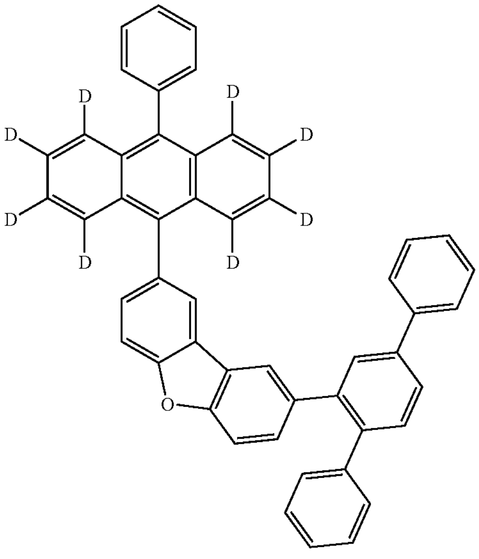
-continued
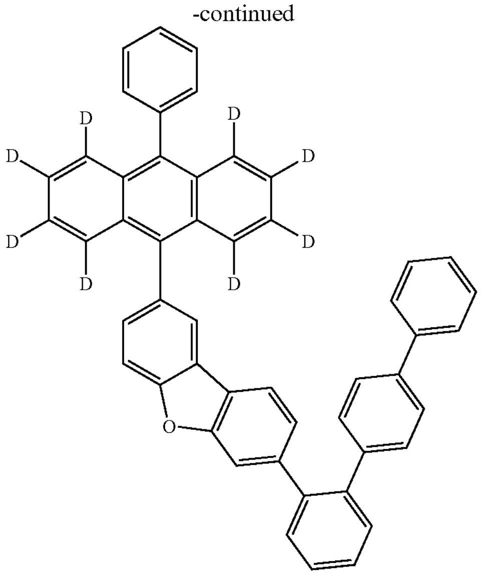
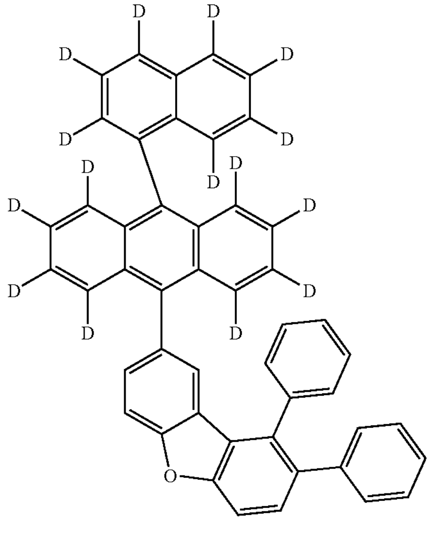
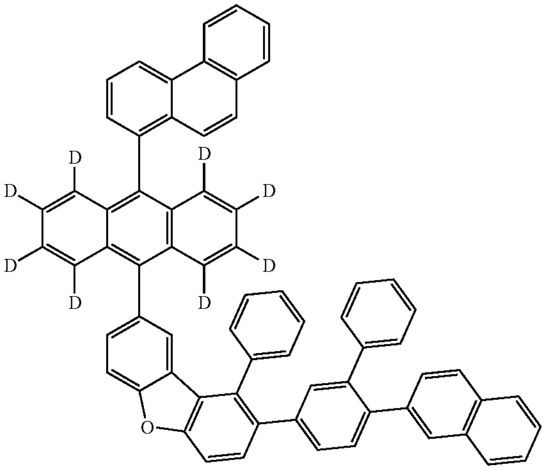

-continued
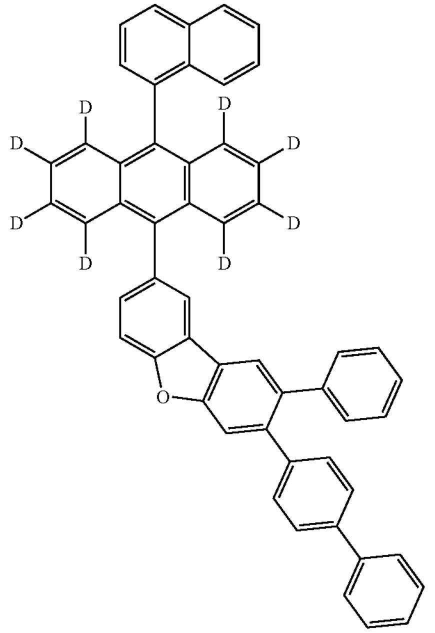
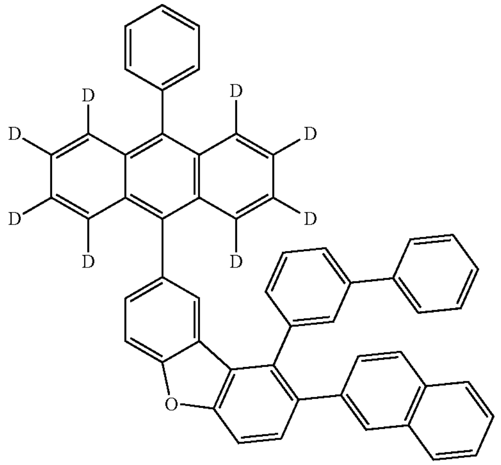
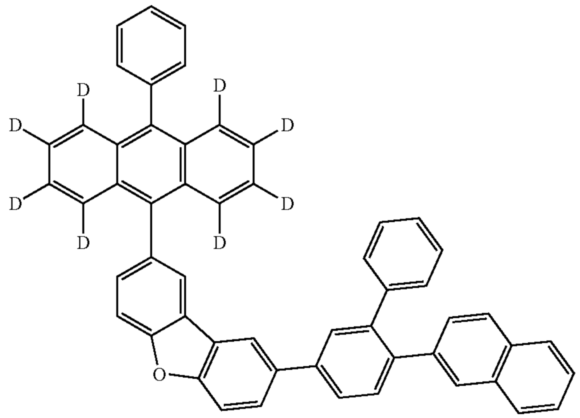
-continued
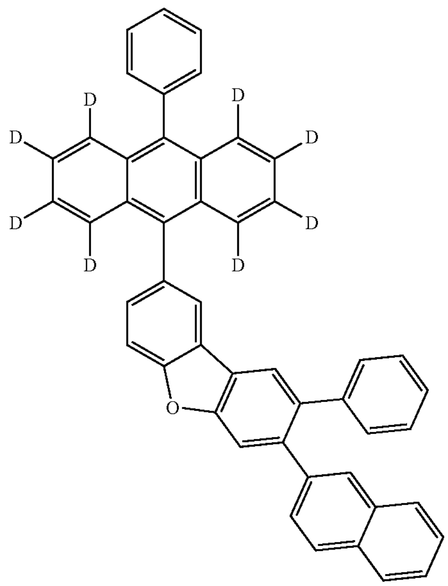
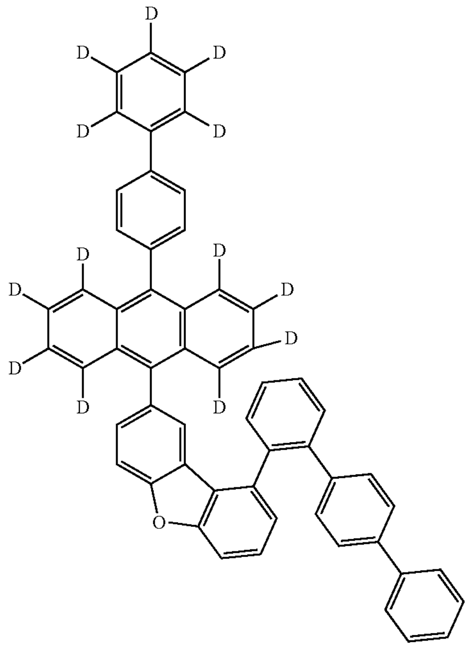

-continued
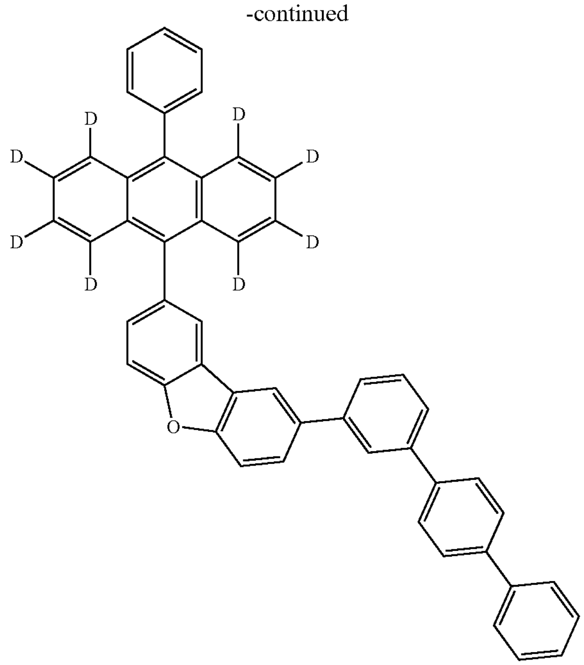
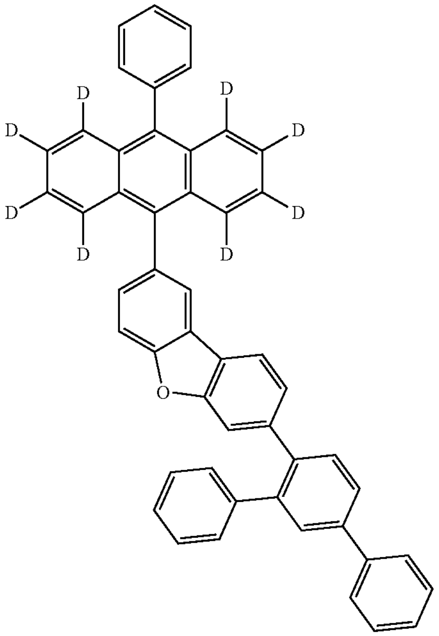
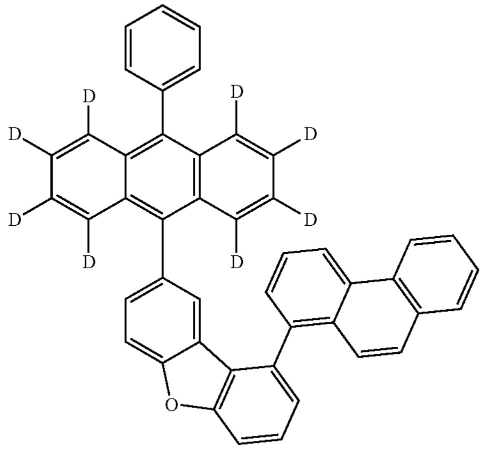
-continued
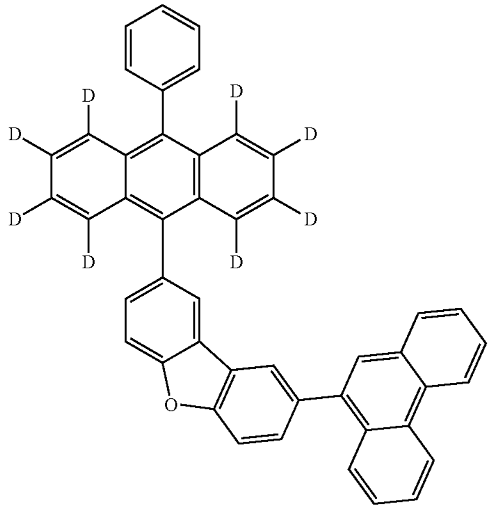
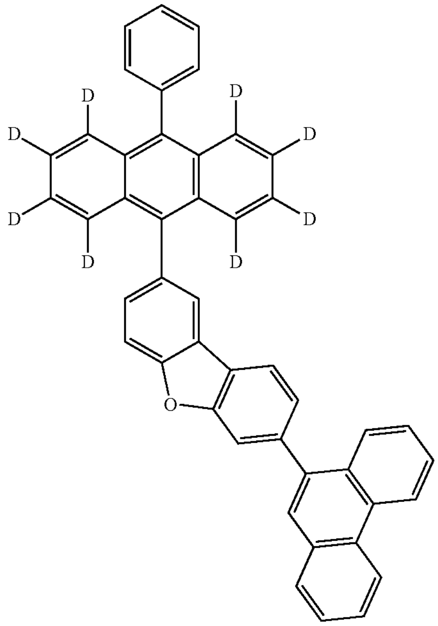
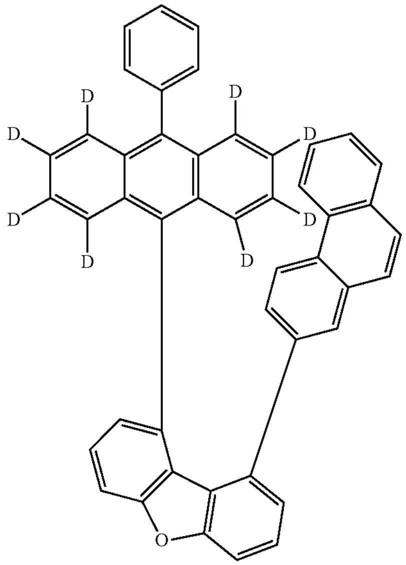

-continued
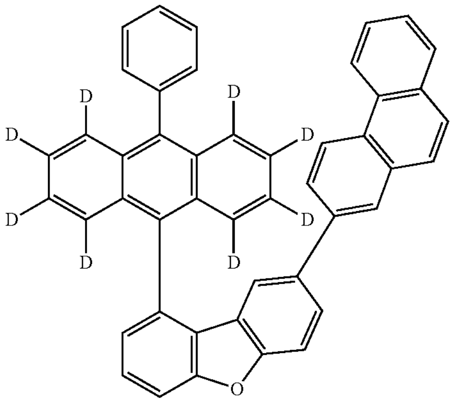
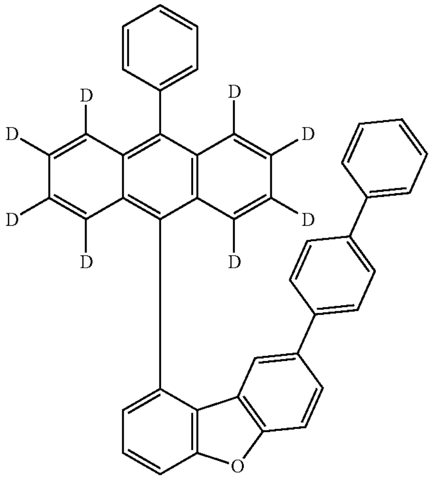
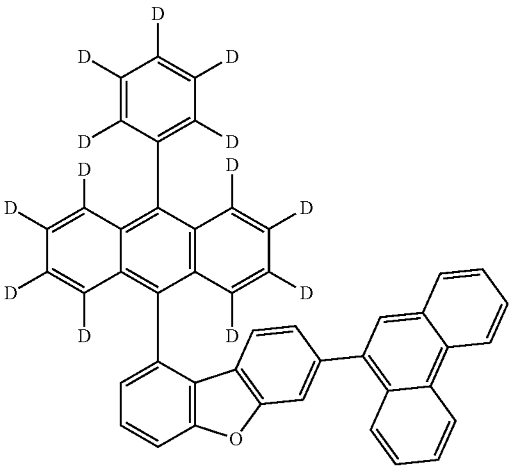
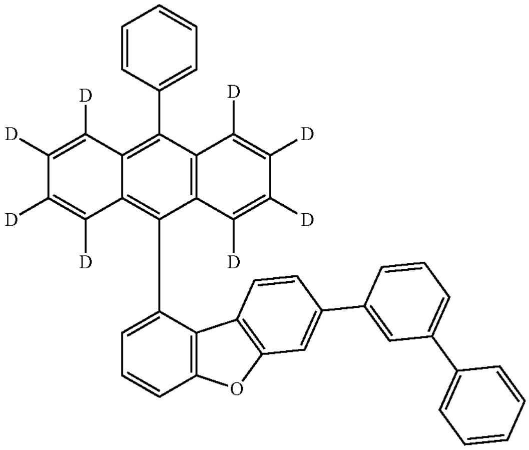
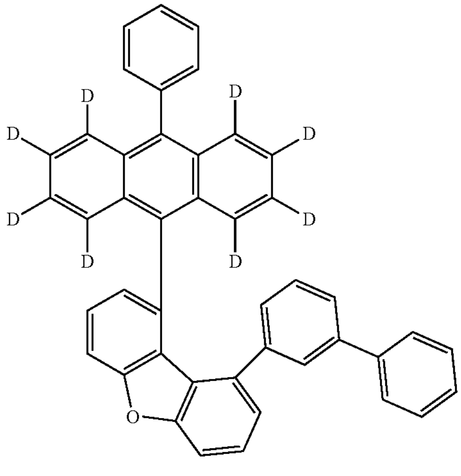
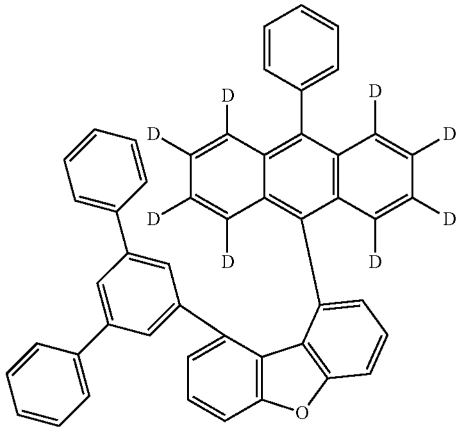
-continued -continued
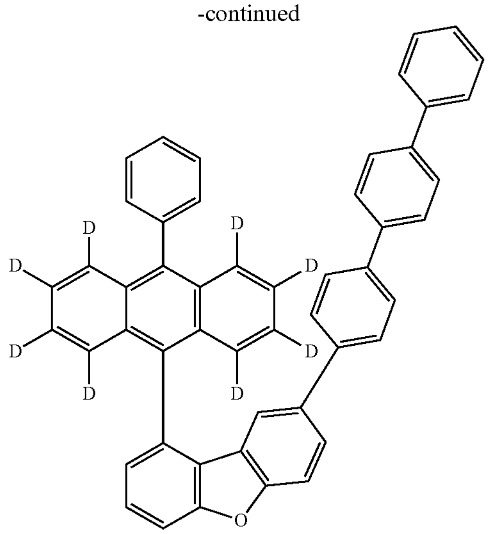
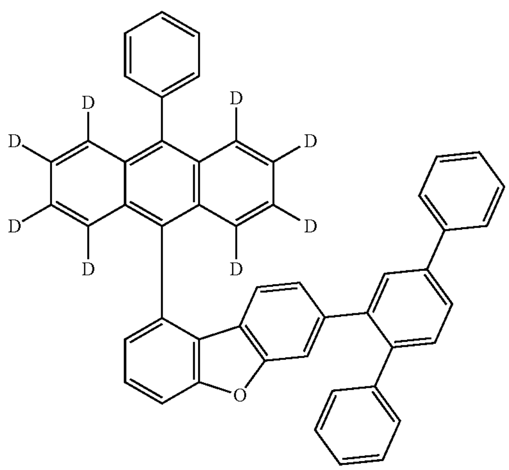
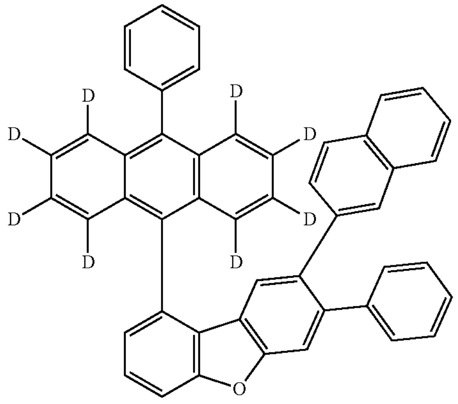
-continued
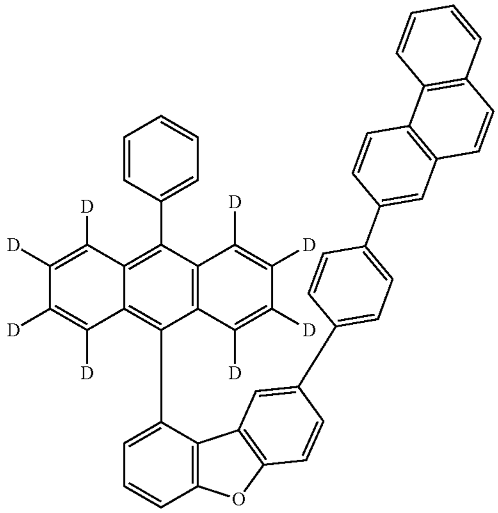
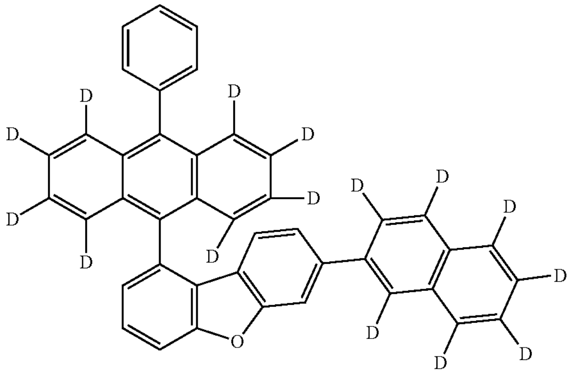
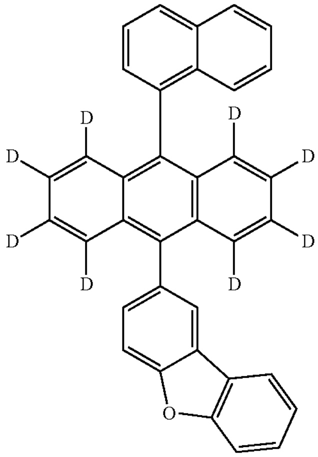

-continued
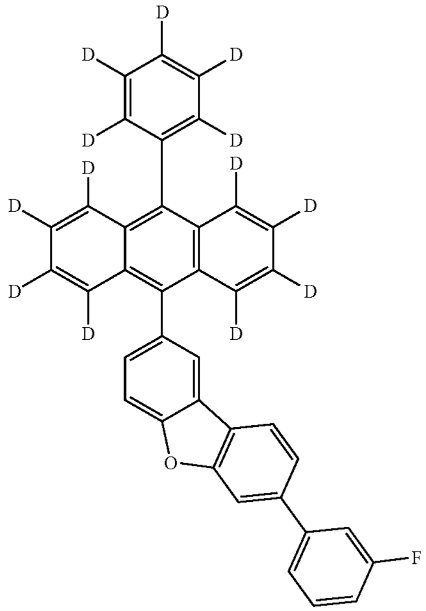
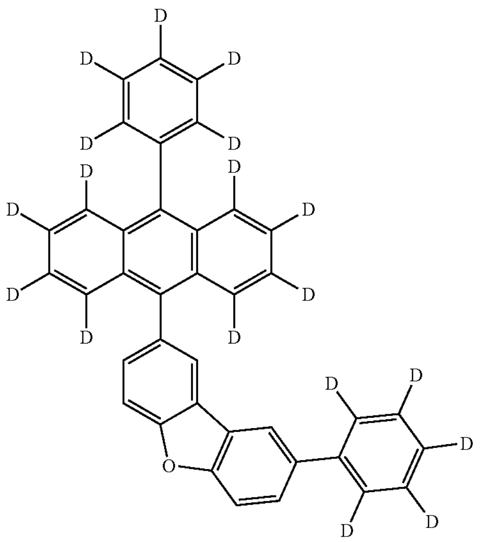
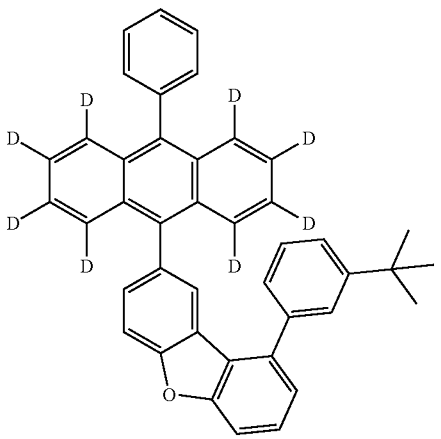
-continued
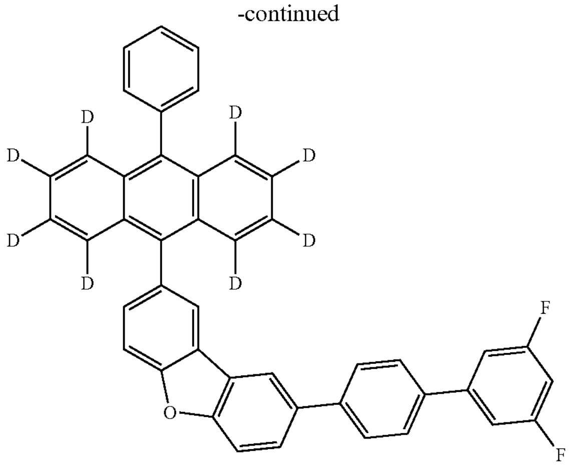
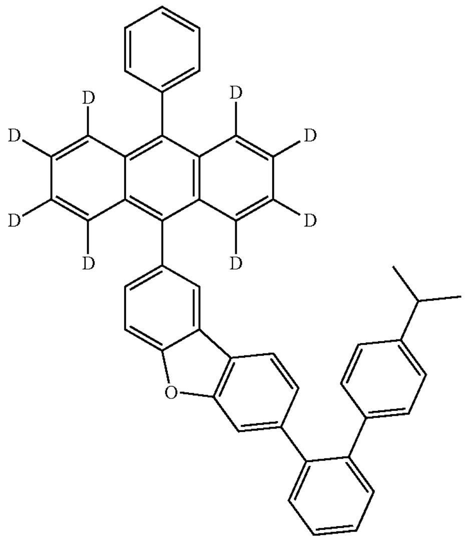
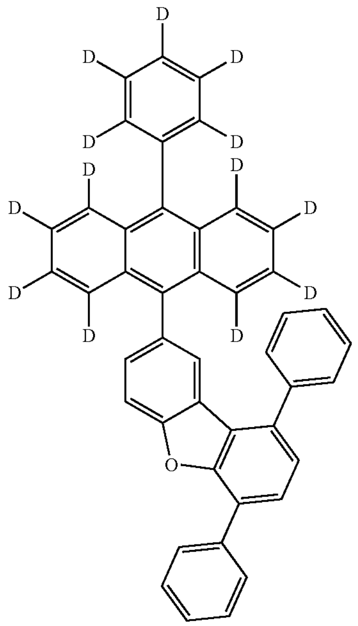

-continued
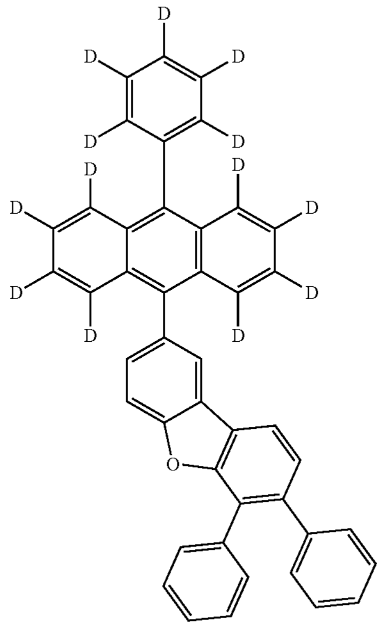
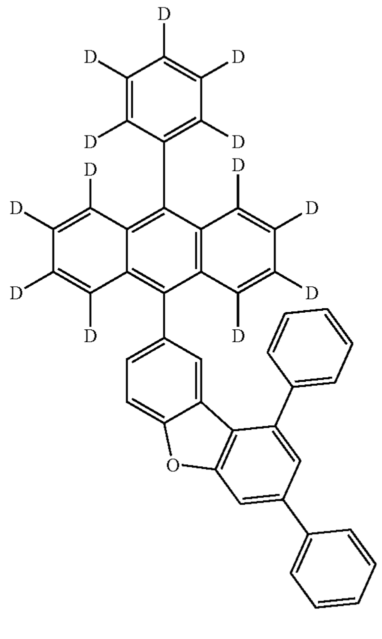
-continued
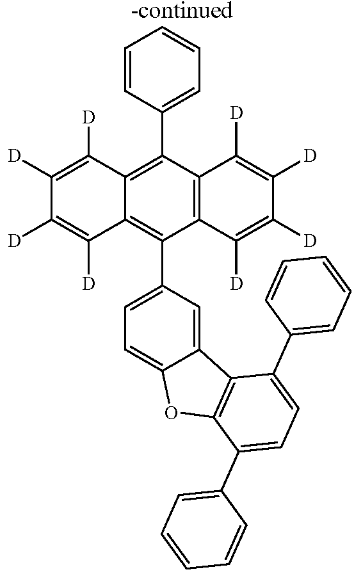
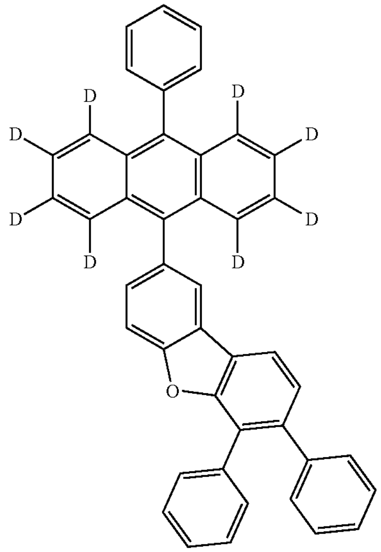
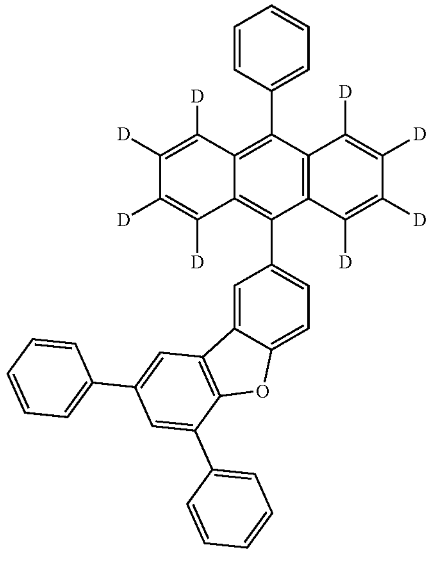

-continued
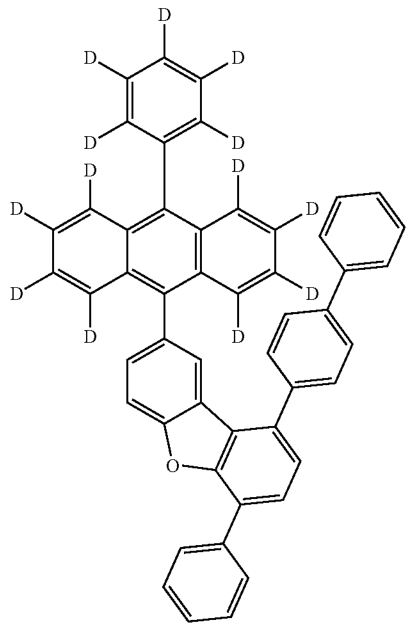
-continued
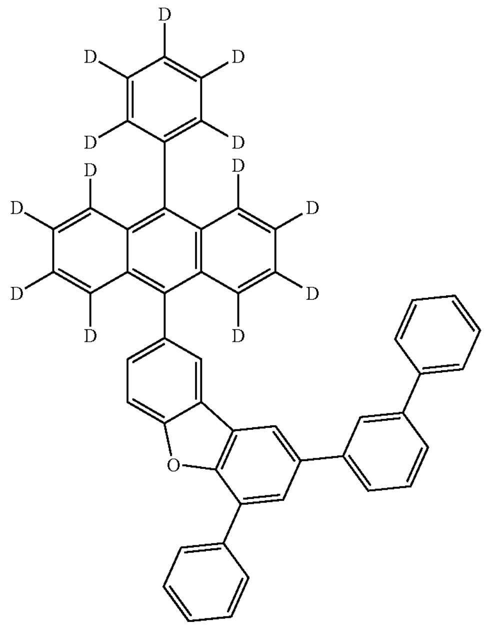
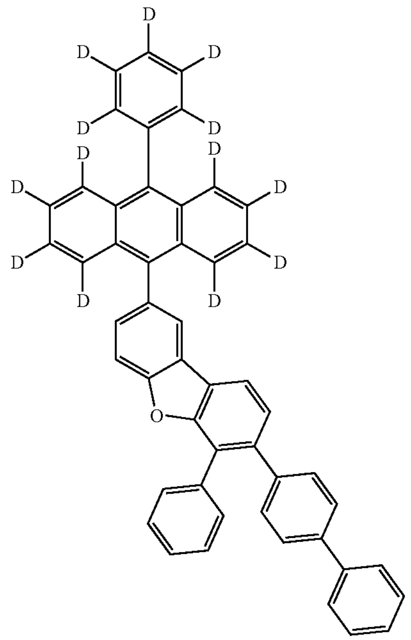
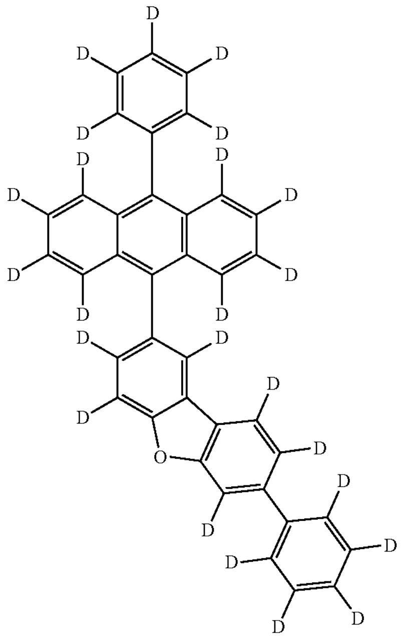

-continued
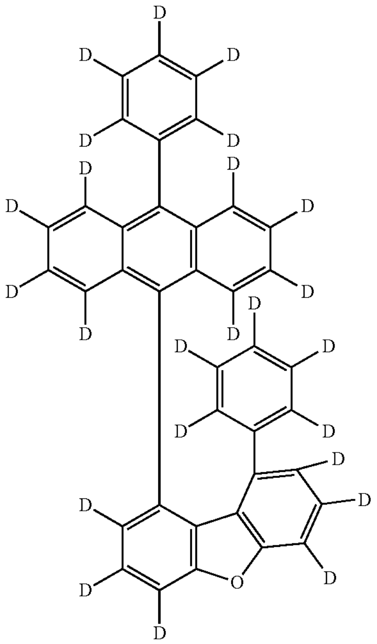
-continued
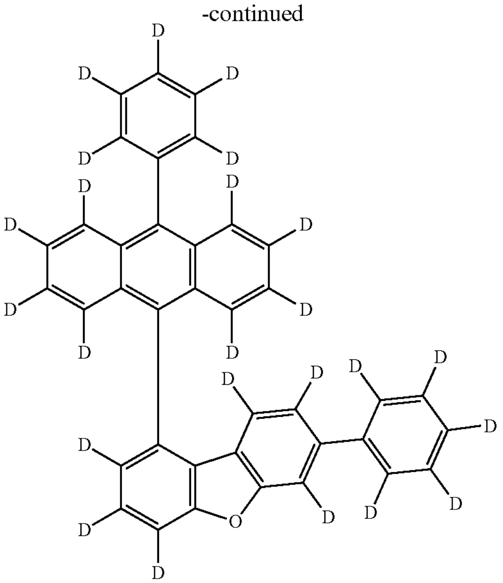
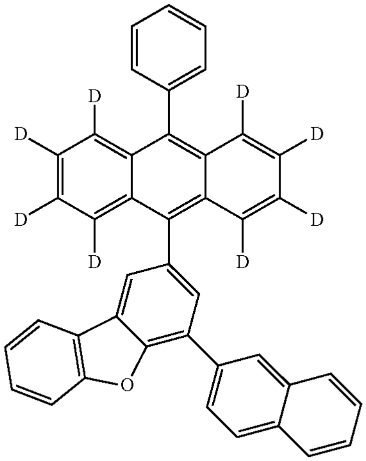
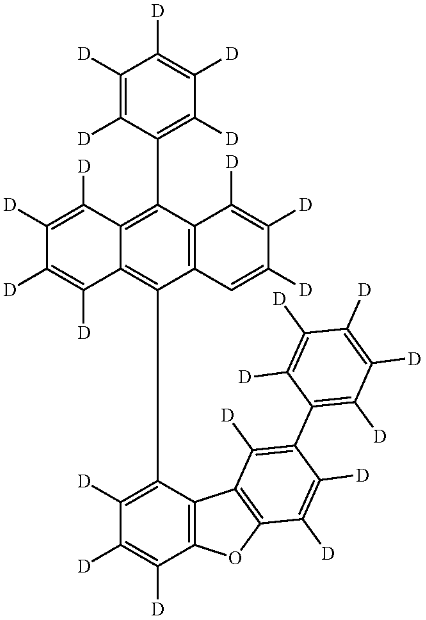
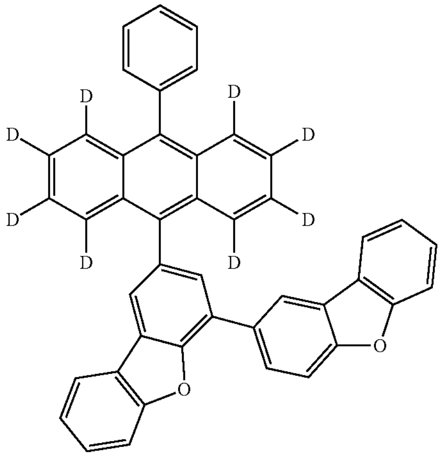

-continued
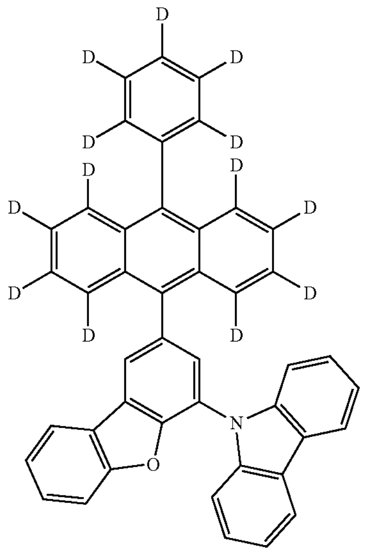
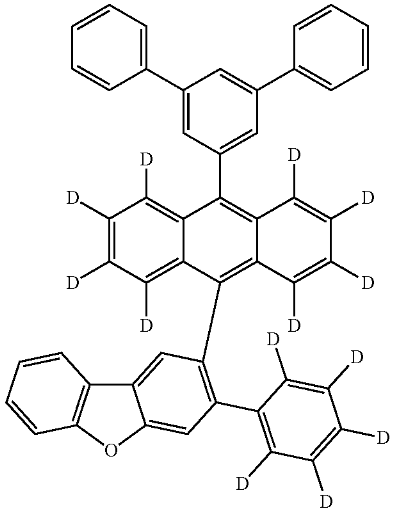
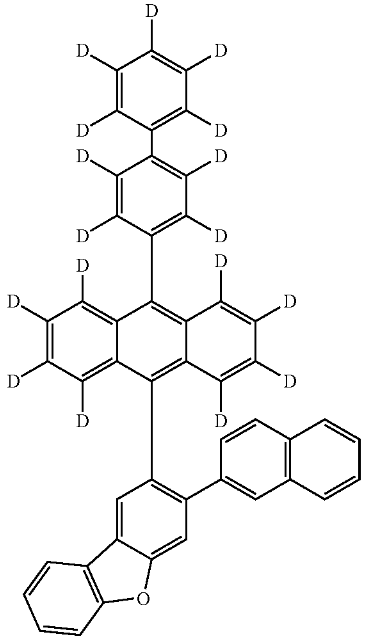
-continued
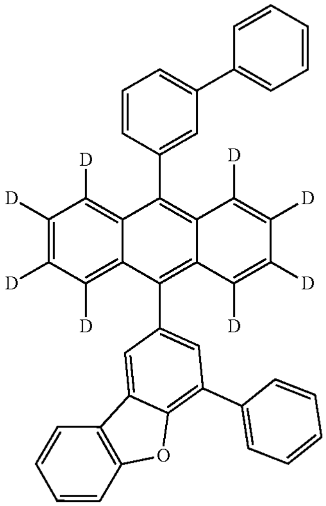
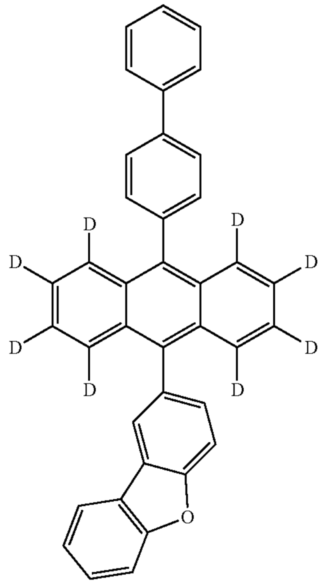
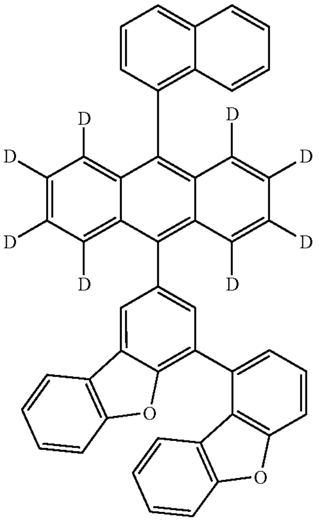

-continued
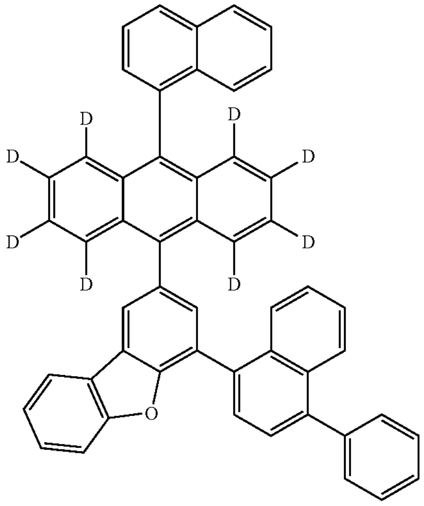
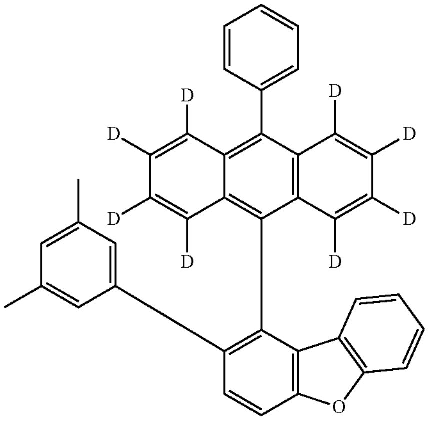
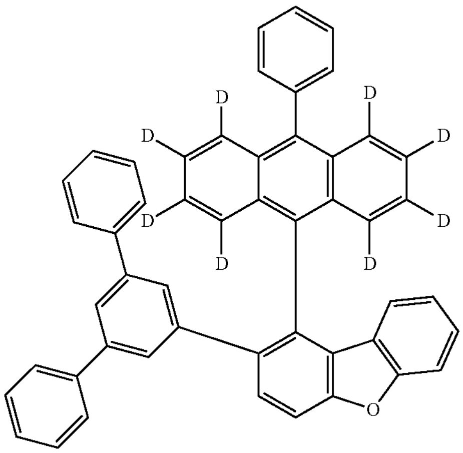
-continued
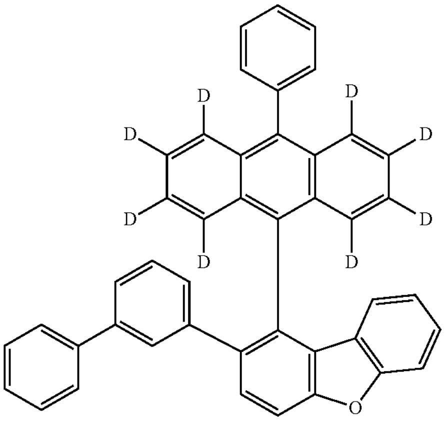
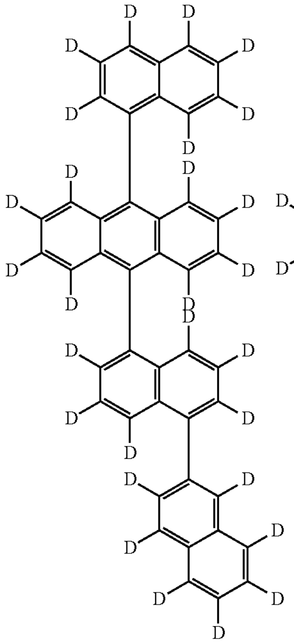
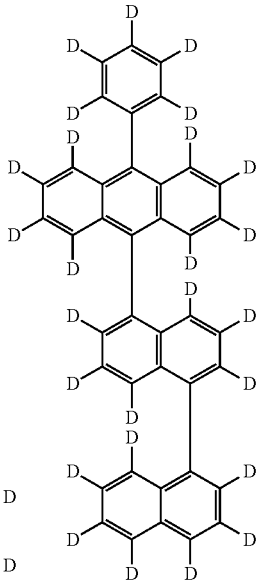
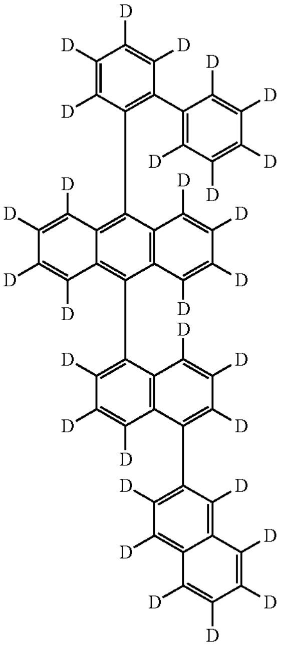

-continued
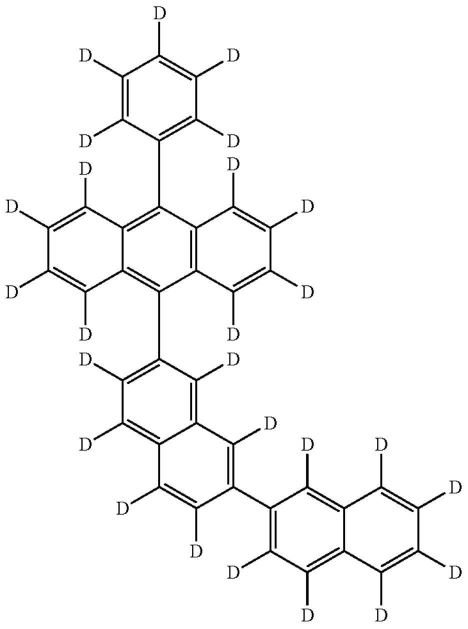
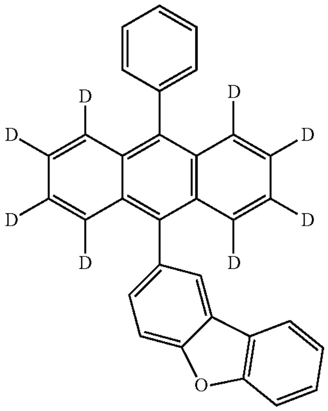
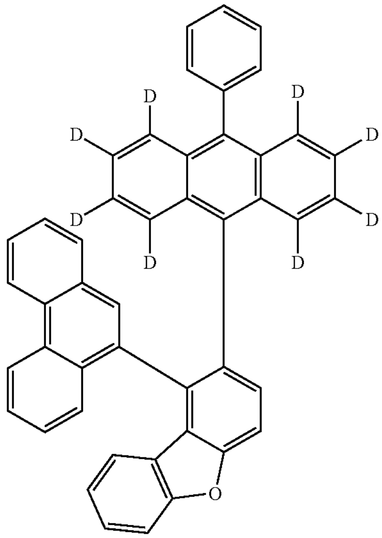
-continued
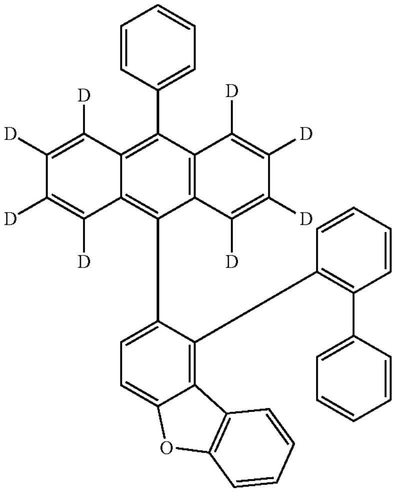
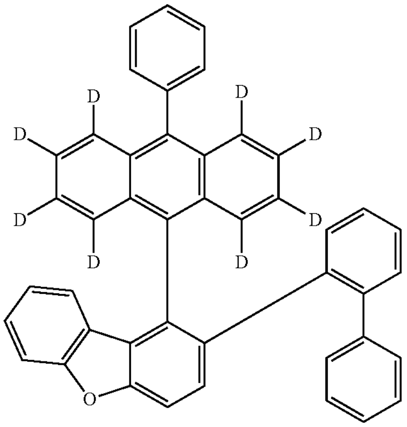
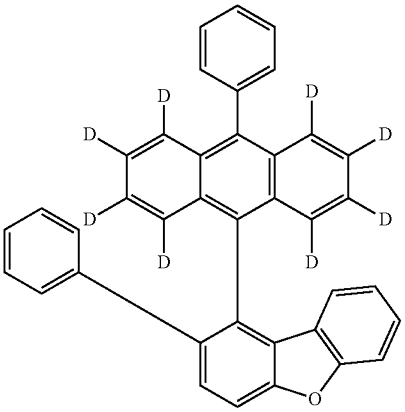

-continued
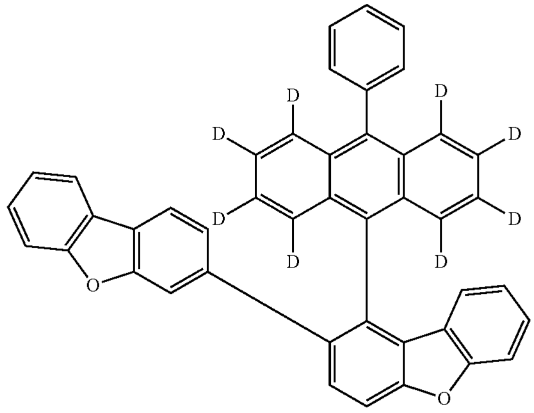
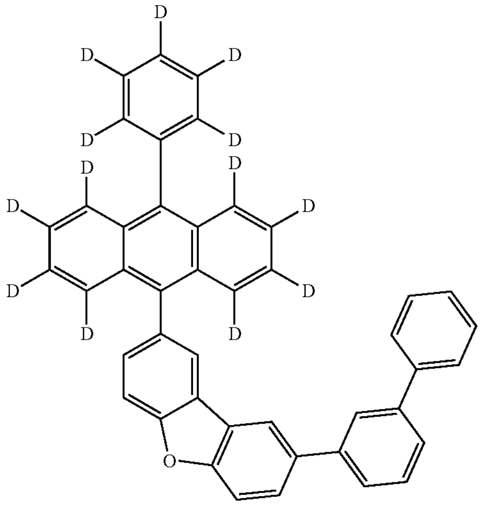
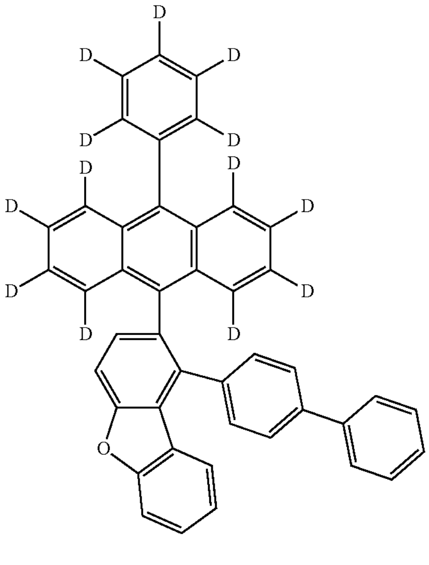
-continued
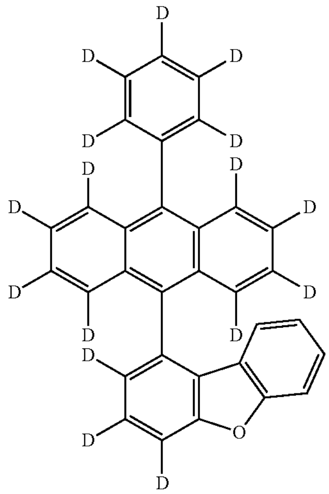
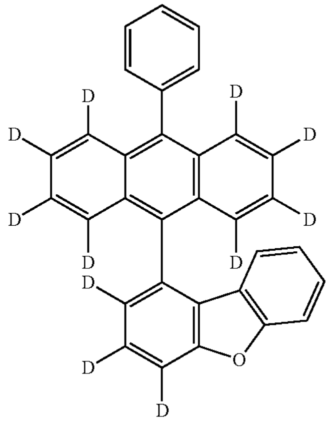
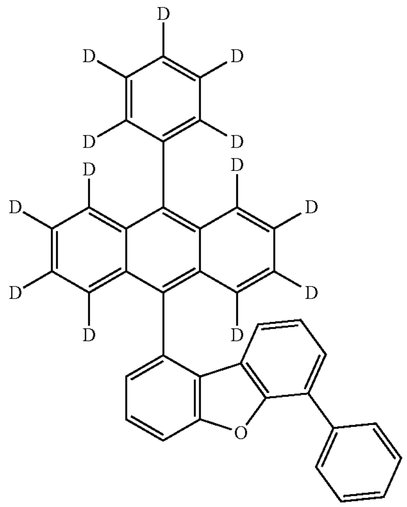

-continued
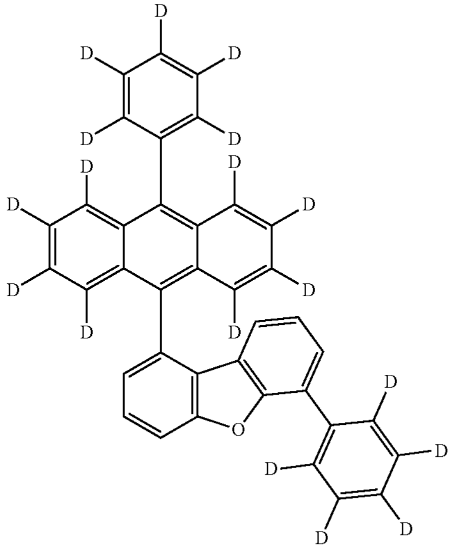
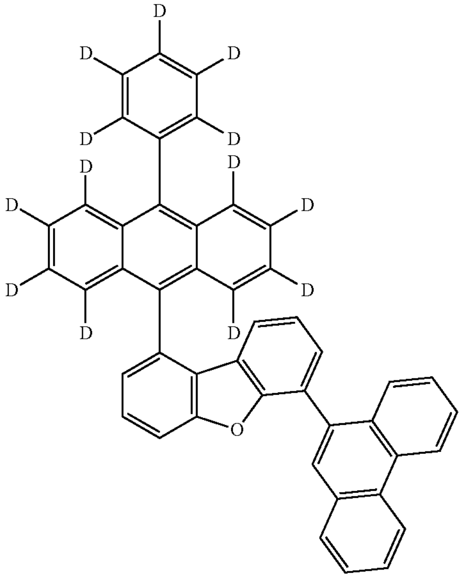
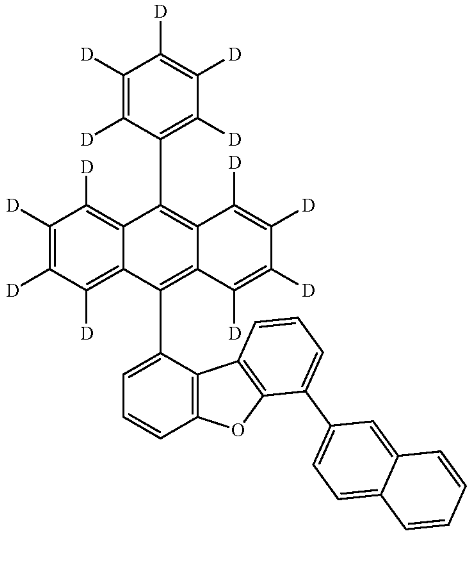
-continued
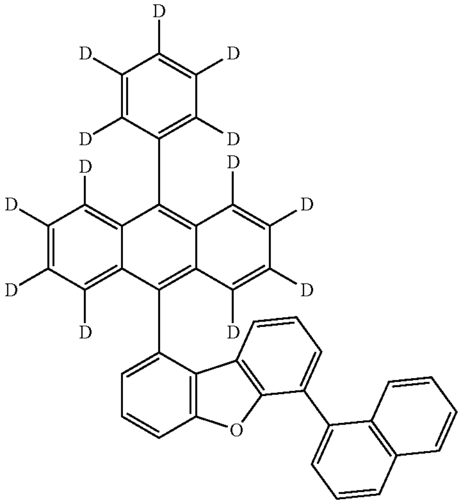
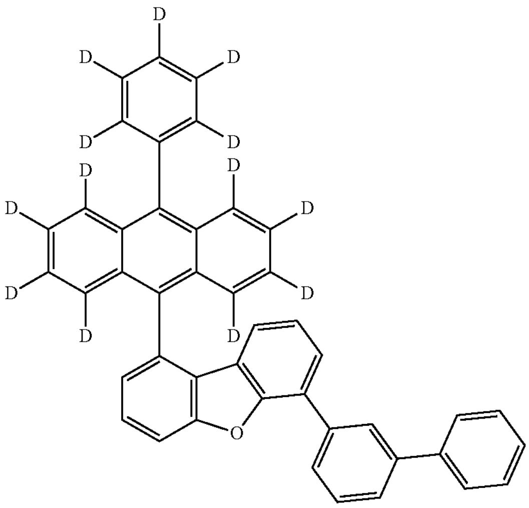
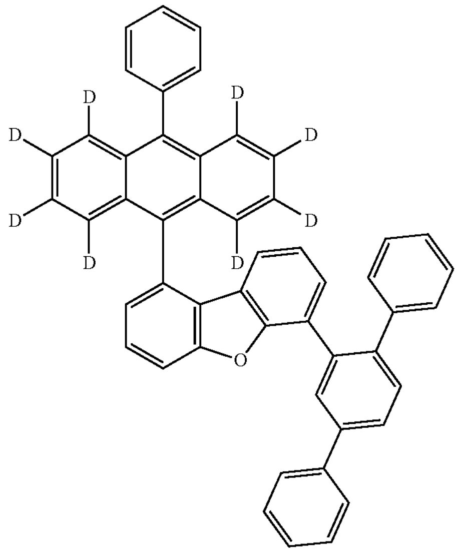

-continued
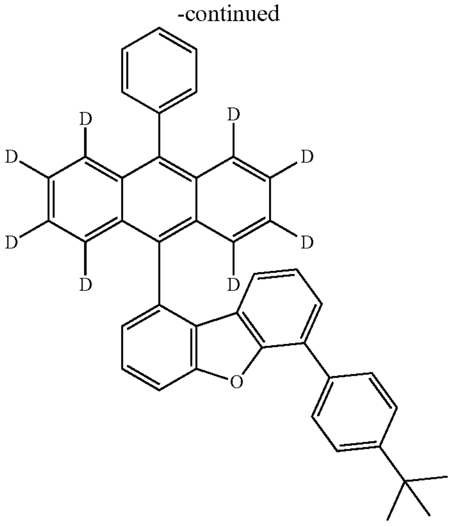
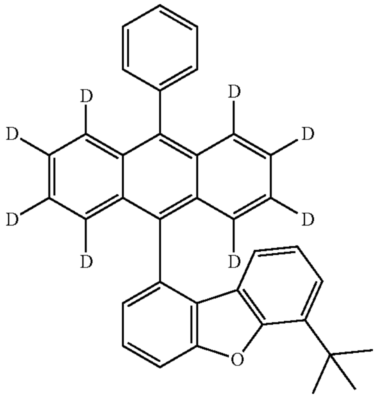
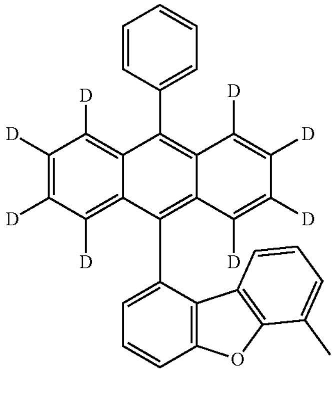
-continued
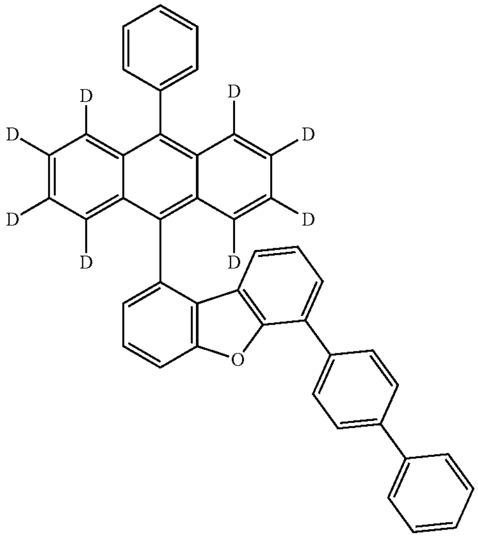
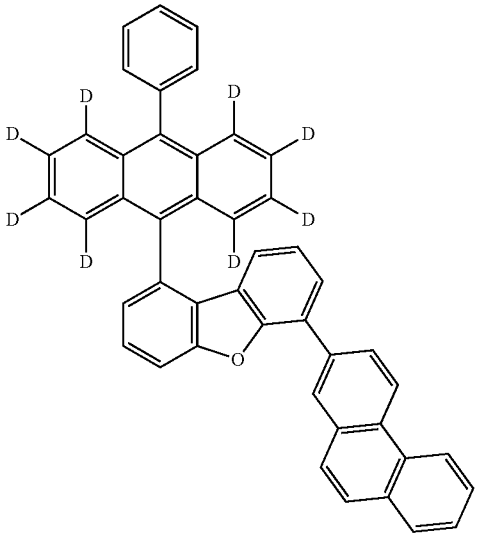
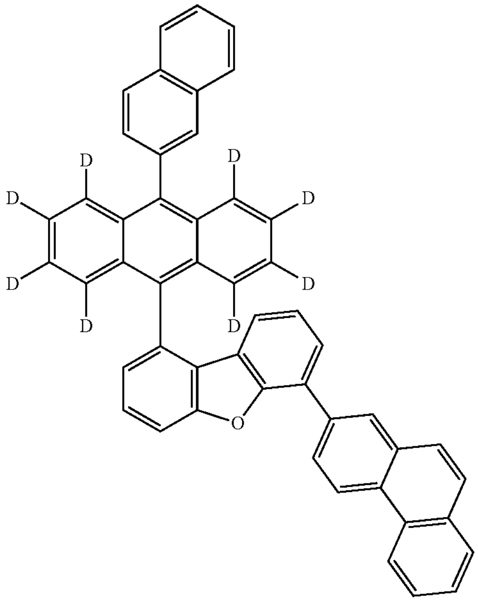

-continued
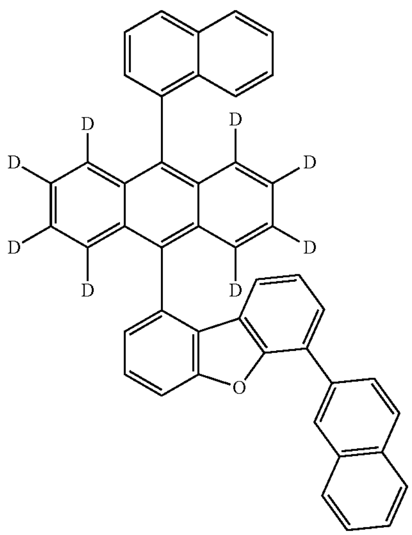
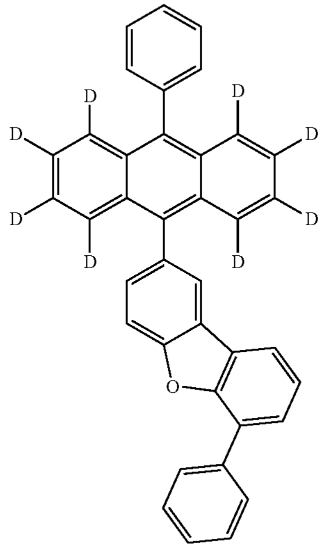
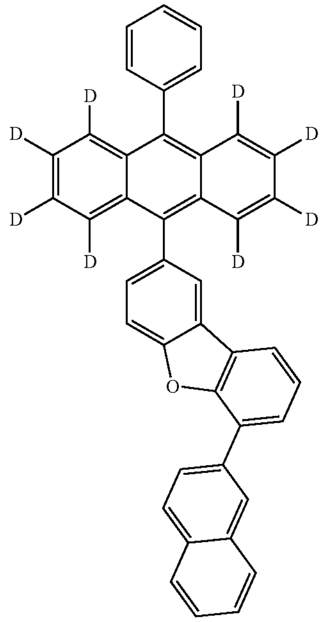
-continued
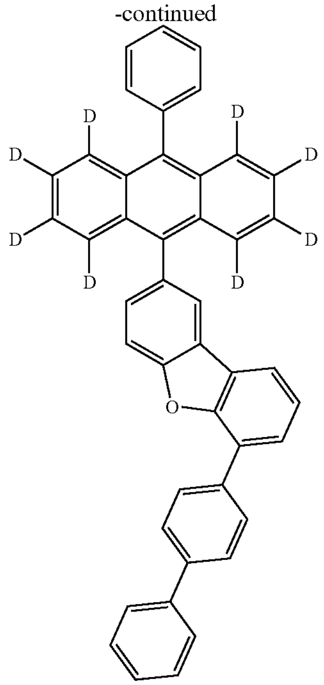
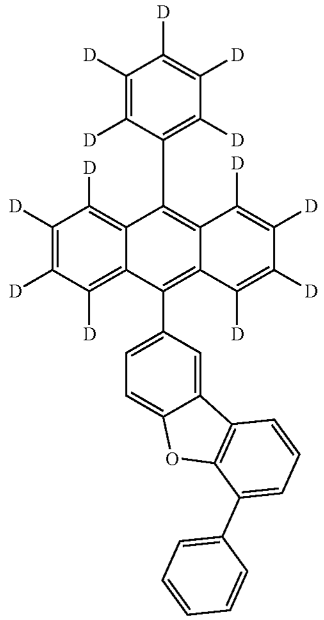

-continued
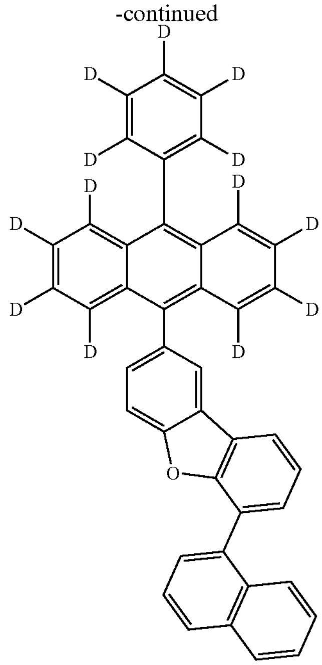
-continued
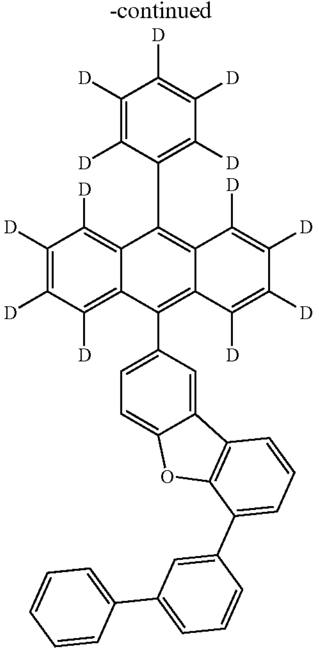
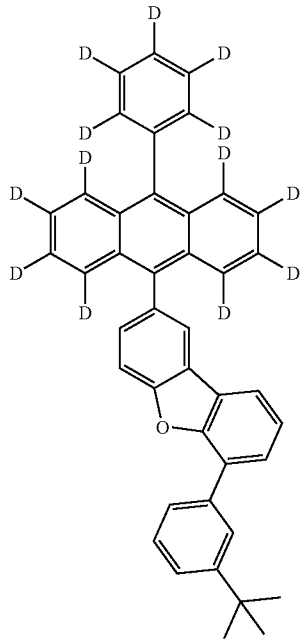
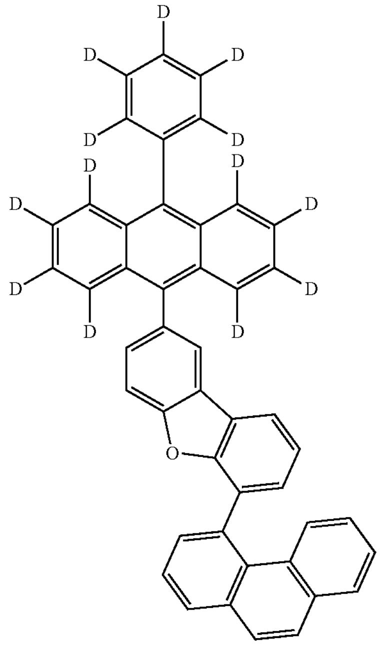

-continued
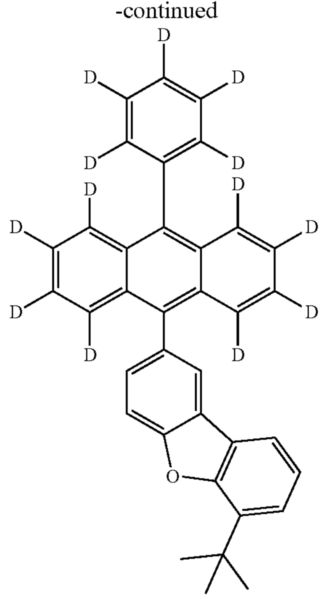
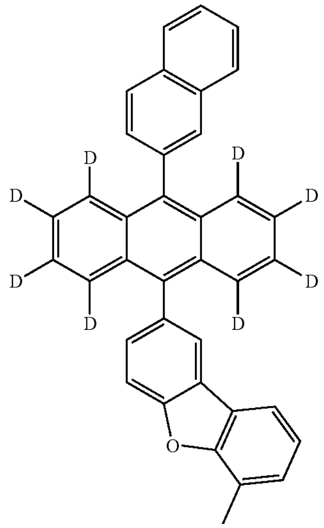
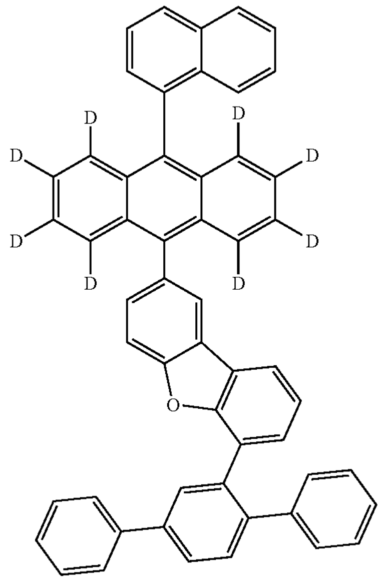
-continued
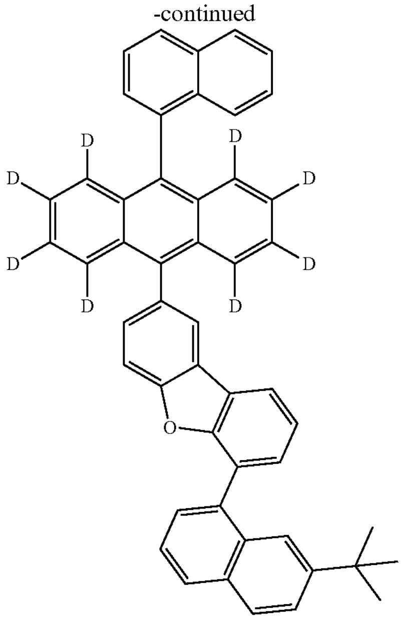
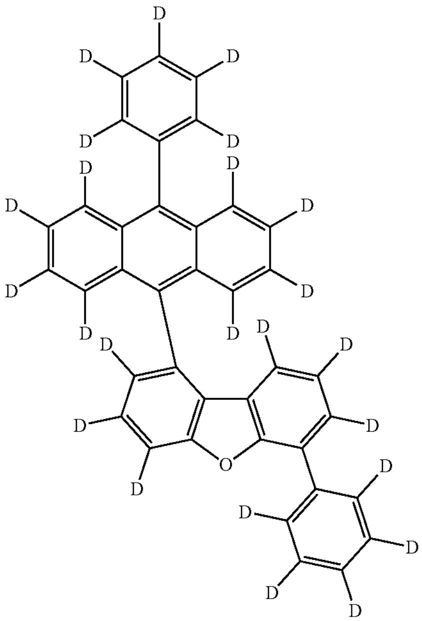

-continued
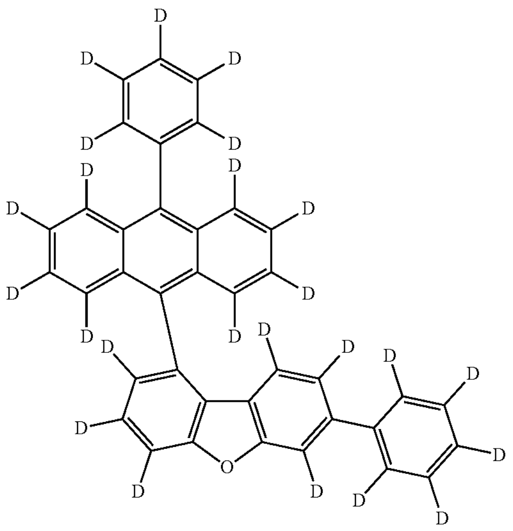
-continued
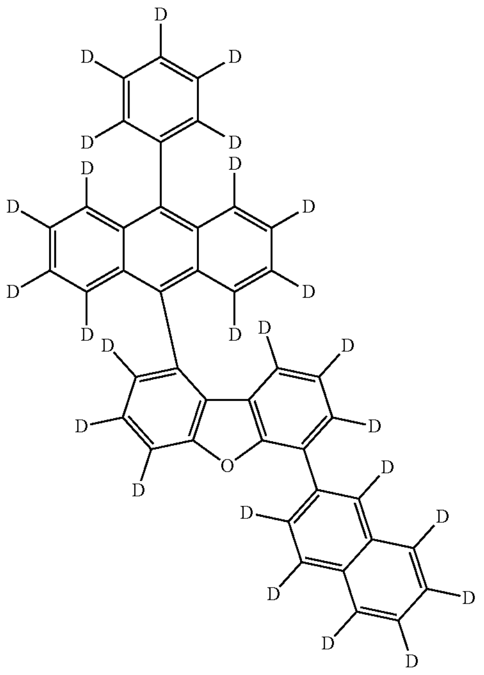
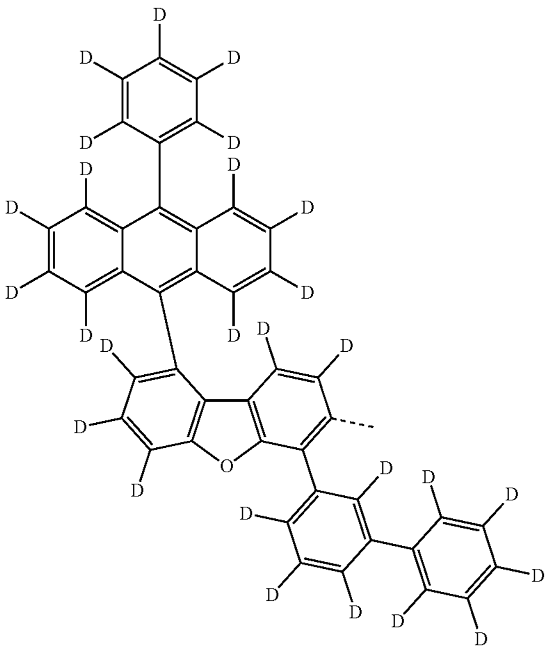
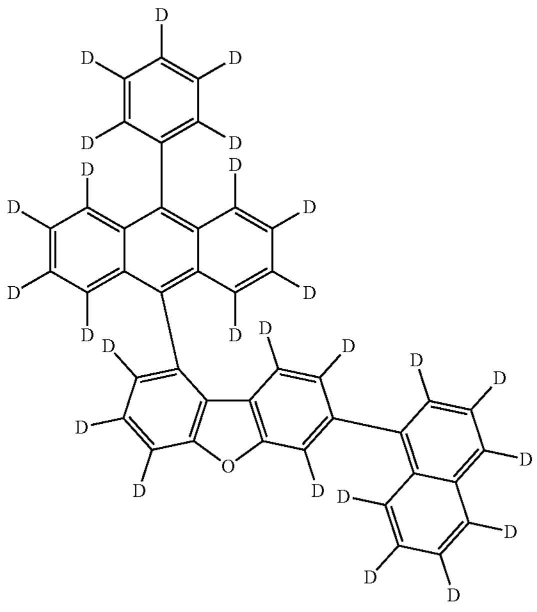

-continued
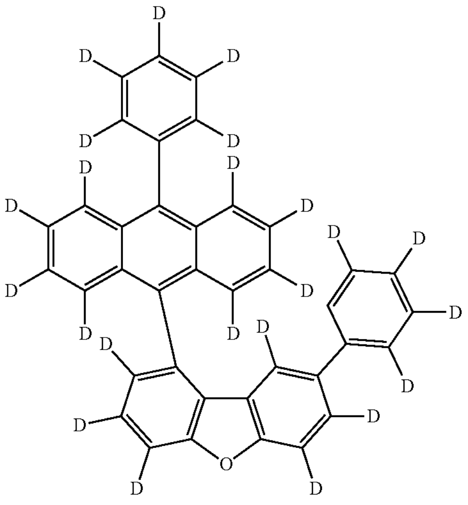
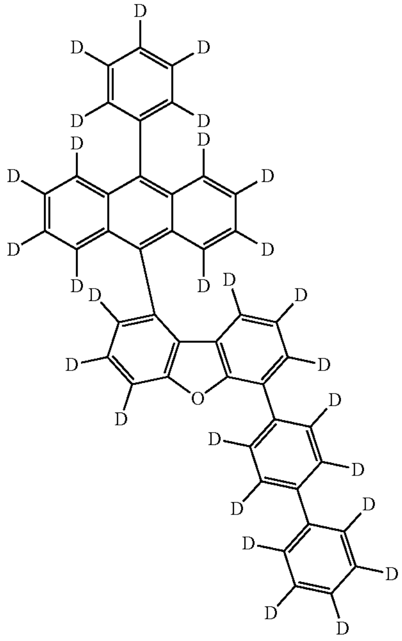
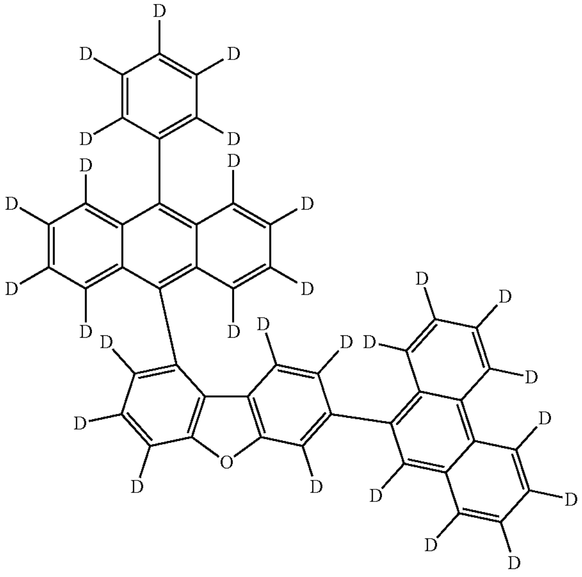
-continued
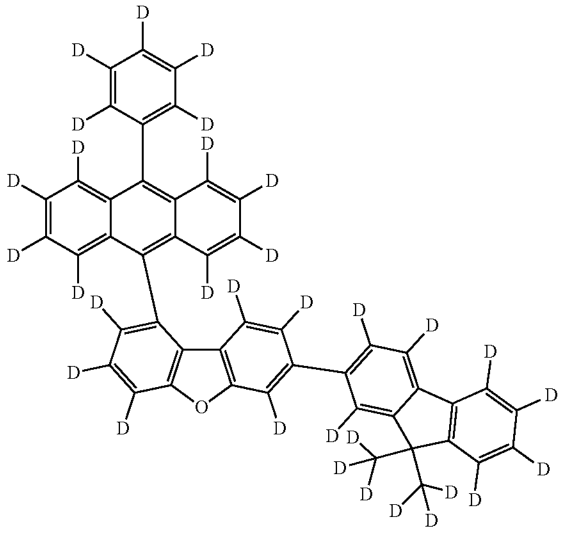
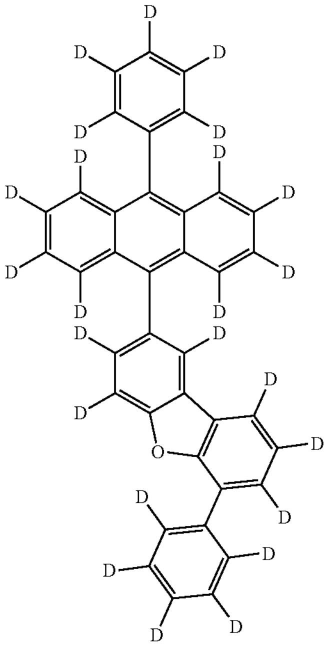

-continued
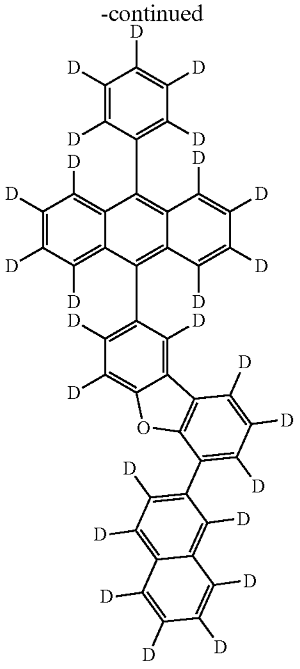
-continued
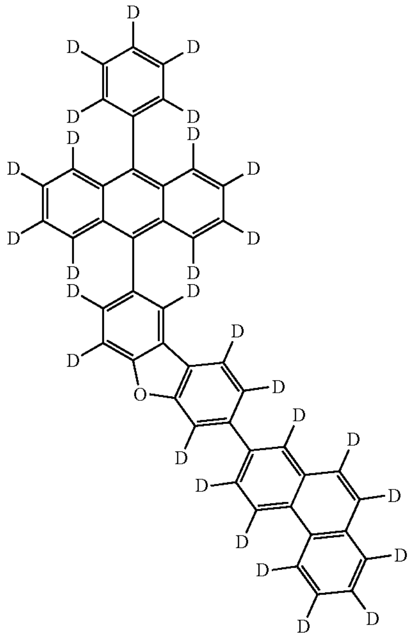
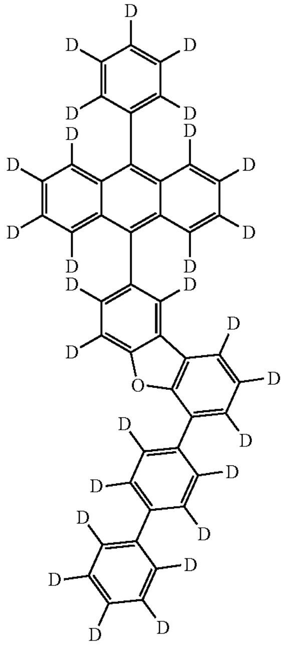
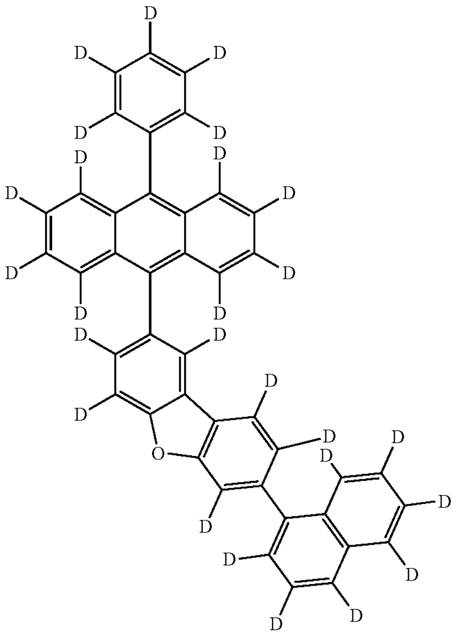

-continued
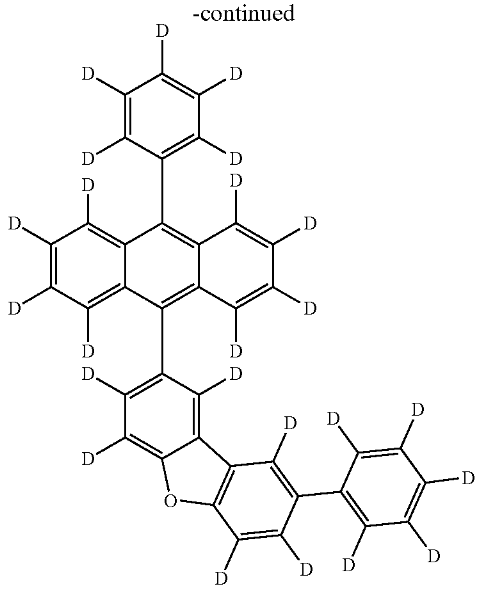
-continued
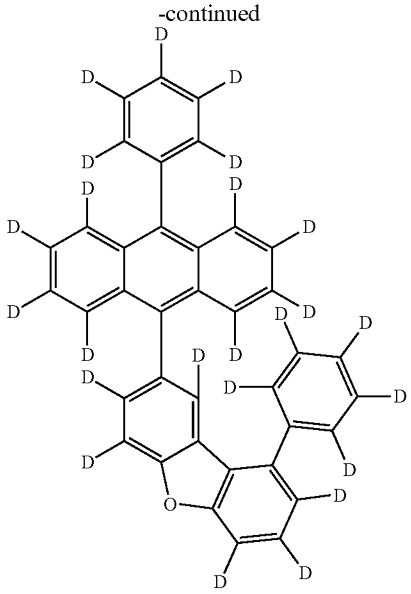
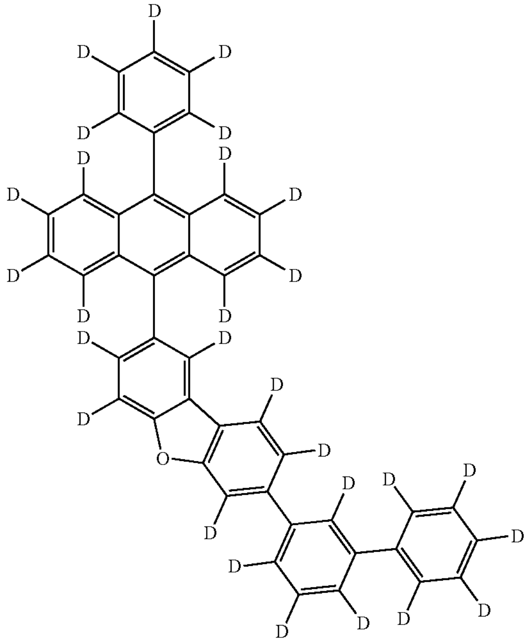
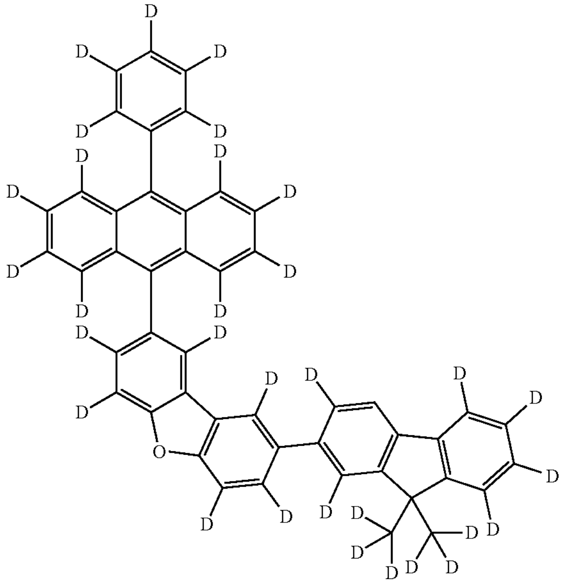

-continued
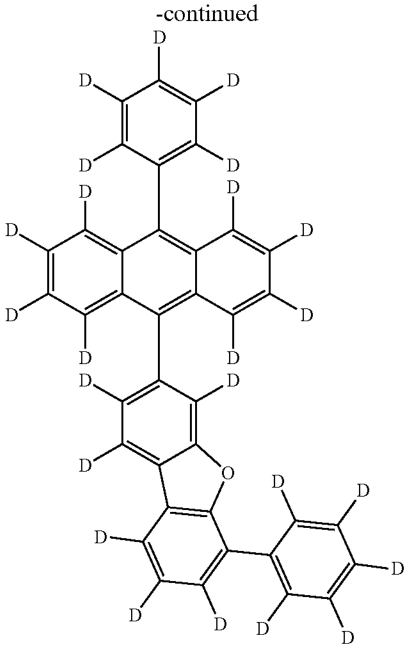
-continued
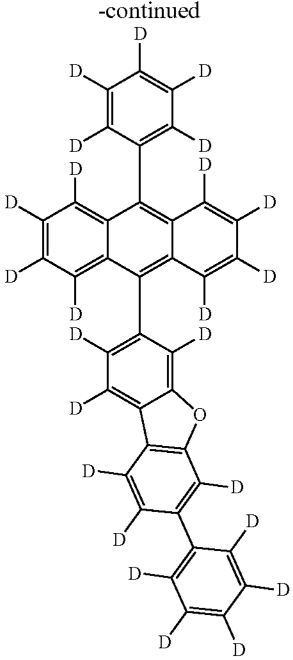
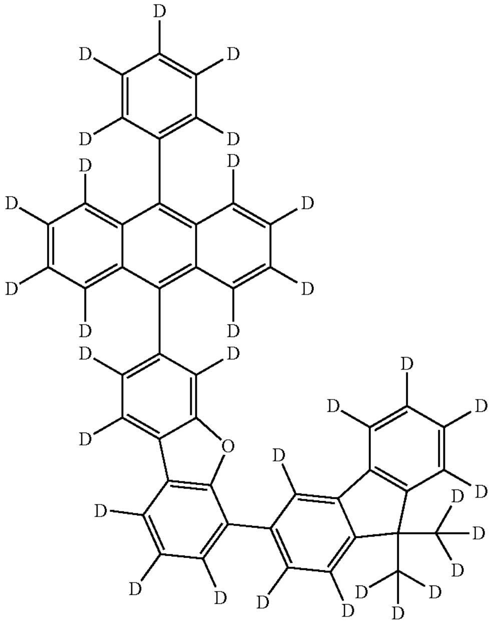
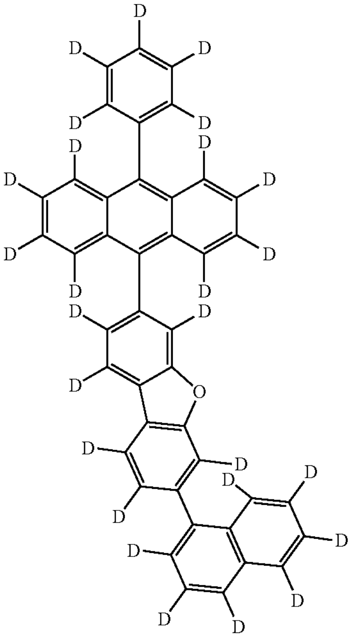

-continued
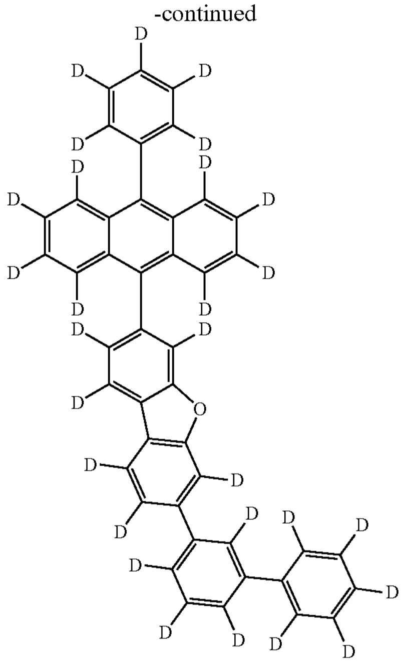
-continued
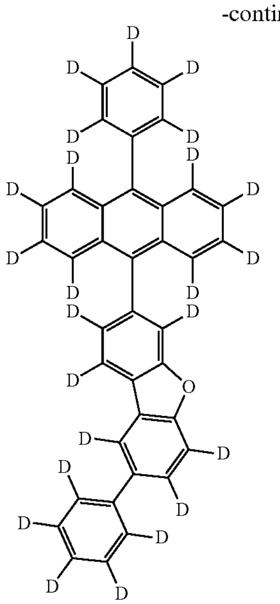
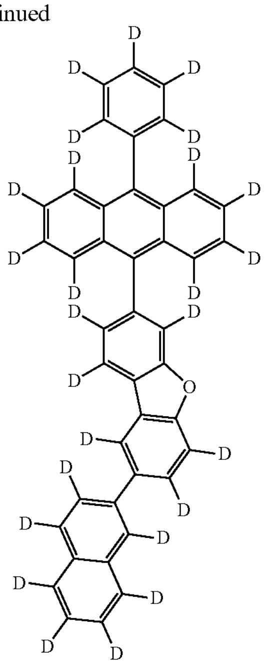
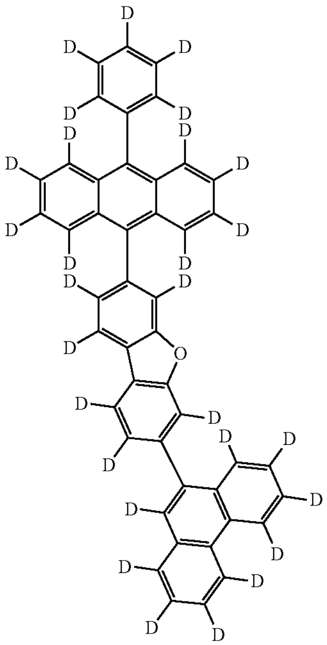
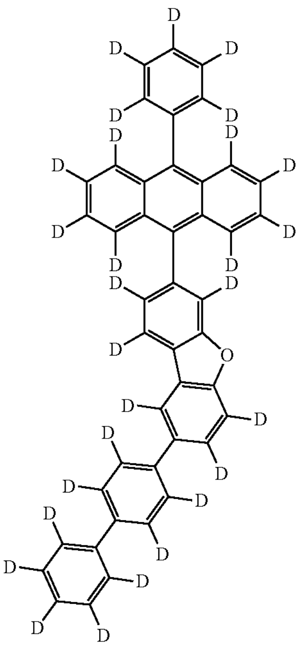

-continued
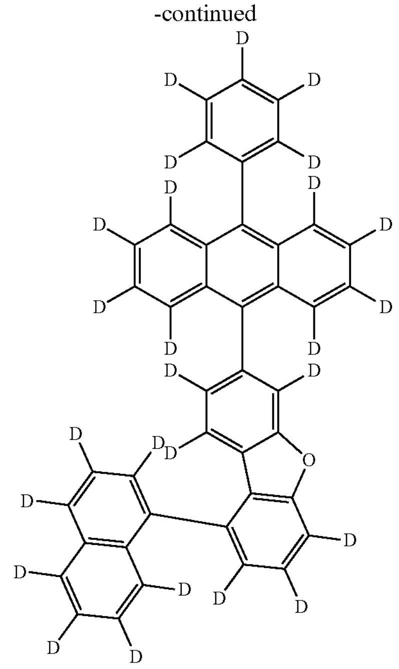
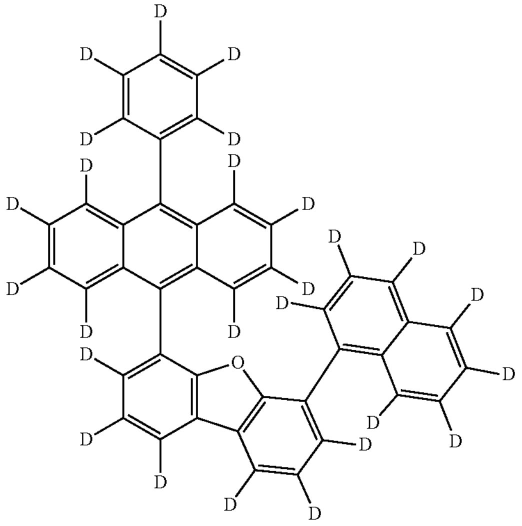
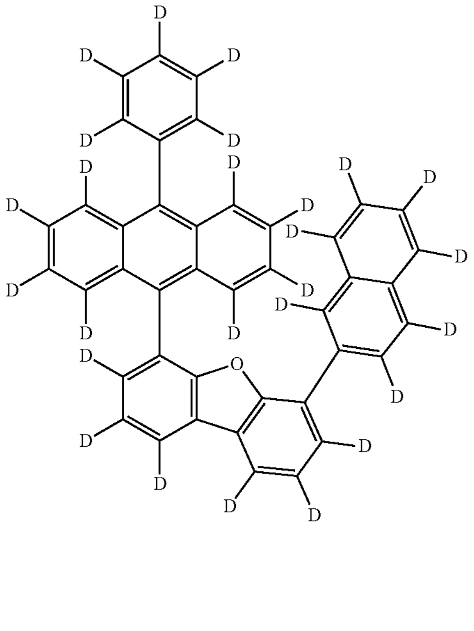
-continued
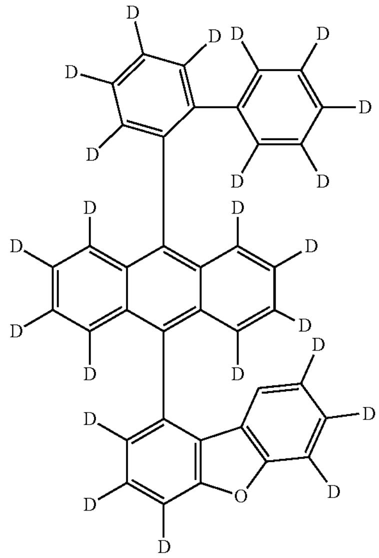
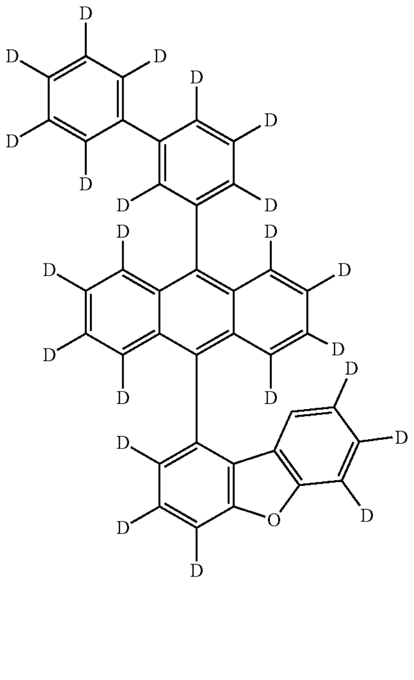

-continued

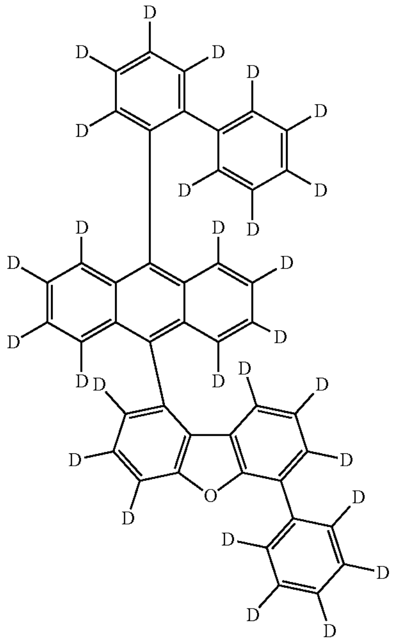

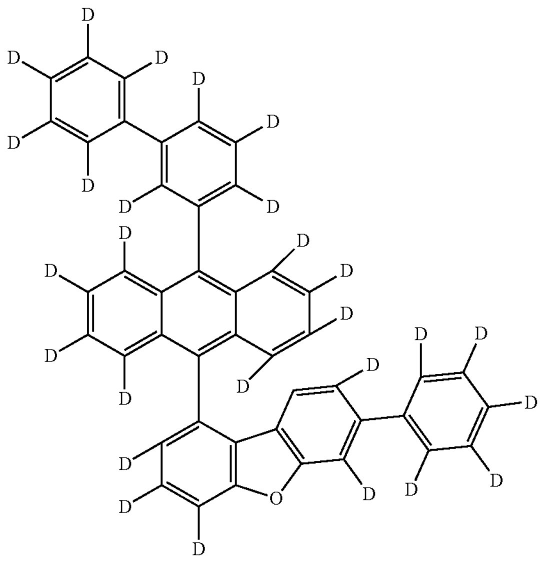

-continued

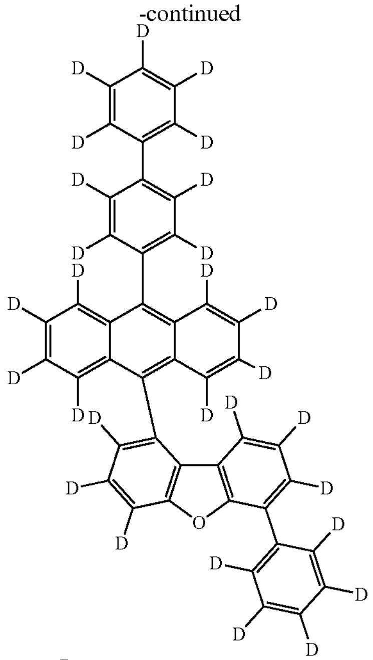

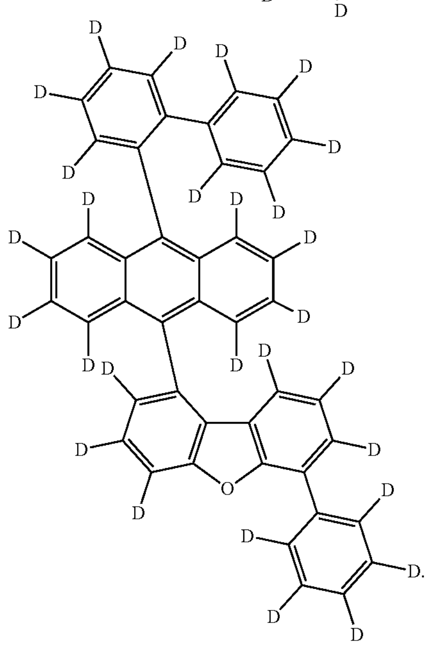

4. The organic electroluminescent device according to claim 2, wherein each of the organic layers is formed by a deposition or solution process.

5. The organic electroluminescent device according to claim 2, wherein one or more dopants other than the compound represented by Formula A-1 are mixed or stacked in the light emitting layer.

6. The organic electroluminescent device according to claim 3, wherein one or more hosts other than the anthracene compound are mixed or stacked in the light emitting layer.

7. The organic electroluminescent device according to claim 2, wherein the organic electroluminescent device is used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

8. A compound selected from the following compounds 1 to 87:
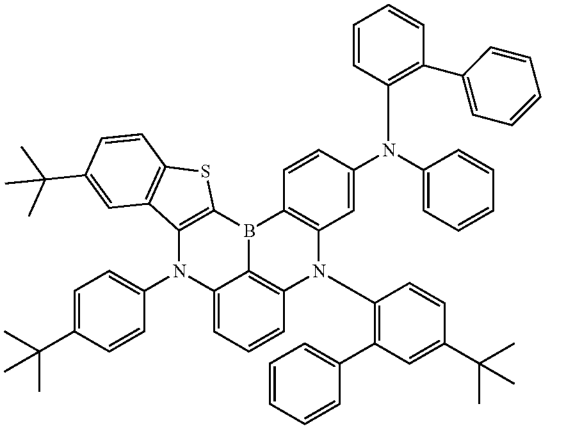
1
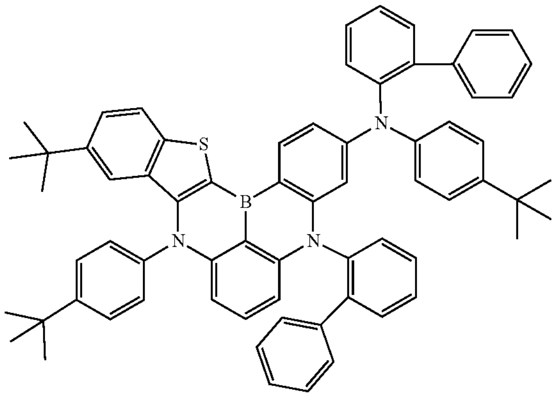
2
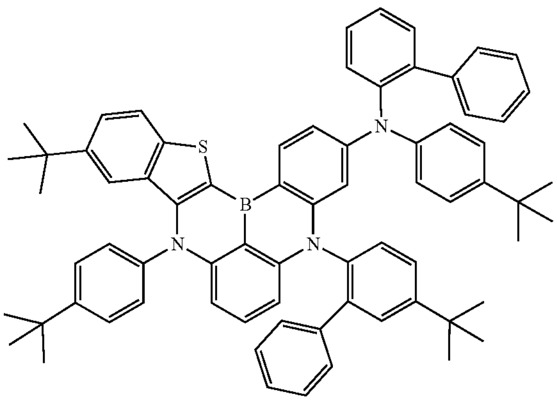
3
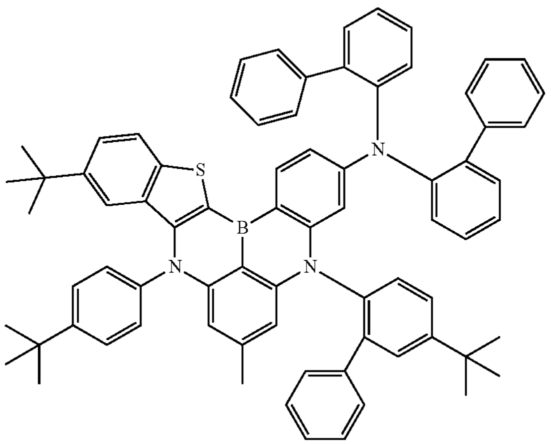
4
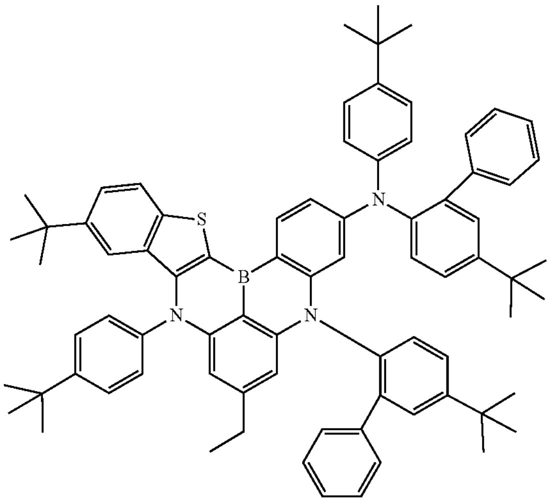
5
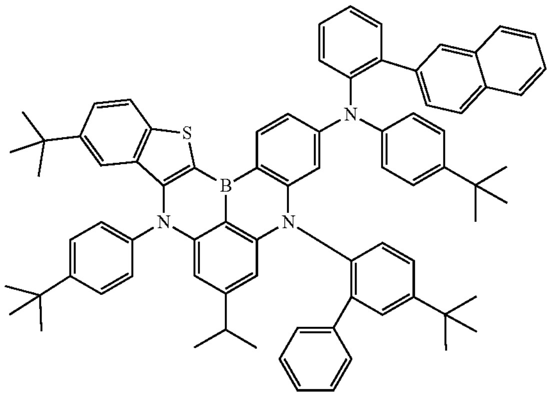
6

-continued
7
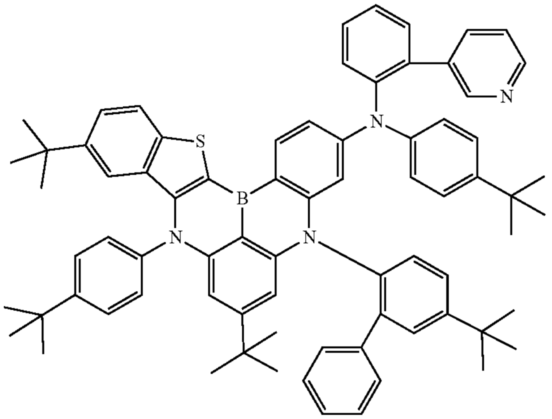
8
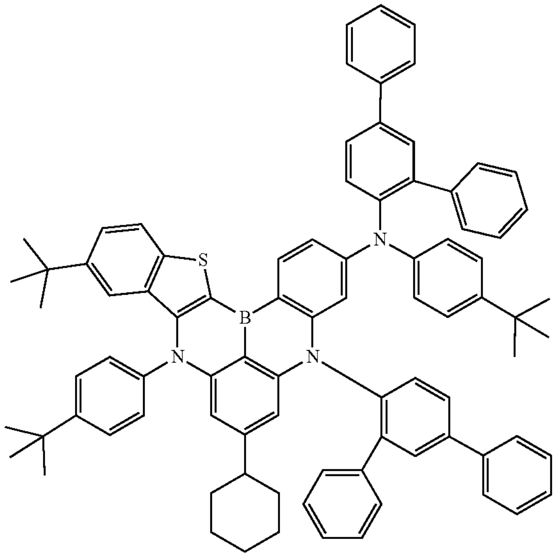
9
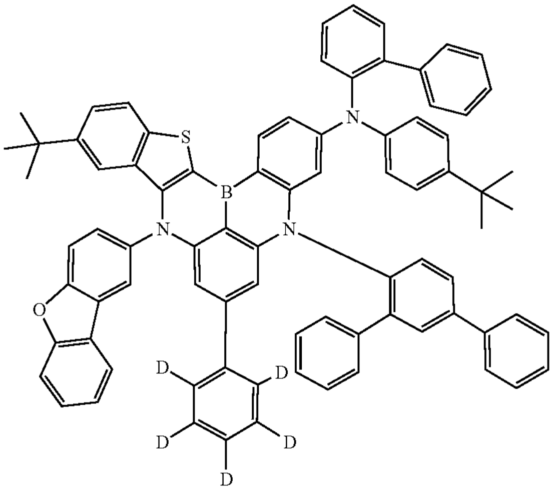
10
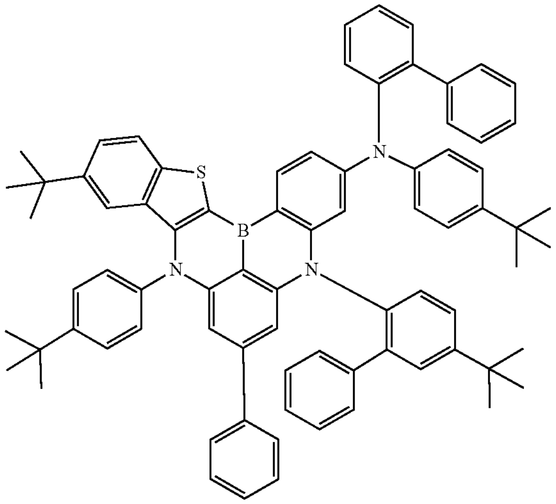
11
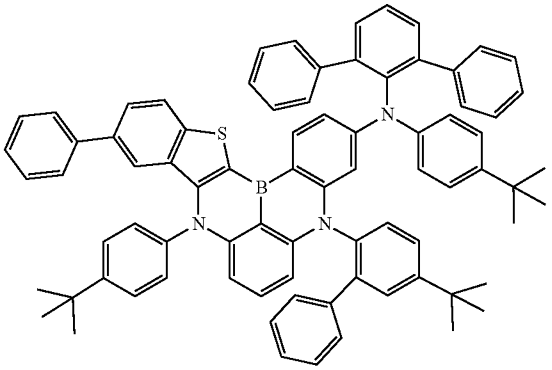
12
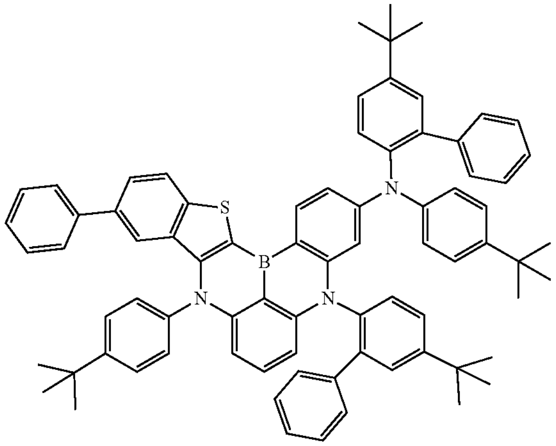

-continued
13
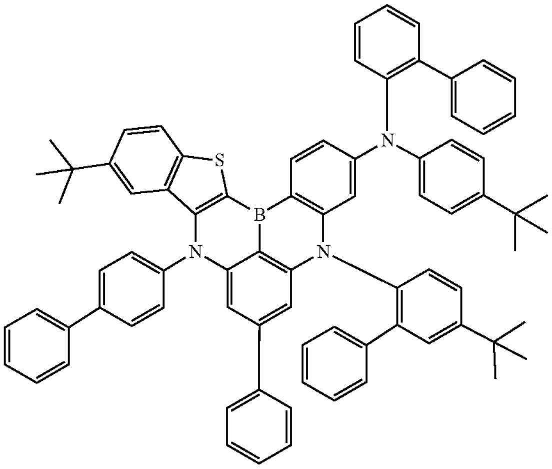
14
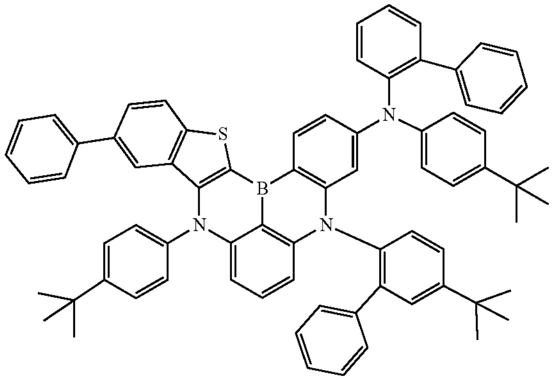
15
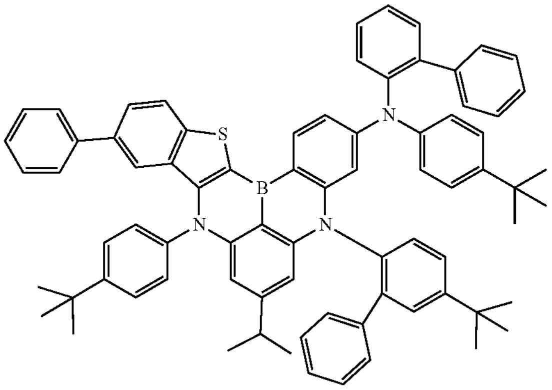
16
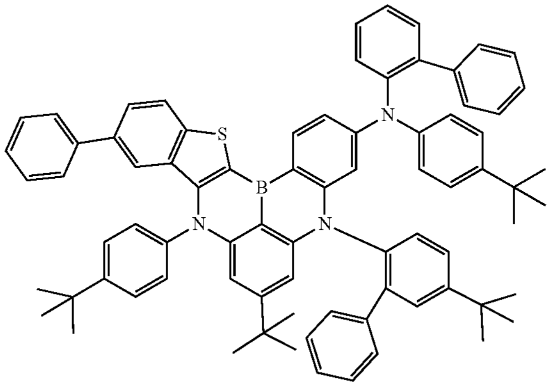
17
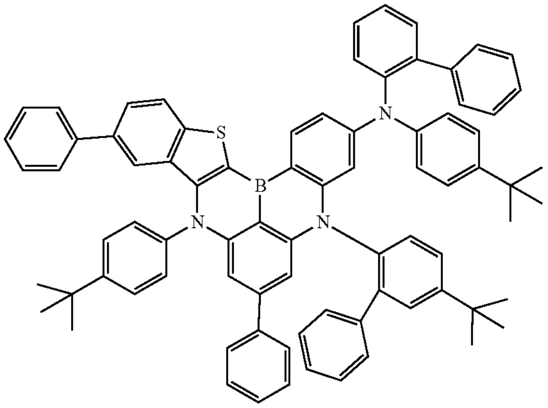
18
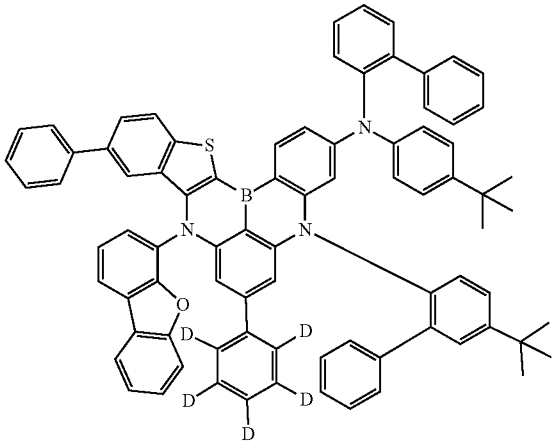

-continued
19
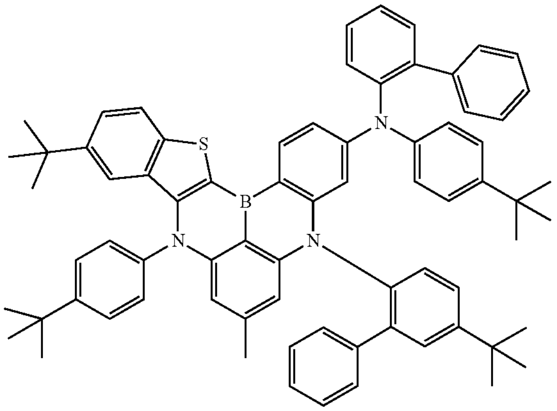
20
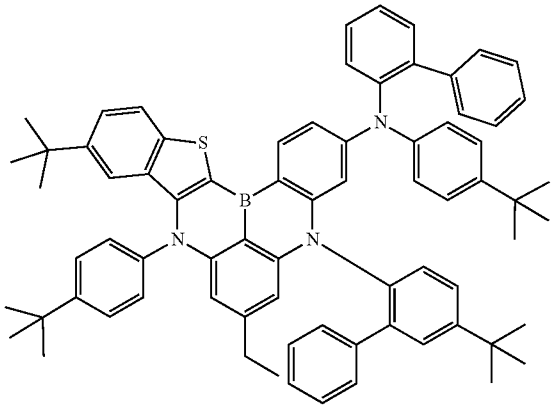
21
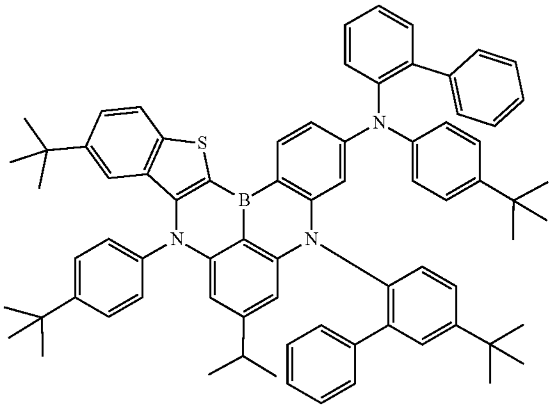
22
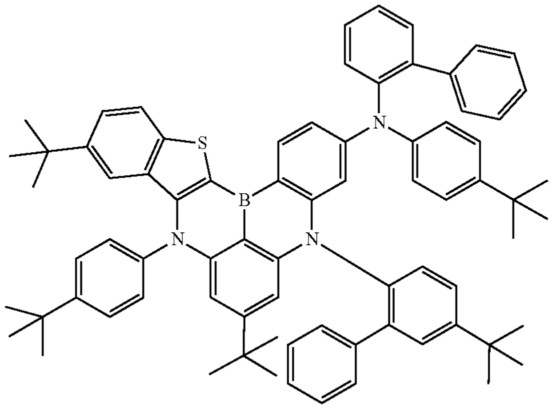
23
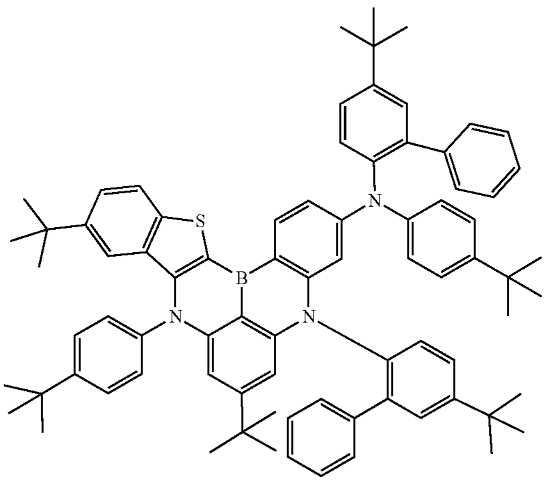
24
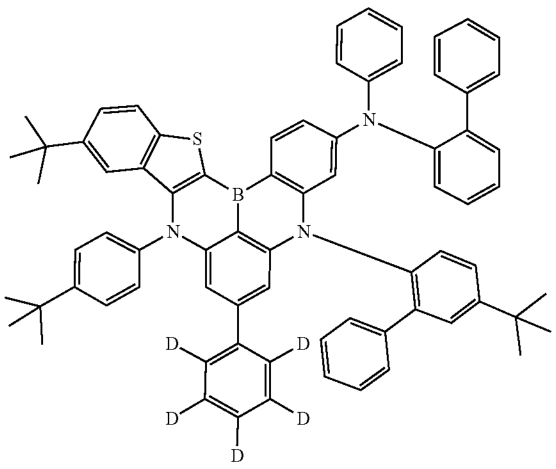

-continued
25
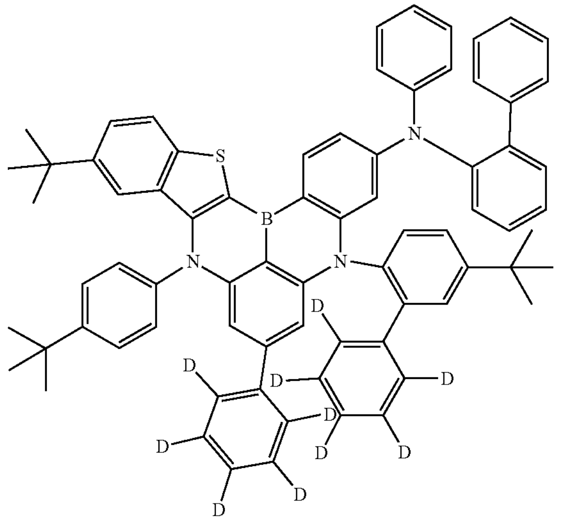
26
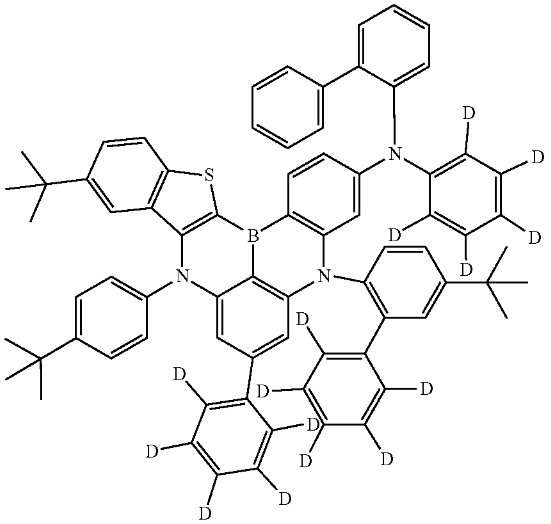
27
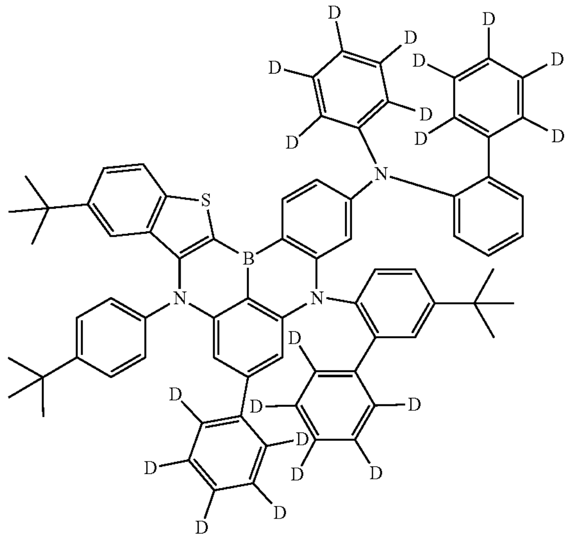
28
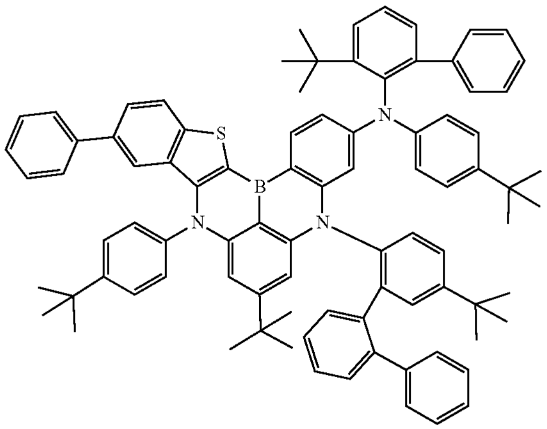
29
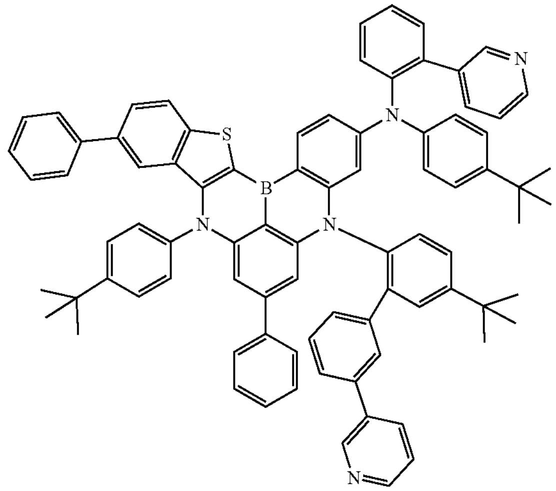
30
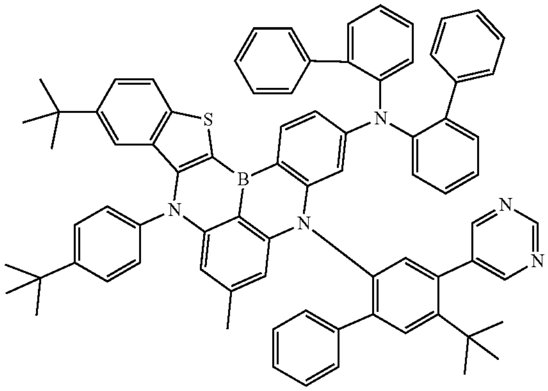

-continued
31
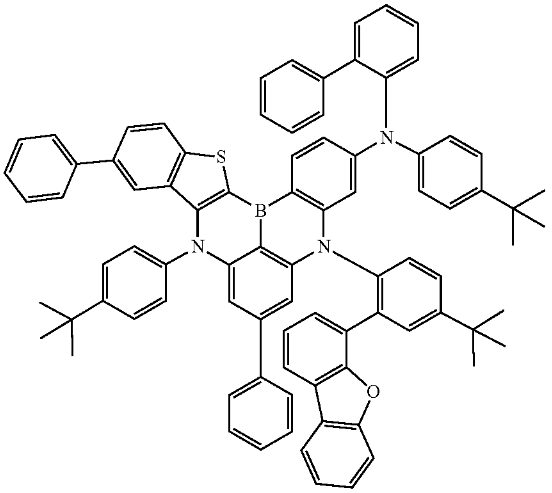
32
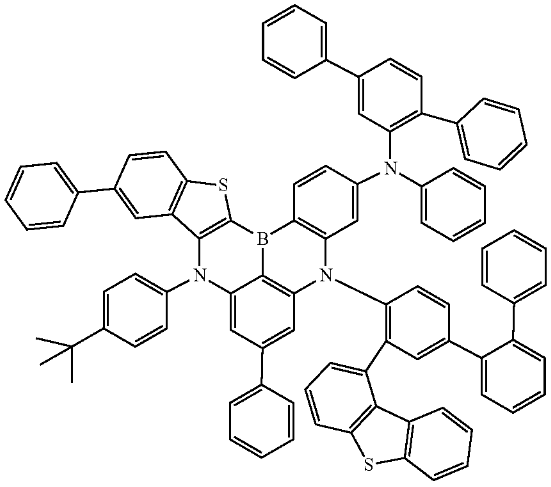
33
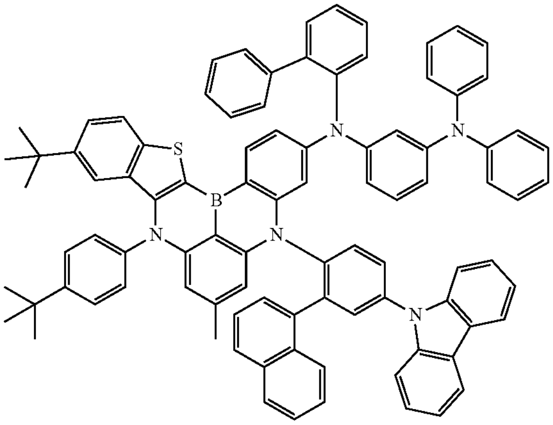
34
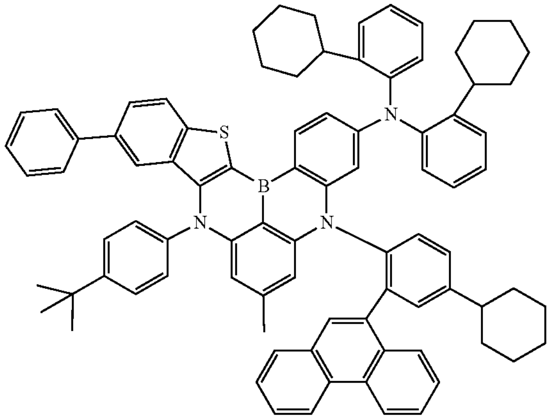
35
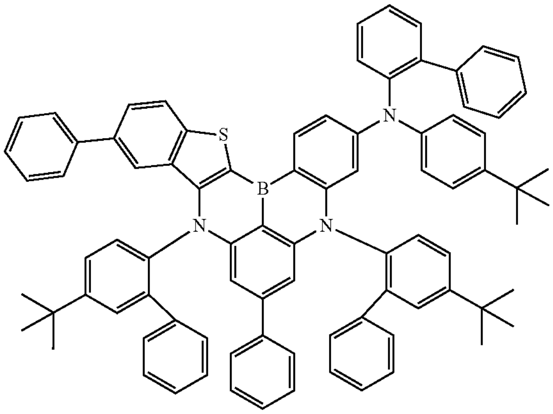
36
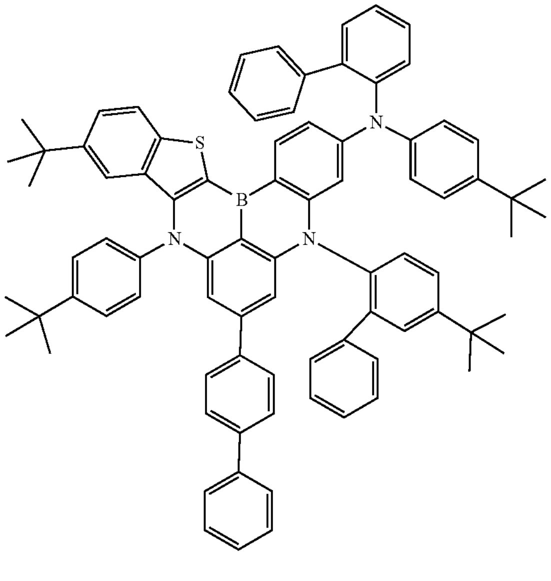

-continued
37
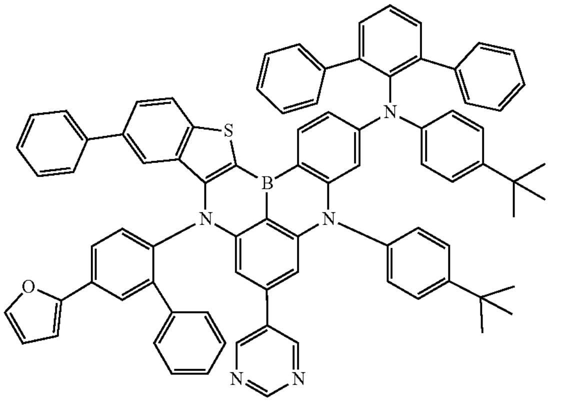
38
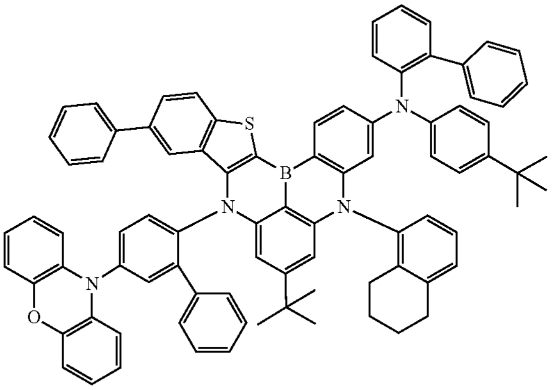
39
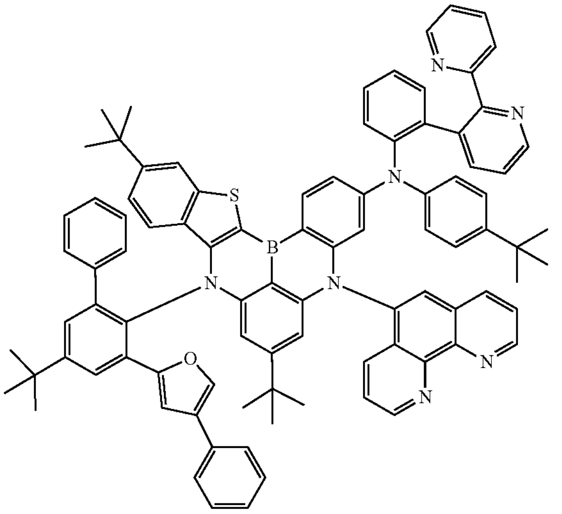
40
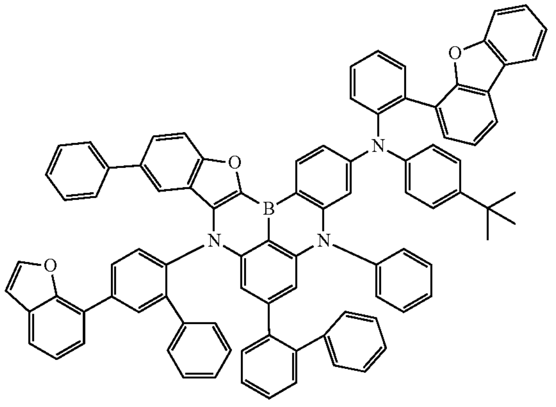
41
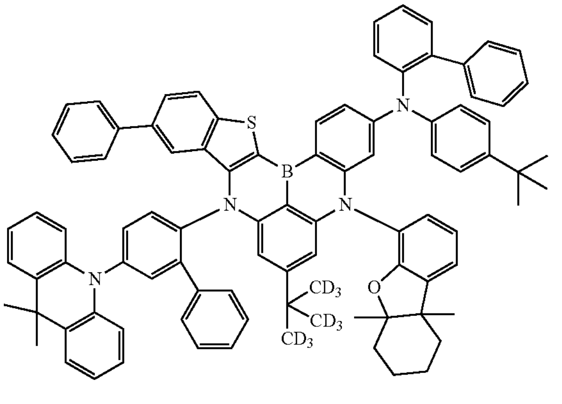
42
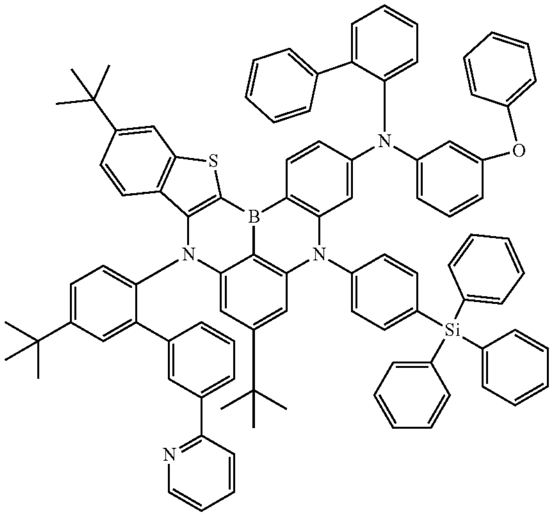

-continued
43
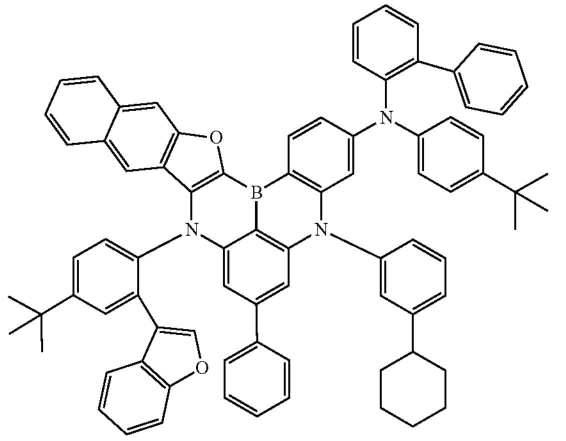
44
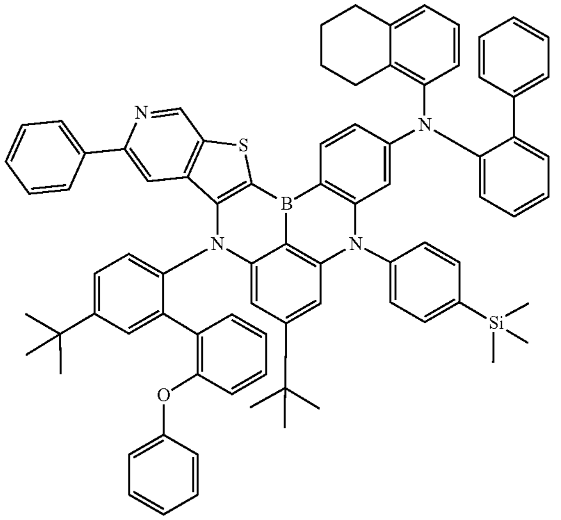
45
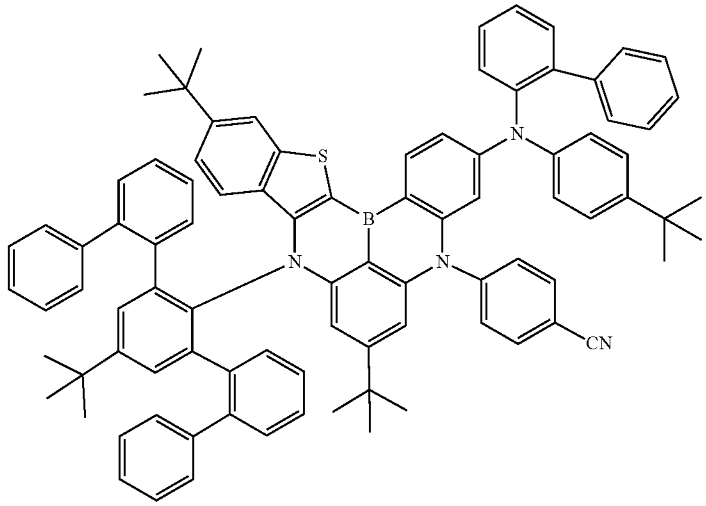
46
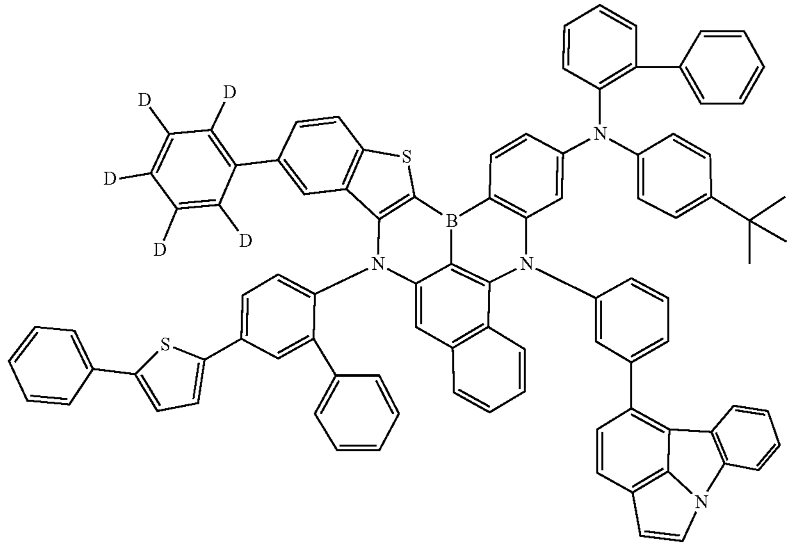

-continued
47
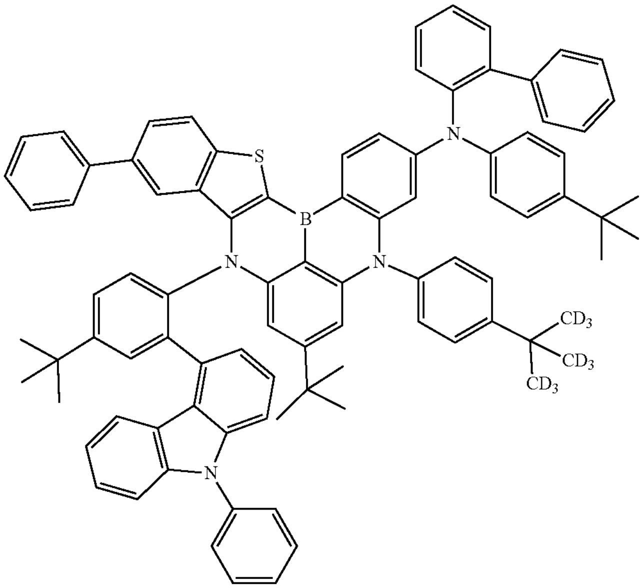
48
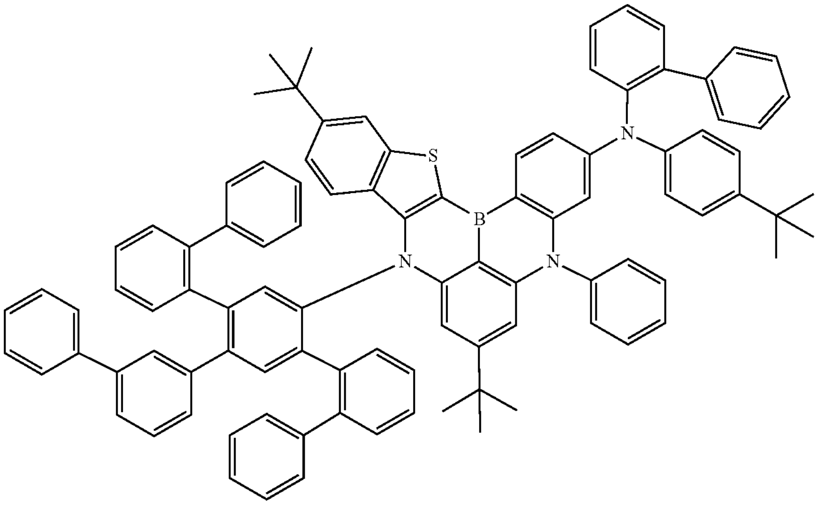
49
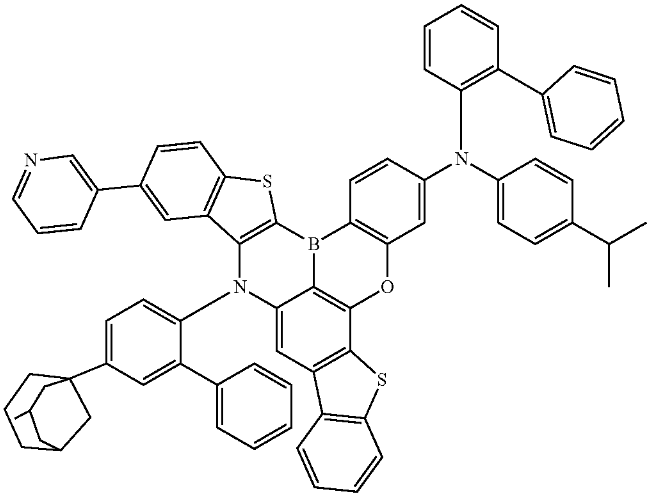

-continued
50
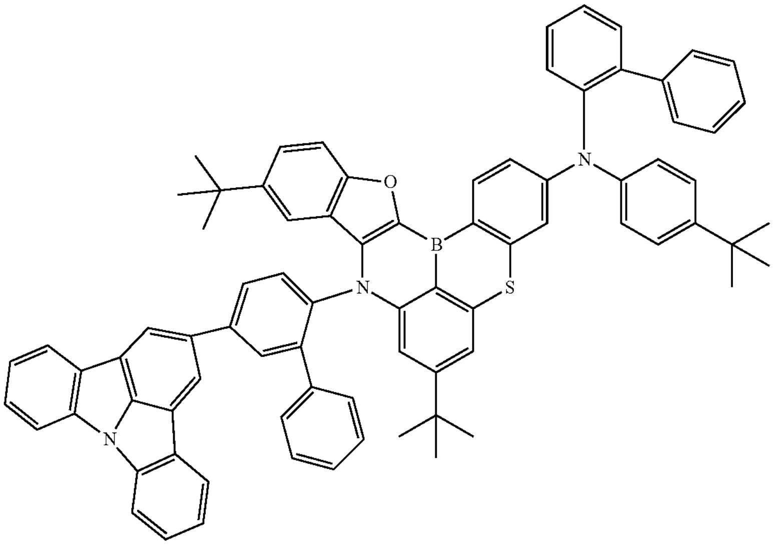
51
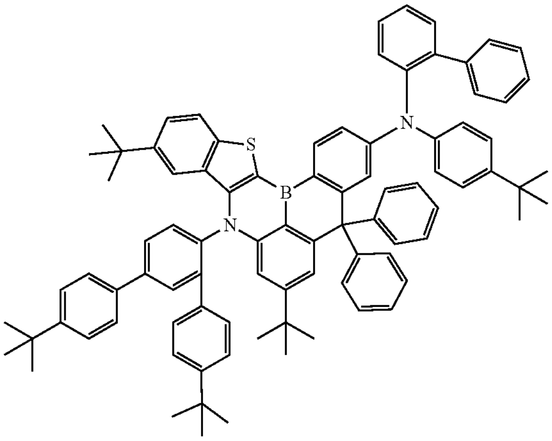
52
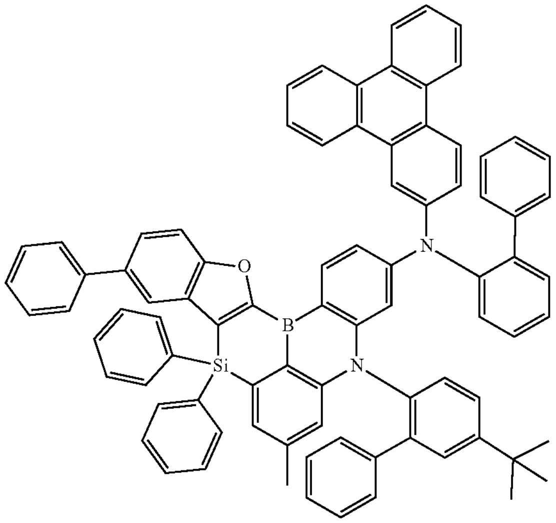
53
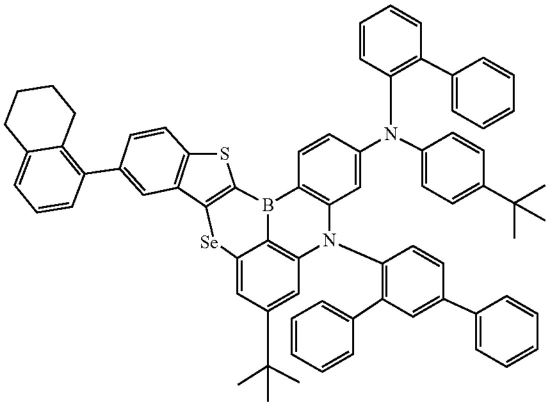
54
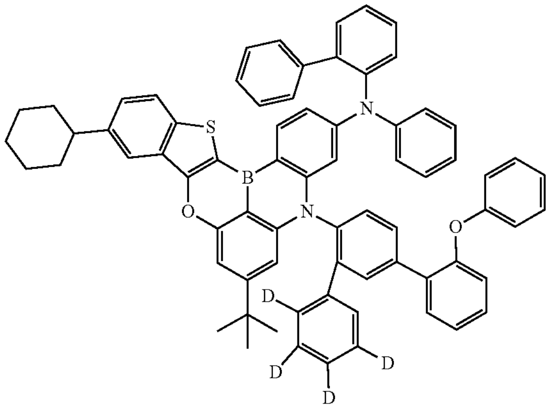

-continued
55
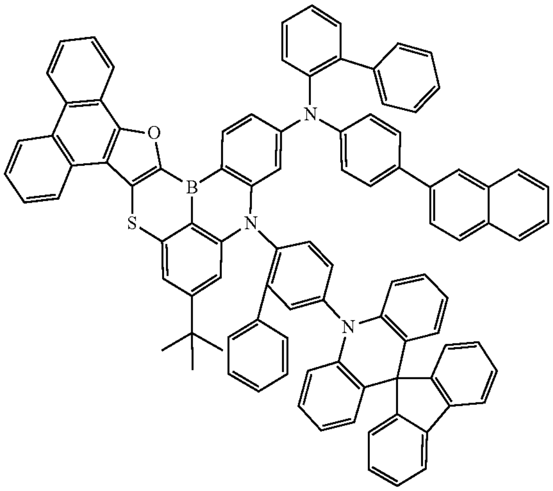
56
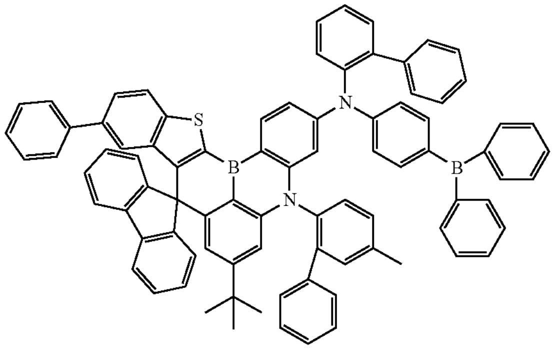
57
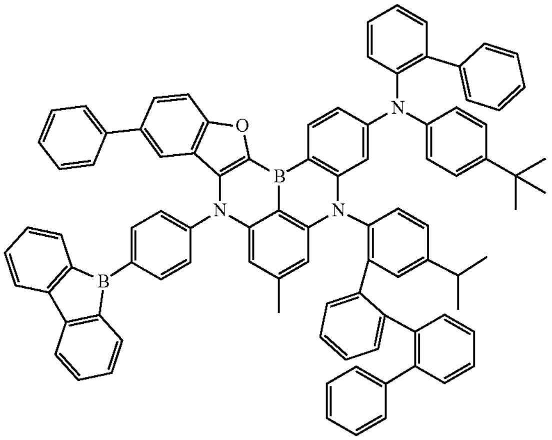
58
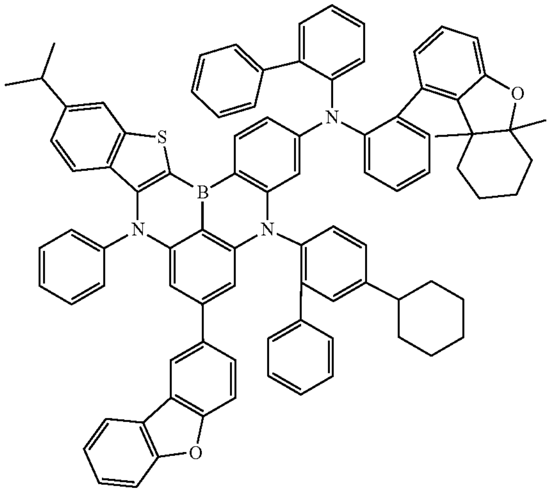
59
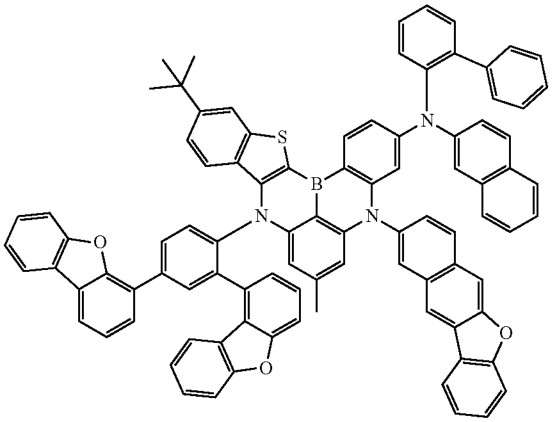
60
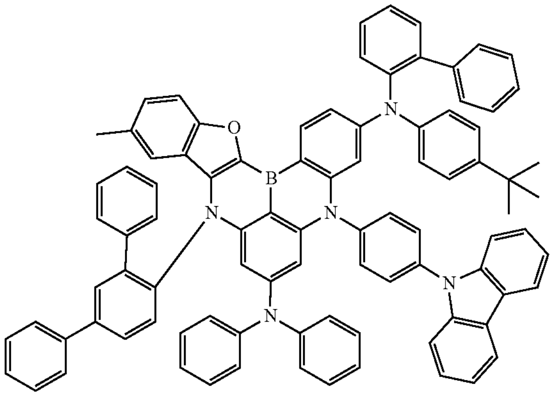

-continued
61
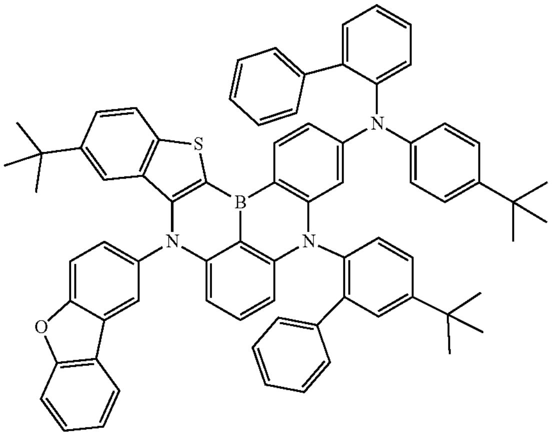
62
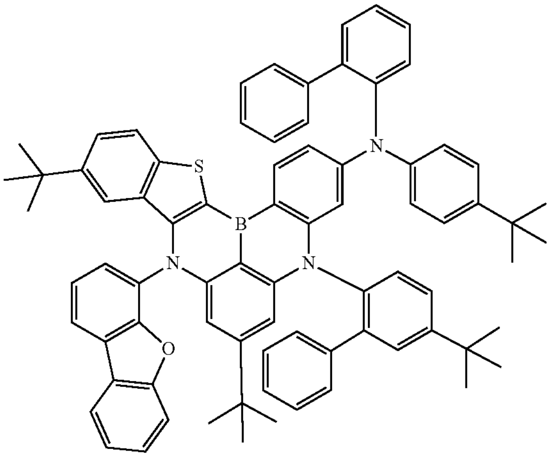
63
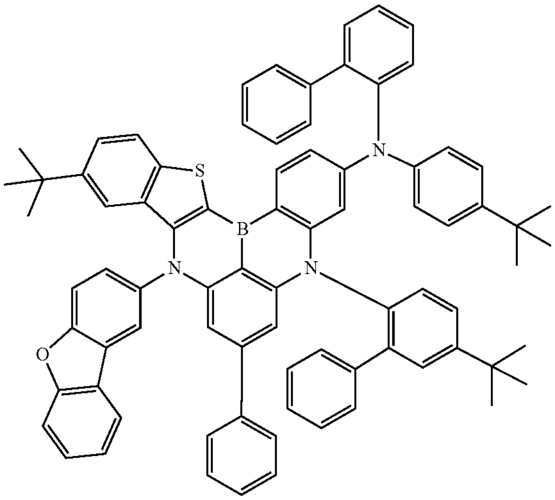
64
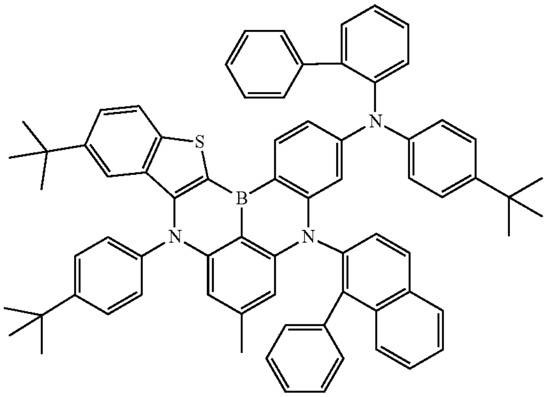
65
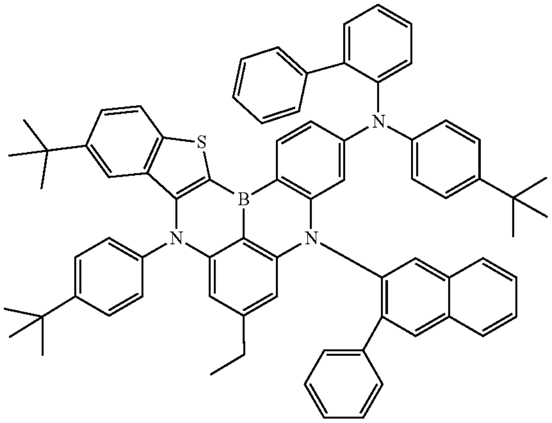
66
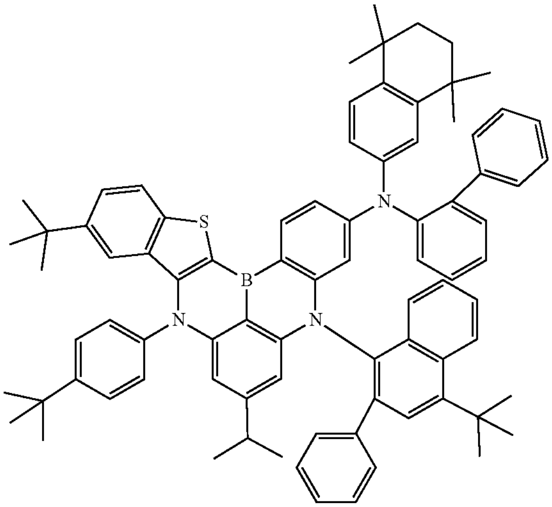

-continued
67
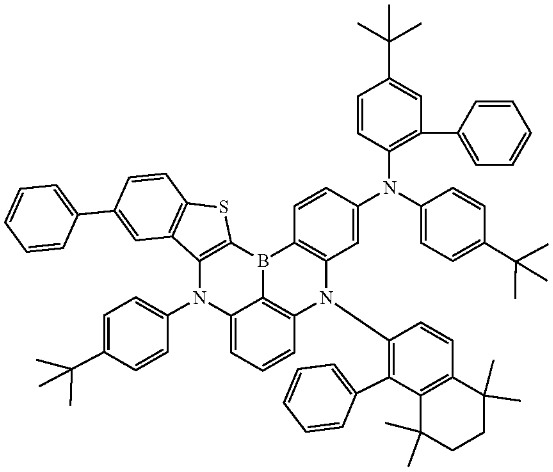
68
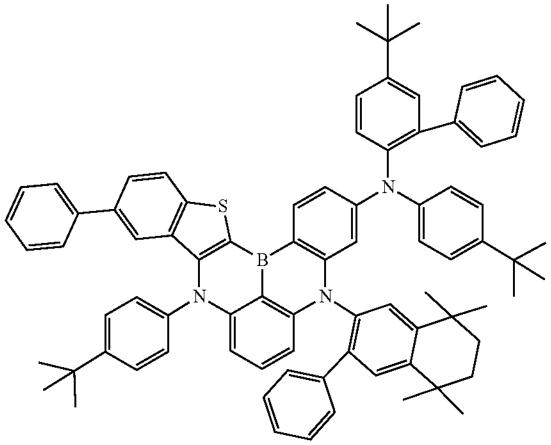
69
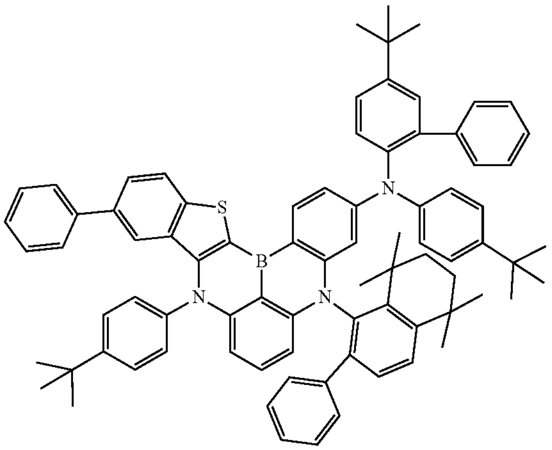
70
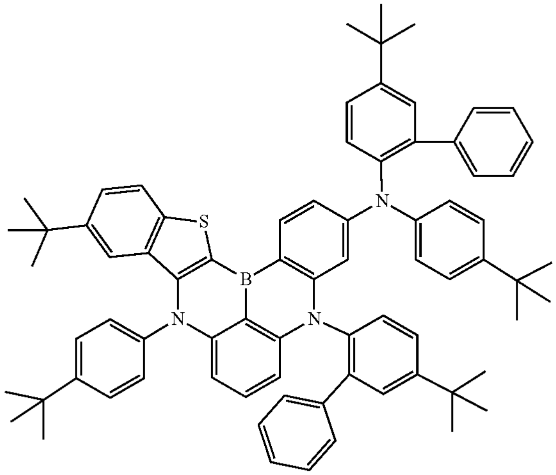
71
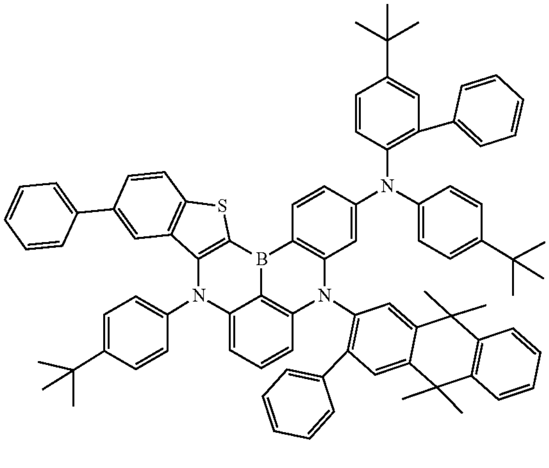
72
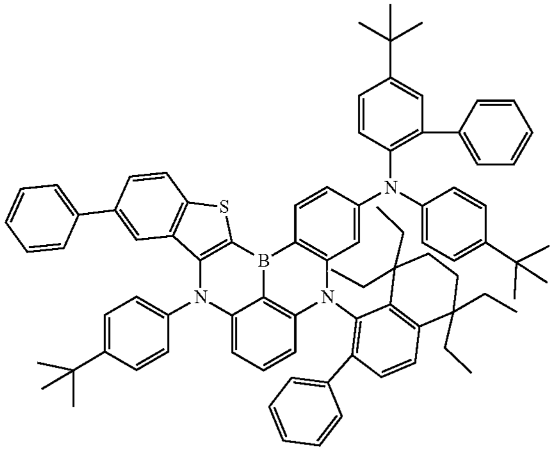

-continued
73
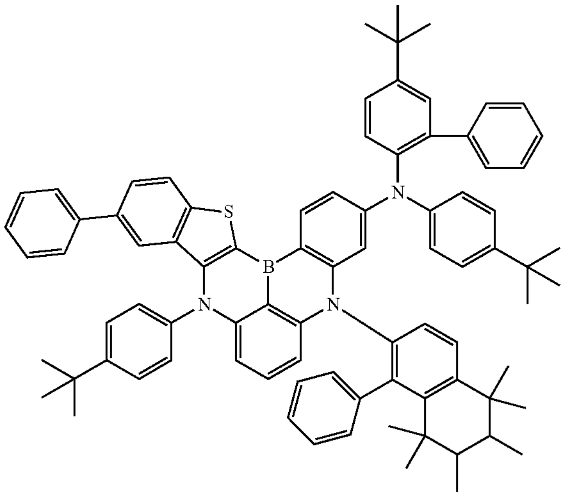
74
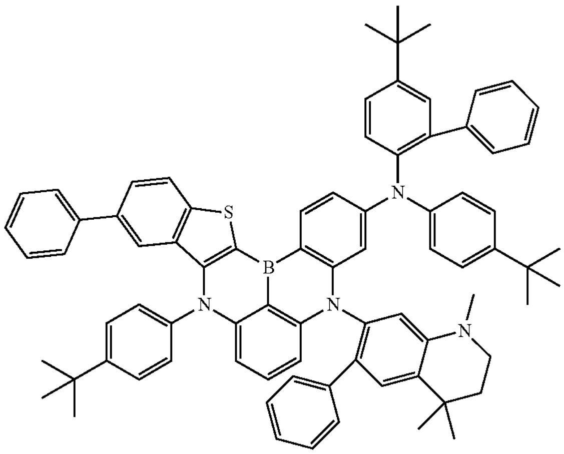
75
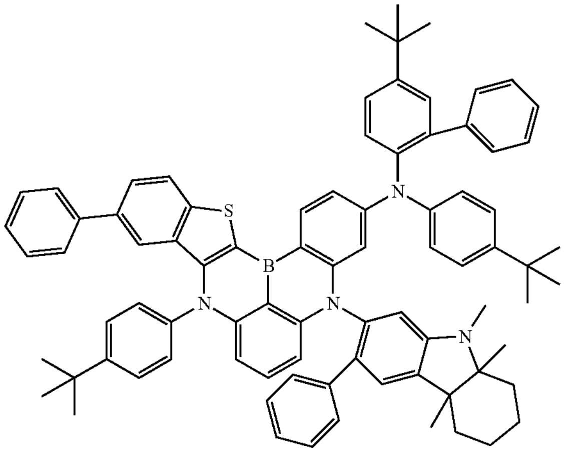
76
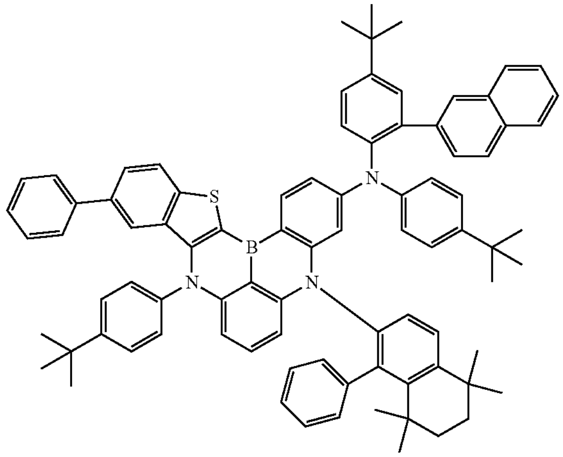
77
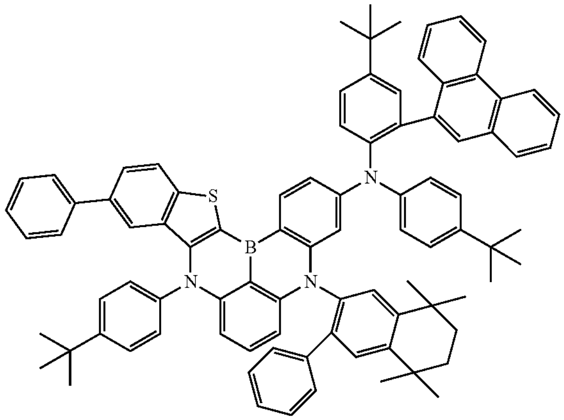
78
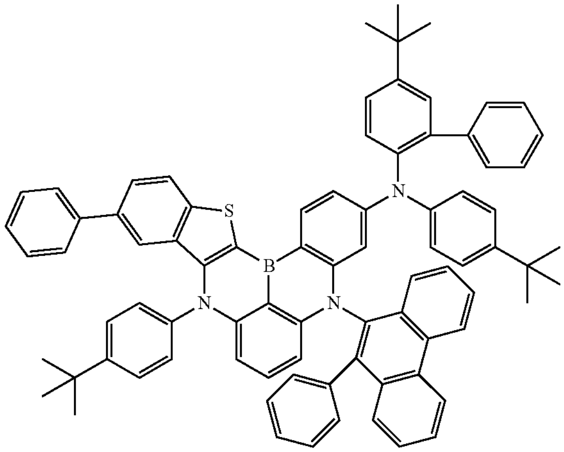

-continued
79
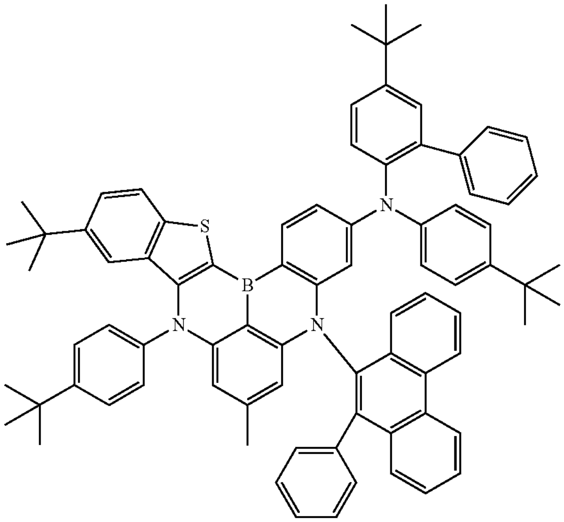
80
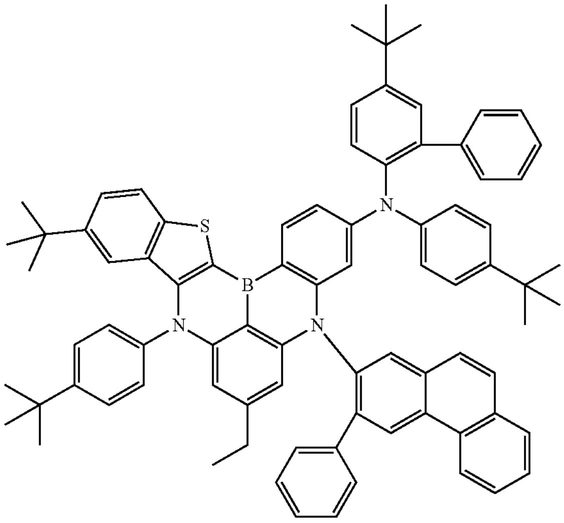
81
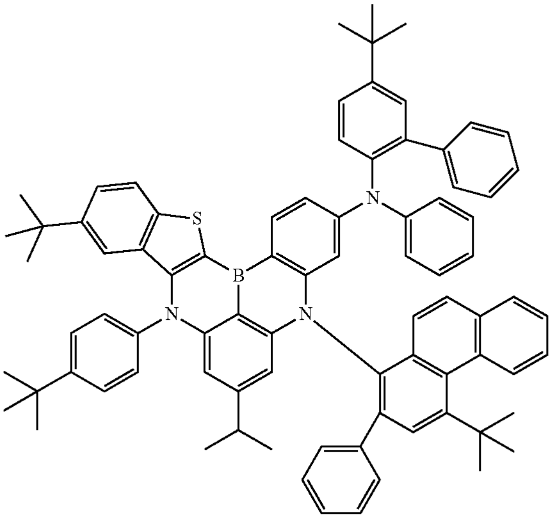
-continued
82
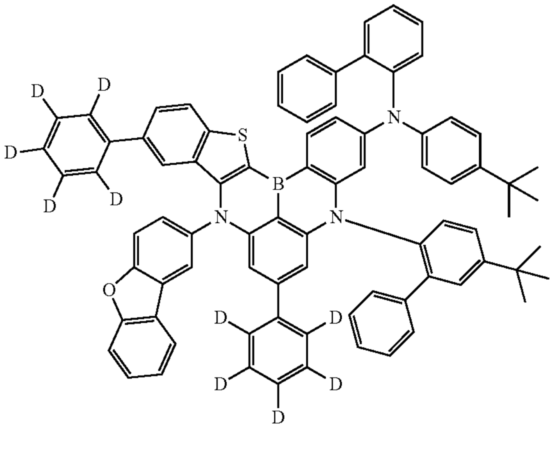
83
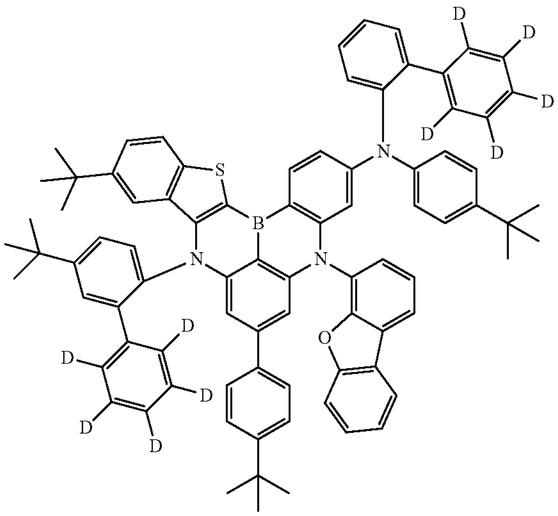
84
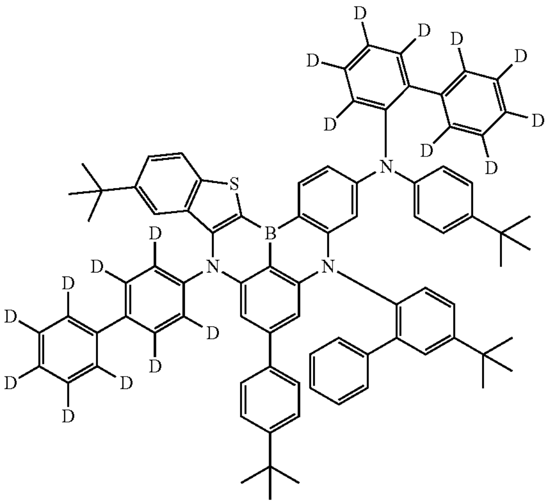

-continued

85

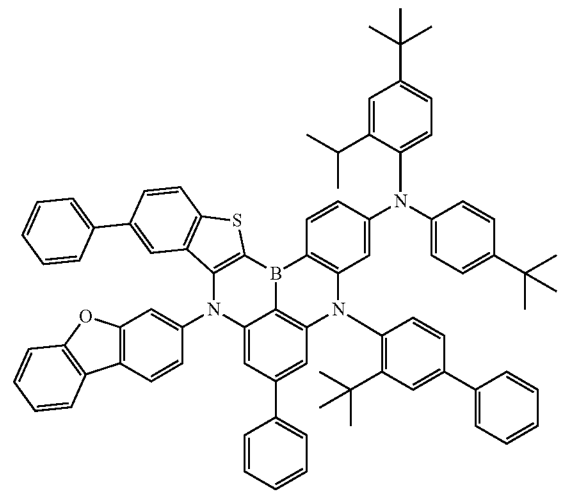

86

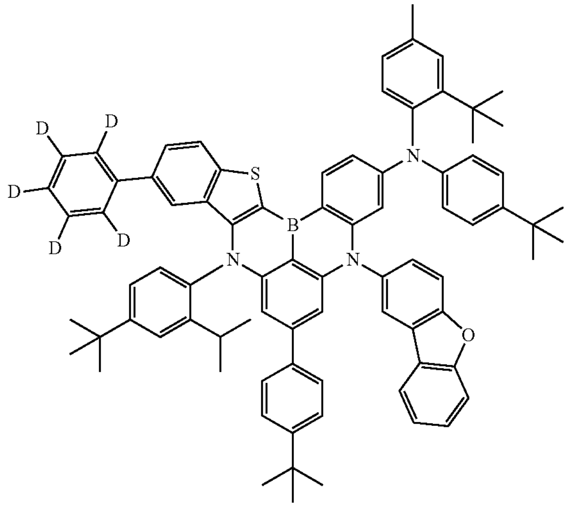

87

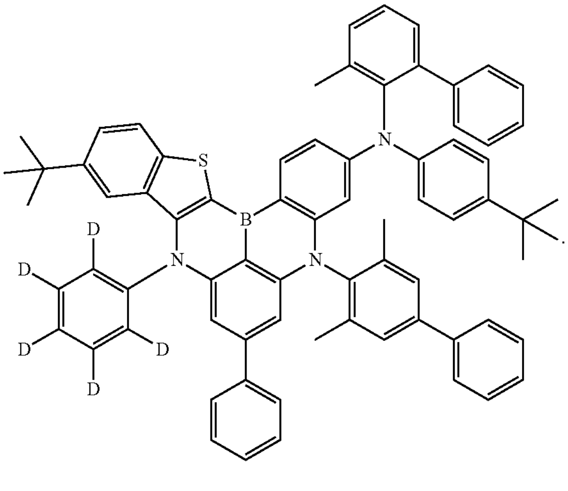

9. An organic electroluminescent device comprising a first electrode, a second electrode opposite to the first electrode, and one or more organic layers interposed between the first and second electrodes wherein one of the organic layers is a light emitting layer composed of a host and a dopant and wherein the dopant is the compound according to claim 8.

10. An organic electroluminescent device comprising a first electrode, a second electrode opposite to the first electrode, and one or more organic layers interposed between the first and second electrodes wherein one of the organic layers is a light emitting layer comprising a host and a dopant and wherein the dopant comprises the compound according to claim 8; and the host is an anthracene compound represented by Formula 1:

(1)

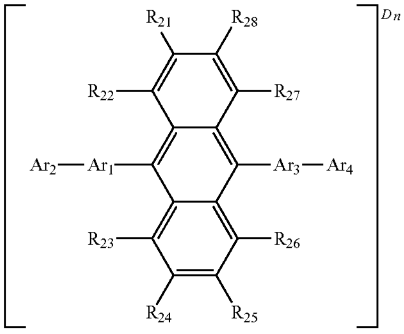

wherein $R_{21}$ to $R_{28}$ are identical to or different from each other and are each independently selected from hydrogen, deuterium, substituted or unsubstituted $C_1$-$C_{30}$ alkyl, substituted or unsubstituted $C_2$-$C_{30}$ alkynyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, $Ar_1$ and $Ar_3$ are identical to or different from each other and are each independently substituted or unsubstituted $C_6$-$C_{30}$ arylene or substituted or unsubstituted $C_5$-$C_{30}$ heteroarylene, $Ar_2$ and $Ar_4$ are identical to or different from each other and are each independently selected from substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, and substituted or unsubstituted $C_3$-$C_{30}$ mixed aliphatic-aromatic cyclic groups, $D_n$ represents the number of deuterium (D) atoms replacing hydrogen atoms in $Ar_1$ to $Ar_4$, and n is an integer from 0 to 40.

11. The organic electroluminescent device according to claim 10, wherein at least one of $R_{21}$ to $R_{28}$ in Formula 1 is a deuterium atom.

12. The organic electroluminescent device according to claim 10, wherein the compound represented by Formula 1 is selected from the group consisting of the following compounds:

-continued
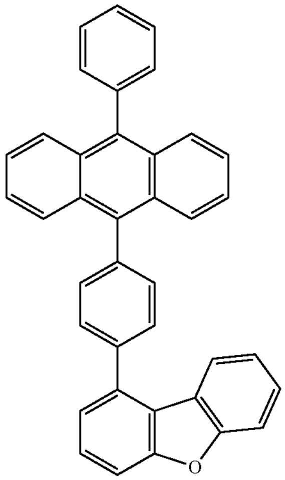
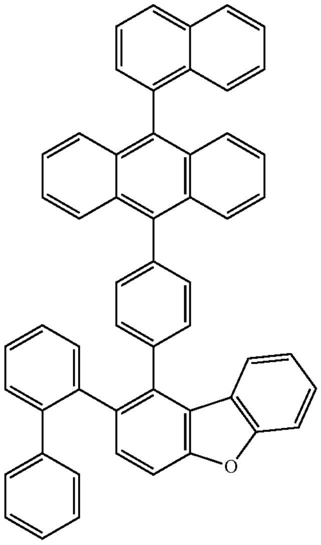
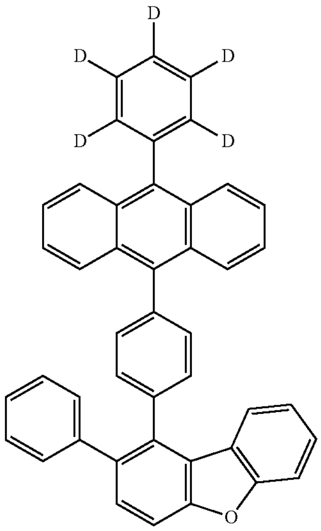
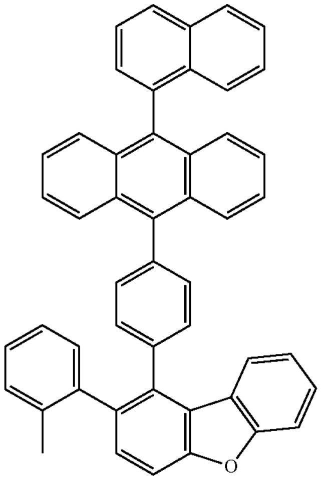
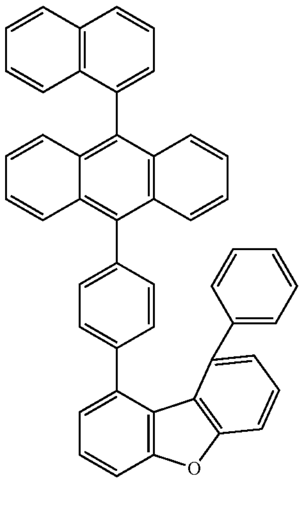
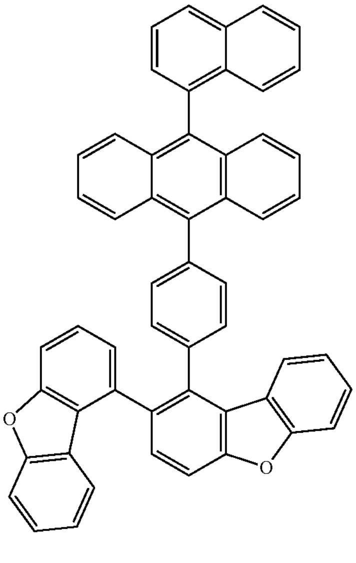

-continued
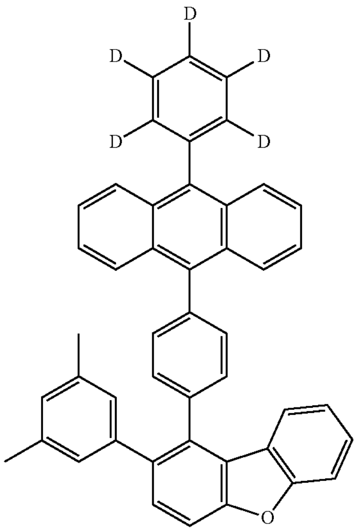
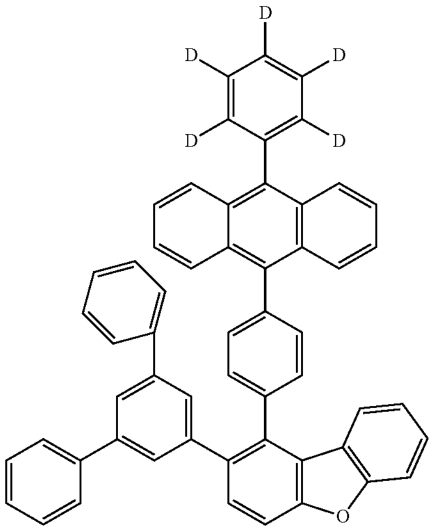
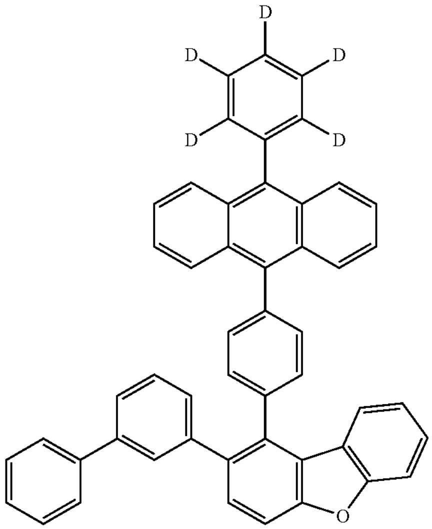
-continued
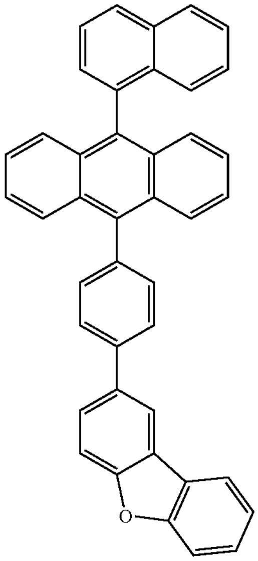
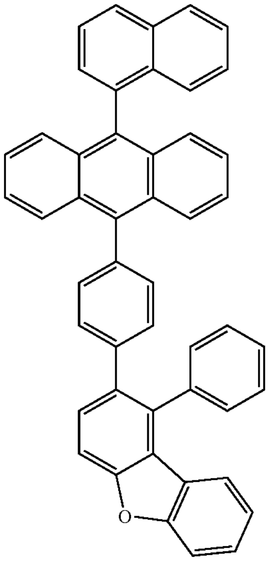
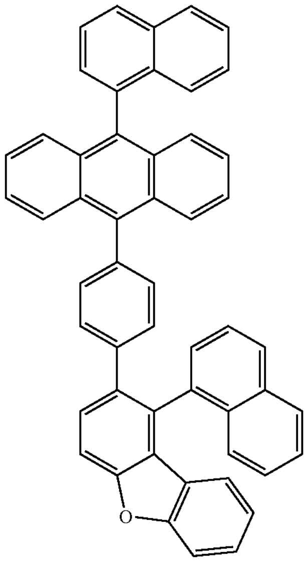

-continued
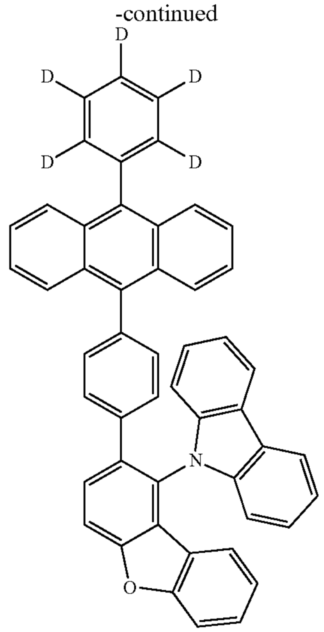
-continued
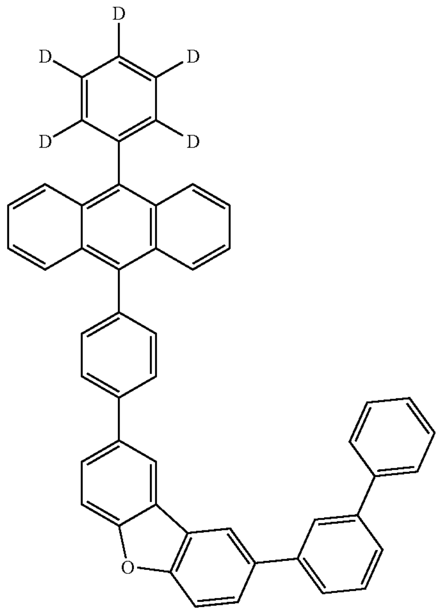
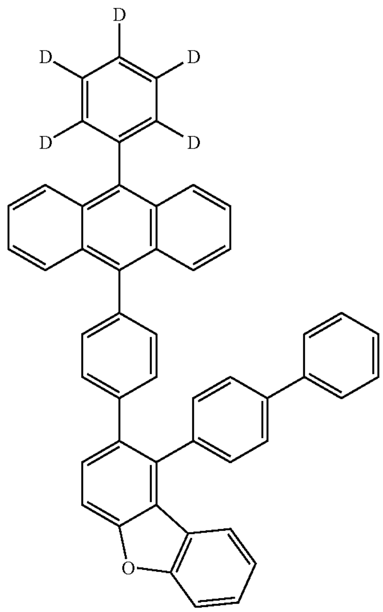
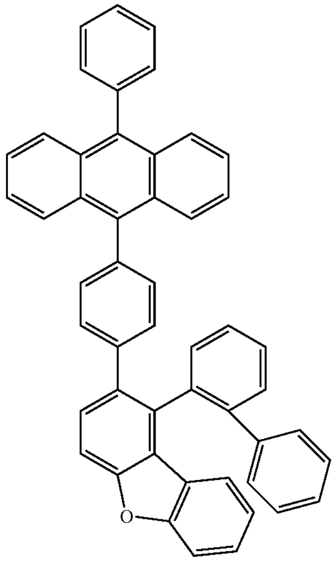

-continued
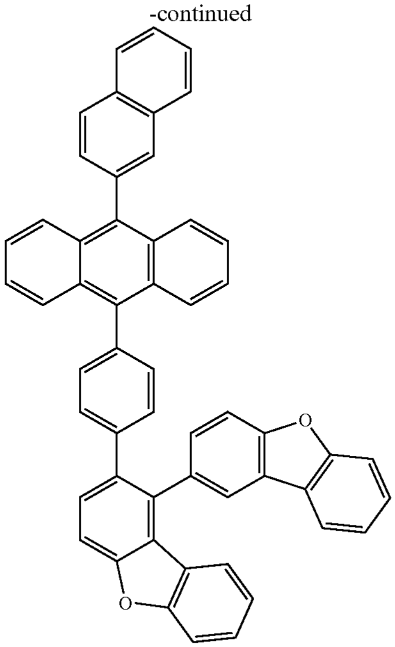
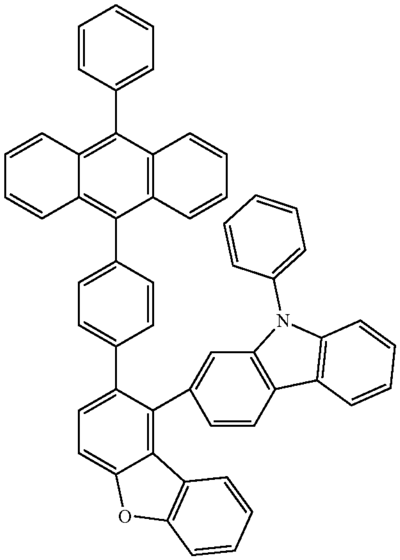
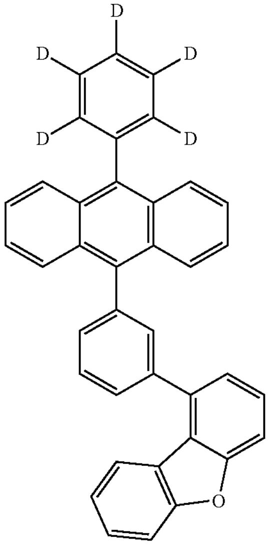
-continued
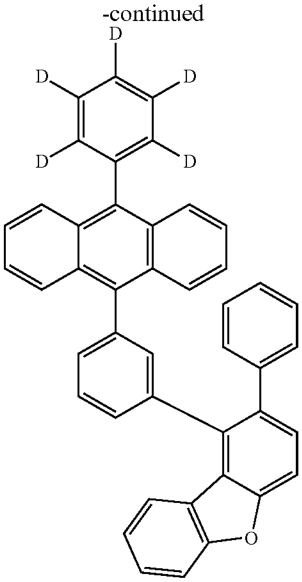
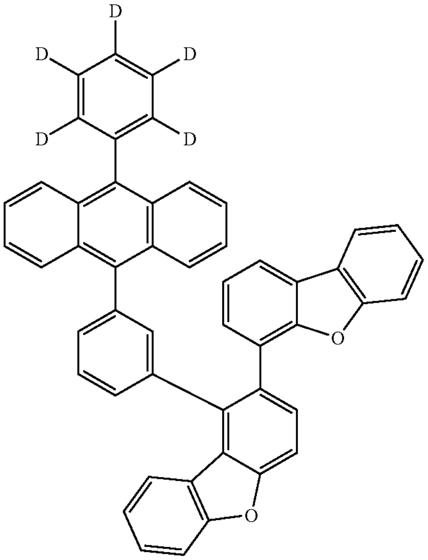
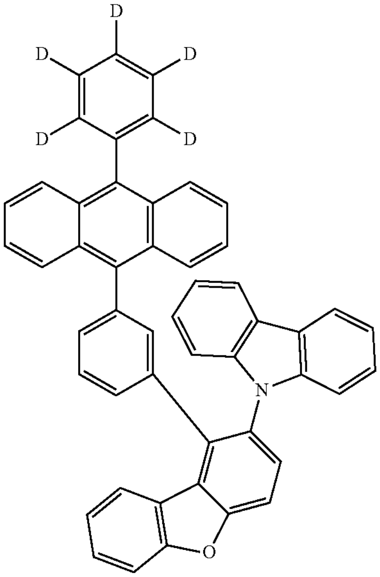

-continued
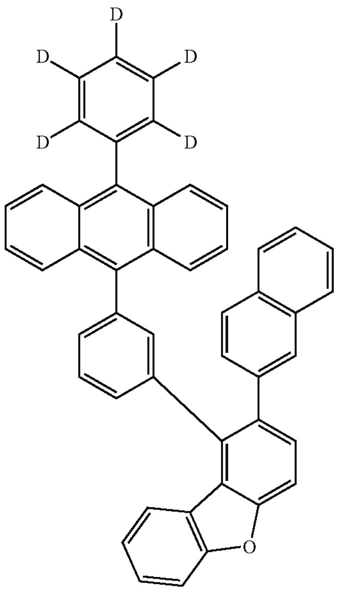
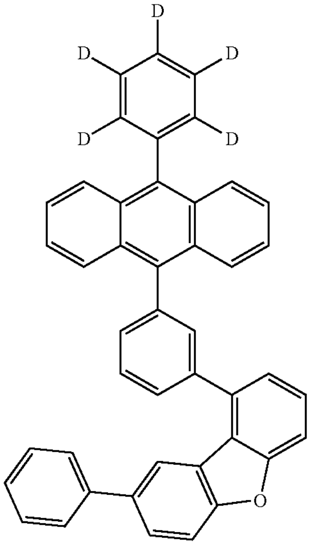
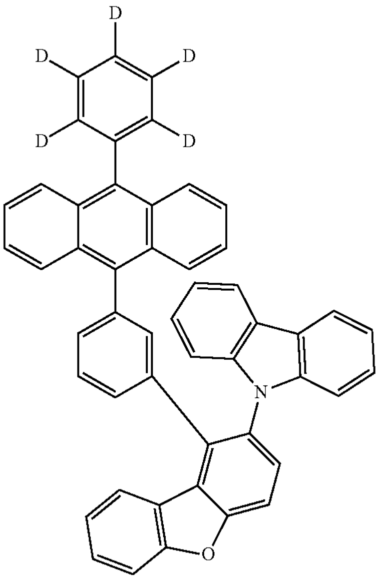
-continued
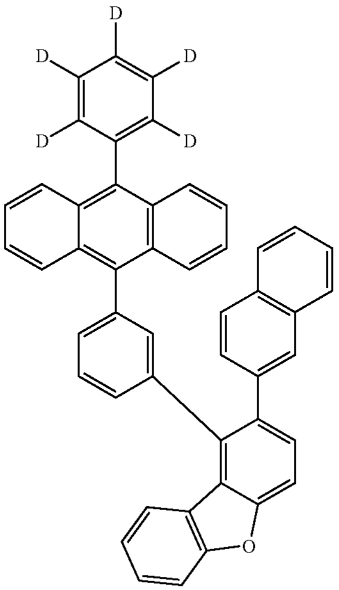
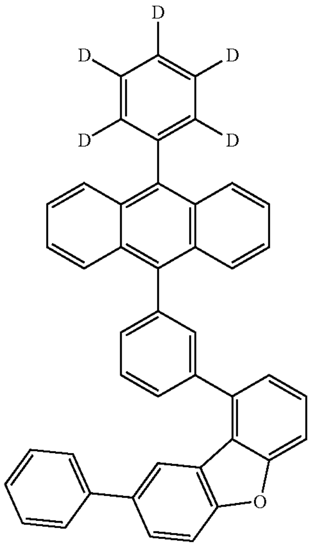
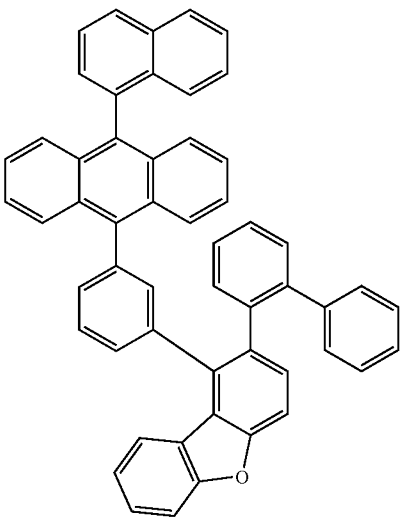

-continued
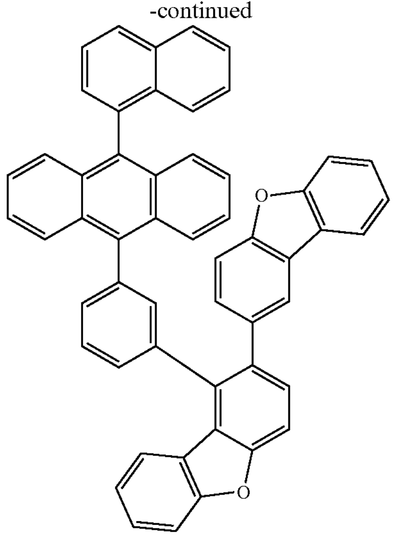
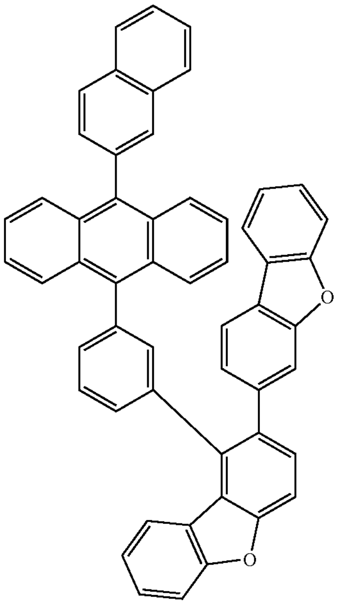
-continued
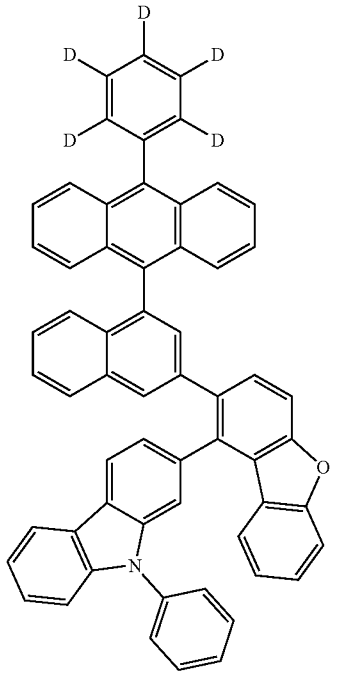
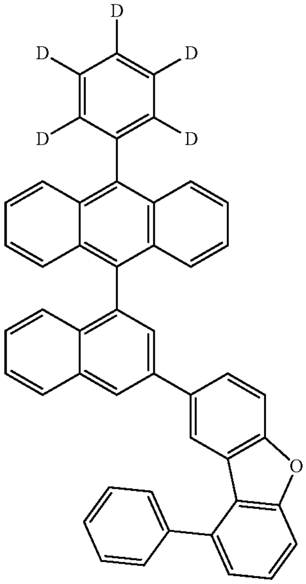

-continued
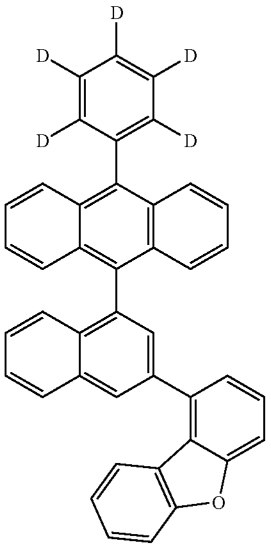
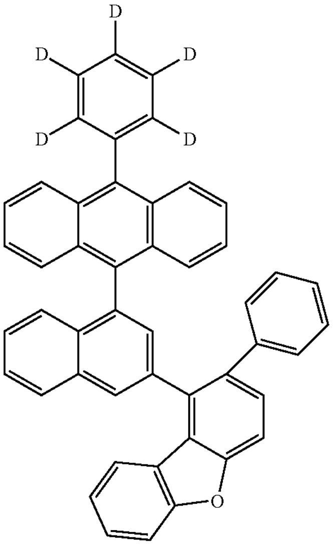
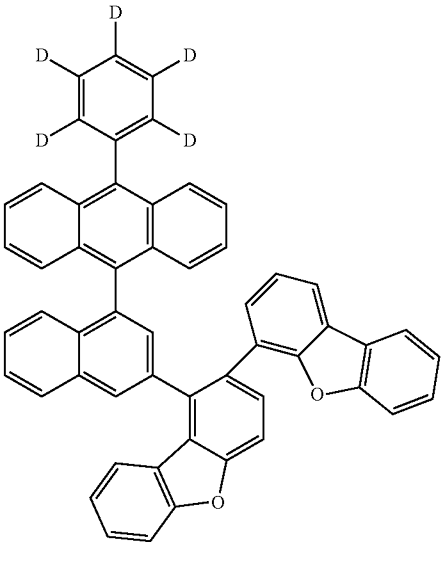
-continued
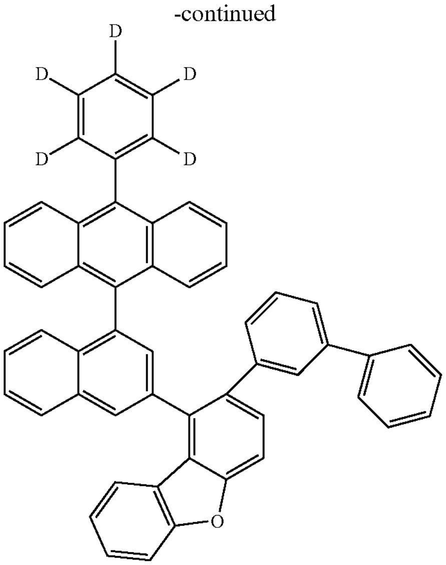
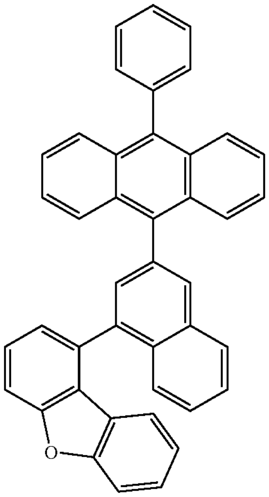
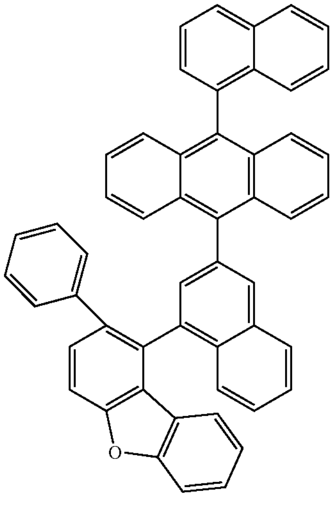

-continued
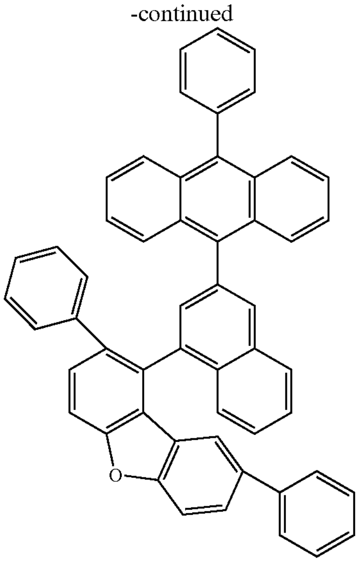
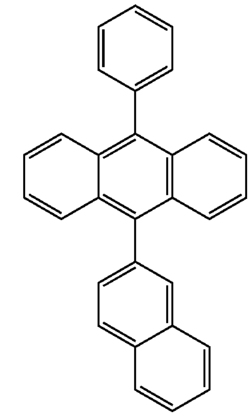
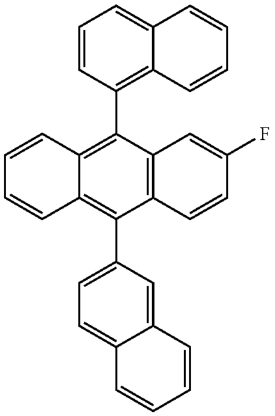
-continued
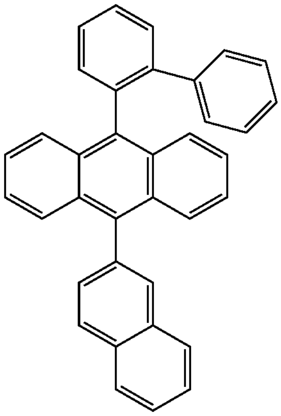
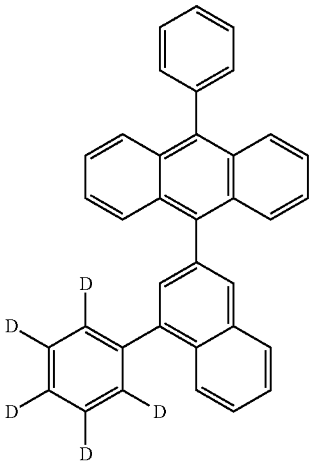
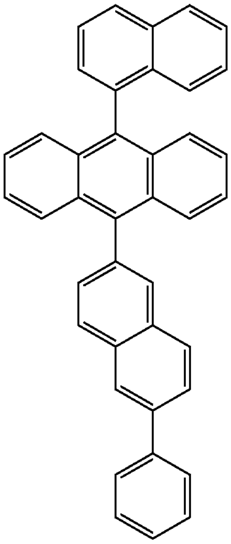

-continued
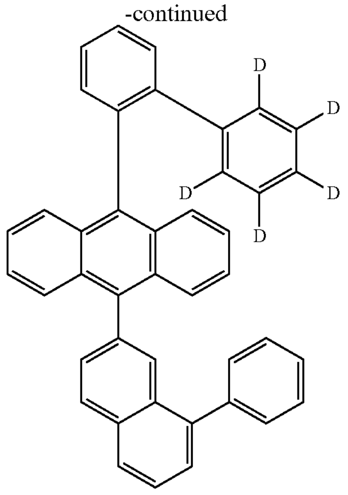
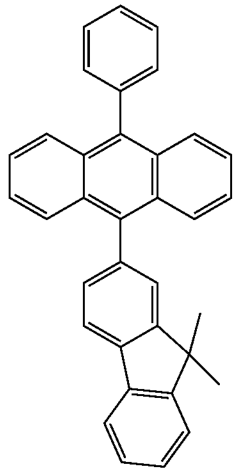
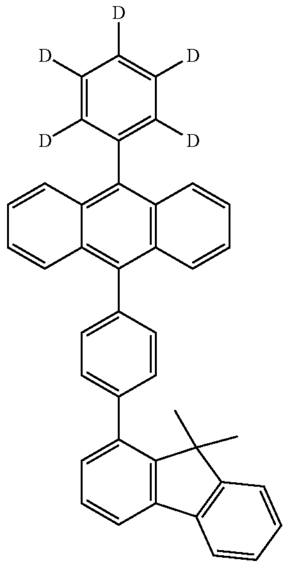
-continued
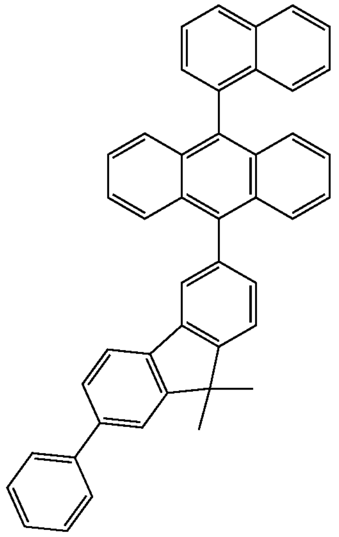
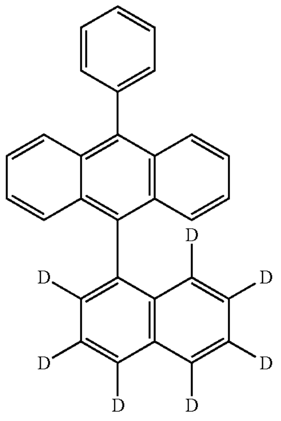
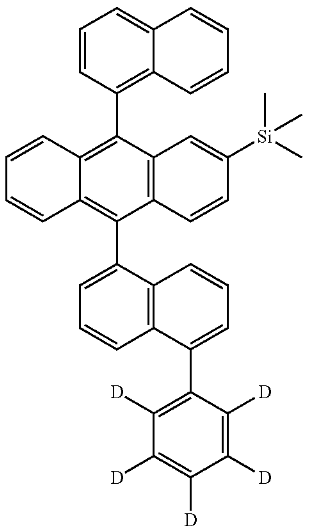

-continued
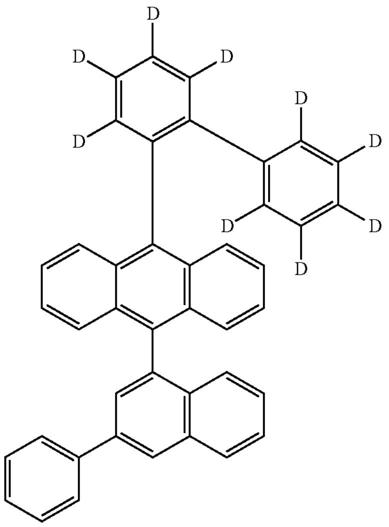
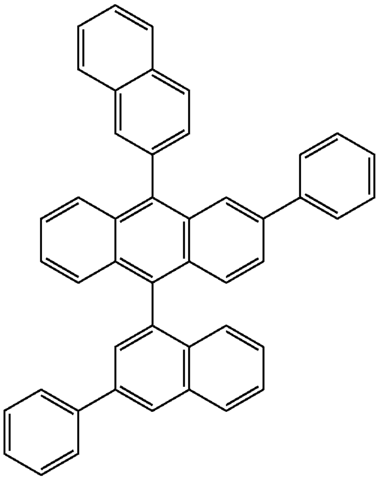
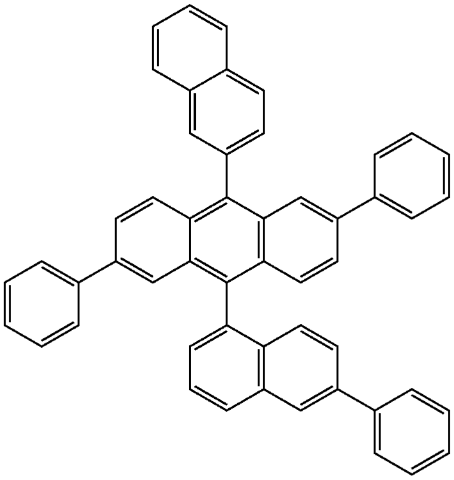
-continued
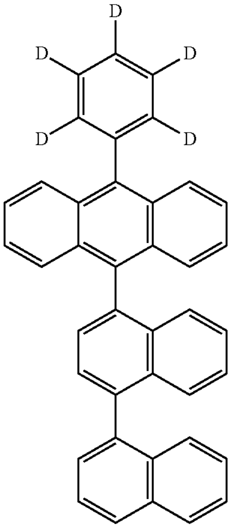
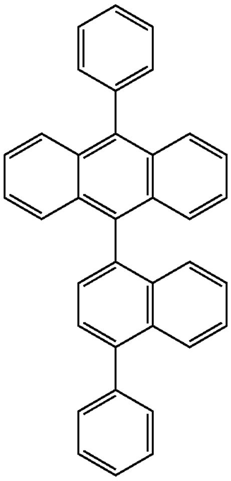
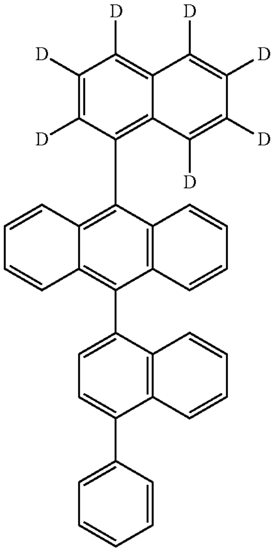

-continued
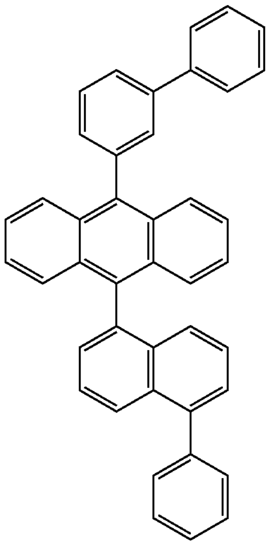
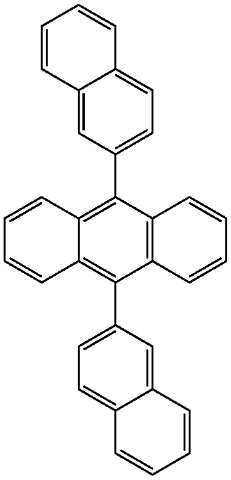
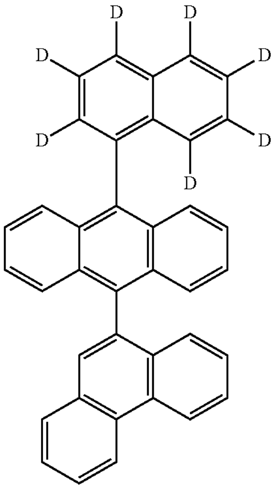
-continued
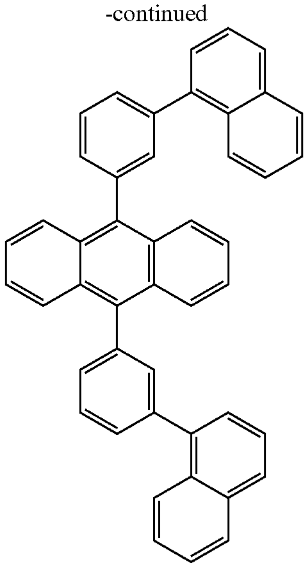
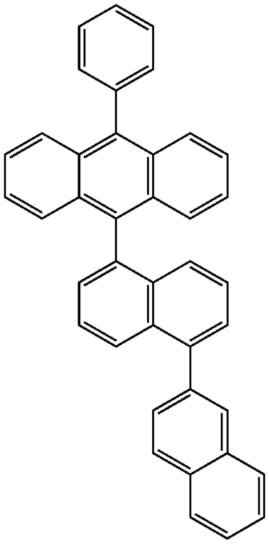
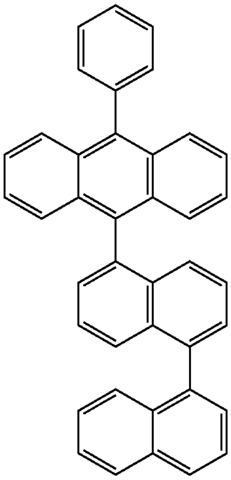

-continued
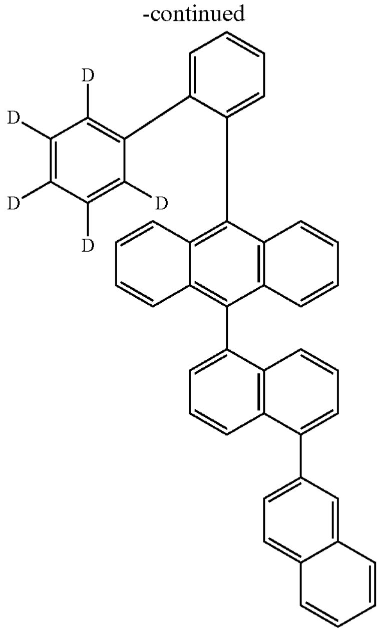
-continued
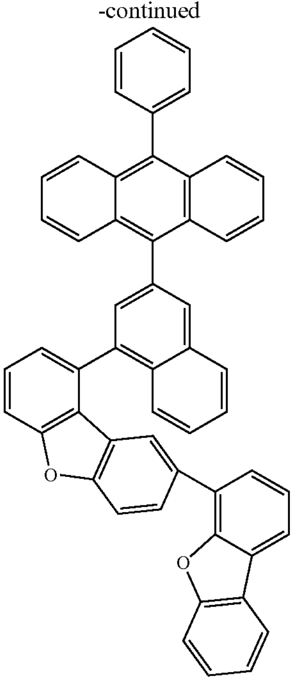
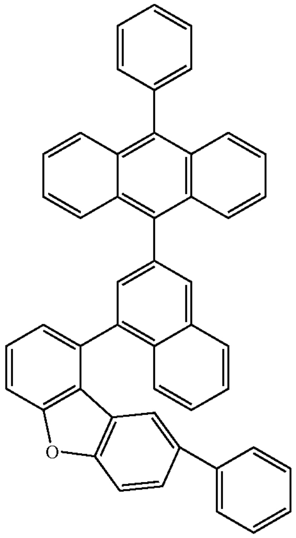
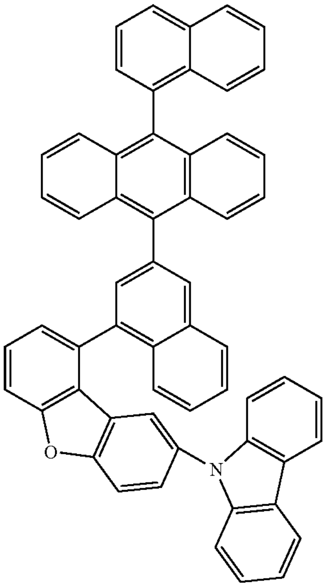

-continued
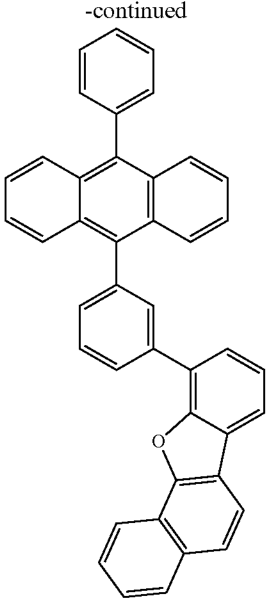
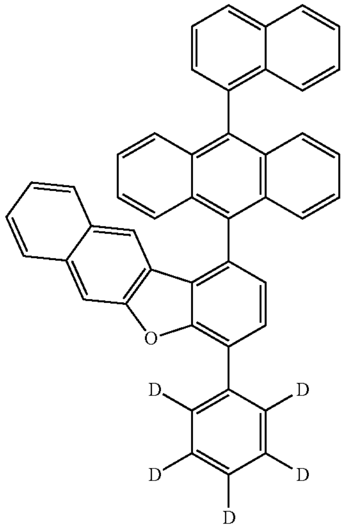
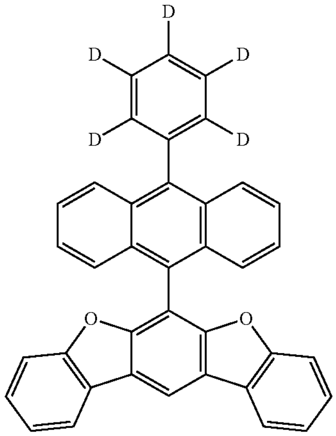
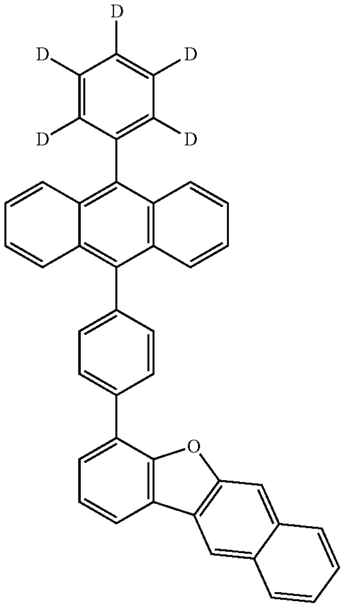 [SMILES: [2H]c1c([2H])c([2H])c(-c2c3ccccc3c(-c3ccc(-c4cccc5c4oc4cc6ccccc6cc45)cc3)c3ccccc23)c([2H])c1[2H]]
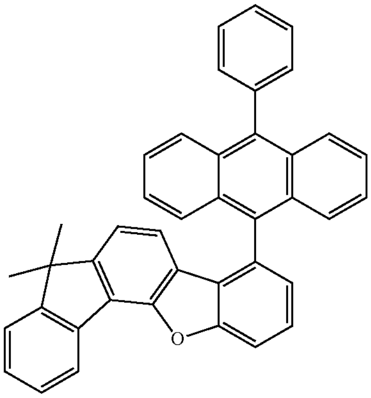

-continued
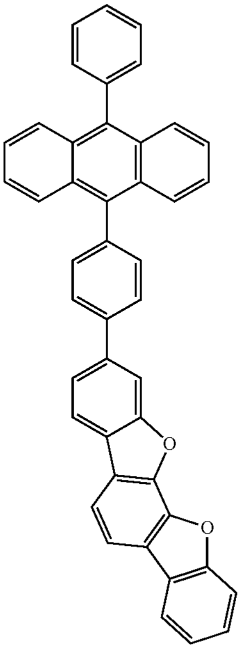
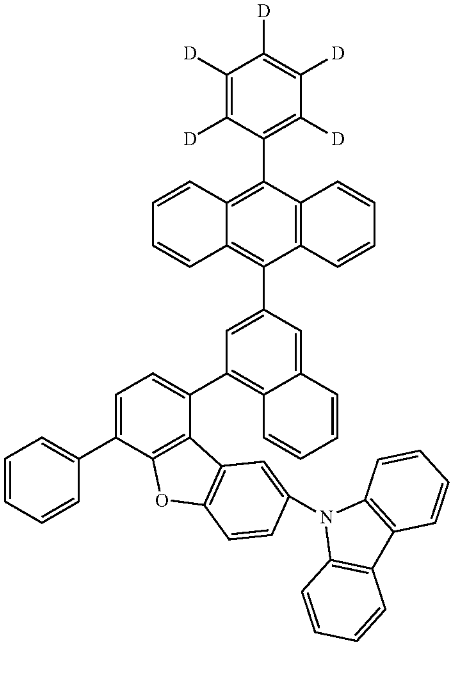
-continued
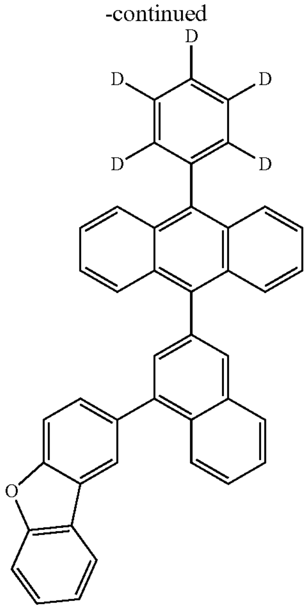
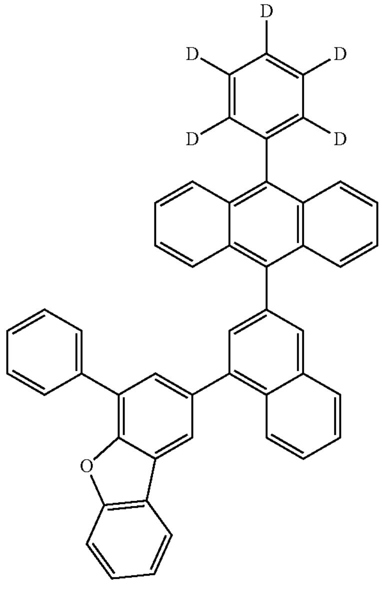

-continued
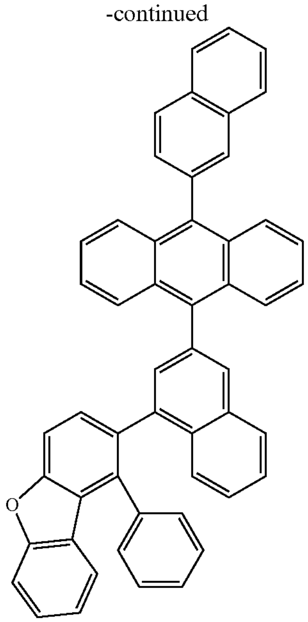
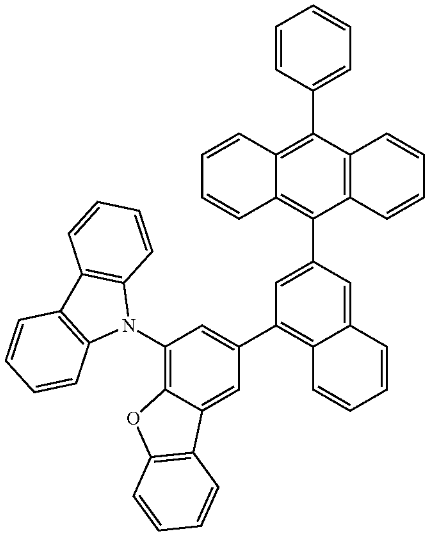
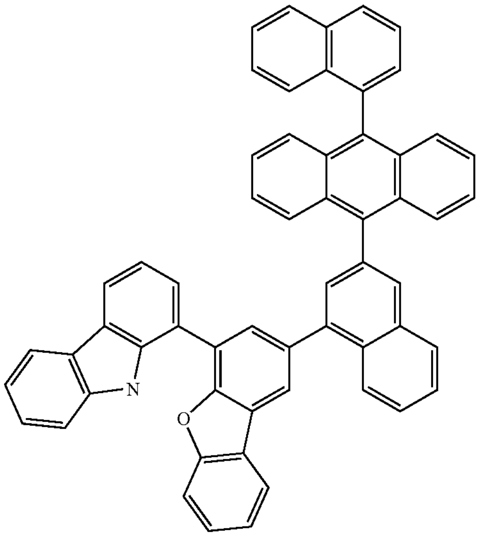
-continued
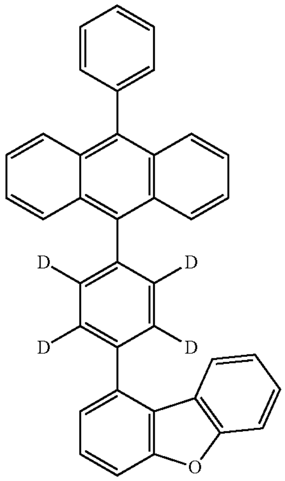
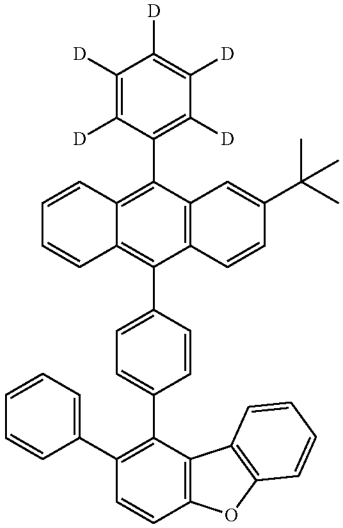
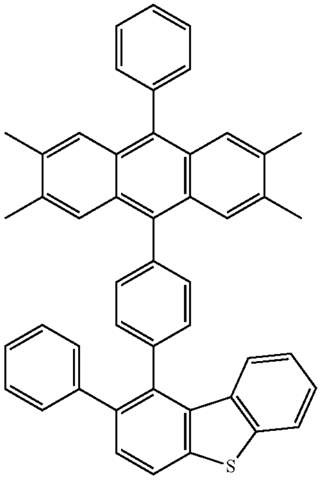

-continued
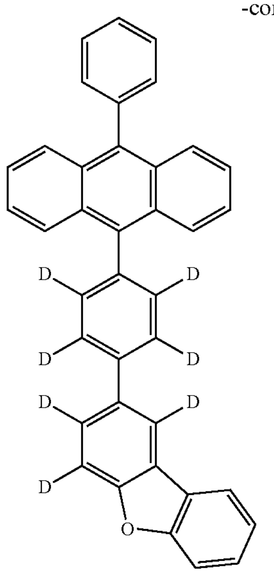
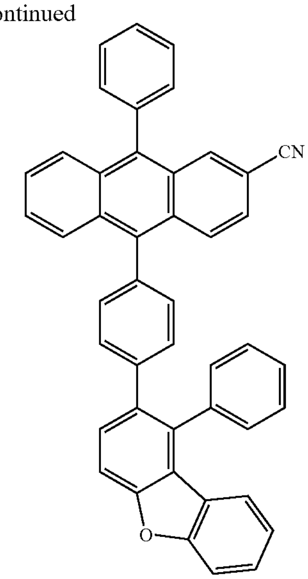
-continued
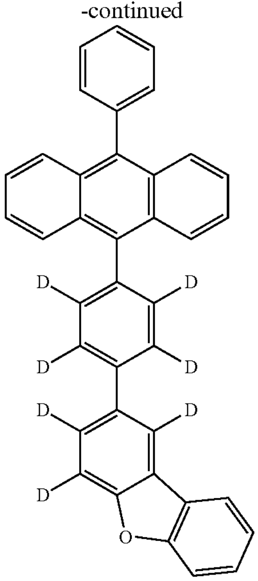
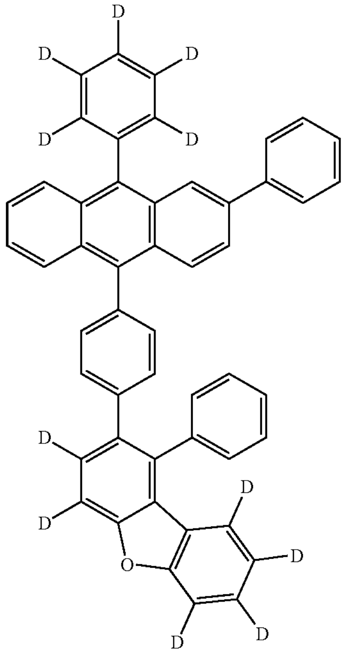
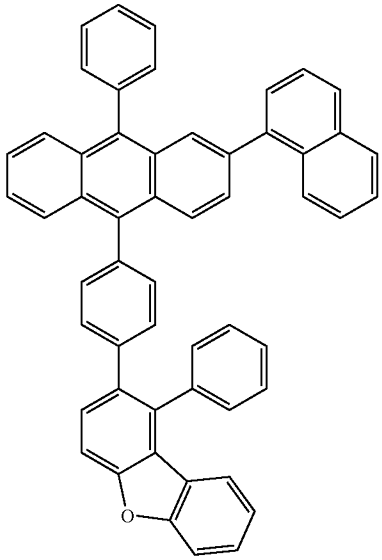

-continued
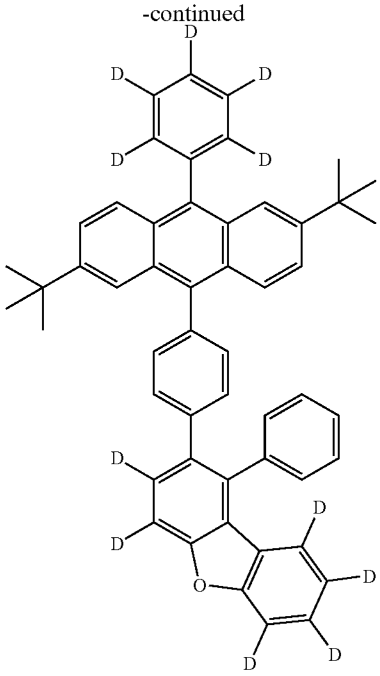
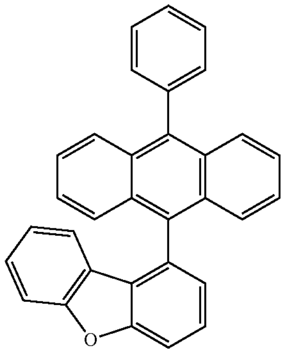
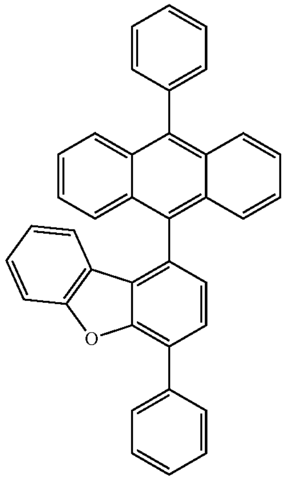
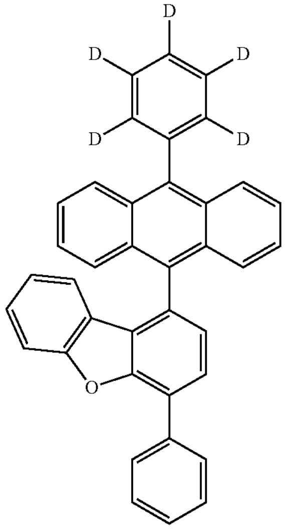
-continued
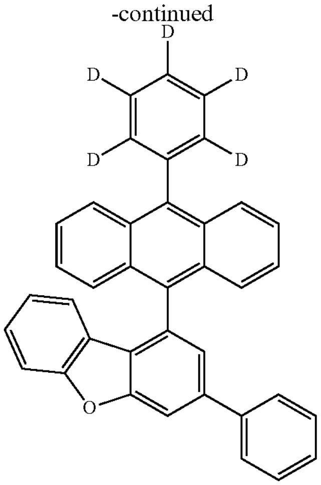
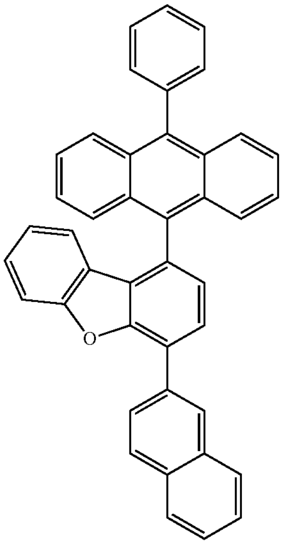
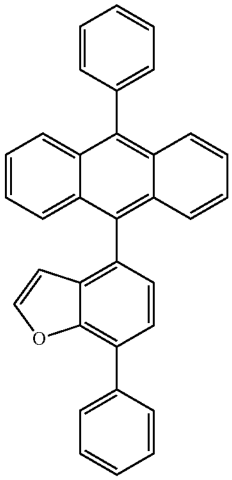
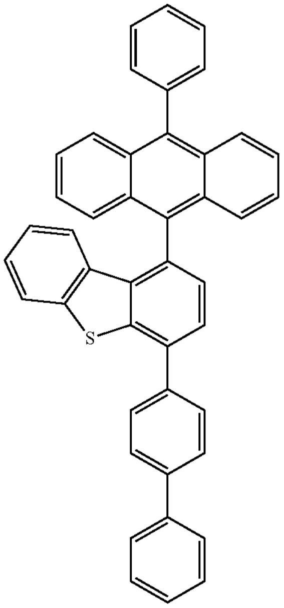
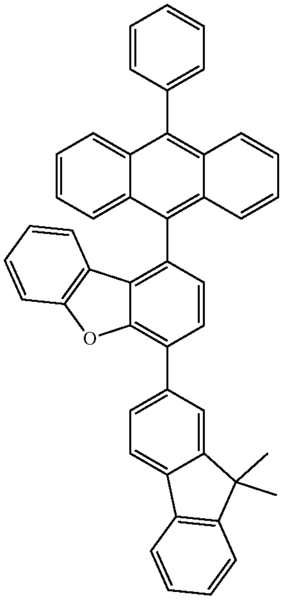

-continued
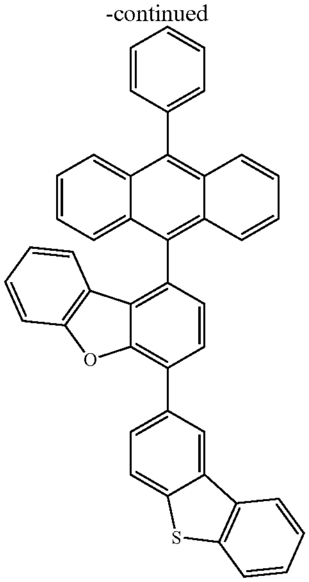
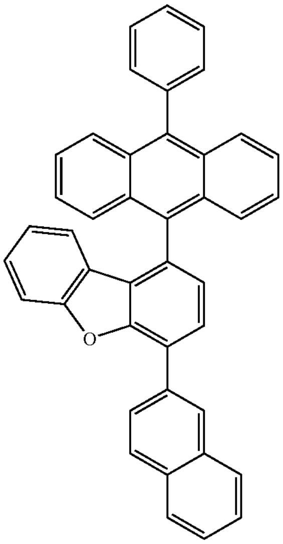
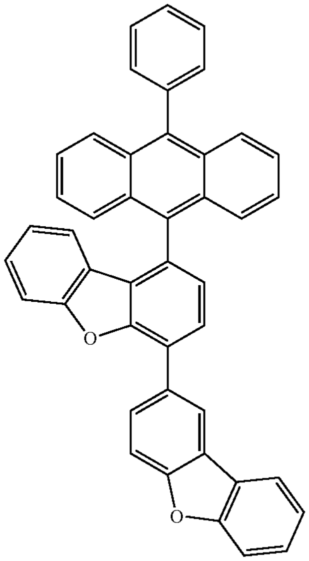
-continued
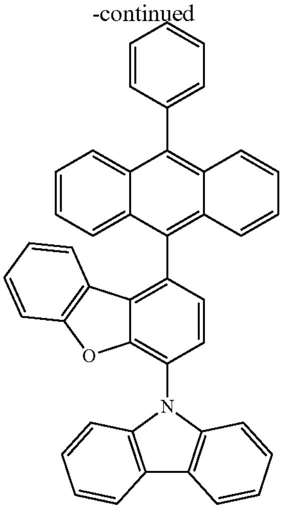
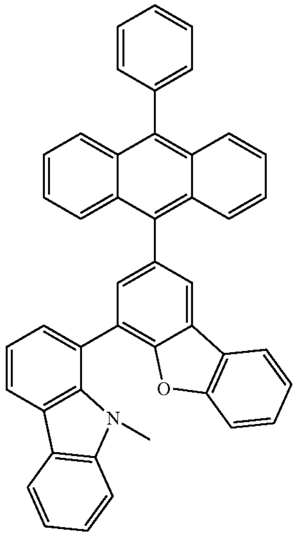
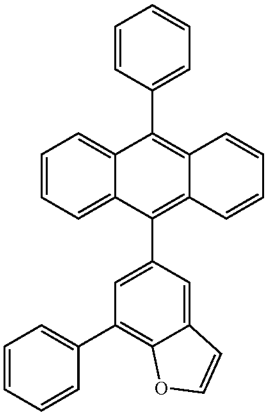

-continued
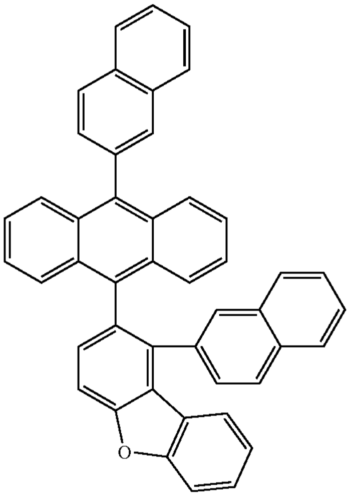
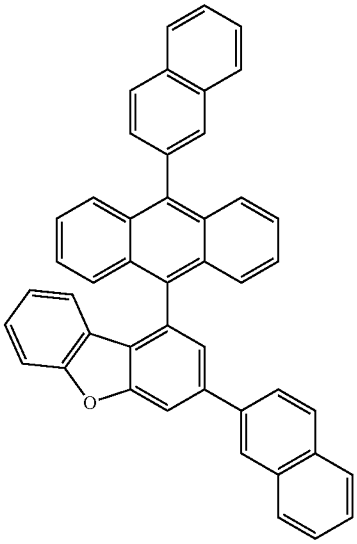
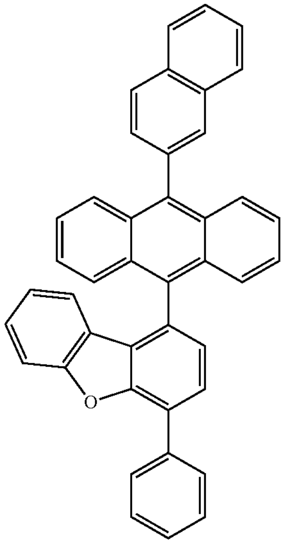
-continued
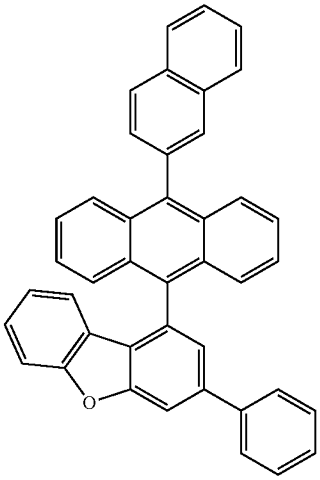
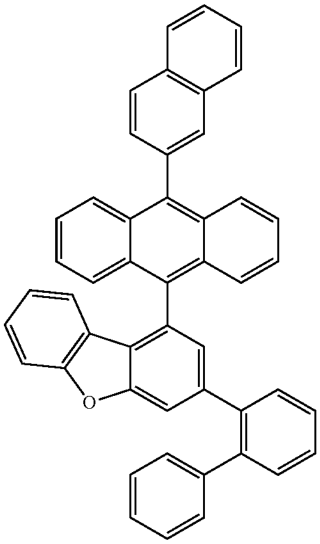
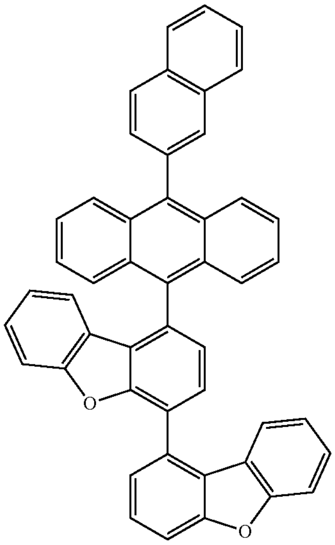

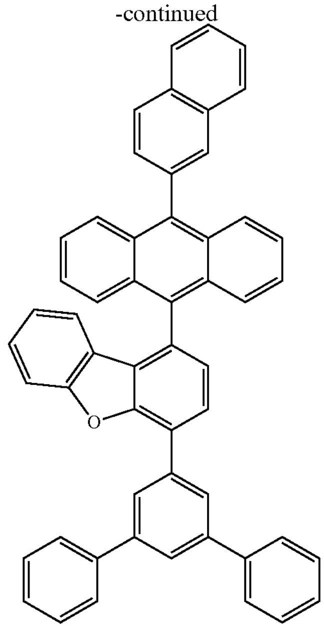
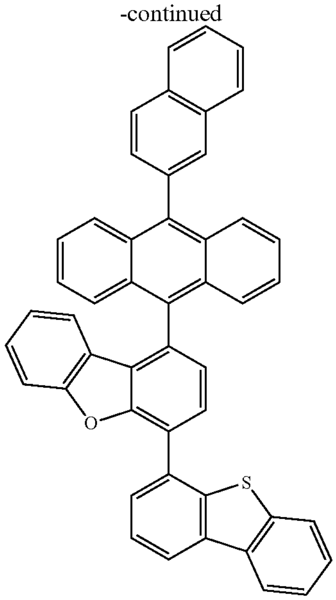
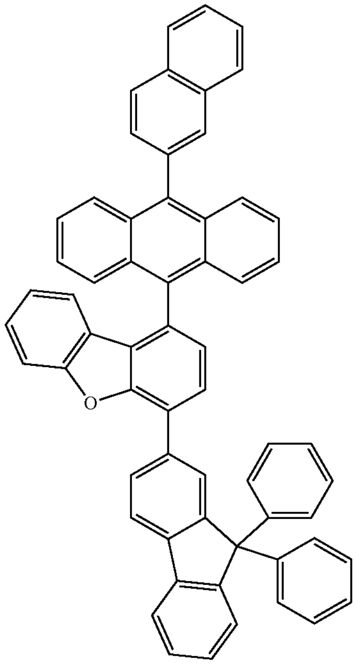
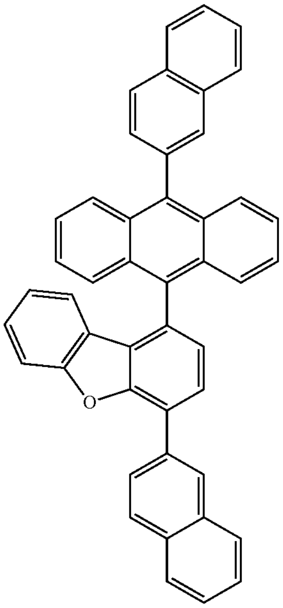
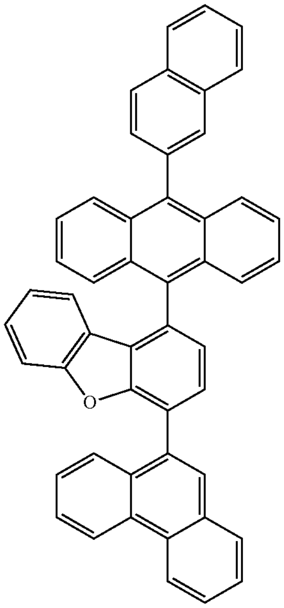

-continued
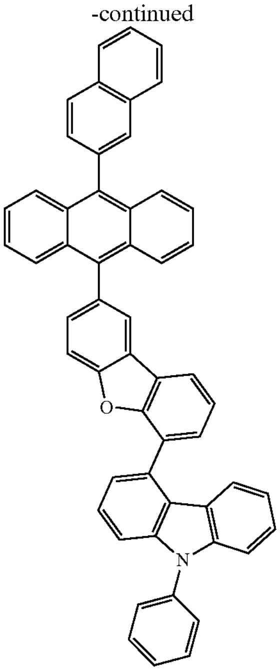
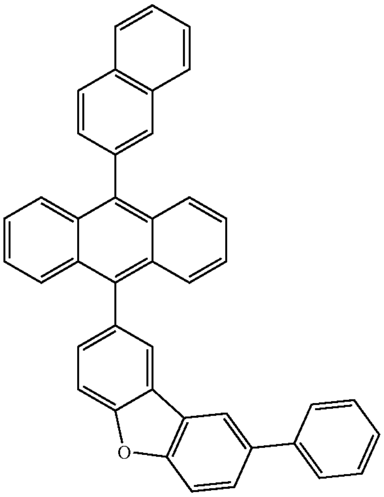
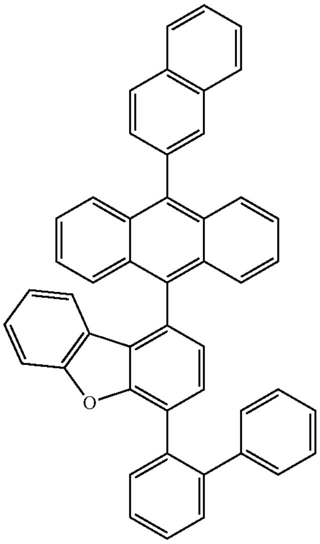
-continued
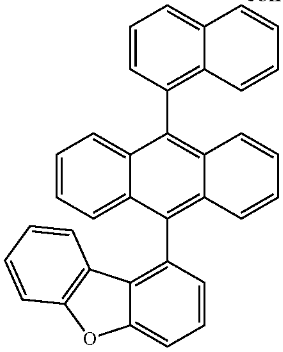
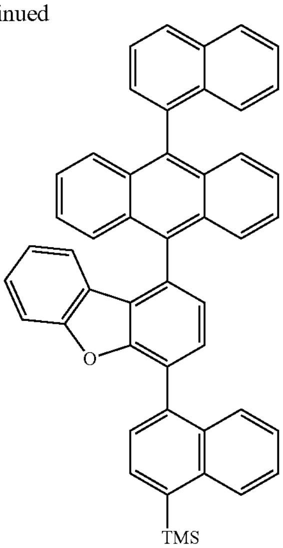
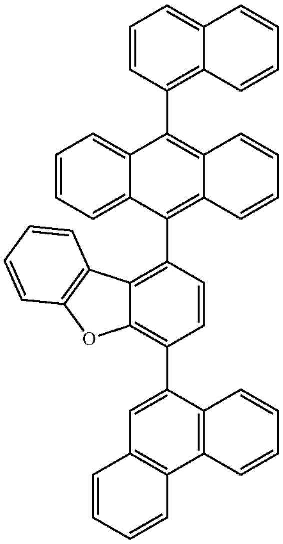
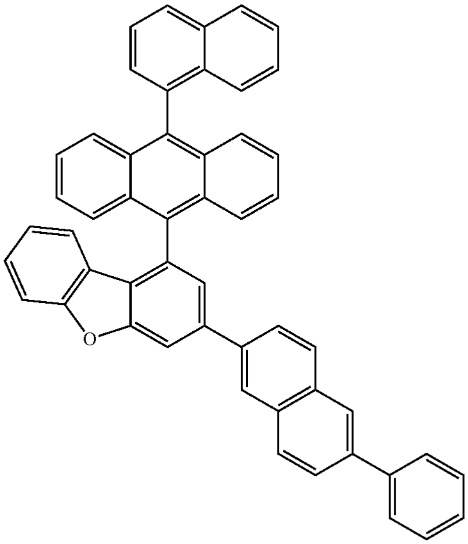

-continued
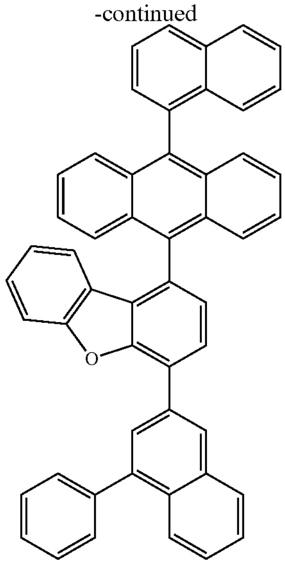
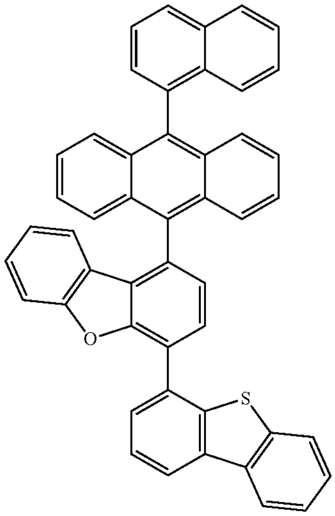
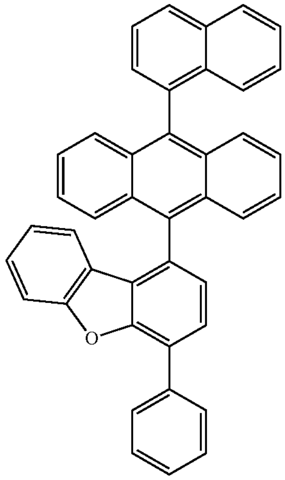
-continued
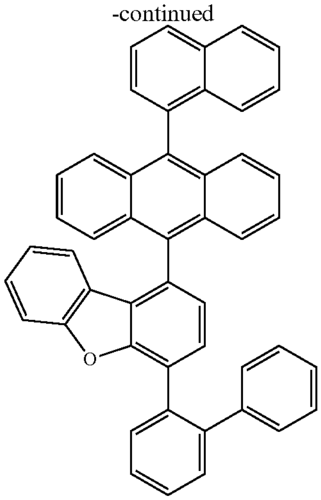
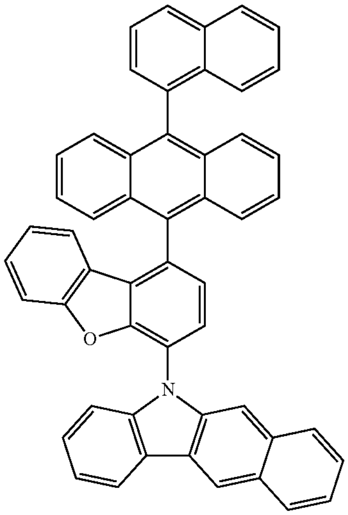
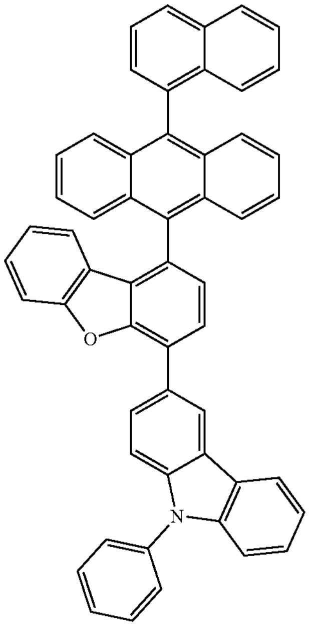

-continued
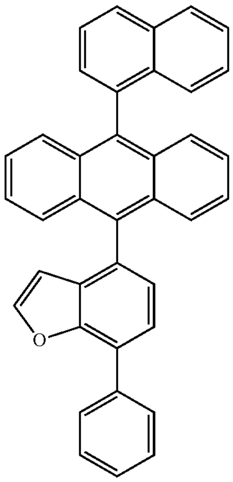
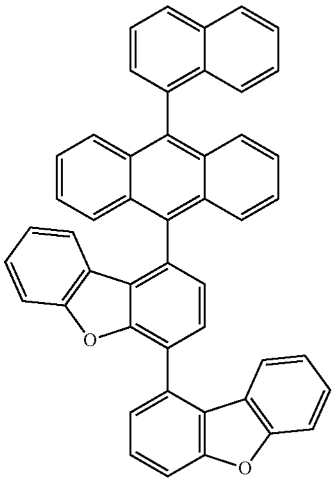
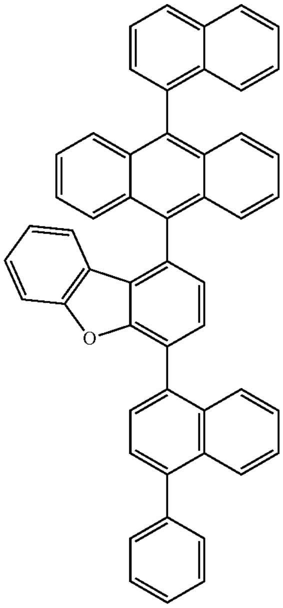
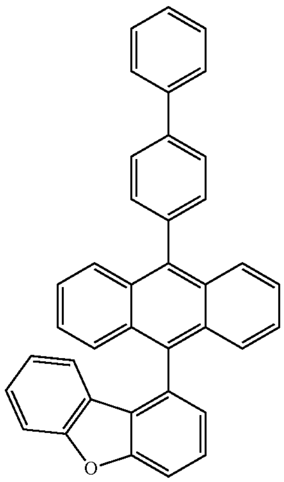
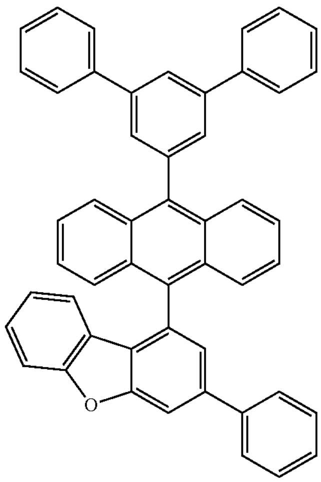
-continued
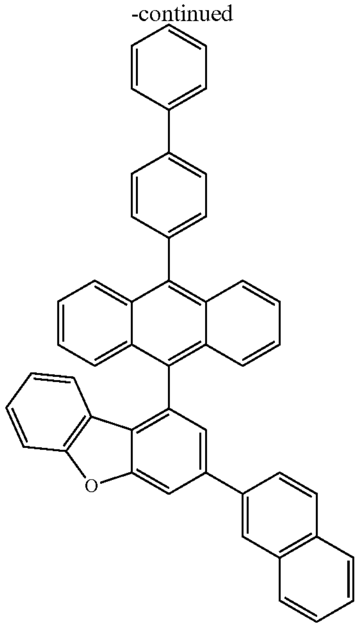
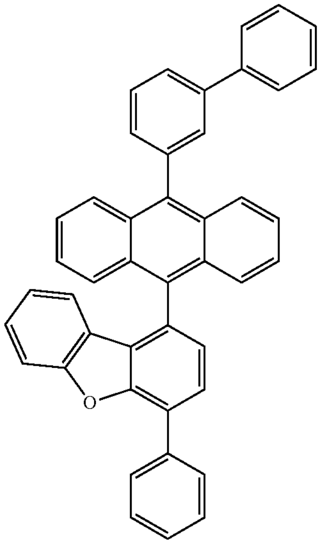

-continued
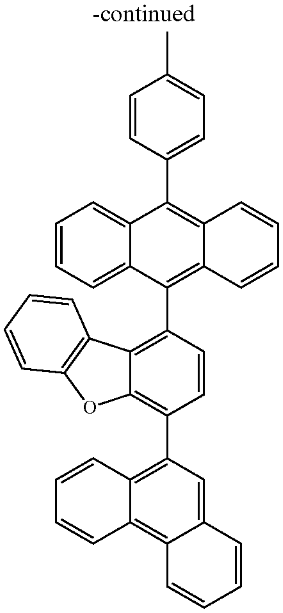
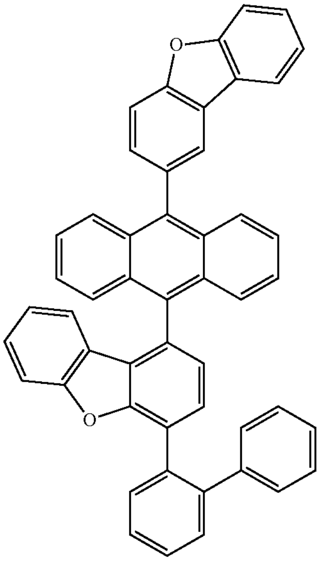
-continued
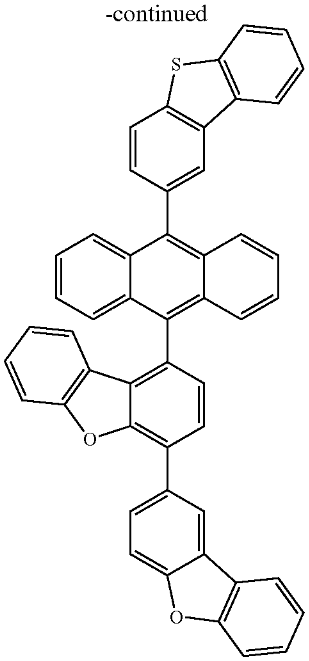
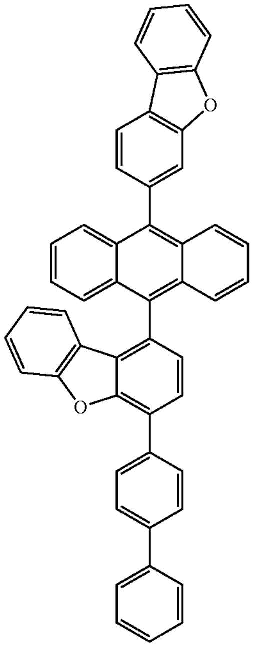
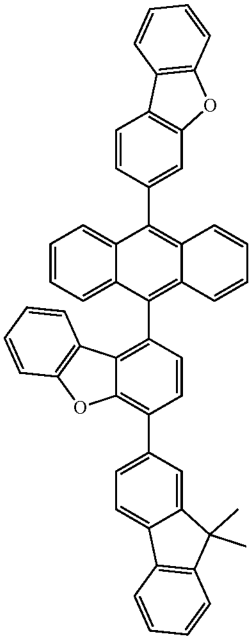

-continued
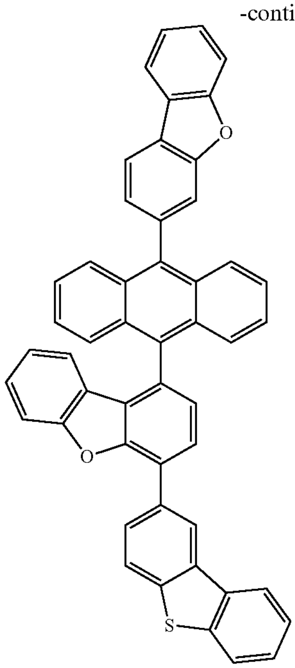
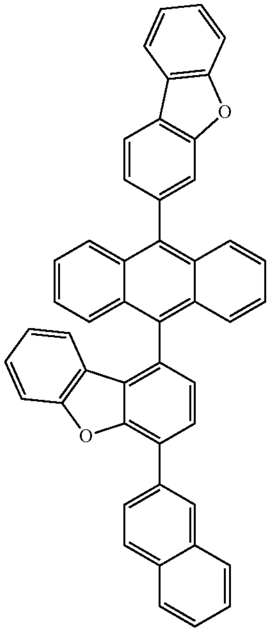
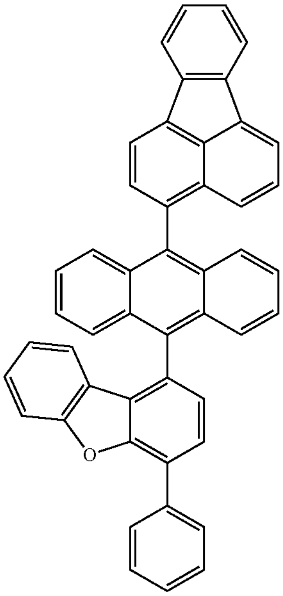
-continued
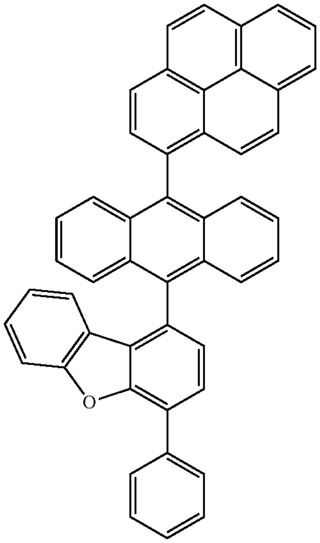
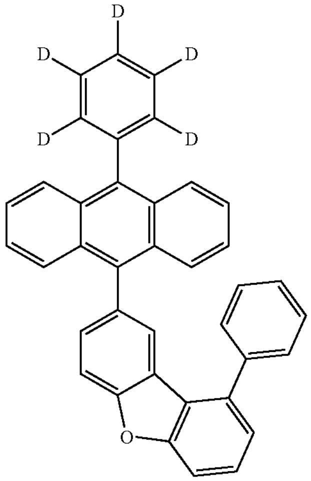
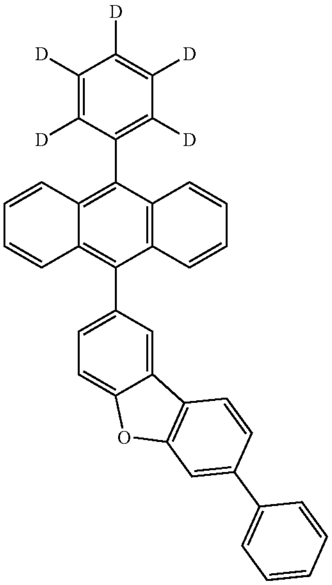

-continued
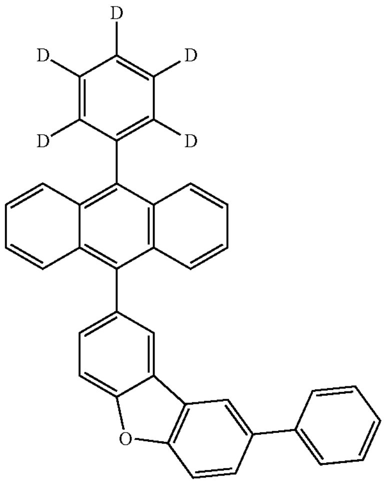
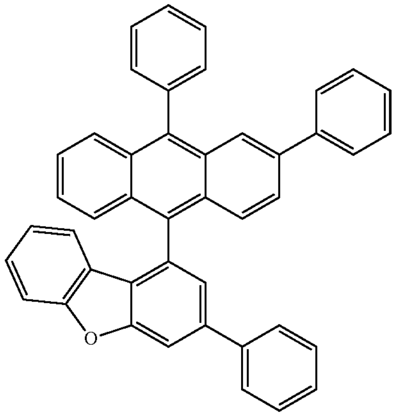
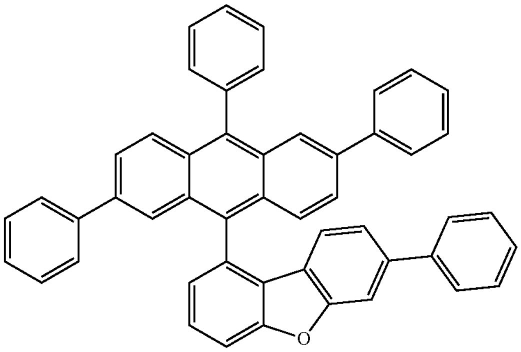
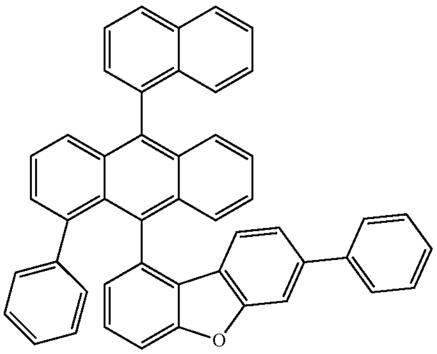
-continued
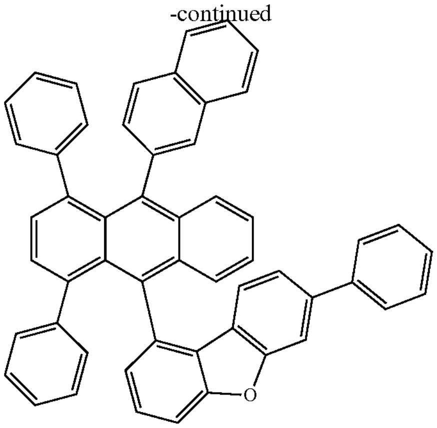
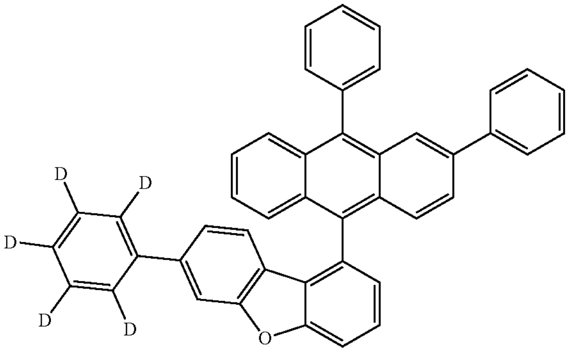
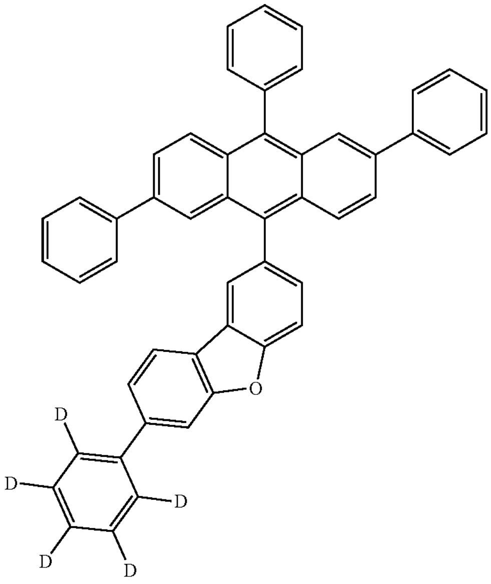

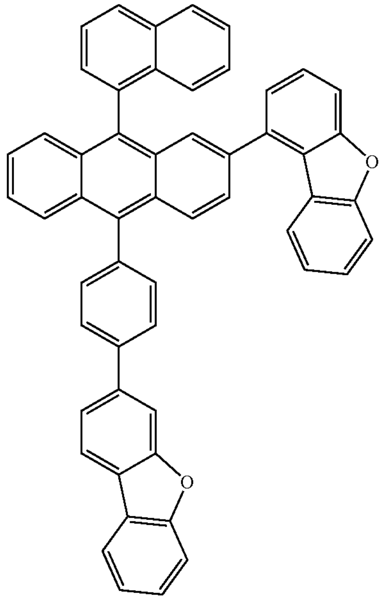
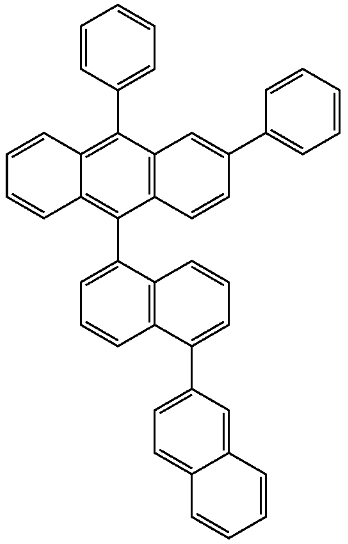
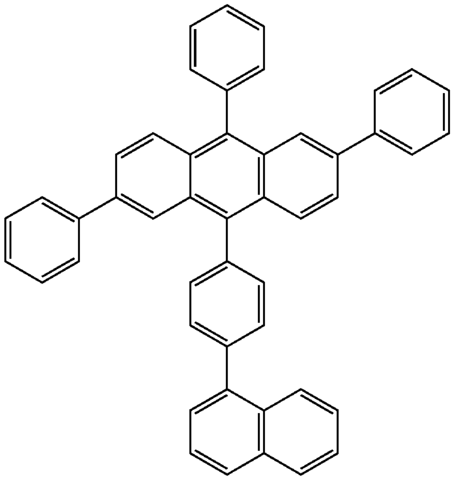
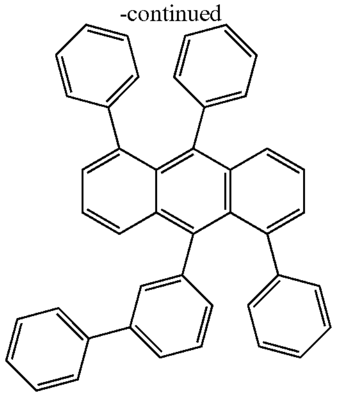
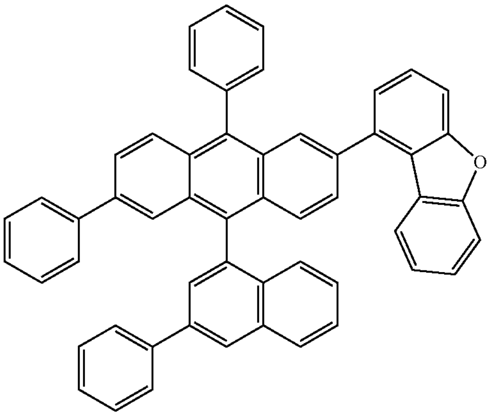
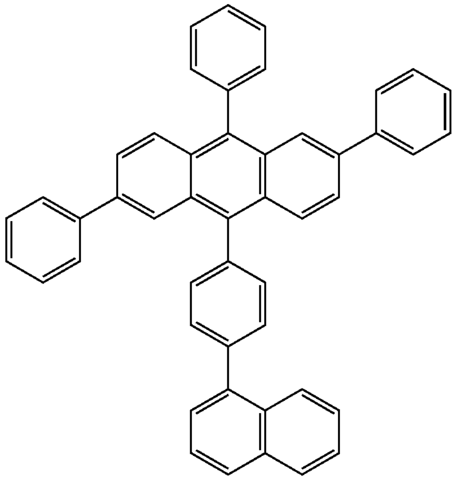

-continued
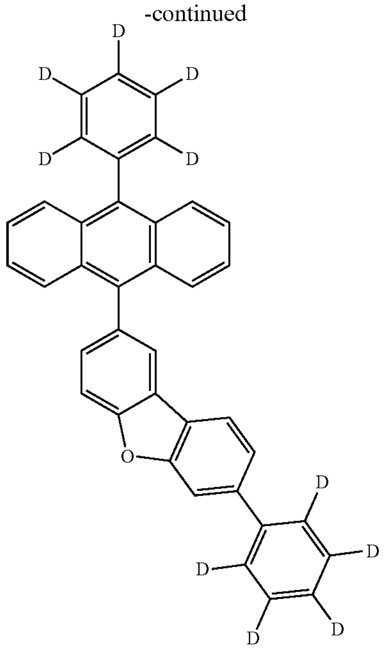
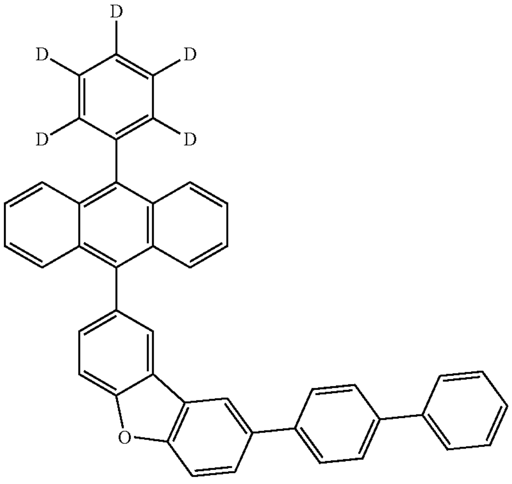
-continued
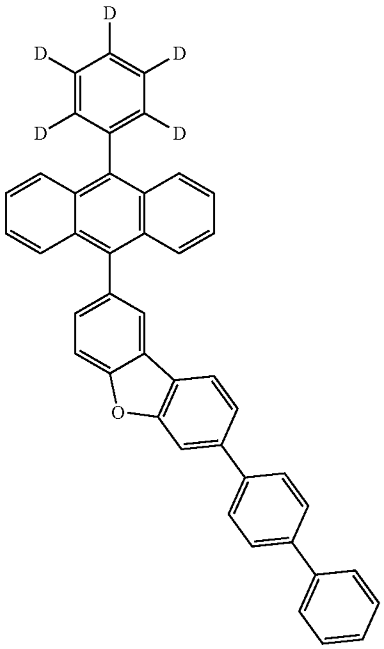
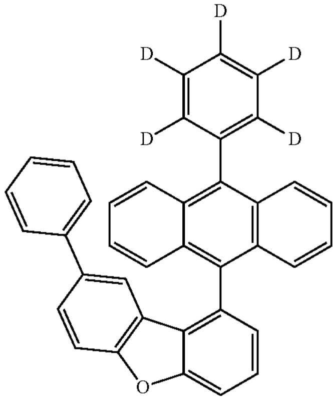
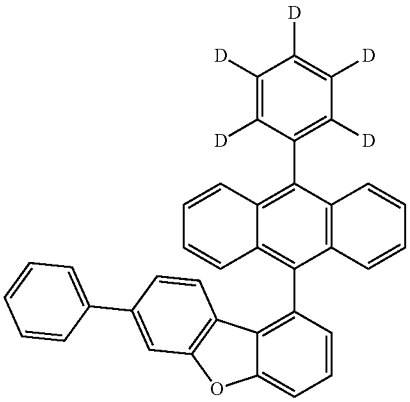

-continued
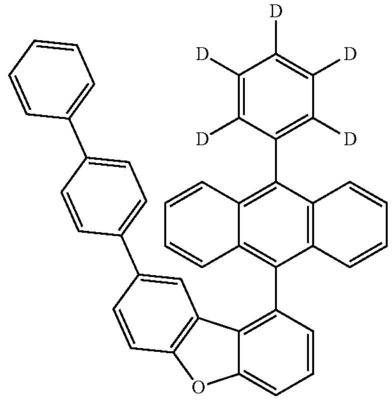
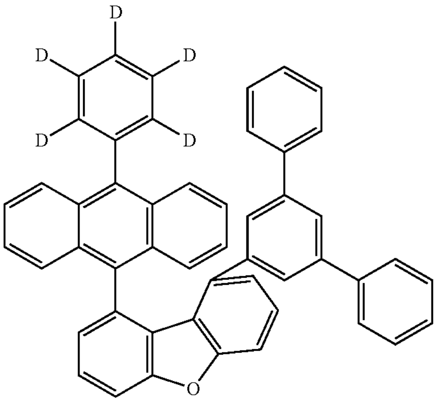
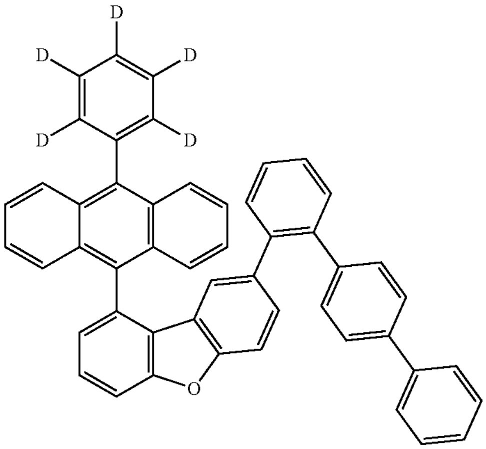
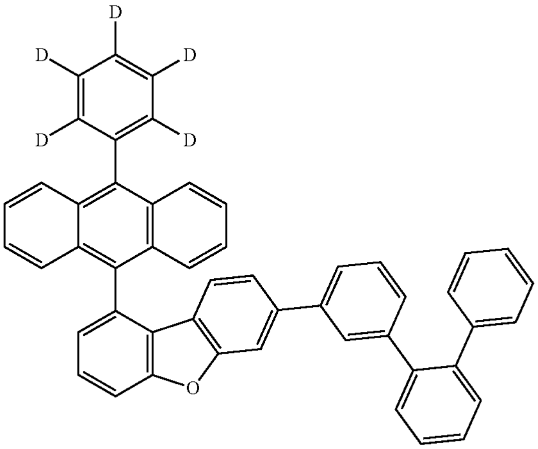
-continued
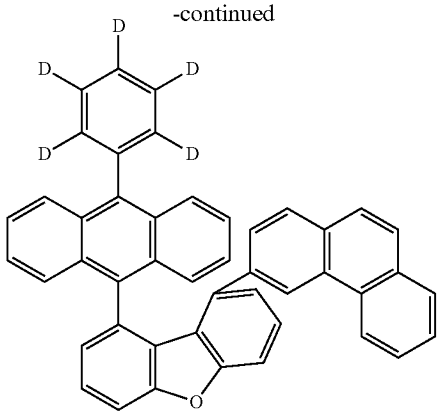
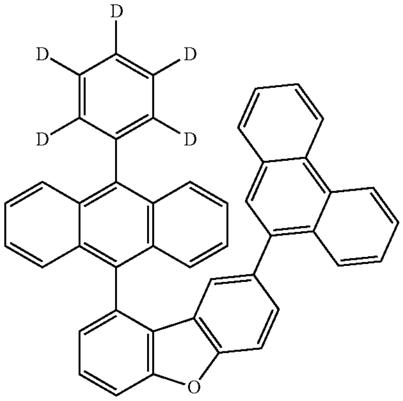
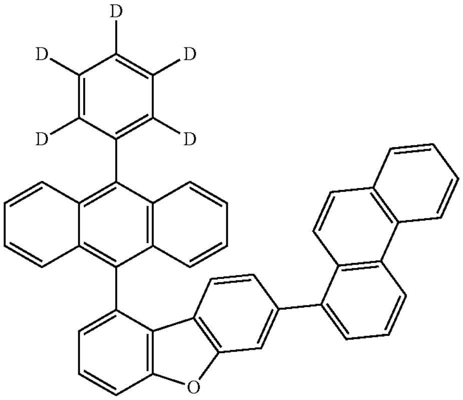

-continued
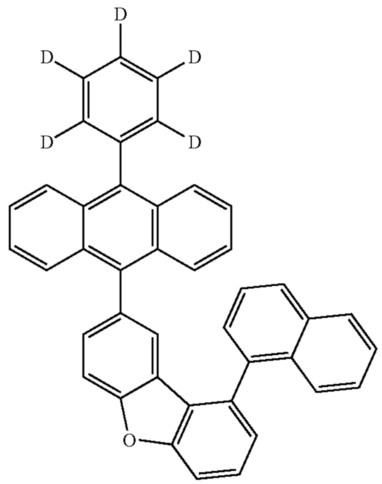
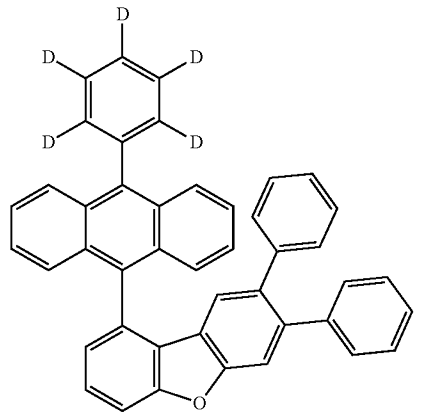
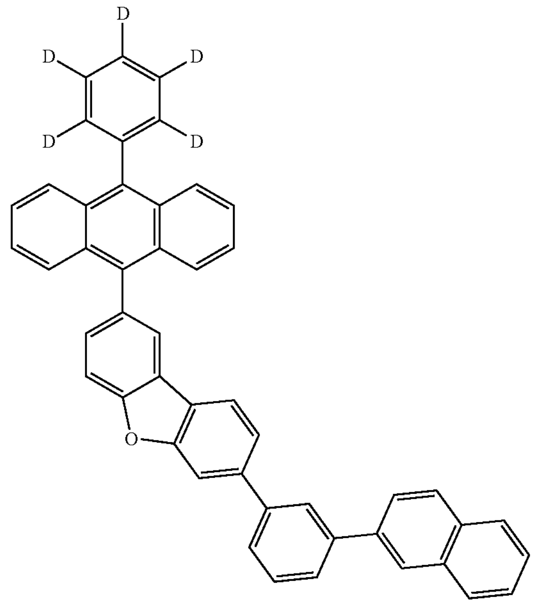
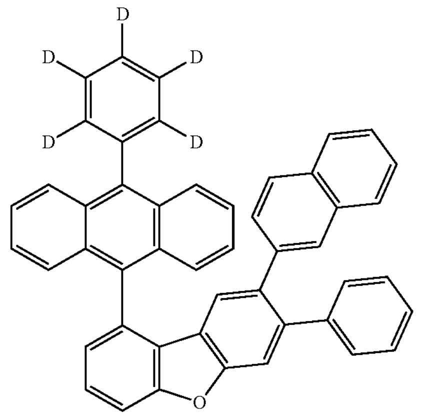
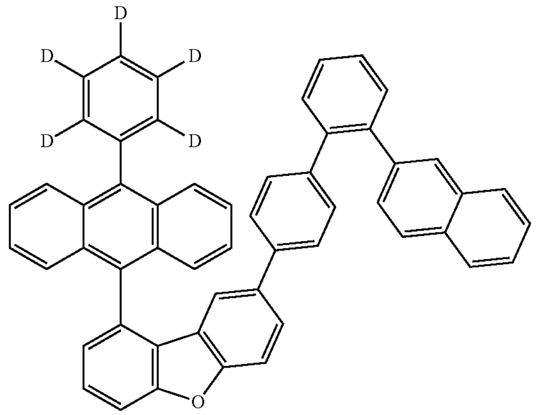
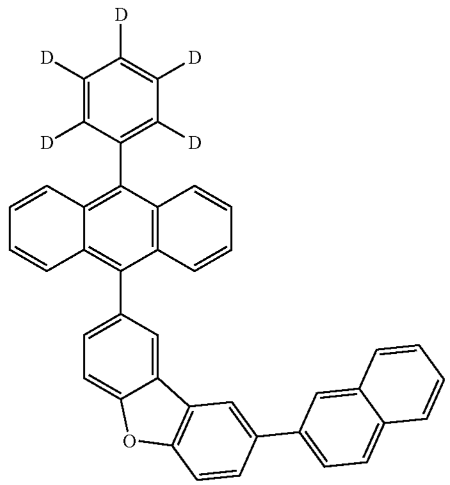
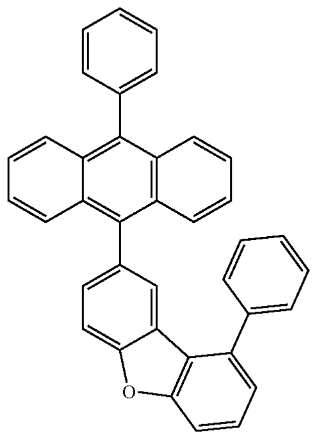

-continued
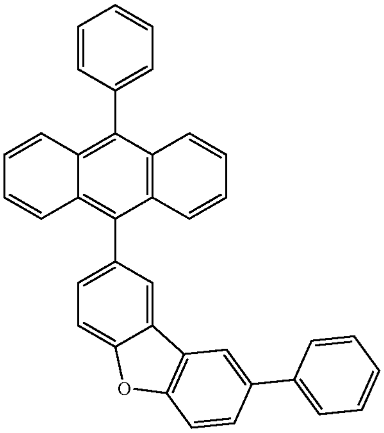
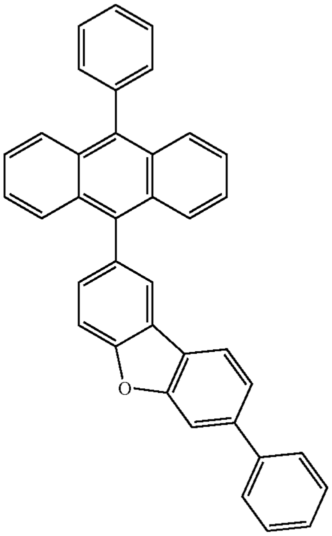
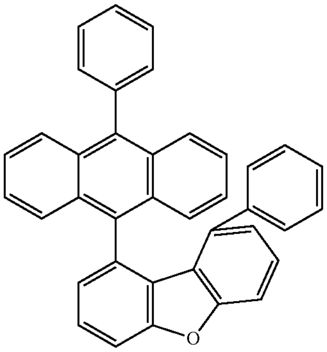
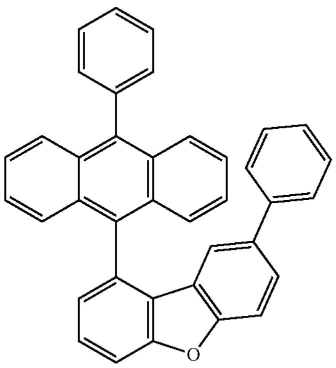
-continued
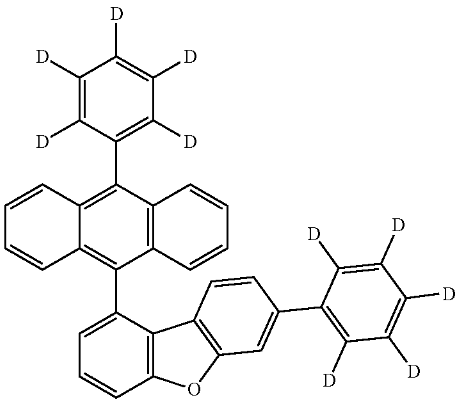
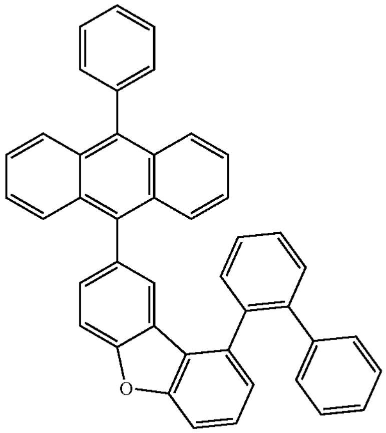
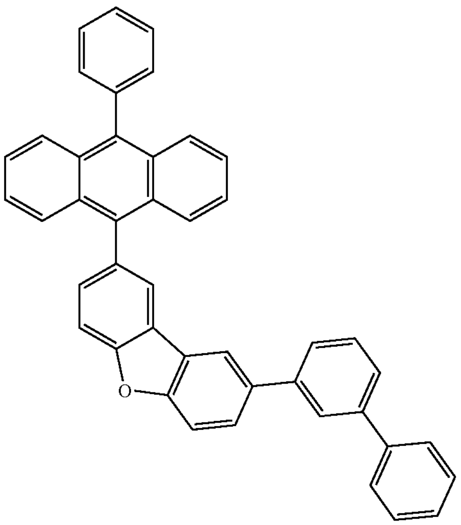

-continued
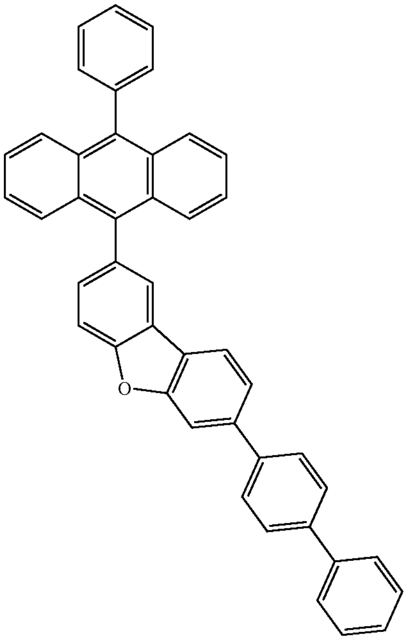
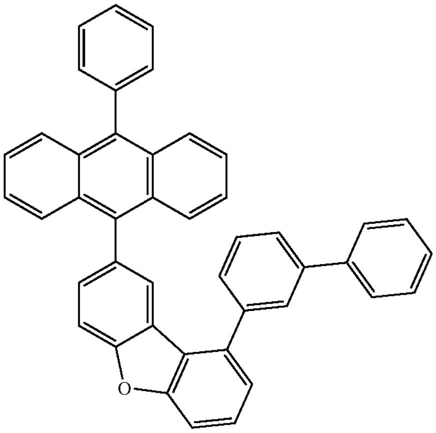
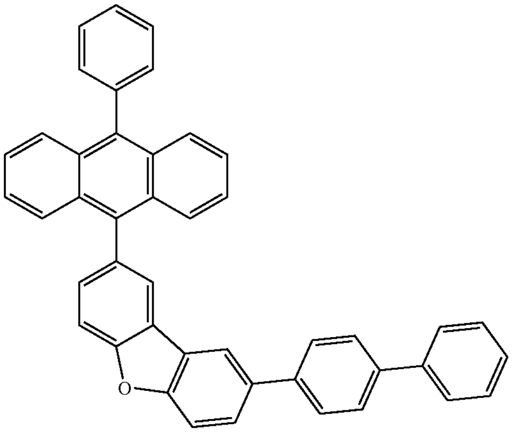
-continued
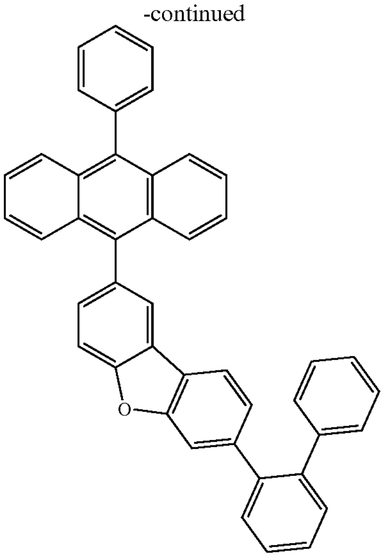
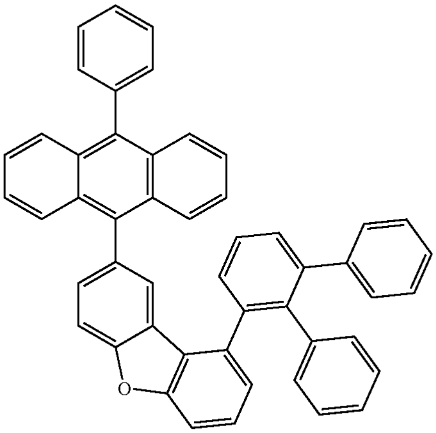
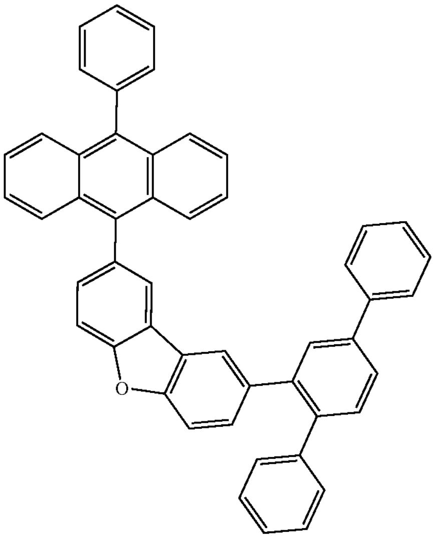

-continued
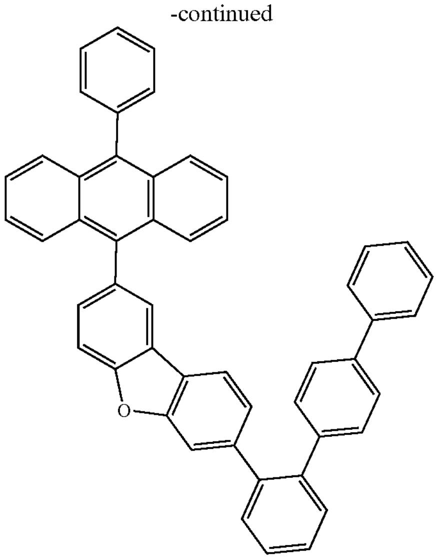
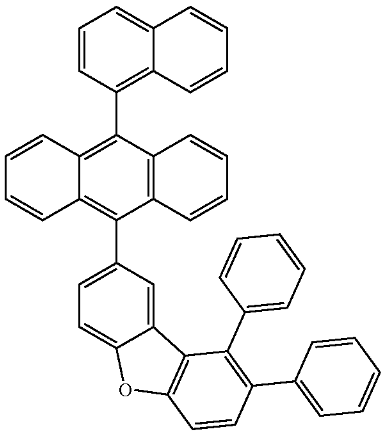
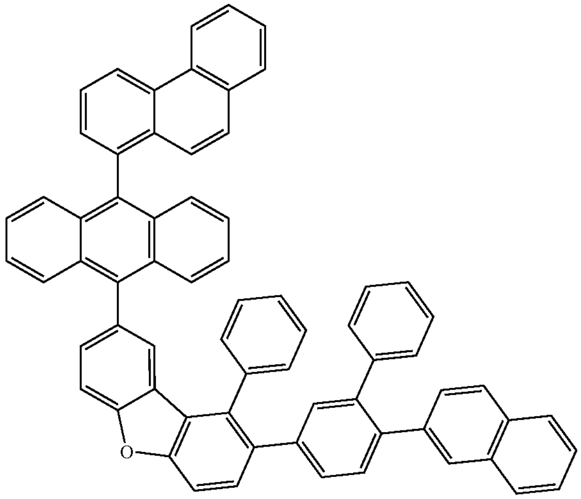
-continued
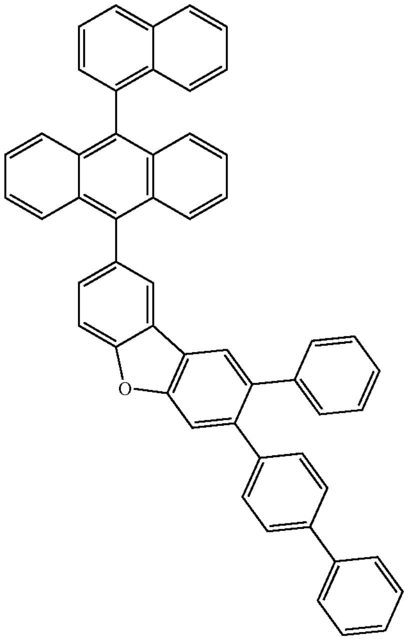
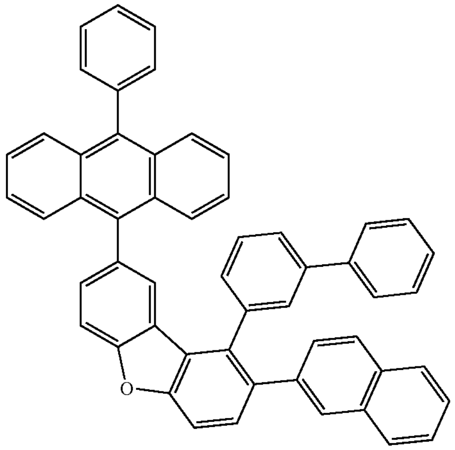
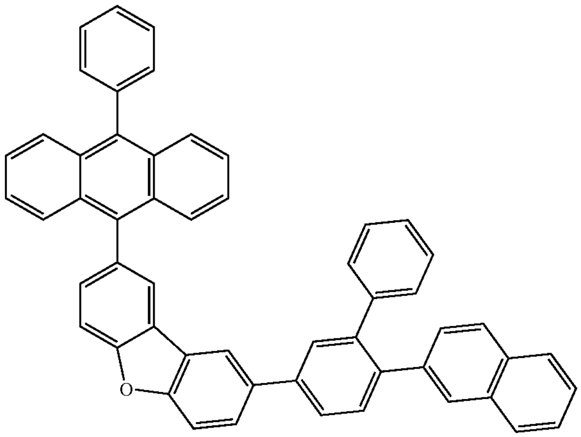

-continued
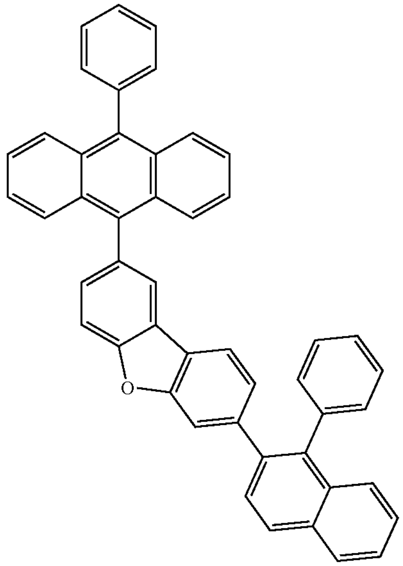
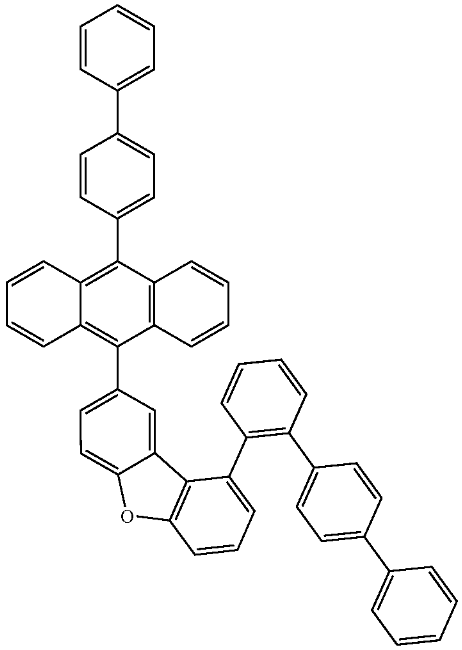
-continued
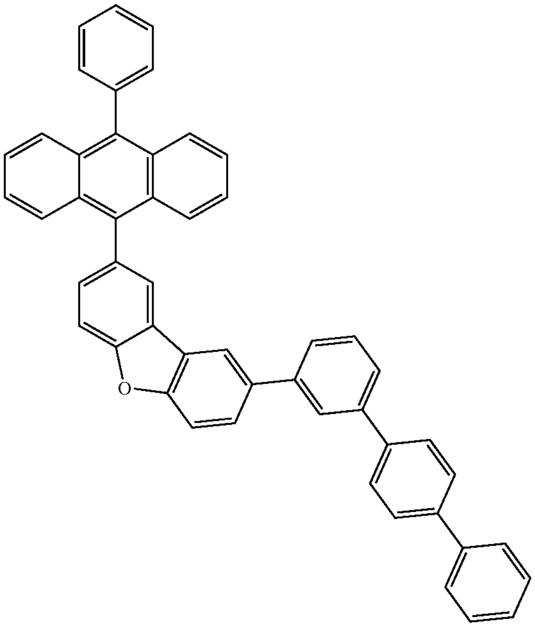
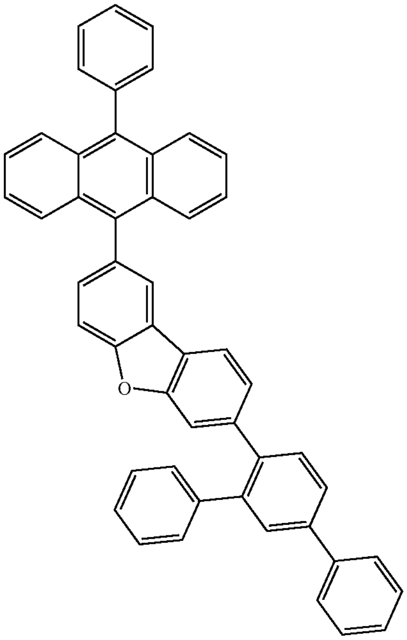
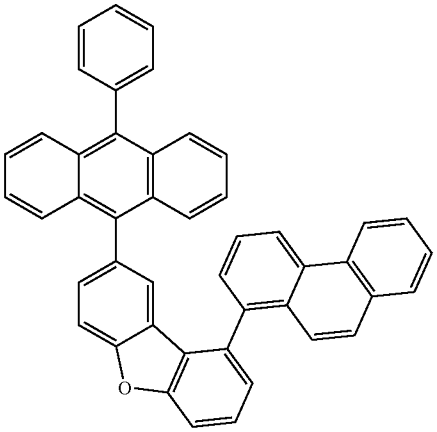

-continued
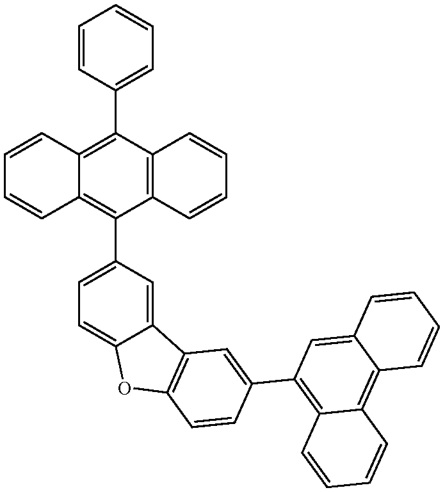
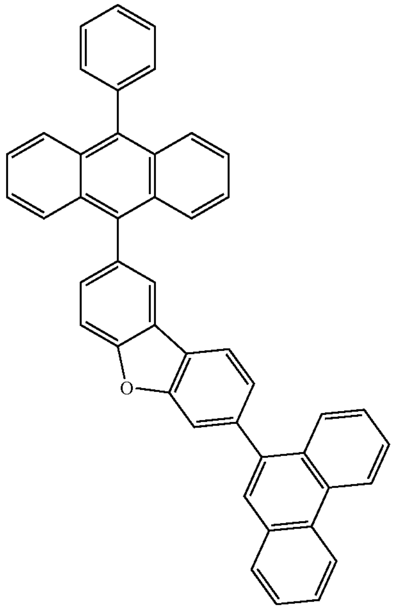
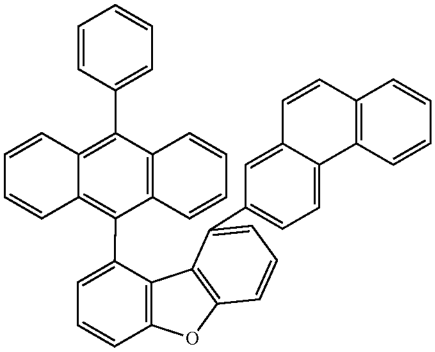
-continued
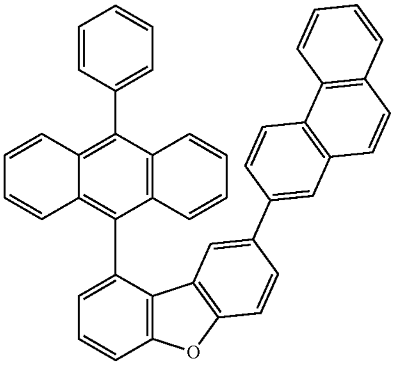
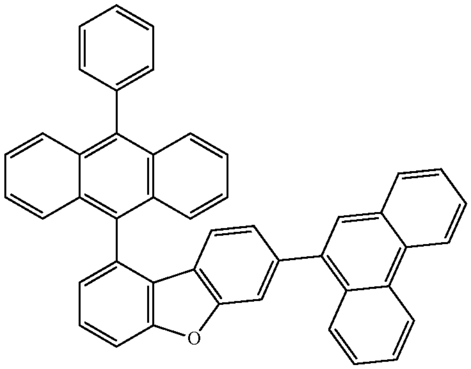
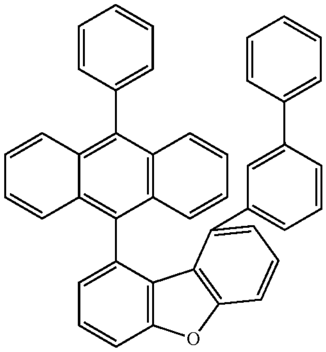
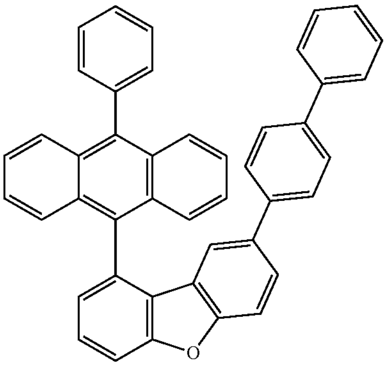

-continued
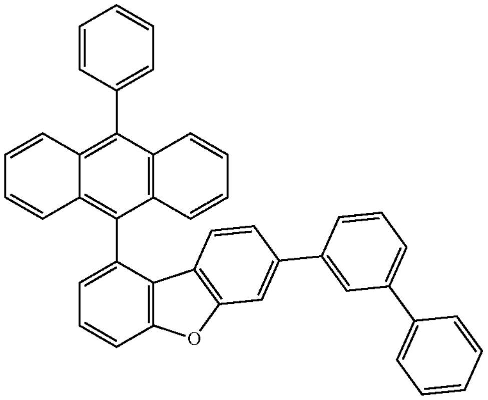
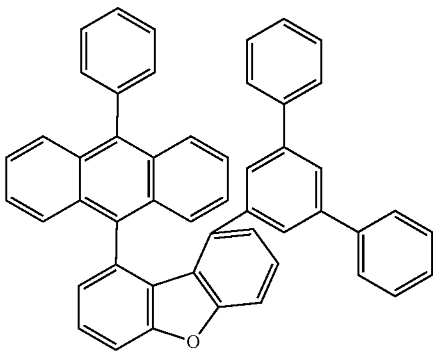
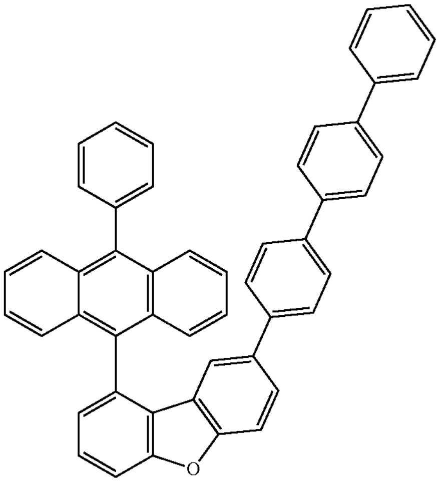
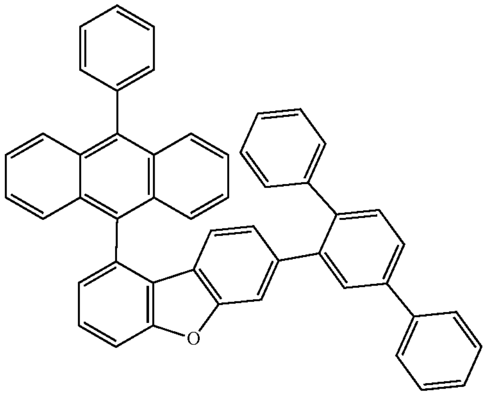
-continued
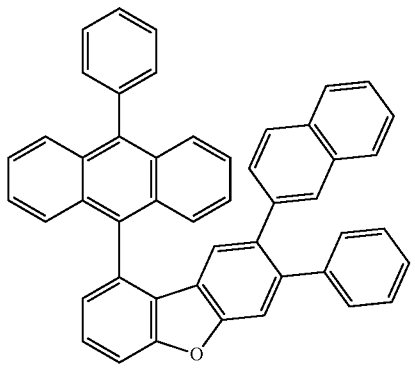
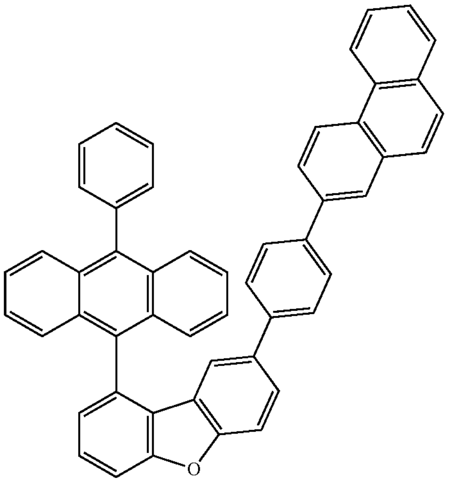
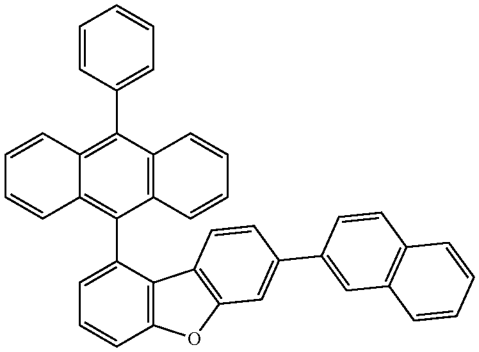
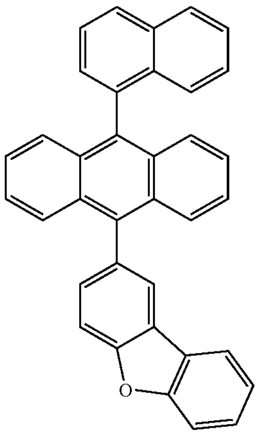

-continued
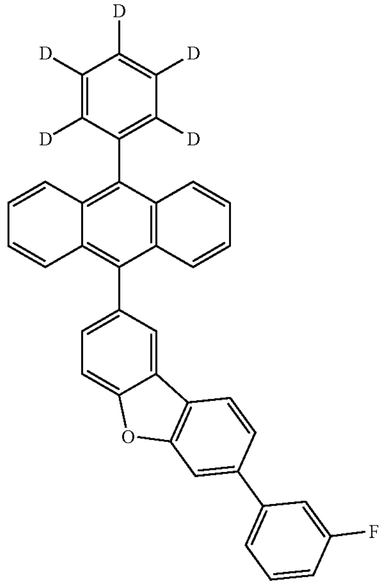
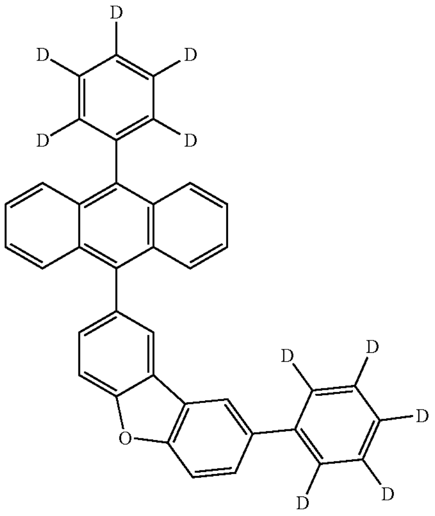
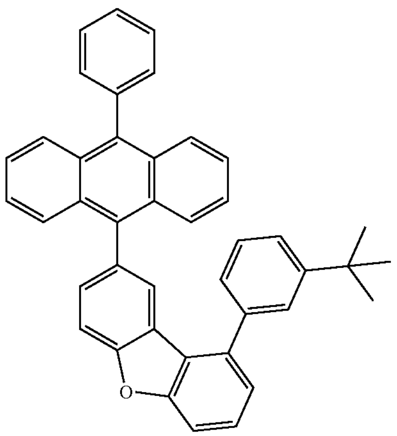
-continued
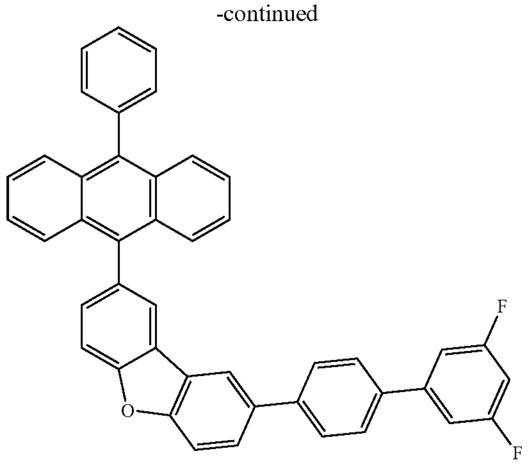
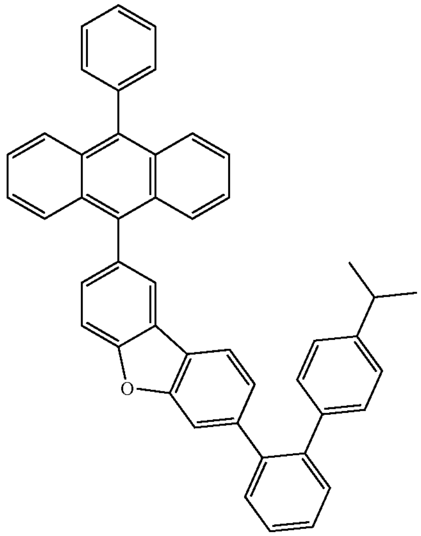
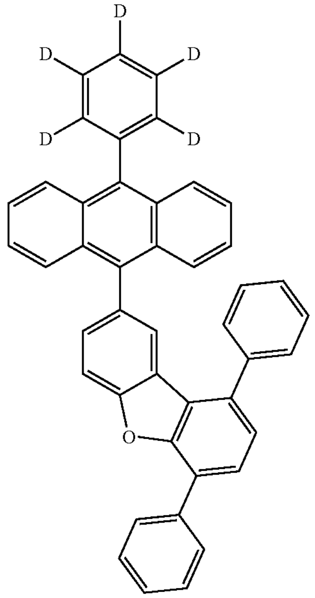

-continued
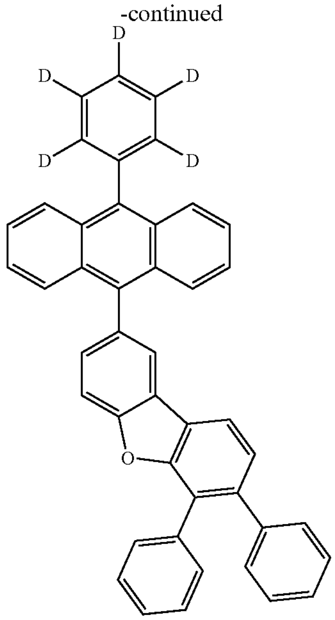
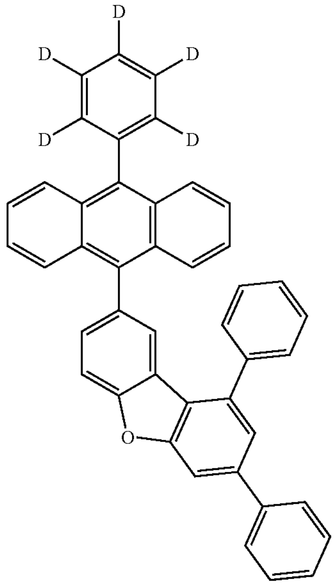
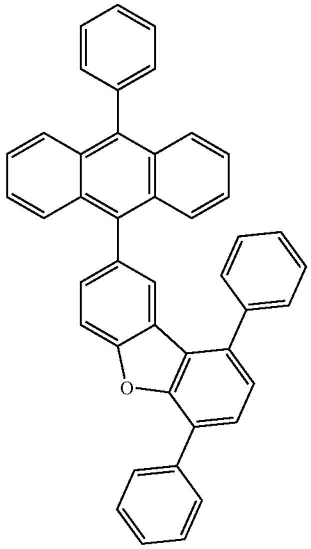
-continued
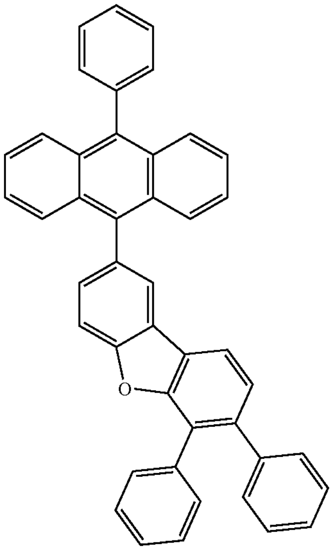
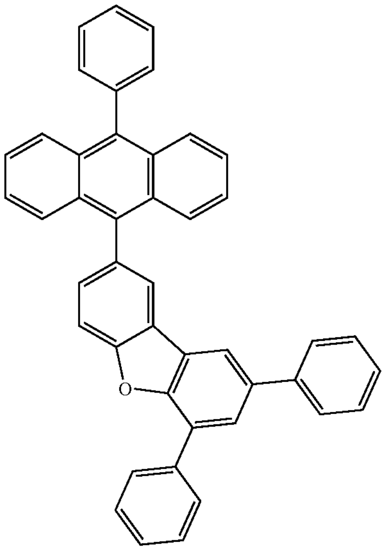
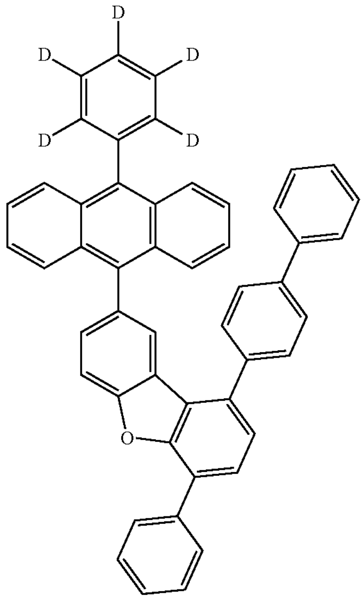

-continued
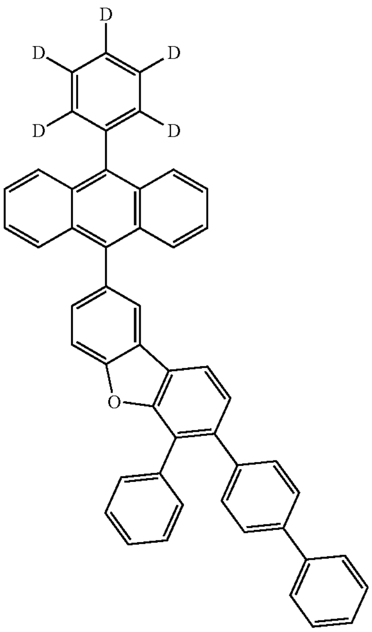
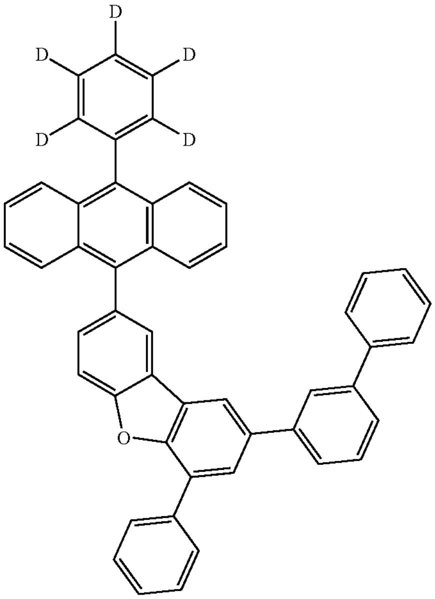
-continued
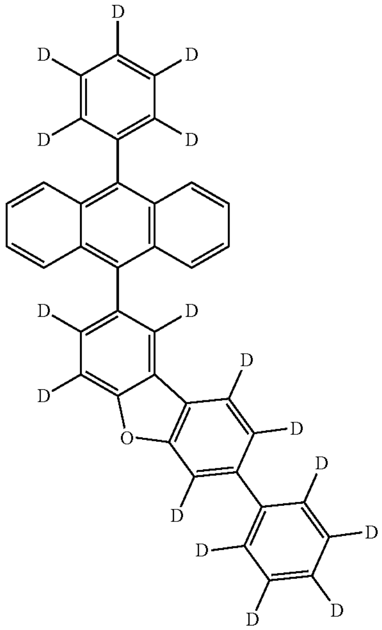
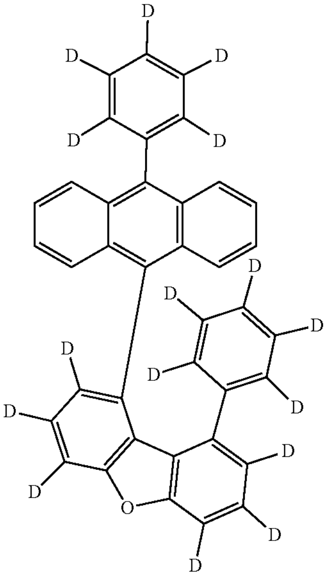

-continued
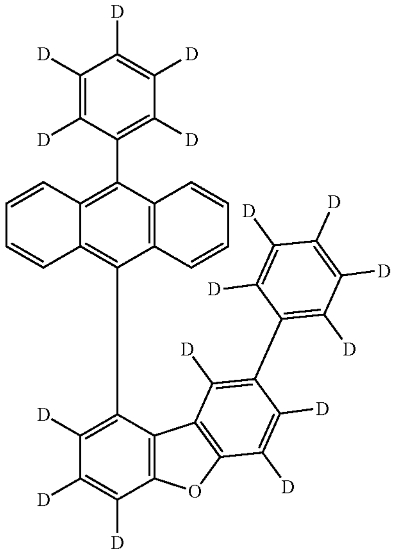
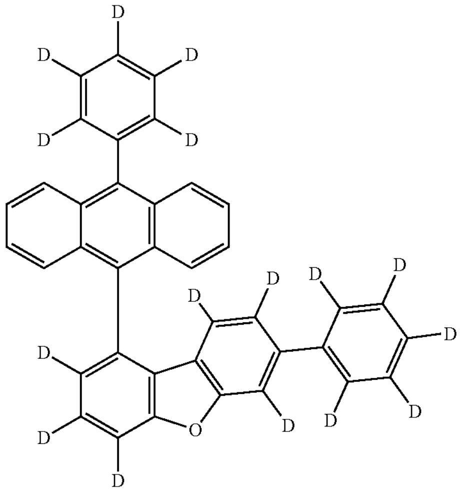
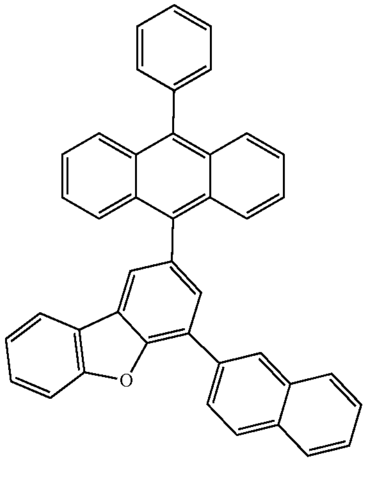
-continued
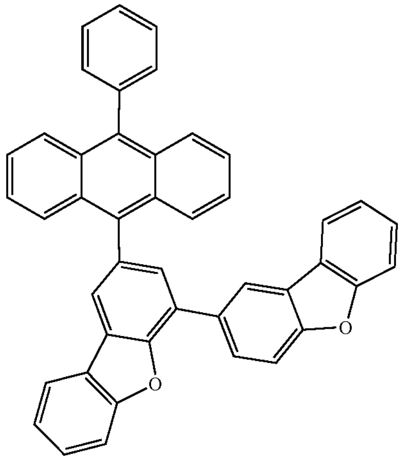
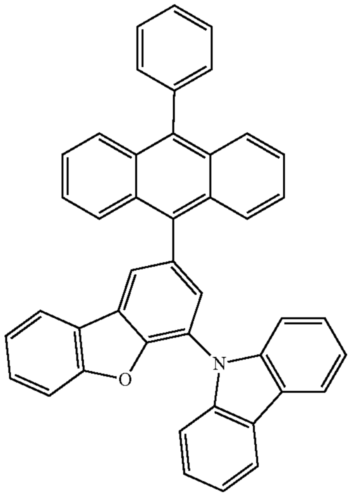
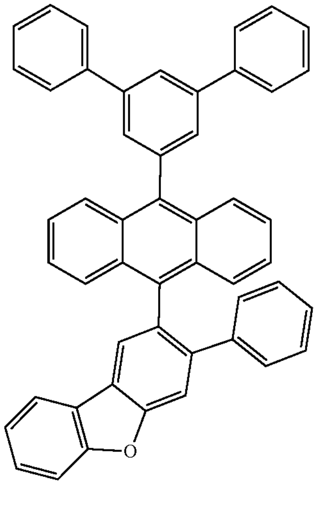

-continued
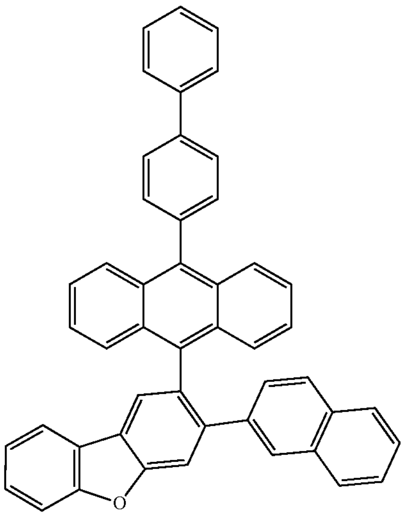
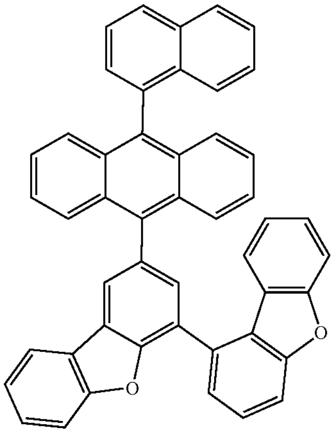
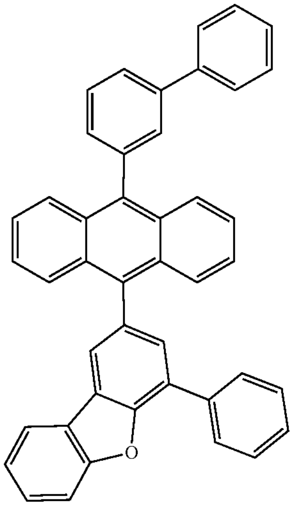
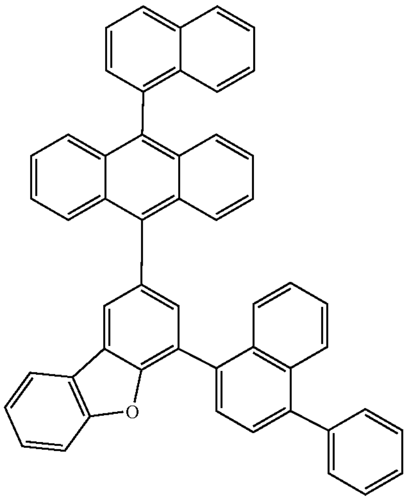
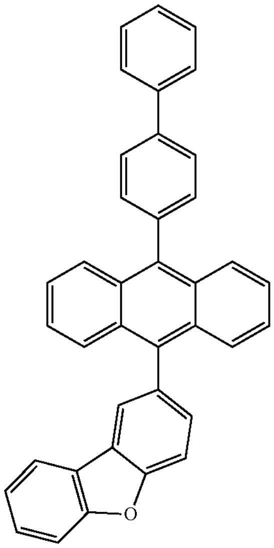
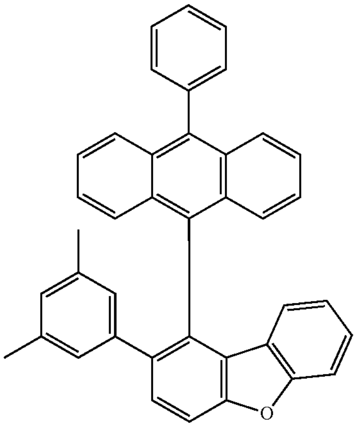
, -continued
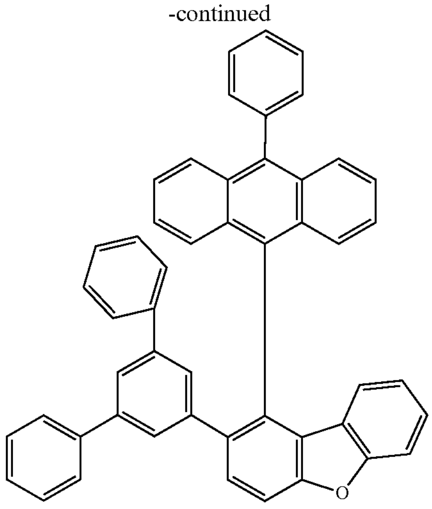
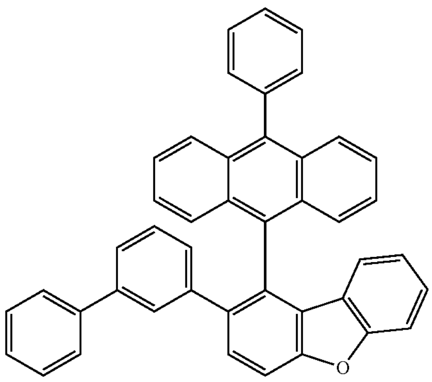
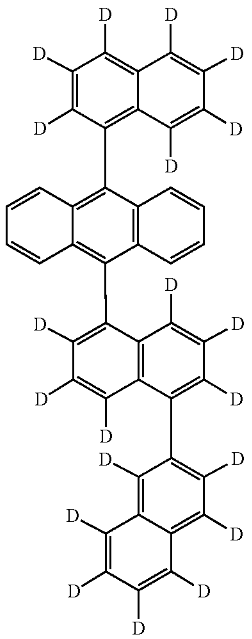
-continued
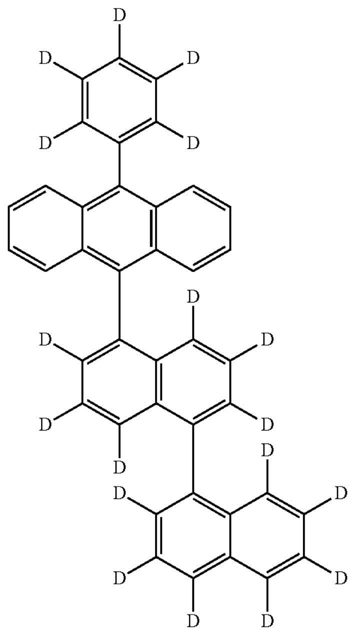
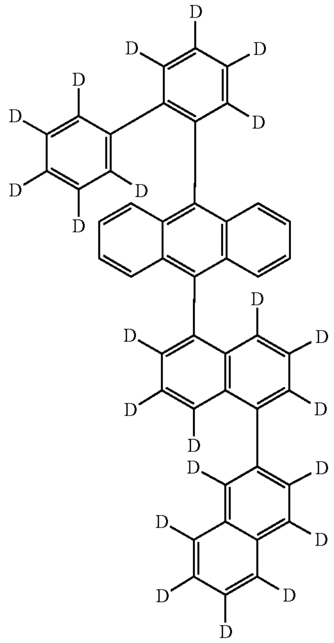

-continued
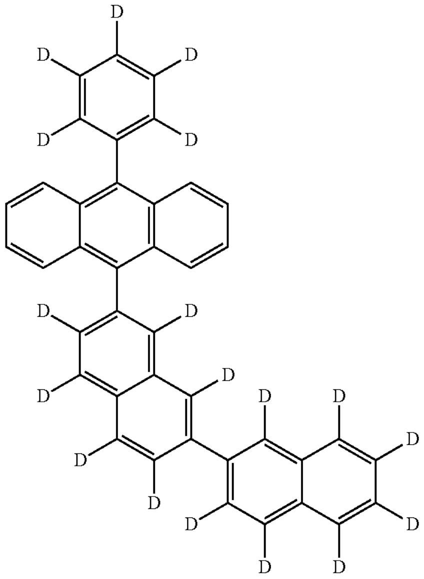
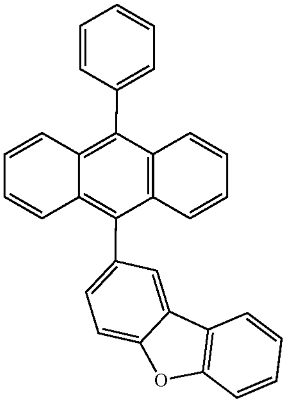
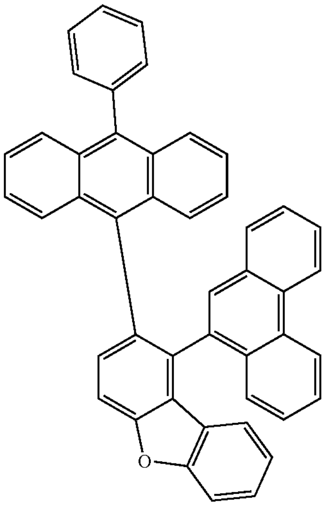
-continued
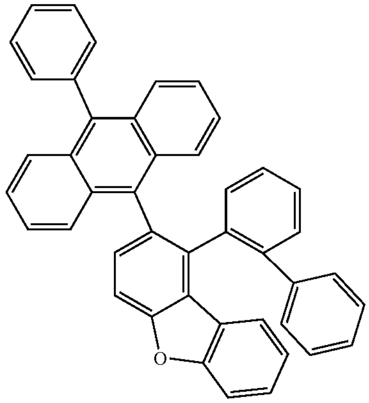
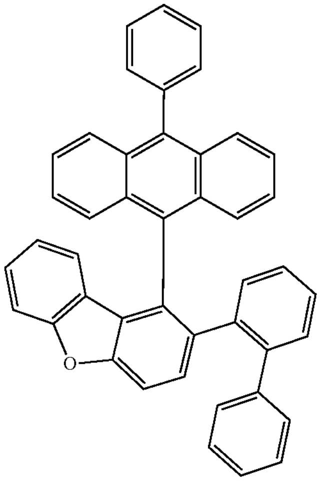
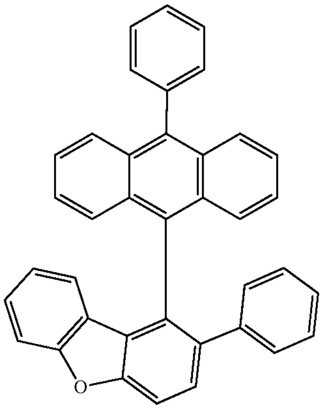
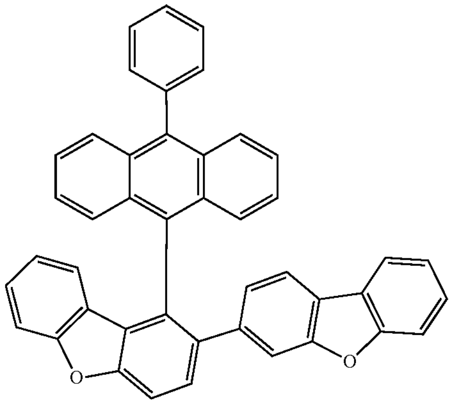

-continued
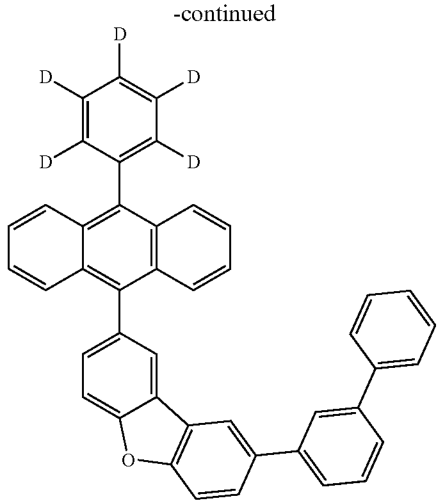
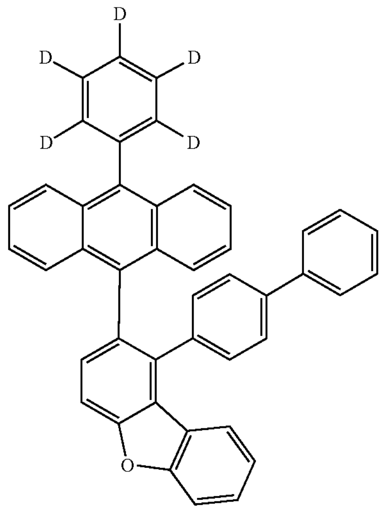
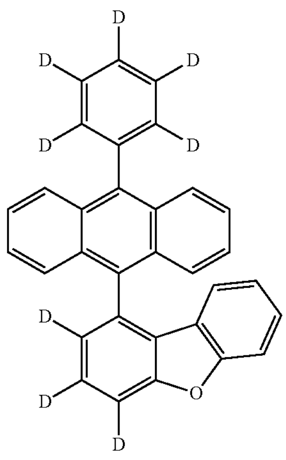
-continued
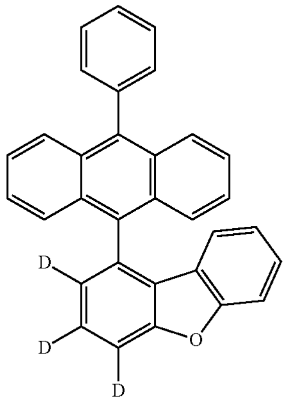
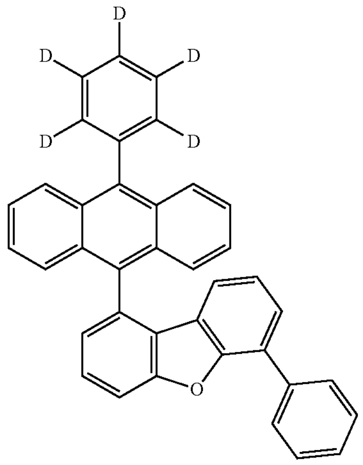
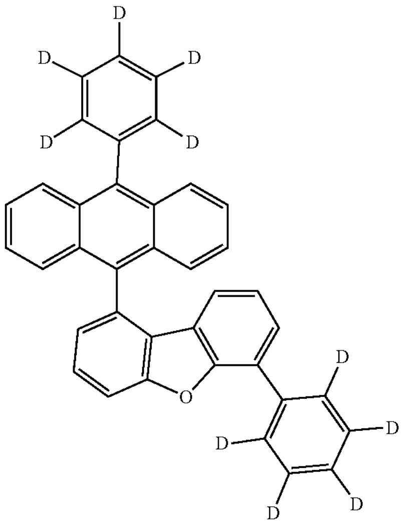

-continued
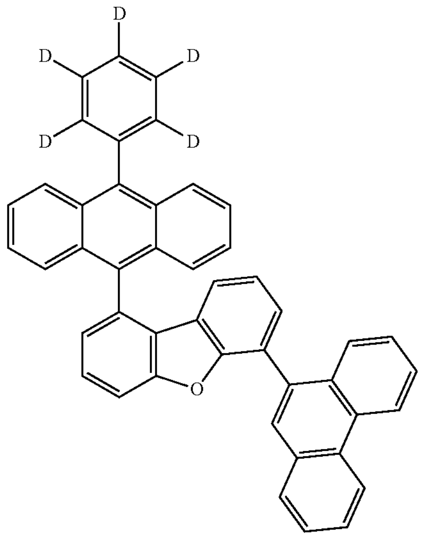
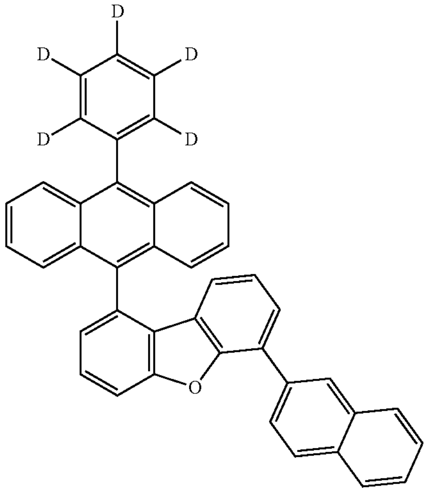
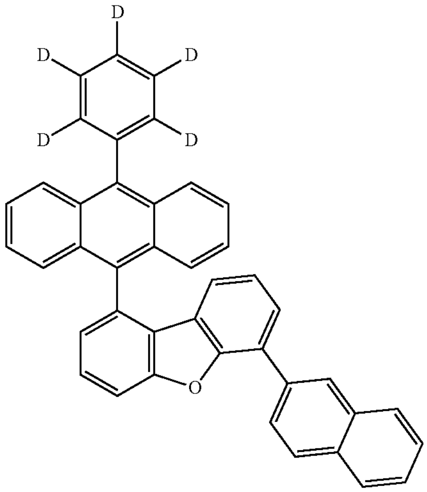
-continued
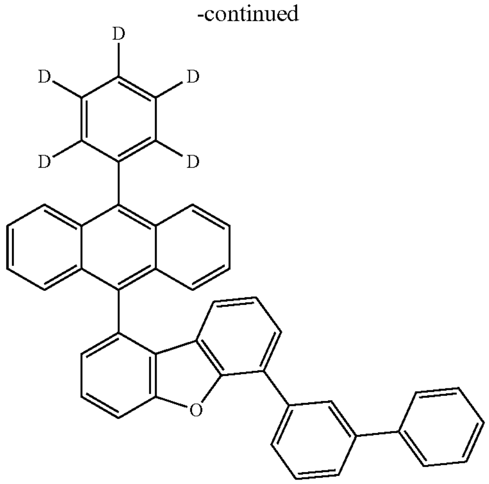
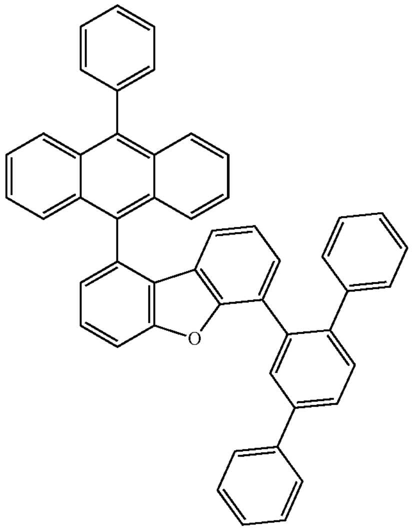
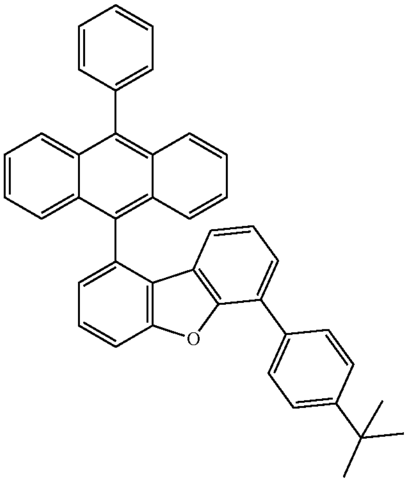

-continued
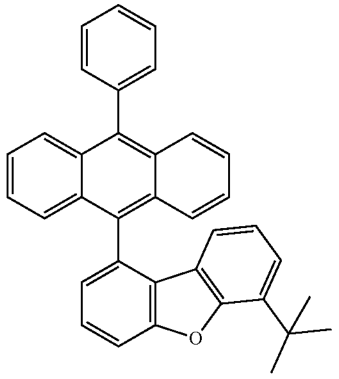
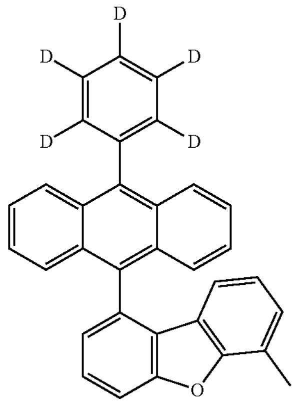
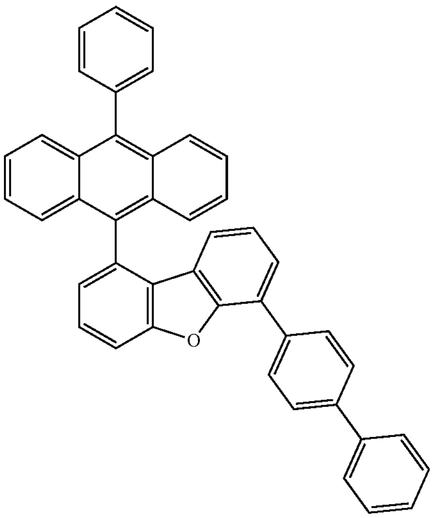
-continued
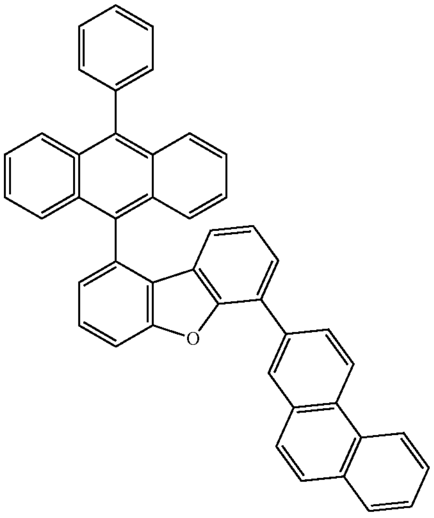
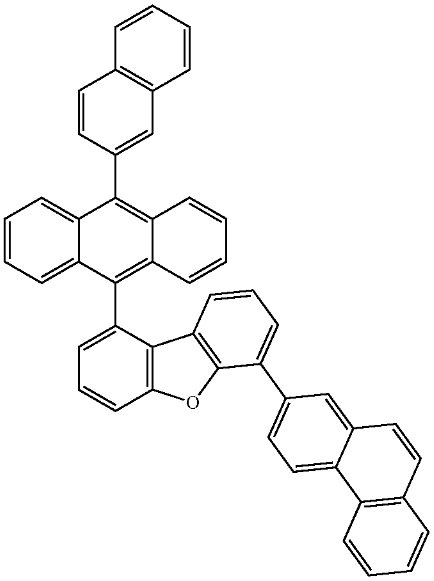
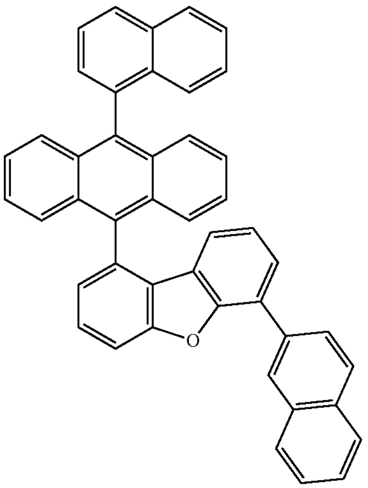

-continued
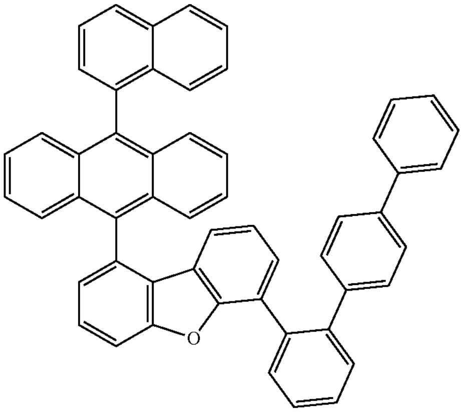
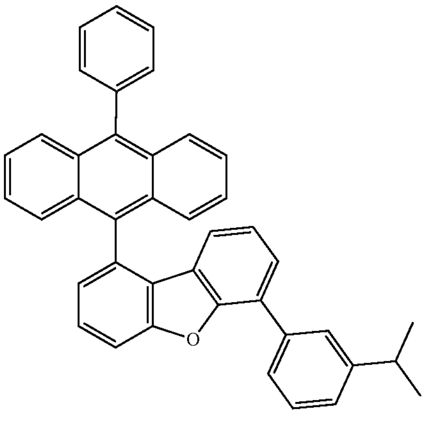
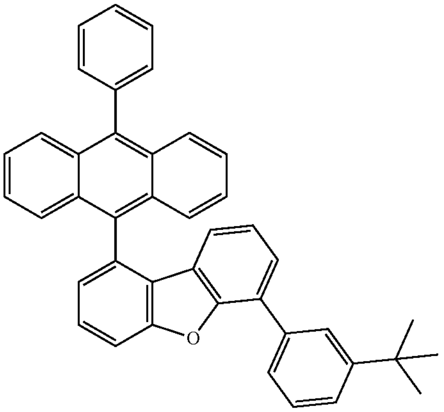
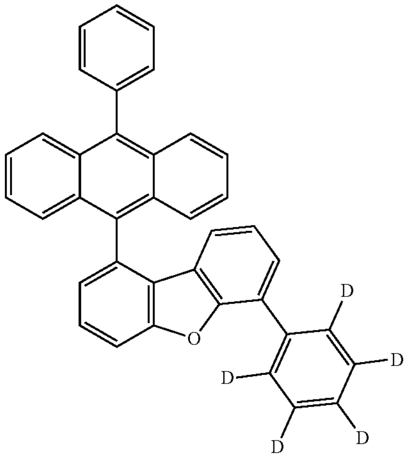
-continued
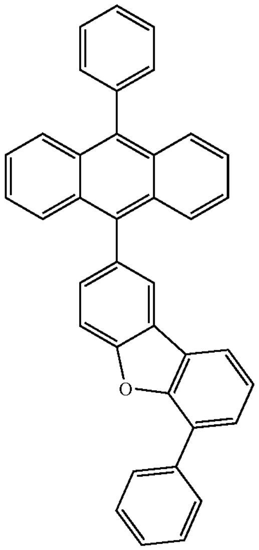
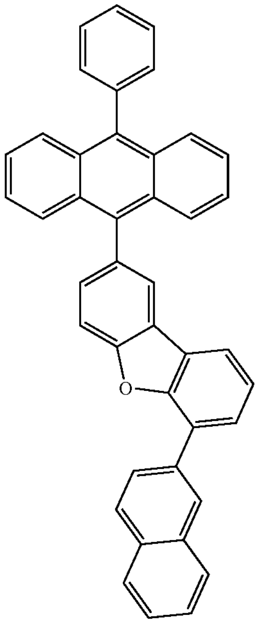

-continued
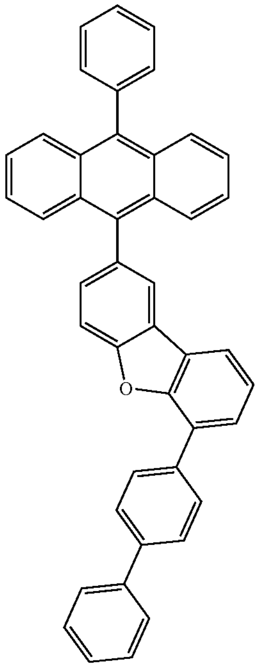
-continued
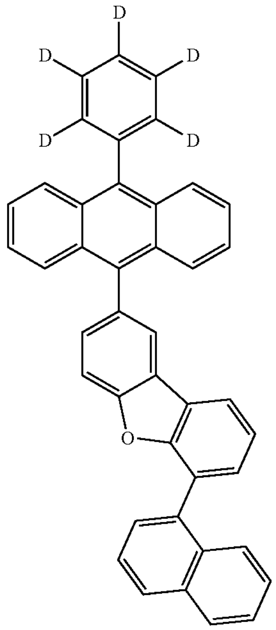
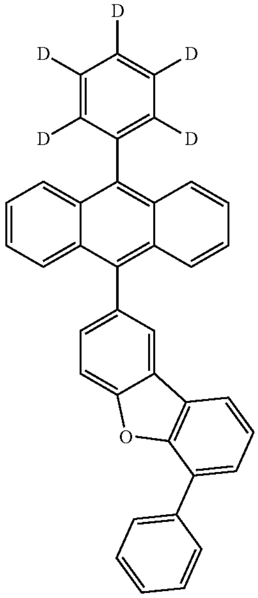
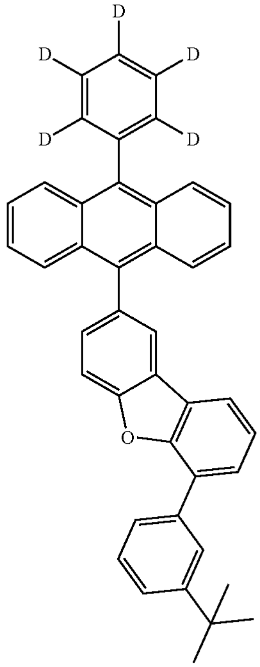

-continued
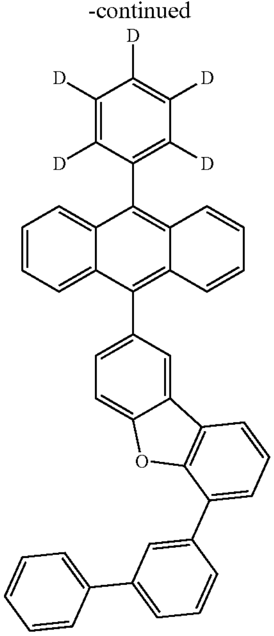
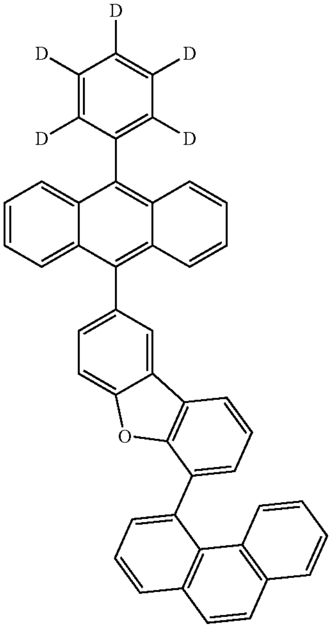
-continued
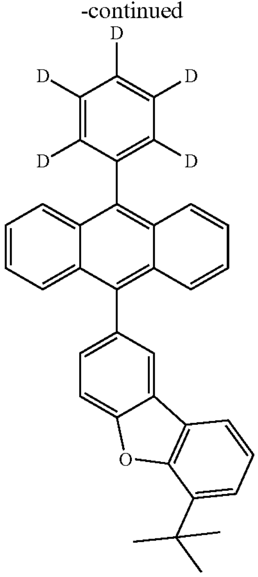
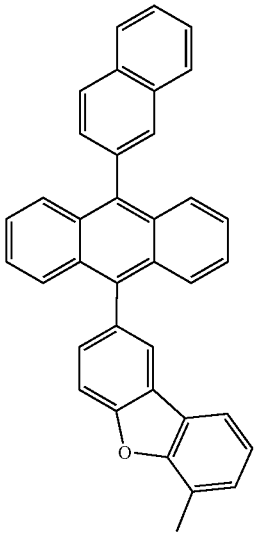
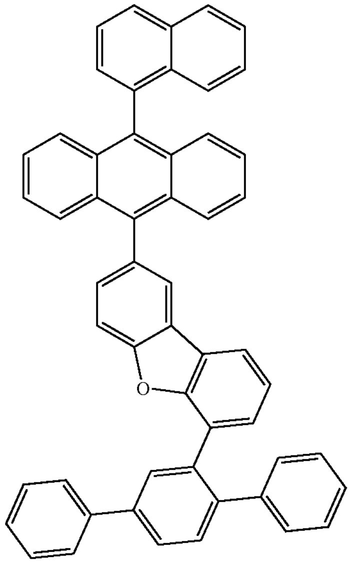

-continued
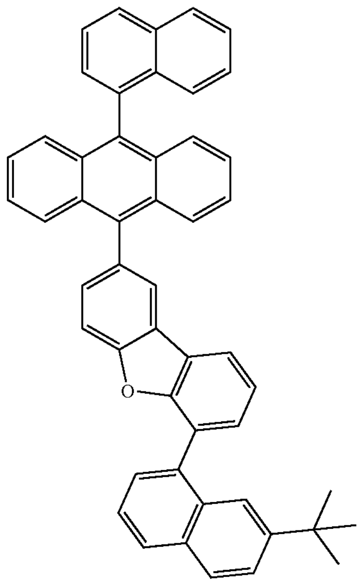
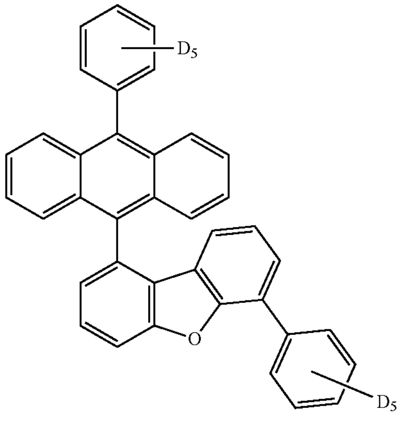
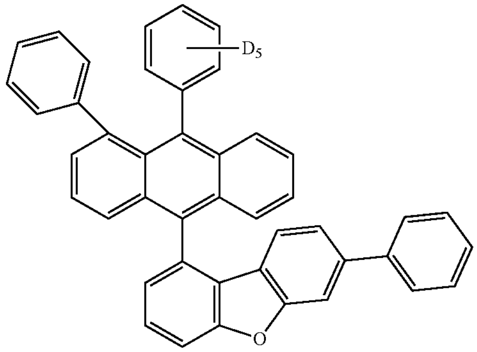
-continued
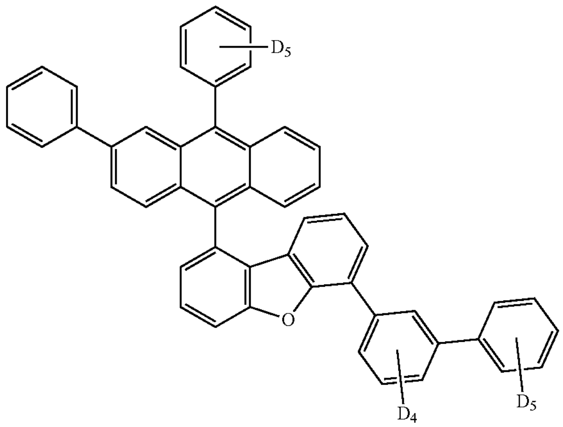
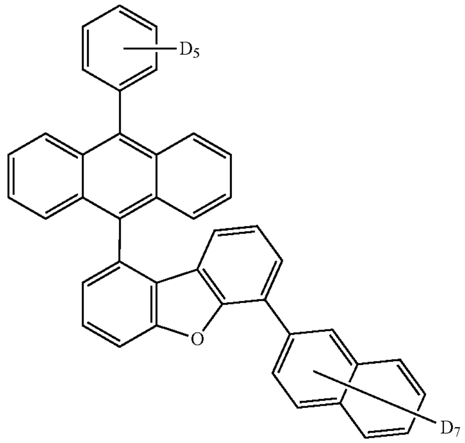
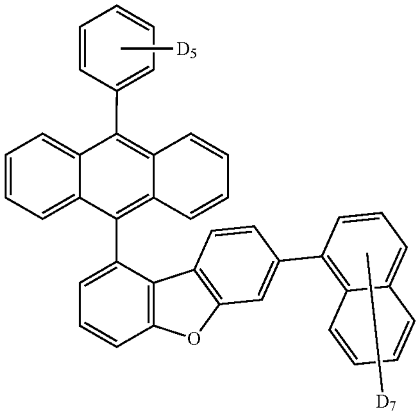
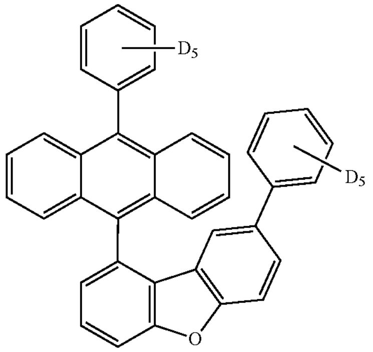

-continued
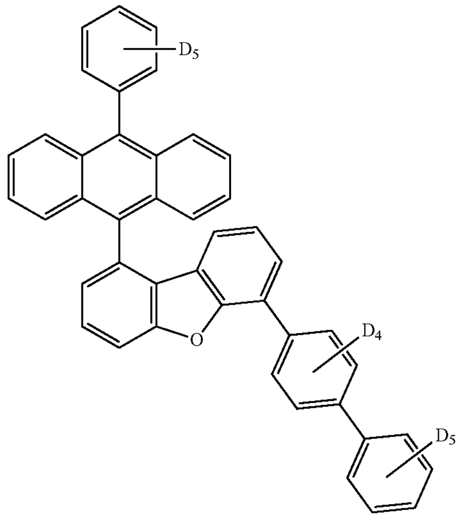
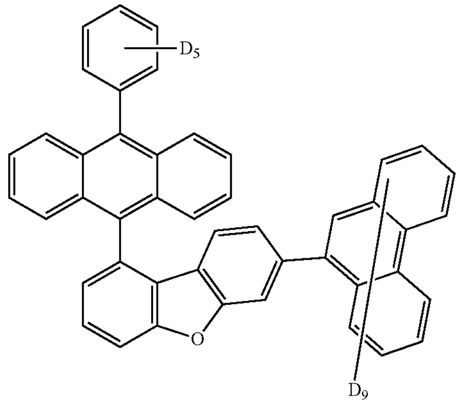
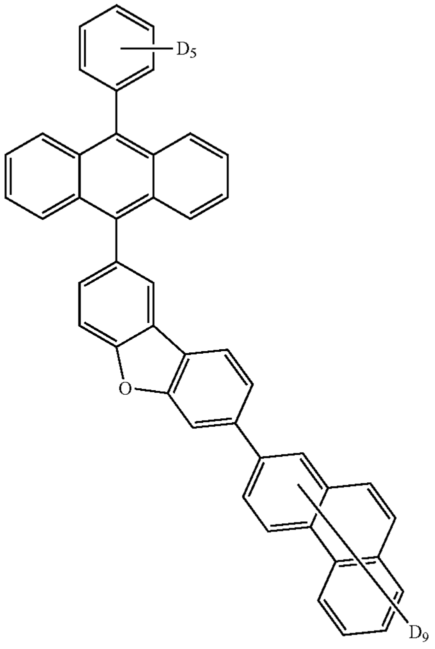
-continued
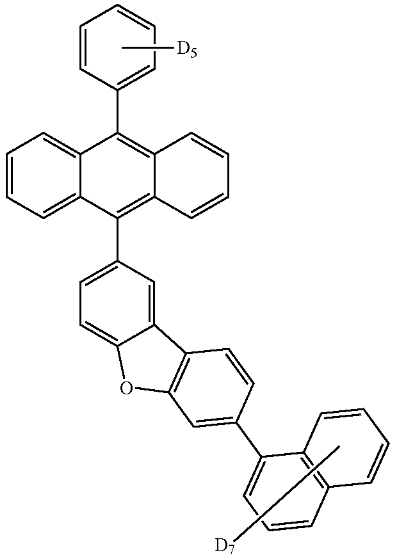
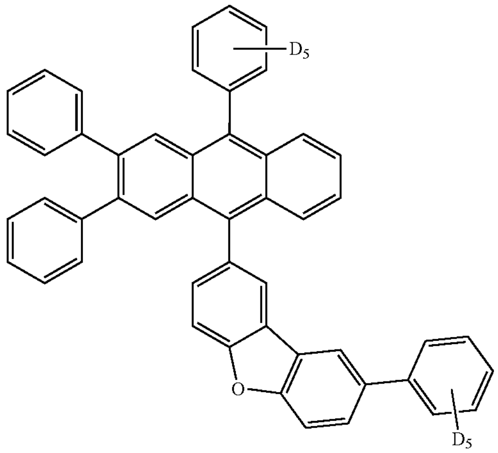
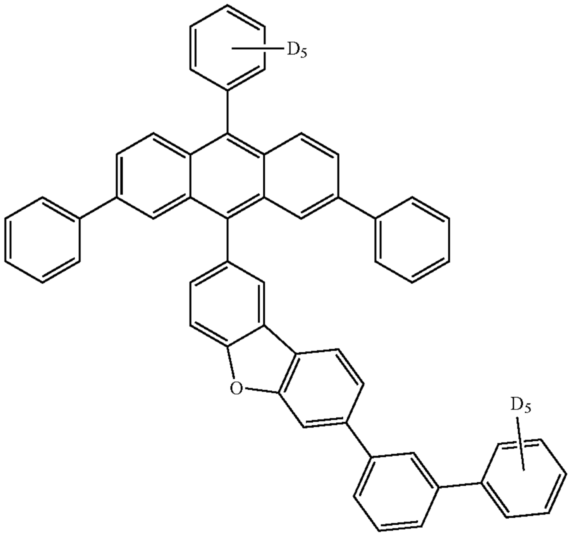

-continued
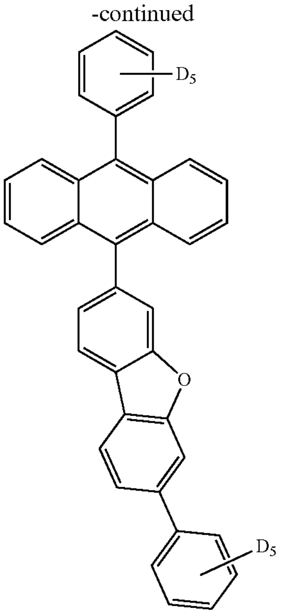
-continued
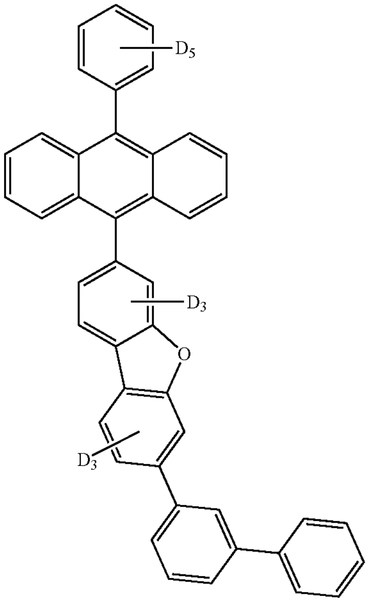
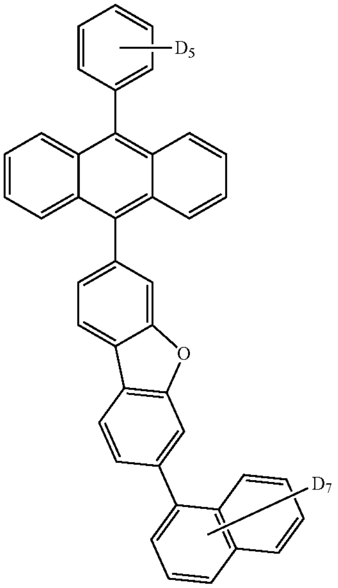
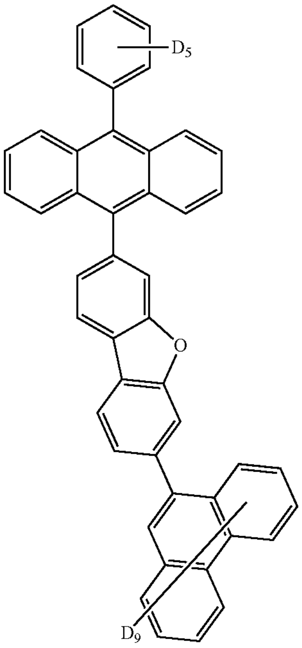

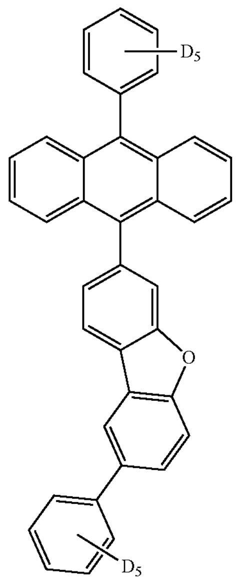
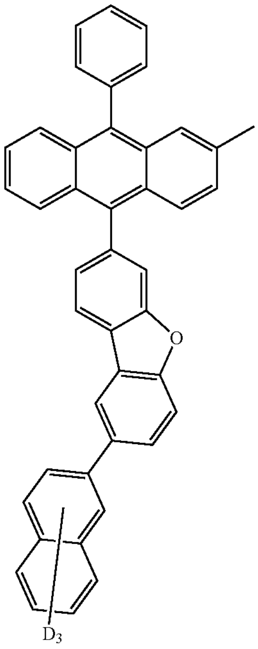
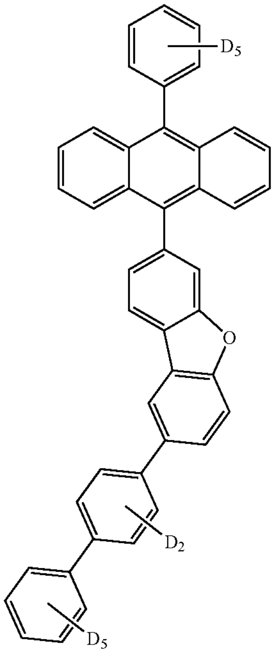
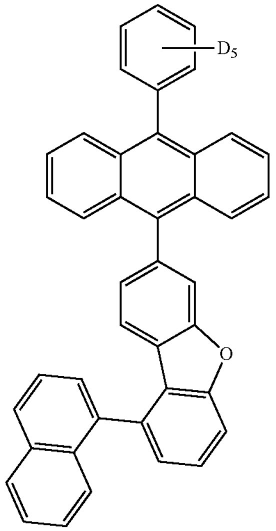
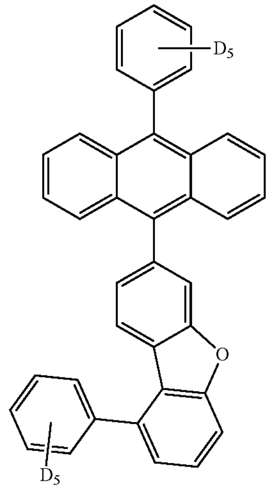

-continued
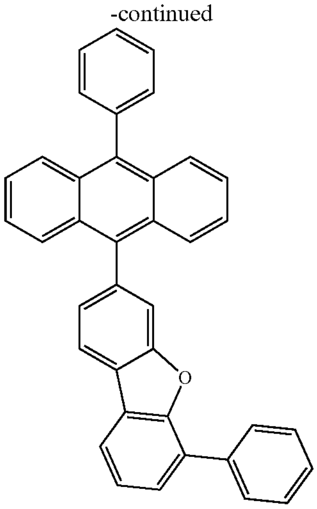
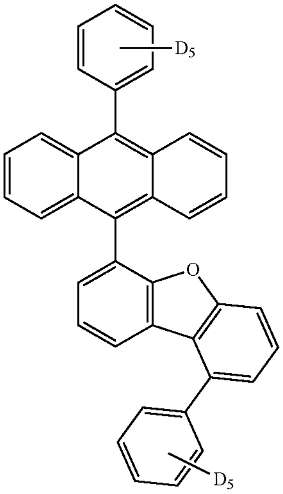
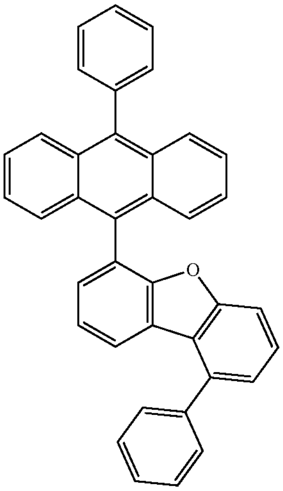
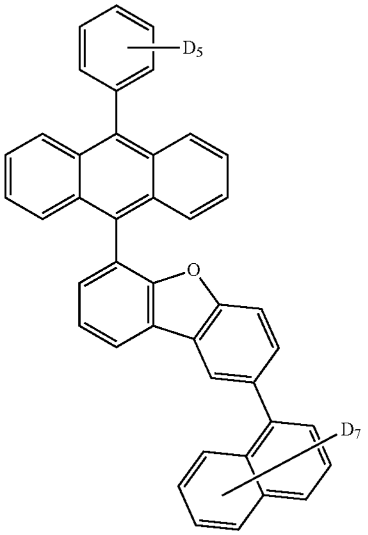
-continued
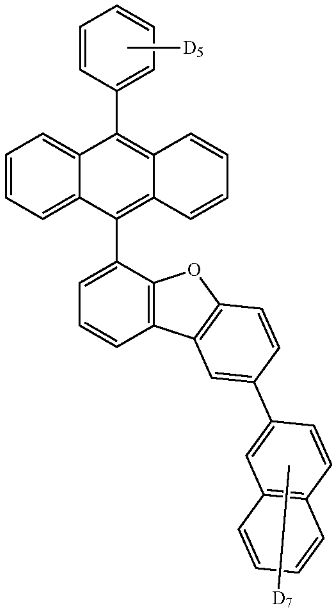

-continued
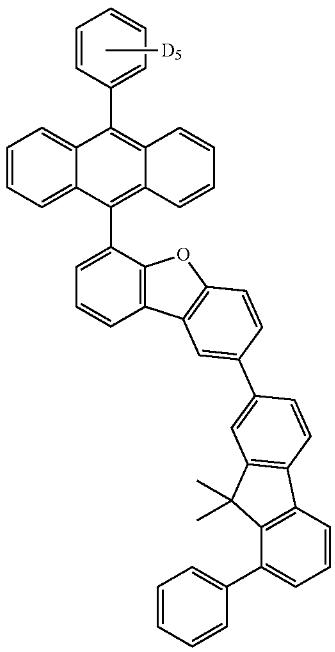
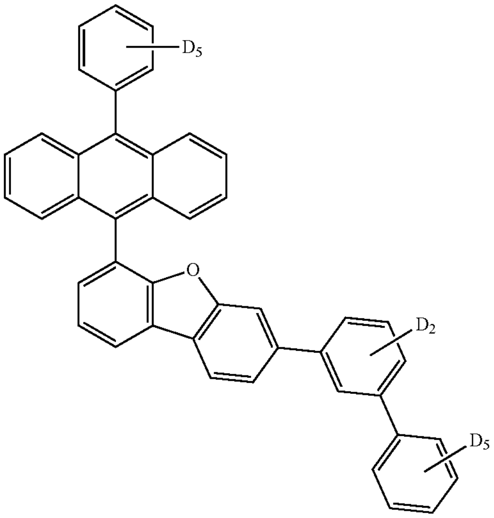
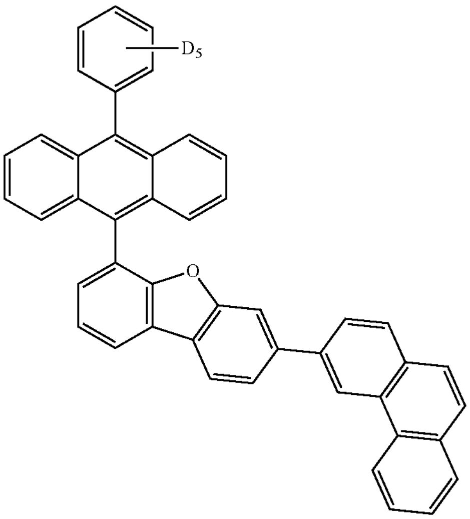
-continued
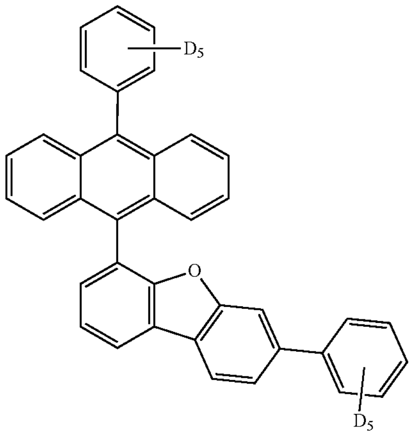
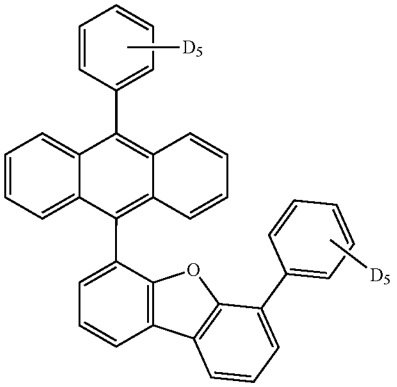
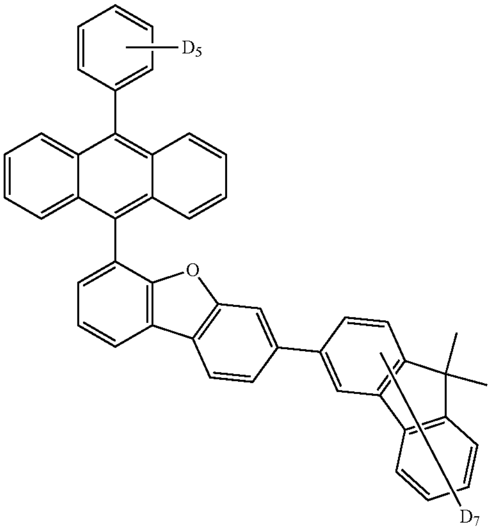

-continued
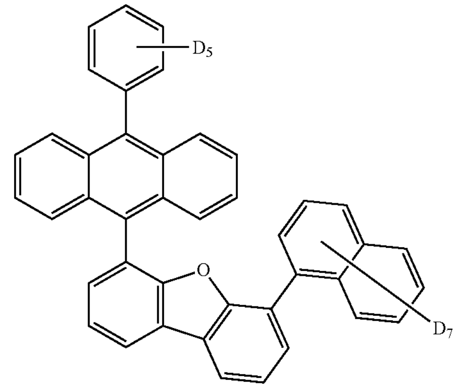
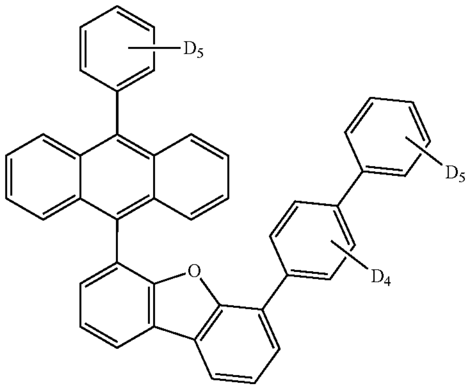
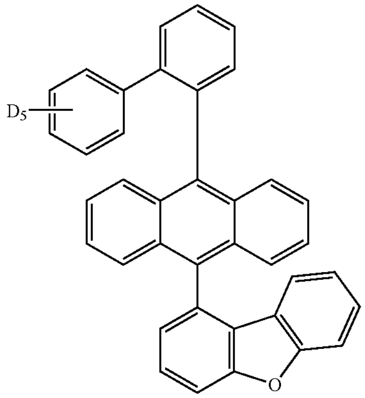
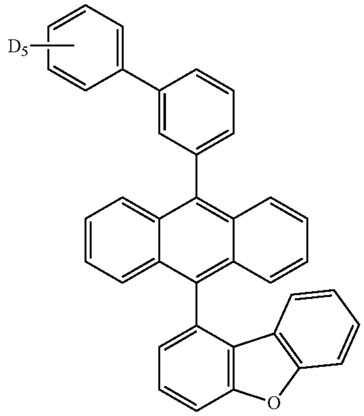
-continued
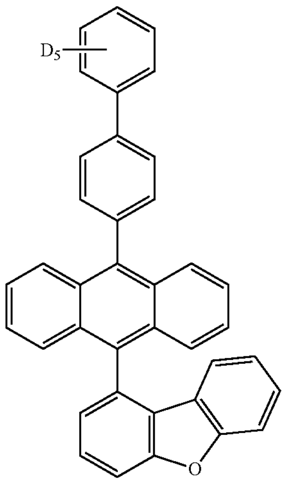
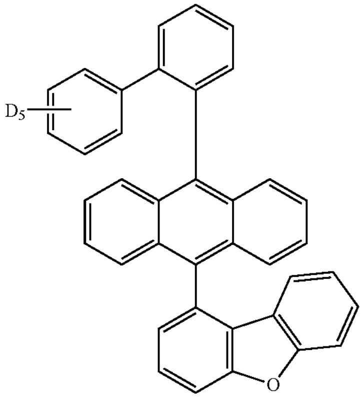
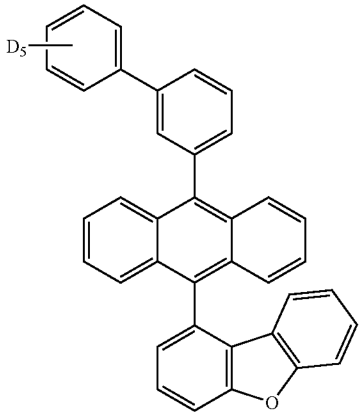

-continued
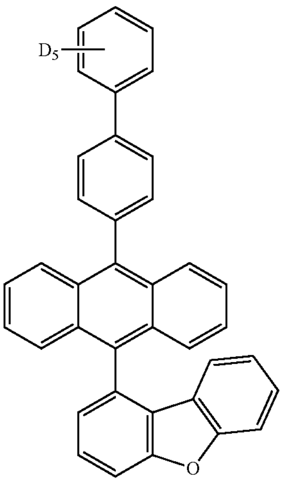
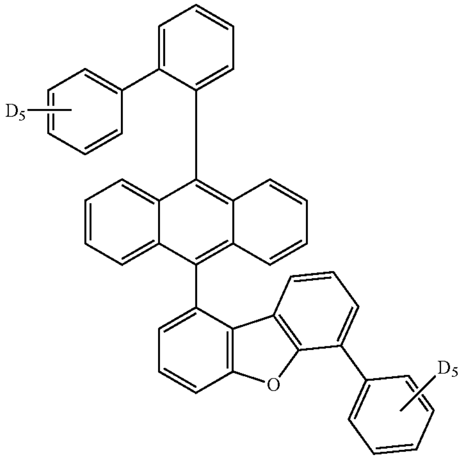
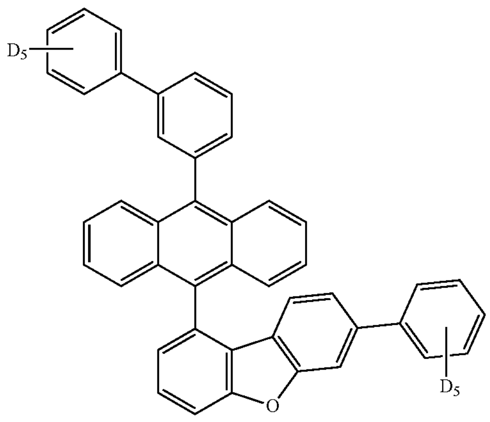
-continued
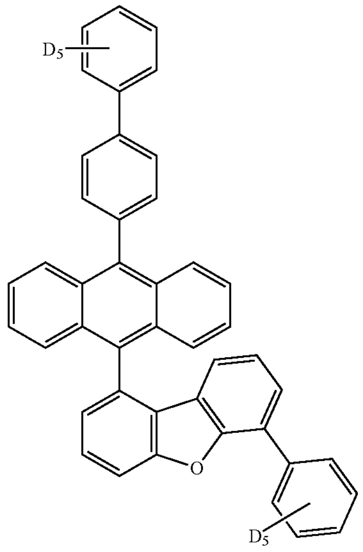
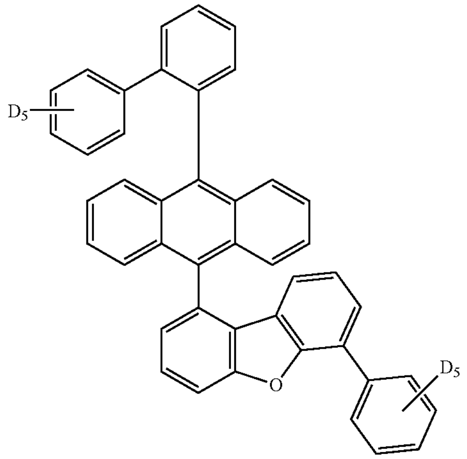
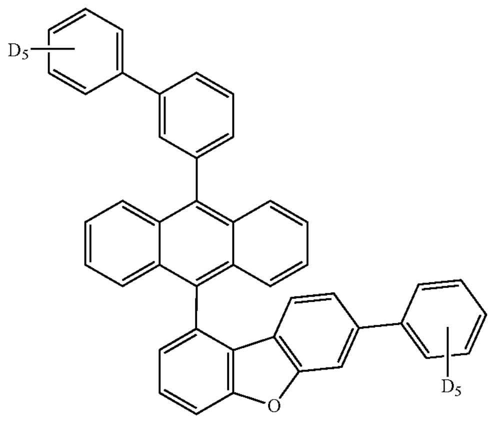

-continued
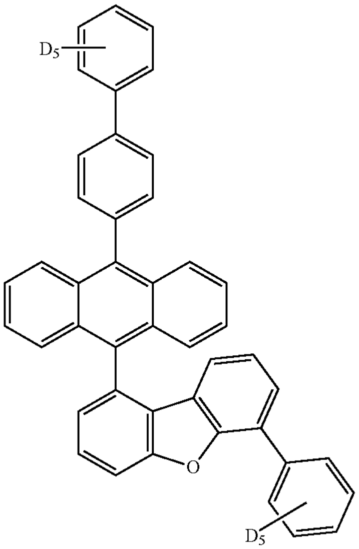
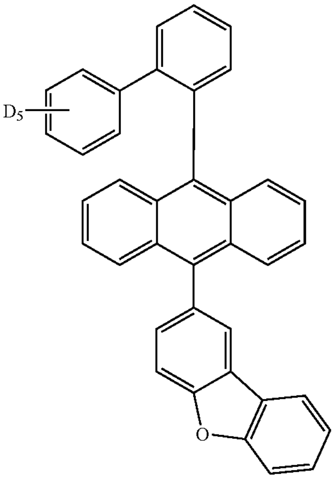
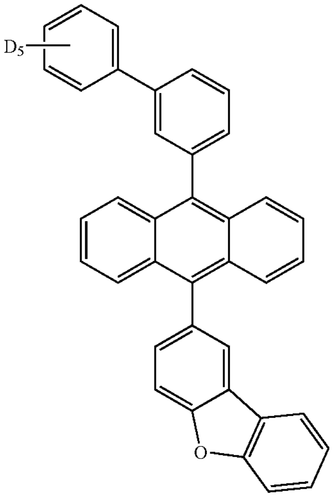
-continued
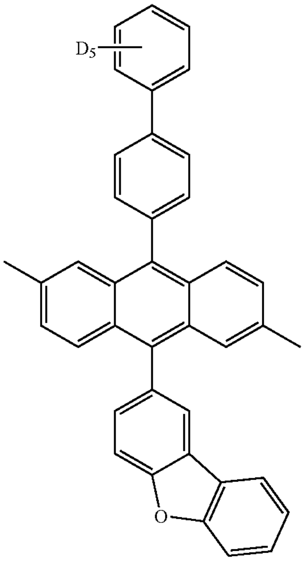
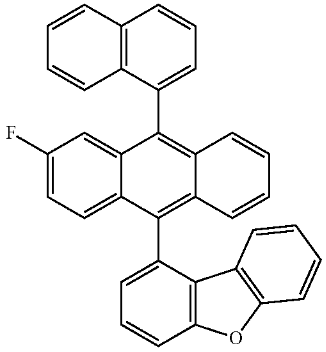
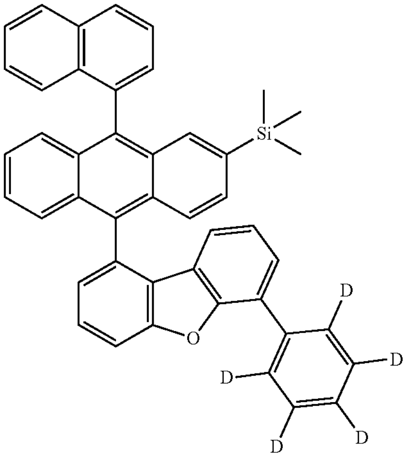
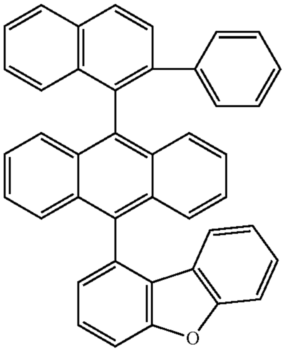

-continued
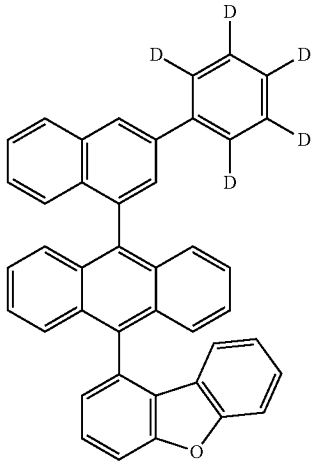
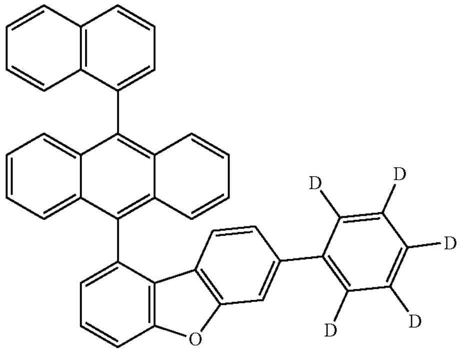
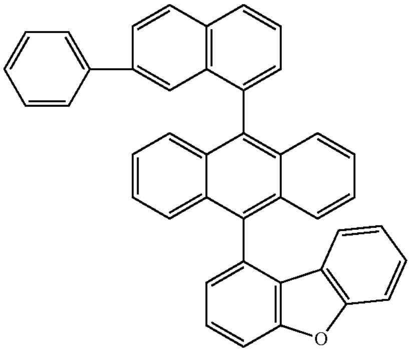
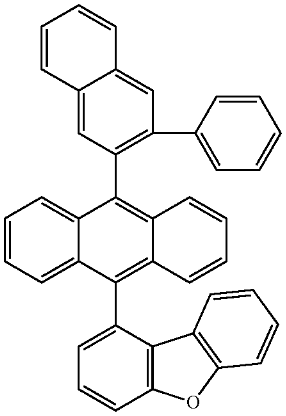
-continued
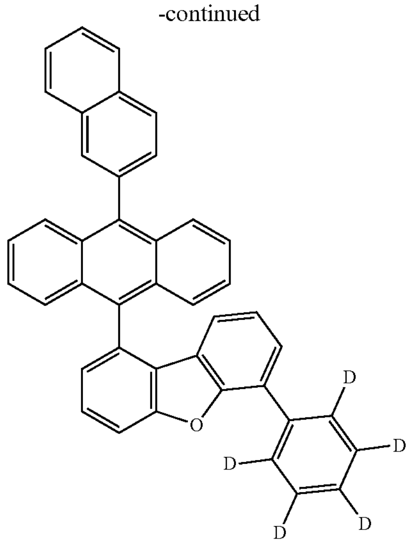
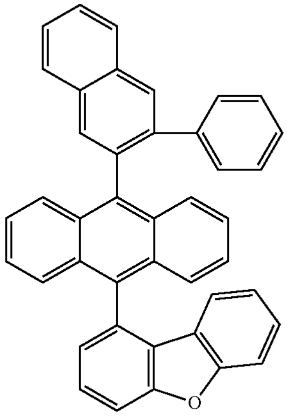
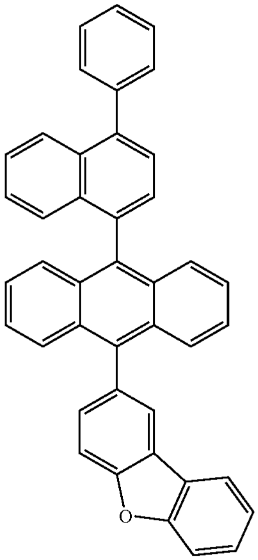

-continued
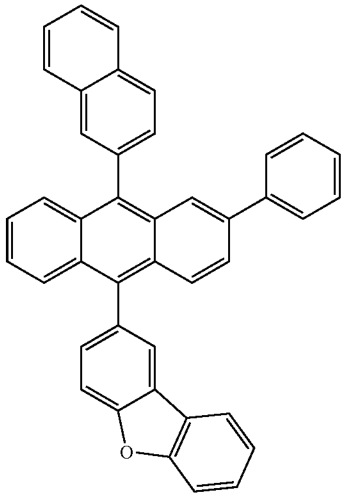
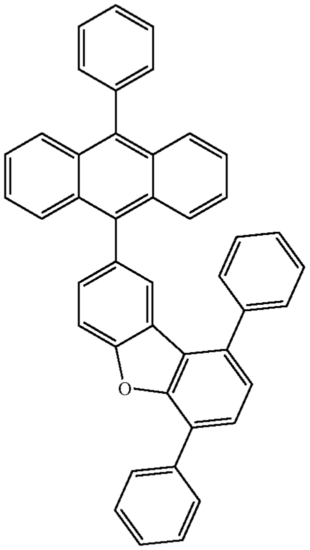
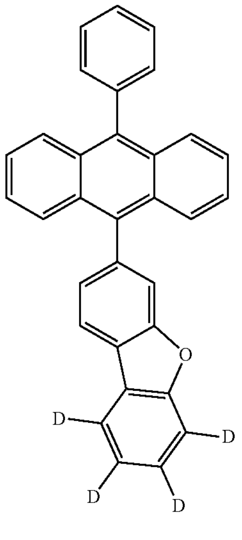
-continued
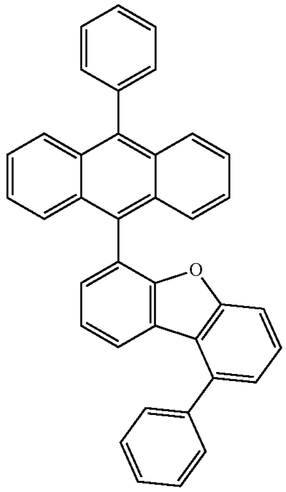
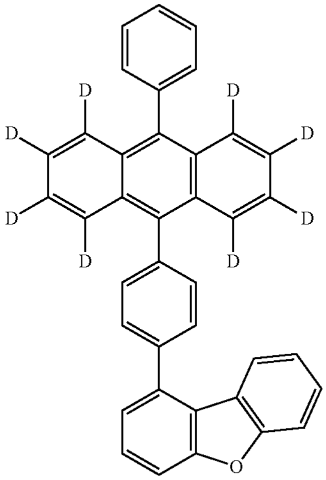
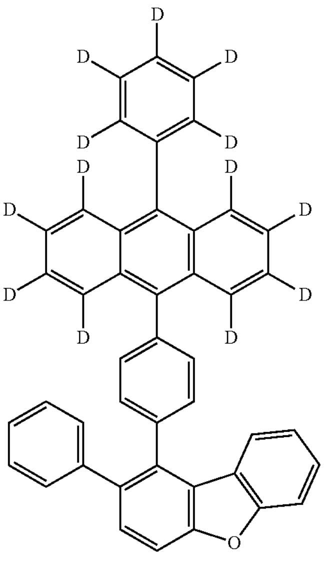

-continued
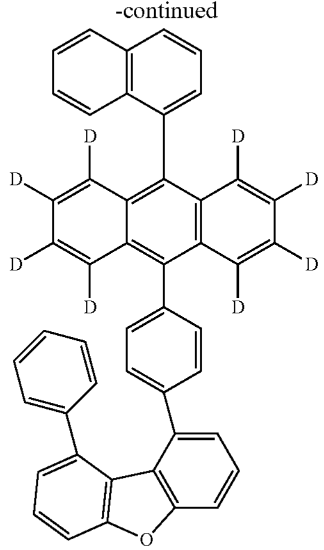
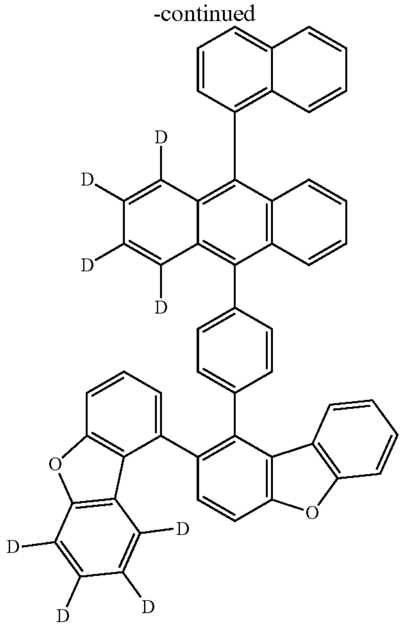
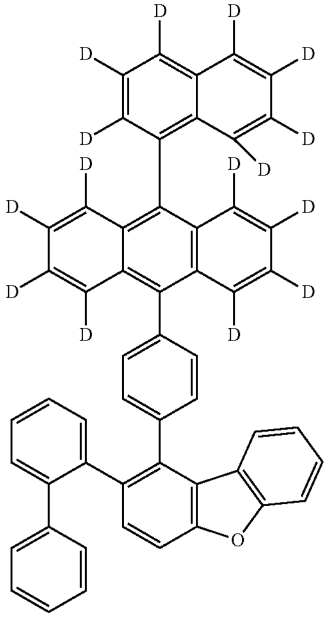
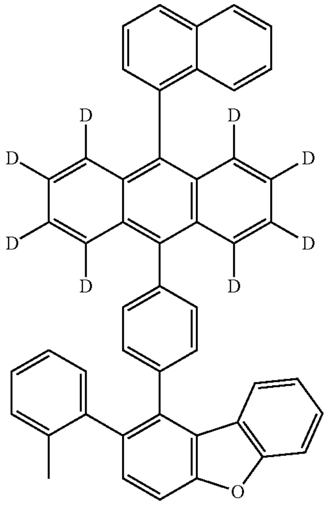
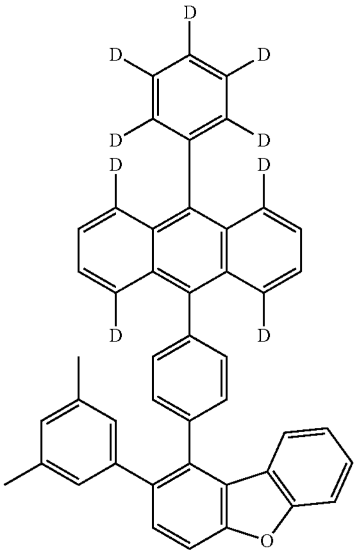

-continued
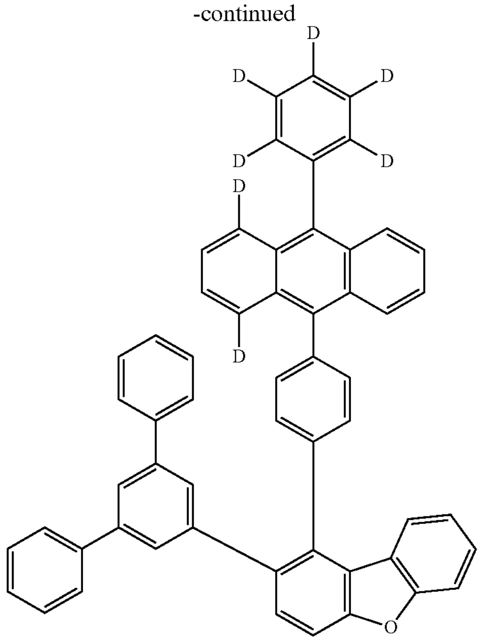
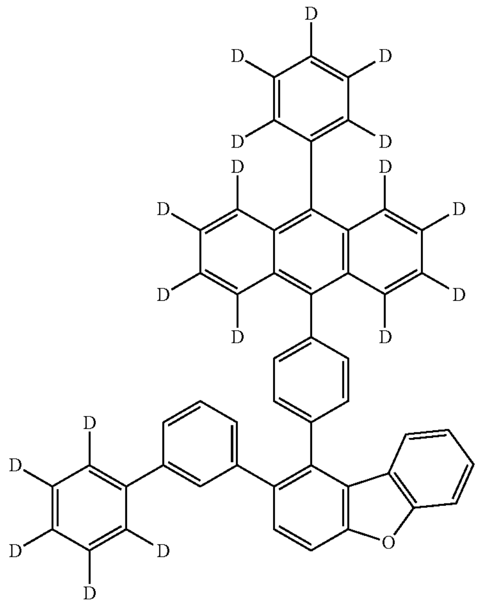
-continued
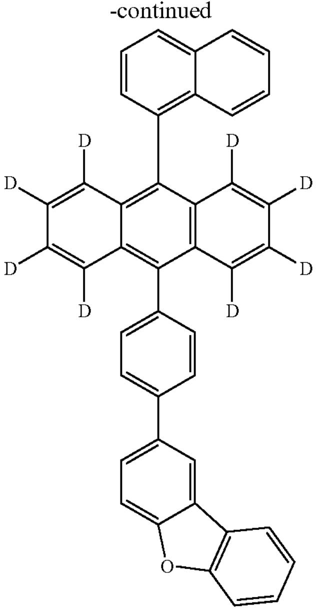
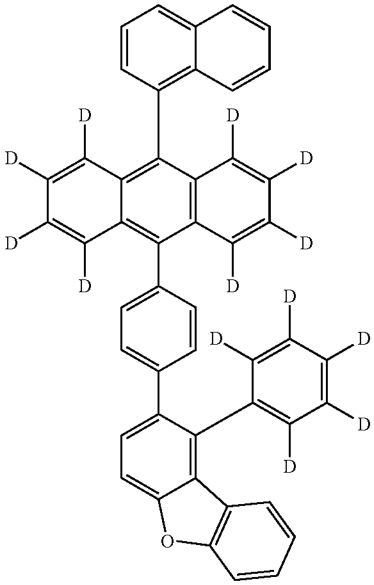

-continued
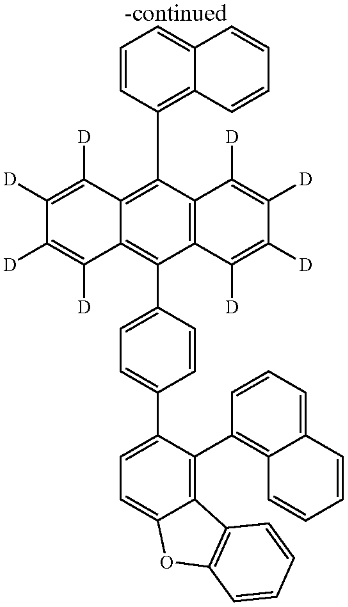
-continued
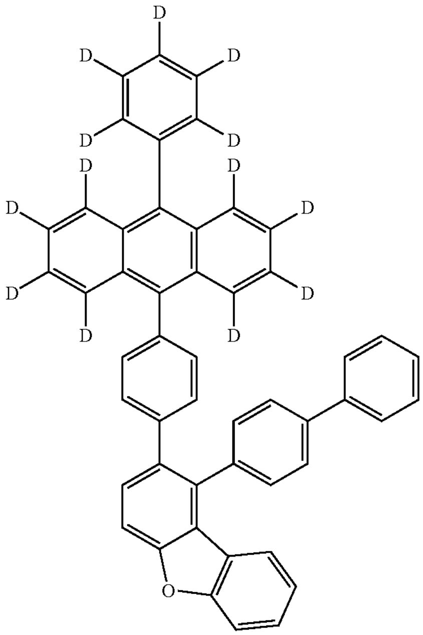
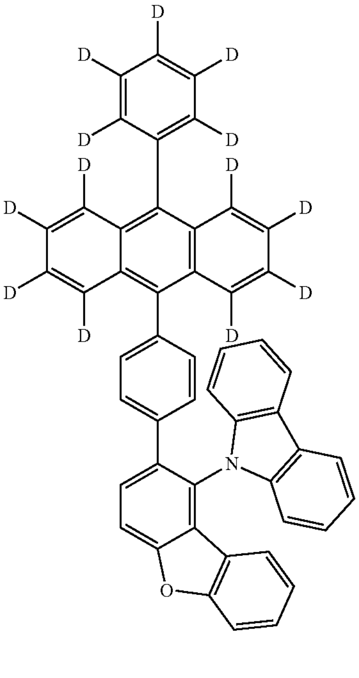
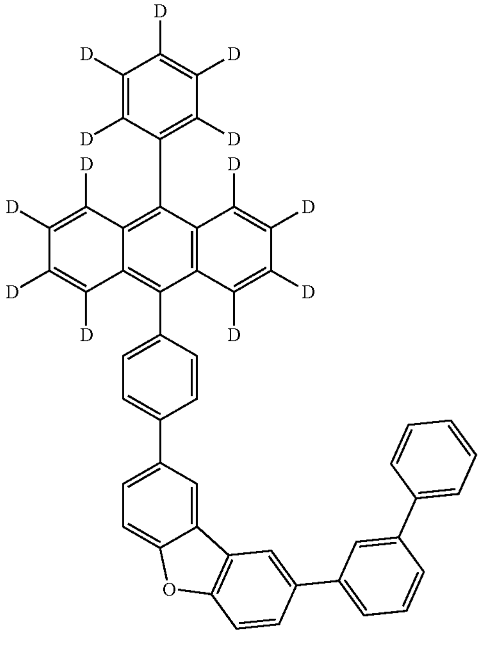

-continued
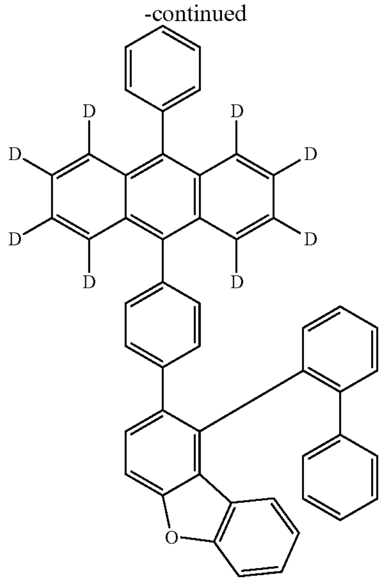
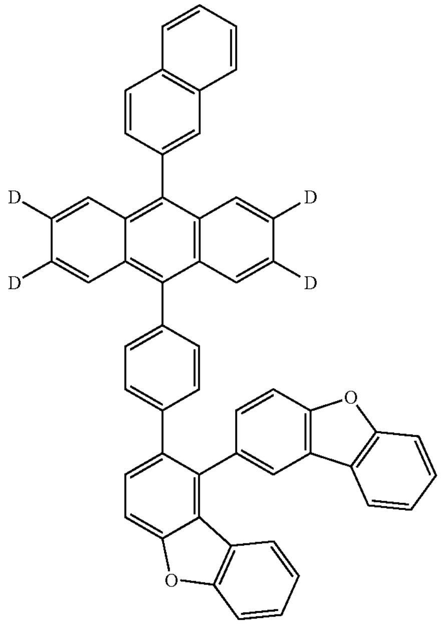
-continued
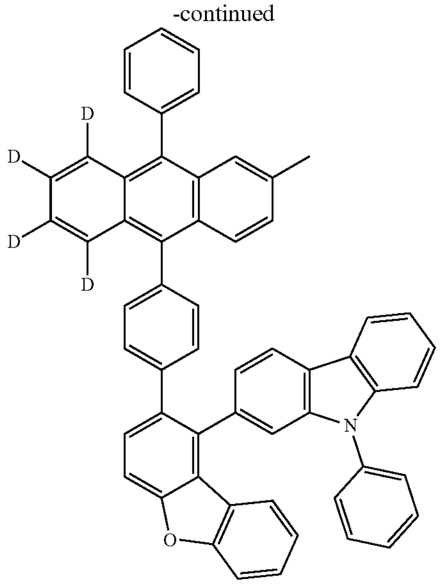
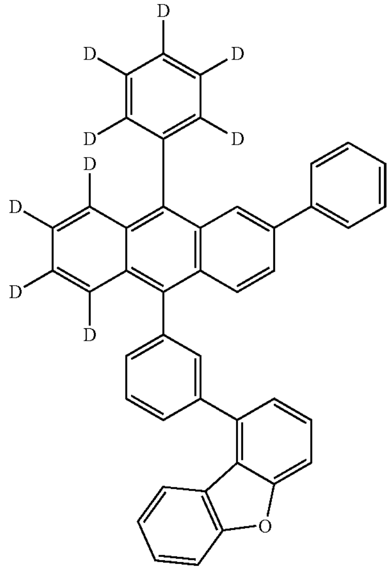
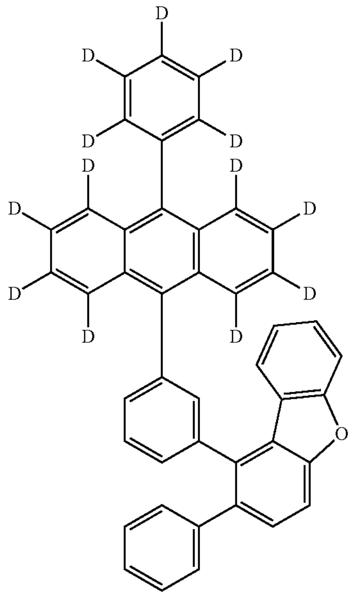

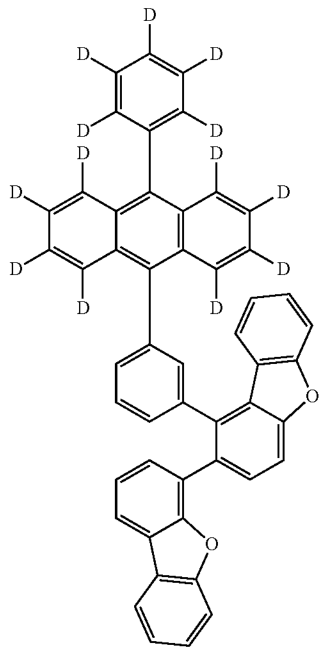
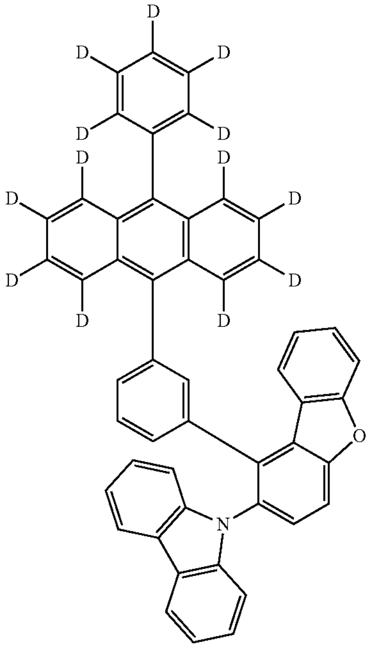
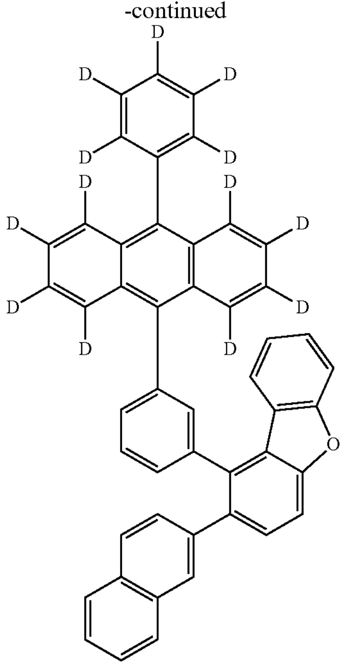
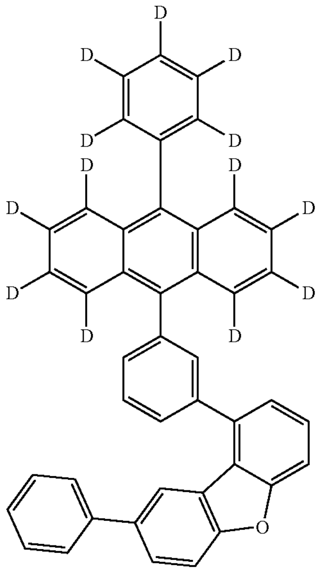

-continued
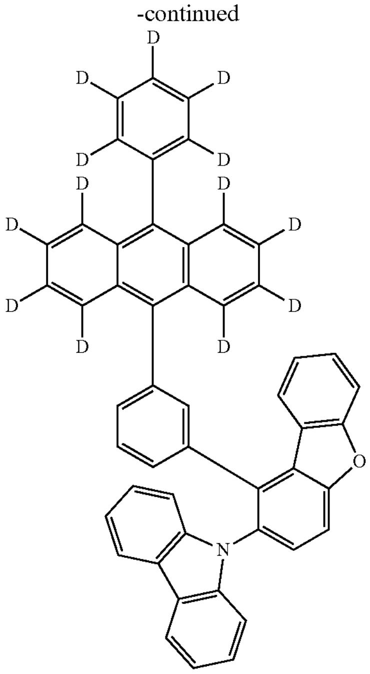
-continued
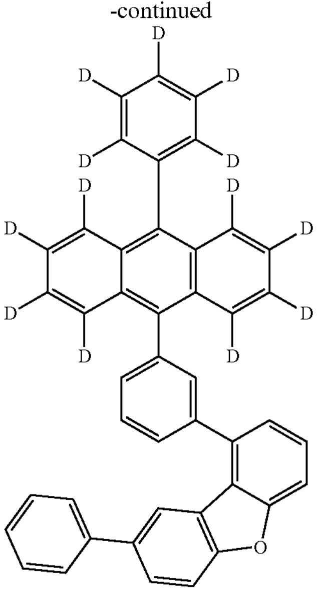
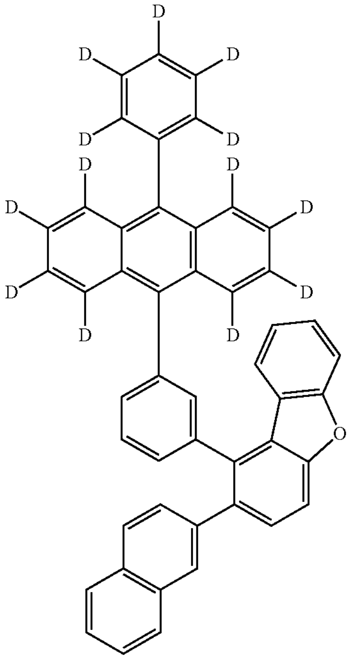
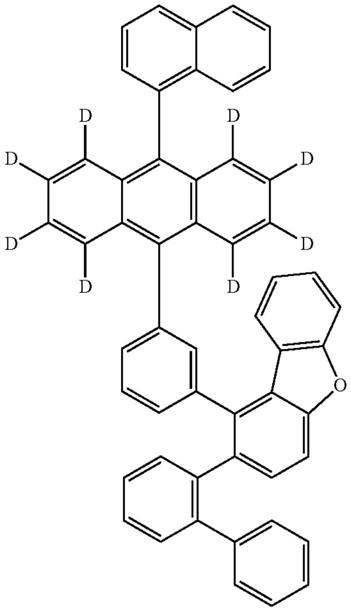

-continued
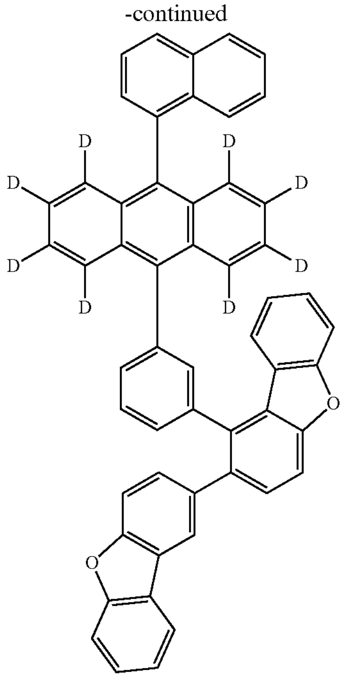
-continued
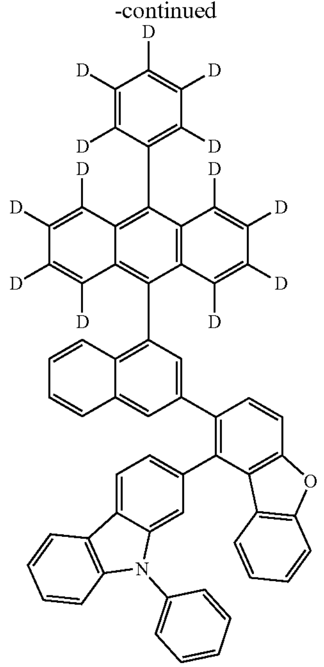
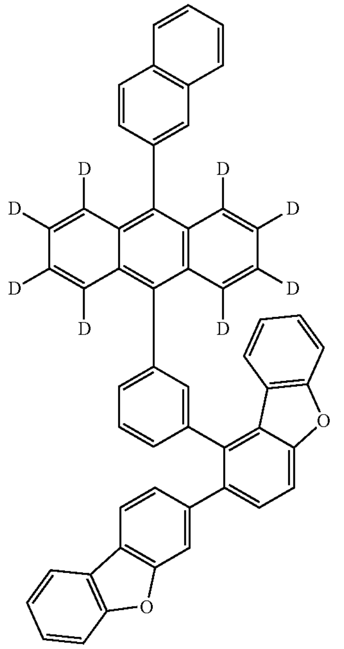
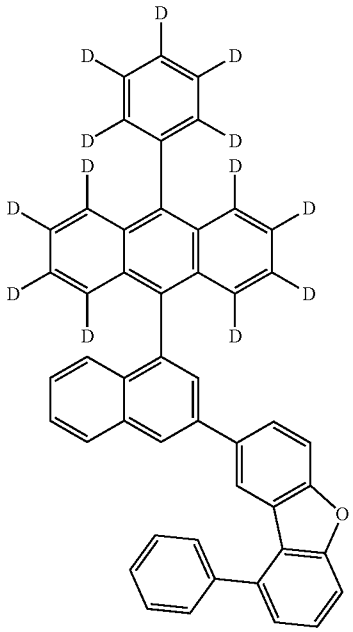

-continued
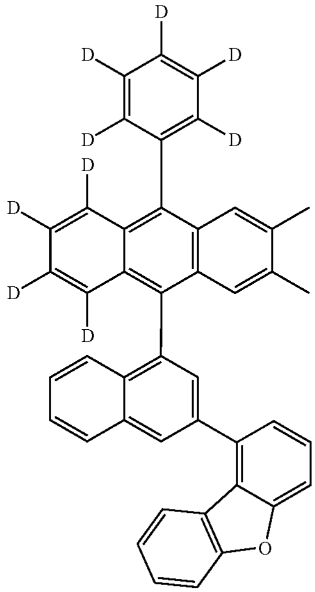
-continued
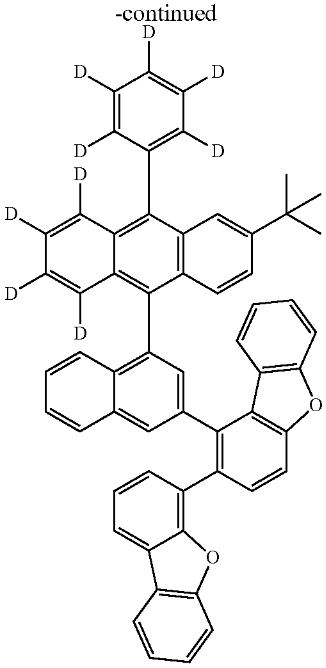
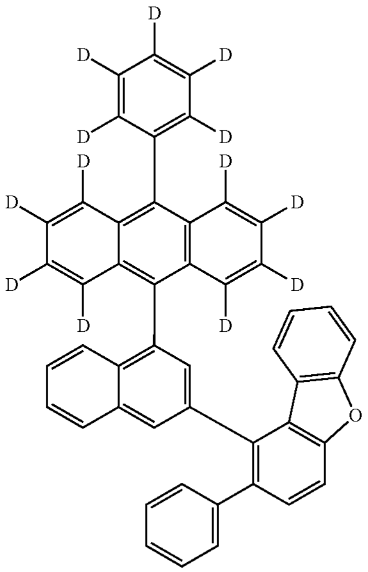
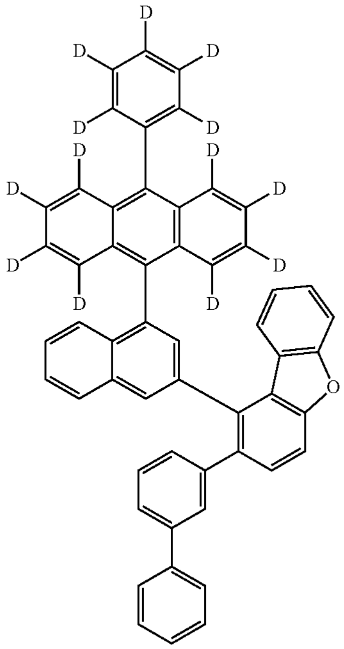 [SMILES: [2H]c1c([2H])c([2H])c(-c2c3c([2H])c([2H])c([2H])c([2H])c3c(-c3cc(-c4c(-c5cccc(-c6ccccc6)c5)ccc5oc6ccccc6c45)cc4ccccc34)c3c([2H])c([2H])c([2H])c([2H])c23)c([2H])c1[2H]]

-continued
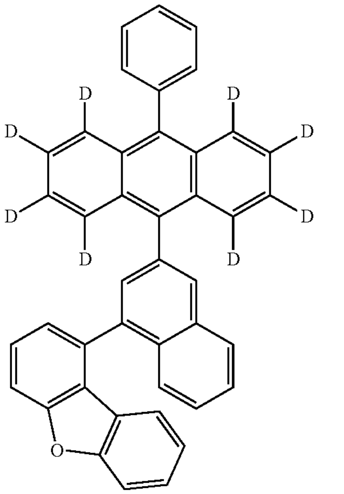 [SMILES: [2H]c1c([2H])c([2H])c2c(-c3cc(-c4cccc5oc6ccccc6c45)c4ccccc4c3)c3c([2H])c([2H])c([2H])c([2H])c3c(-c3ccccc3)c2c1[2H]]
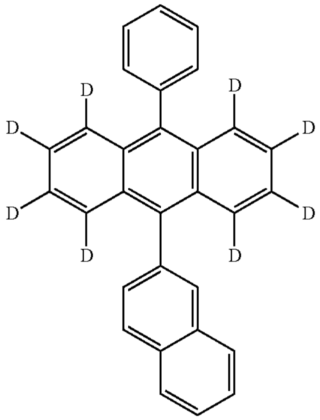
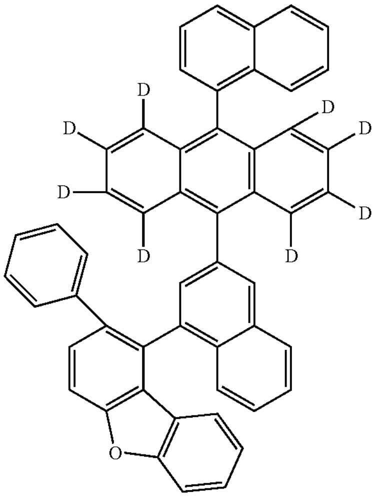
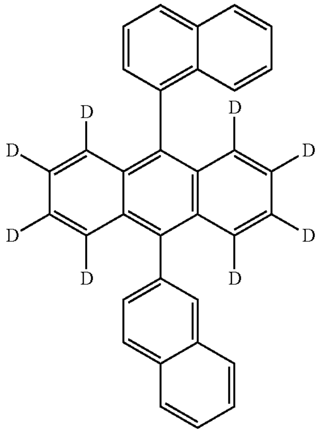
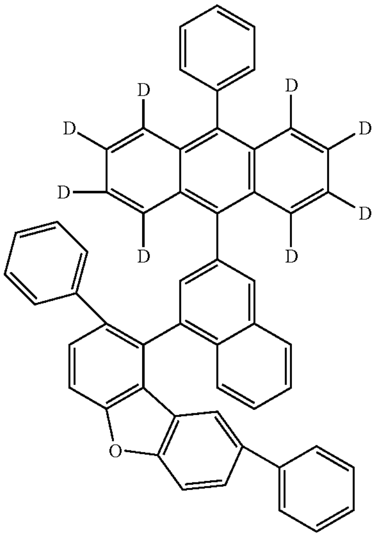
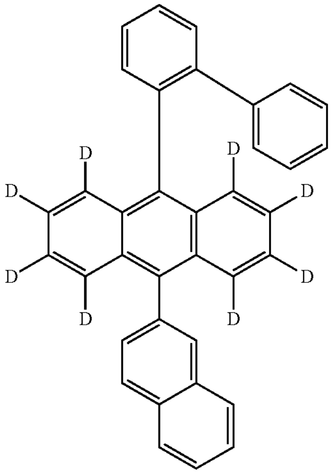

-continued
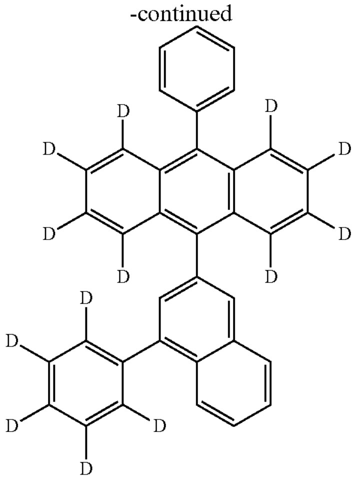
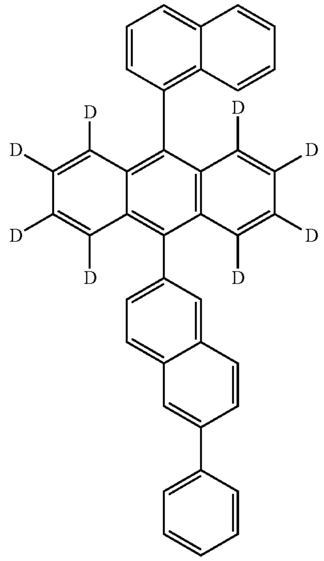
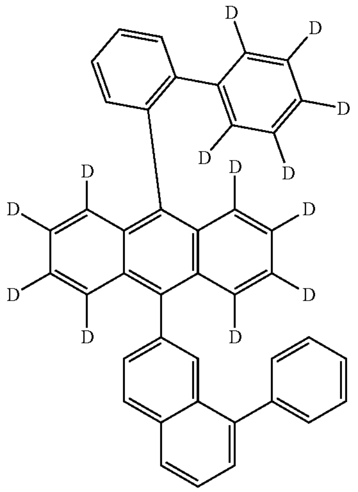
-continued
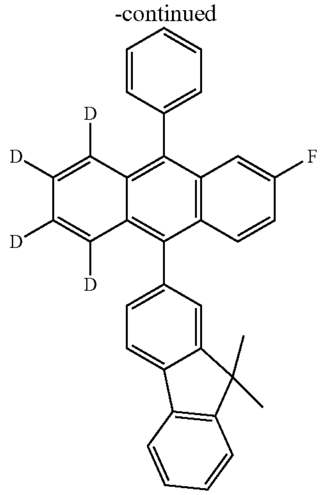
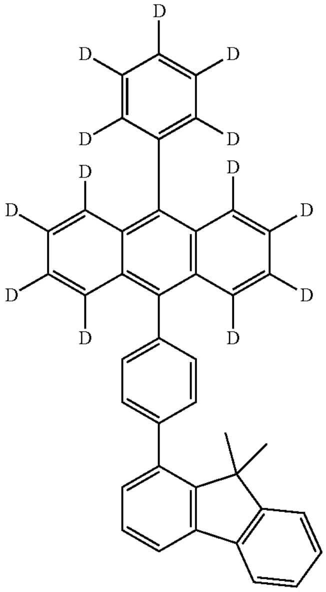
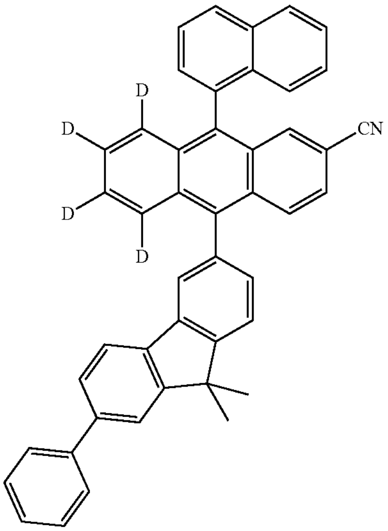

-continued
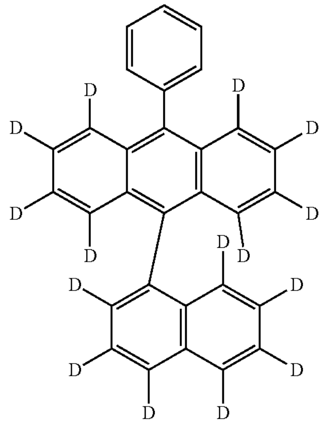
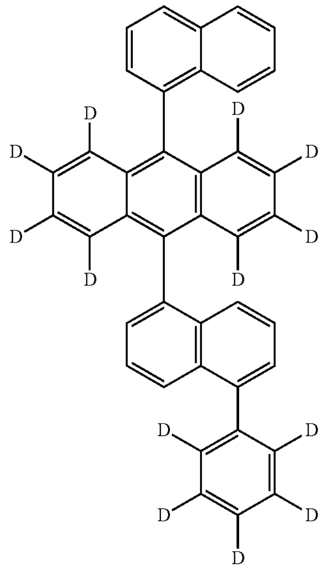
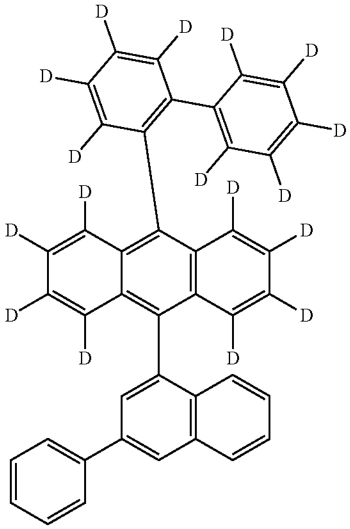
-continued
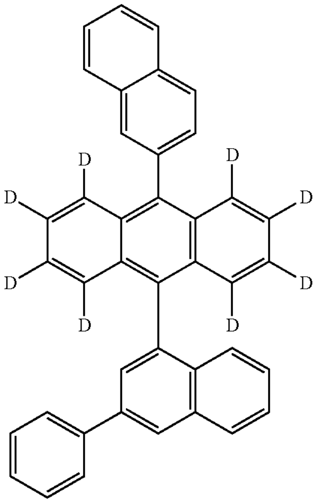
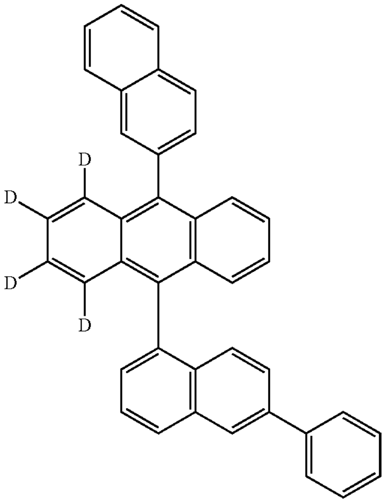
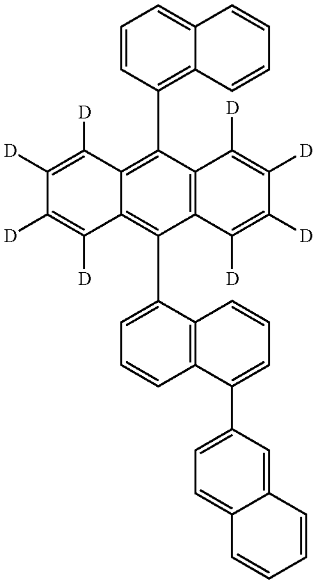

-continued
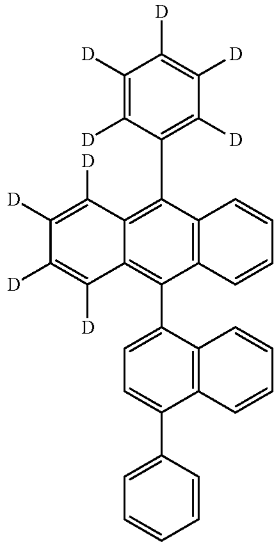
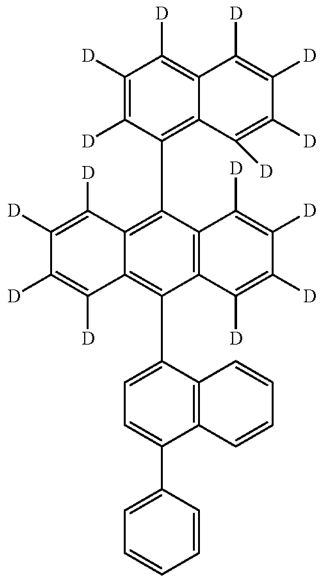
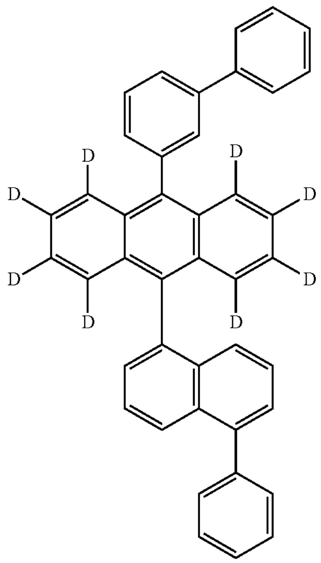
-continued
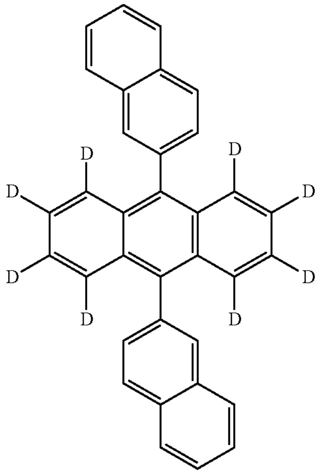
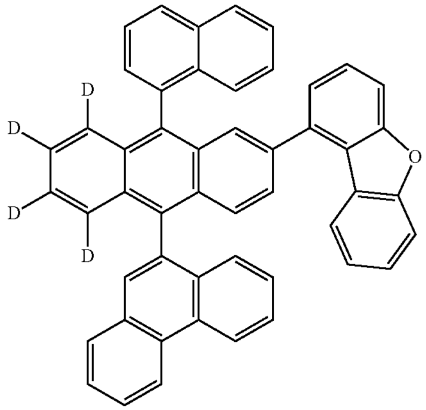
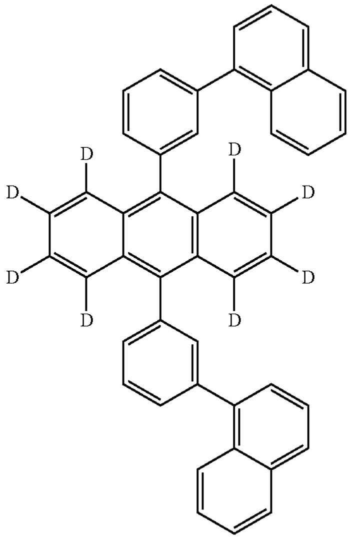

-continued
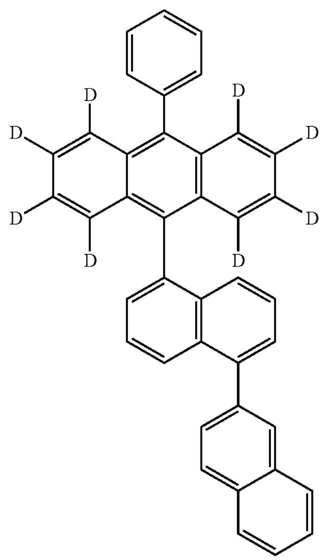
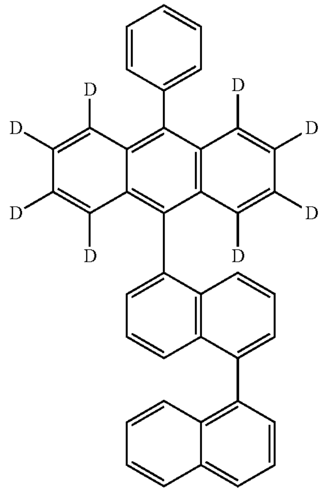
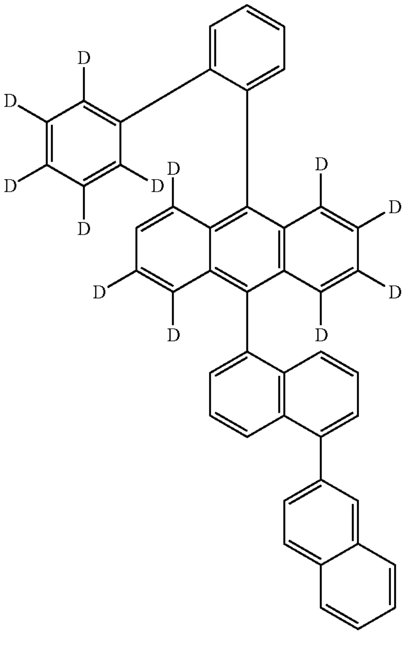
-continued
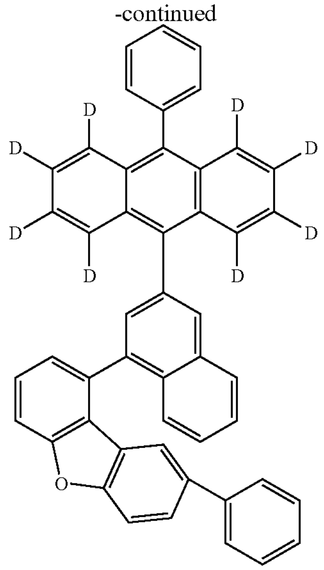
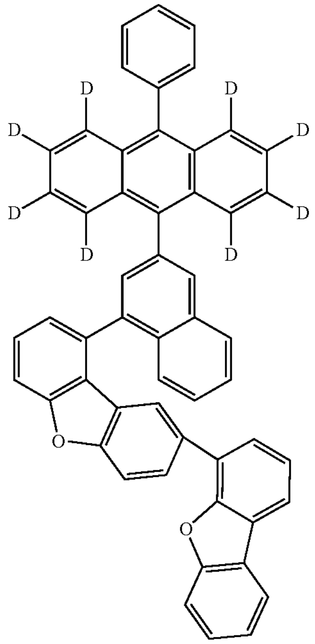

-continued
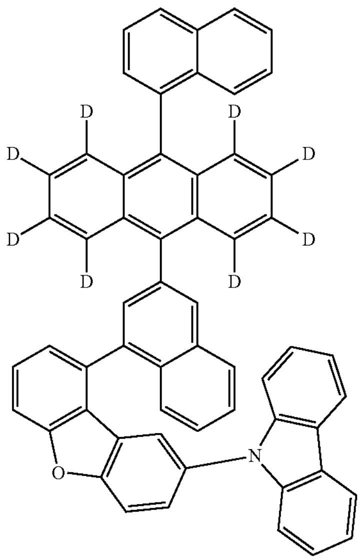
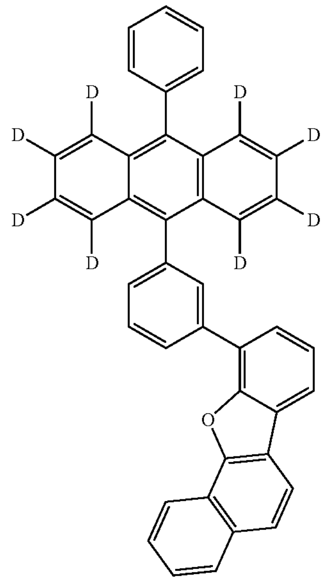
-continued
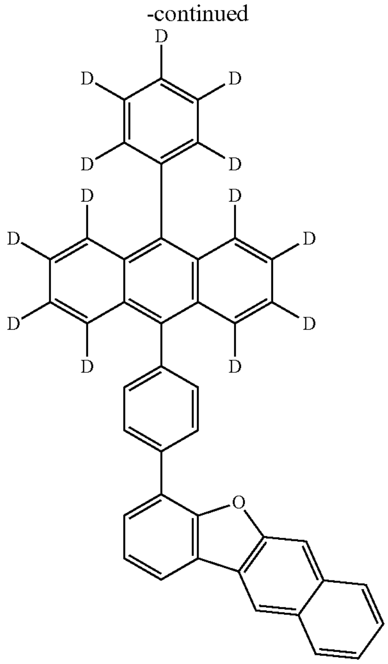
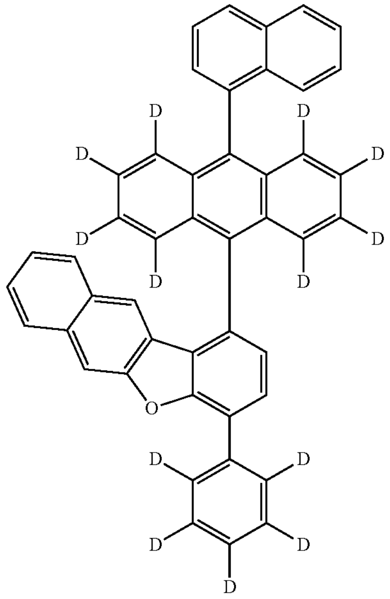
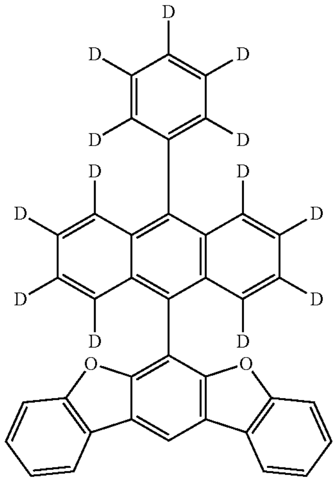

-continued
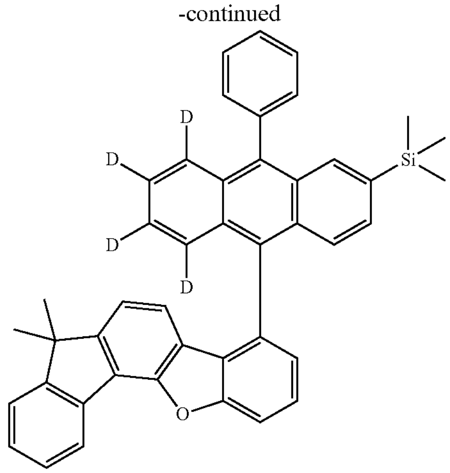
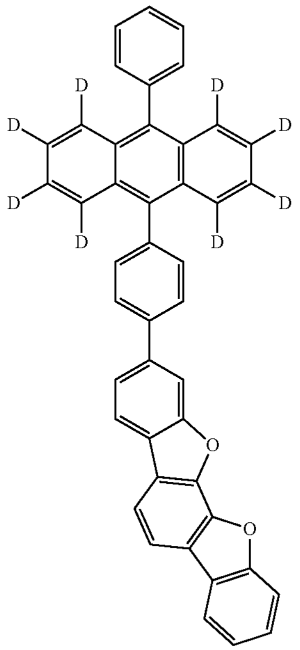
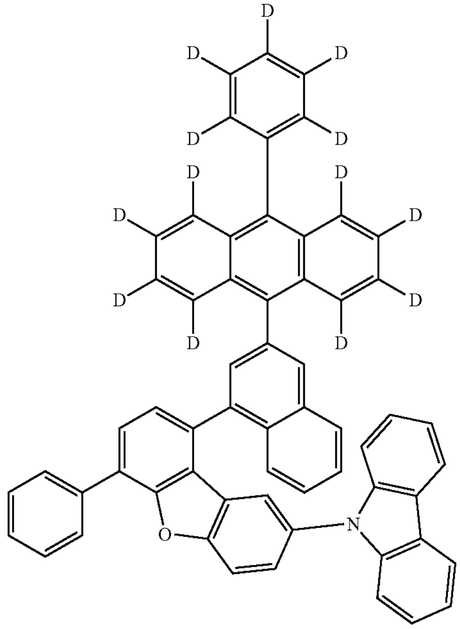
-continued
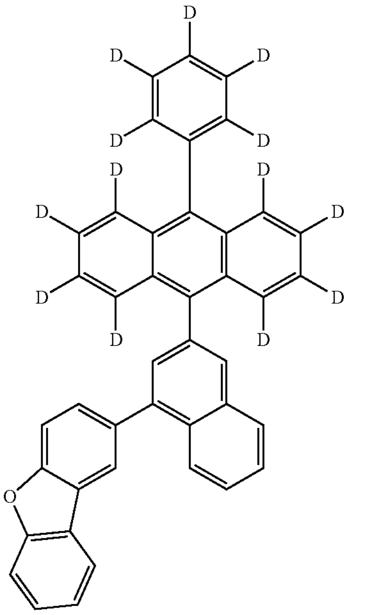
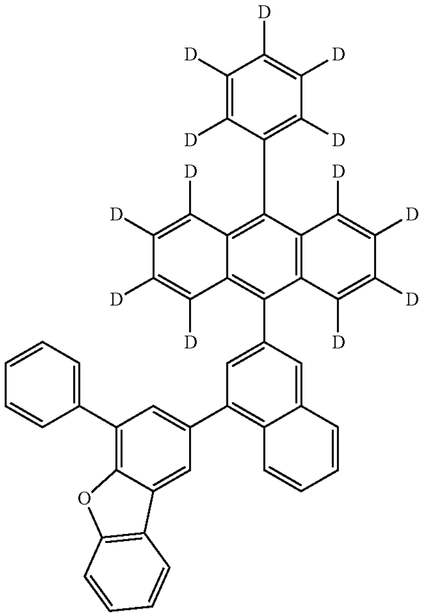

-continued
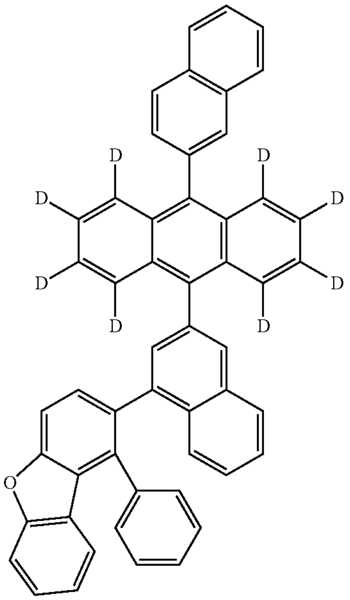
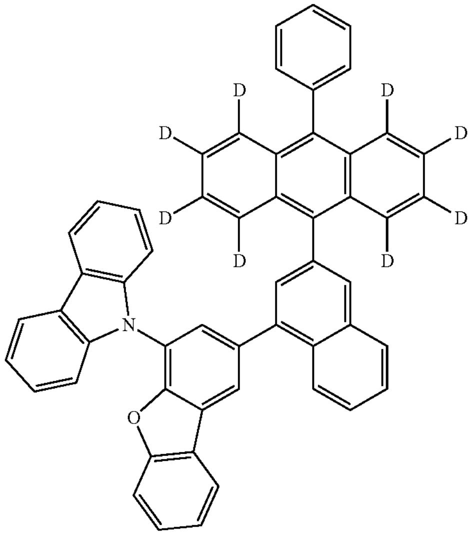
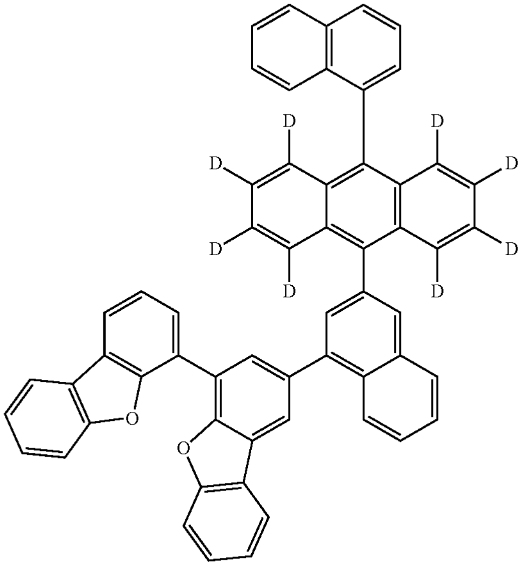
-continued
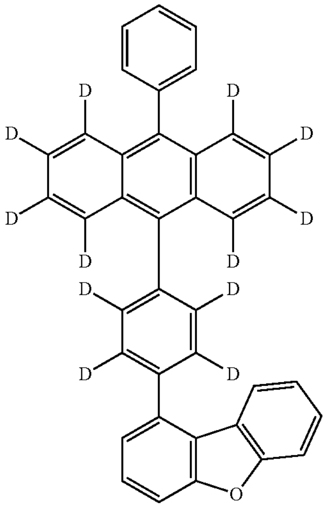
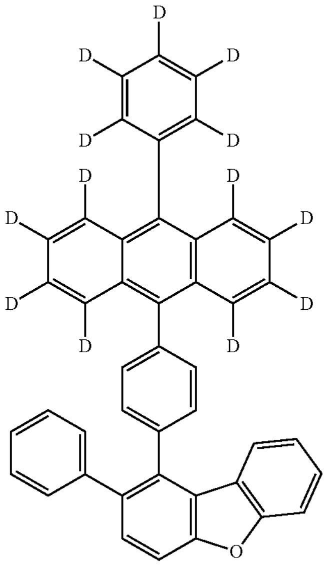
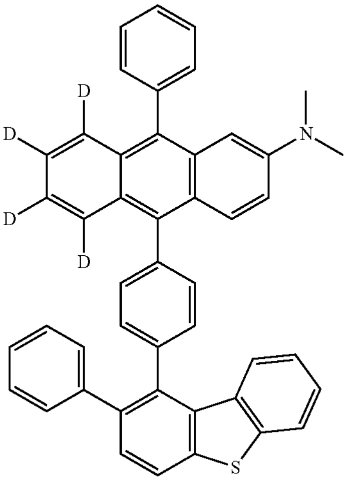

-continued
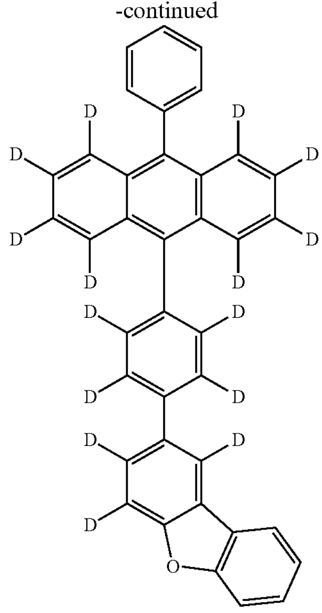
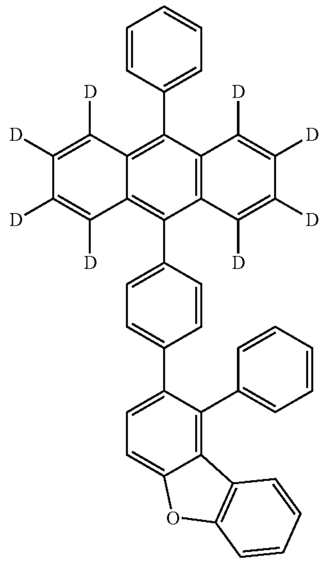
-continued
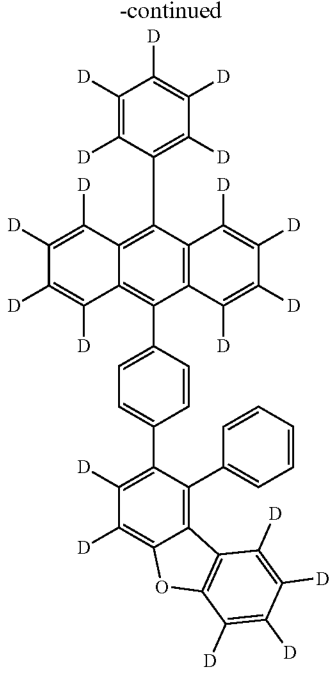
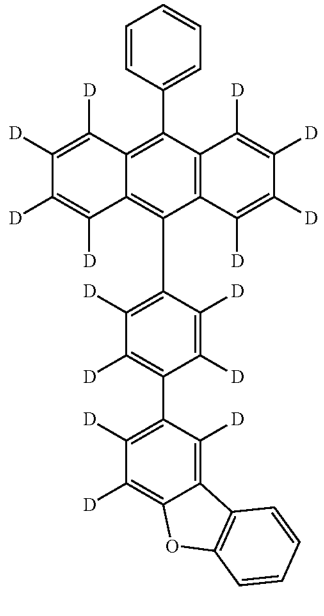

-continued
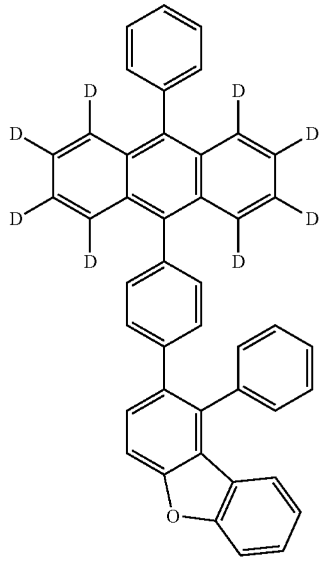
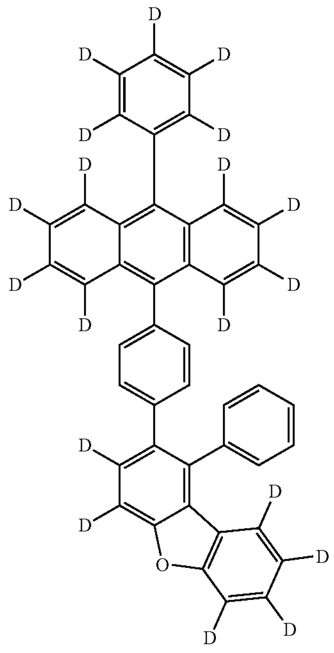
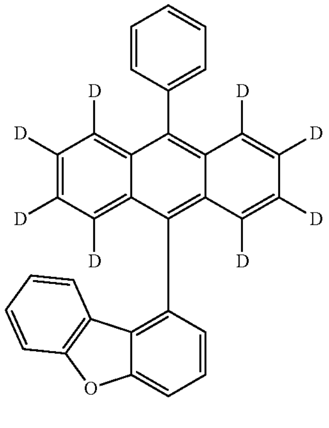
-continued
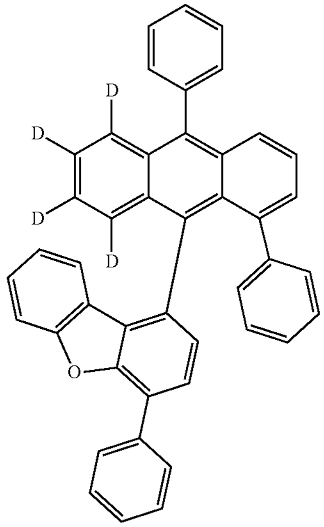
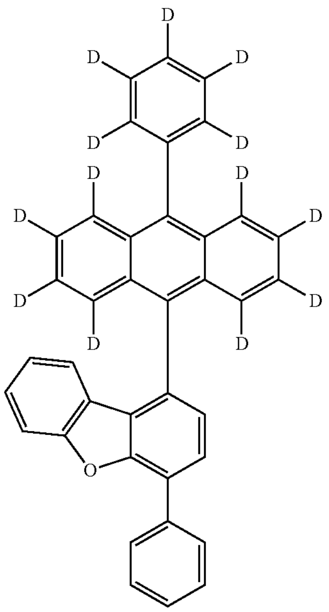
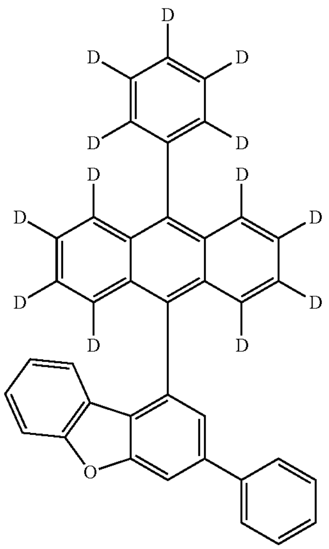

-continued
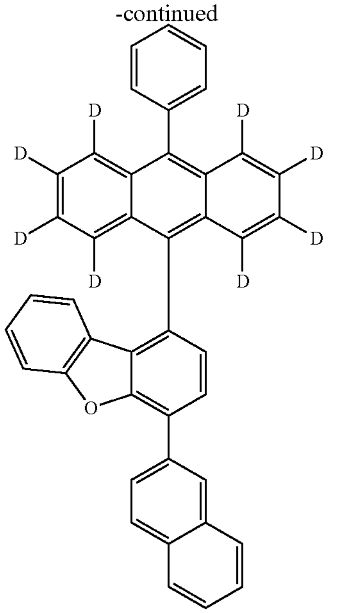
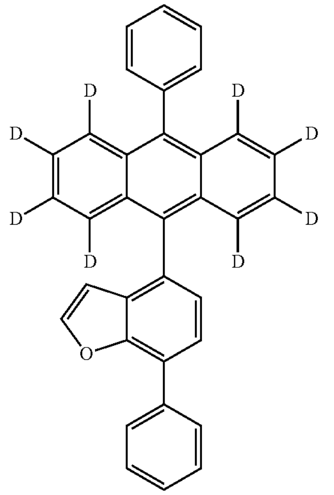
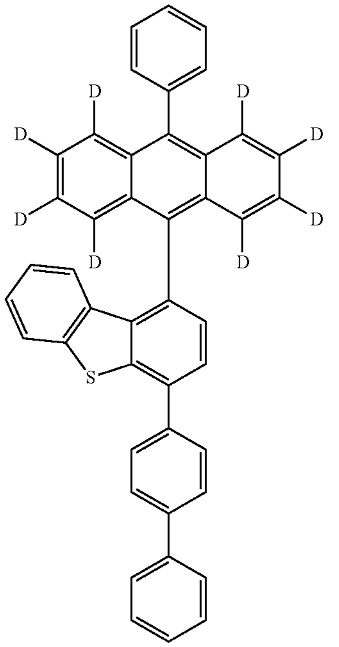
-continued
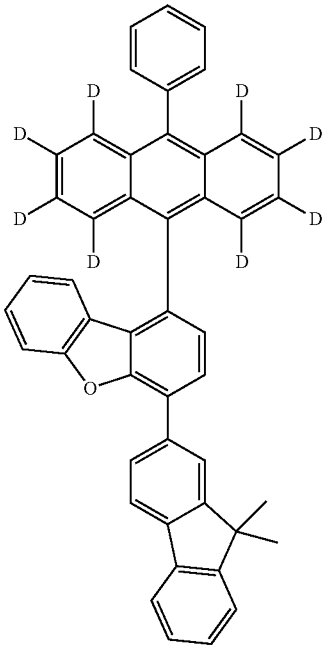
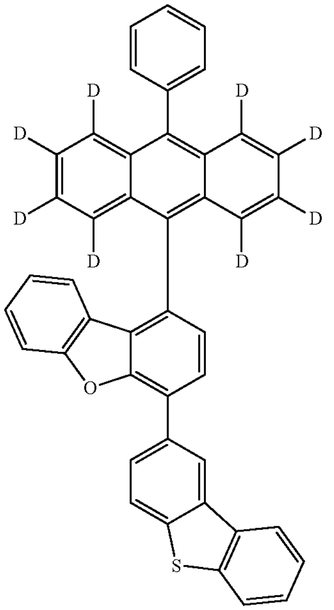

-continued
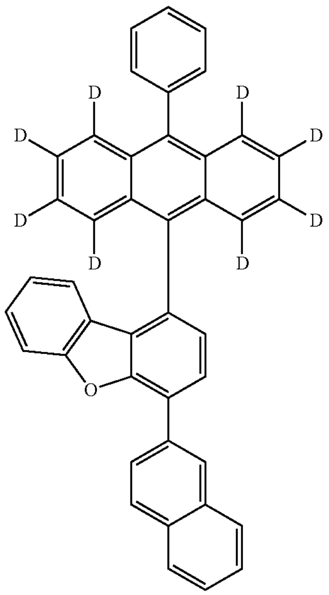
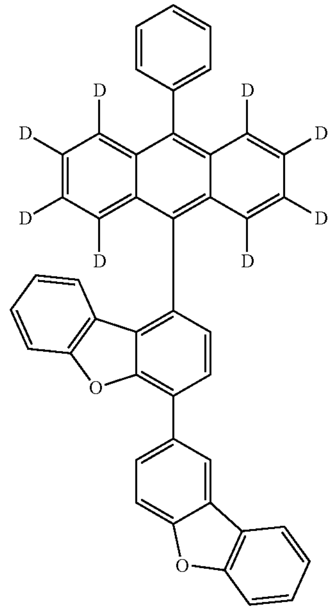
-continued
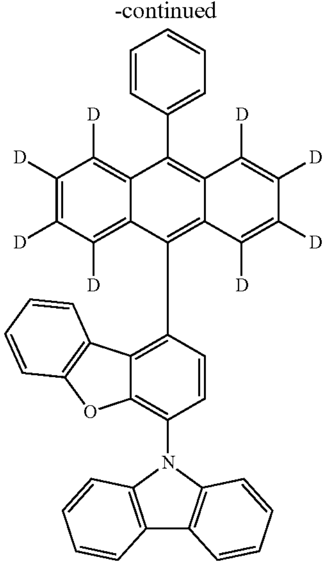
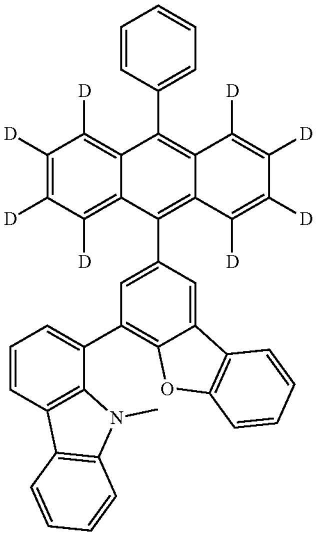
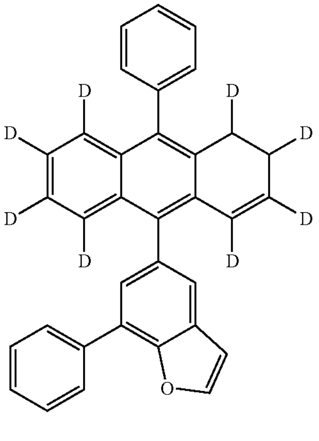

-continued
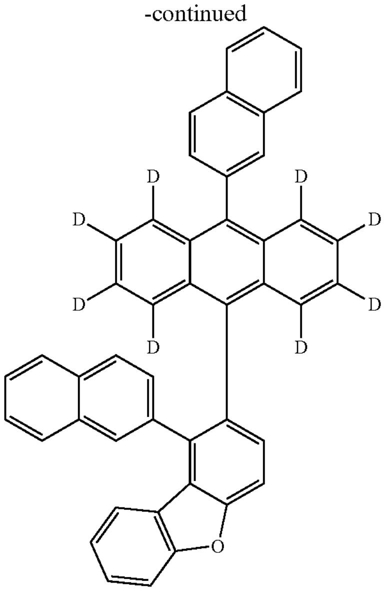
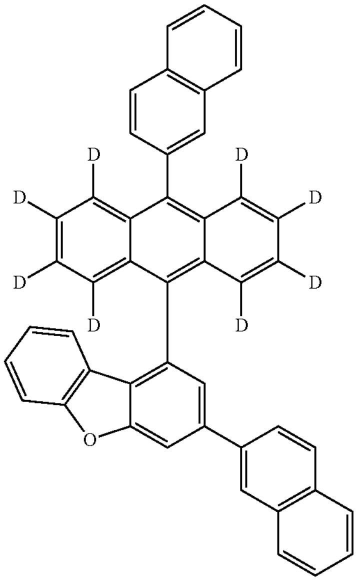
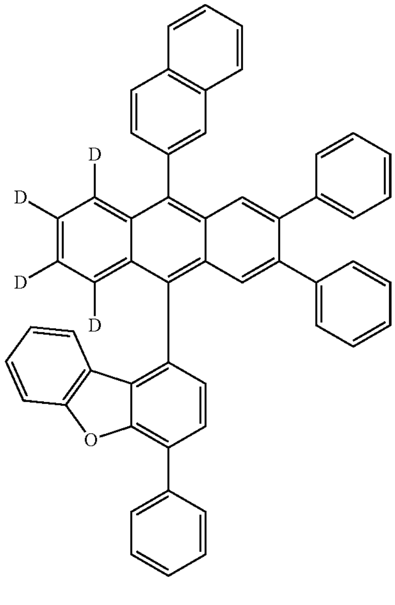
-continued
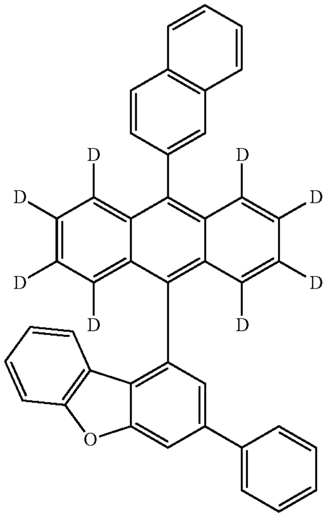
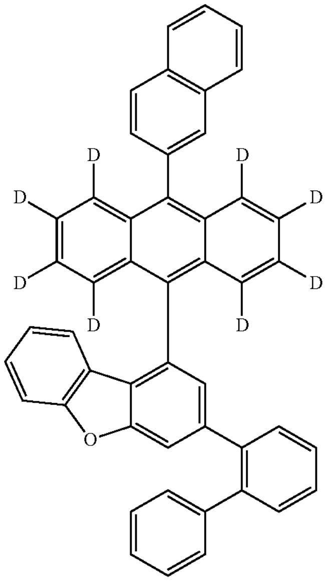
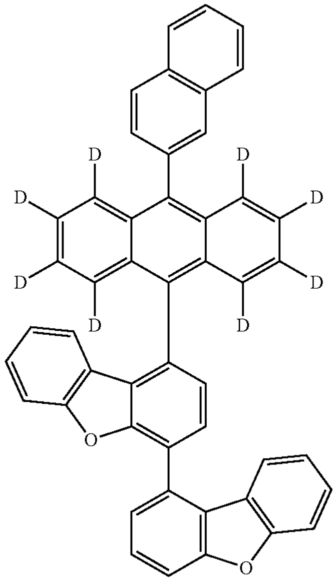

-continued
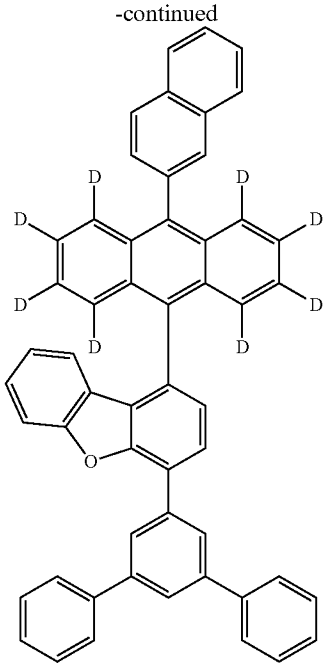
-continued
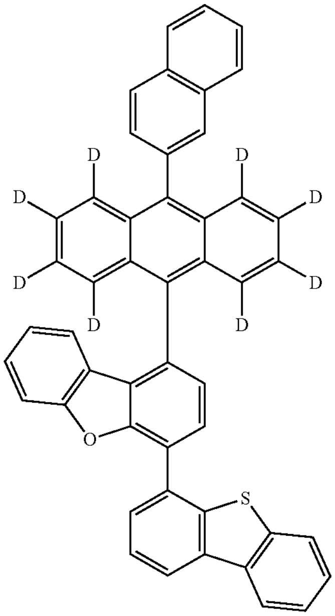
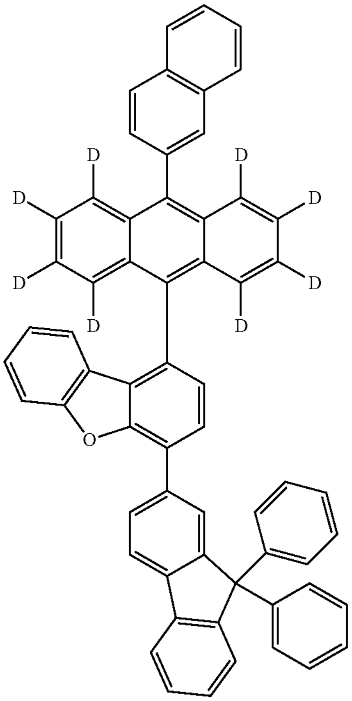
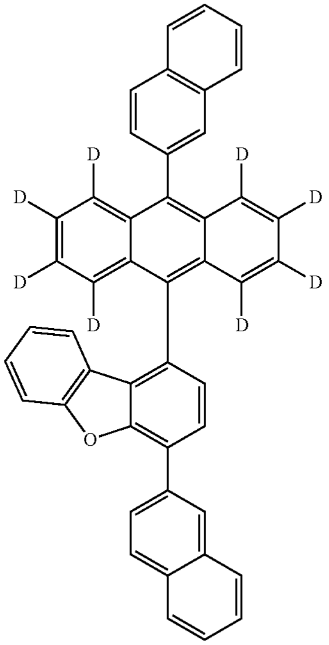

-continued
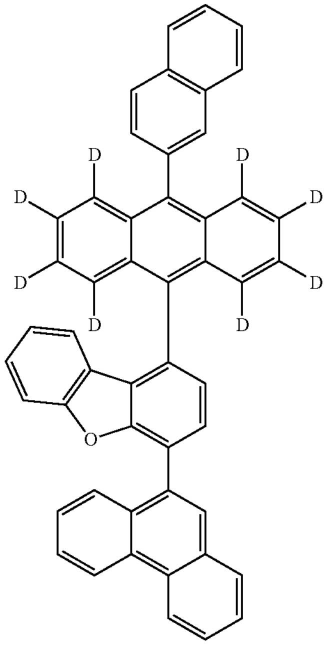
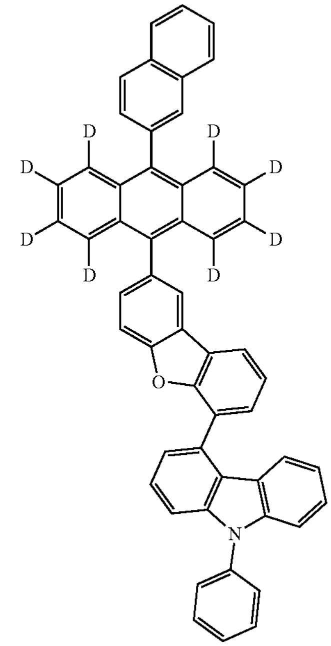
-continued
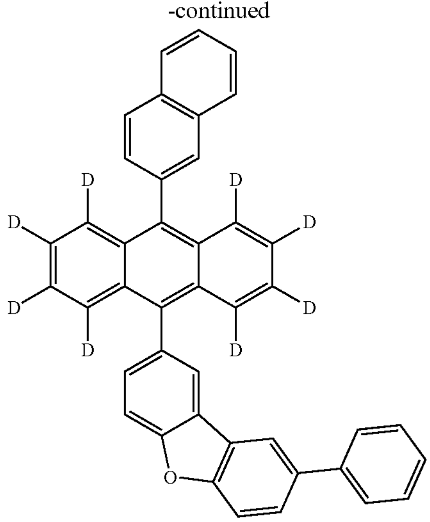
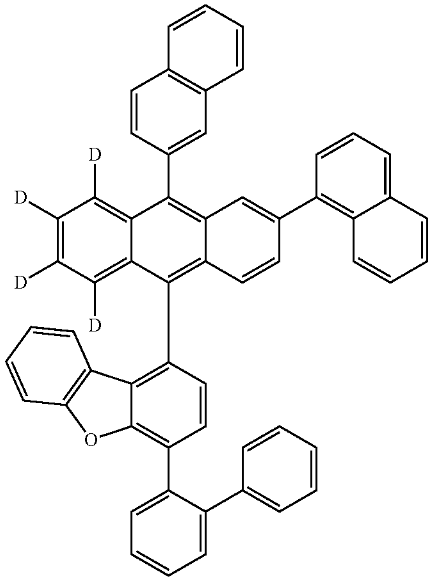
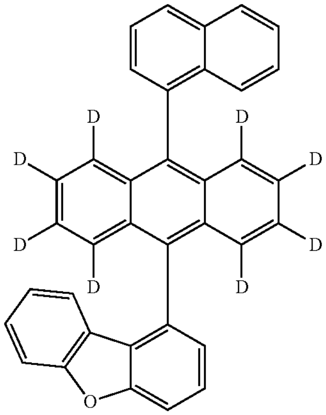

-continued
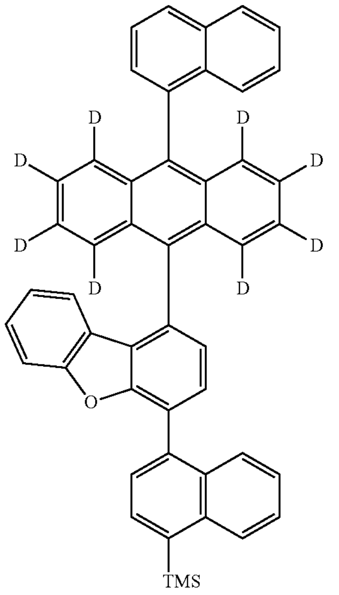
-continued
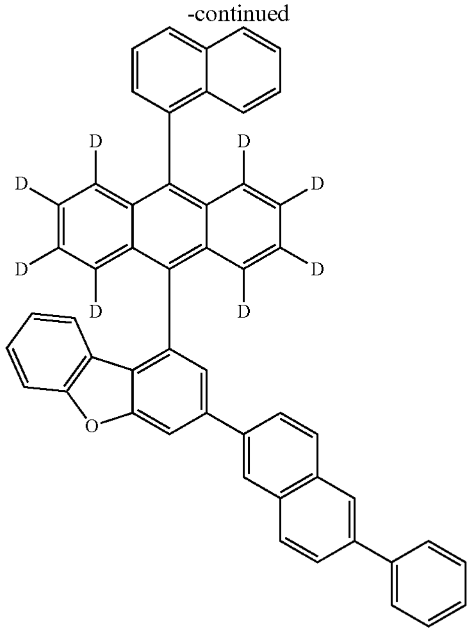
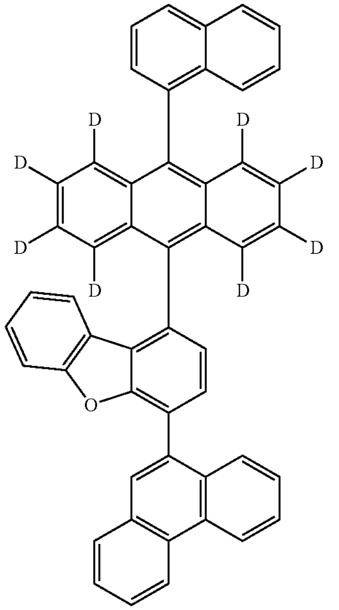
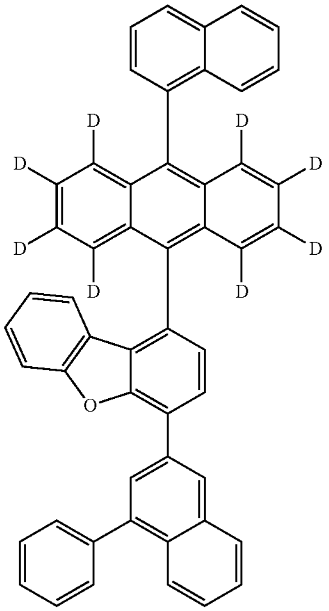

-continued
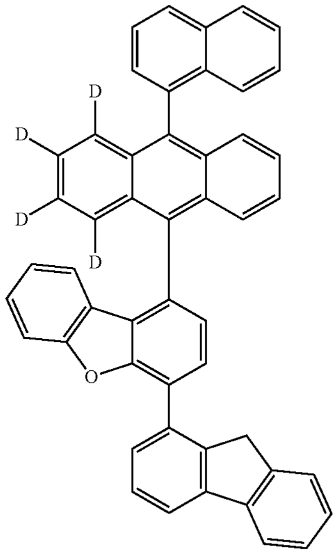
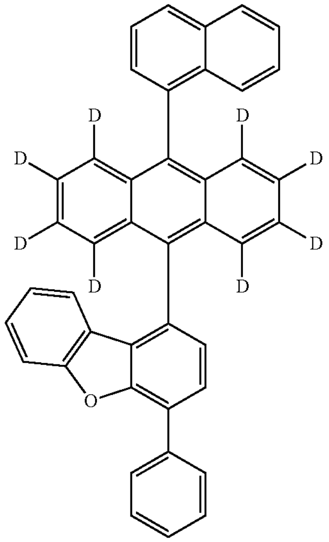
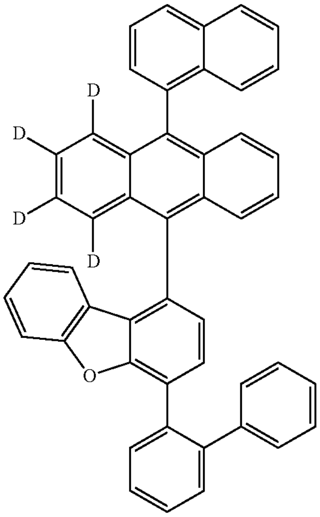
-continued
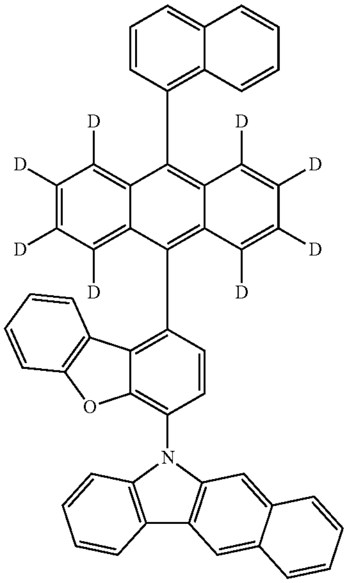
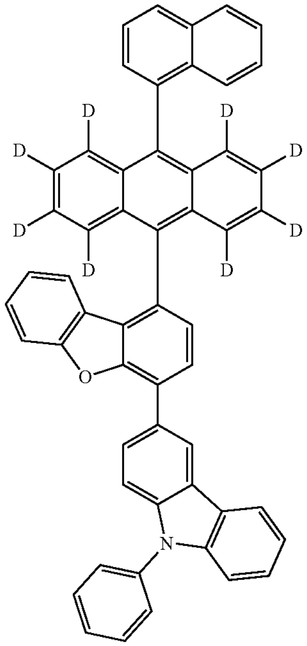

-continued
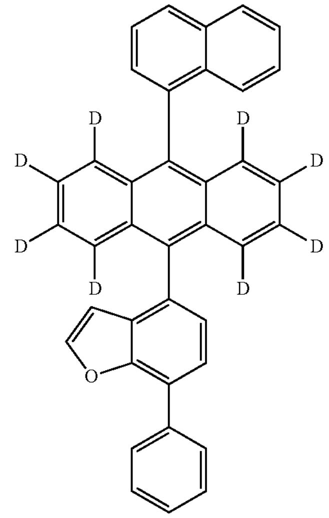
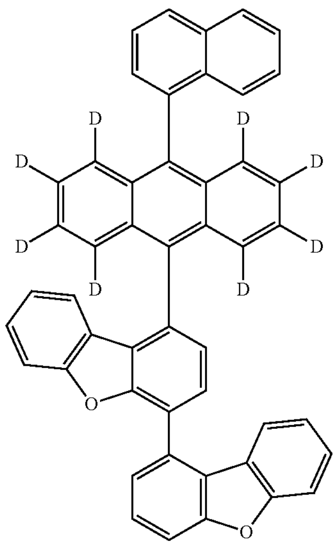
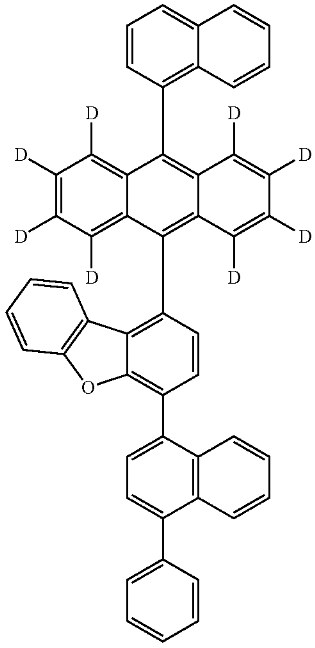
-continued
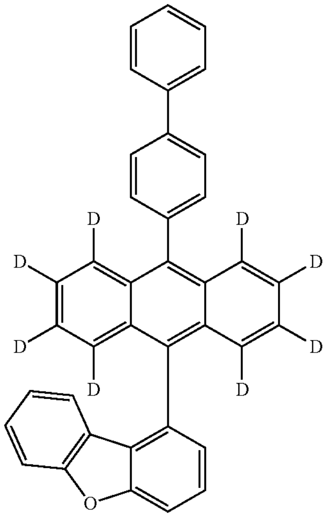
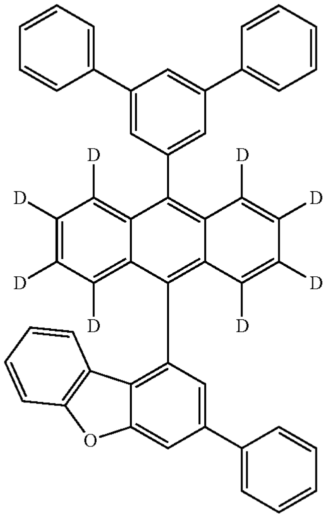
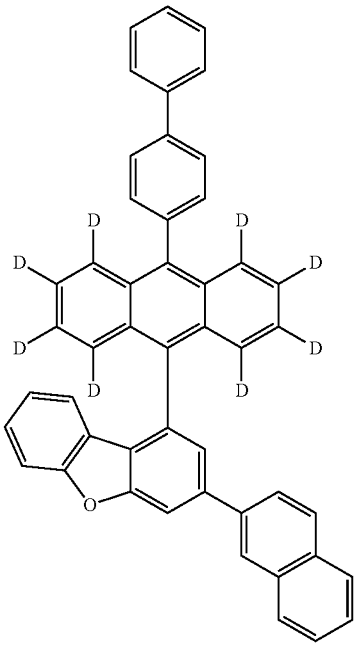

-continued
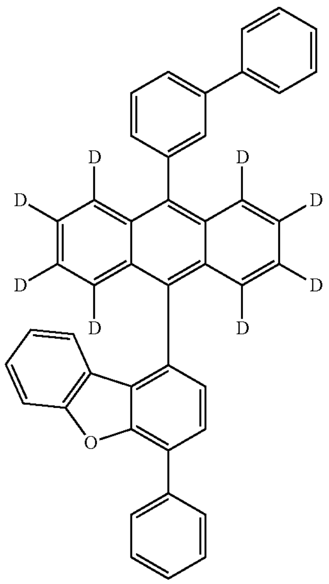
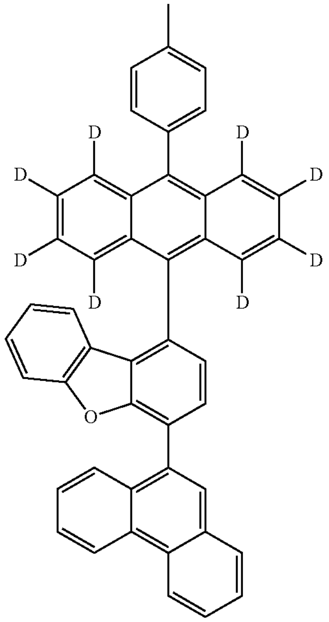
-continued
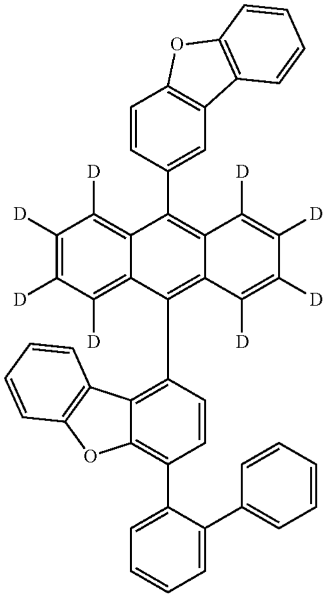
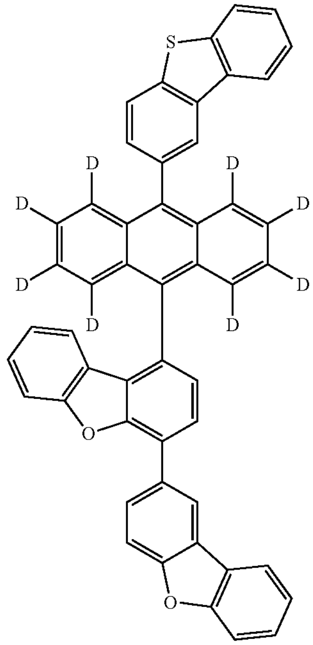

-continued
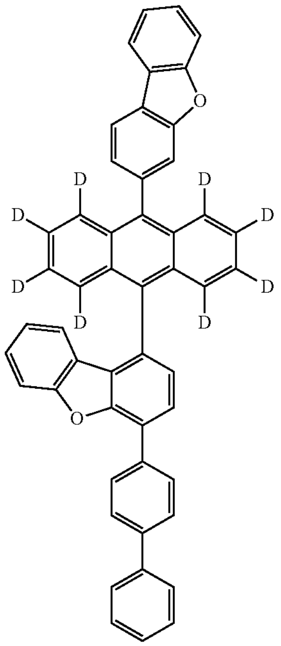
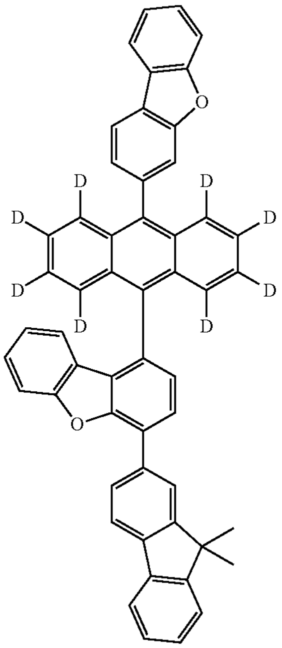
-continued
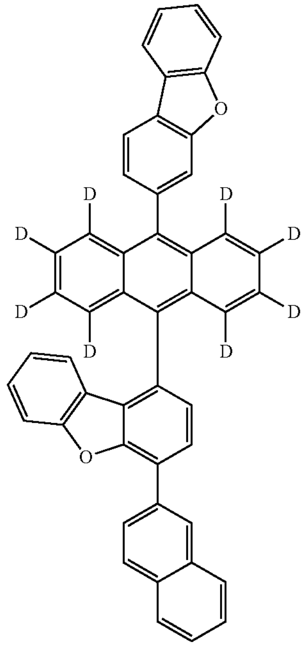
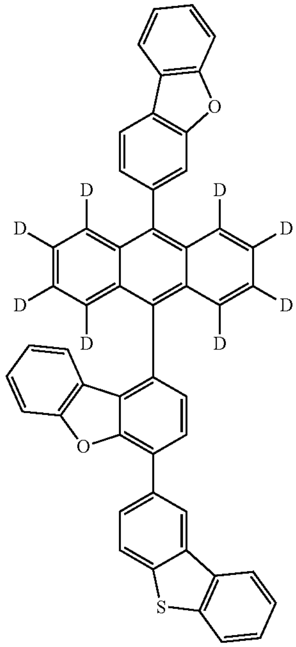 [SMILES: [2H]c1c([2H])c([2H])c2c(-c3ccc(-c4ccc5sc6ccccc6c5c4)c4oc5ccccc5c34)c3c([2H])c([2H])c([2H])c([2H])c3c(-c3ccc4c(c3)oc3ccccc34)c2c1[2H]]
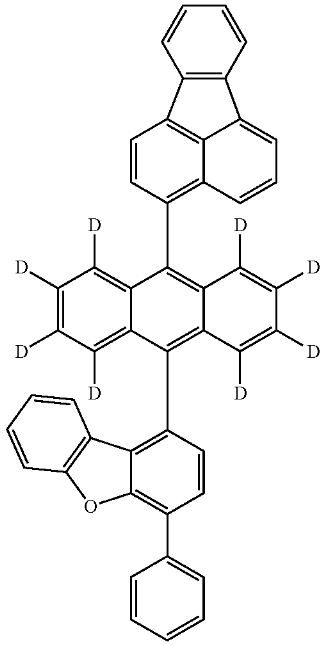

-continued
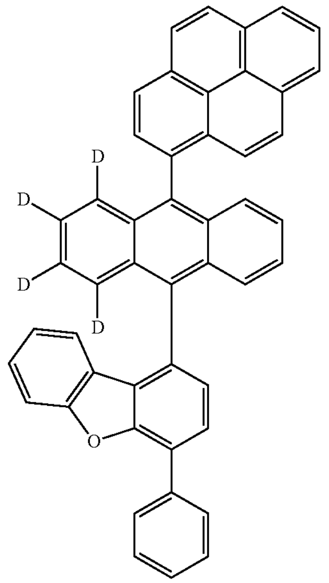
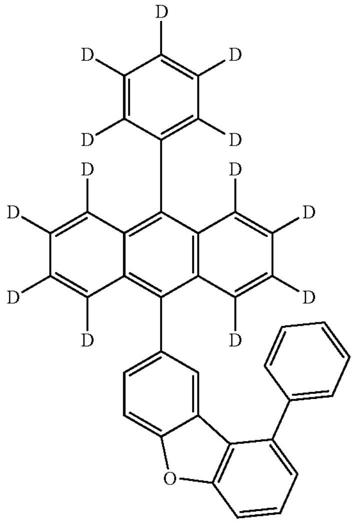
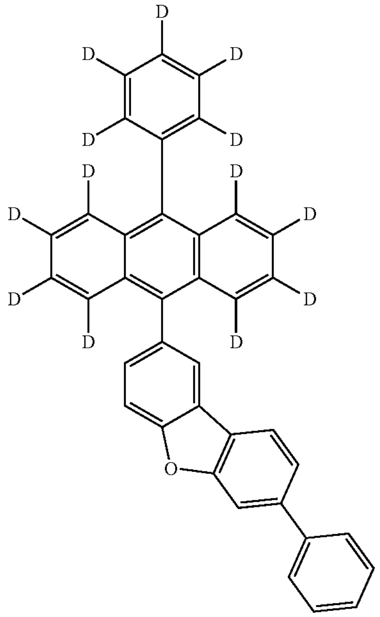
-continued
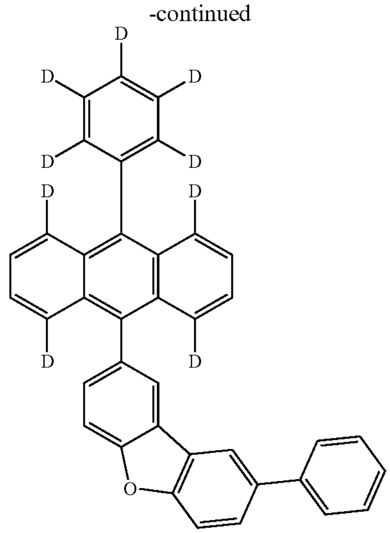
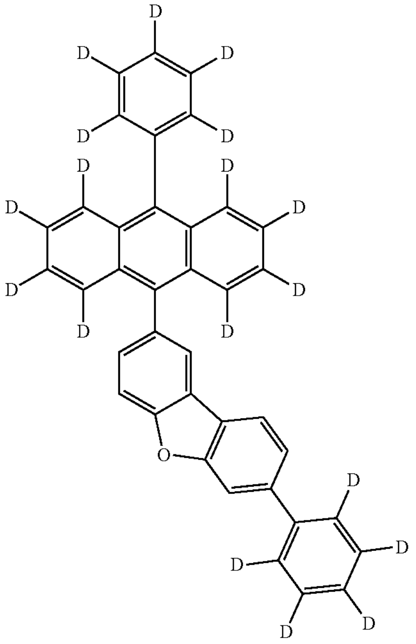
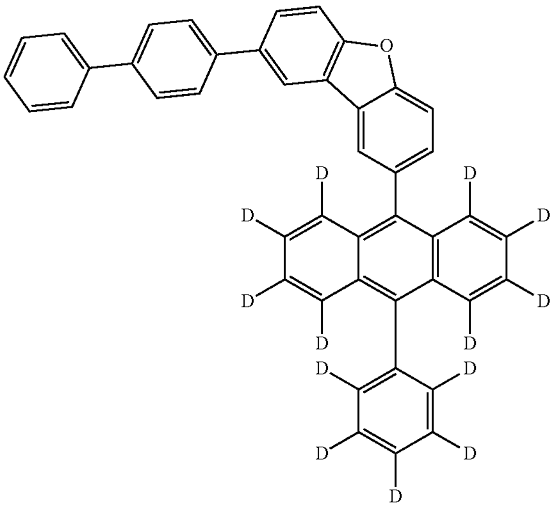

-continued
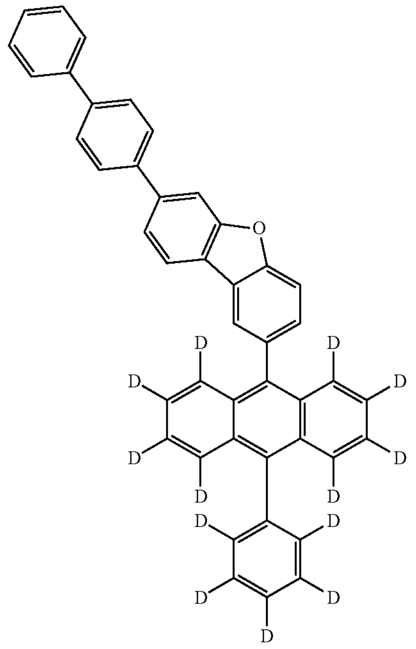
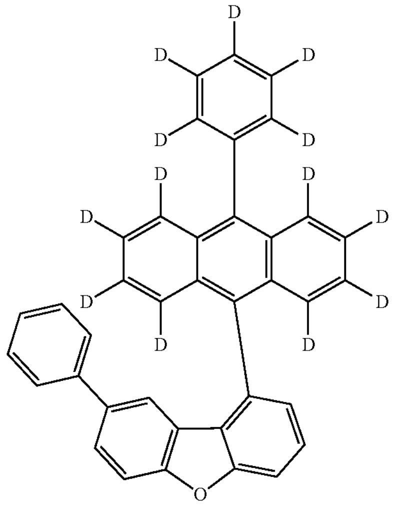
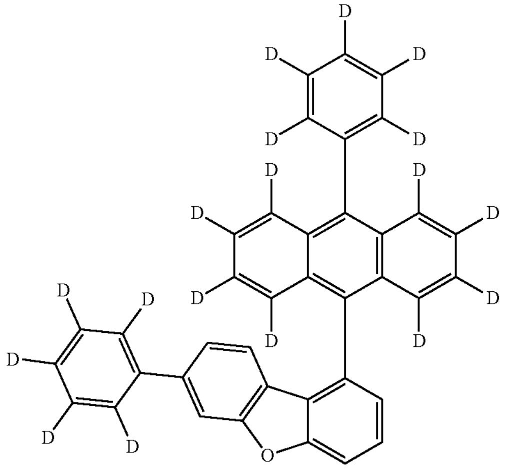
-continued
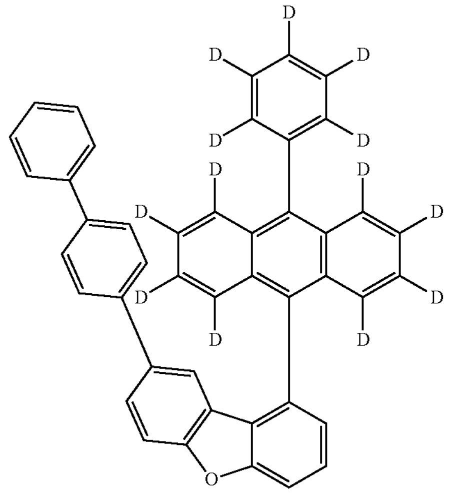
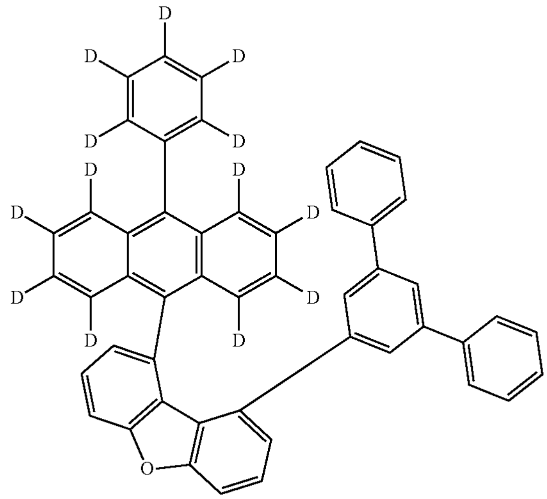
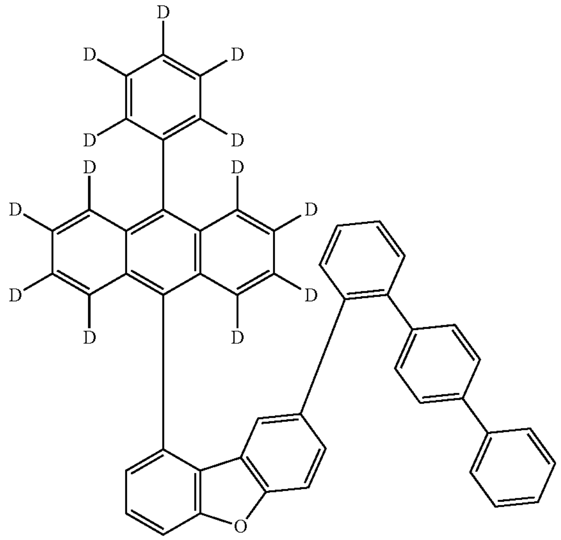

-continued
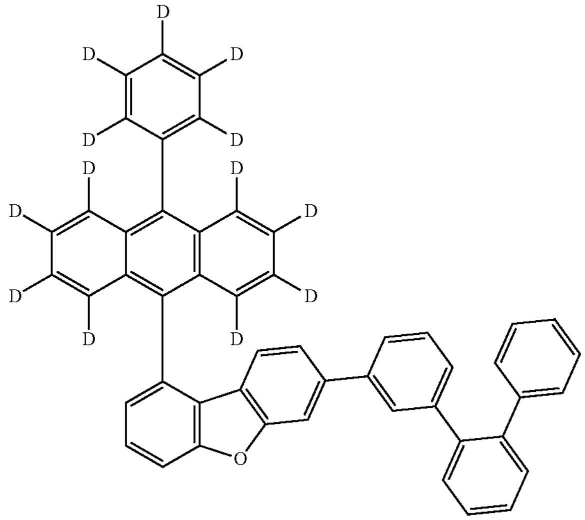
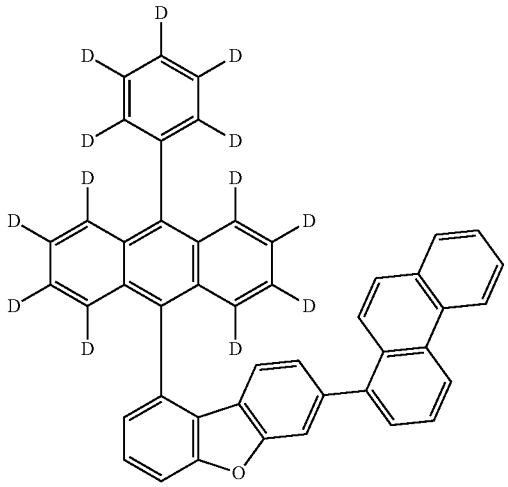
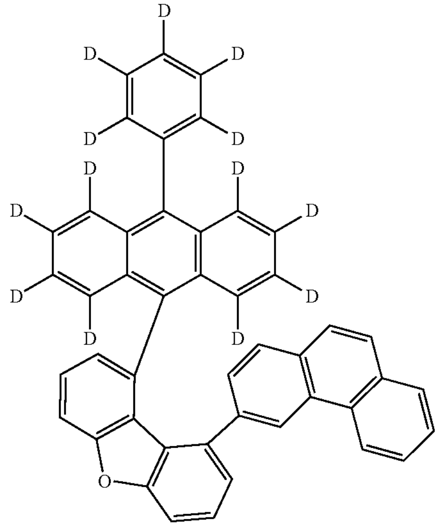
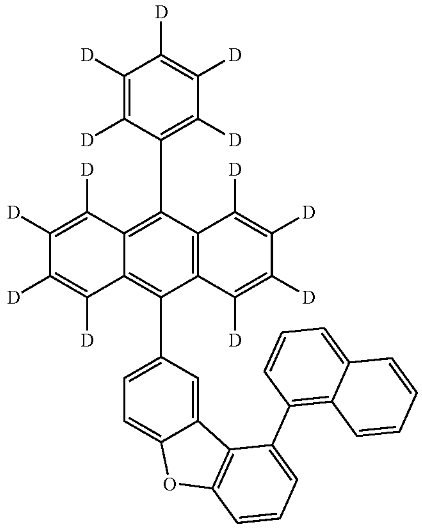
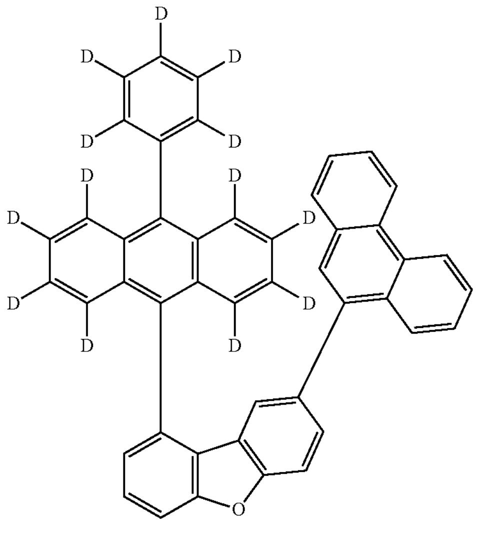
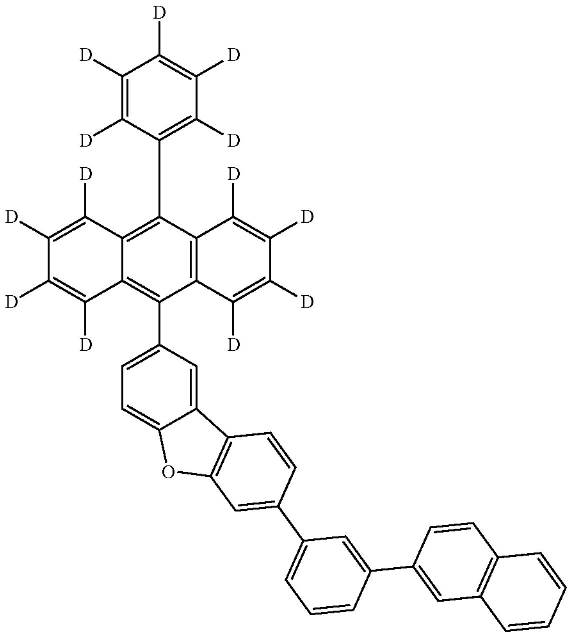

-continued
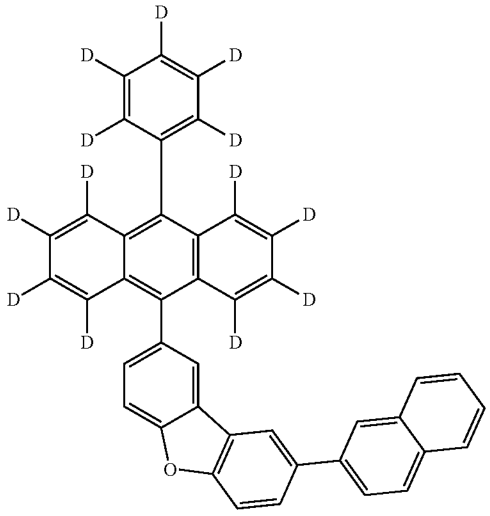
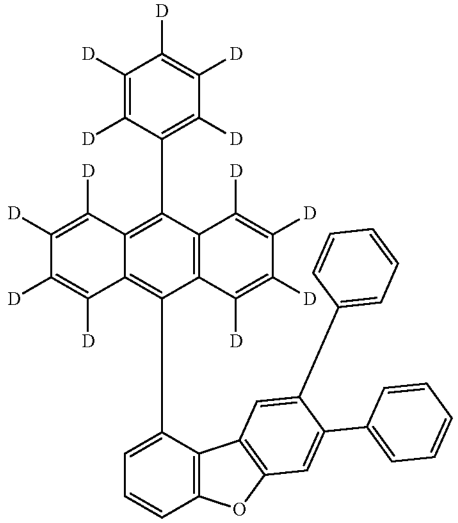
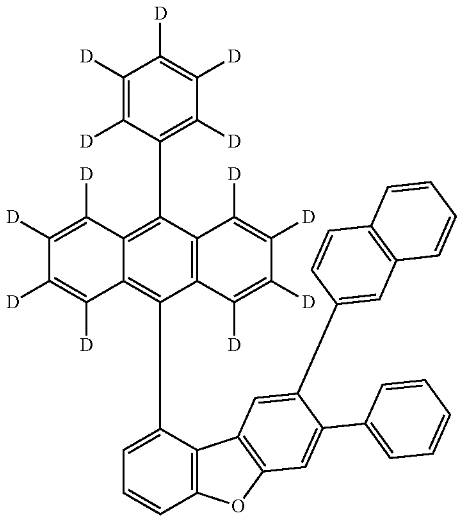
-continued
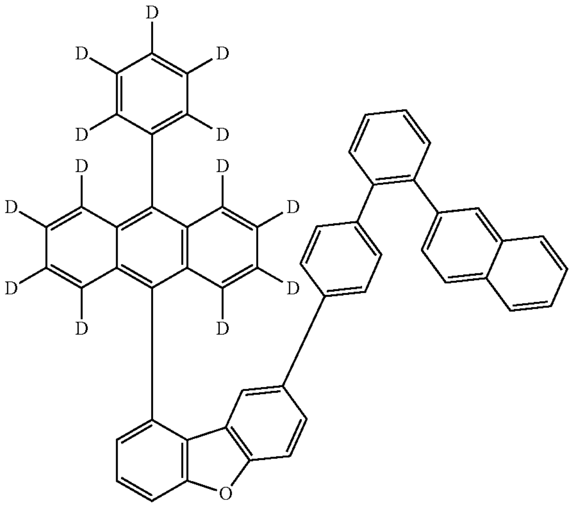
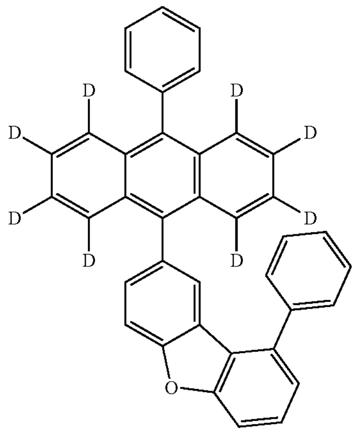
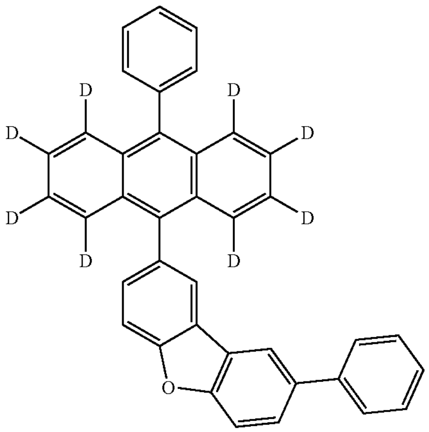

-continued
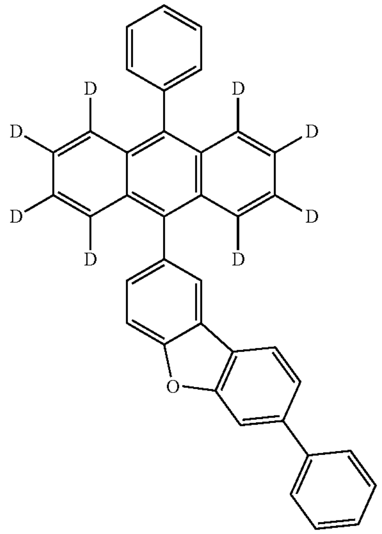
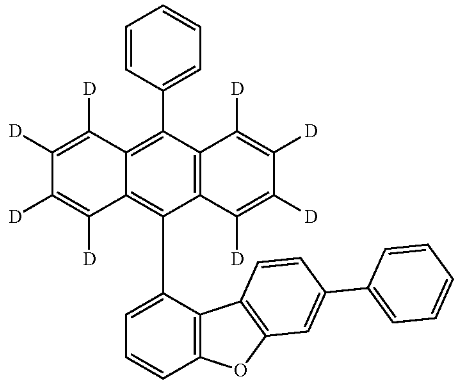
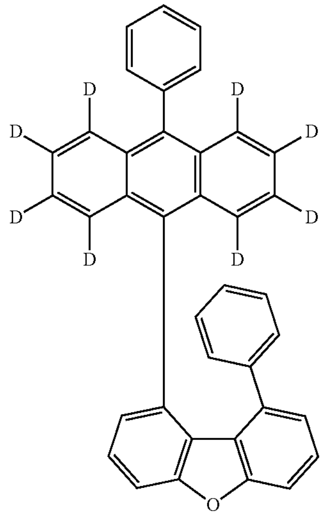
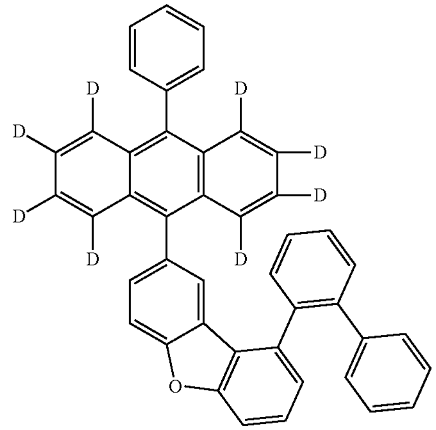
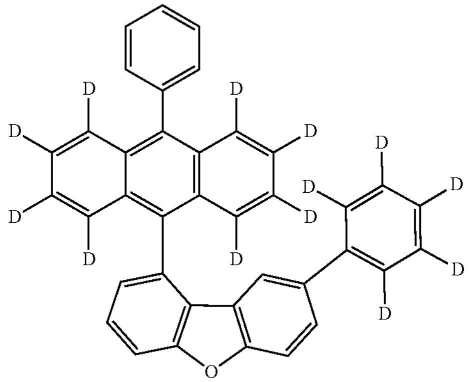
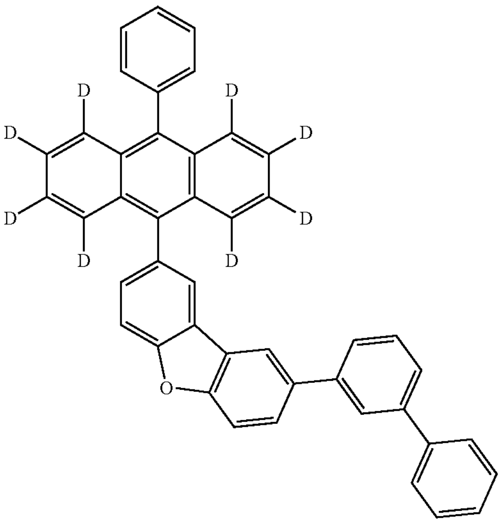
-continued -continued
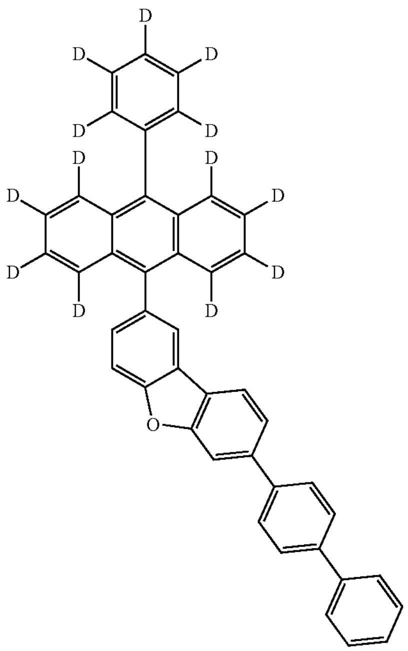
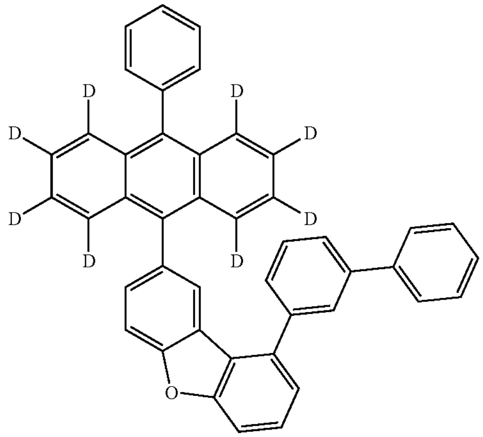
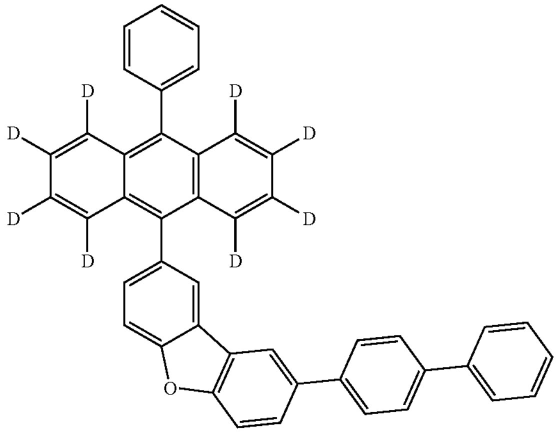
-continued
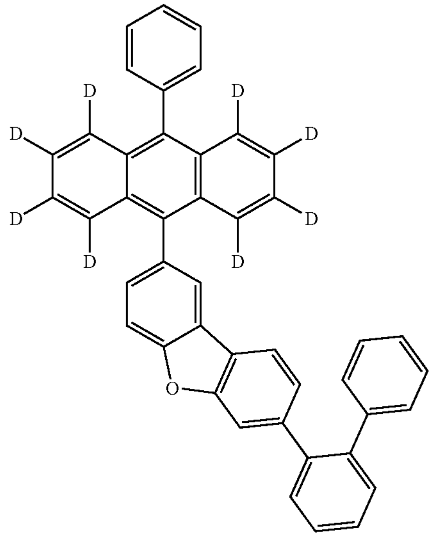
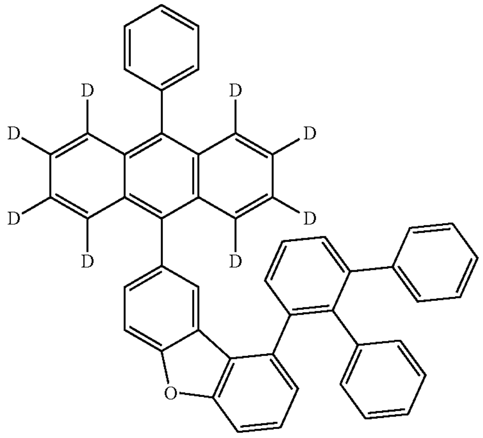
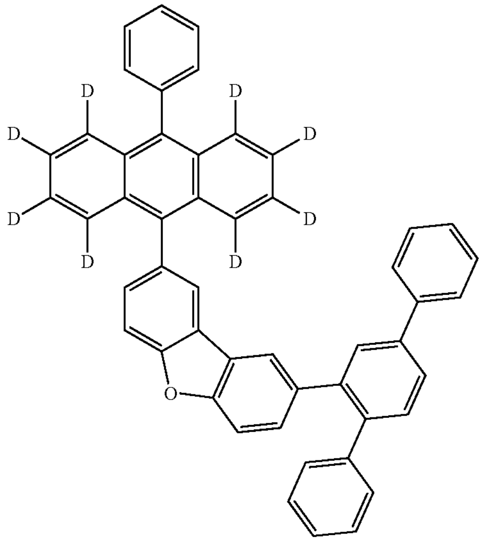

-continued
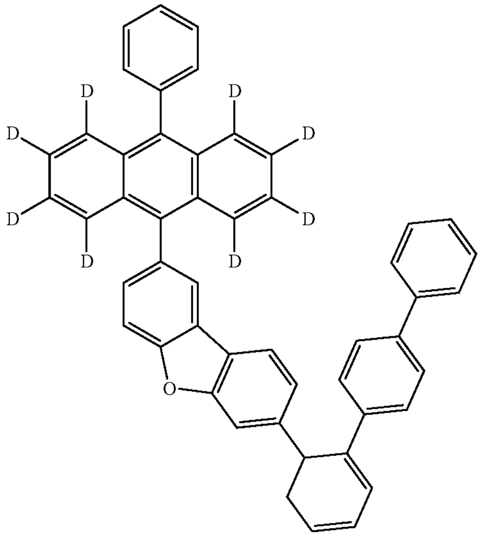
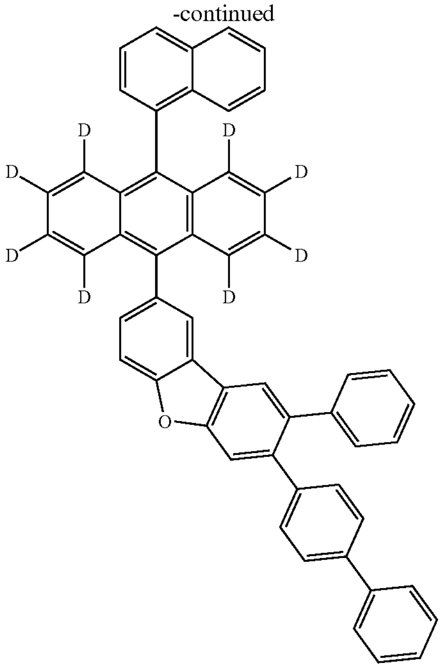
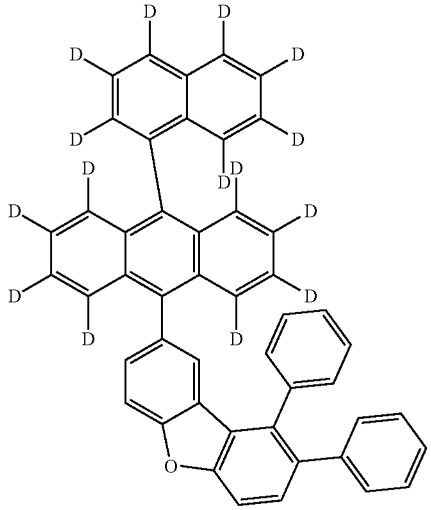
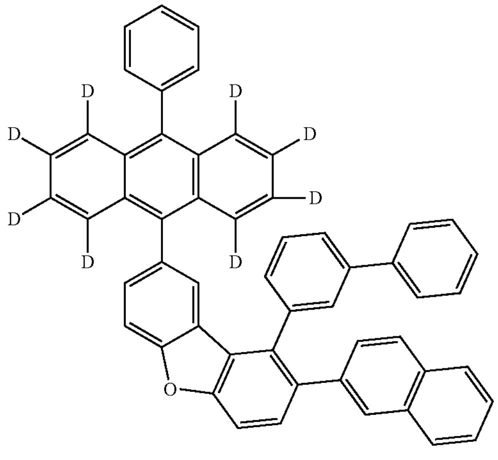
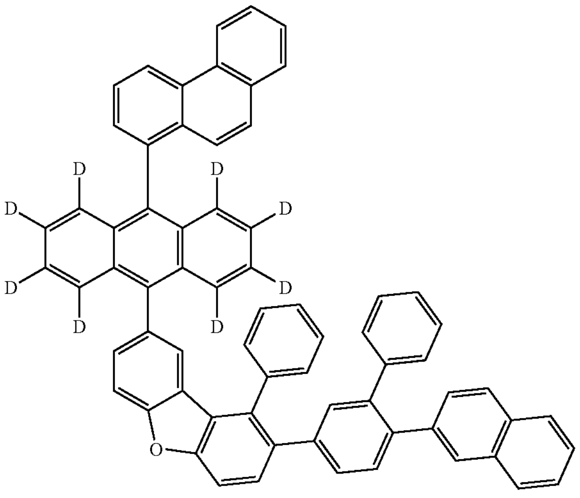
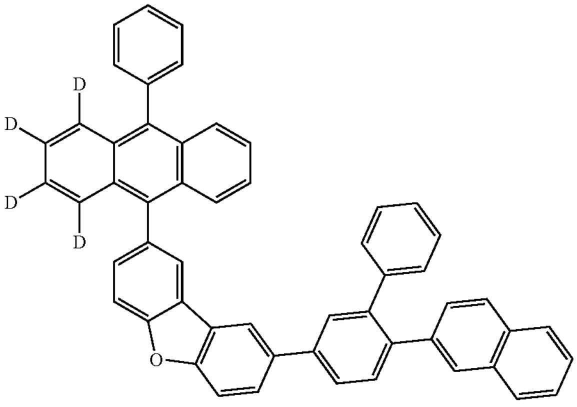
-continued -continued
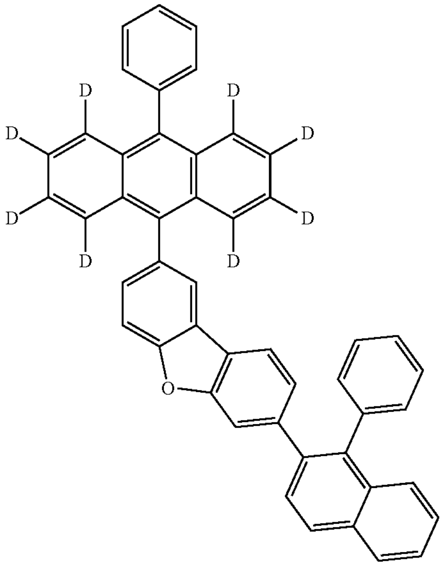
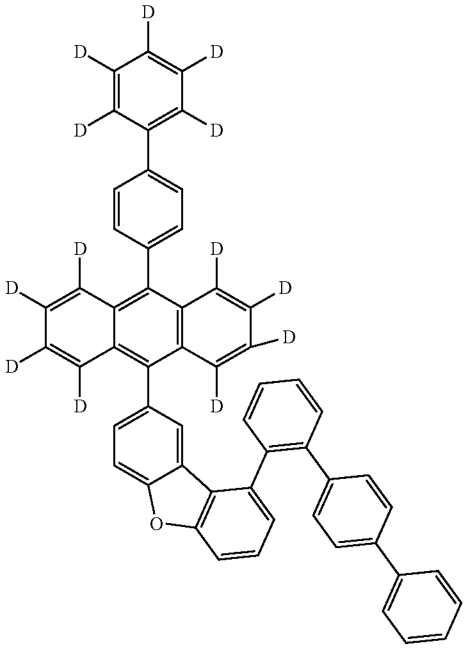
-continued
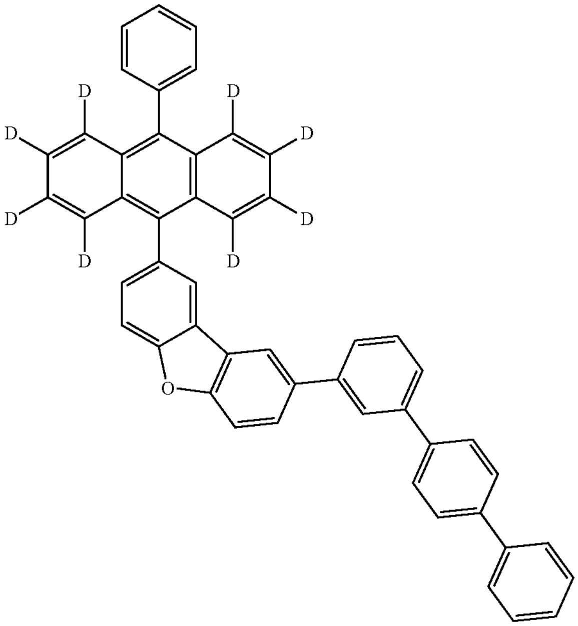
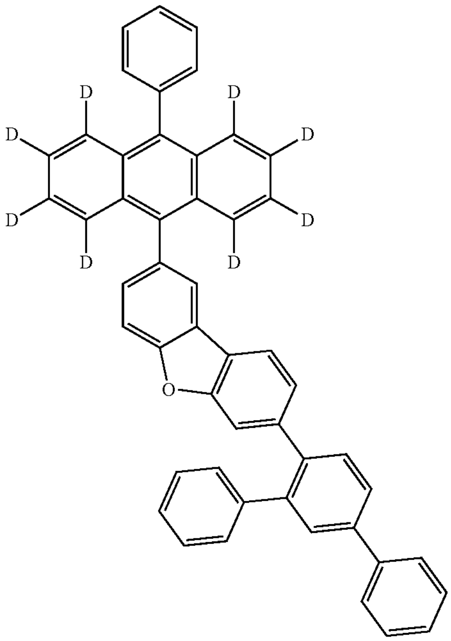
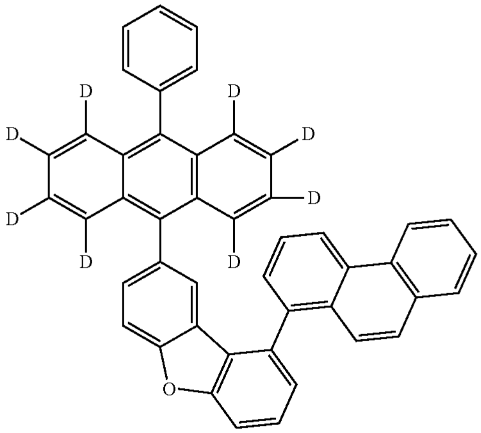

-continued
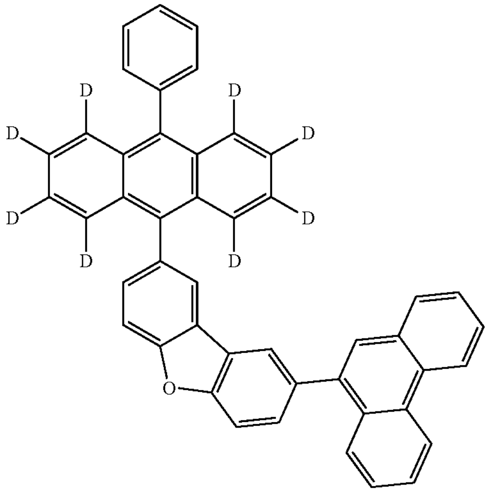
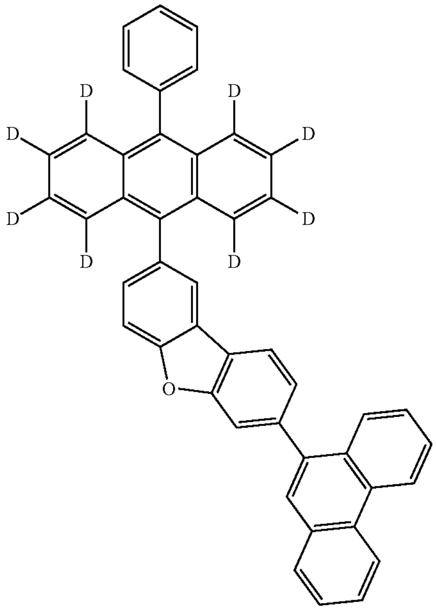
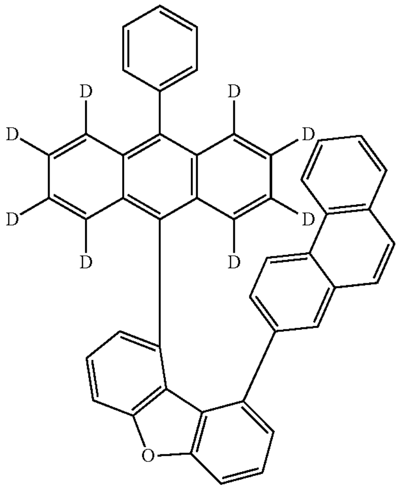
-continued
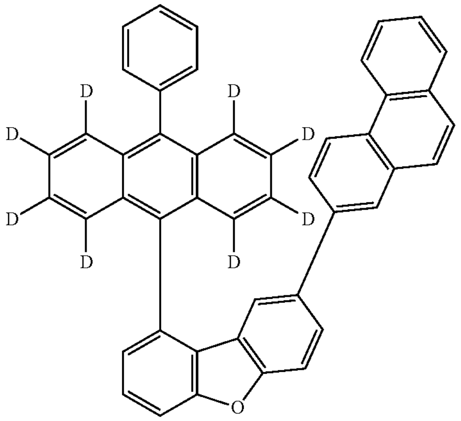
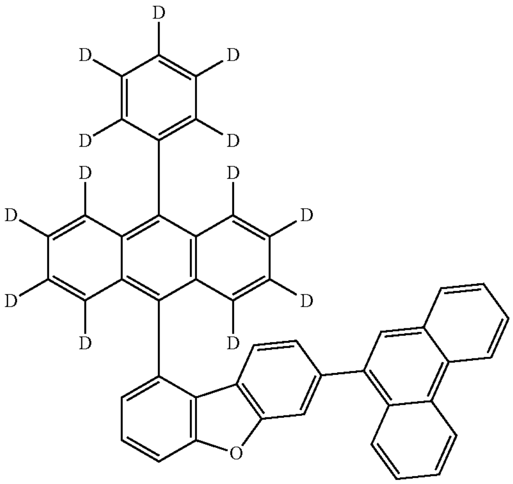
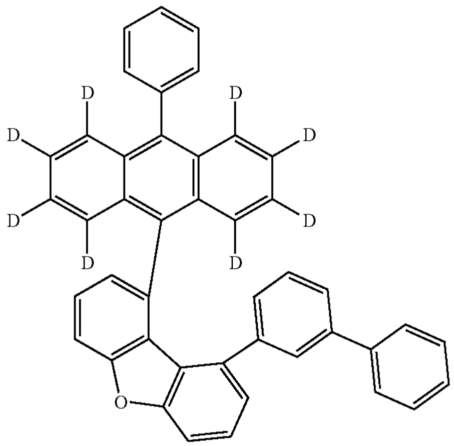

-continued
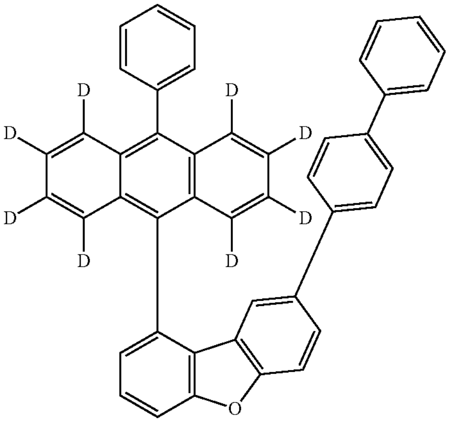
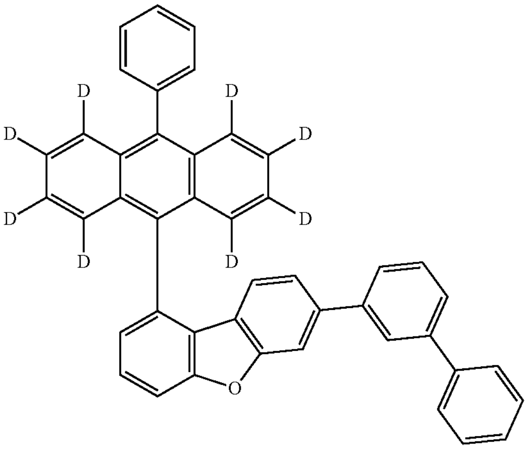
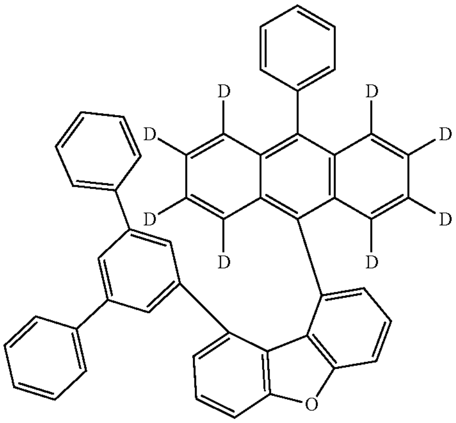
-continued
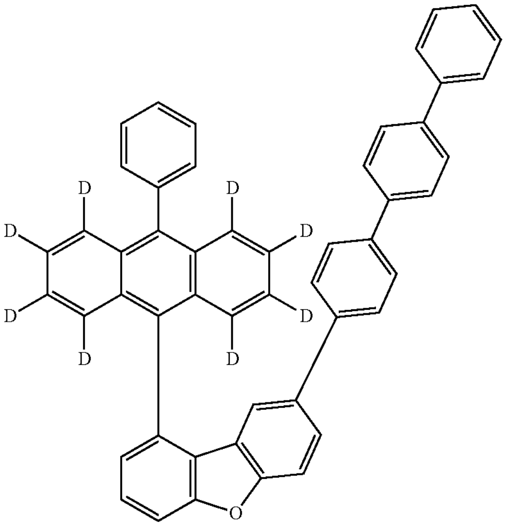
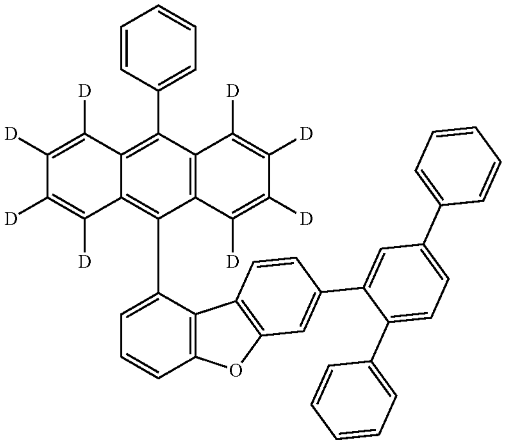
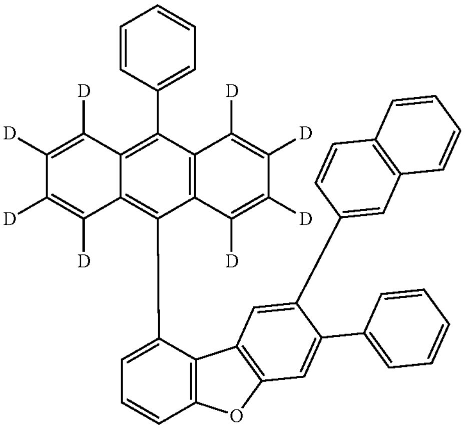

-continued
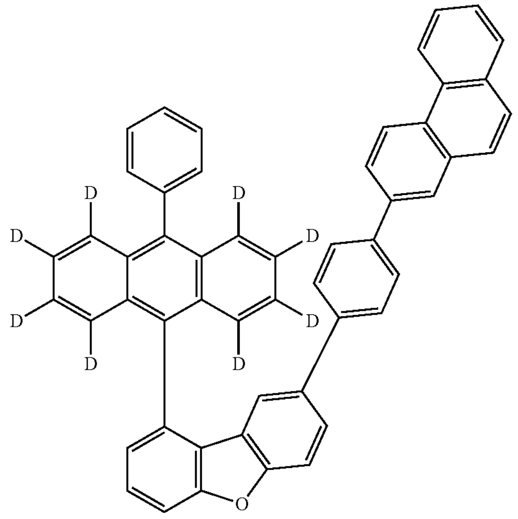
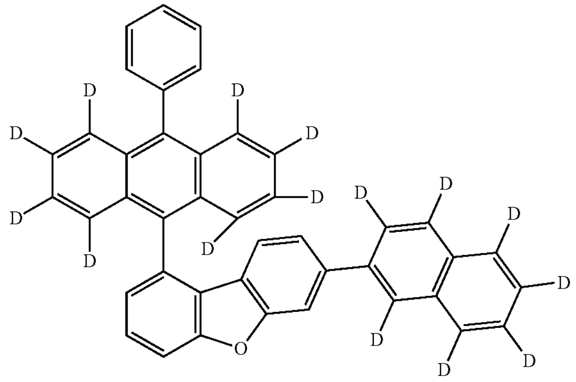
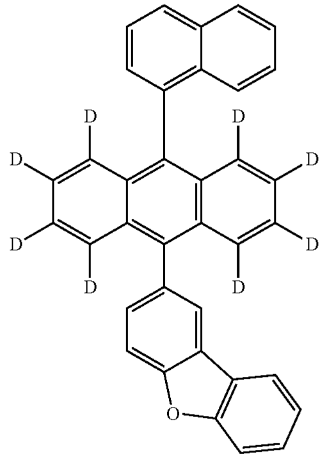
-continued
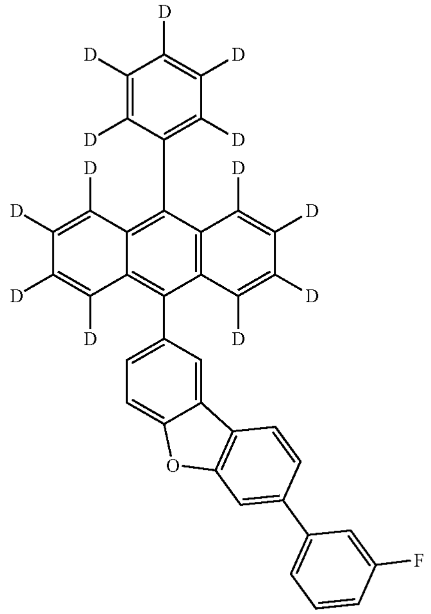
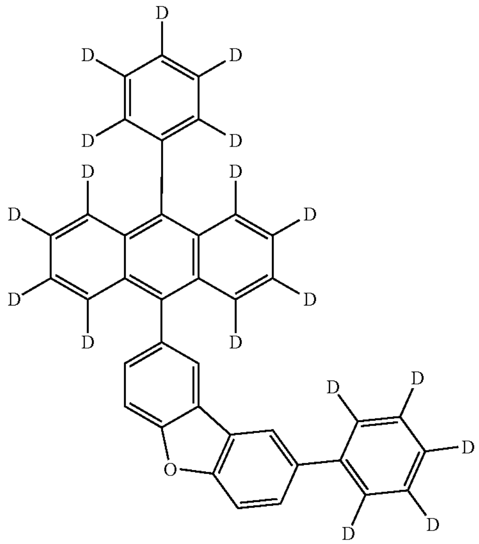
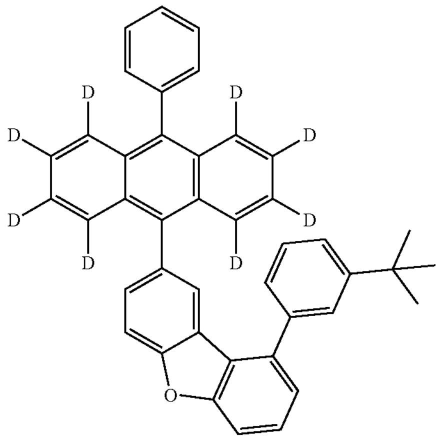

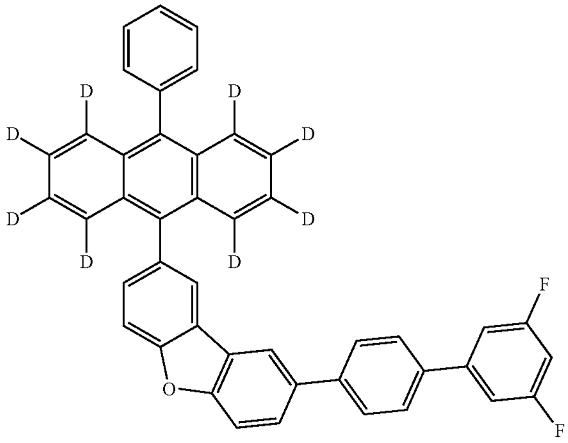
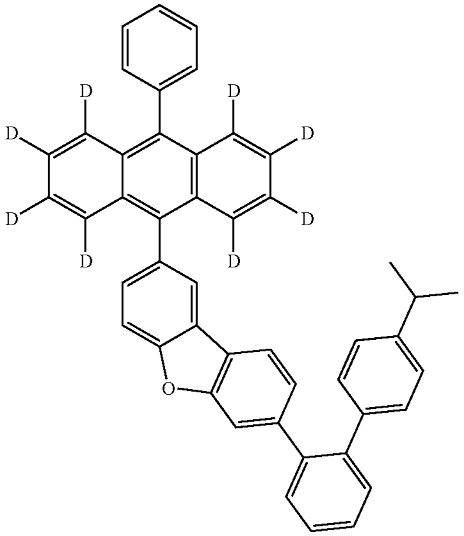
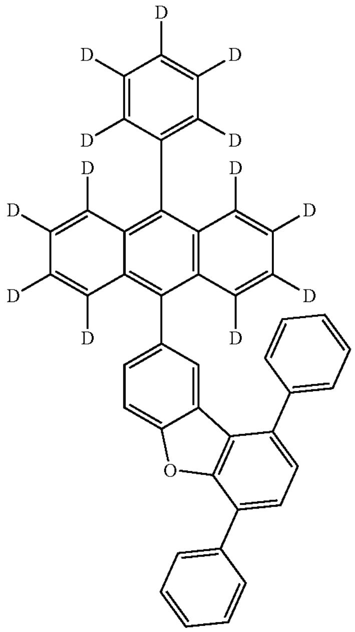
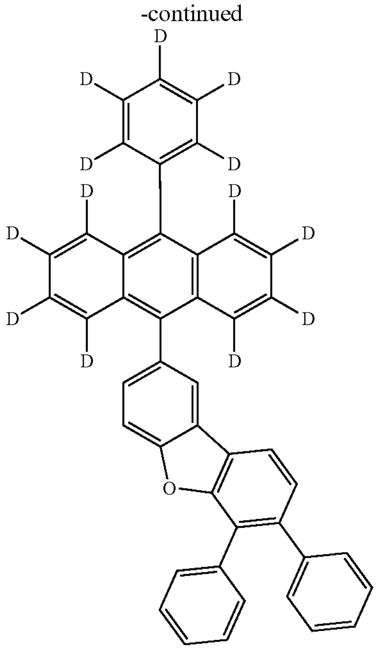
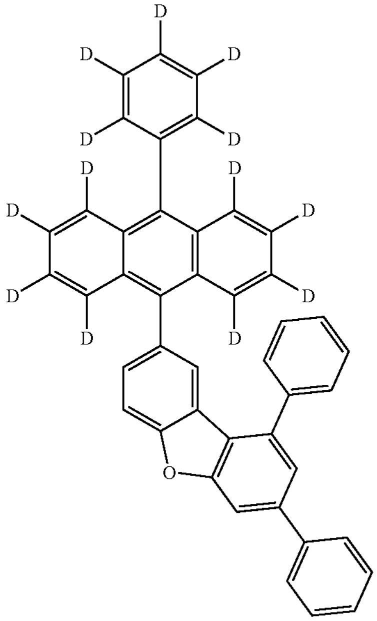

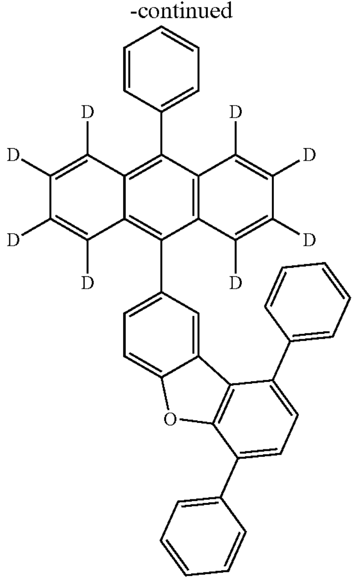
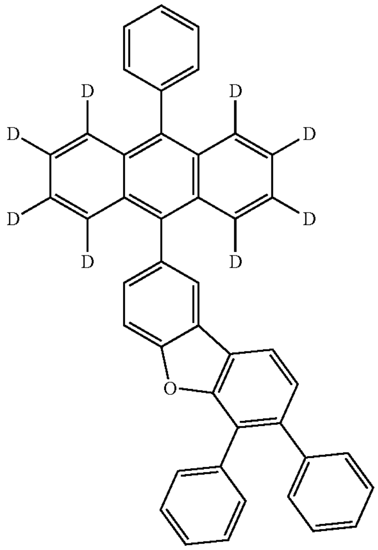
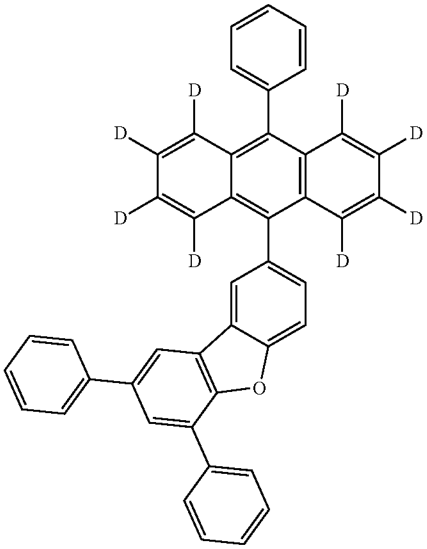
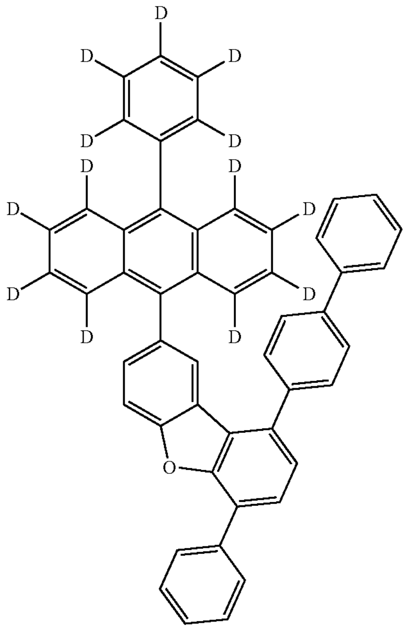
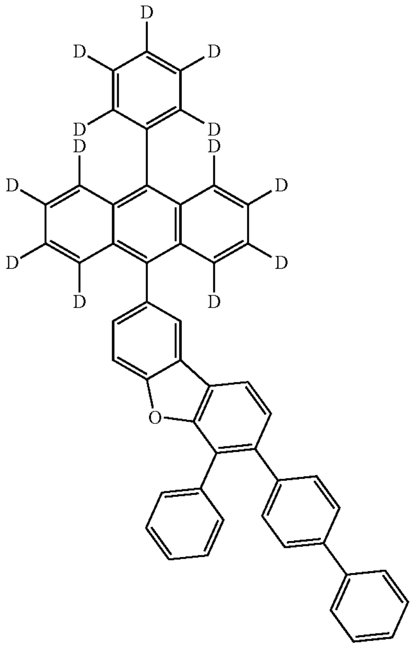

-continued
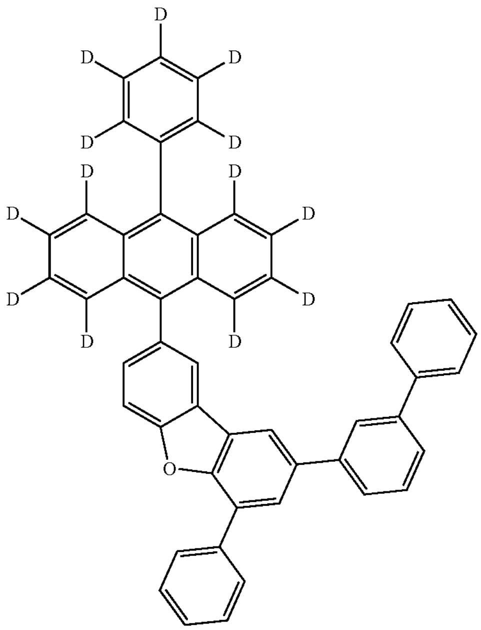
-continued
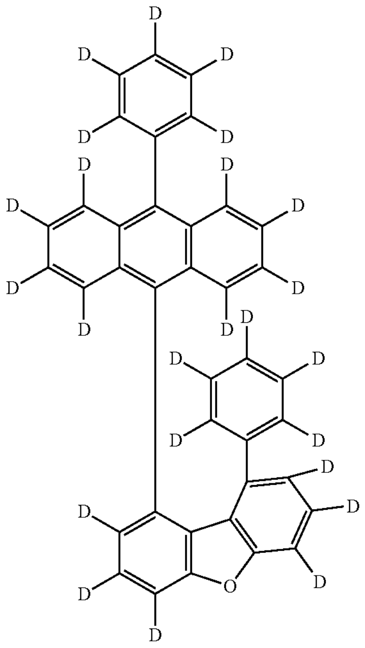
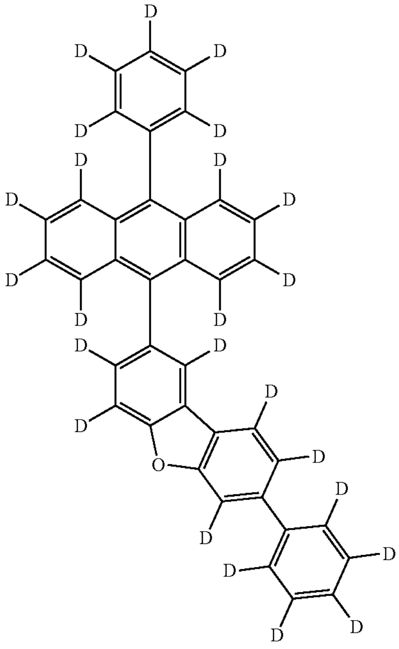
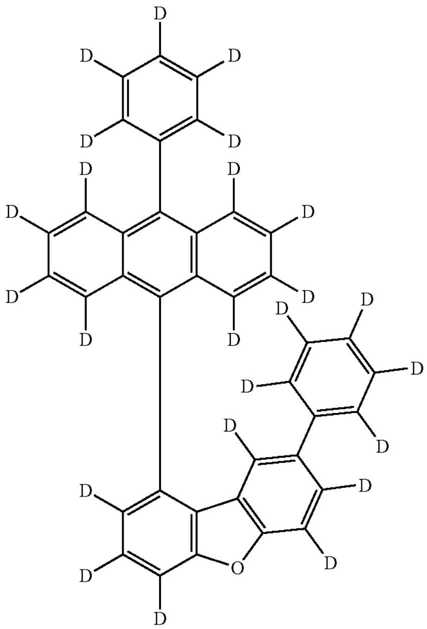

-continued
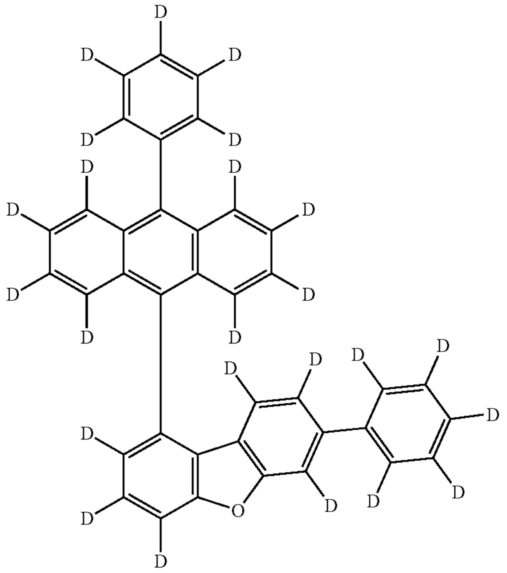
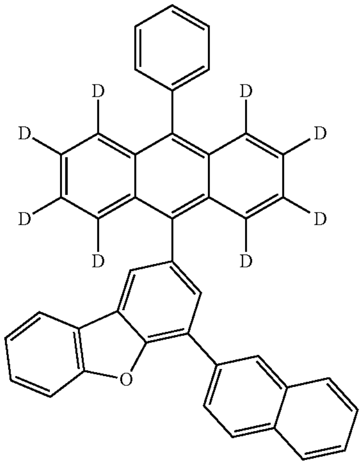
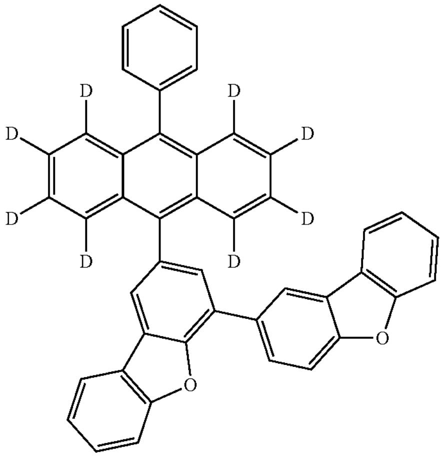
-continued
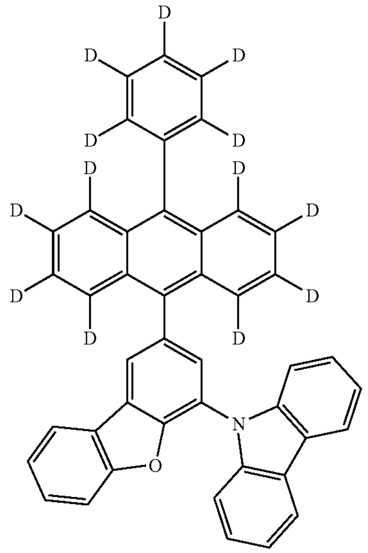
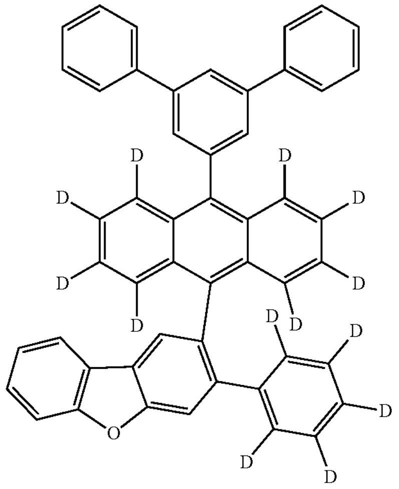
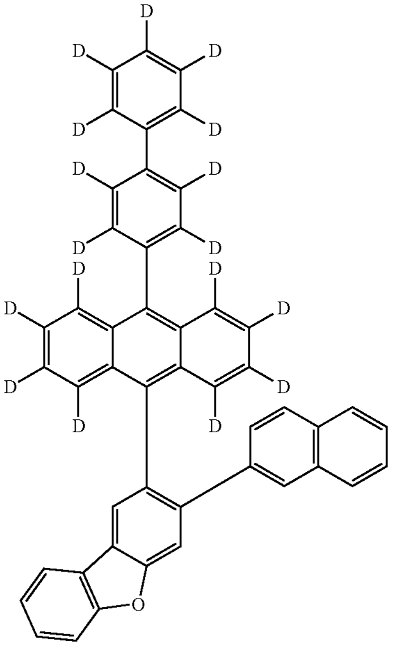

-continued
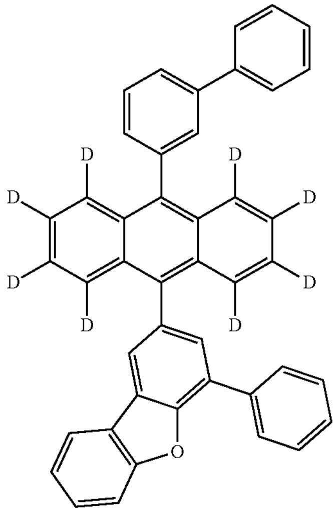
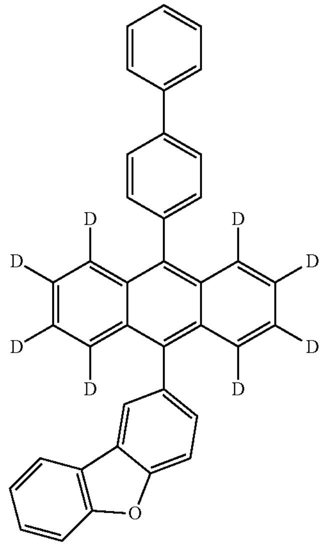
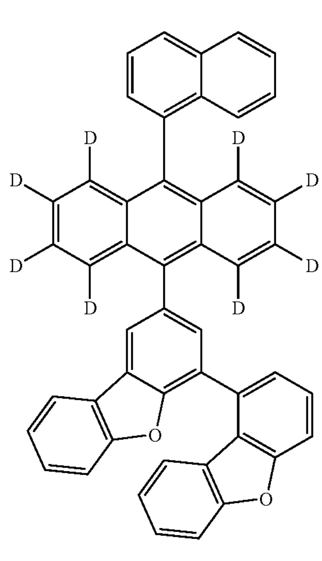
-continued
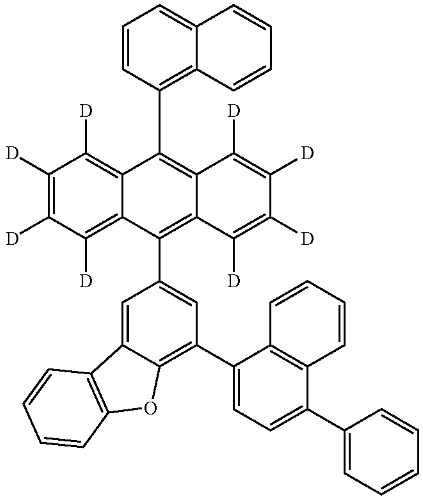
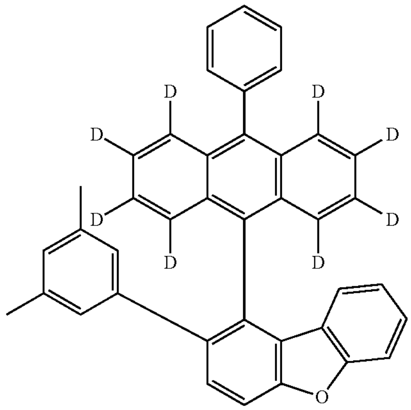
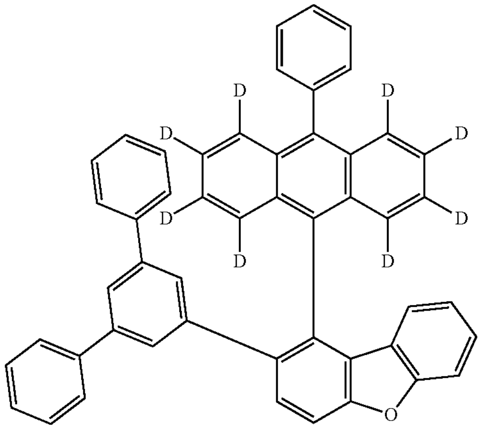

-continued
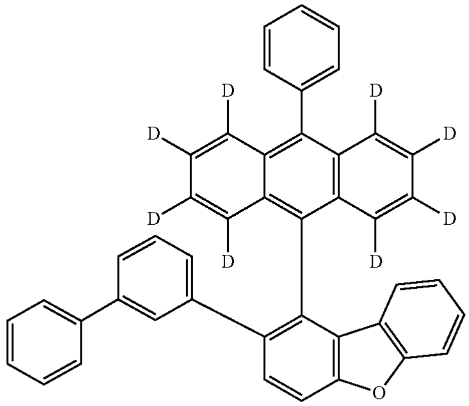
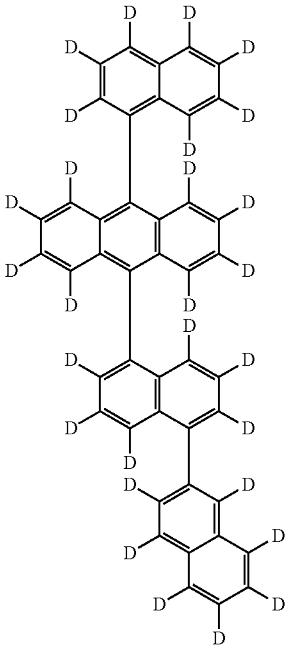
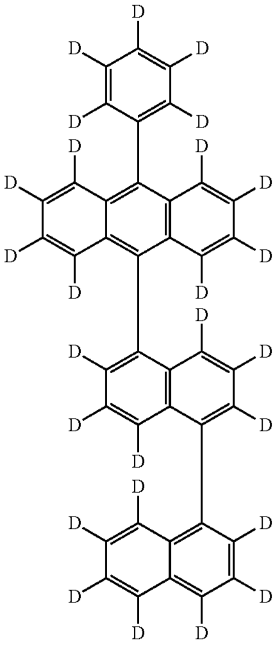
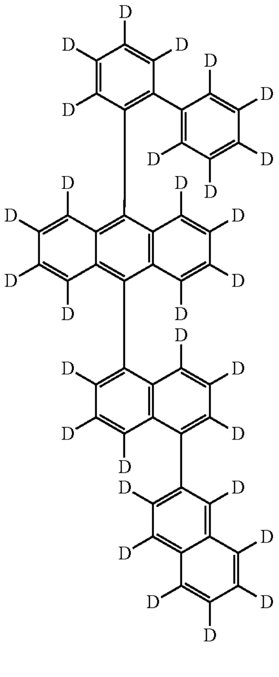
-continued
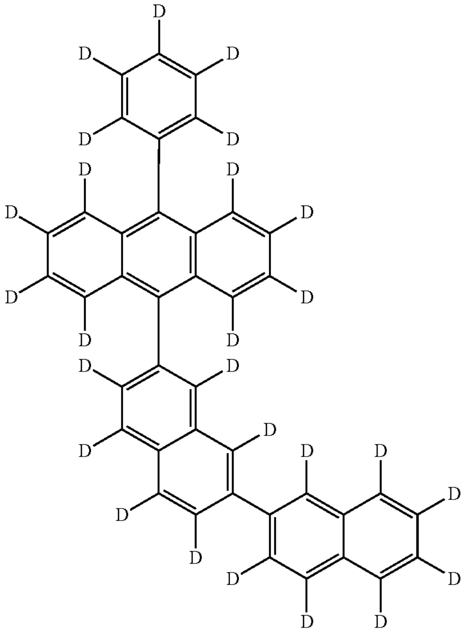
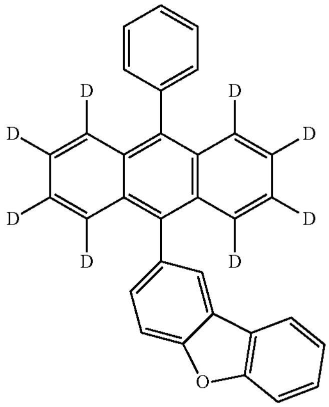
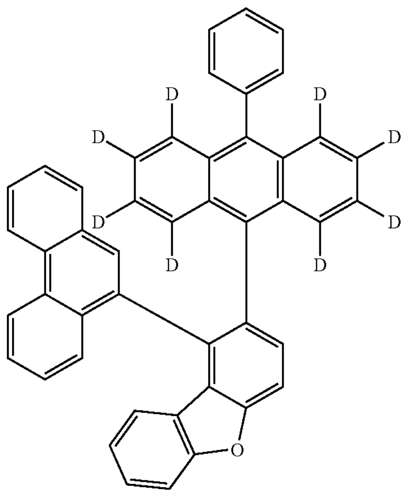

-continued
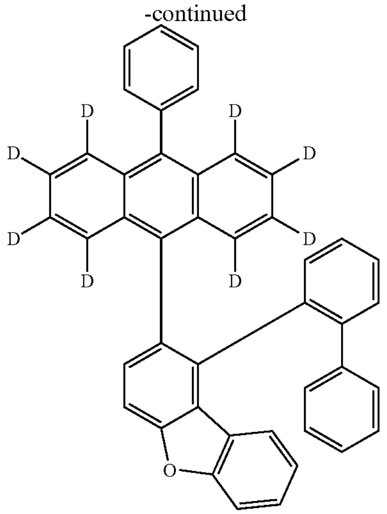
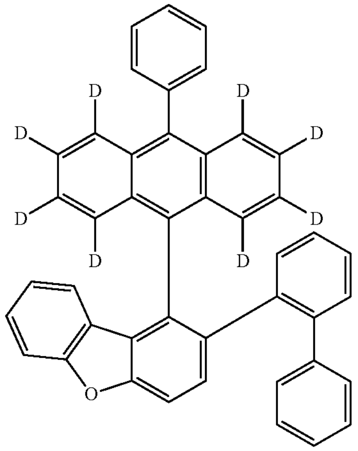
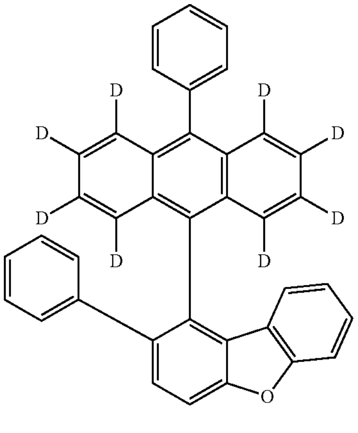
-continued
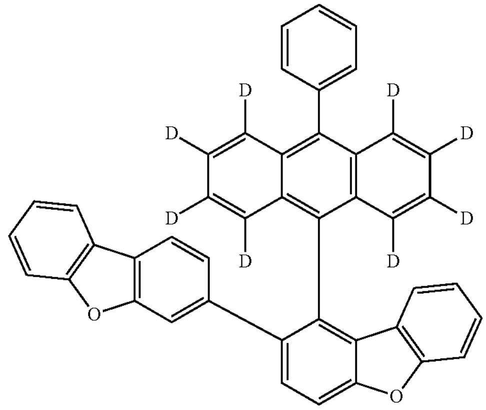
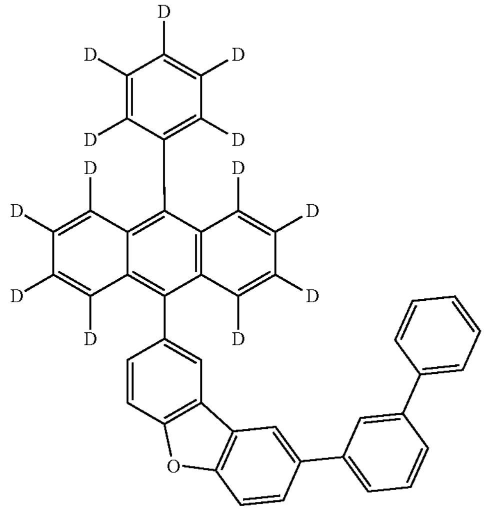
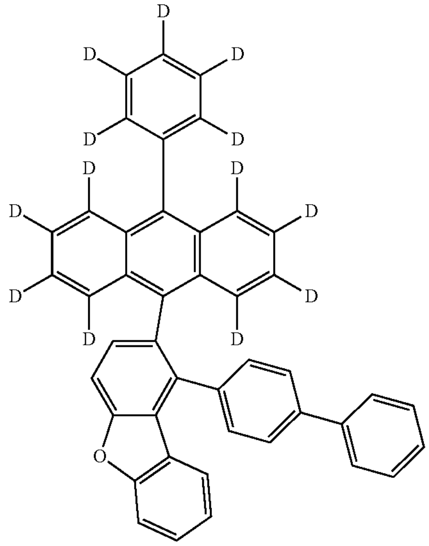

-continued
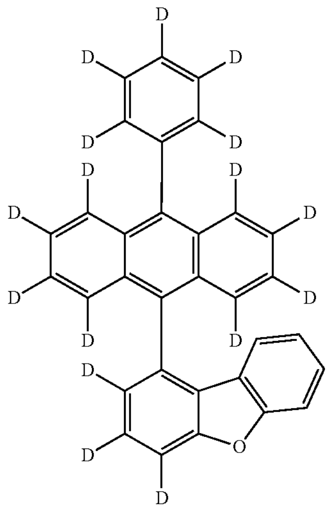
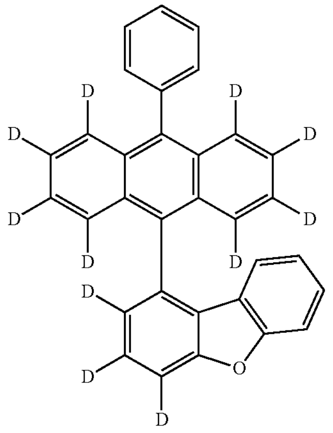
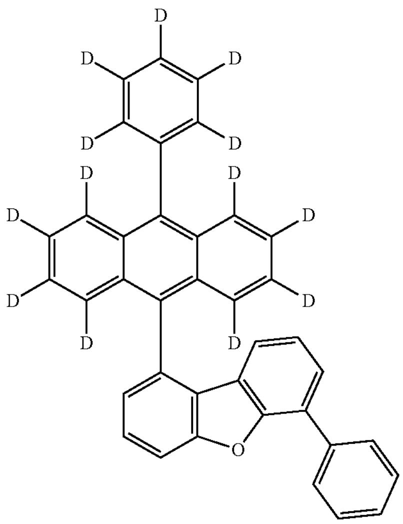
-continued
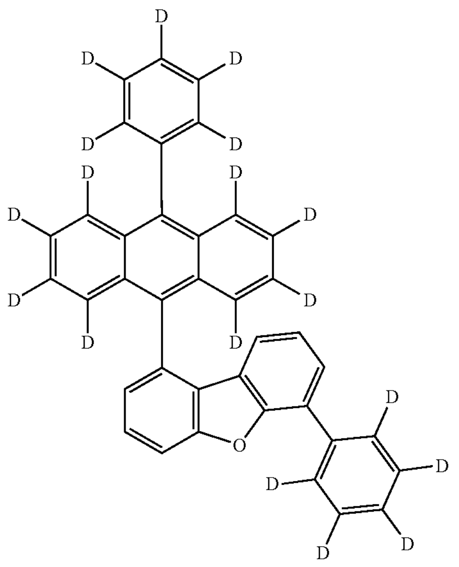 [SMILES: [2H]c1c([2H])c([2H])c(-c2cccc3c2oc2cccc(-c4c5c([2H])c([2H])c([2H])c([2H])c5c(-c5c([2H])c([2H])c([2H])c([2H])c5[2H])c5c([2H])c([2H])c([2H])c([2H])c45)c23)c([2H])c1[2H]]
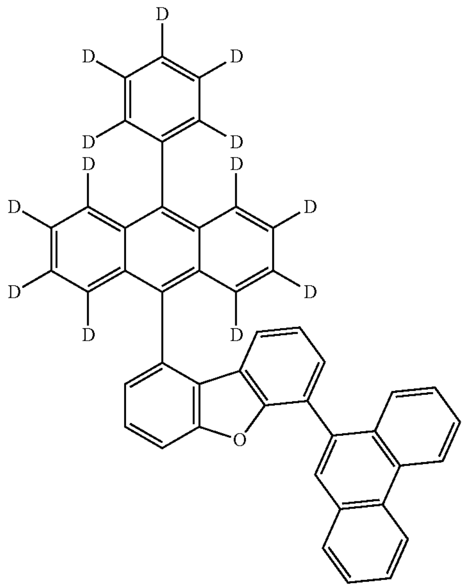

-continued
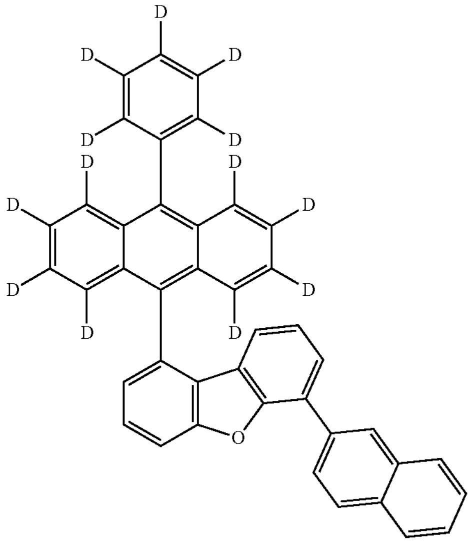
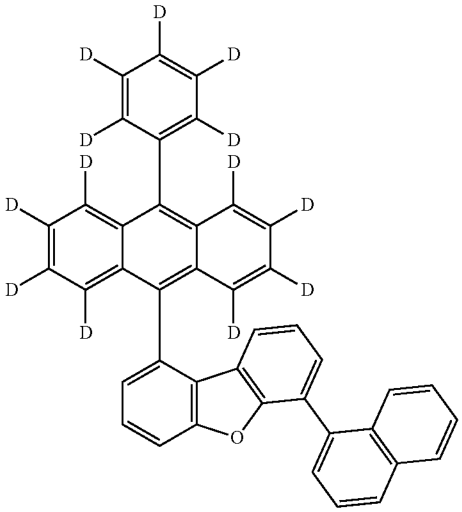
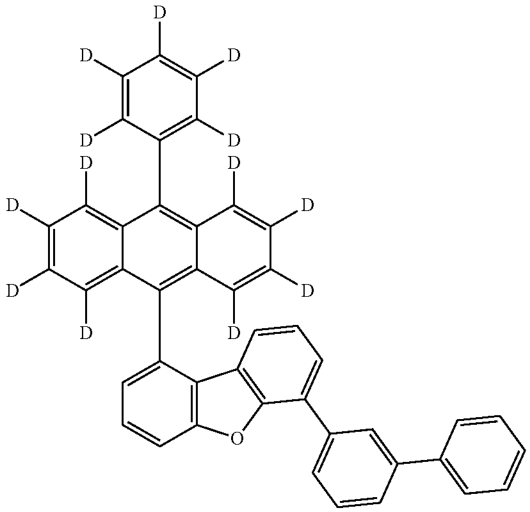
-continued
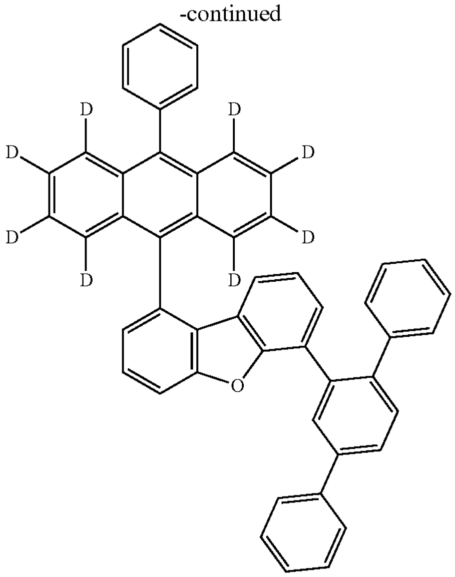
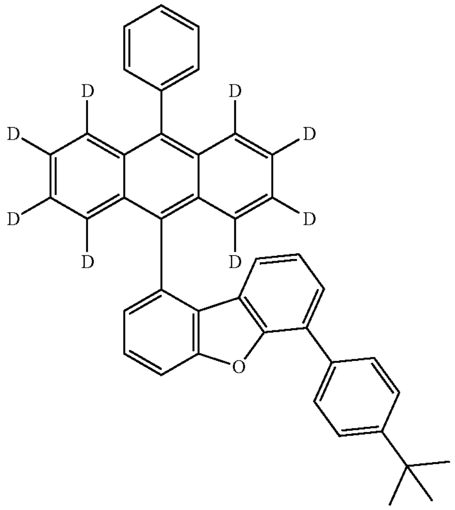
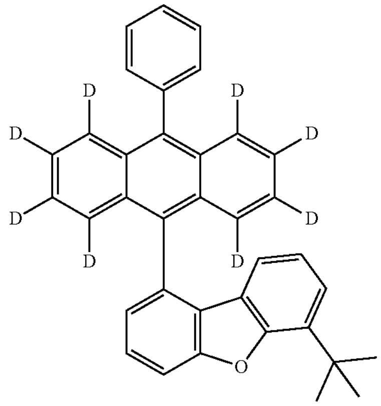

-continued
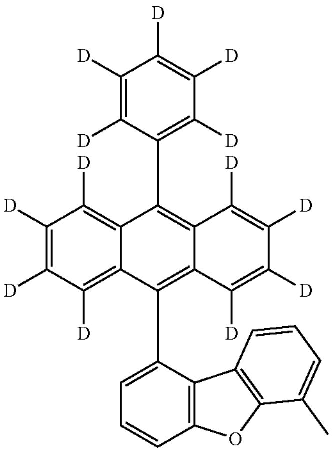
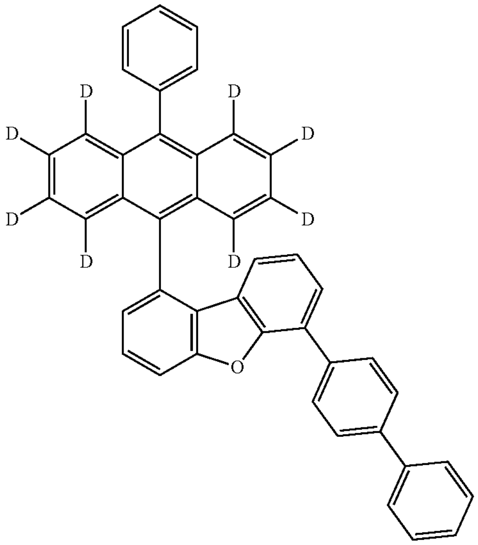
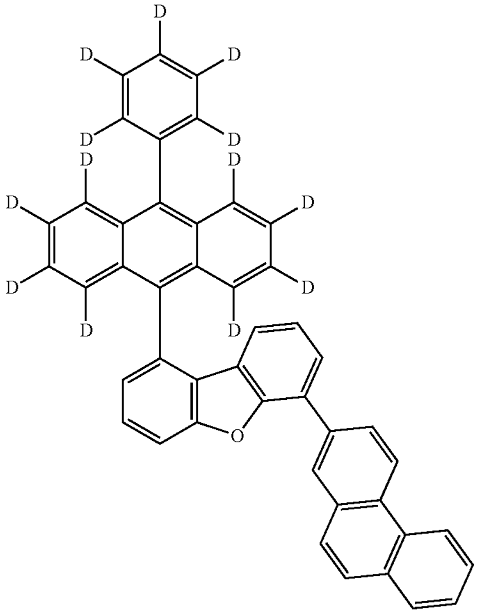
-continued
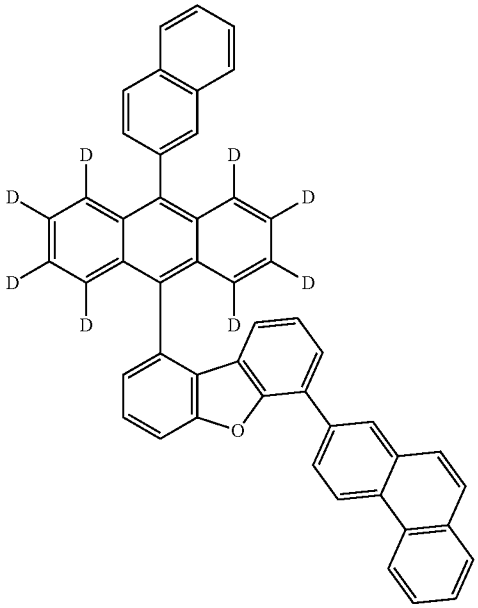
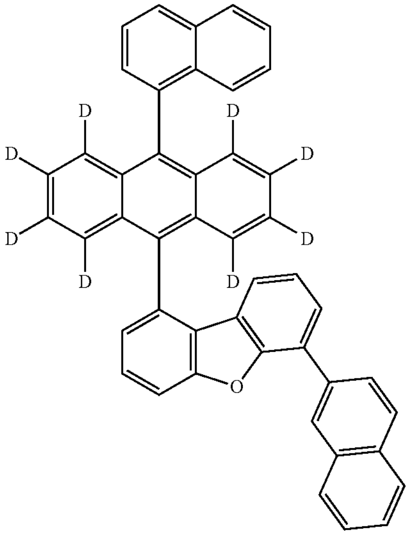
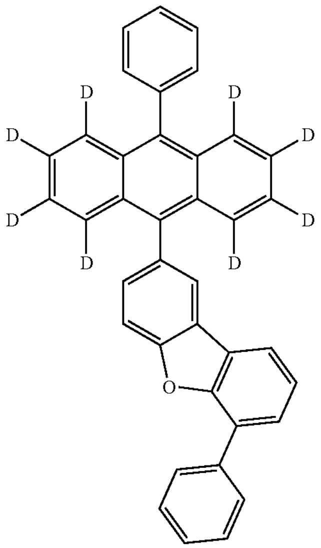

-continued
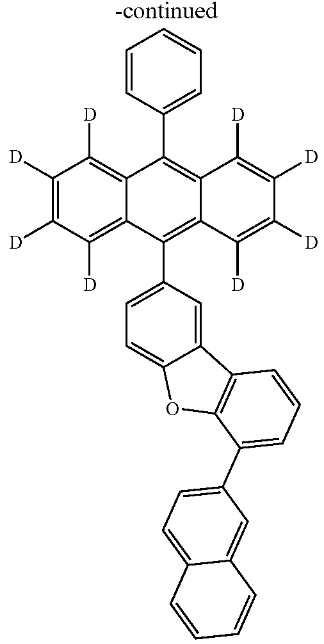
-continued
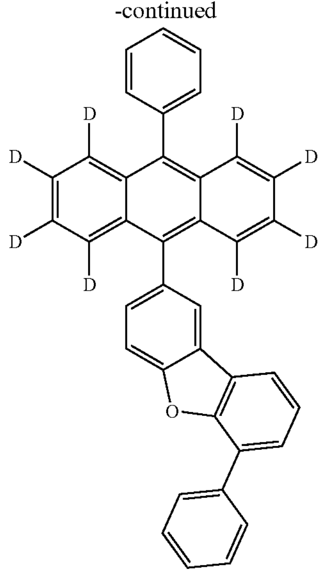
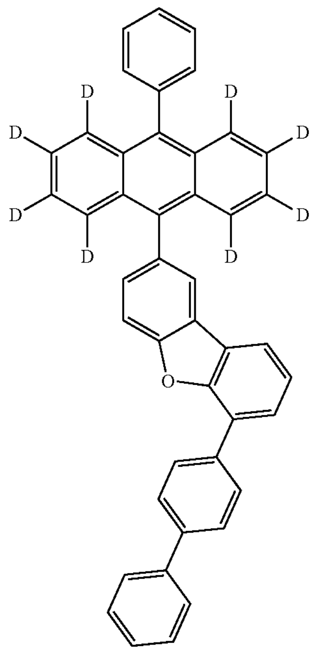
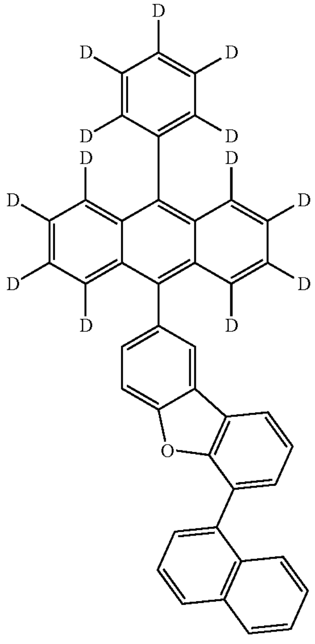

-continued
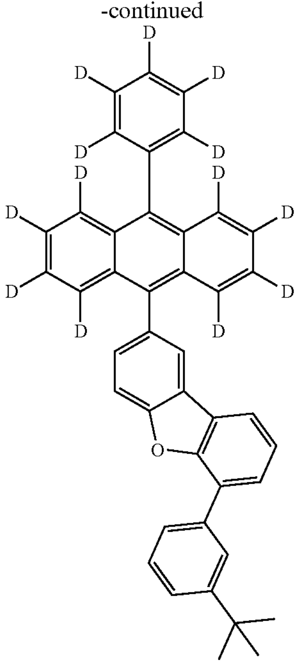
-continued
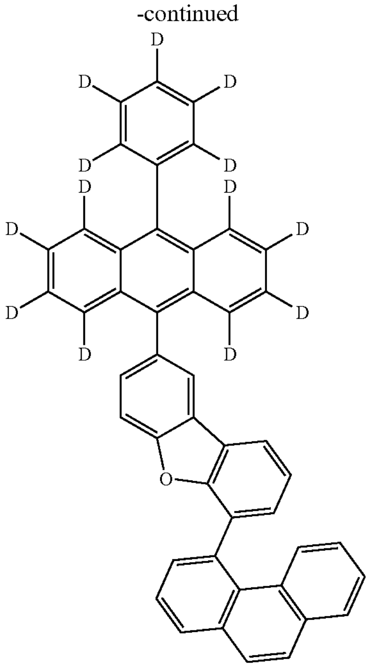
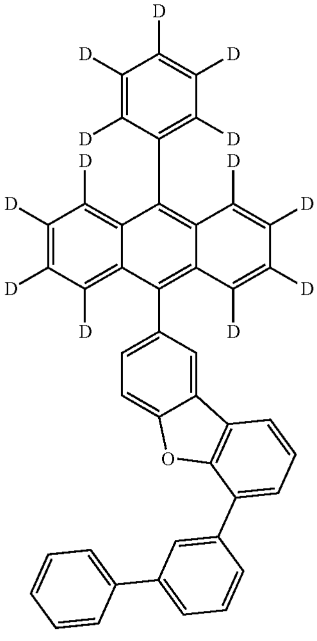
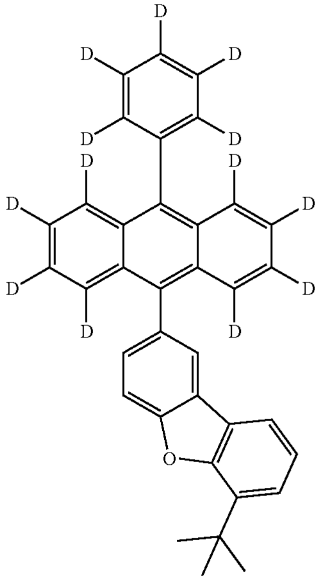

-continued
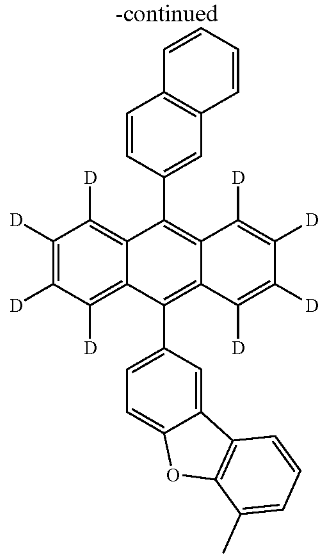
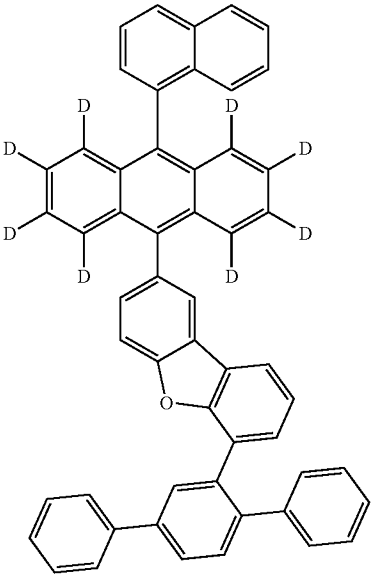
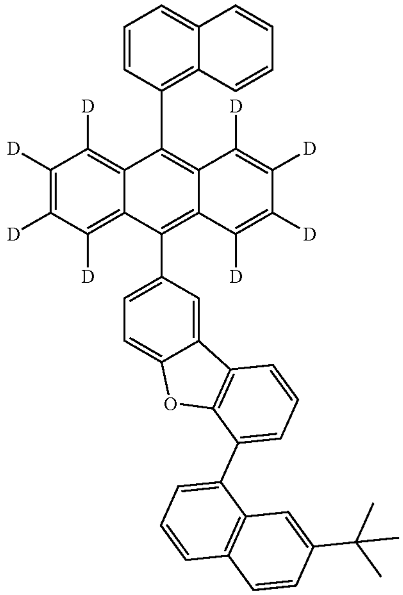
-continued
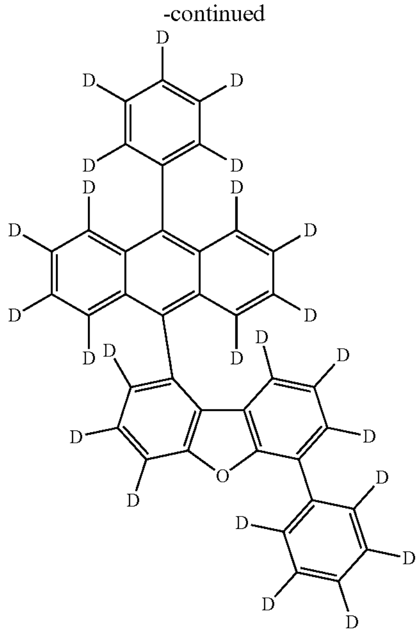
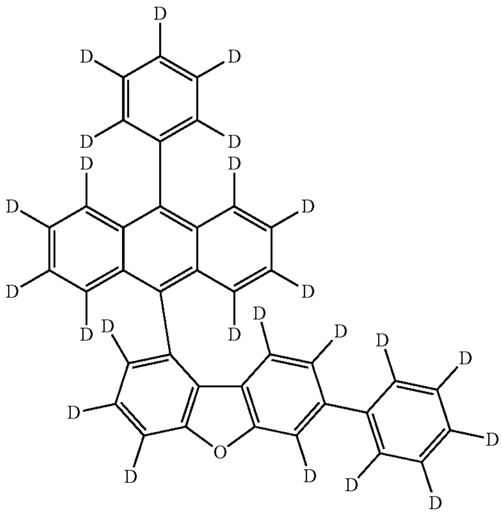

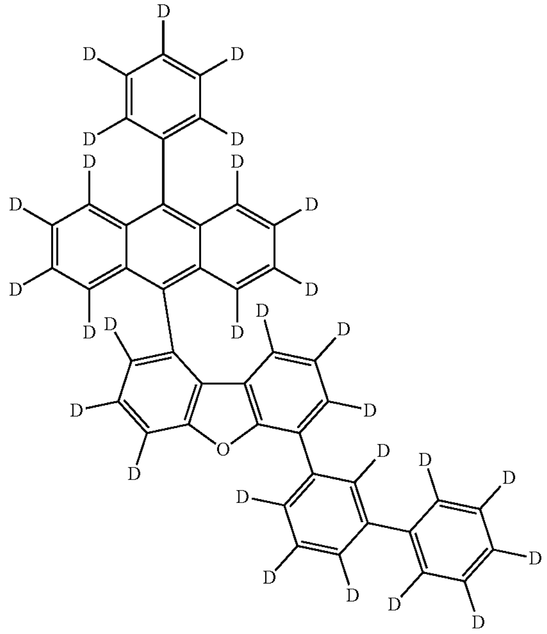
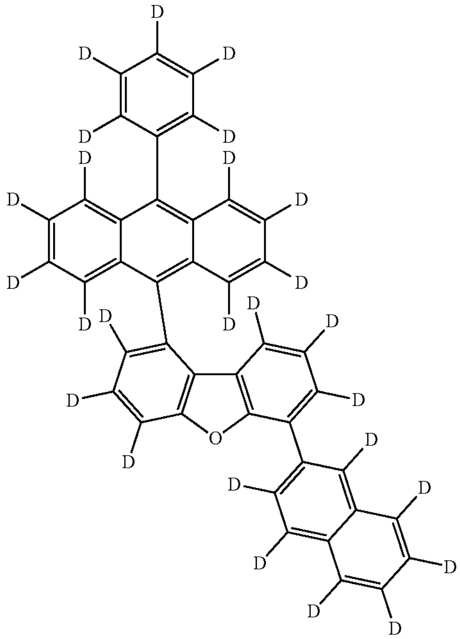
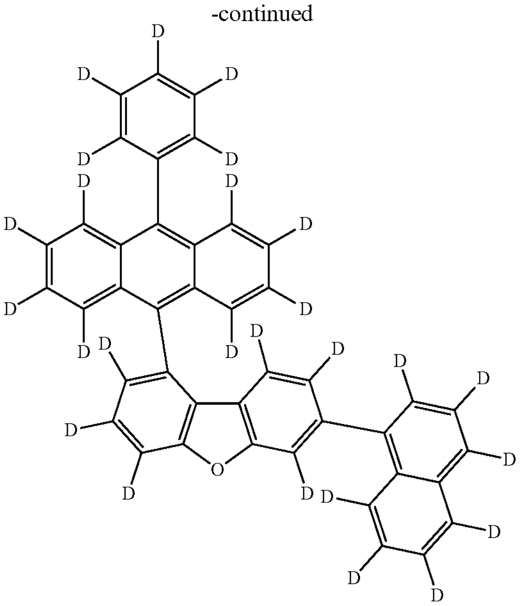
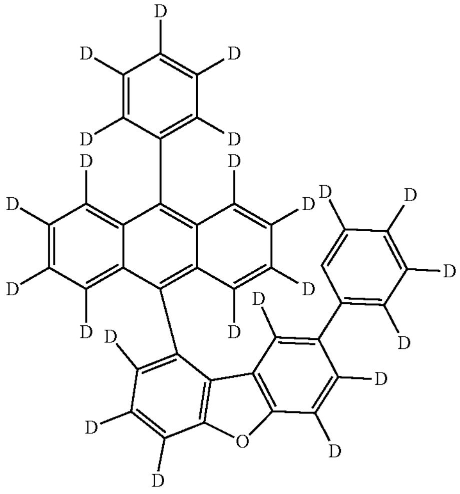
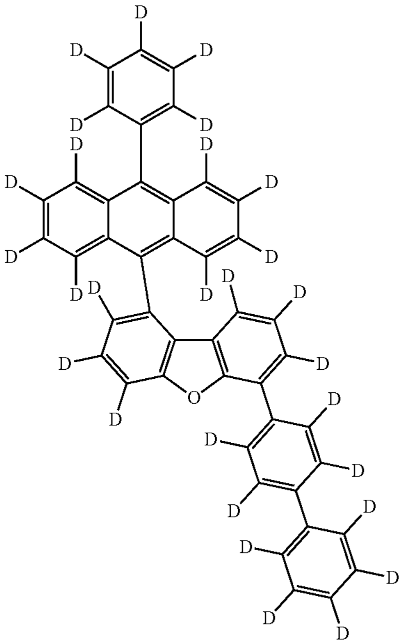

-continued
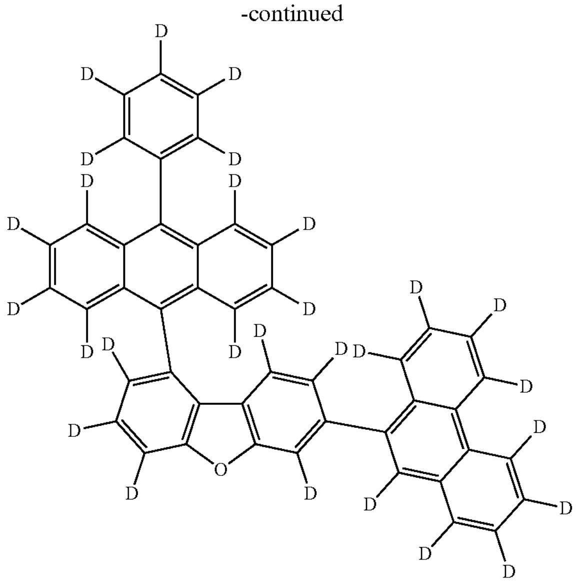
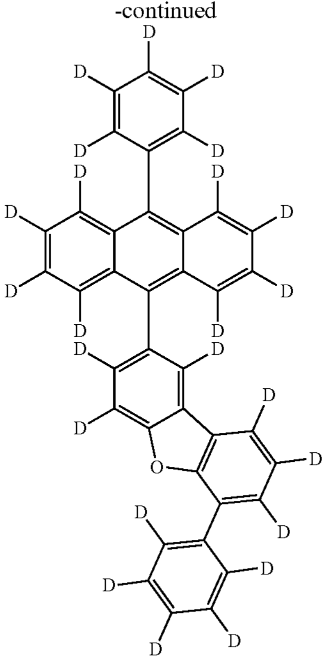
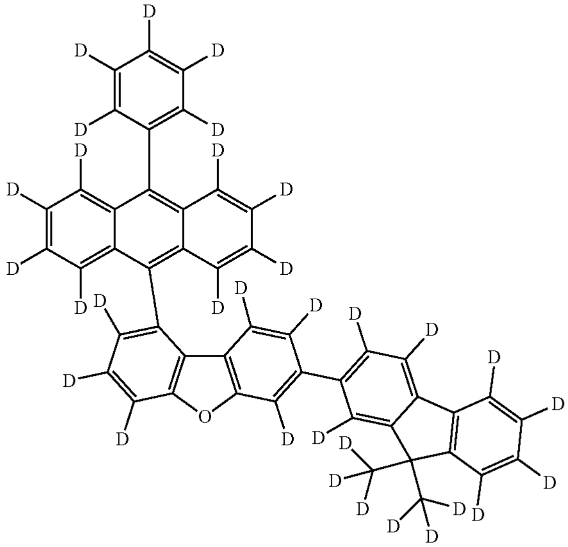
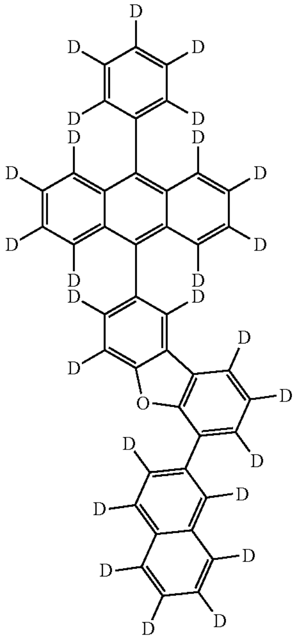

-continued
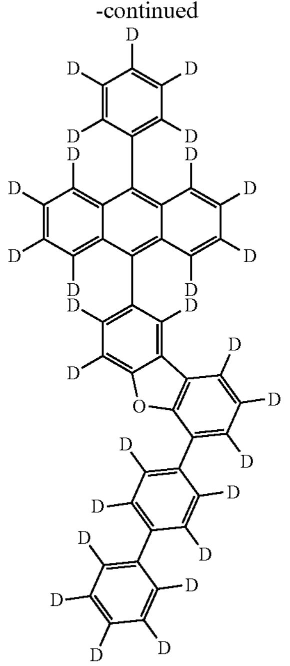
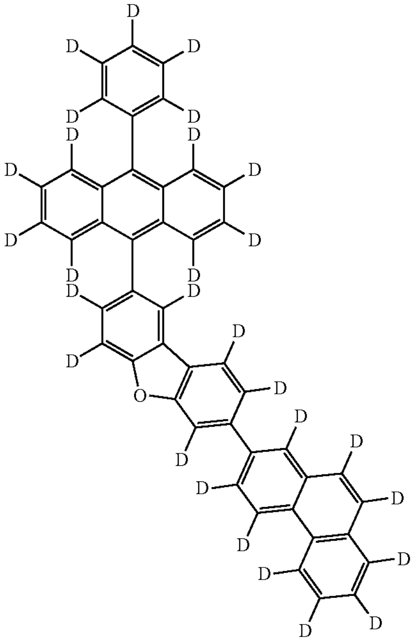
-continued
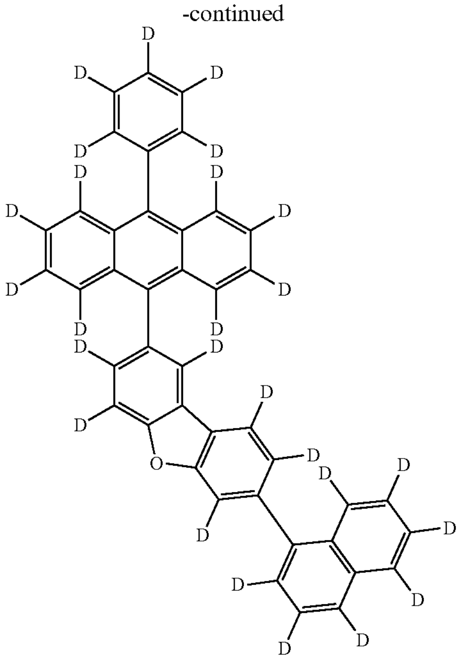
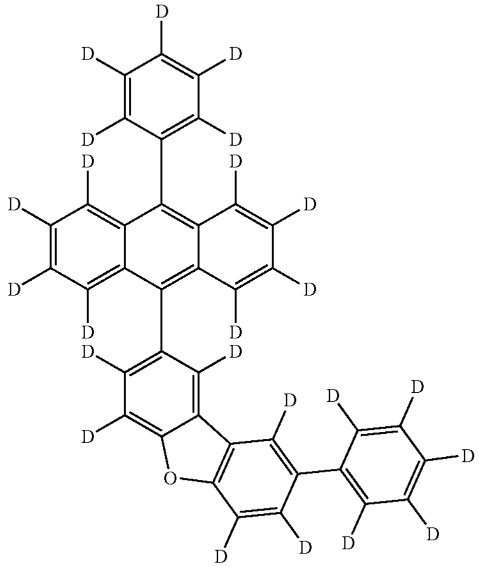

-continued
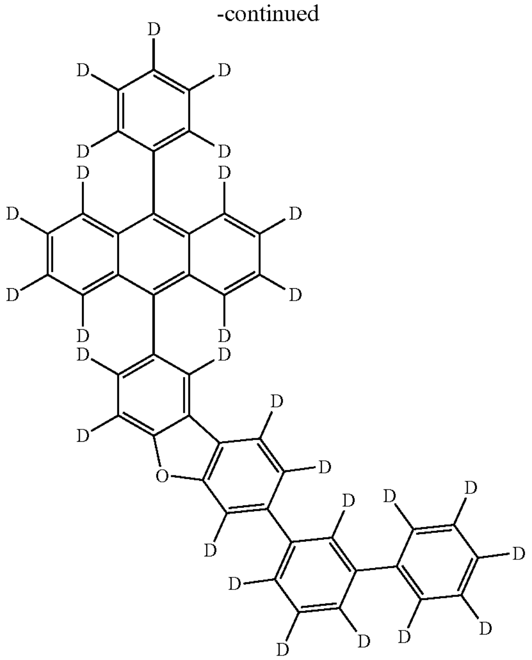
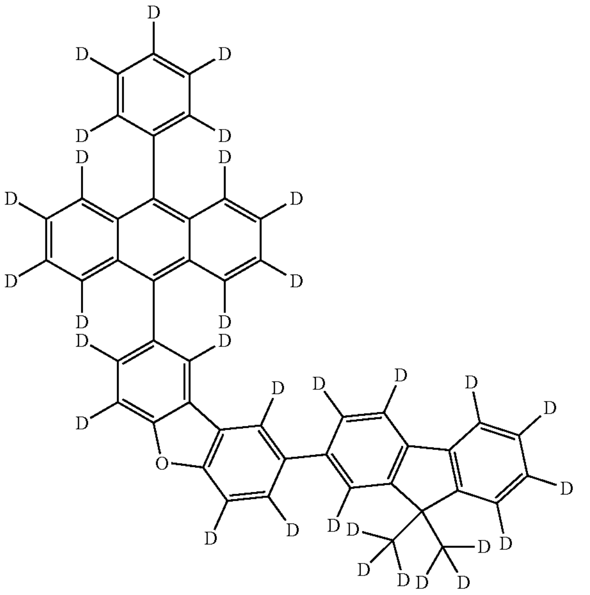
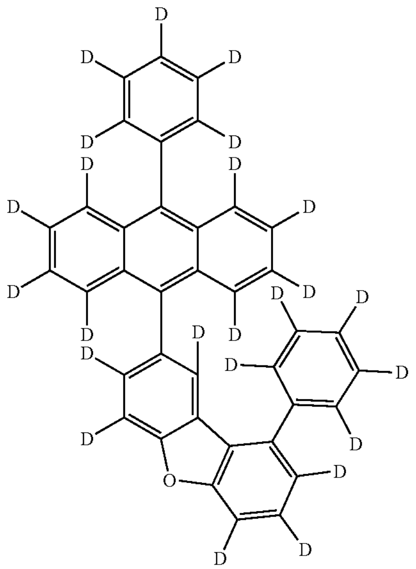
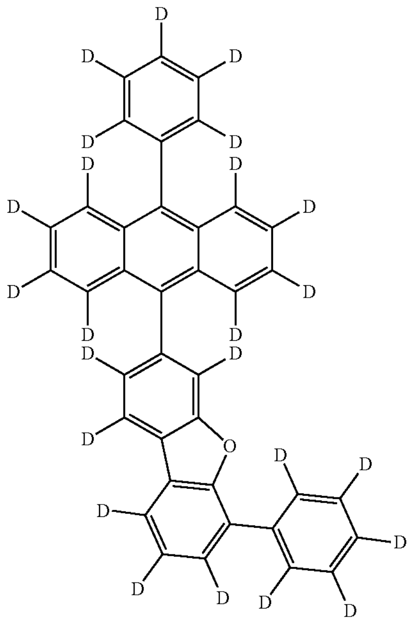

-continued
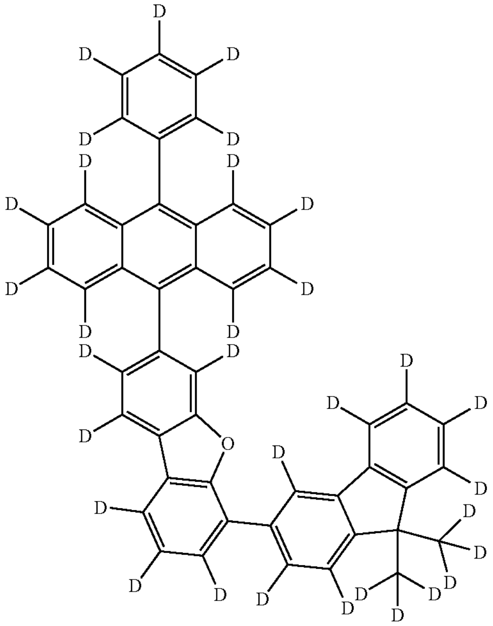
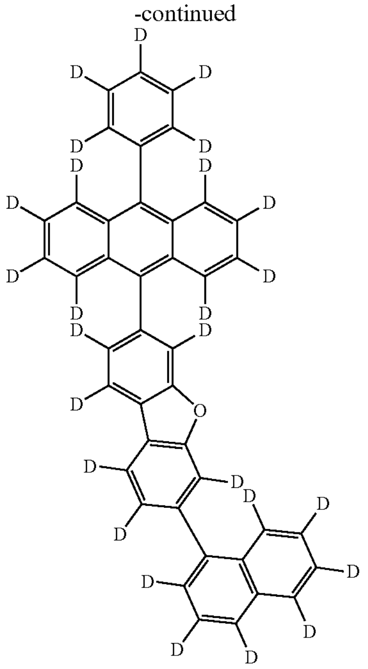
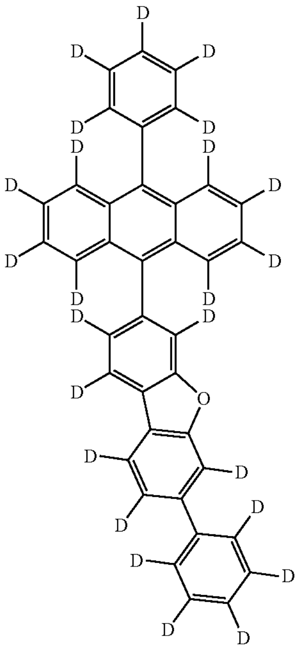
-continued
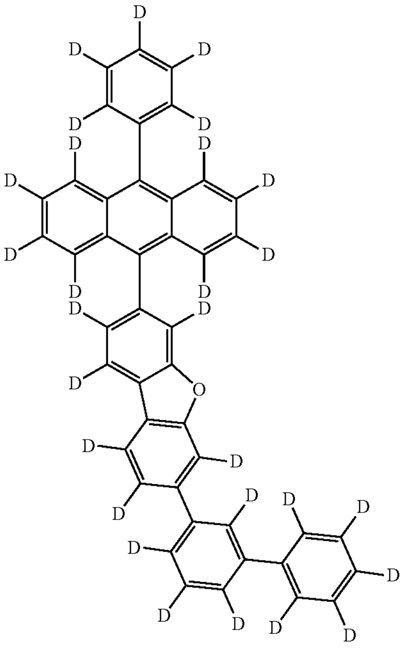

-continued
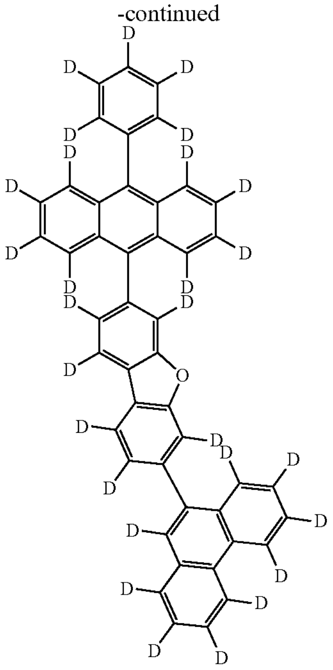
-continued
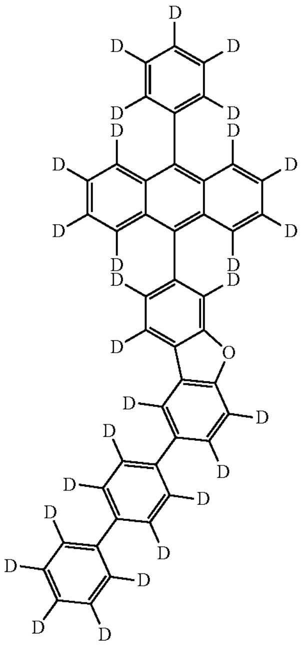
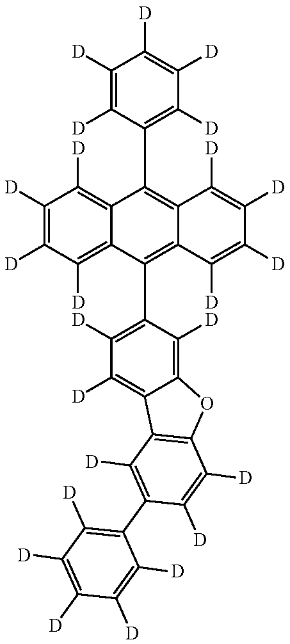
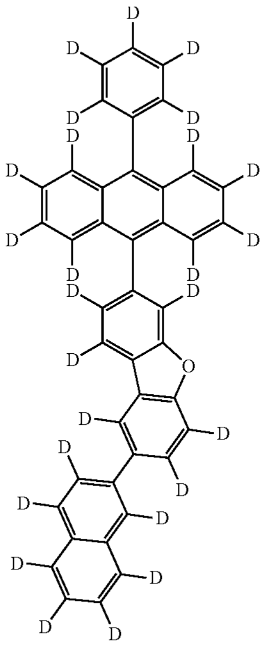
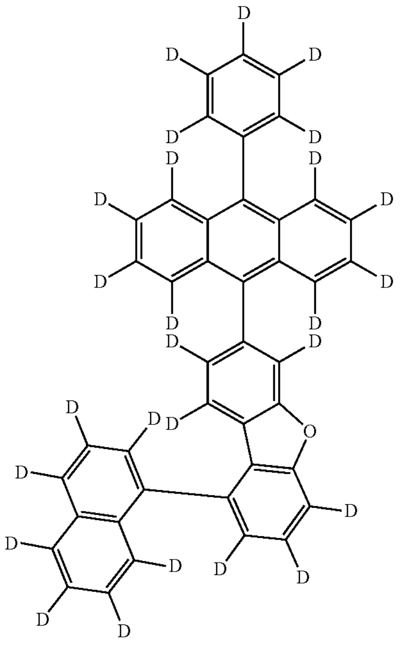

-continued
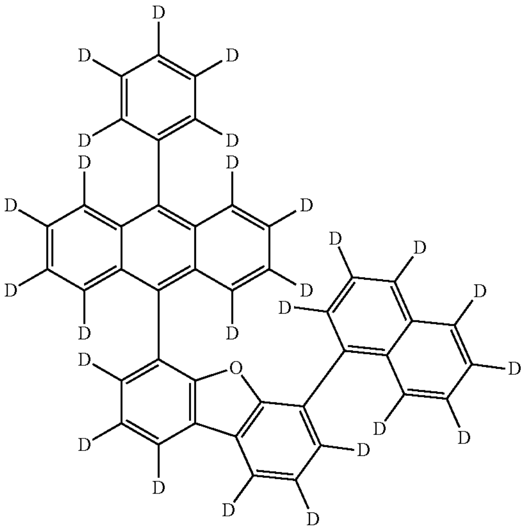
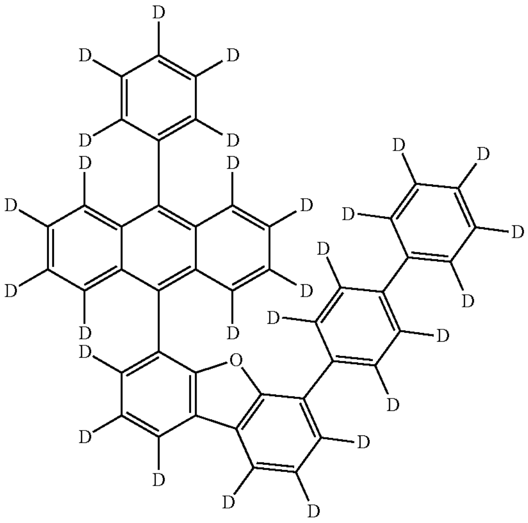
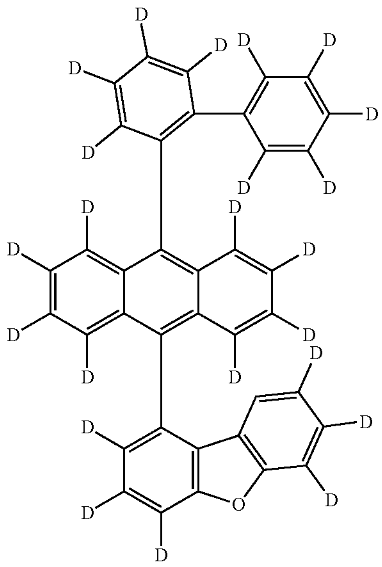
-continued
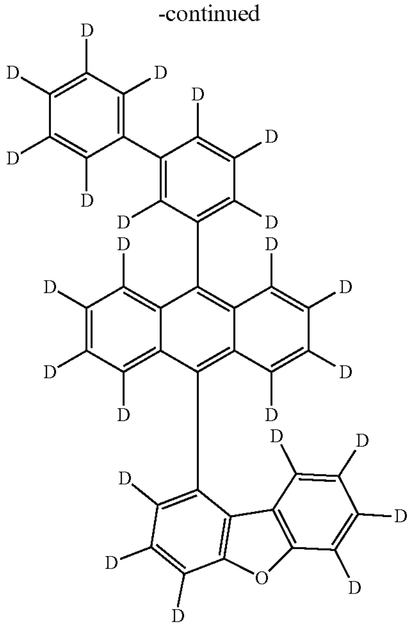
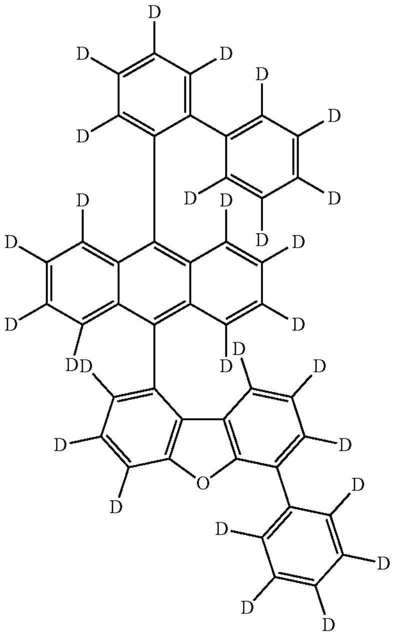

-continued

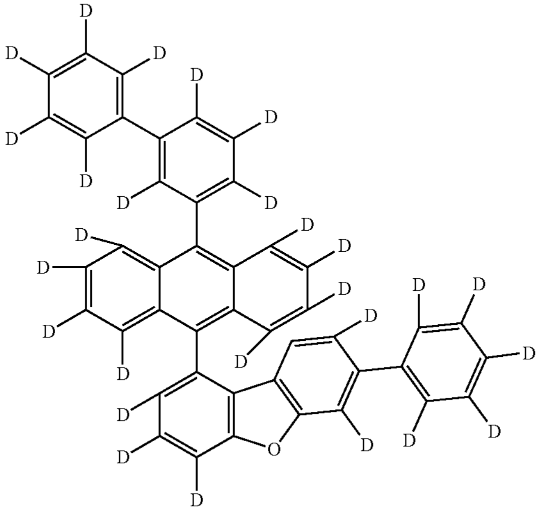

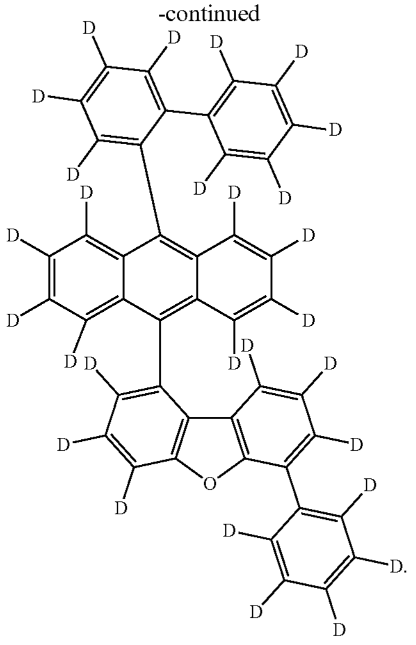

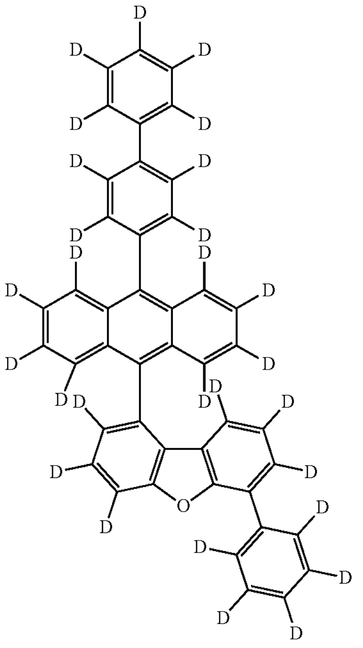

13. The organic electroluminescent device according to claim 9, wherein each of the organic layers is formed by a deposition or solution process.

14. The organic electroluminescent device according to claim 10, wherein one or more hosts other than the compound represented by Formula 1 are mixed or stacked in the light emitting layer.

15. The organic electroluminescent device according to claim 9, wherein the organic electroluminescent device is used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

16. The organic electroluminescent device according to claim 10, wherein the organic electroluminescent device is used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

* * * * *